US010263015B2

(12) United States Patent
Sasaki

(10) Patent No.: US 10,263,015 B2
(45) Date of Patent: Apr. 16, 2019

(54) SEMICONDUCTOR DEVICE

(71) Applicant: Japan Display Inc., Tokyo (JP)

(72) Inventor: Toshinari Sasaki, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 15/443,079

(22) Filed: Feb. 27, 2017

(65) Prior Publication Data

US 2017/0271375 A1 Sep. 21, 2017

(30) Foreign Application Priority Data

Mar. 18, 2016 (JP) ................................ 2016-054739
Mar. 18, 2016 (JP) ................................ 2016-054742
Mar. 18, 2016 (JP) ................................ 2016-054746
Mar. 18, 2016 (JP) ................................ 2016-054749

(51) Int. Cl.

*H01L 29/786* (2006.01)
*H01L 27/12* (2006.01)
*H01L 21/475* (2006.01)
*H01L 29/423* (2006.01)
*H01L 29/66* (2006.01)

(52) U.S. Cl.

CPC ........ *H01L 27/1225* (2013.01); *H01L 21/475* (2013.01); *H01L 27/127* (2013.01); *H01L 27/1288* (2013.01); *H01L 29/42384* (2013.01); *H01L 29/66969* (2013.01); *H01L 29/7869* (2013.01)

(58) Field of Classification Search

CPC ......... H01L 29/41741; H01L 29/41775; H01L 29/78642; H01L 29/7869; H01L 29/78696; H01L 29/0673; H01L 29/0676
See application file for complete search history.

(56) References Cited

U.S. PATENT DOCUMENTS

2005/0184348 A1* 8/2005 Youn .............. H01L 21/823487 257/401
2011/0210327 A1 9/2011 Kondo et al.
2014/0175434 A1* 6/2014 Yuan ................ H01L 29/78642 257/43

FOREIGN PATENT DOCUMENTS

JP 2010-062229 A 3/2010
JP 2012174836 A * 9/2012 ....... H01L 29/78642
JP 2014-194579 A 10/2014
WO WO-2018063165 A1 * 4/2018 ............ H01L 23/50

* cited by examiner

*Primary Examiner* — Cuong Q Nguyen
*Assistant Examiner* — Peter M Albrecht
(74) *Attorney, Agent, or Firm* — Typha IP LLC

(57) ABSTRACT

A semiconductor device includes a first electrode, a first insulating layer on the first electrode, a second electrode on the first insulating layer, a second insulating layer on the second electrode, a first opening in the first insulating layer, the second electrode and the second insulating layer, the first opening reaching the first electrode, a first oxide semiconductor layer in the first opening, the first oxide semiconductor layer being connected with the first electrode and the second electrode, a first gate electrode facing the first oxide semiconductor layer, and a first gate insulating layer between the first oxide semiconductor layer and the first gate electrode.

19 Claims, 320 Drawing Sheets

10E

10

10B

10C

10D

10D

10E

10G

10G

10H

10H

10H

10J

10L

10M

10N

10P

10R

10W

10W

10X

10Y

10AA

10AB

10AE

10AE

10AF

SEMICONDUCTOR DEVICE

CROSS REFERENCE TO RELATED APPLICATIONS

This application is based upon and claims the benefit of priority from the prior Japanese Patent Application No. 2016-054739 filed on Mar. 18, 2016, the prior Japanese Patent Application No. 2016-054742 filed on Mar. 18, 2016, the prior Japanese Patent Application No. 2016-054746 filed on Mar. 18, 2016, and the prior Japanese Patent Application No. 2016-054749 filed on Mar. 18, 2016, the entire contents of which are incorporated herein by reference.

FIELD

The present invention relates to a semiconductor device, and an embodiment disclosed herein relates to a structure and a layout of a semiconductor device.

BACKGROUND

Recently, a driving circuit of a display device, a personal computer or the like includes a semiconductor device such as a transistor, a diode or the like as a microscopic switching element. Especially in a display device, a semiconductor device is used as a selective transistor that supplies a voltage or a current in accordance with the gray scale of each of pixels and also used in a driving circuit that selects a pixel to which the voltage or the current is to be supplied. The characteristics required of a semiconductor vary in accordance with the use thereof. For example, a semiconductor used as a selective transistor is required to have a low off-current or little variance in characteristics from another selective semiconductor included in the same device. A semiconductor used in a driving circuit is required to have a high on-current.

To be used in a display device as described above, a semiconductor device including a channel formed of amorphous silicon, low-temperature polysilicon or single crystalline silicon has been conventionally developed. A semiconductor device including a channel formed of amorphous silicon can be formed with a simpler structure and in a process of 400° C. or lower, and therefore can be formed, for example, by use of a large glass substrate referred to as an eighth-generation glass substrate (2160×2460 mm). However, such a semiconductor device including a channel formed of amorphous silicon has a low mobility and is not usable in a driving circuit.

A semiconductor device including a channel formed of low-temperature polysilicon or single crystalline silicon has a higher mobility than the semiconductor device including a channel formed of amorphous silicon, and therefore is usable as a selective transistor and also in a driving circuit. However, such a semiconductor device including a channel formed of low-temperature polysilicon or single crystalline silicon has a complicated structure and needs a complicated process to be manufactured. In addition, such a semiconductor device needs to be formed in a process of 500° C. or higher, and therefore cannot be formed by use of a large glass substrate as described above. A semiconductor device including a channel formed of amorphous silicon, low-temperature polysilicon or single crystalline silicon has a high off-current. In the case where such a semiconductor device is used as a selective transistor, it is difficult to keep the applied voltage for a long time.

For the above-described reasons, a semiconductor device including a channel formed of an oxide semiconductor, instead of amorphous silicon, low-temperature polysilicon or single crystalline silicon, has been progressively developed recently (e.g., Japanese Laid-Open Patent Publication No. 2010-062229 and Japanese Laid-Open Patent Publication No. 2014-194579). It is known that a semiconductor device including a channel formed of an oxide semiconductor can be formed with a simple structure and in a process of 400° C. or lower like a semiconductor device including a channel formed of amorphous silicon, and has a mobility higher than that of a semiconductor device including a channel formed of amorphous silicon. It is also known that such a semiconductor device including a channel formed of an oxide semiconductor has a very low off-current.

However, the mobility of the semiconductor device including a channel formed of an oxide semiconductor is lower than that of the semiconductor device including a channel formed of low-temperature polysilicon or single crystalline silicon. Therefore, in order to provide a higher on-current, the semiconductor device including a channel formed of an oxide semiconductor needs to have a shorter L length (channel length). In order to shorten the channel length of the semiconductor device described in Japanese Laid-Open Patent Publication No. 2010-062229 and Japanese Laid-Open Patent Publication No. 2014-194579, a distance between a source and a drain needs to be shortened.

The distance between a source and a drain is determined by a photolithography step and an etching step. In the case where patterning is performed by photolithography, size reduction is restricted by the size of a mask pattern of an exposure device. Especially in the case where patterning is performed on a glass substrate by photolithography, the minimum size of a mask pattern is about 2 μm, and the reduction in the channel length of the semiconductor device is restricted by such a size of the mask pattern. The channel length of the semiconductor device is restricted by photolithography, and therefore, is influenced by the in-plane variance of the substrate in the photolithography step.

SUMMARY

A semiconductor device in an embodiment according to the present invention includes a first electrode, a first insulating layer on the first electrode, a second electrode on the first insulating layer, a second insulating layer on the second electrode, a first opening in the first insulating layer, the second electrode and the second insulating layer, the first opening reaching the first electrode, a first oxide semiconductor layer in the first opening, the first oxide semiconductor layer being connected with the first electrode and the second electrode, a first gate electrode facing the first oxide semiconductor layer, and a first gate insulating layer between the first oxide semiconductor layer and the first gate electrode.

A semiconductor device in an embodiment according to the present invention includes a first electrode, a first insulating layer on the first electrode, the first insulating layer having a first side wall, a second electrode on the first insulating layer, the second electrode having a second side wall, a second insulating layer on the second electrode, a first oxide semiconductor layer on the first side wall, the second side wall and a top surface of the second insulating layer, the first oxide semiconductor layer being connected with the first electrode and the second electrode, a first gate electrode facing the first oxide semiconductor layer, and a first gate insulating layer between the first oxide semiconductor layer and the first gate electrode.

BRIEF DESCRIPTION OF DRAWINGS

FIG. 120 is a plan view showing a step of forming an upper electrode in the manufacturing method of the semiconductor device in the embodiment according to the present invention;

FIG. 121 is a cross-sectional view showing the step of forming the upper electrode in the manufacturing method of the semiconductor device in the embodiment according to the present invention;

FIG. 122 is a plan view showing a step of forming openings in insulating layers in the manufacturing method of the semiconductor device in the embodiment according to the present invention;

FIG. 123 is a cross-sectional view showing the step of forming the openings in the insulating layers in the manufacturing method of the semiconductor device in the embodiment according to the present invention;

FIG. 124 is a plan view showing a step of forming an oxide semiconductor layer in the manufacturing method of the semiconductor device in the embodiment according to the present invention;

FIG. 125 is a cross-sectional view showing the step of forming the oxide semiconductor layer in the manufacturing method of the semiconductor device in the embodiment according to the present invention;

FIG. 126 is a plan view showing a step of forming openings reaching the lower electrode, the upper electrode and the like in the manufacturing method of the semiconductor device in the embodiment according to the present invention;

FIG. 127 is a cross-sectional view showing the step of forming the openings reaching the lower electrode, the upper electrode and the like in the manufacturing method of the semiconductor device in the embodiment according to the present invention;

FIG. 128 is a plan view showing an overview of a semiconductor device in an embodiment according to the present invention;

FIG. 129 is a cross-sectional view showing the overview of the semiconductor device in an embodiment according to the present invention;

FIG. 130 is a plan view showing a step of forming openings in insulating layers in a manufacturing method of the semiconductor device in the embodiment according to the present invention;

FIG. 131 is a cross-sectional view showing the step of forming the openings in the insulating layers in the manufacturing method of the semiconductor device in the embodiment according to the present invention;

Figure 132:
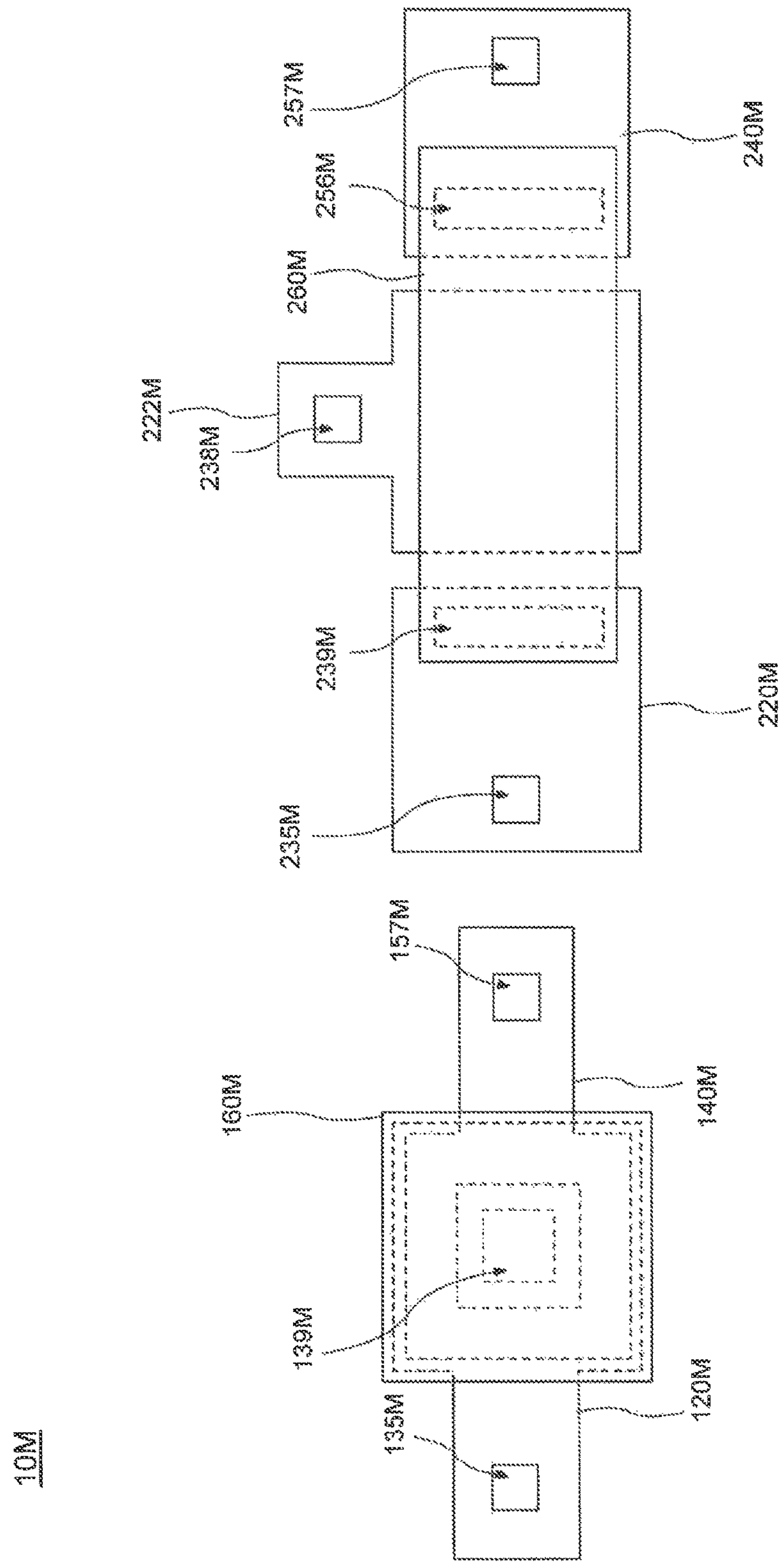
Figure 133:
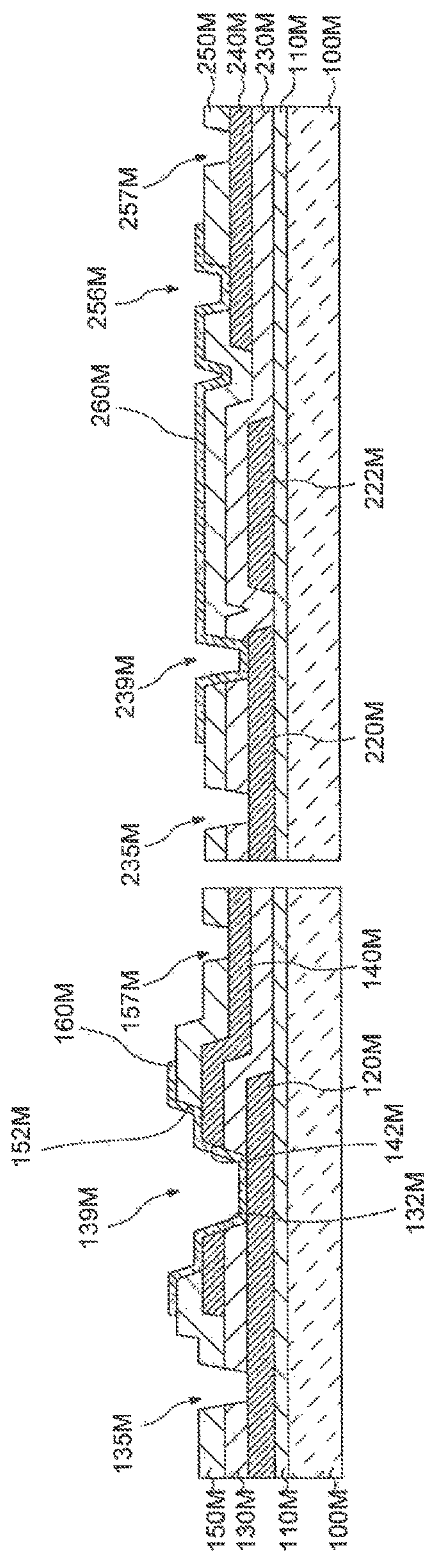
Figure 134:
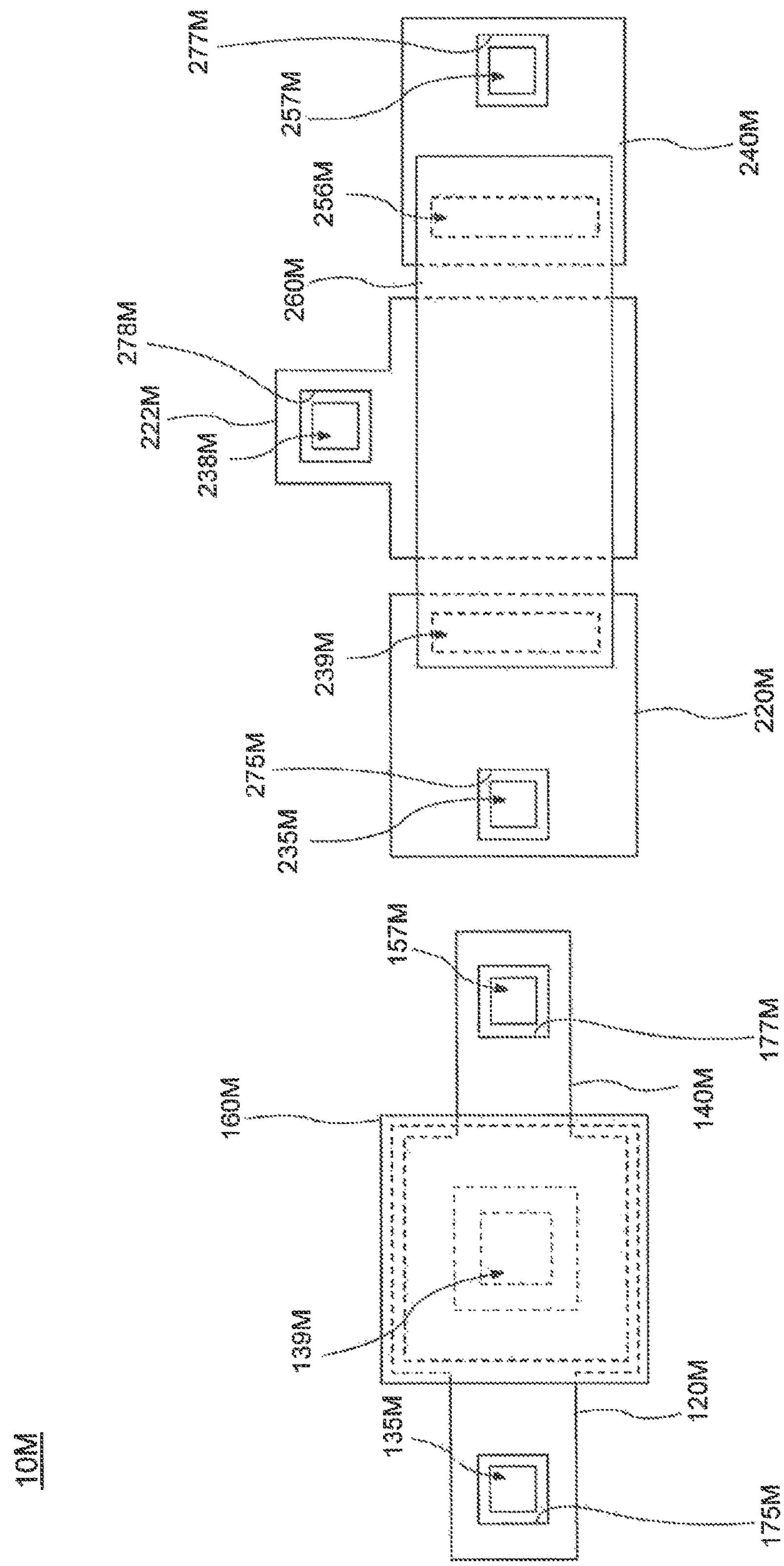
Figure 135:
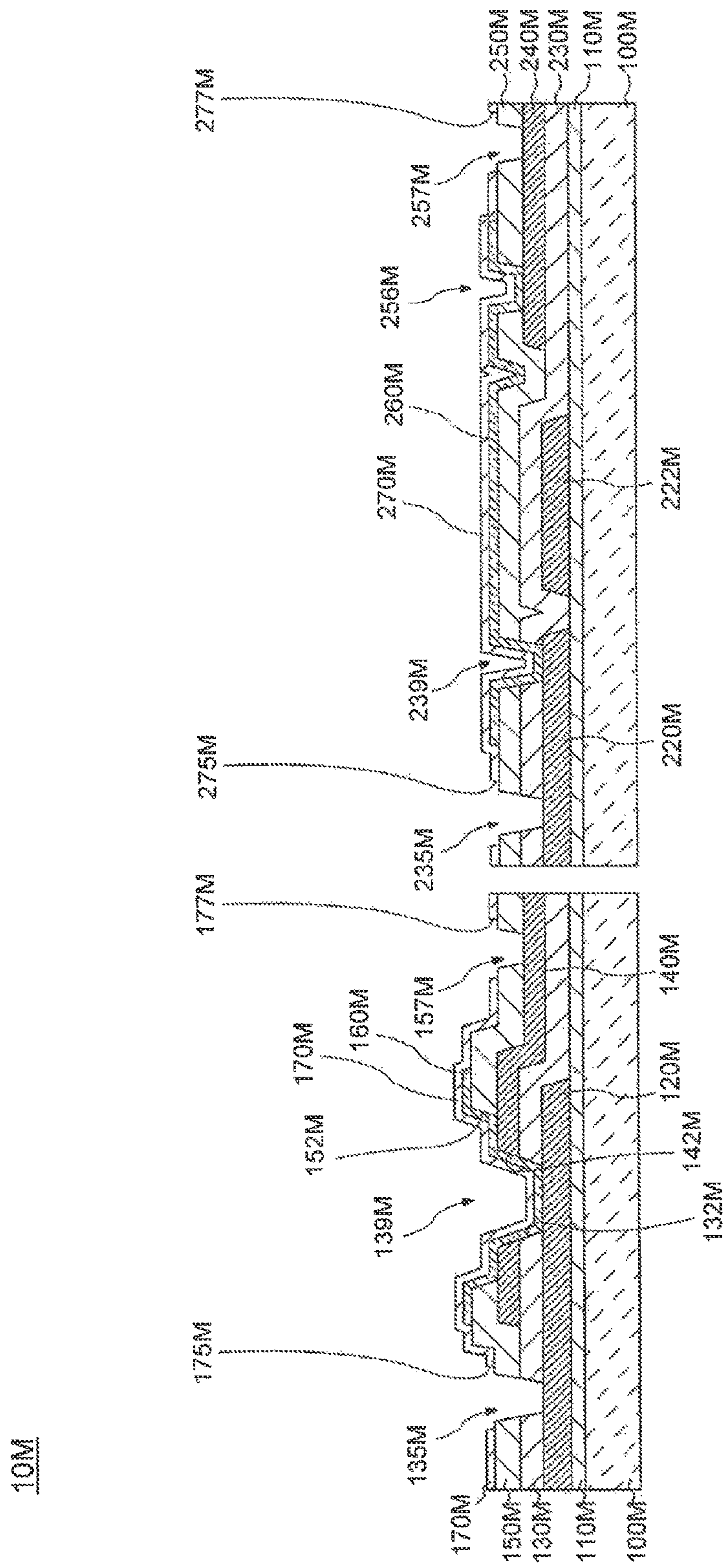
Figure 136:
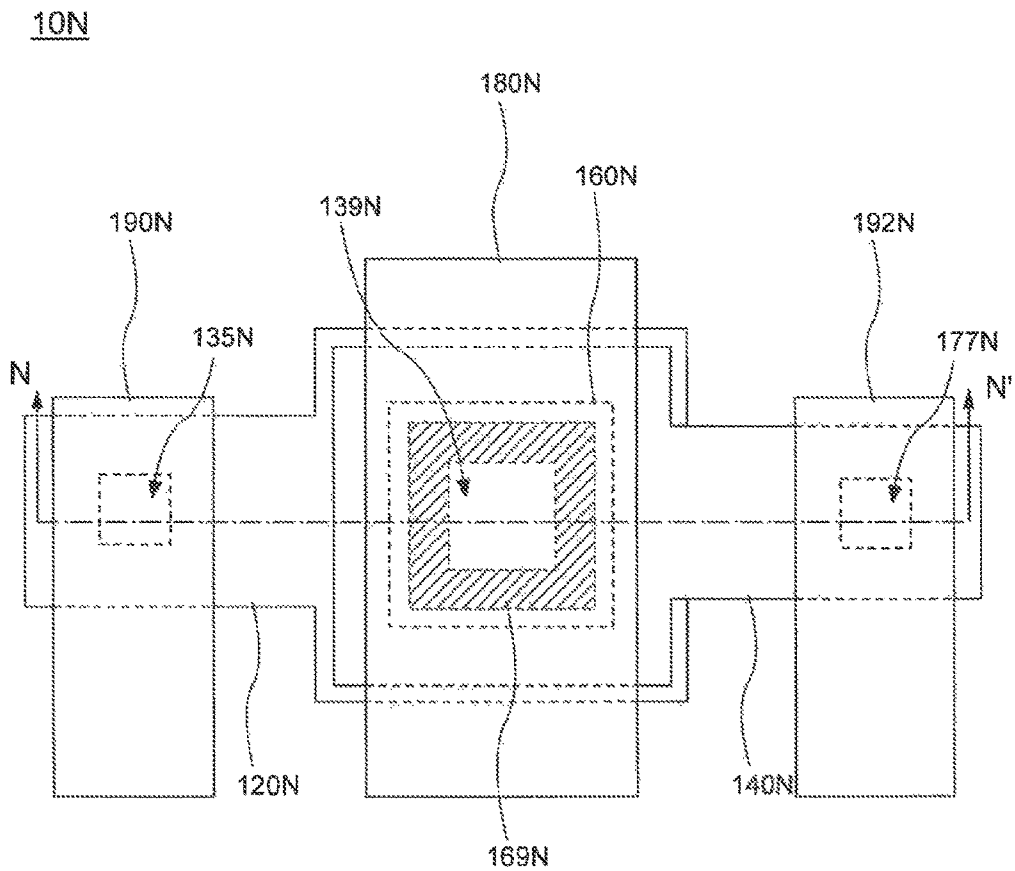
Figure 137:
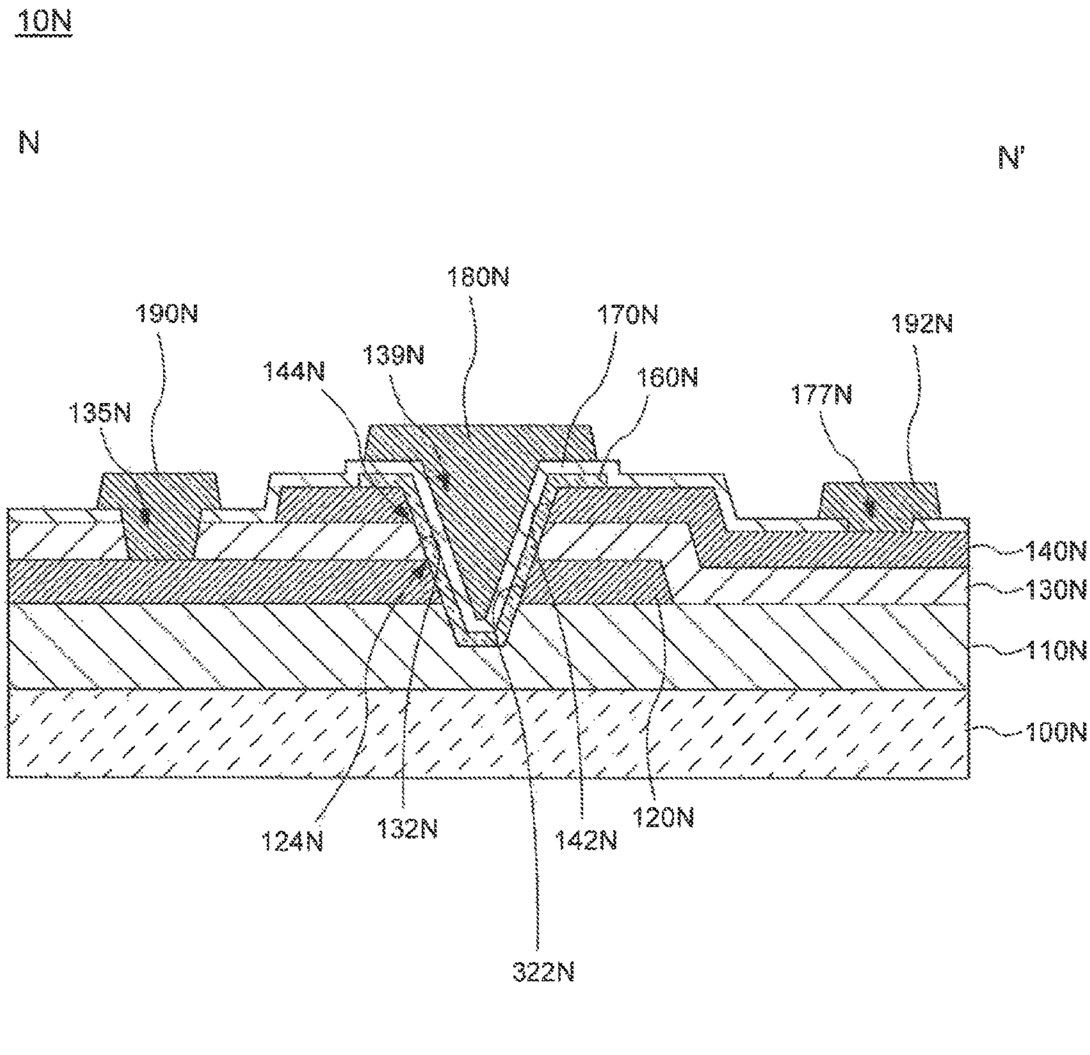
Figure 138:
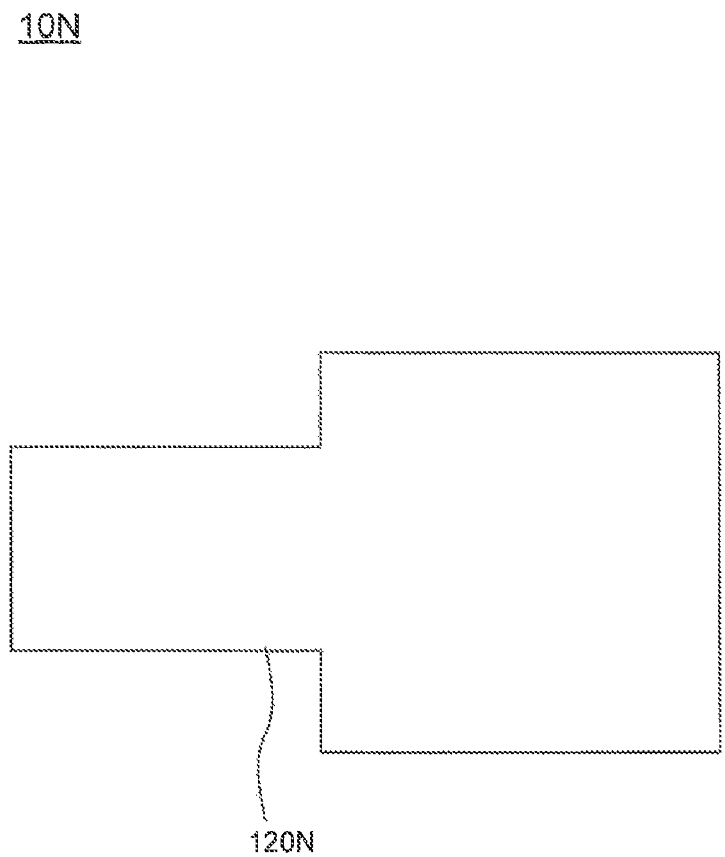
Figure 139:
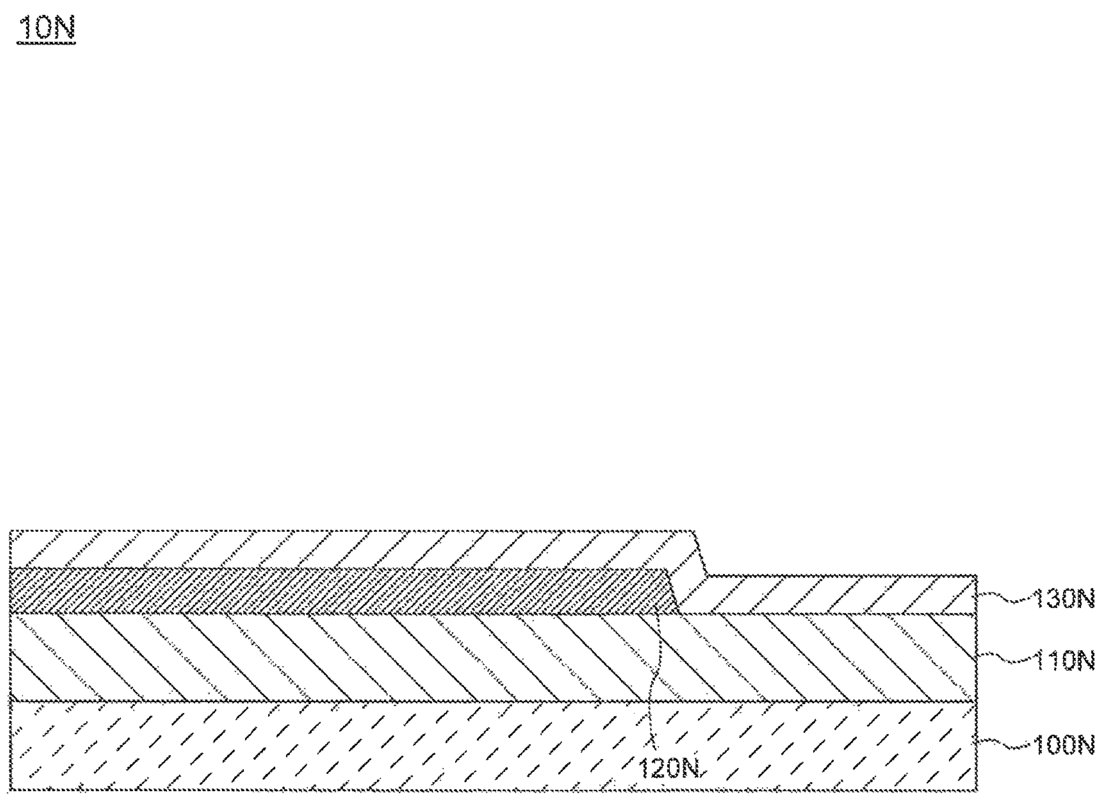
Figure 140:
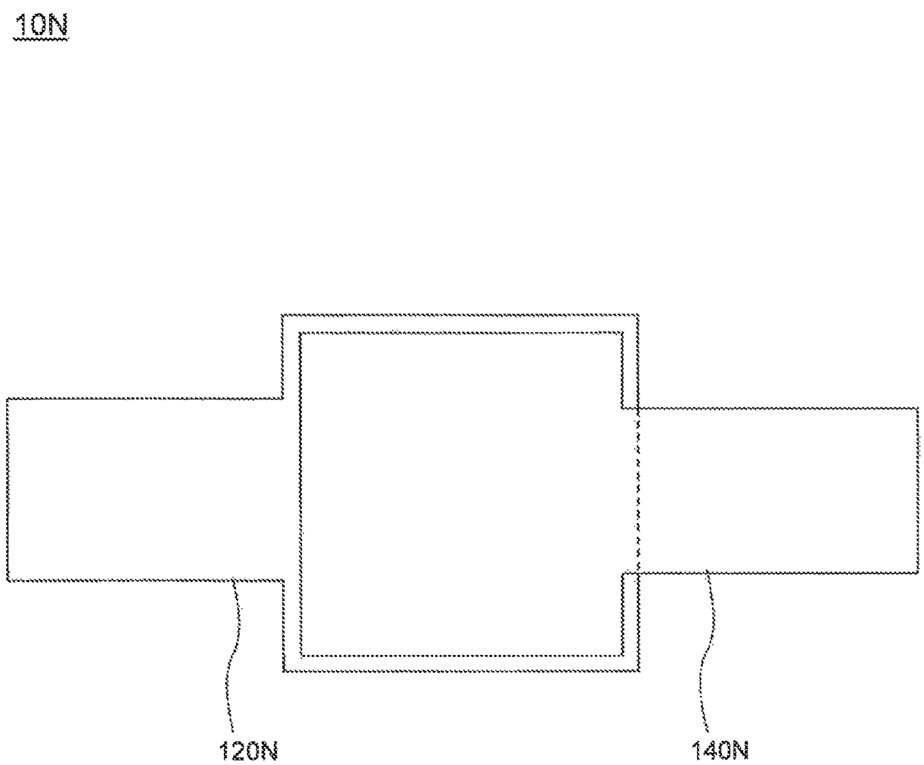
Figure 141:
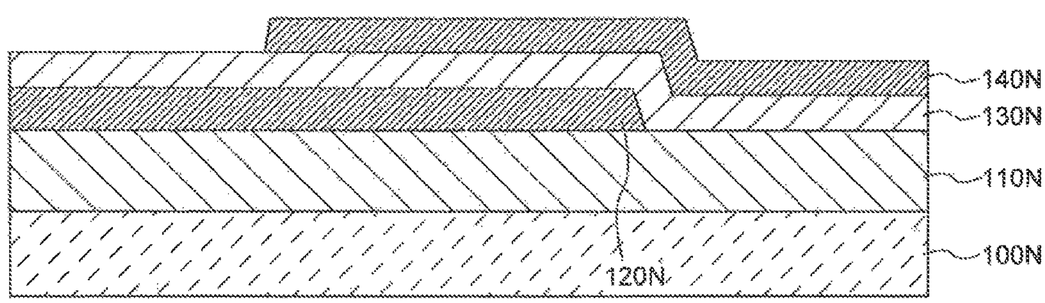
Figure 142:
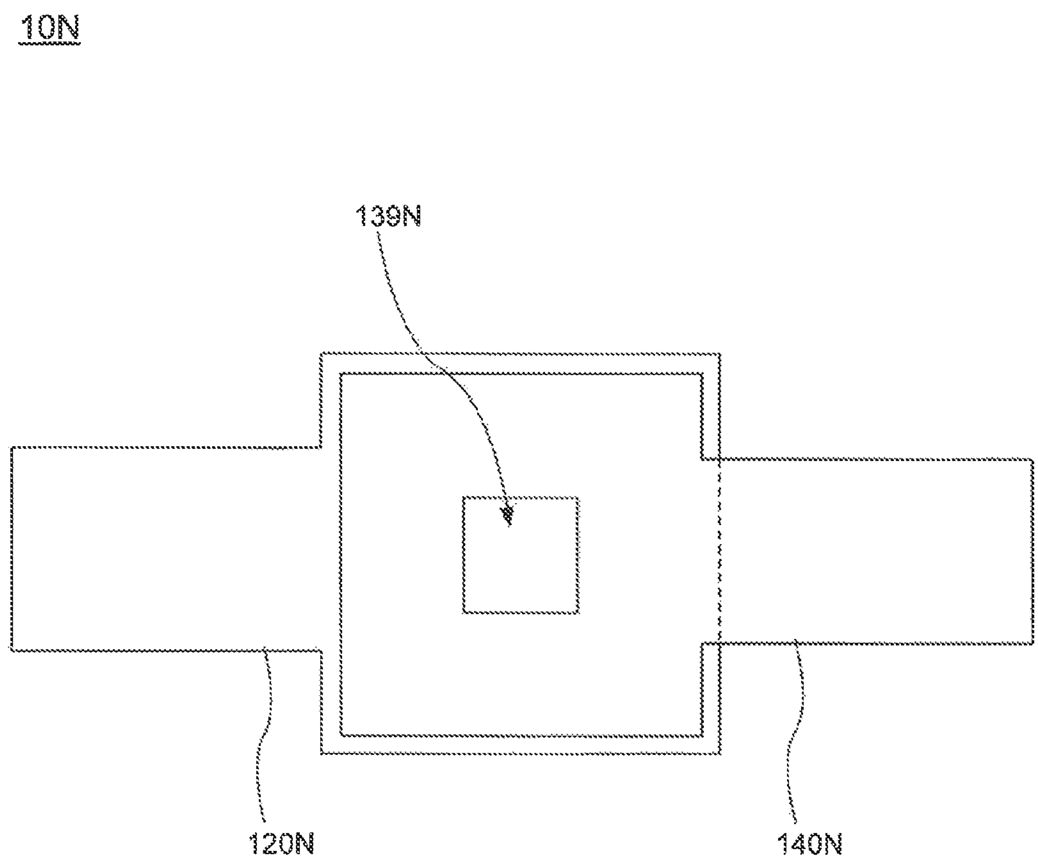
Figure 143:
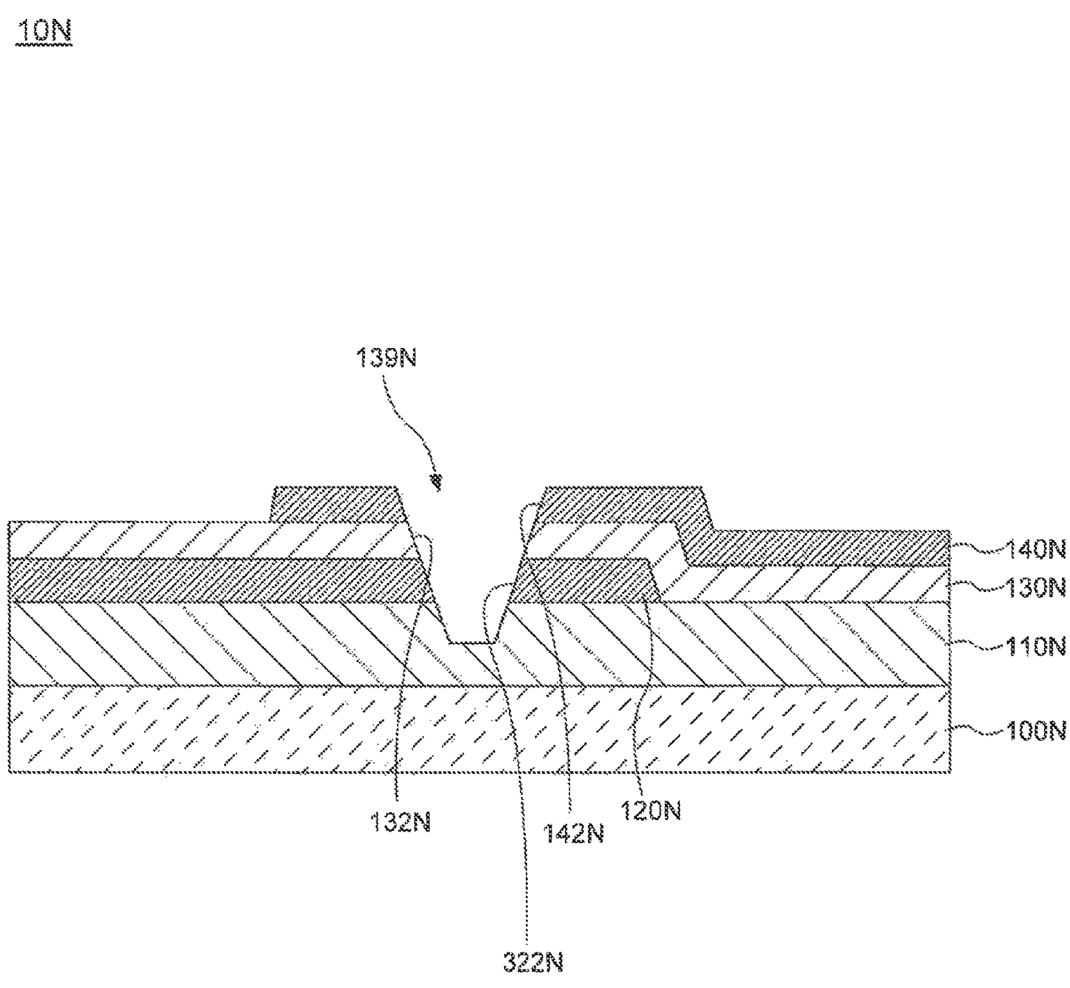
Figure 144:
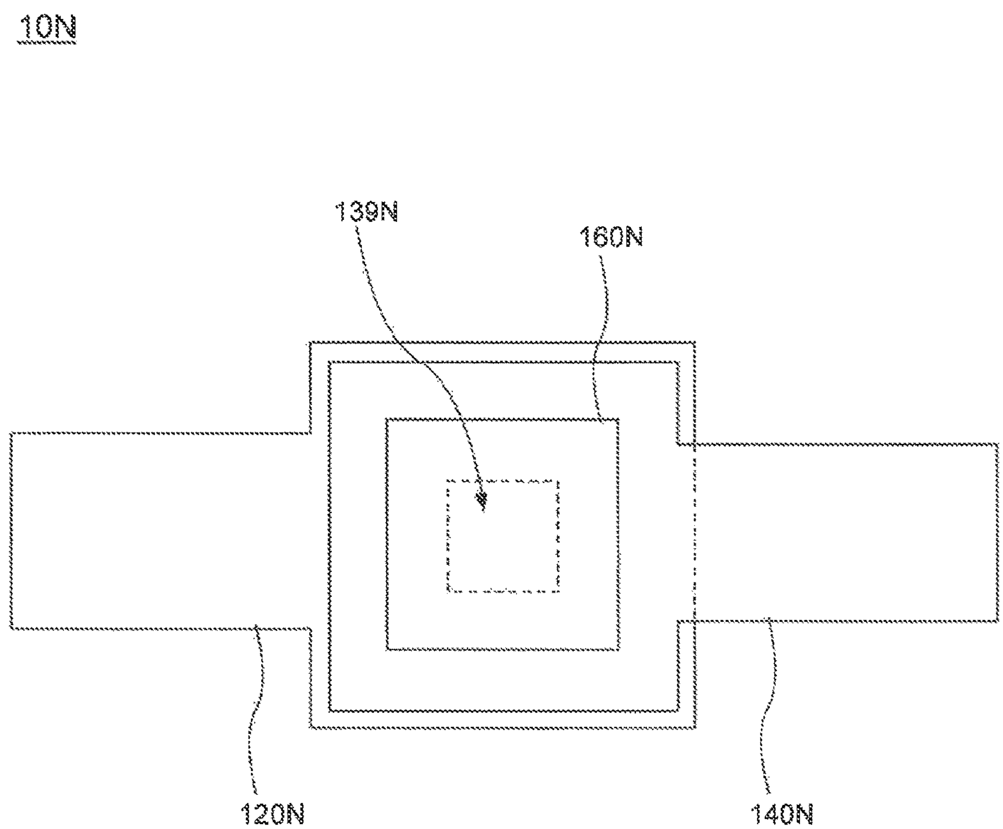
Figure 145:
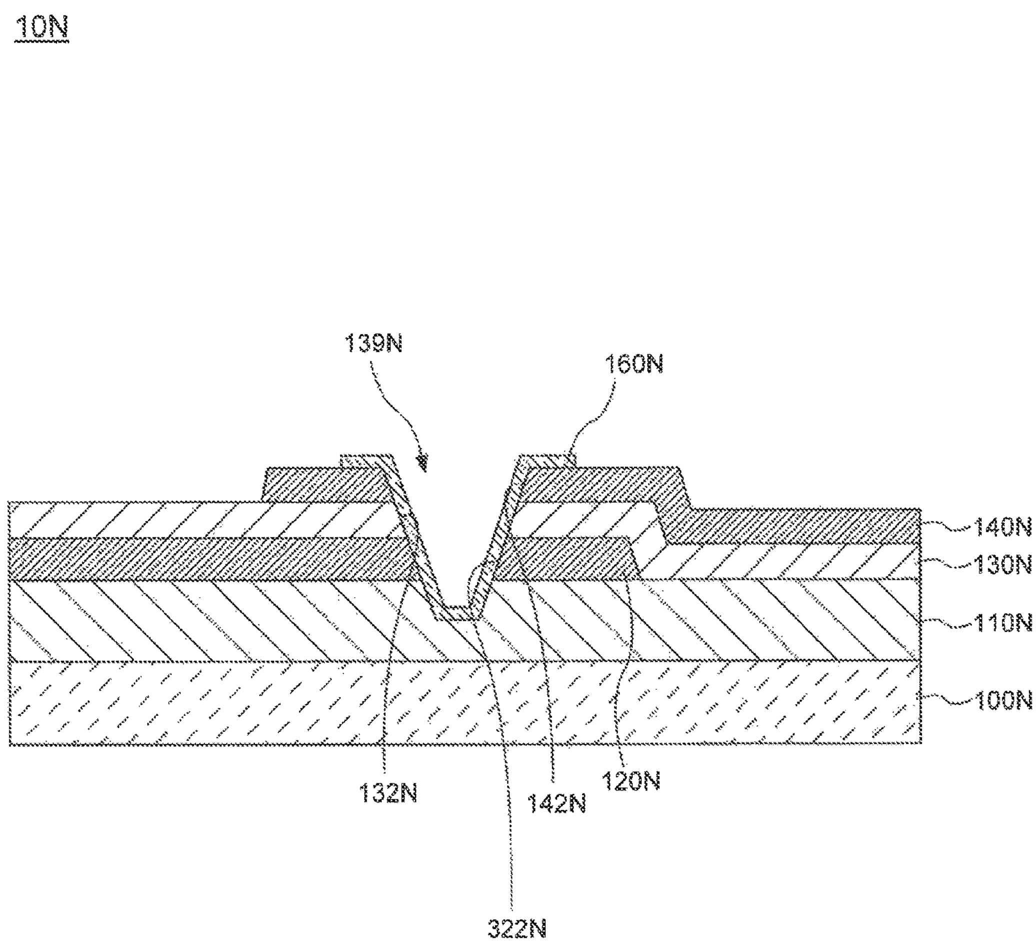
Figure 146:
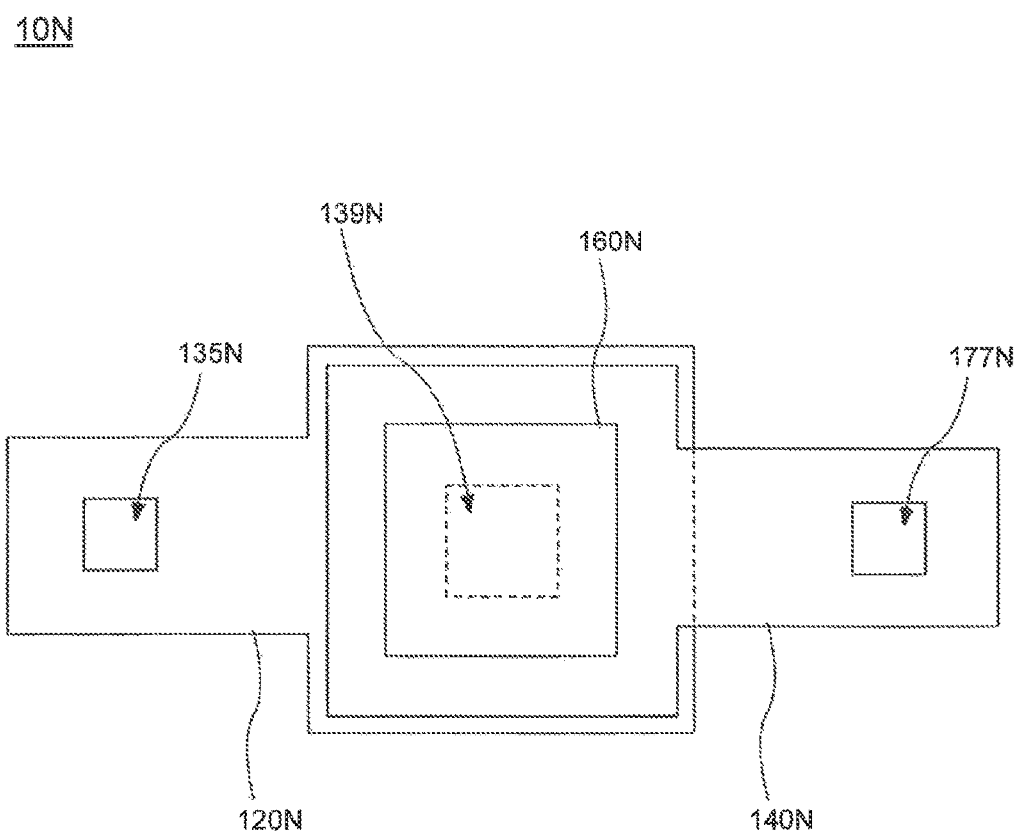
Figure 147:
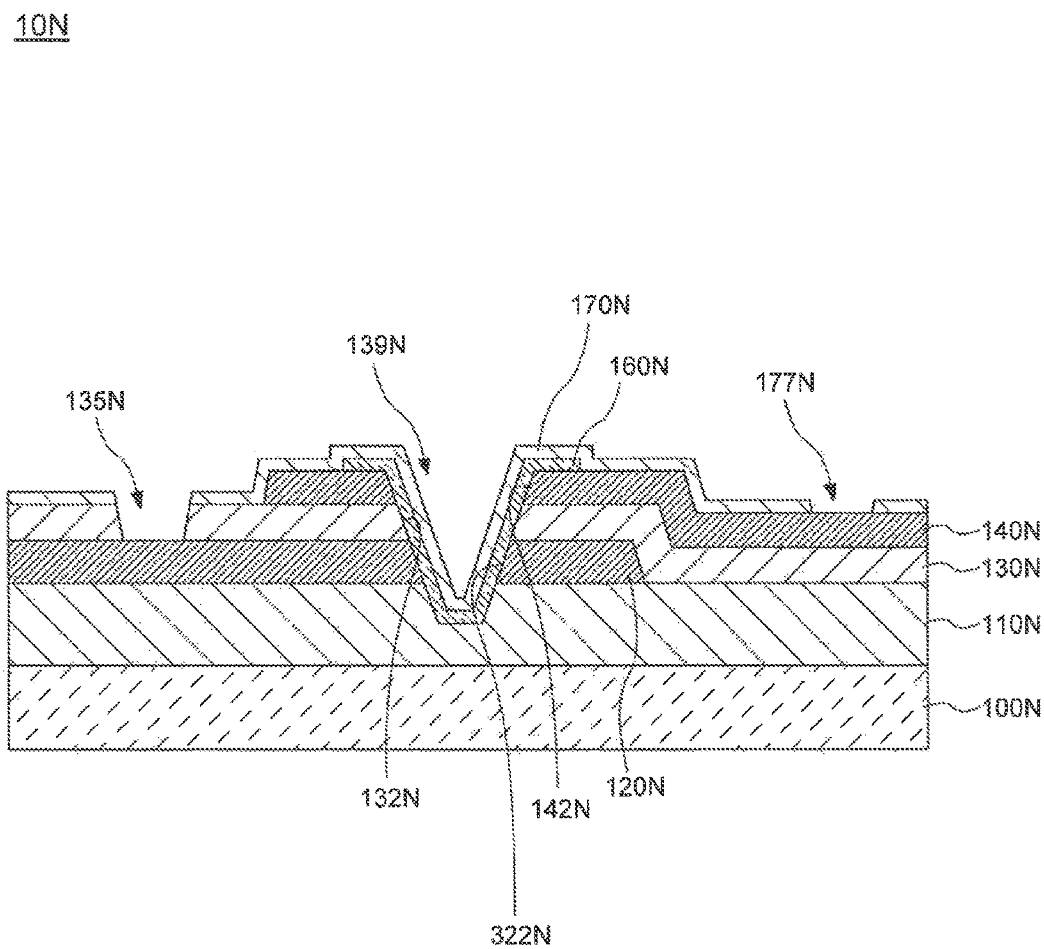
Figure 148:
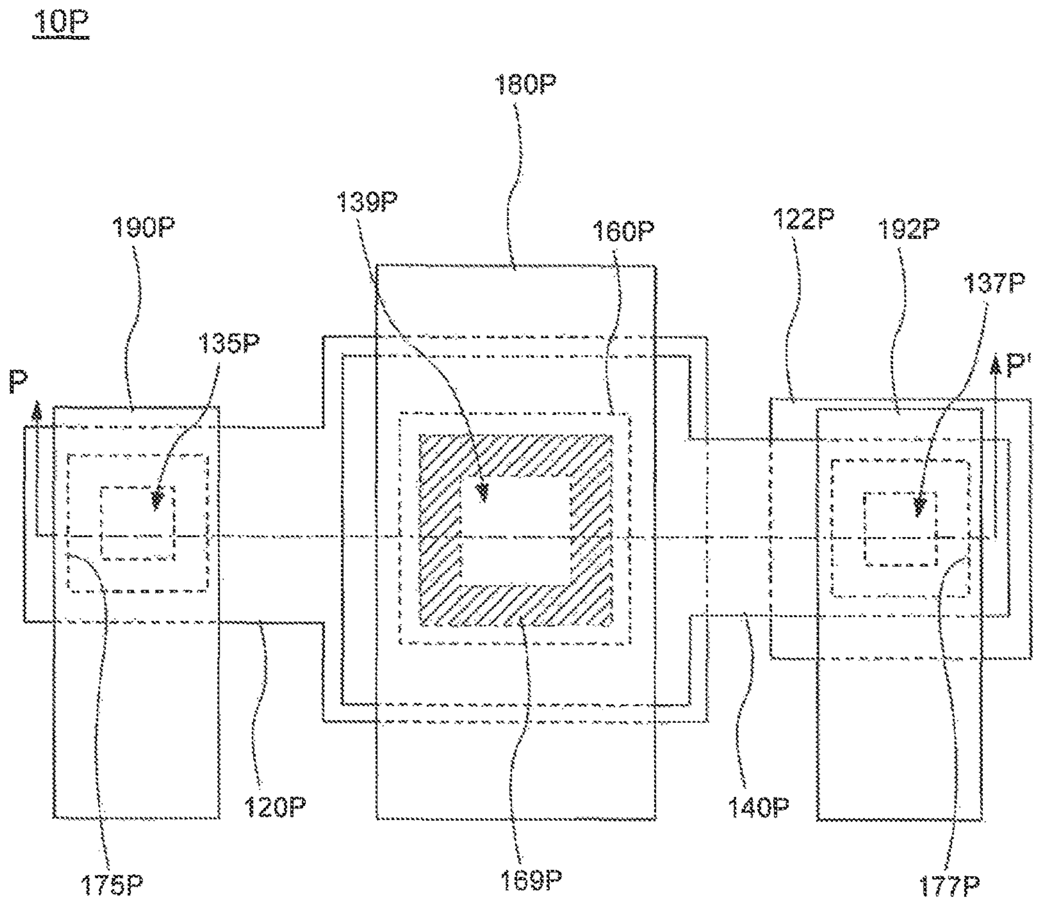
Figure 149:
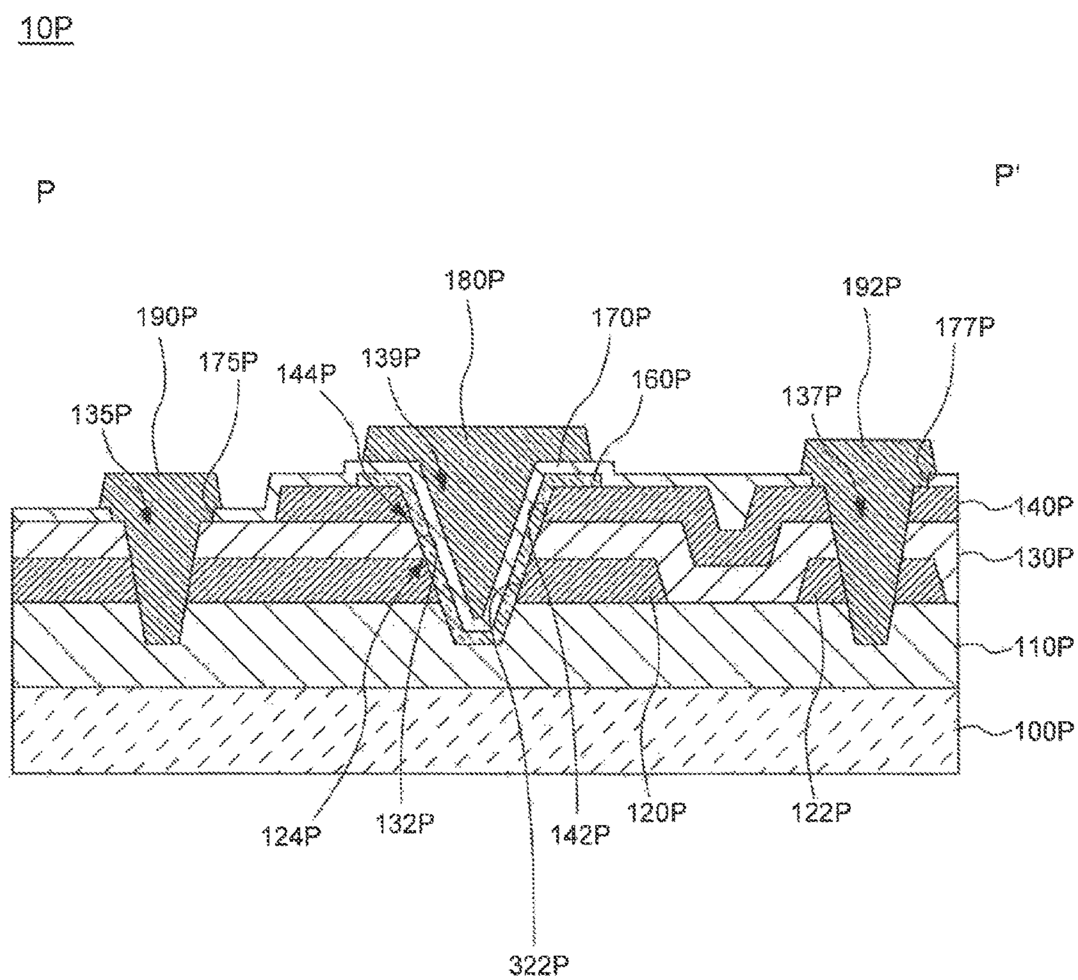
Figure 150:
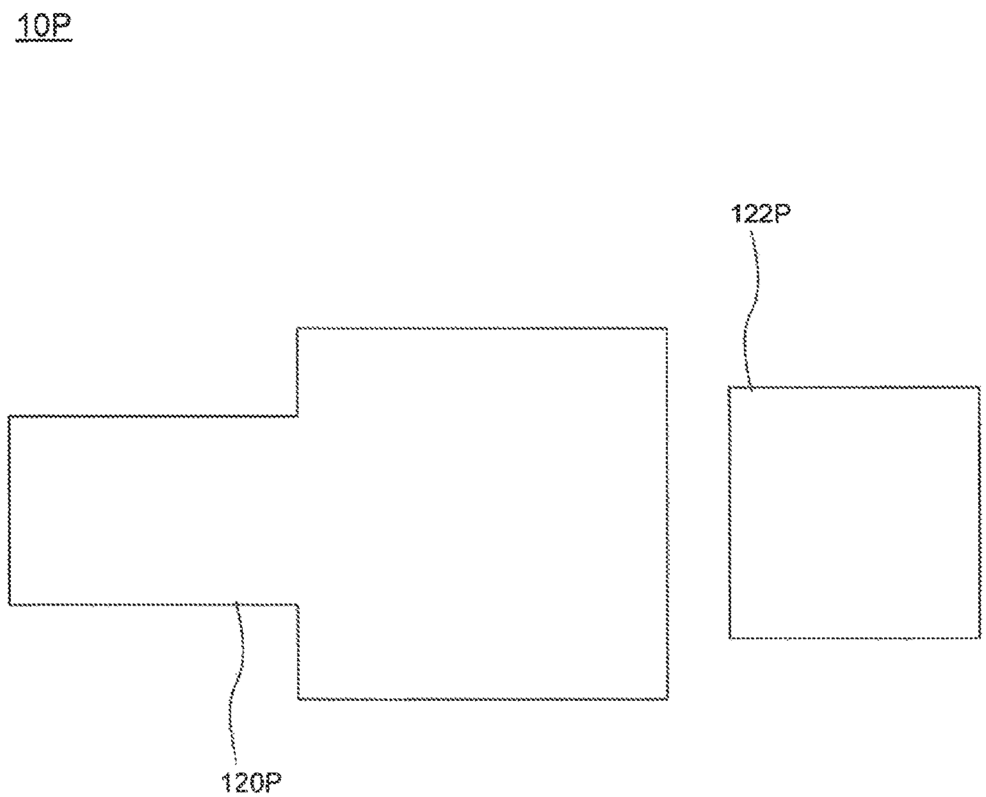
Figure 151:
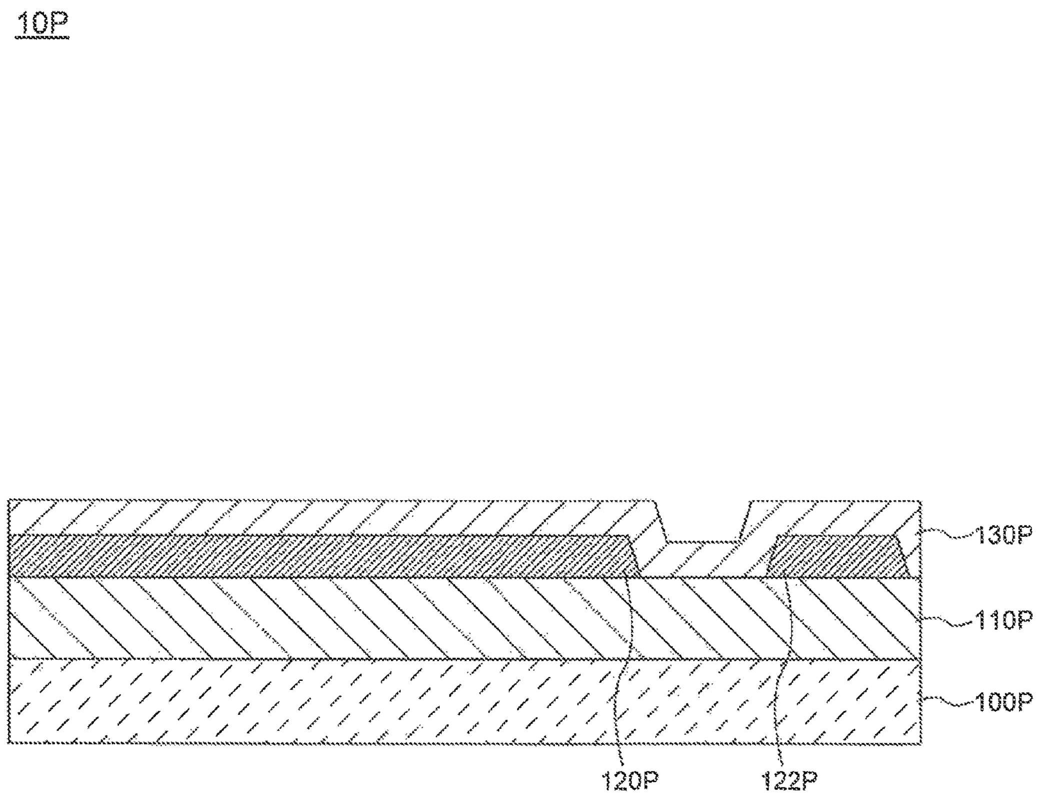
Figure 152:
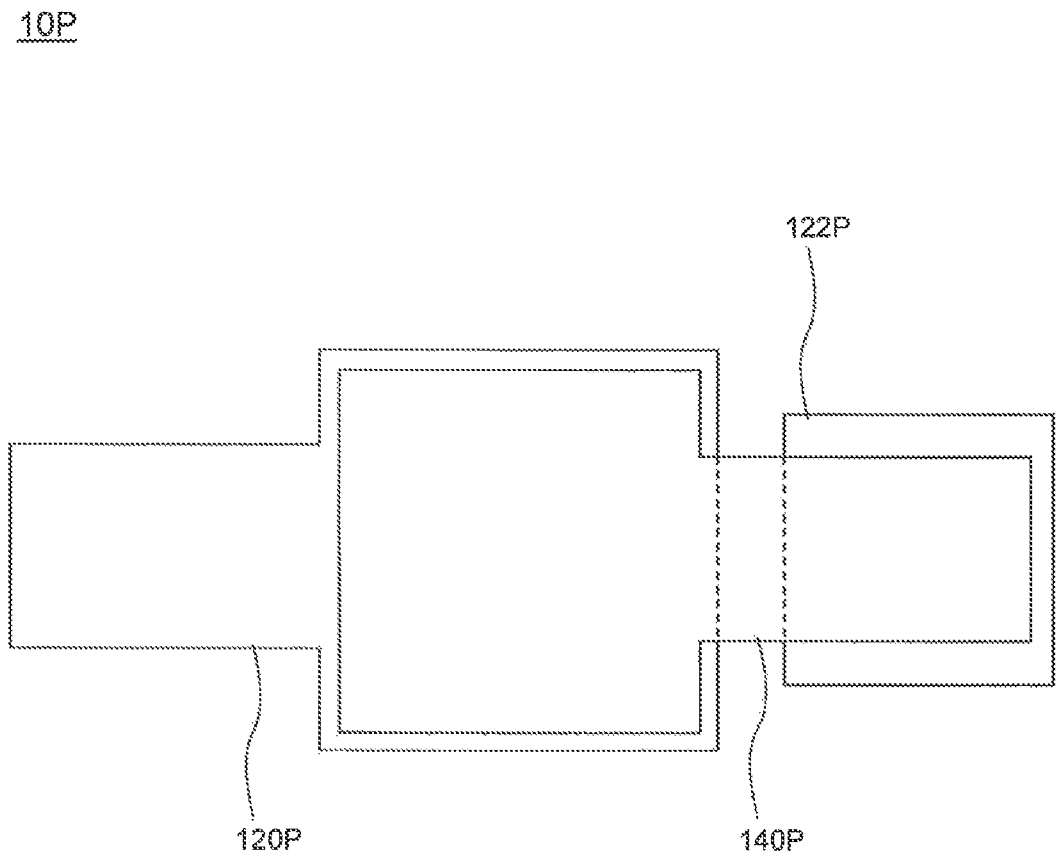
Figure 153:
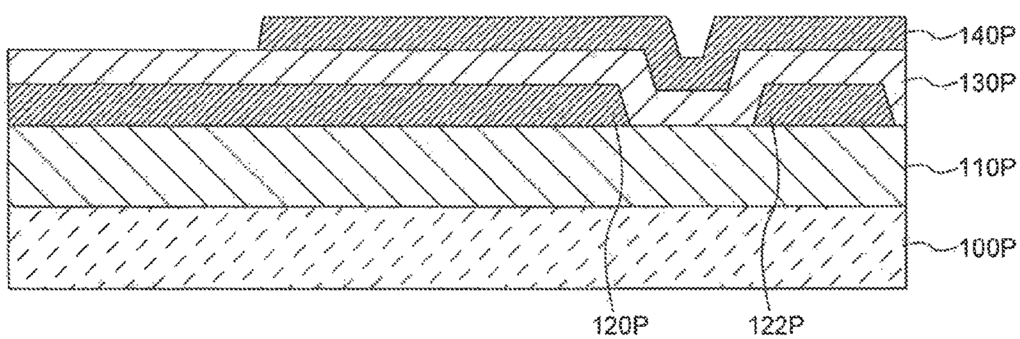
Figure 154:
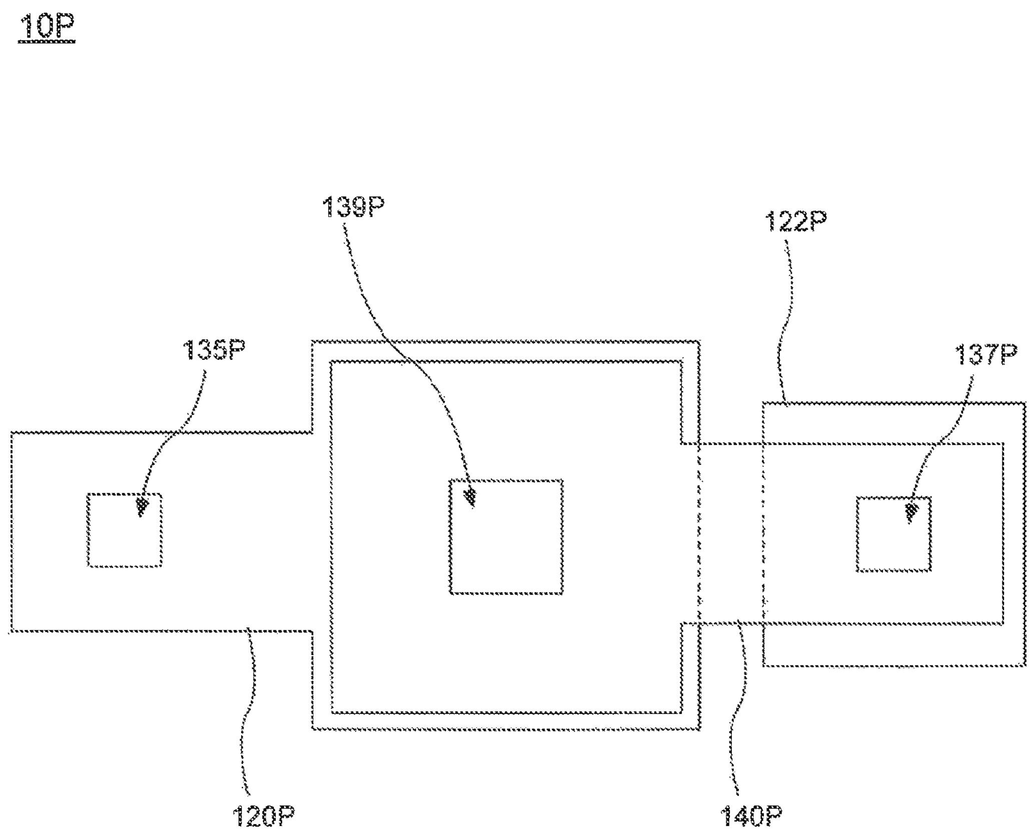
Figure 155:
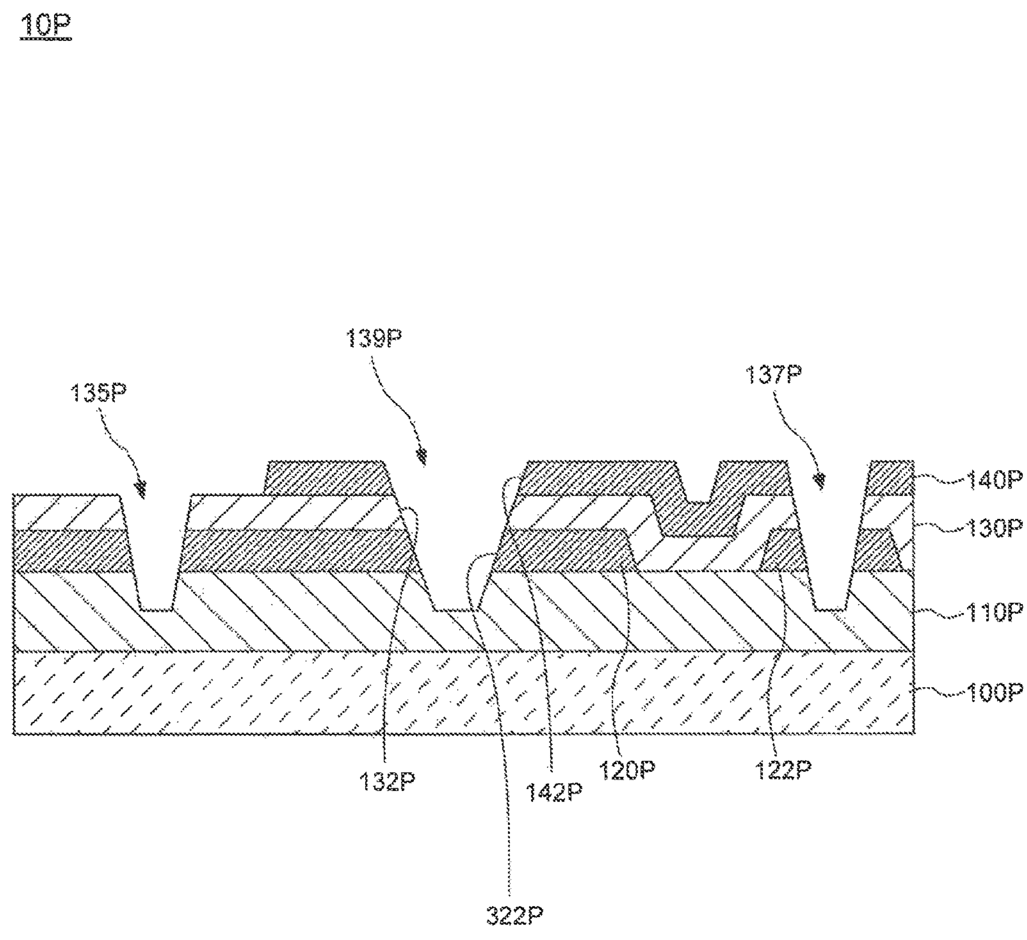
Figure 156:
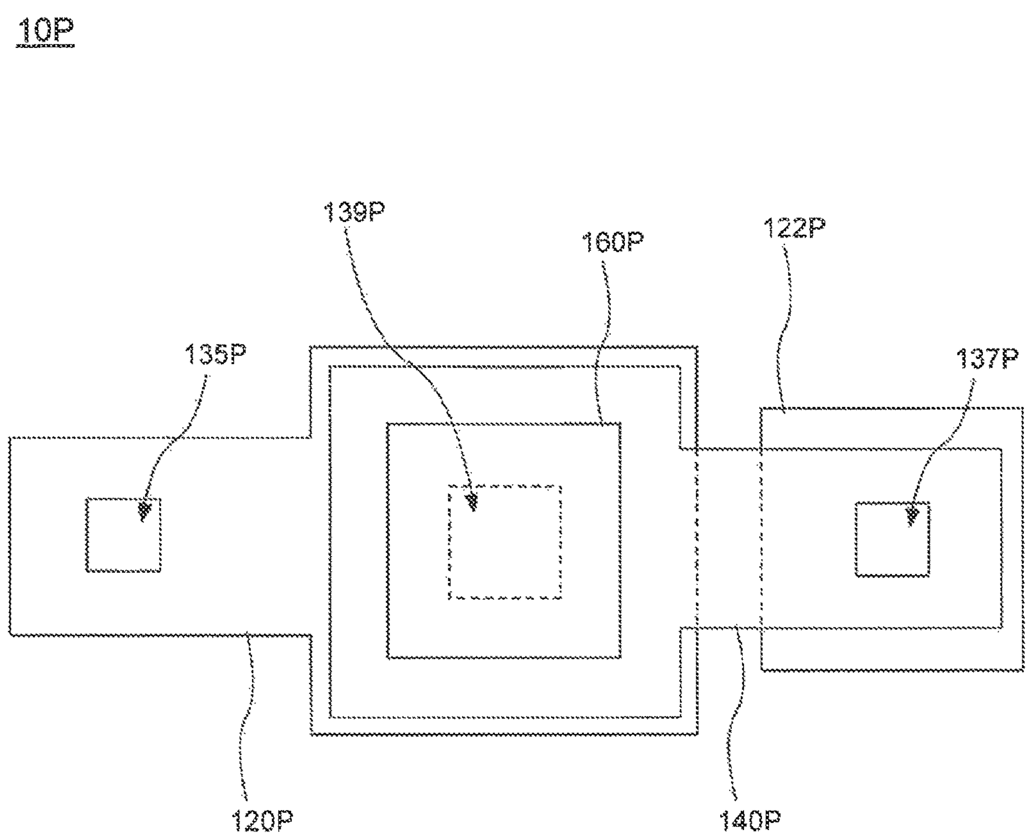
Figure 157:
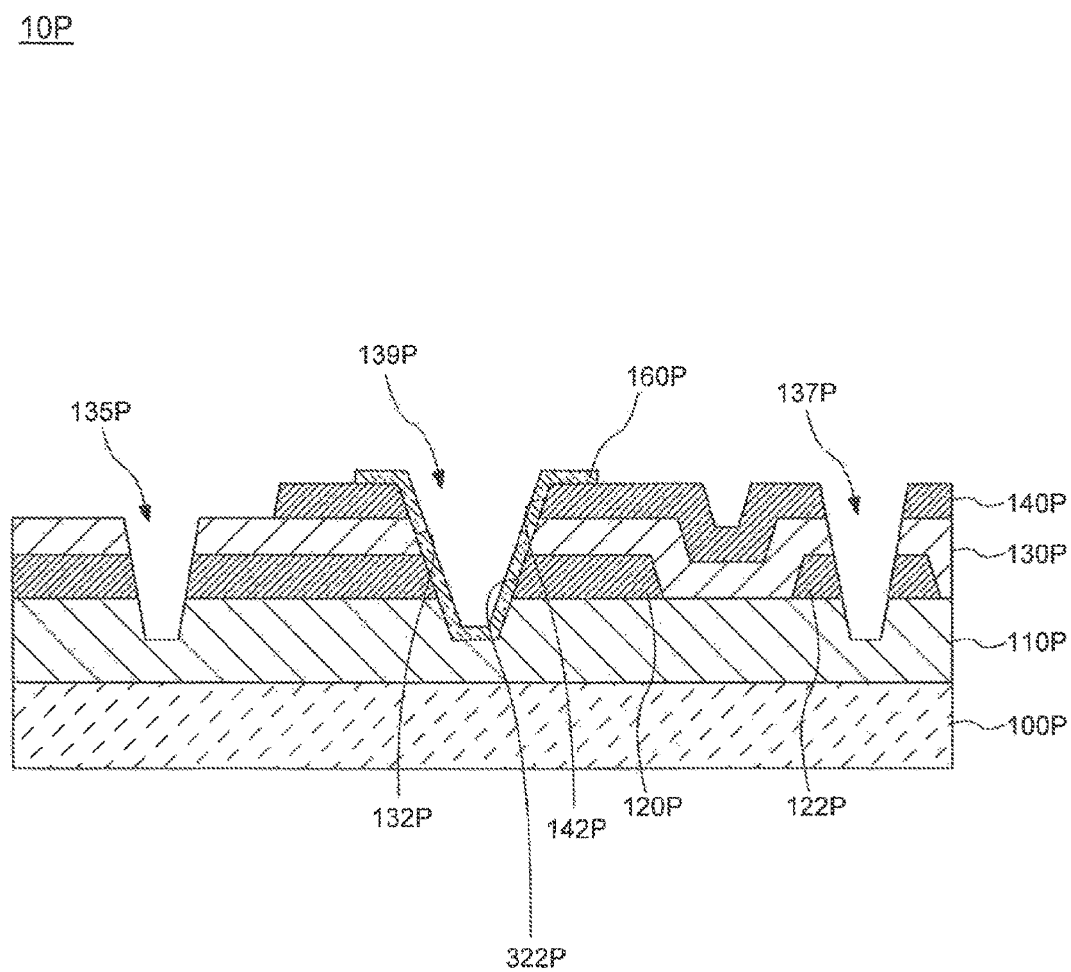
Figure 158:
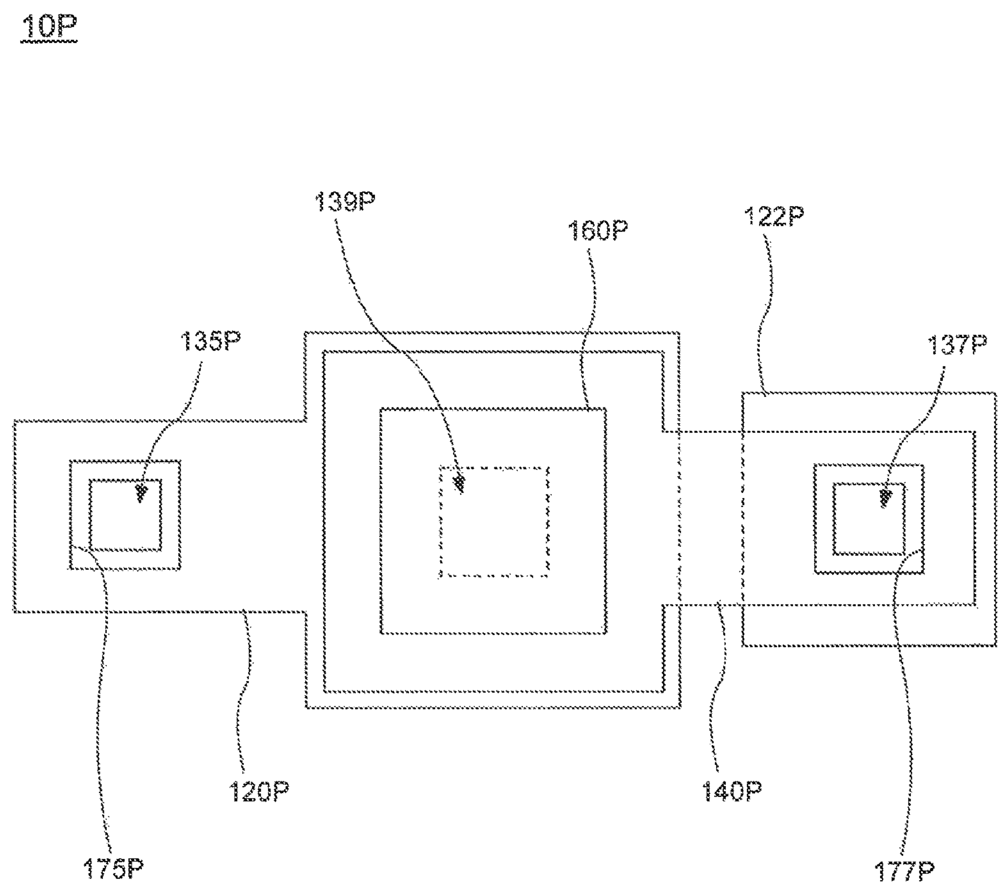
Figure 159:
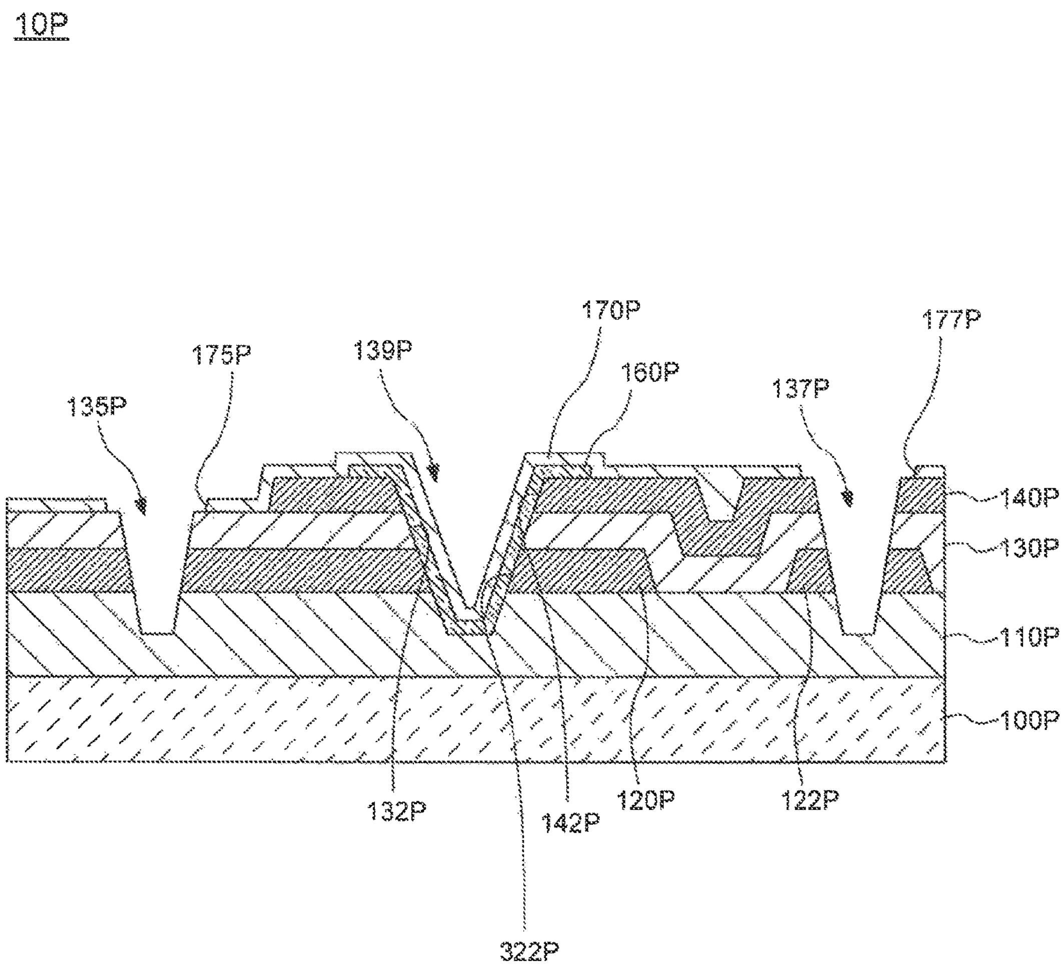
Figure 160:
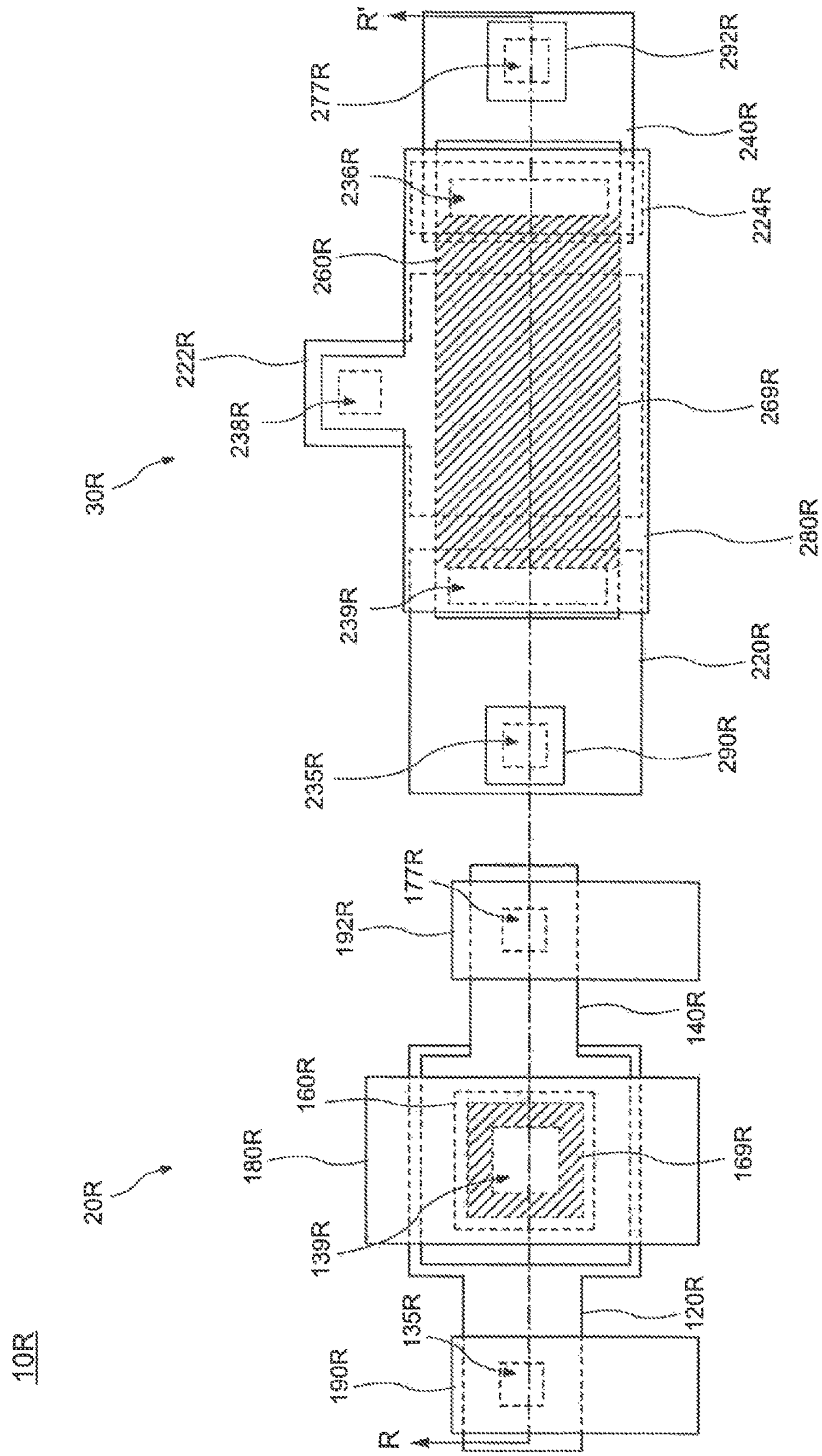
Figure 161:
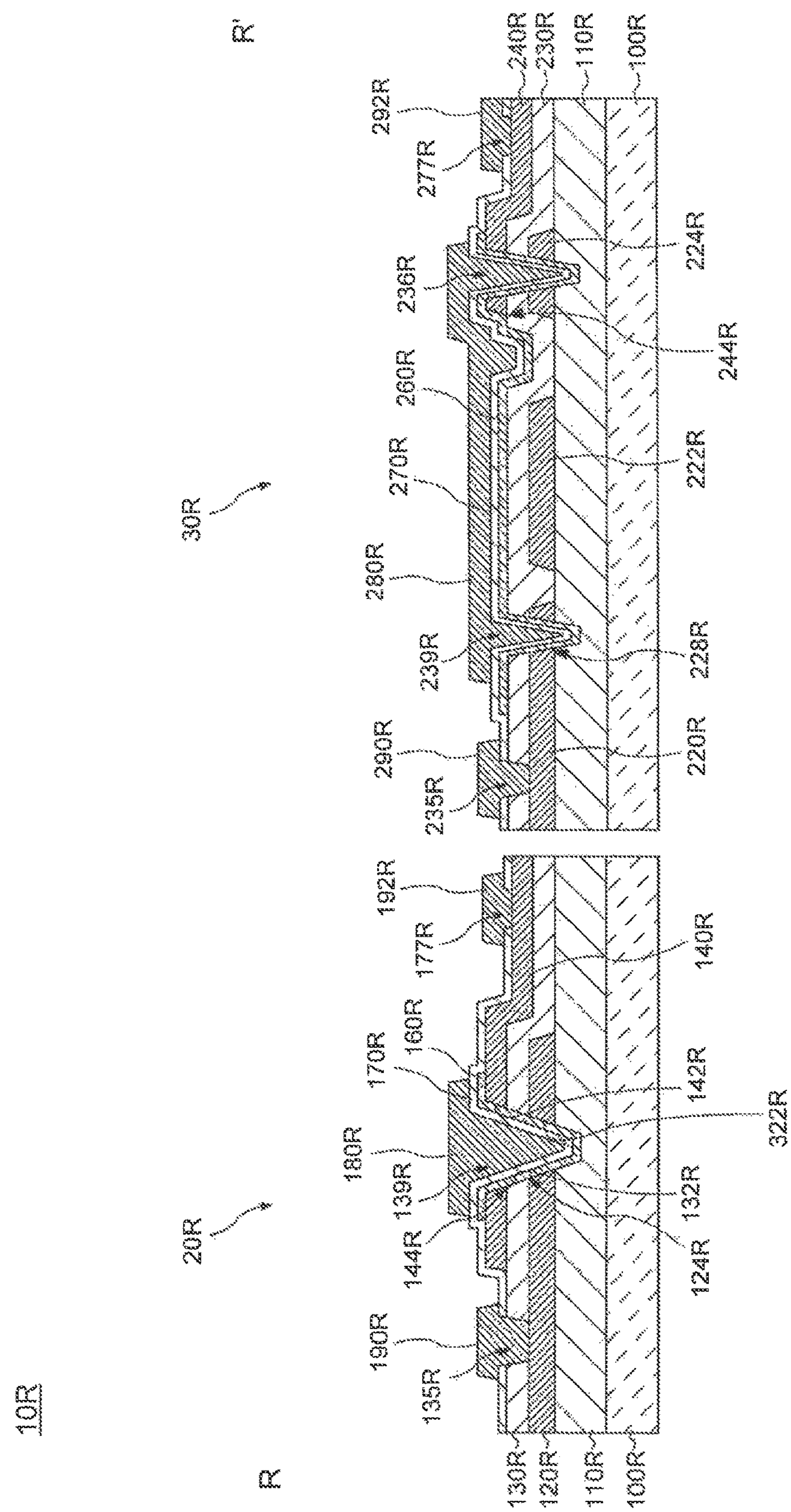
Figure 162:
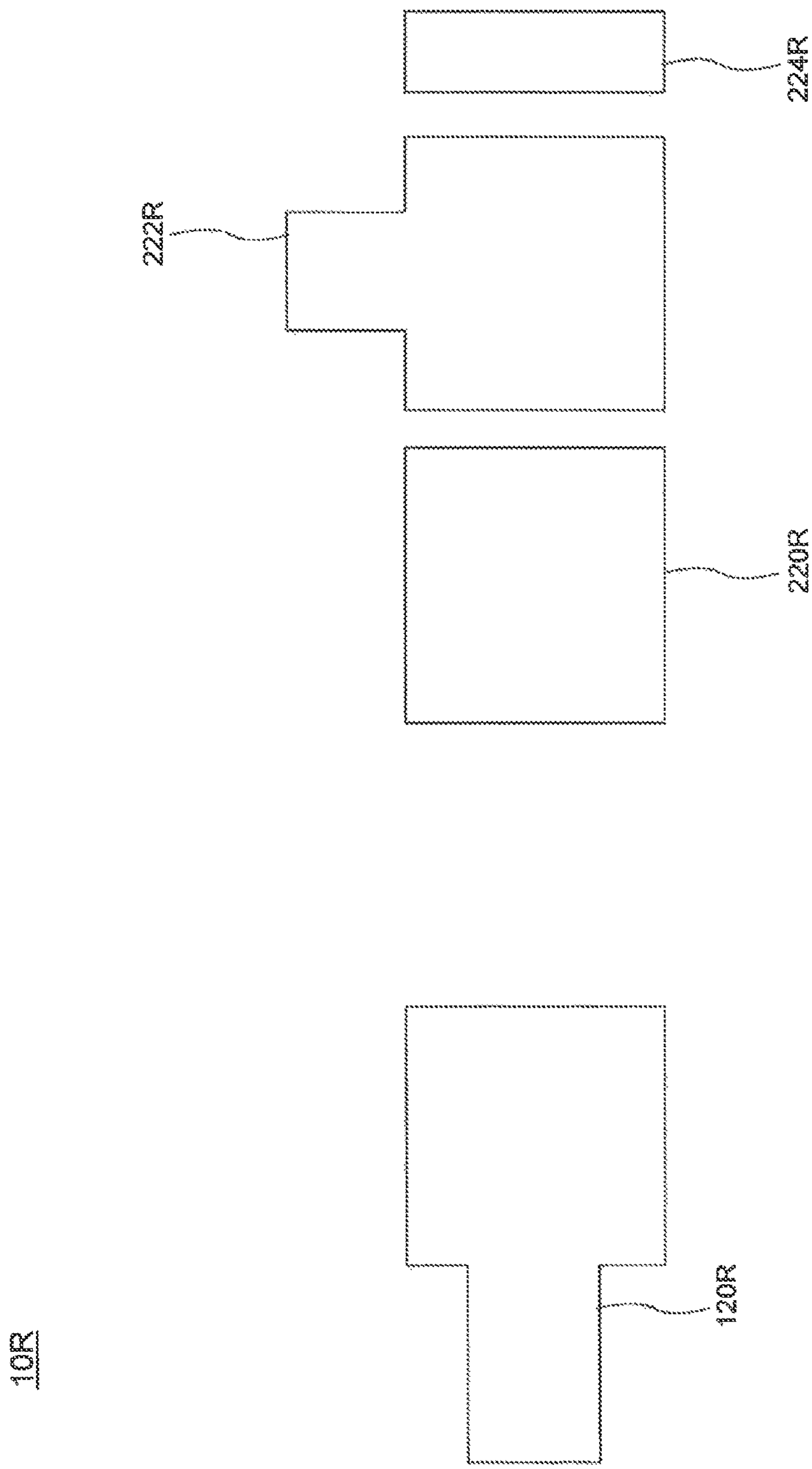
Figure 163:
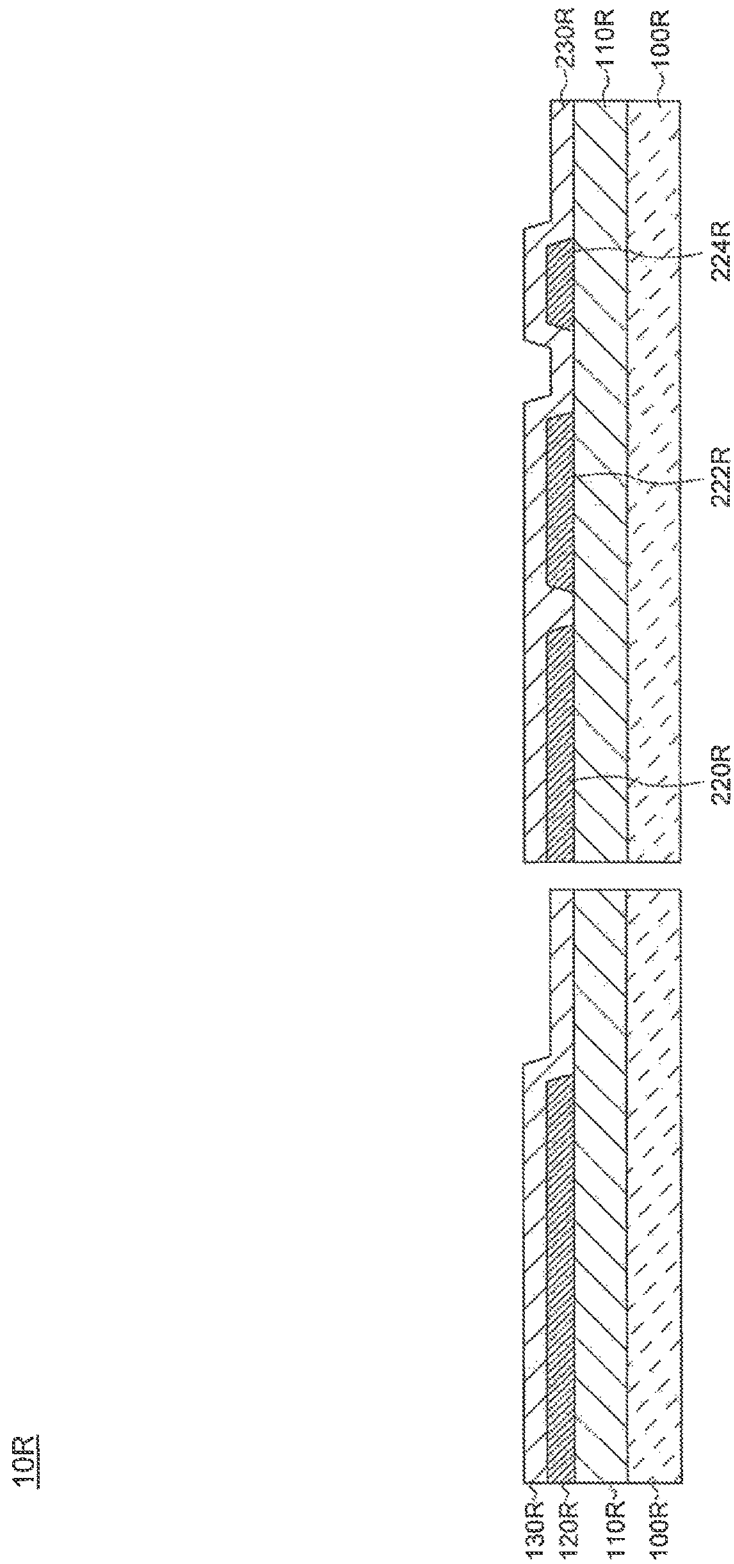
Figure 164:
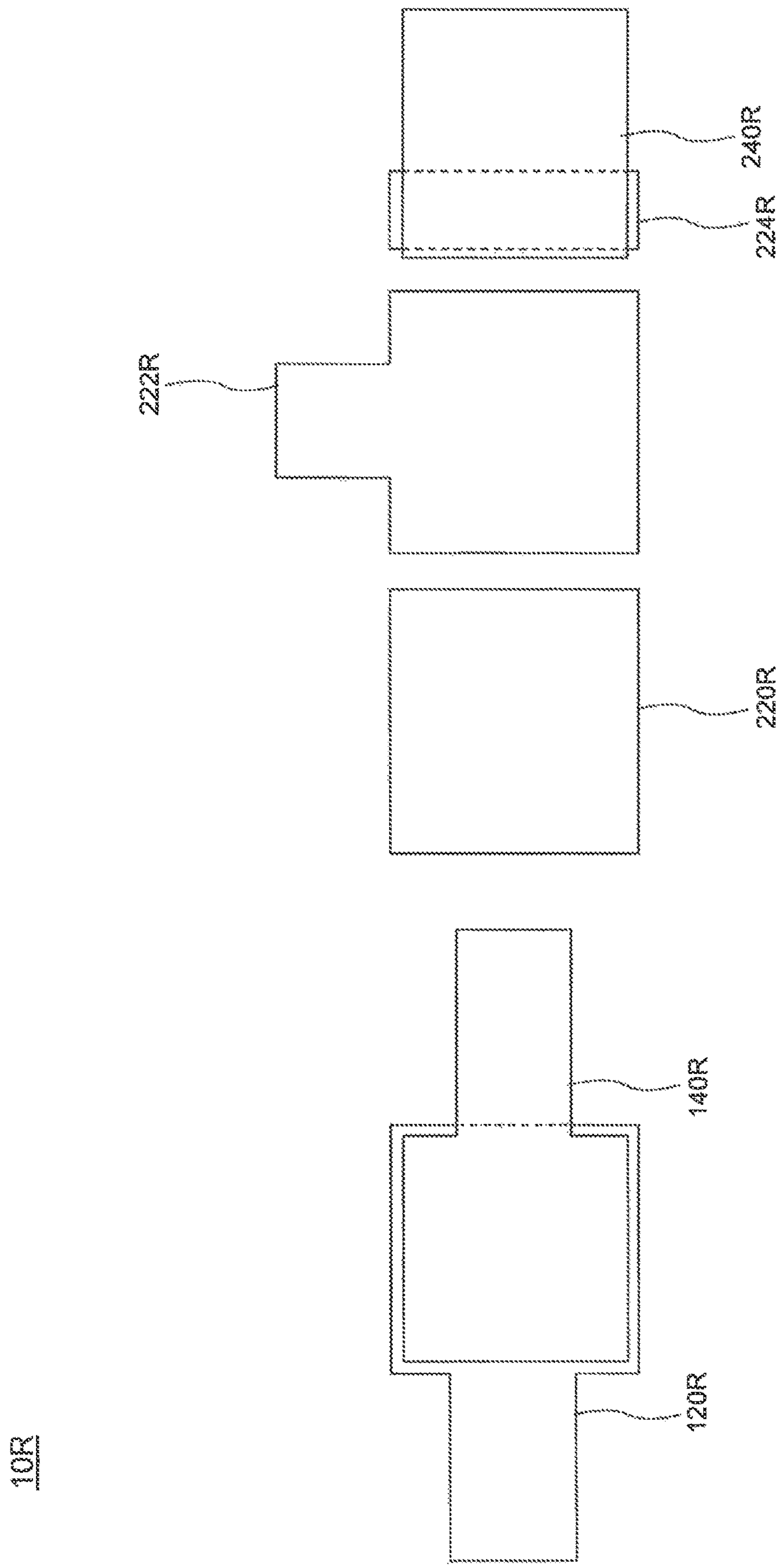
Figure 165:
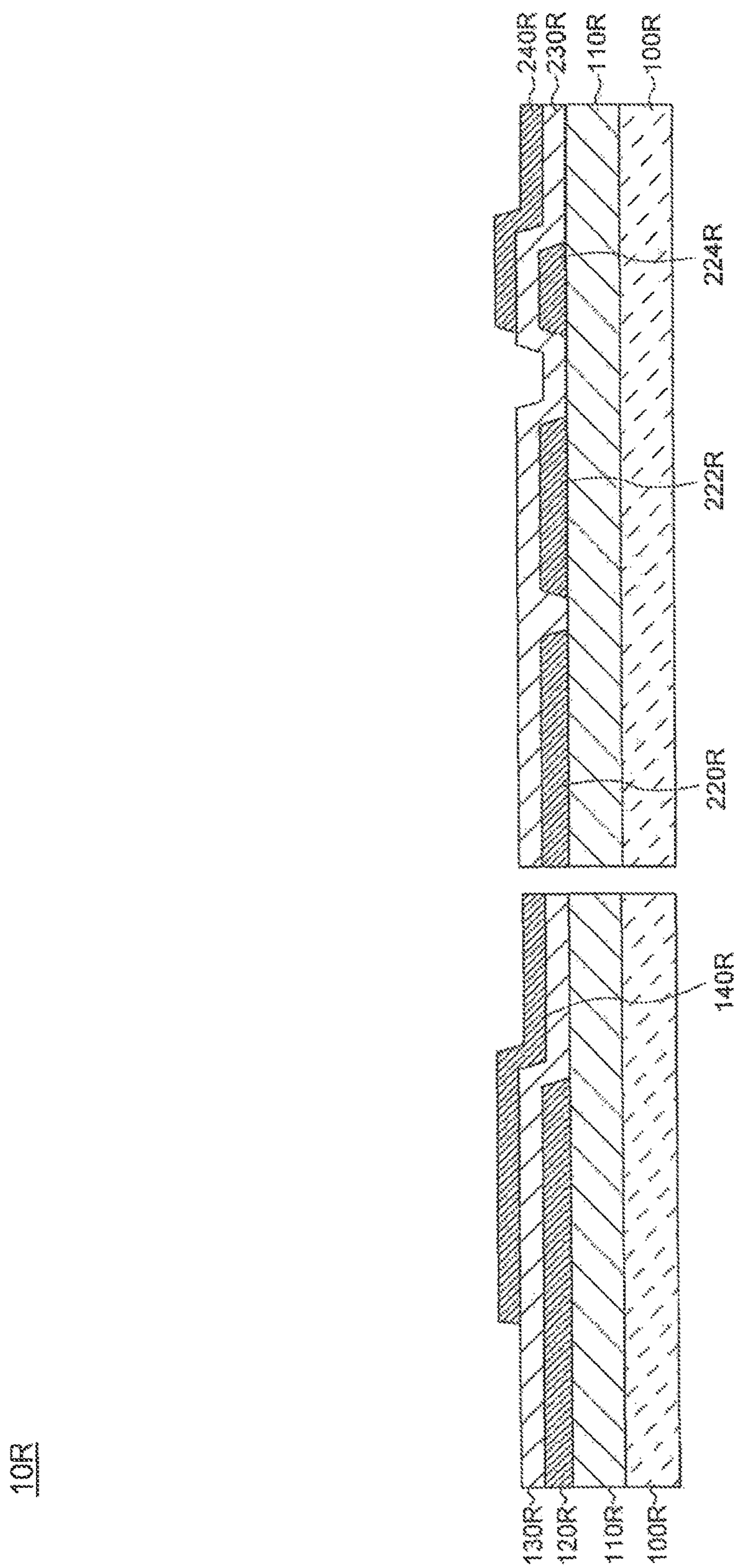
Figure 166:
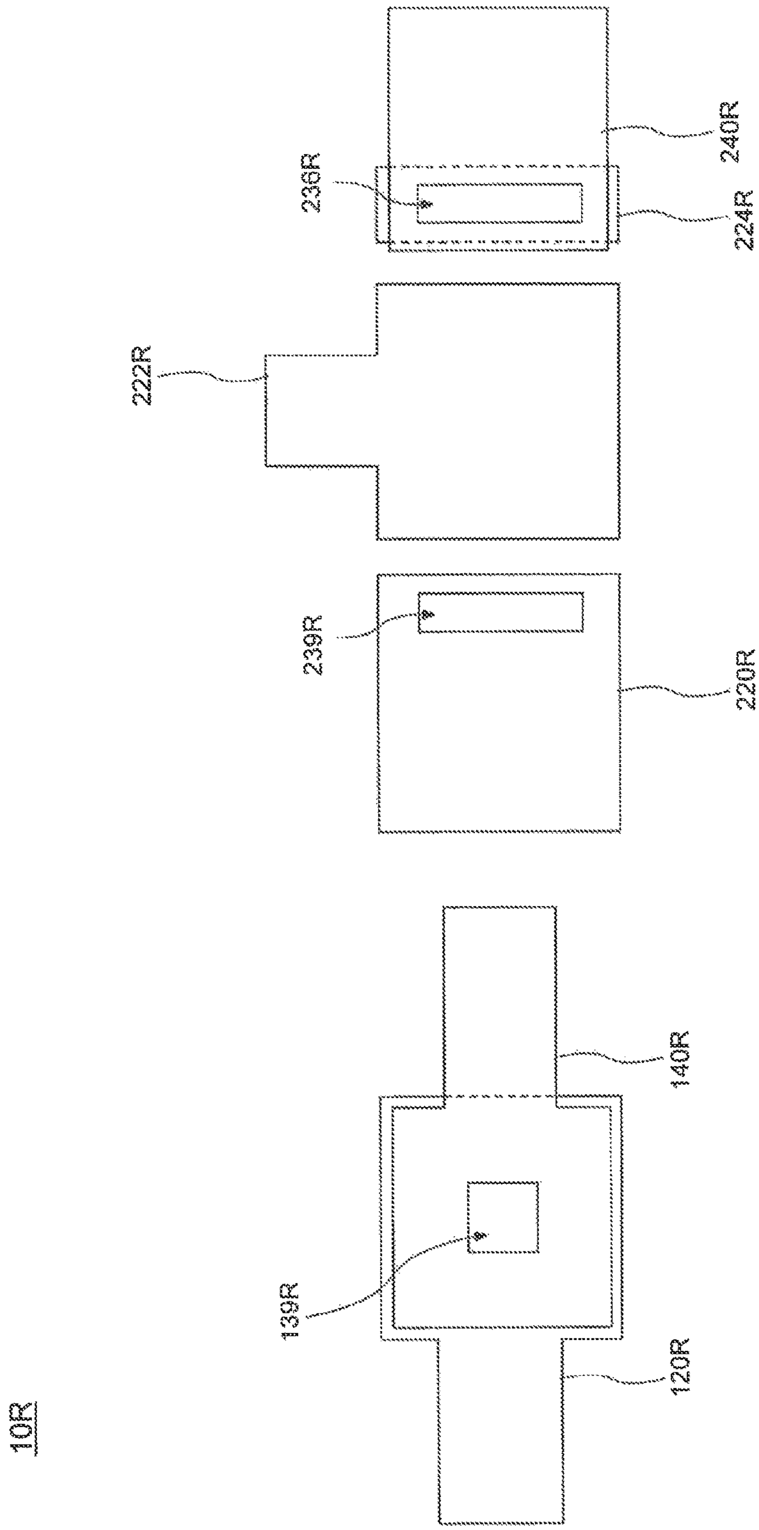
Figure 167:
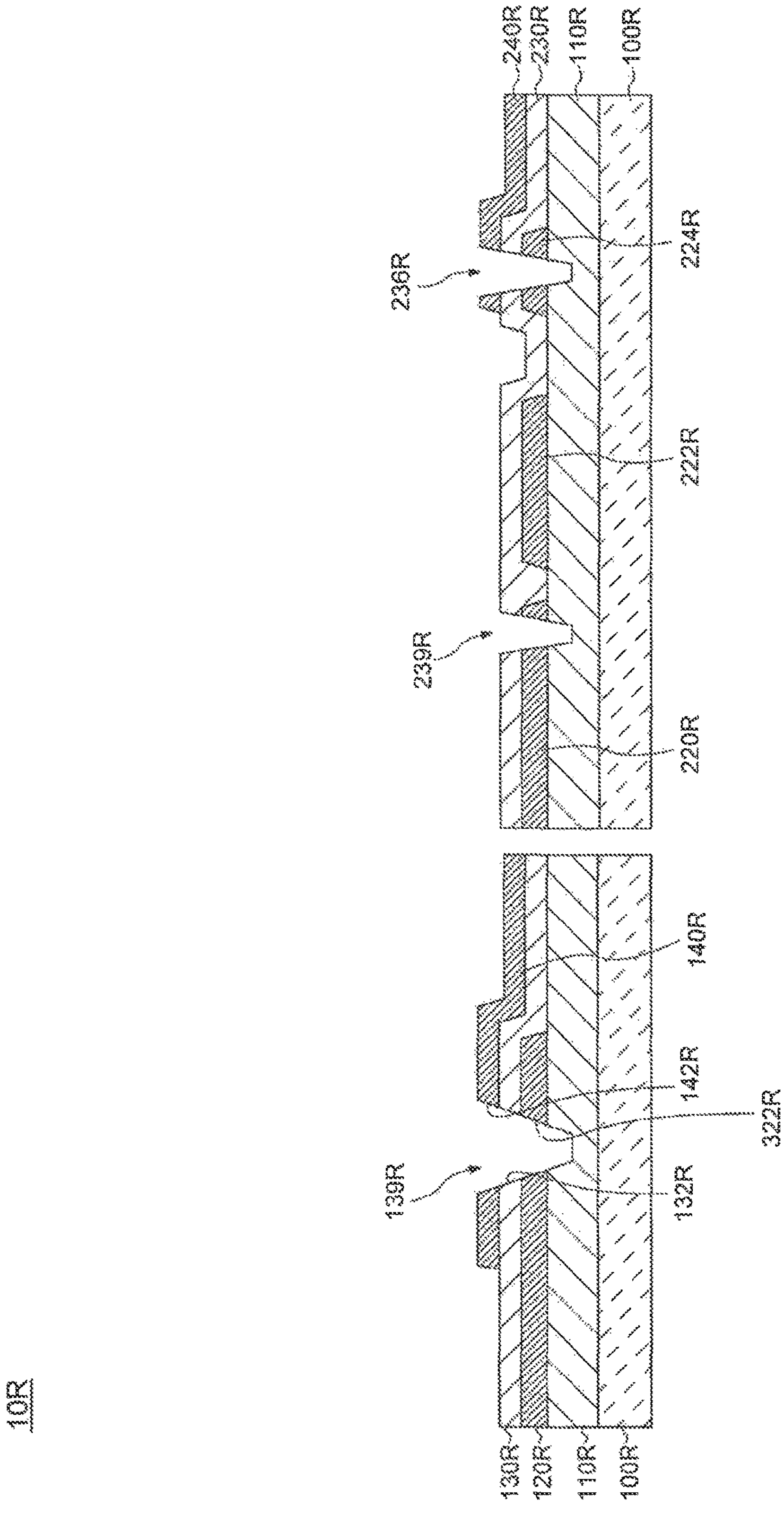
Figure 168:
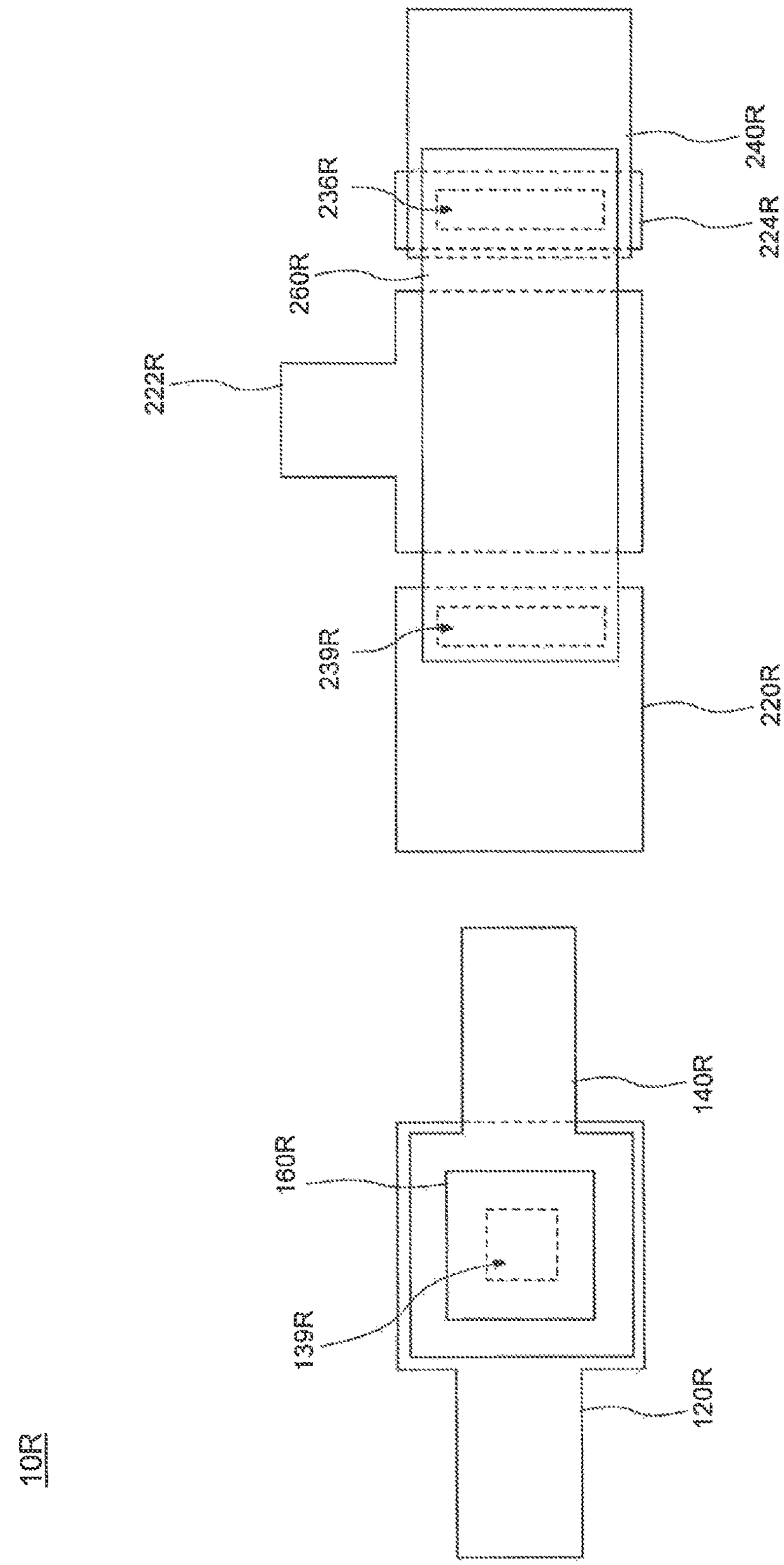
Figure 169:
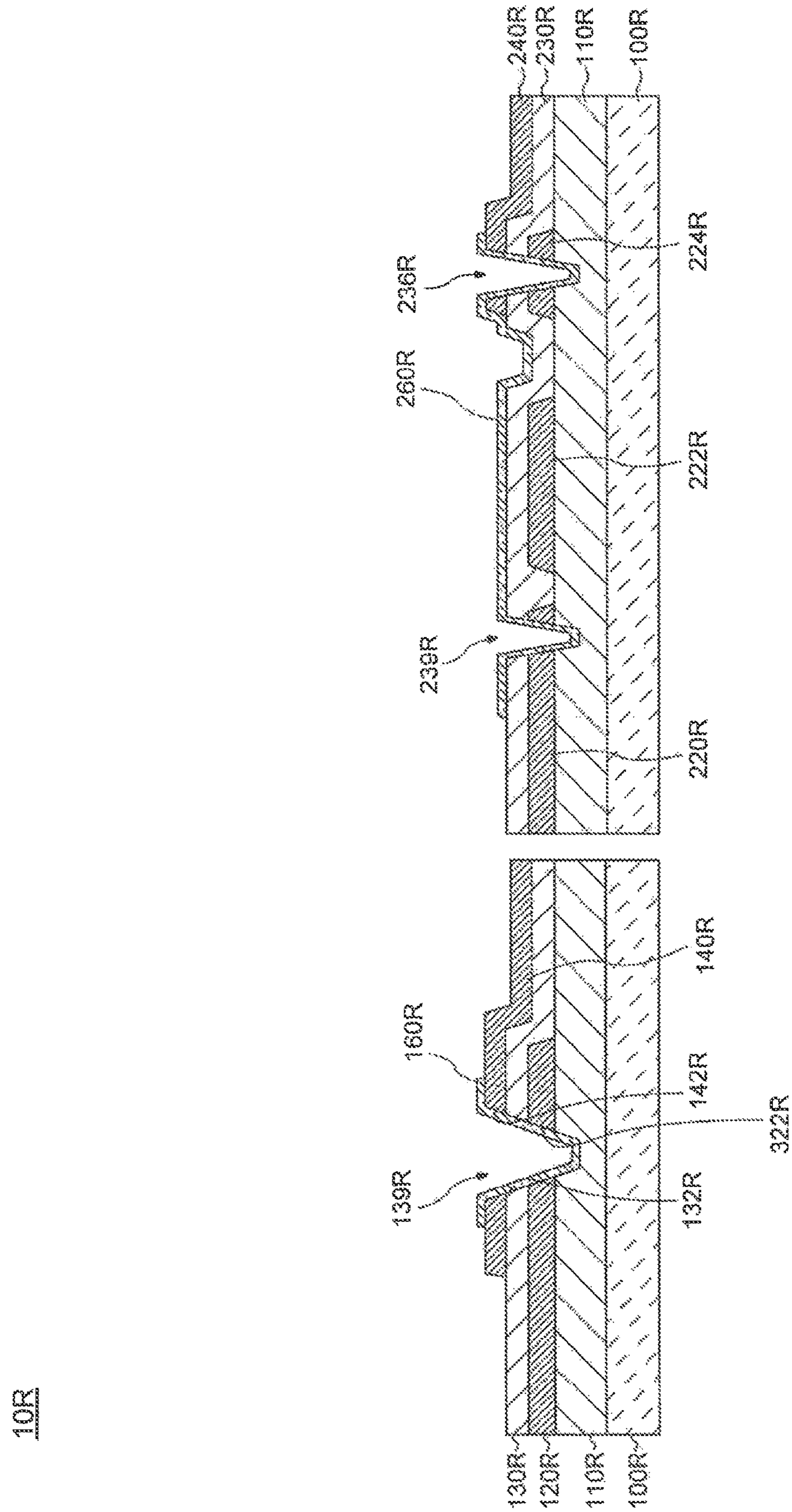
Figure 170:
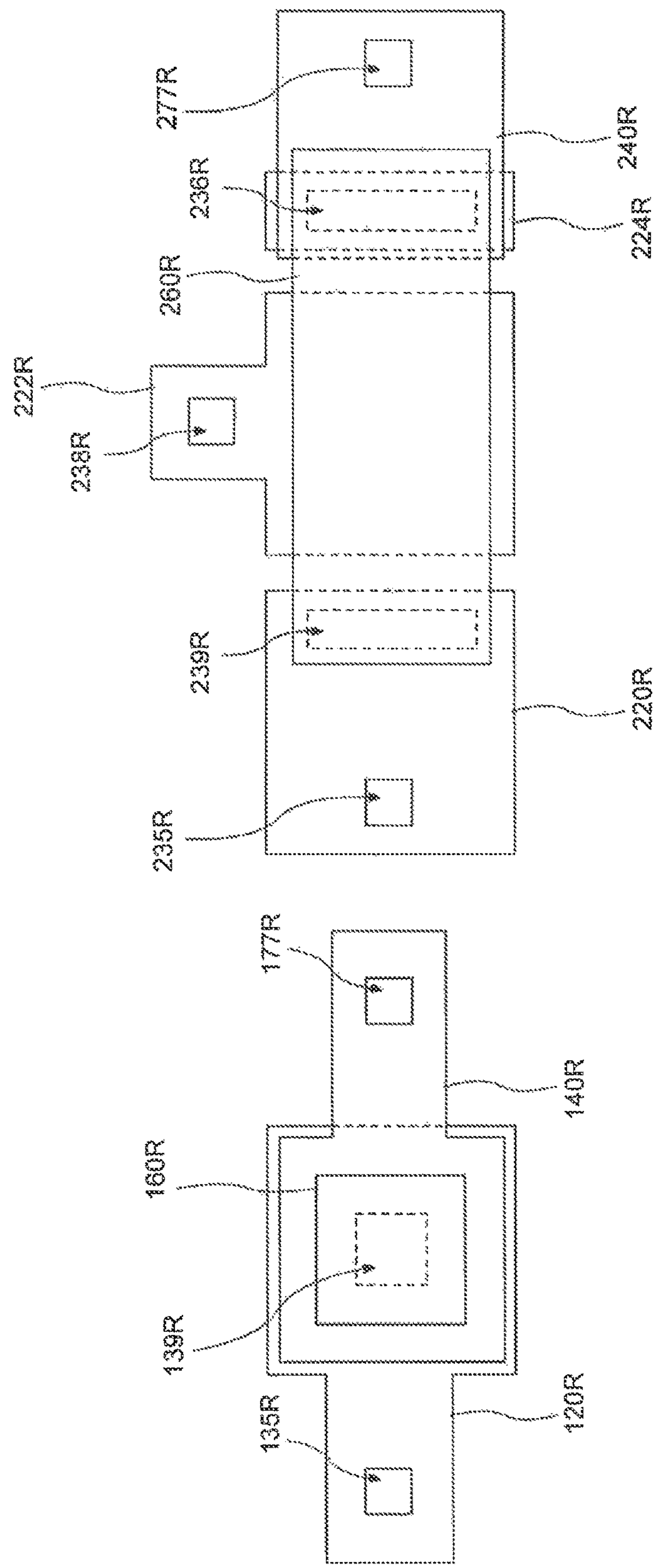
Figure 171:
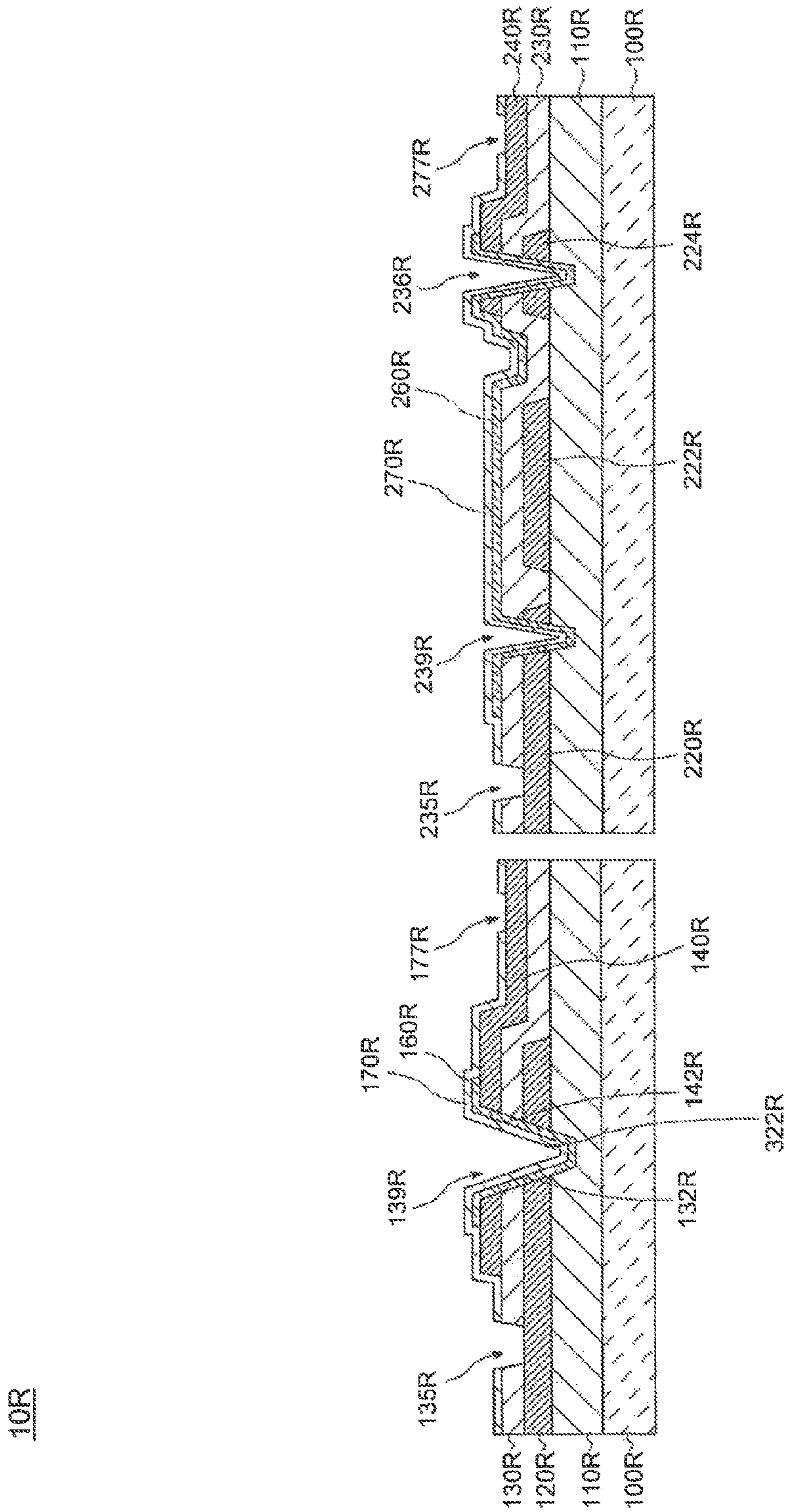
Figure 172:
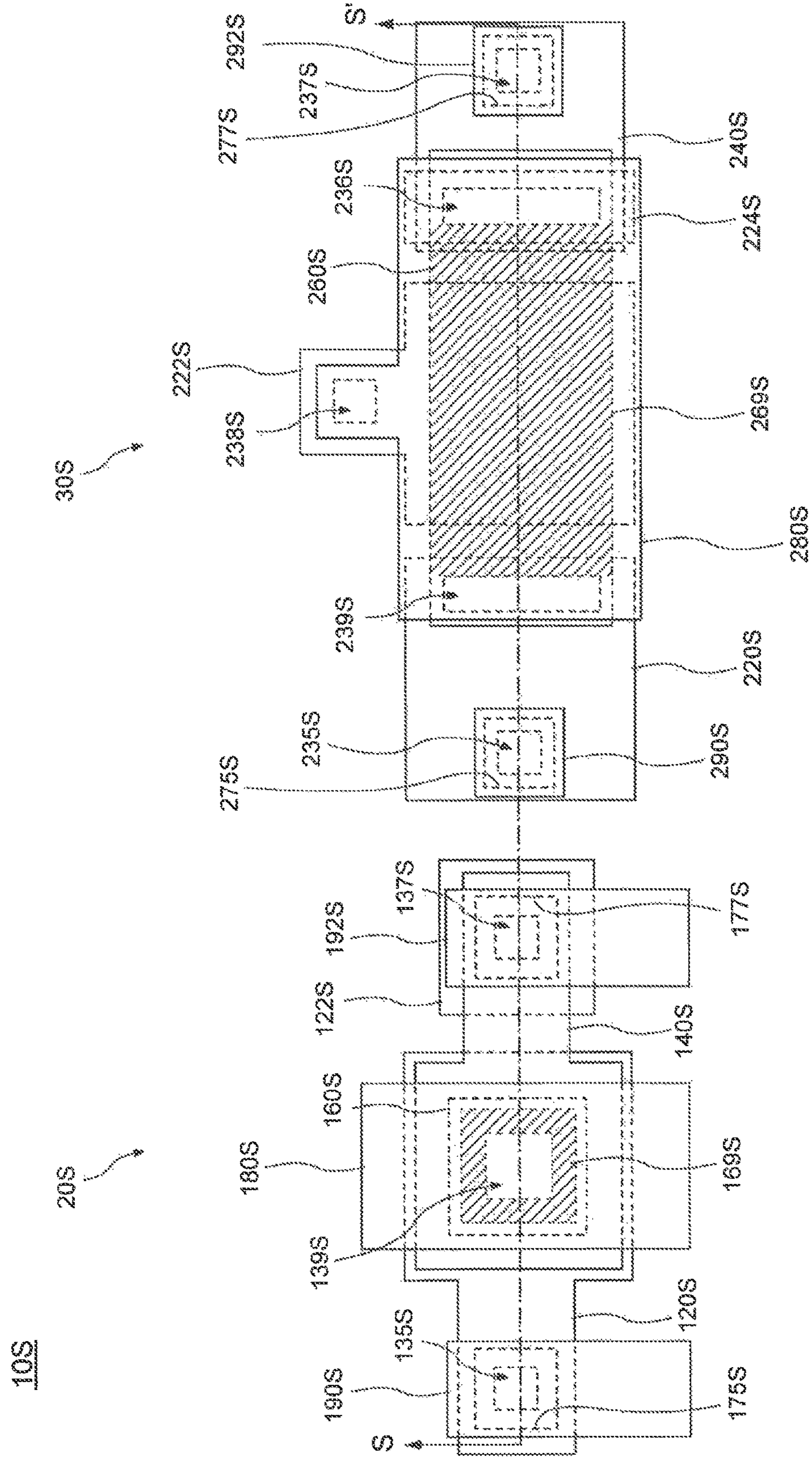
Figure 173:
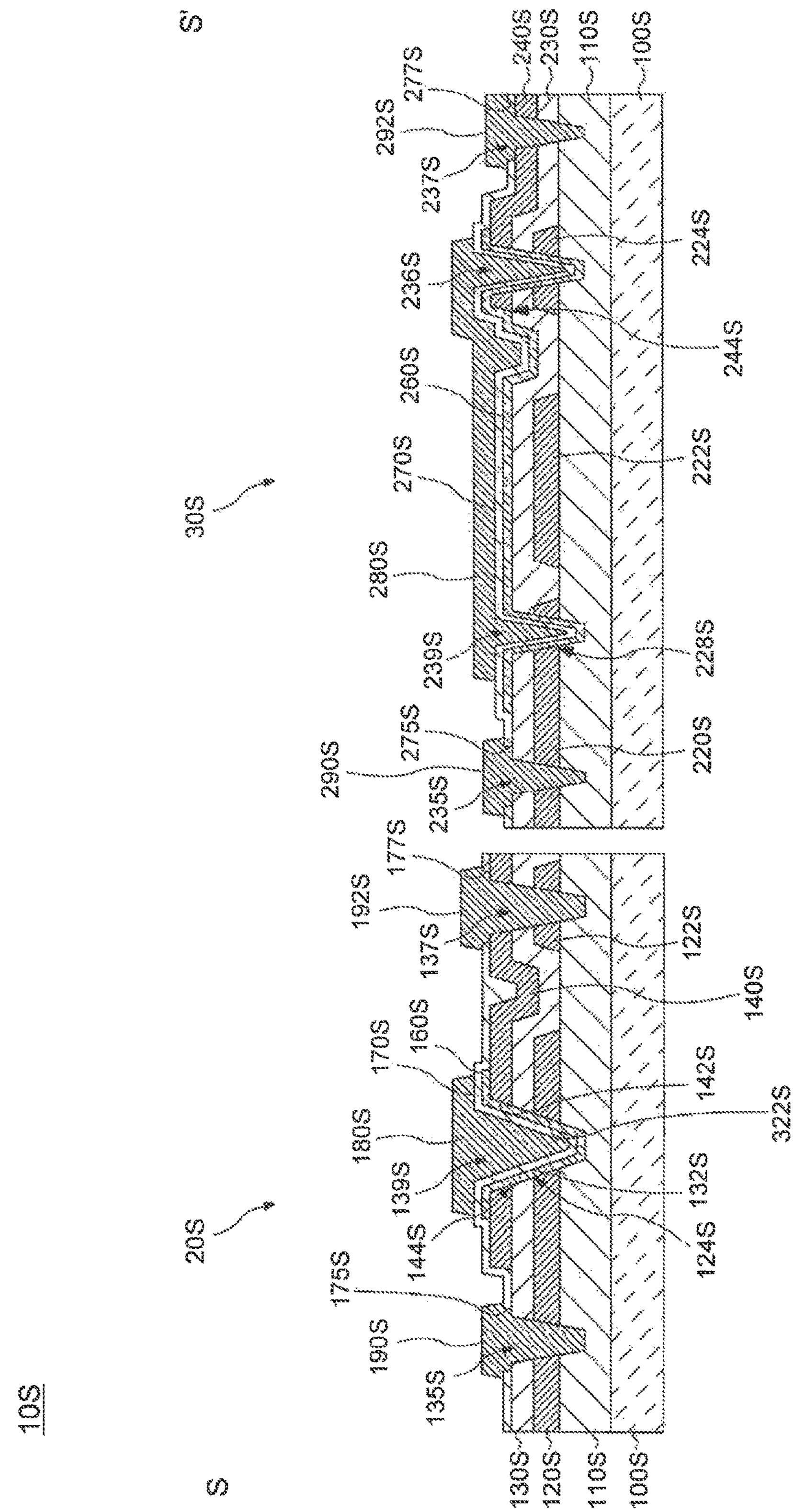
Figure 174:
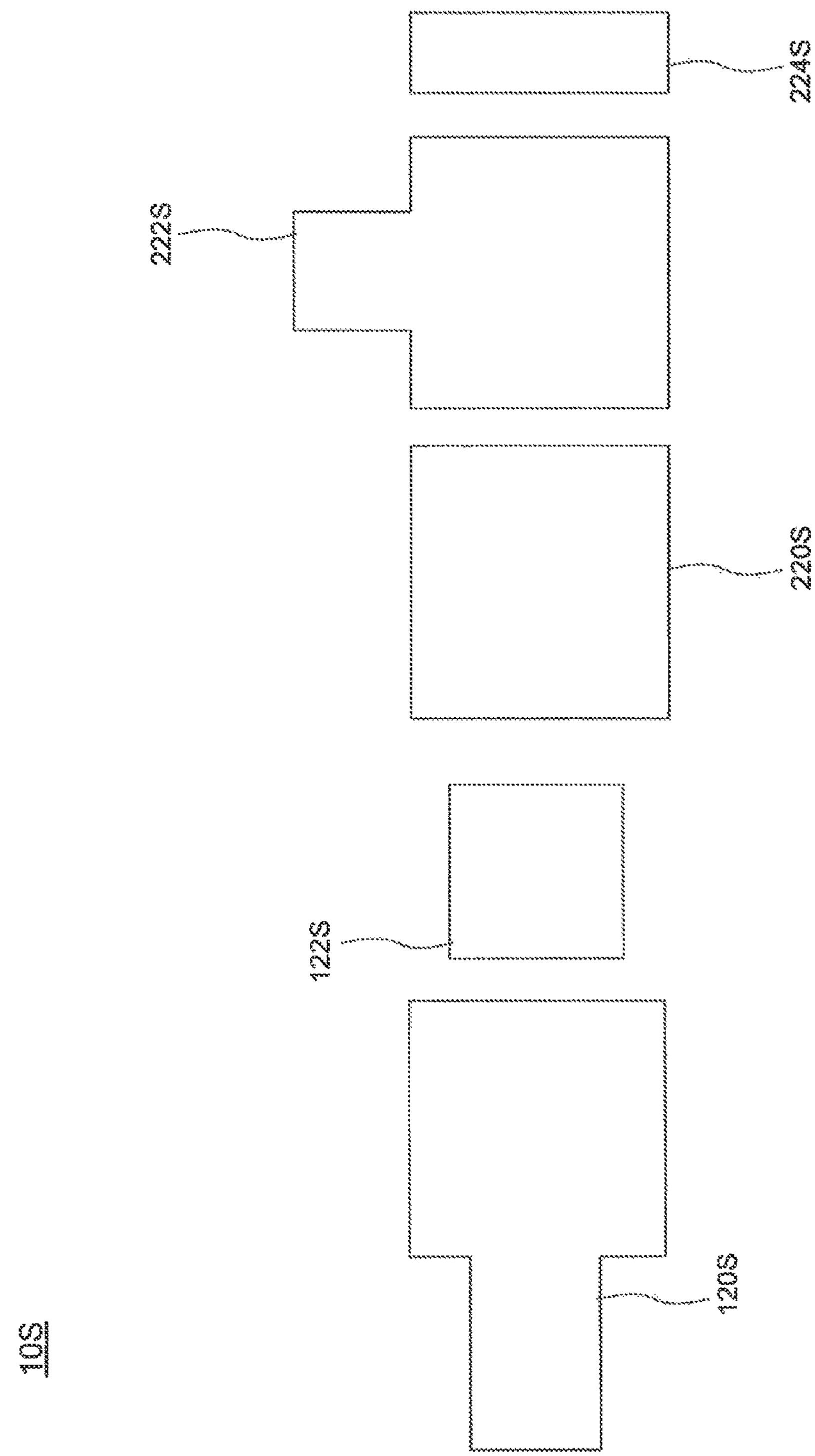
Figure 175:
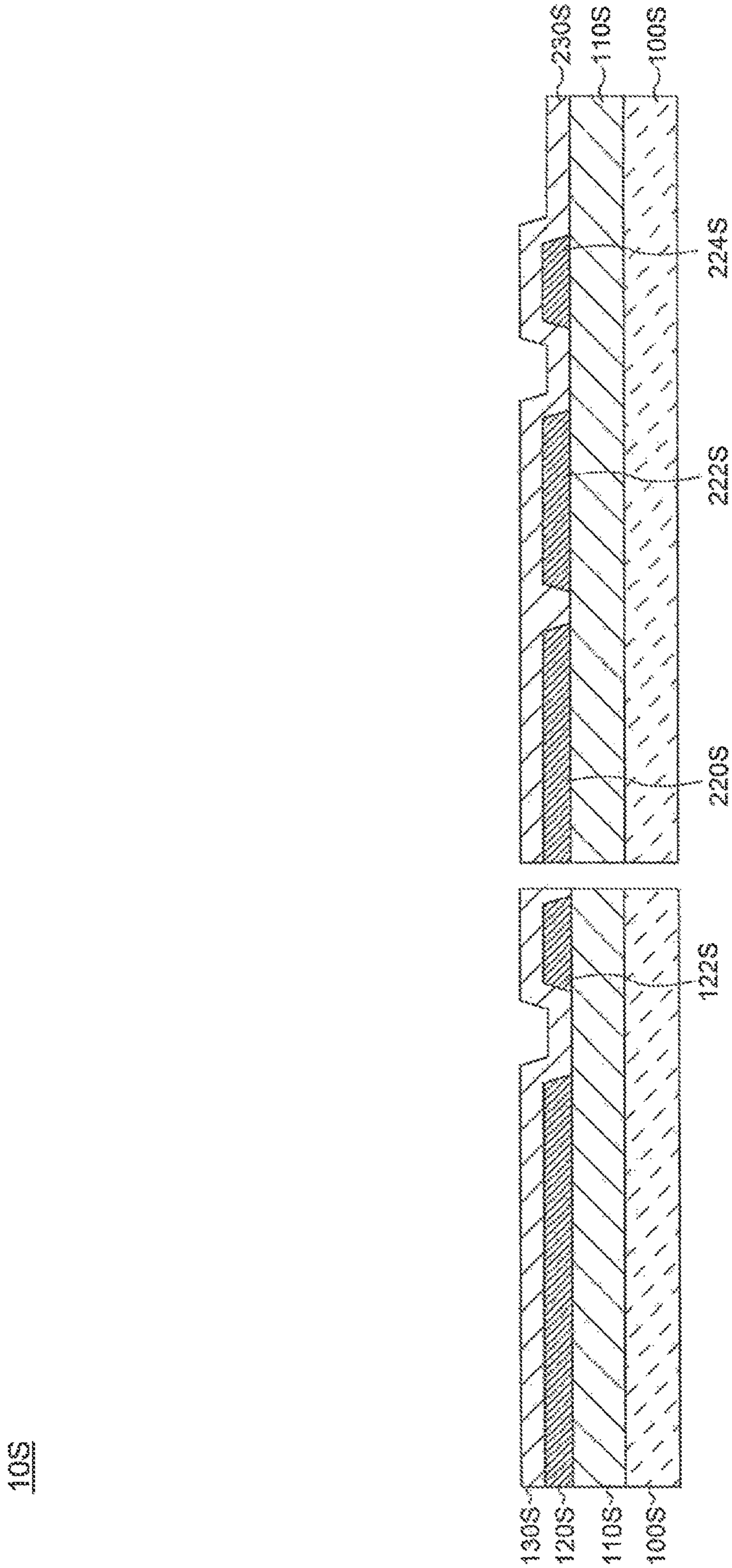
Figure 176:
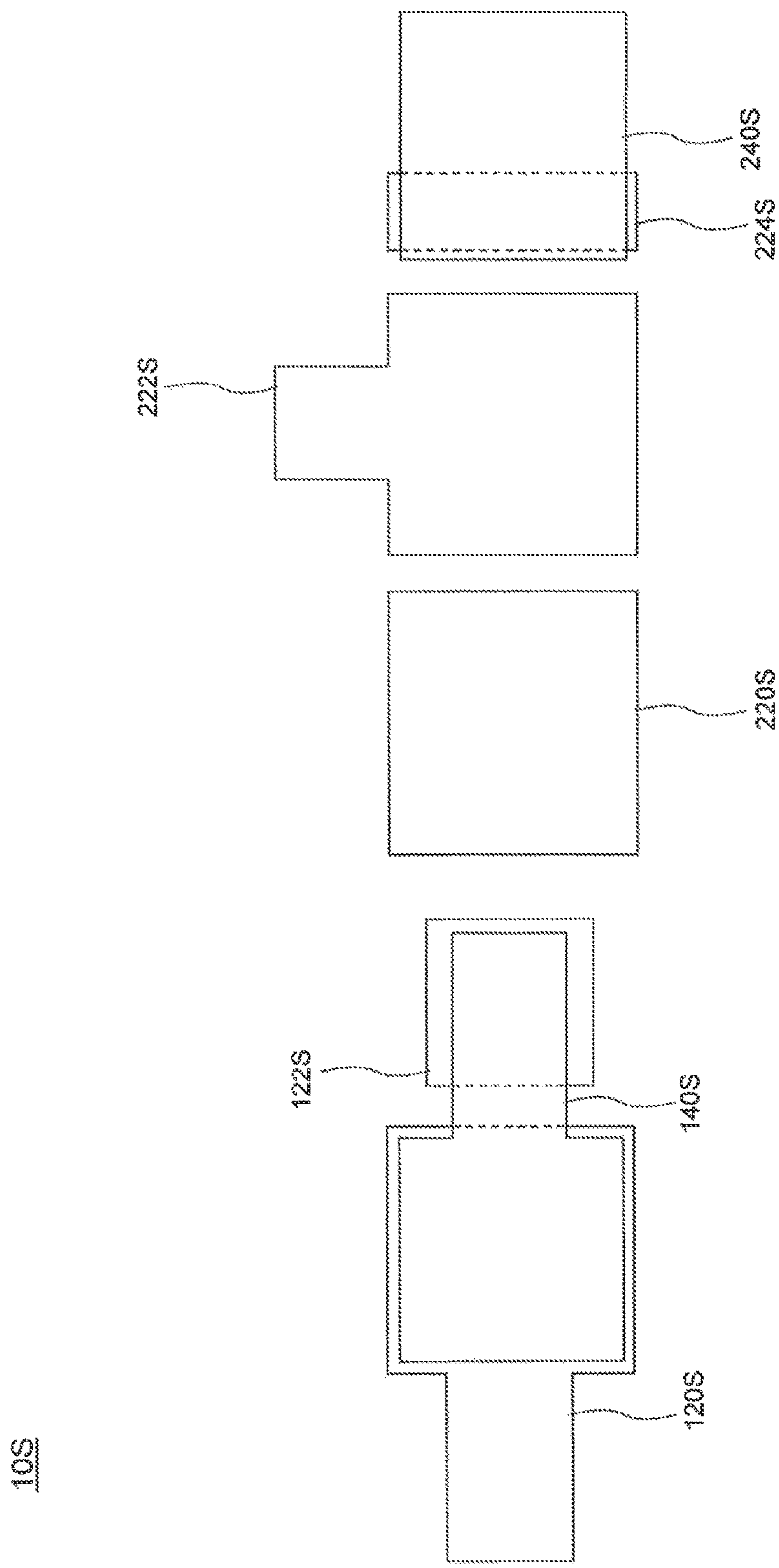
Figure 177:
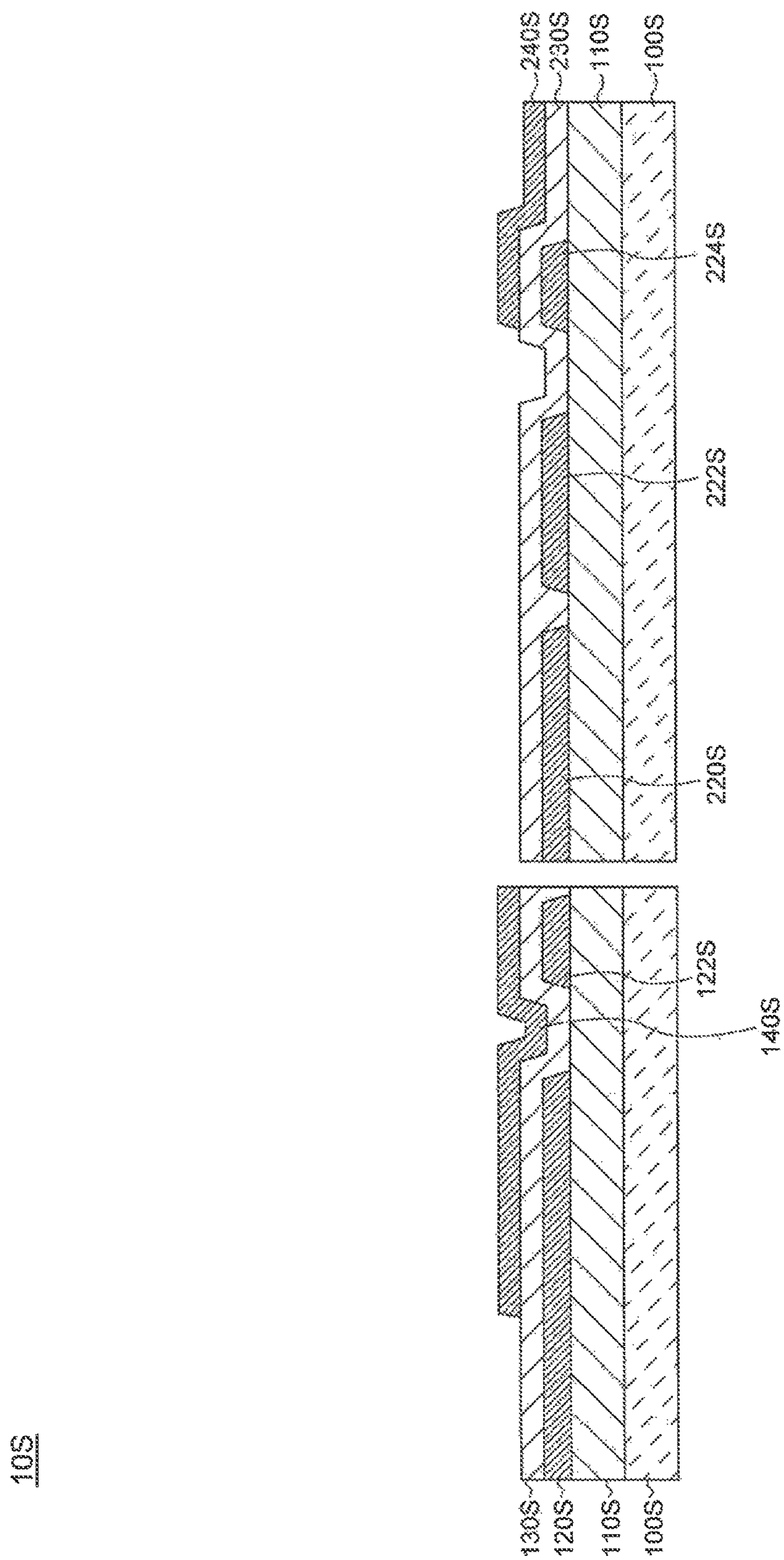
Figure 178:
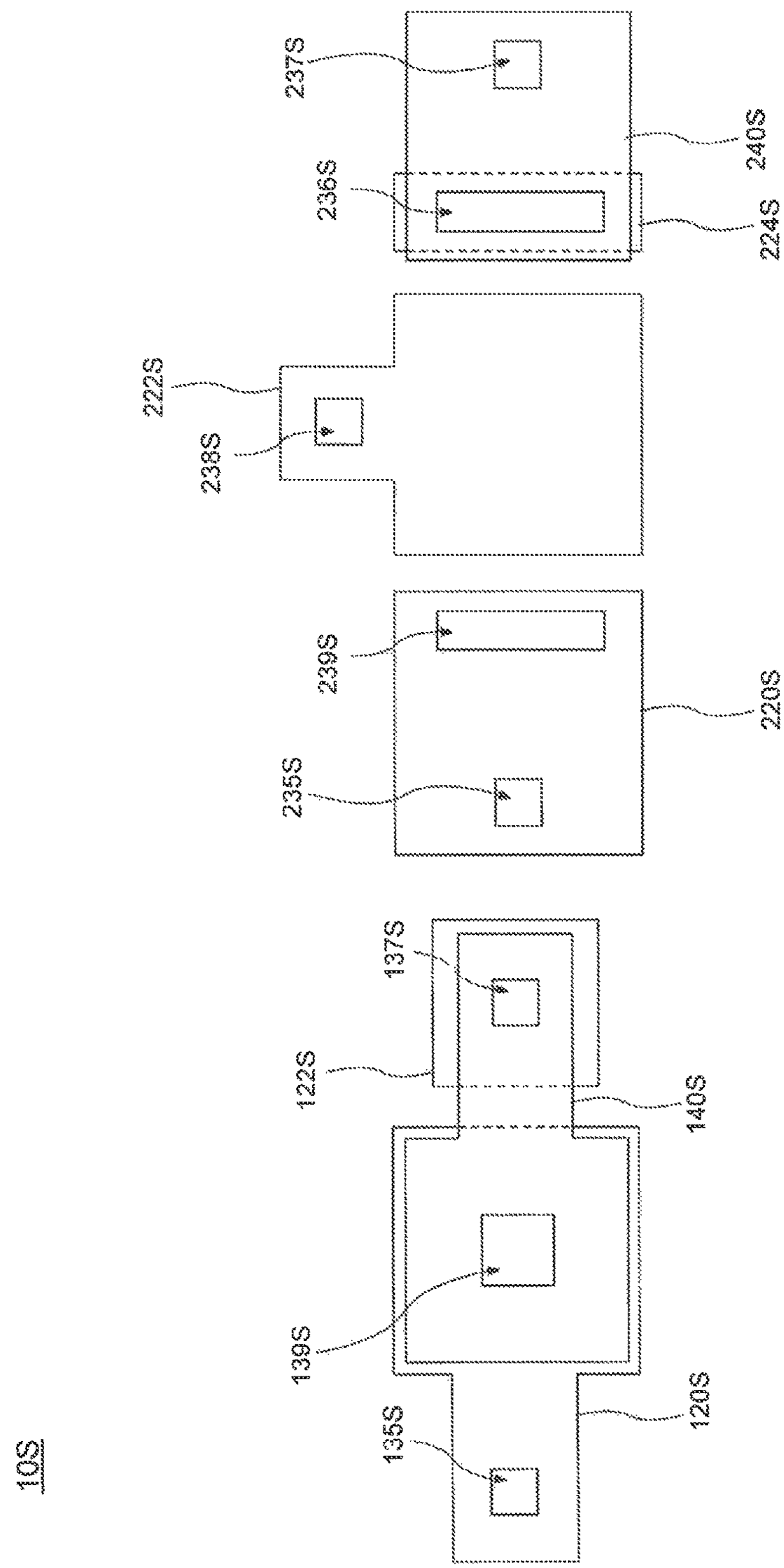
Figure 179:
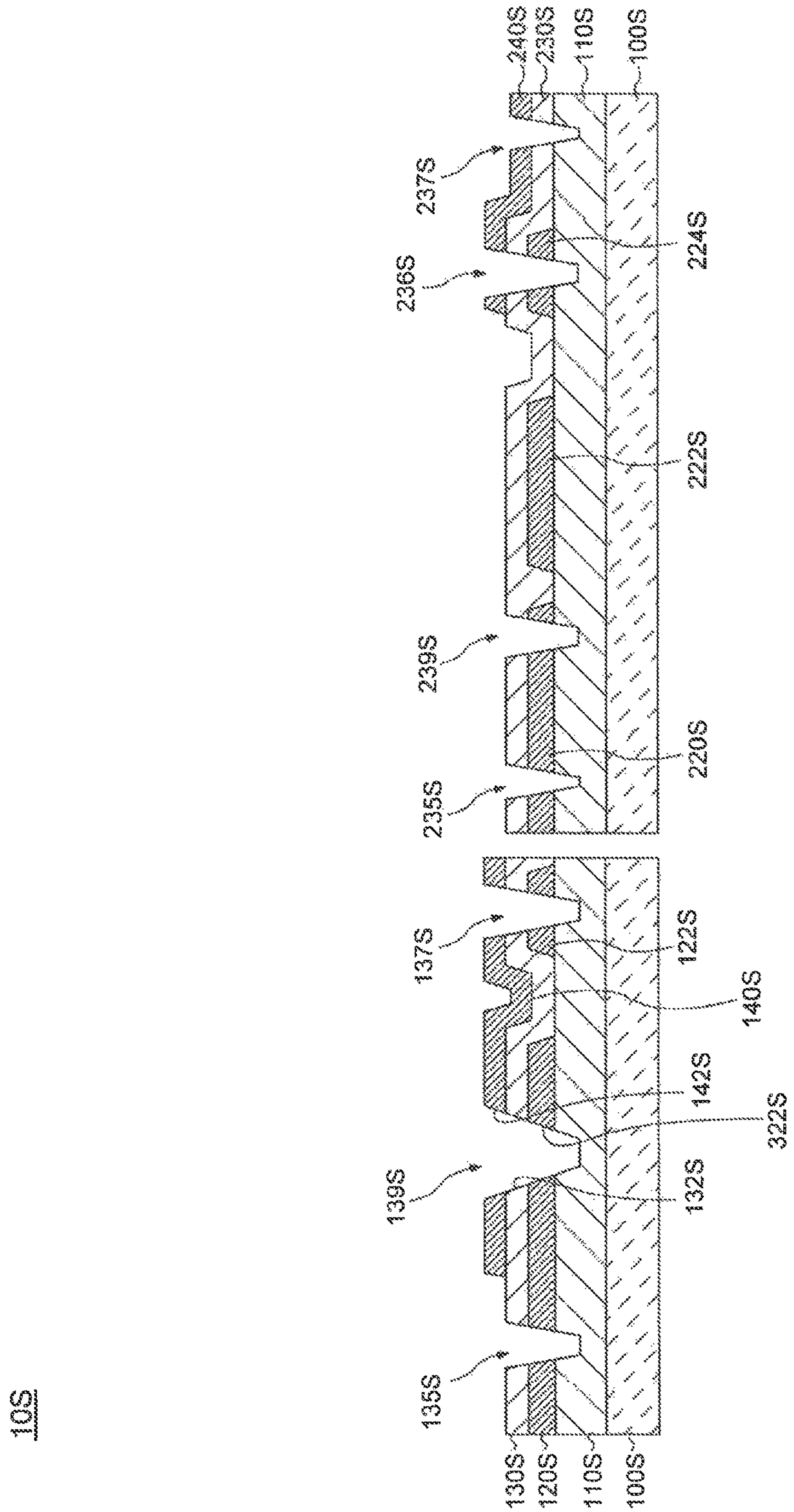
Figure 180:
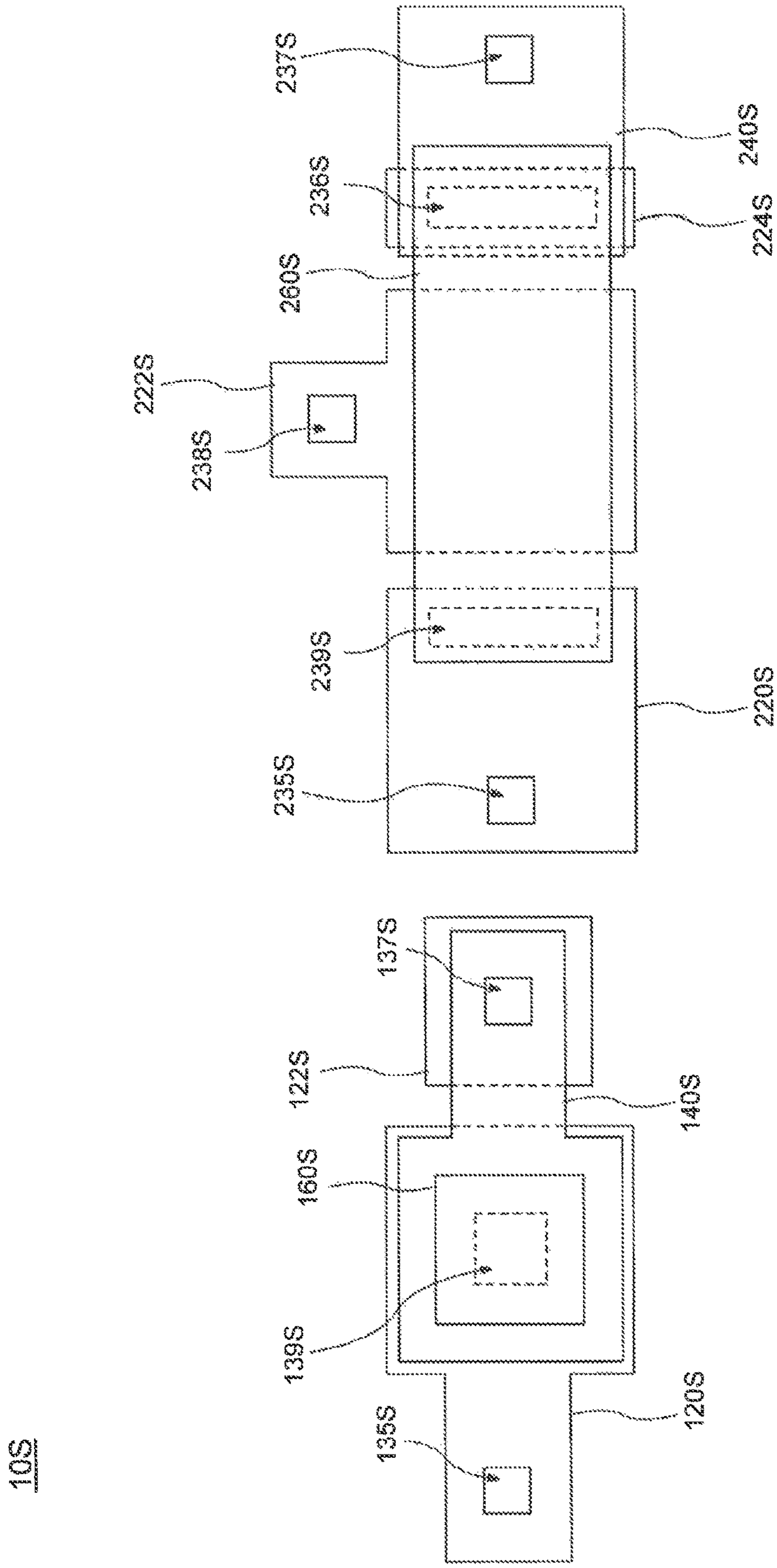
Figure 181:
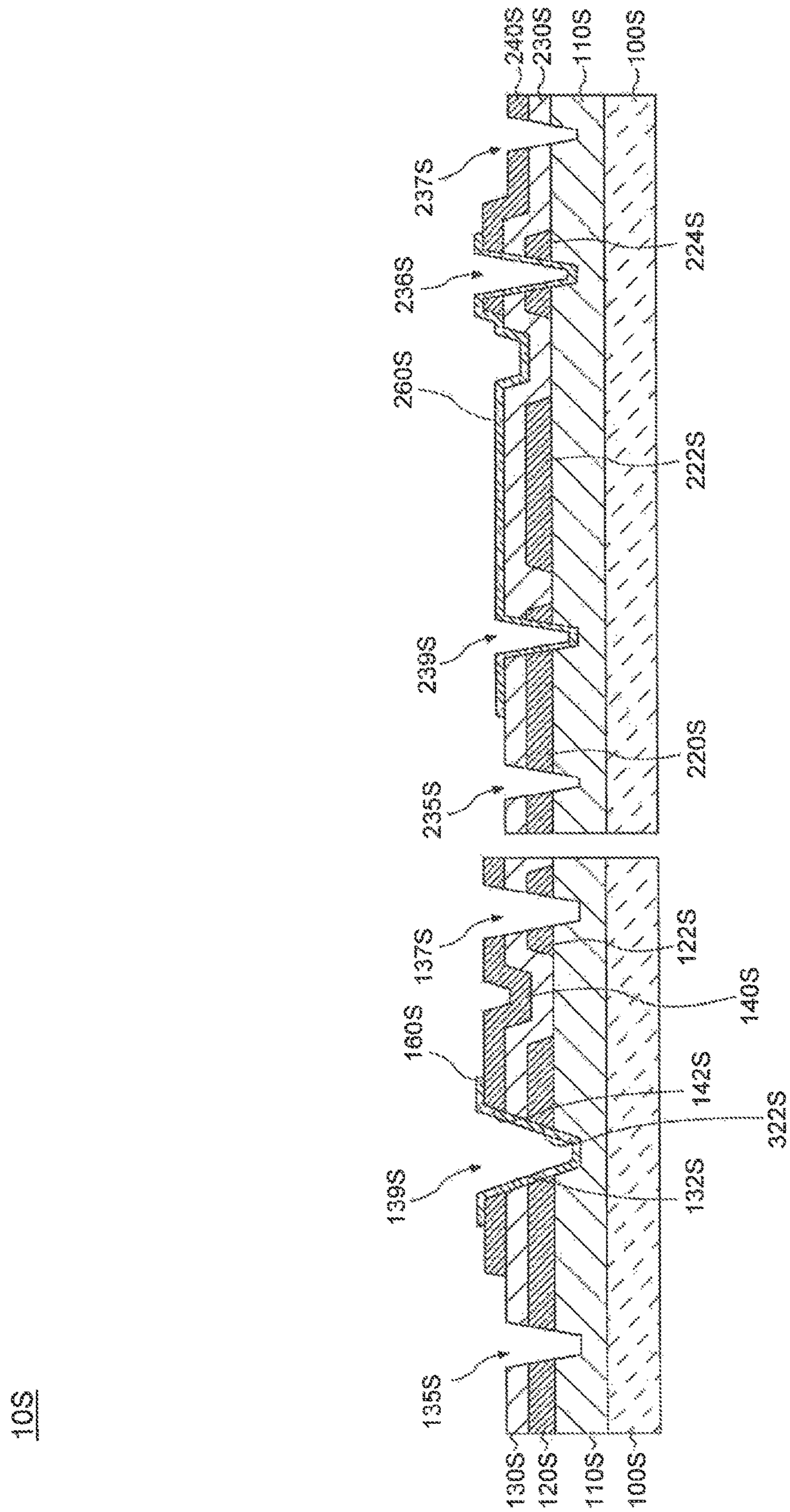
Figure 182:
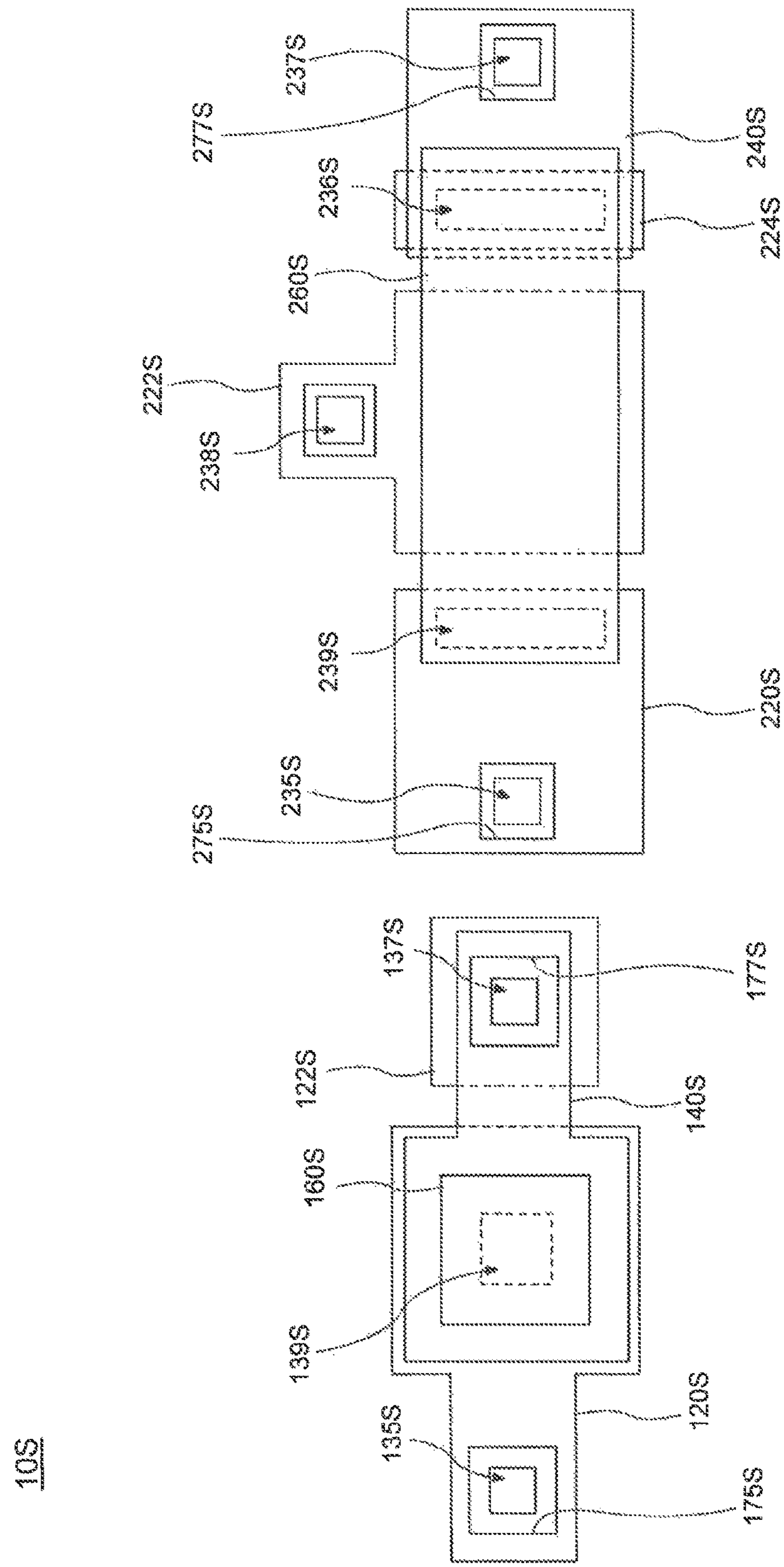
Figure 183:
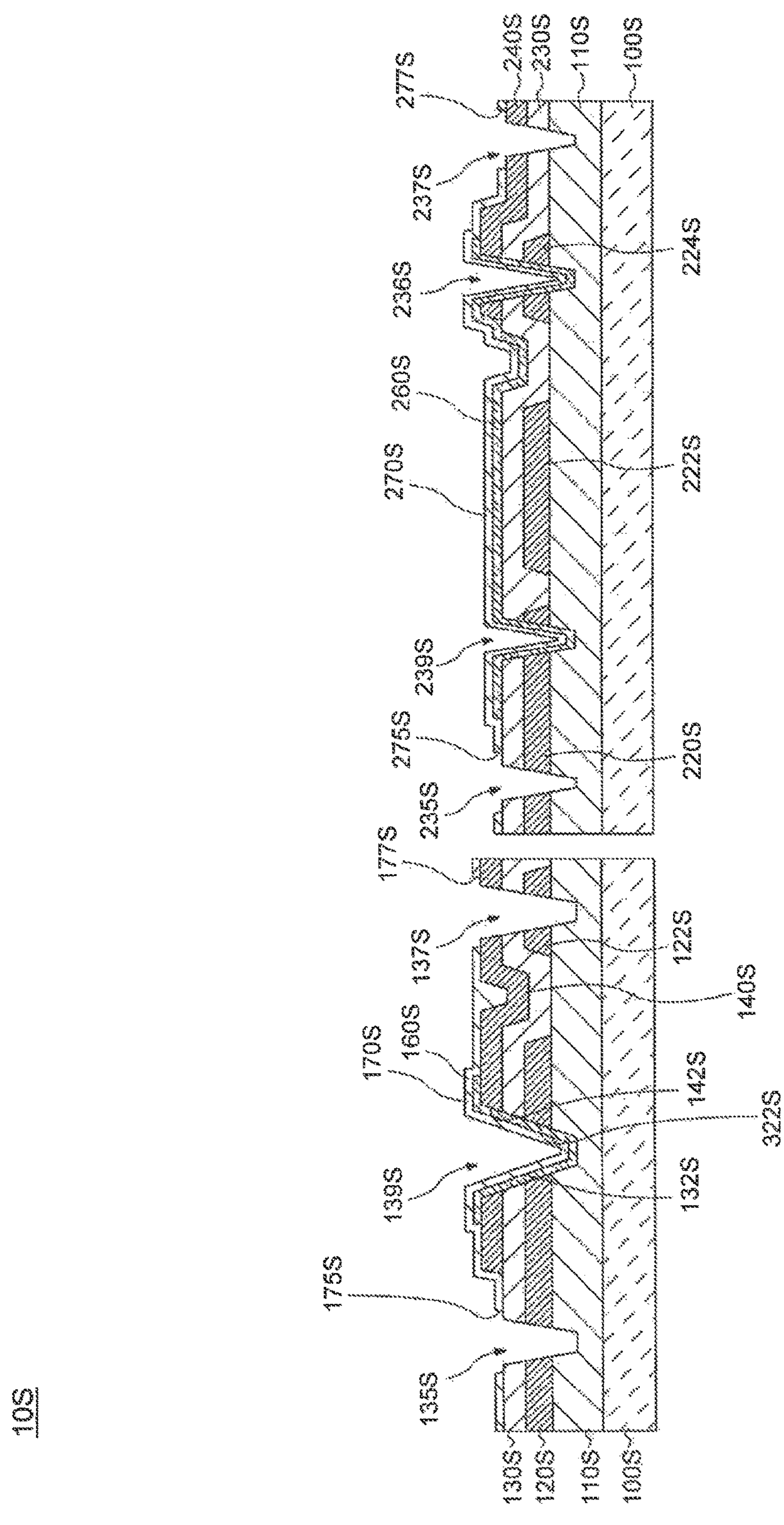
Figure 184A:
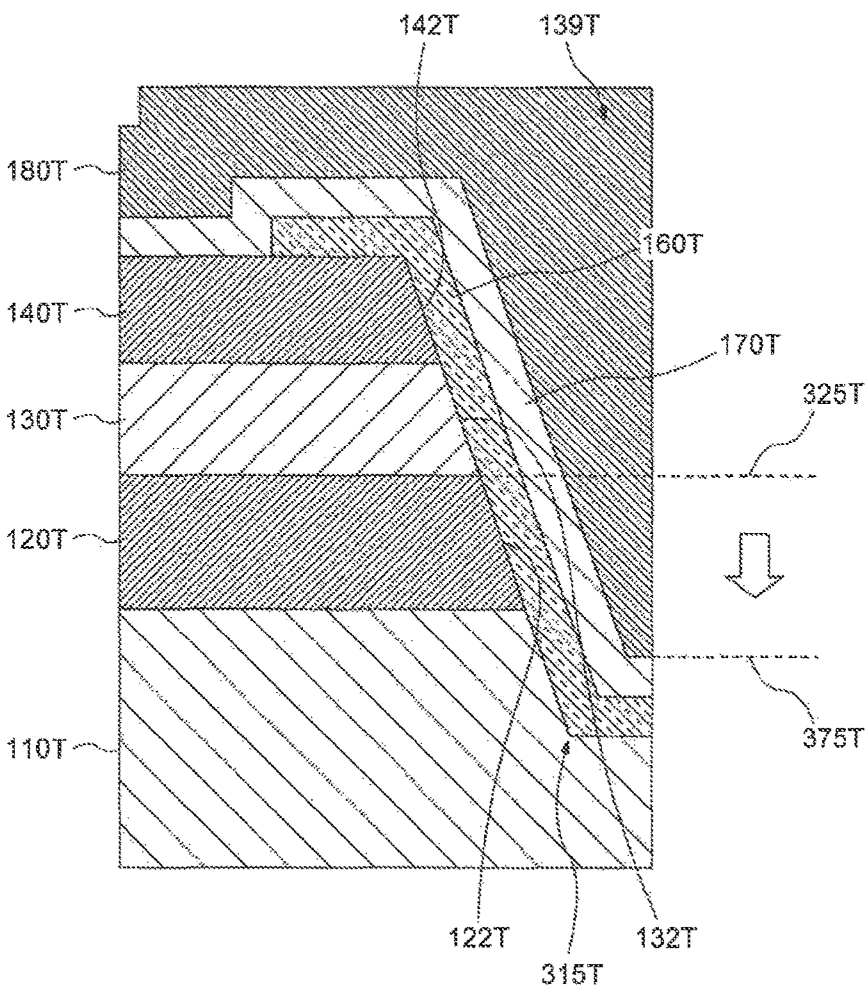
Figure 184B:
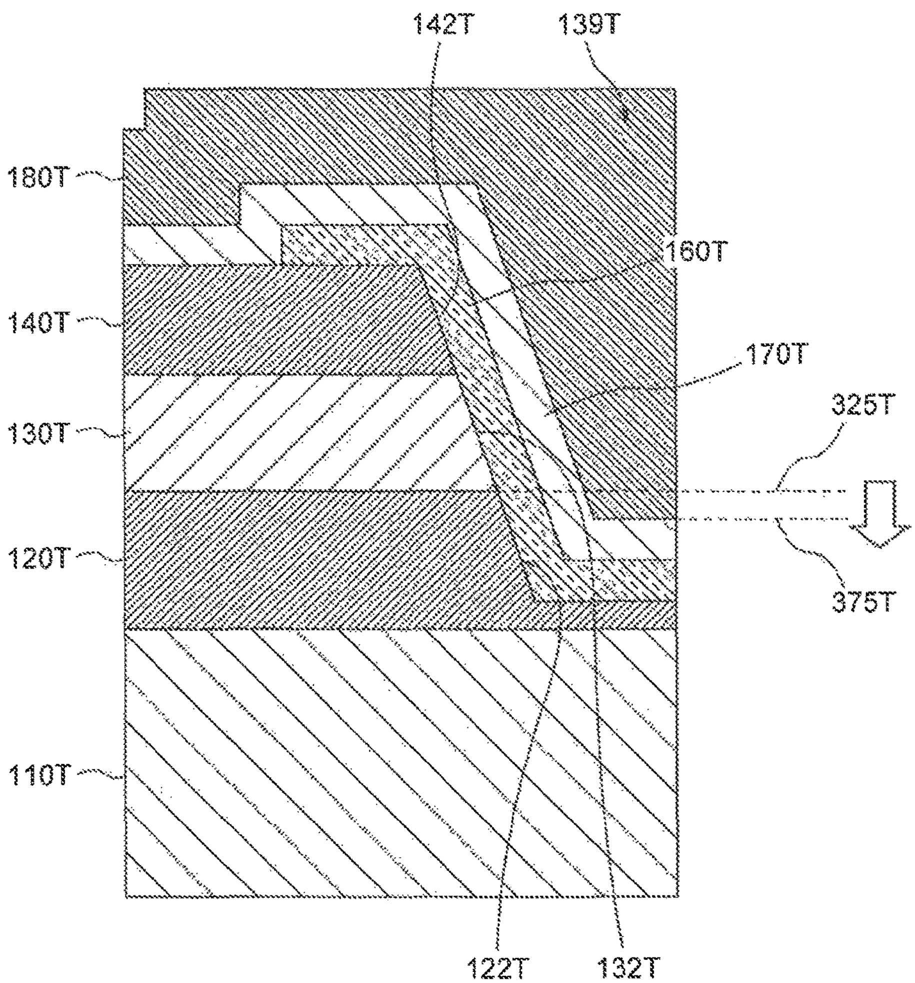
Figure 185A:
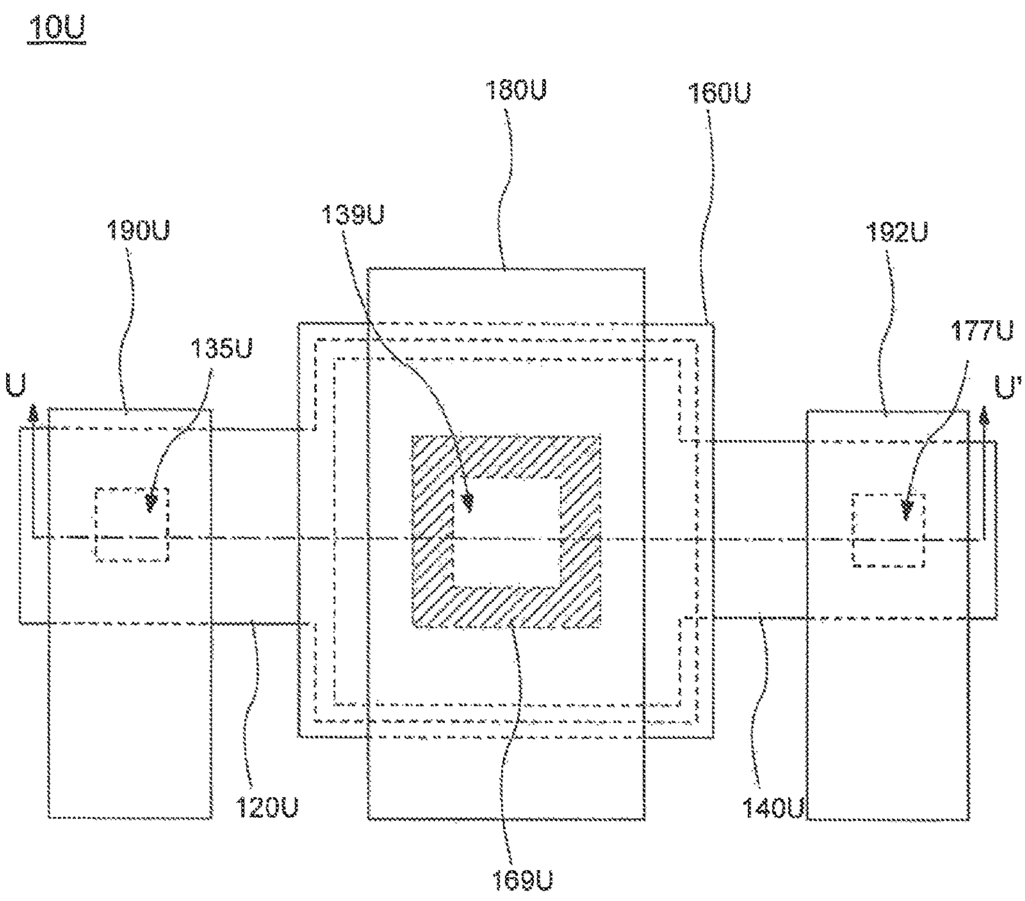
Figure 185B:
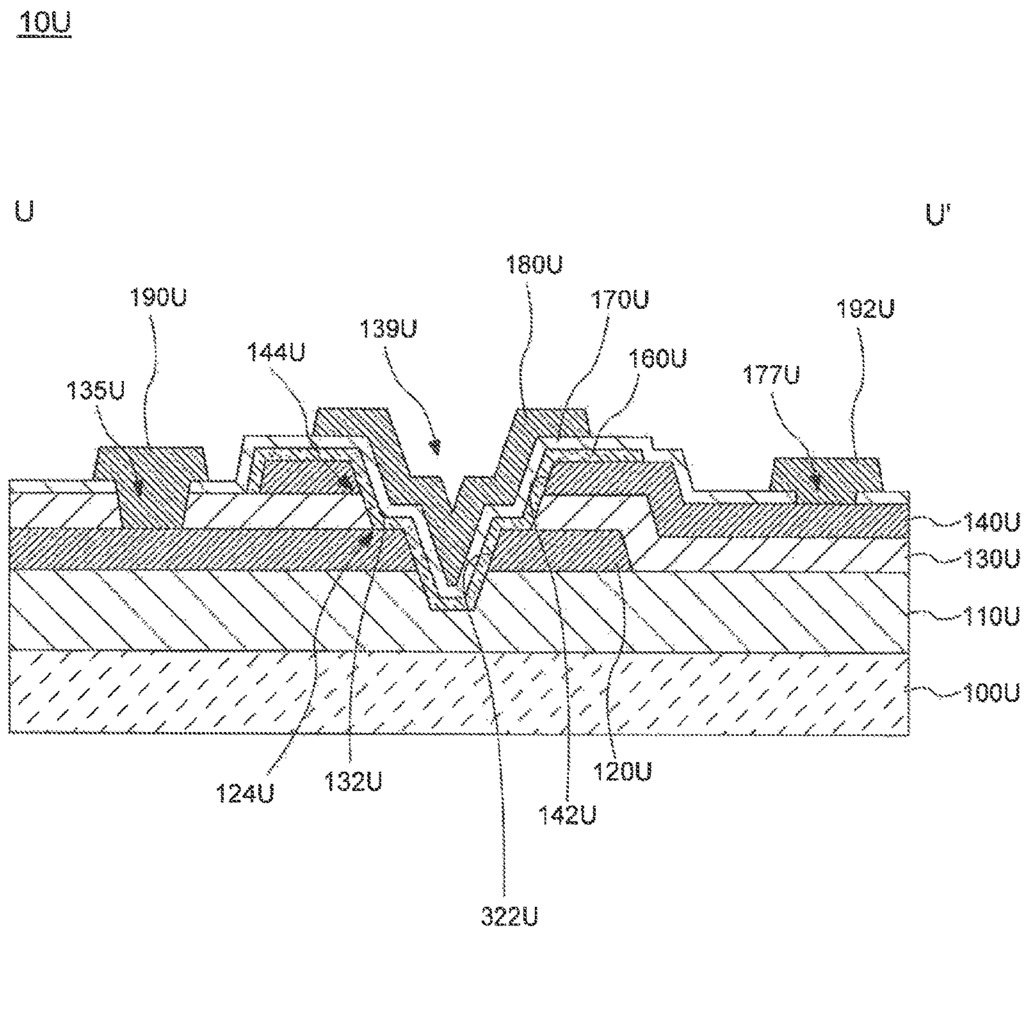
Figure 186A:
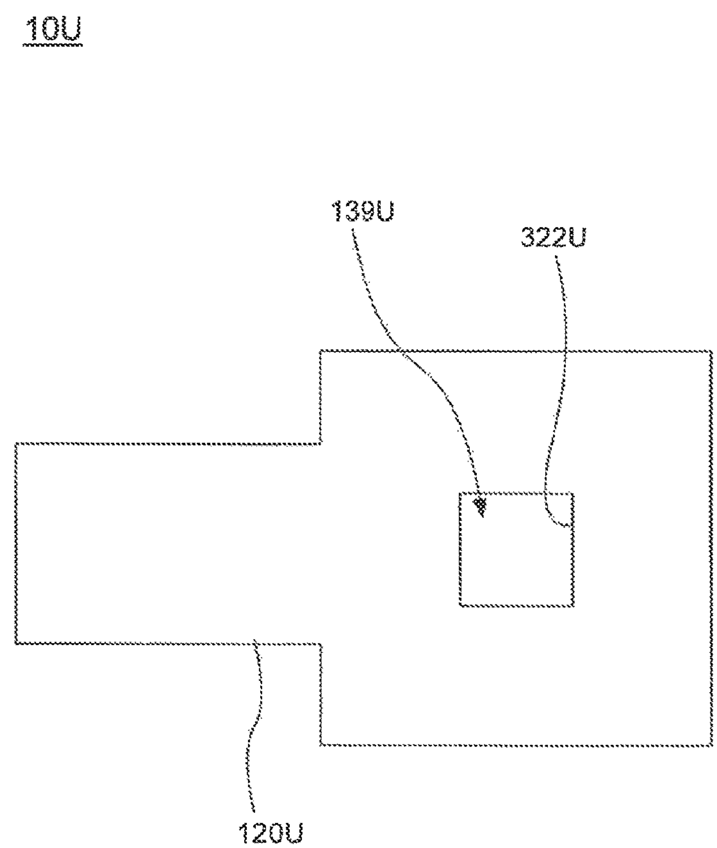
Figure 186B:
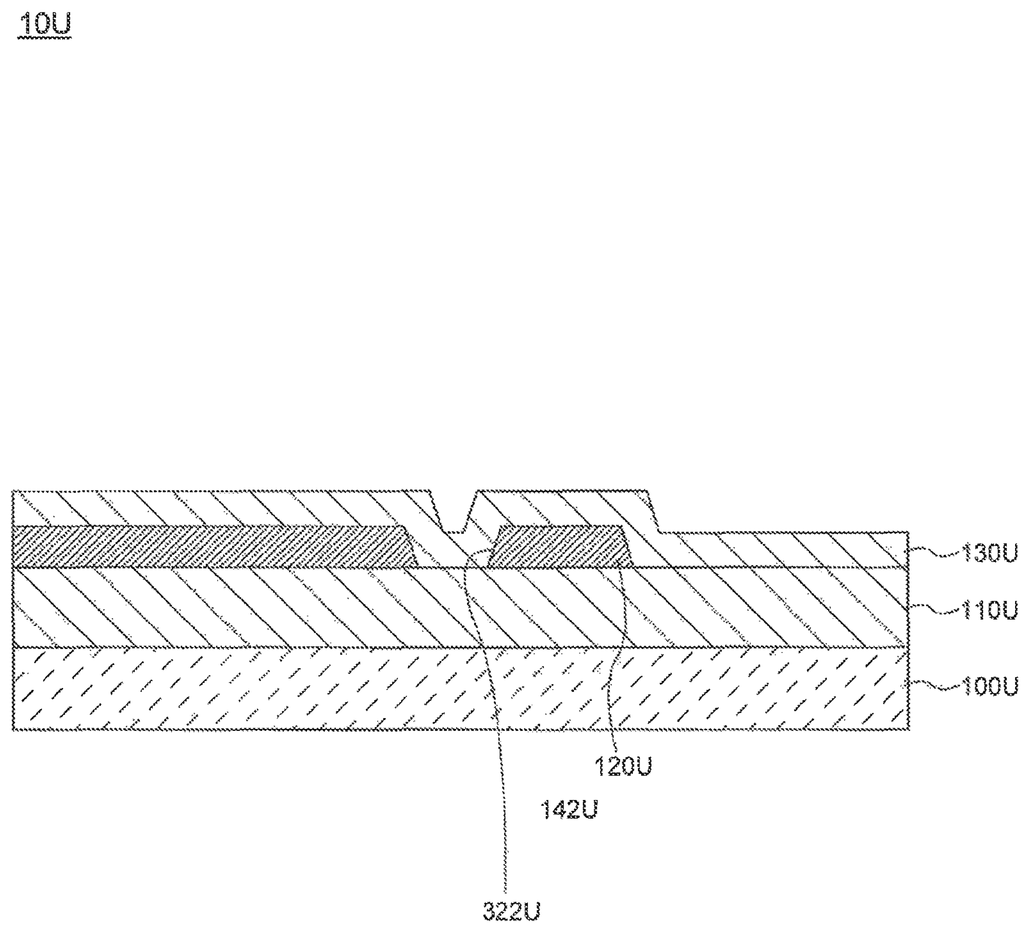
Figure 187:
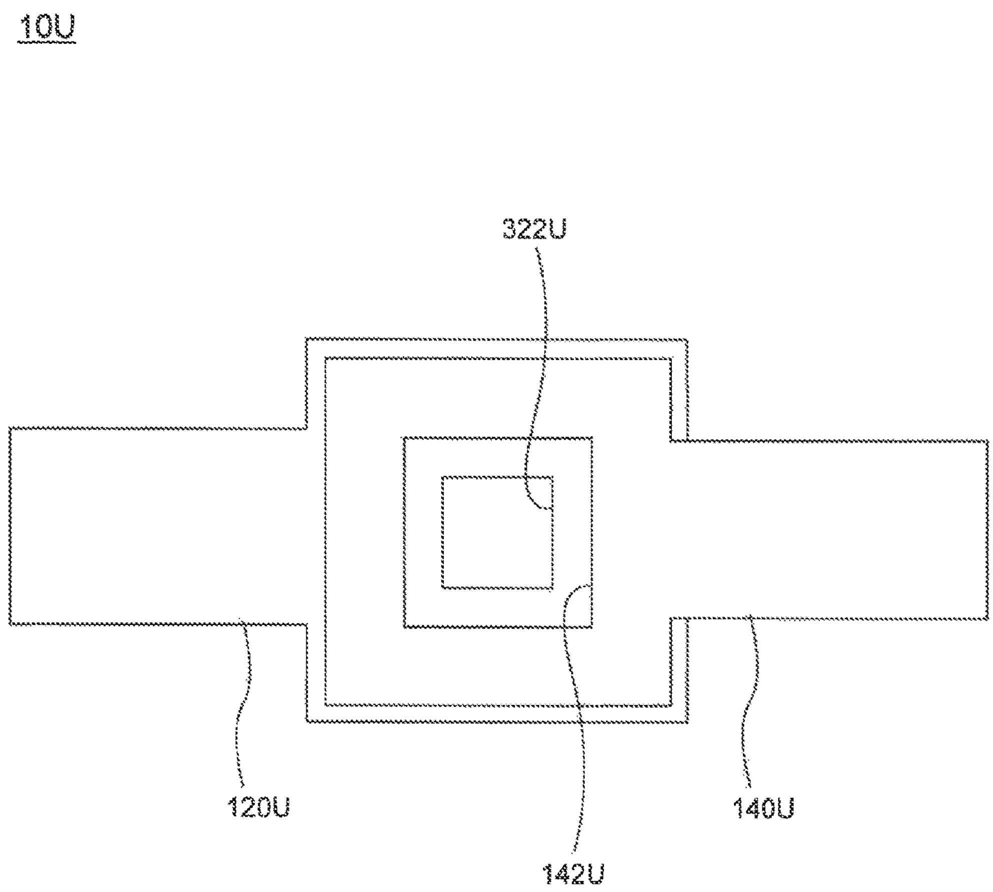
Figure 188:
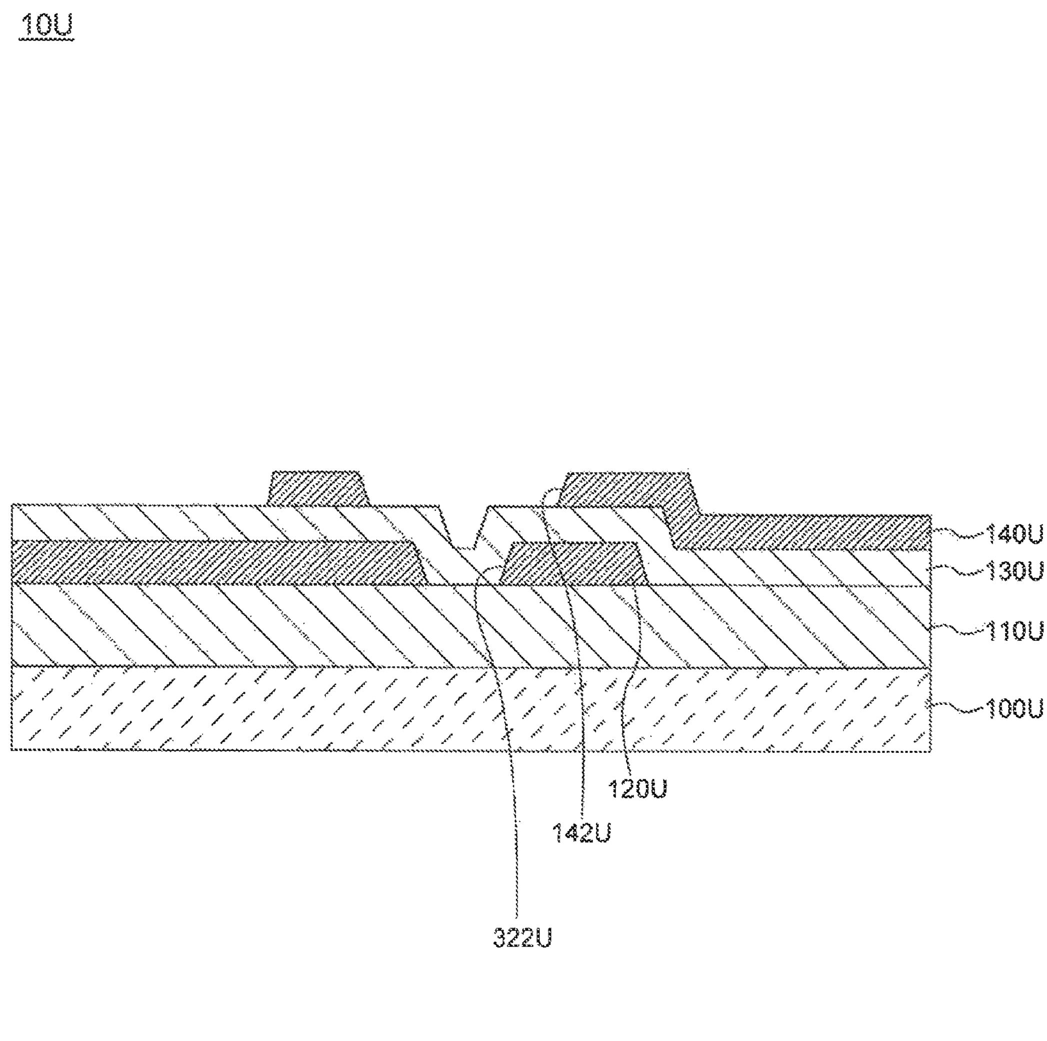
Figure 189:
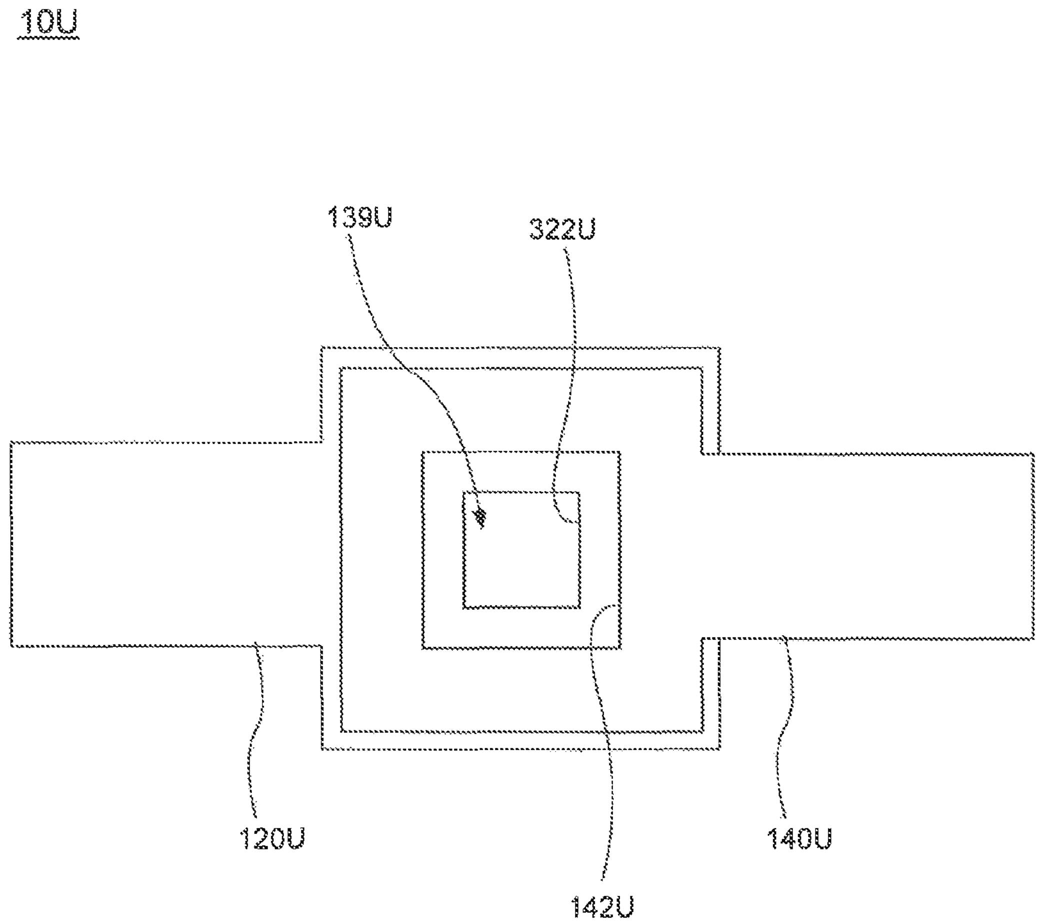
Figure 190:
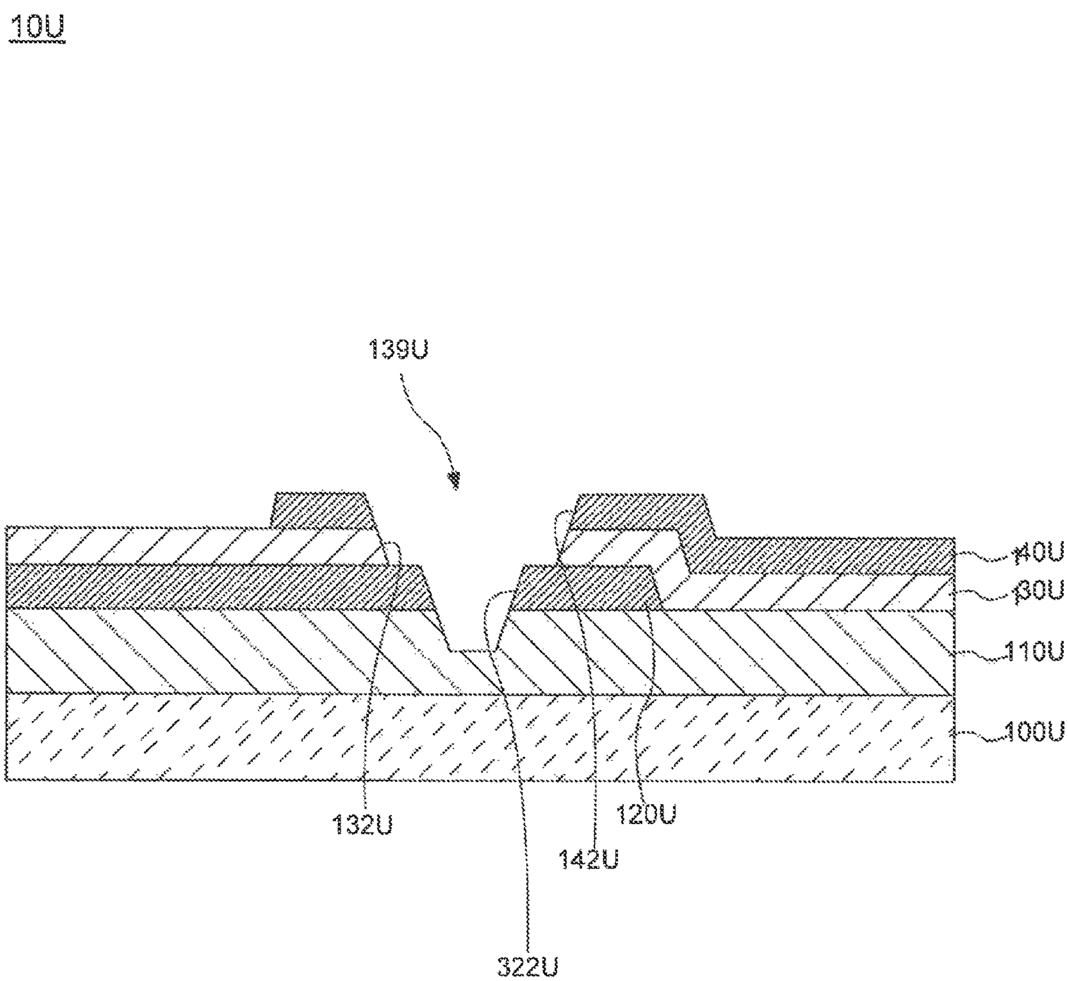
Figure 191:
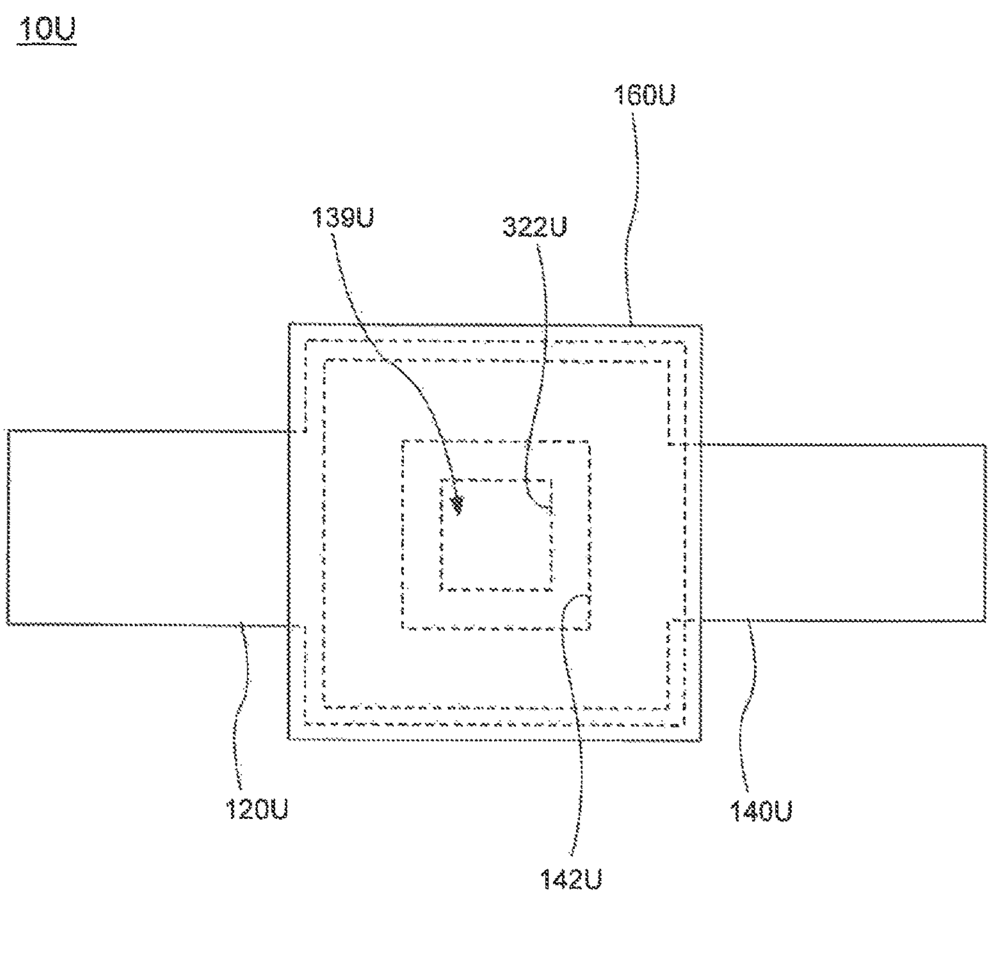
Figure 192:
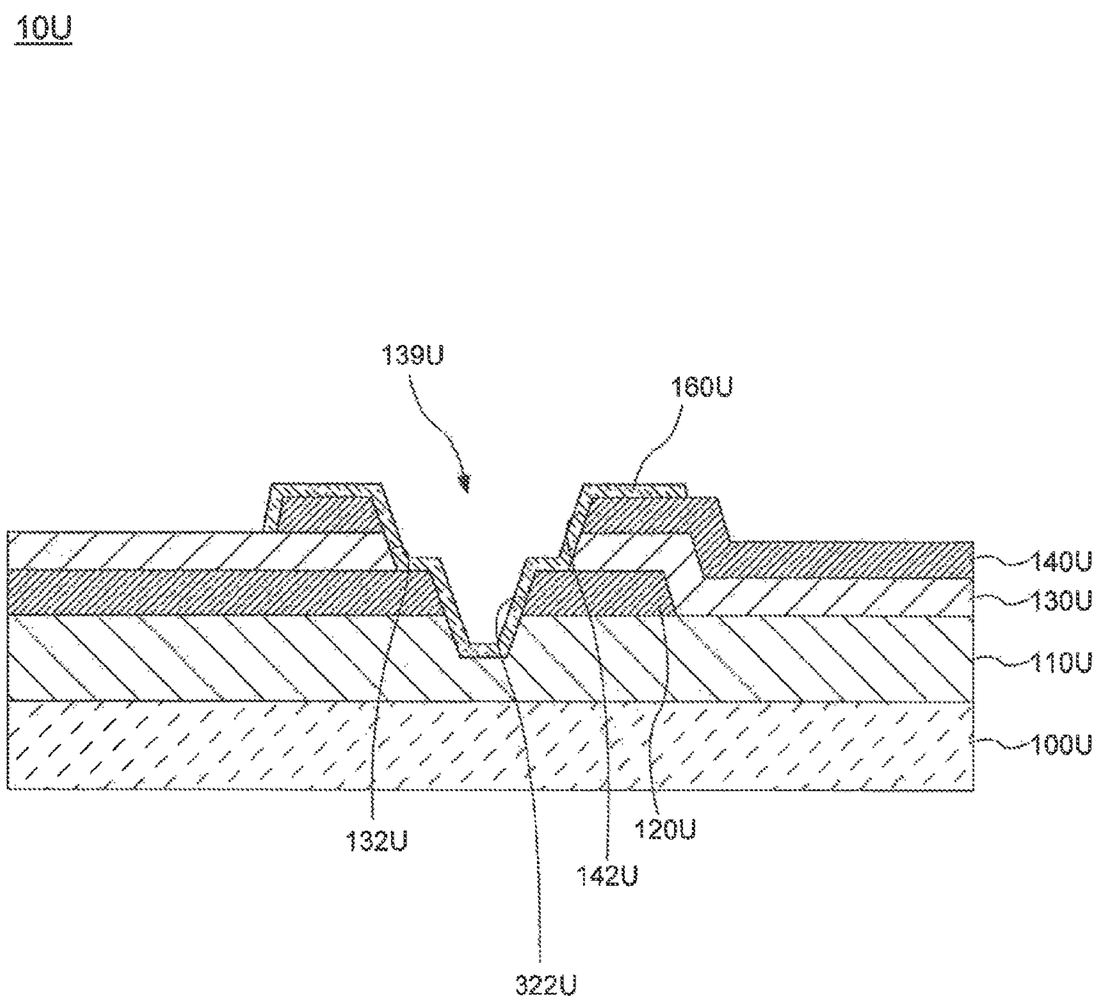
Figure 193:
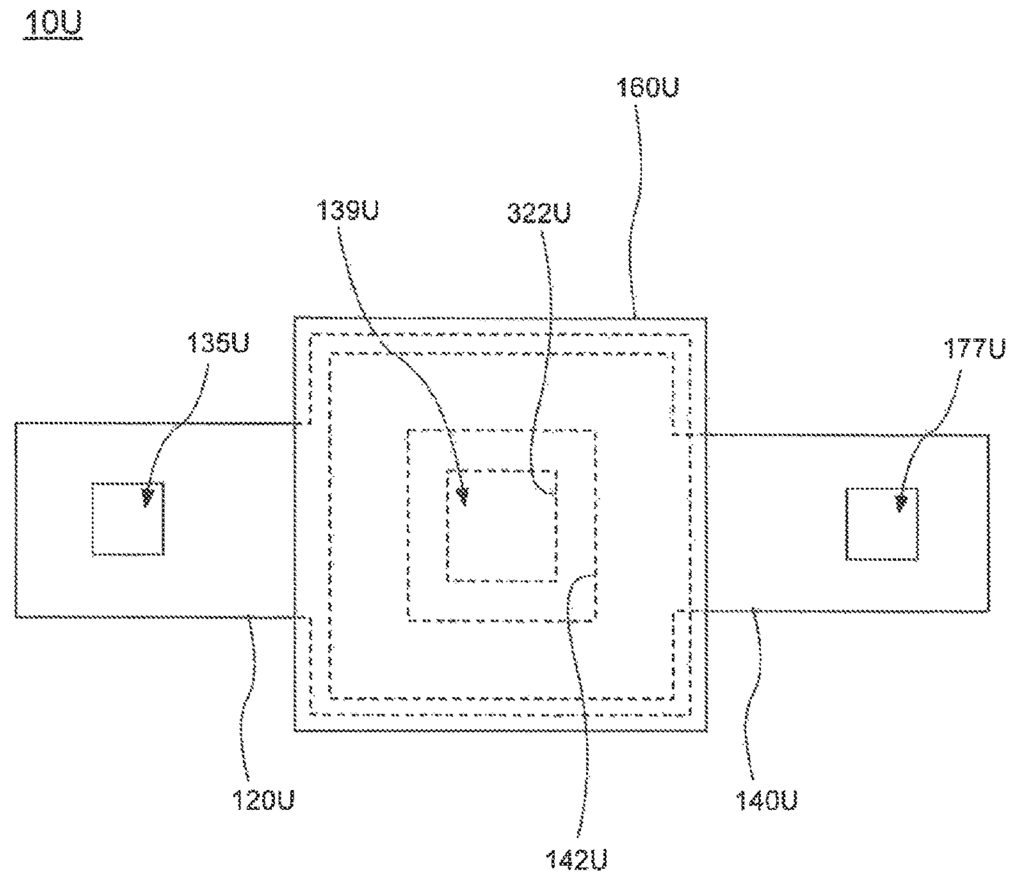
Figure 194:
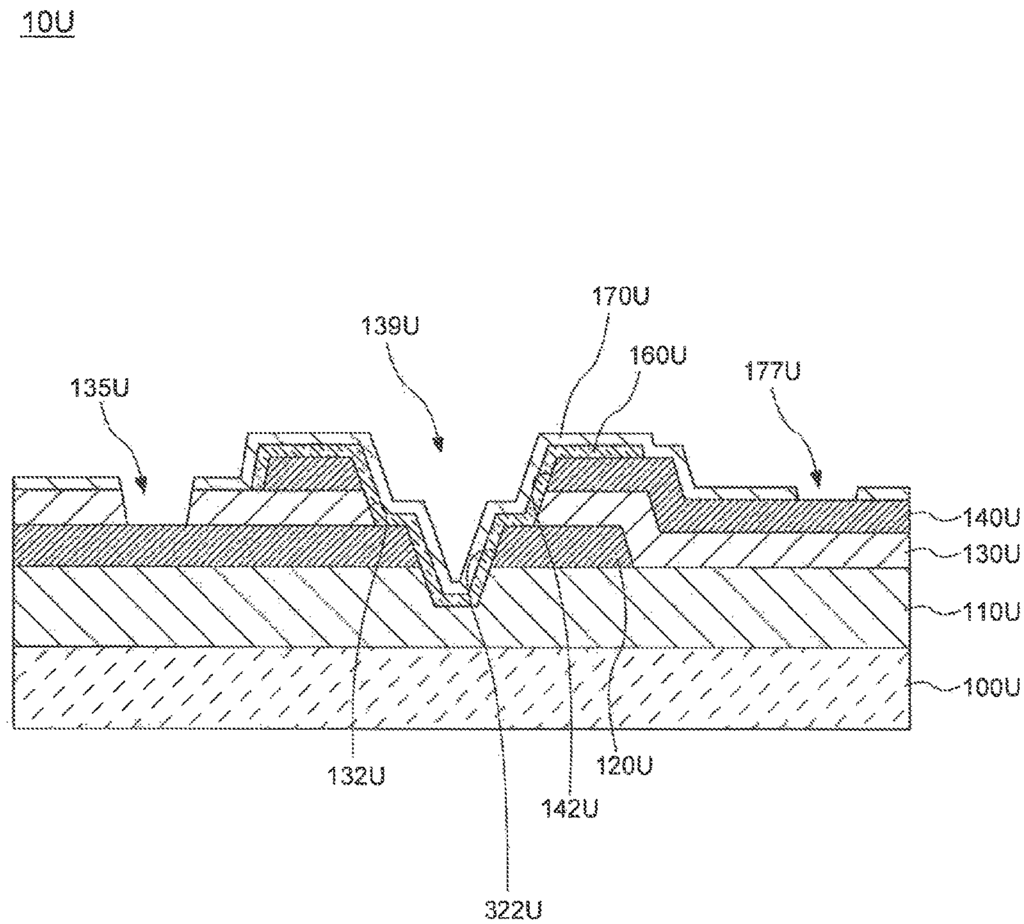
Figure 195:
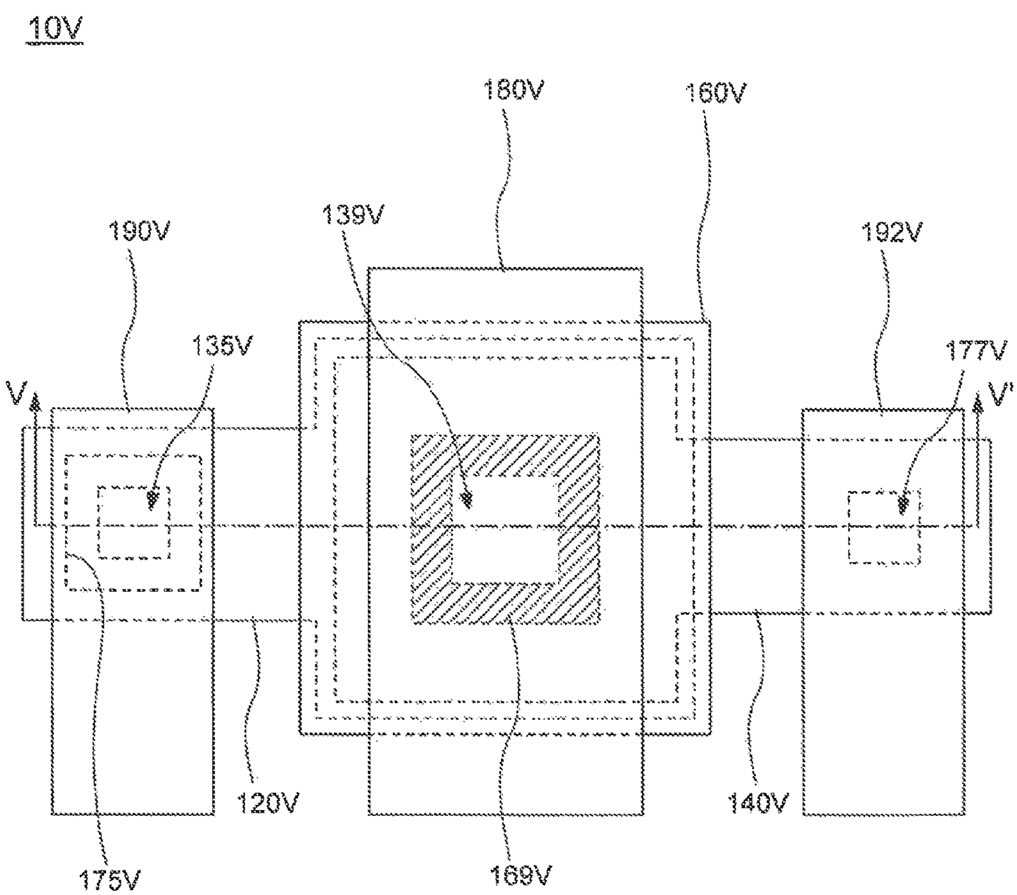
Figure 196:
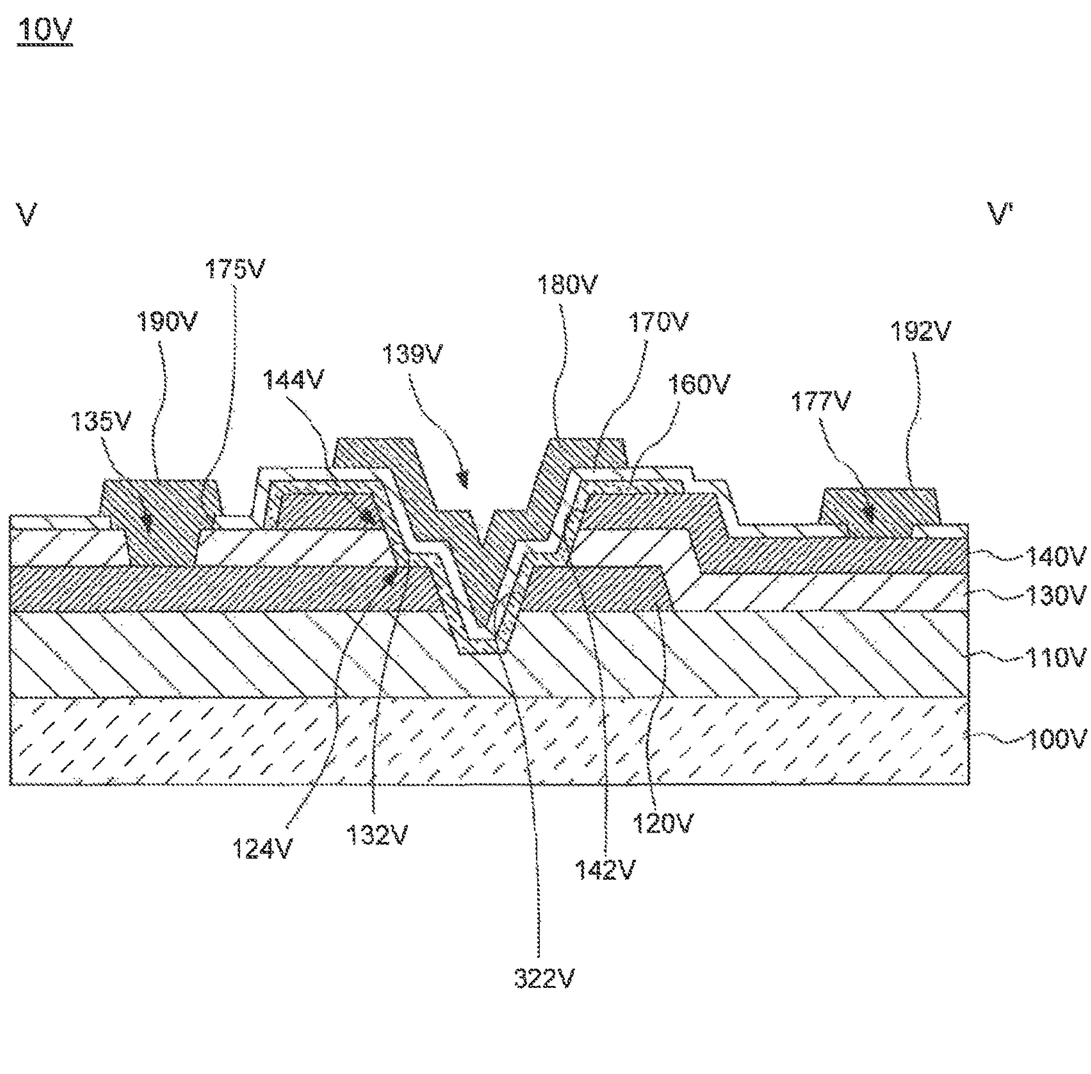
Figure 197:
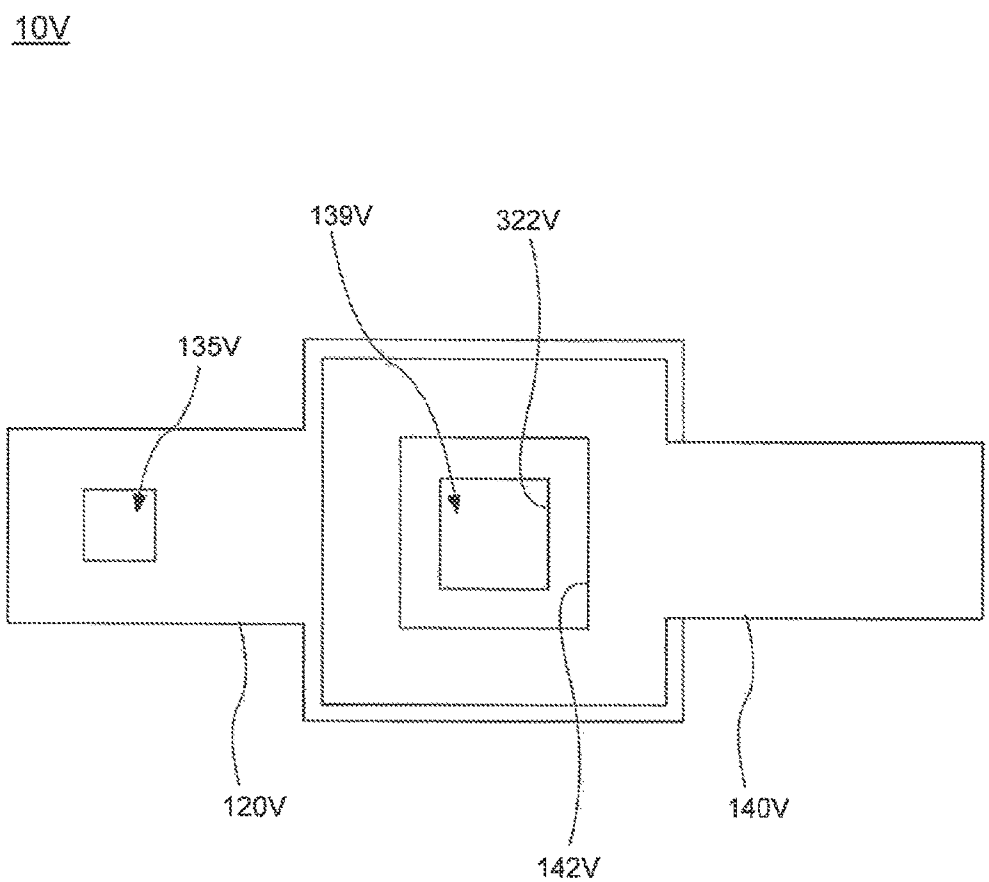
Figure 198:
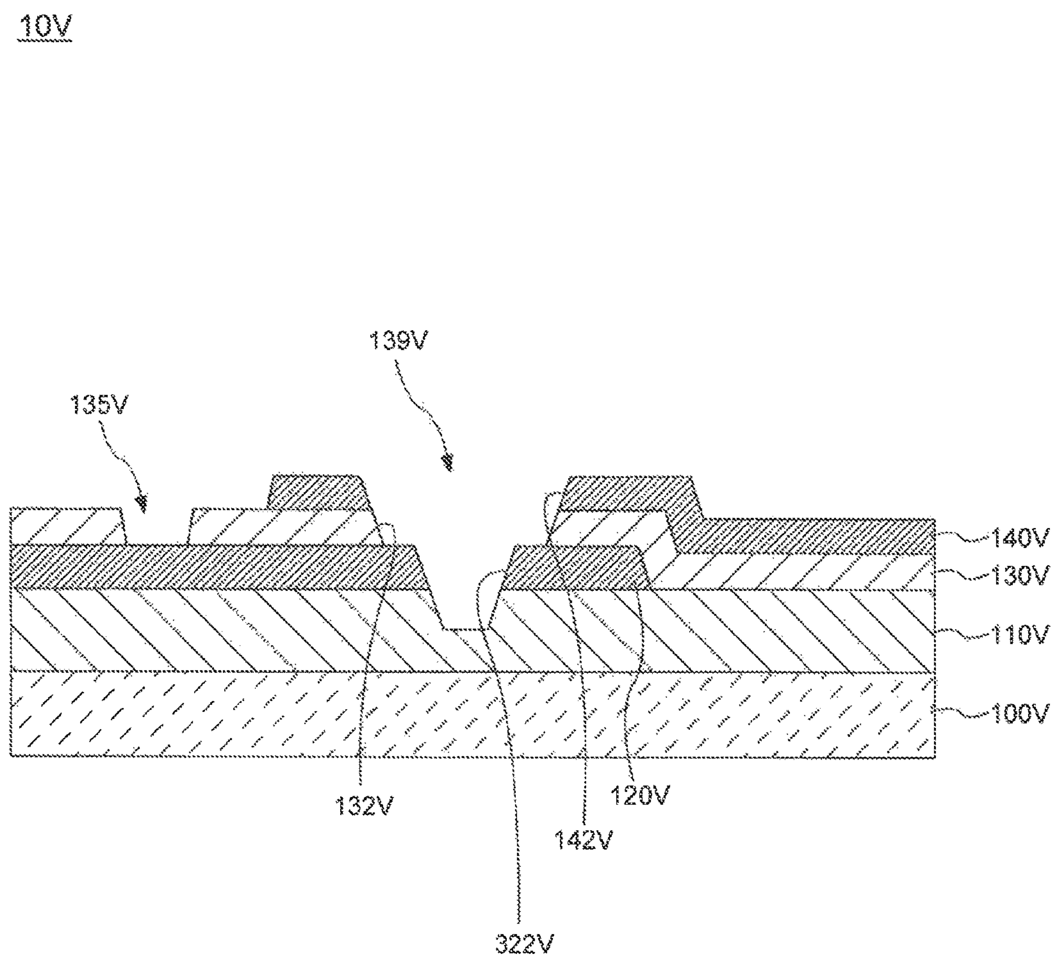
Figure 199:
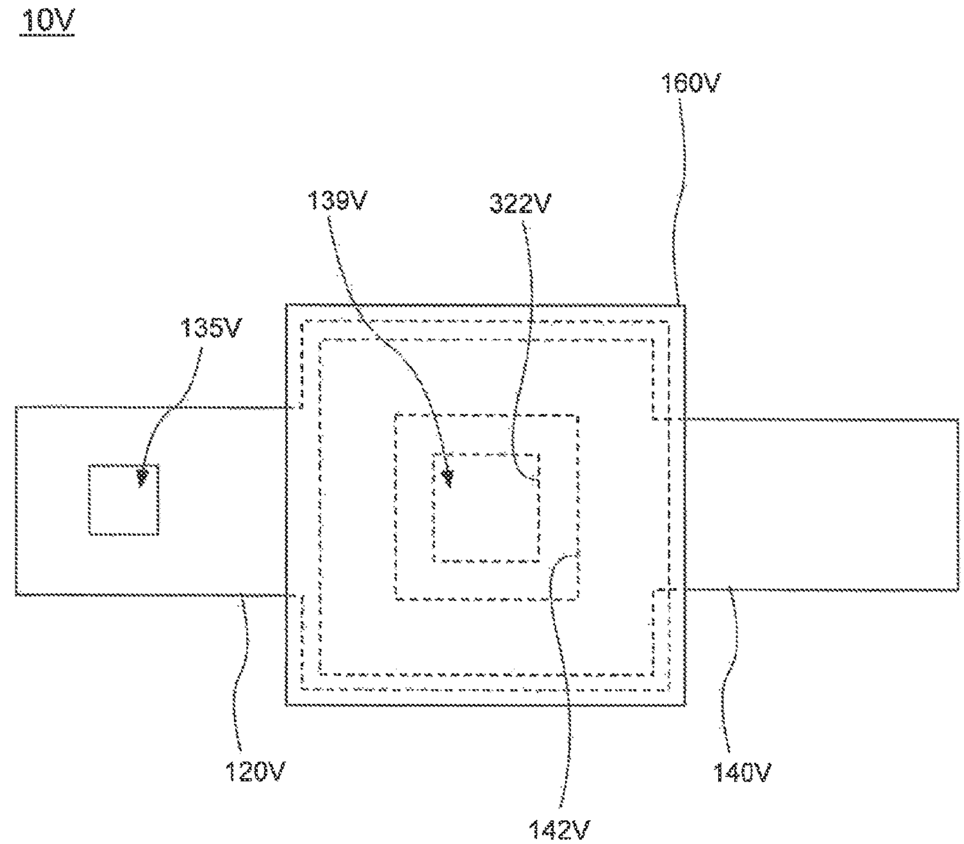
Figure 200:
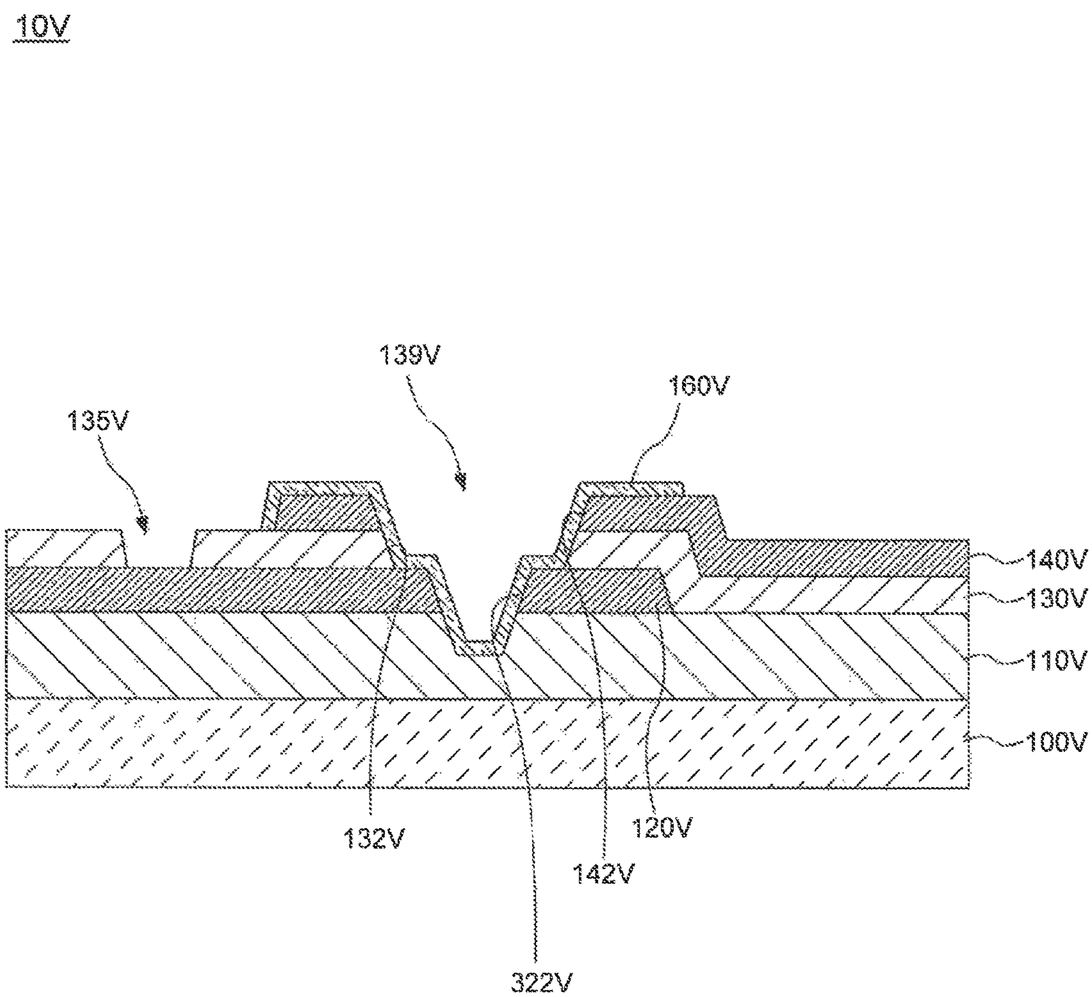
Figure 201:
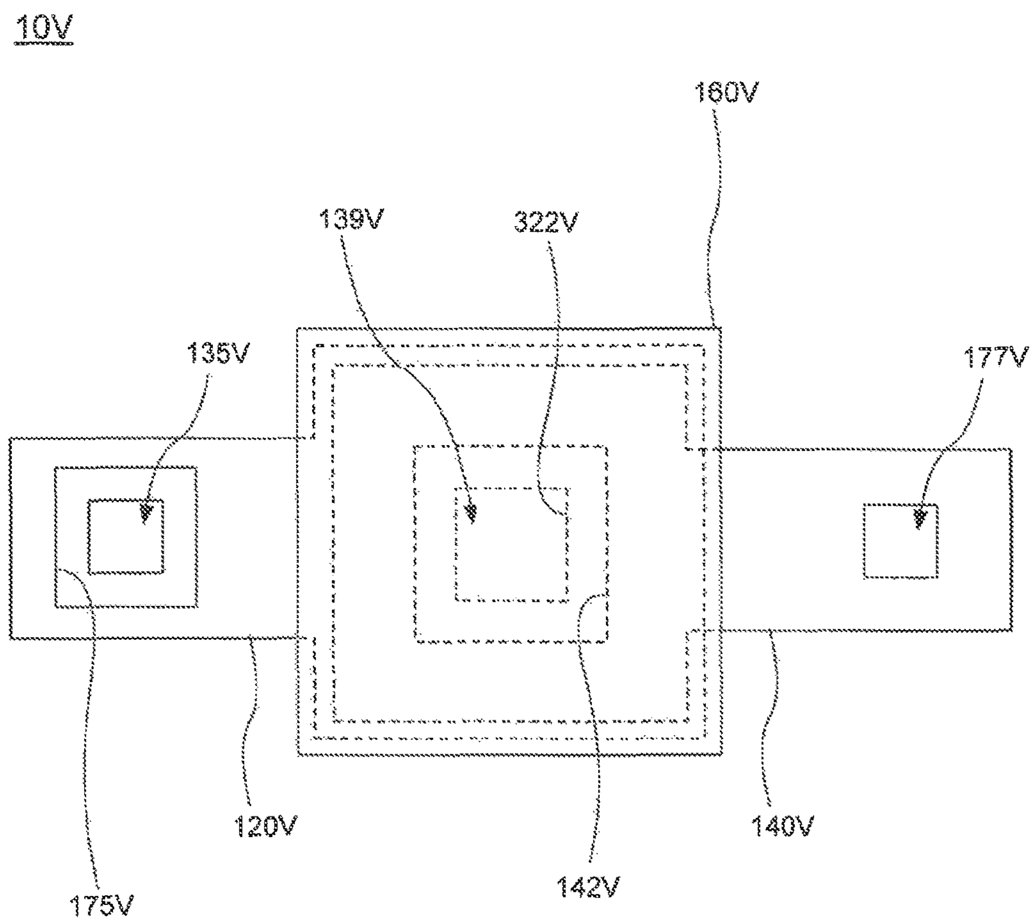
Figure 202:
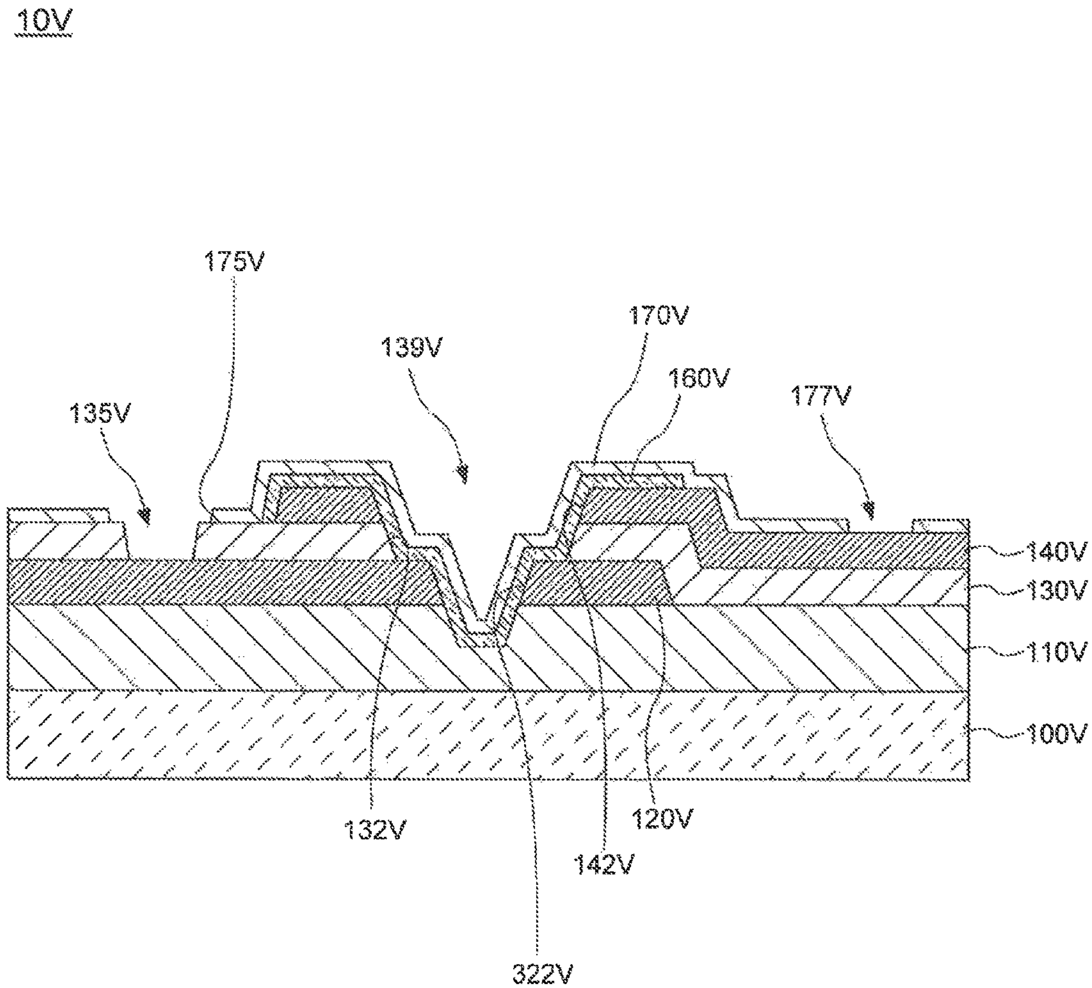
Figure 203:
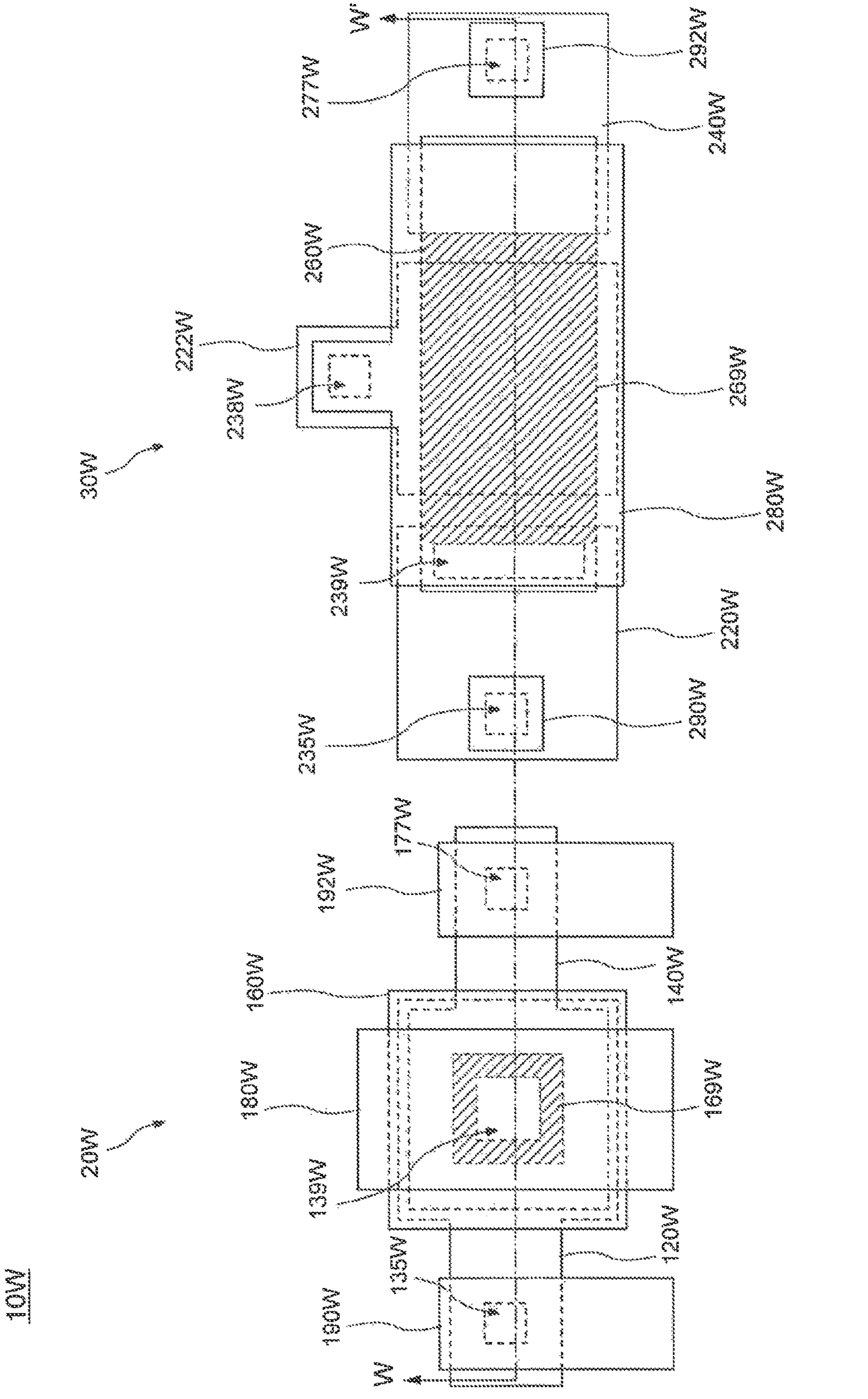
Figure 204:
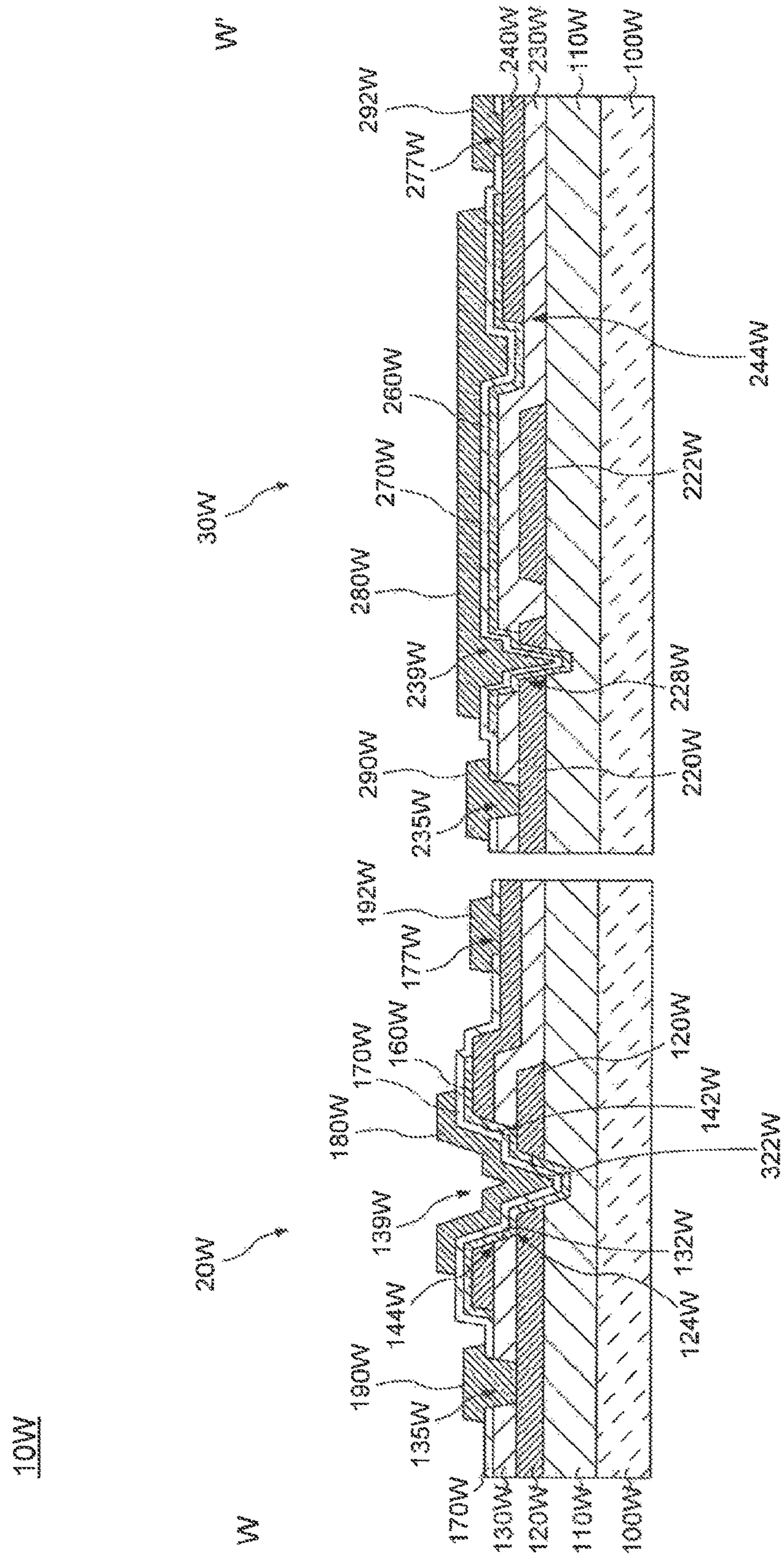
Figure 205:
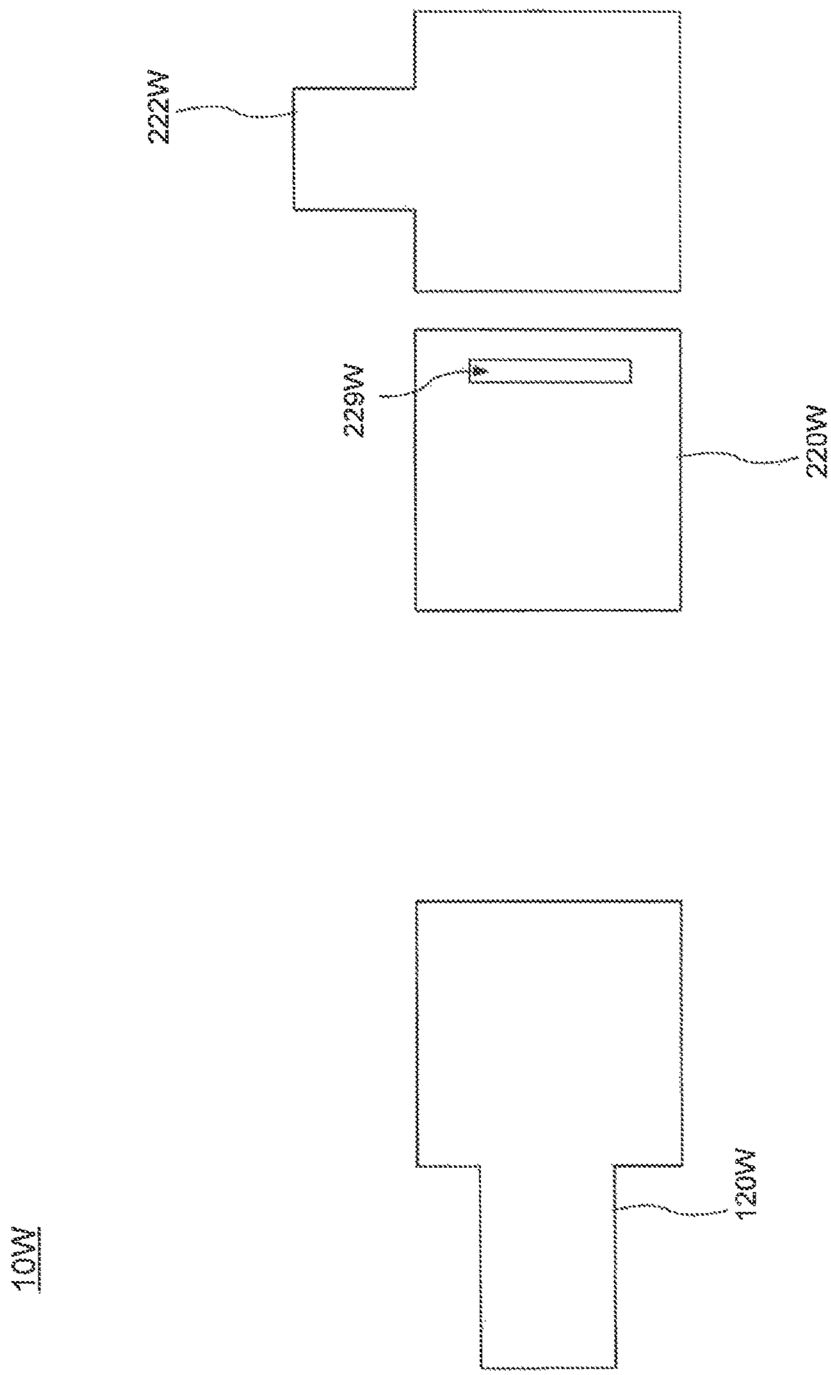
Figure 206:
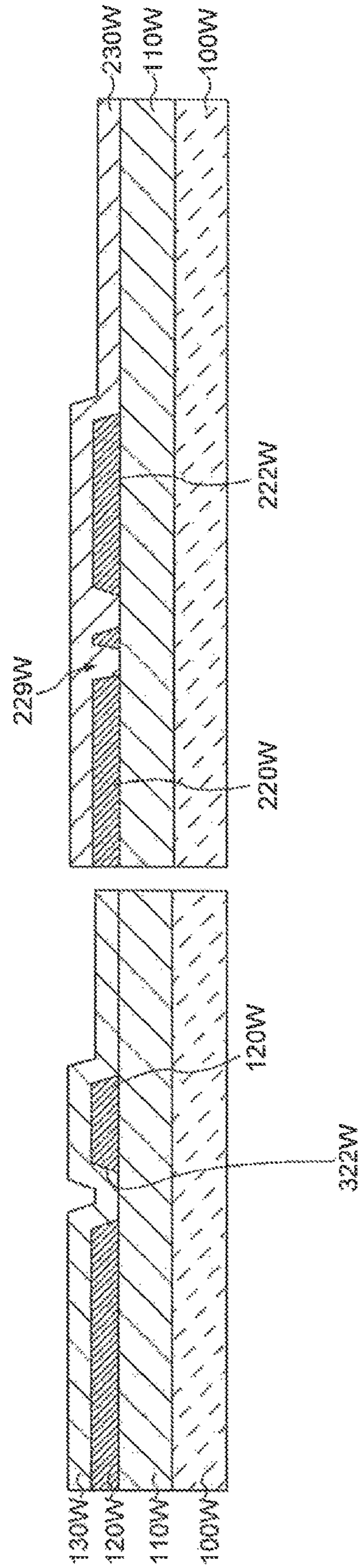
Figure 207:
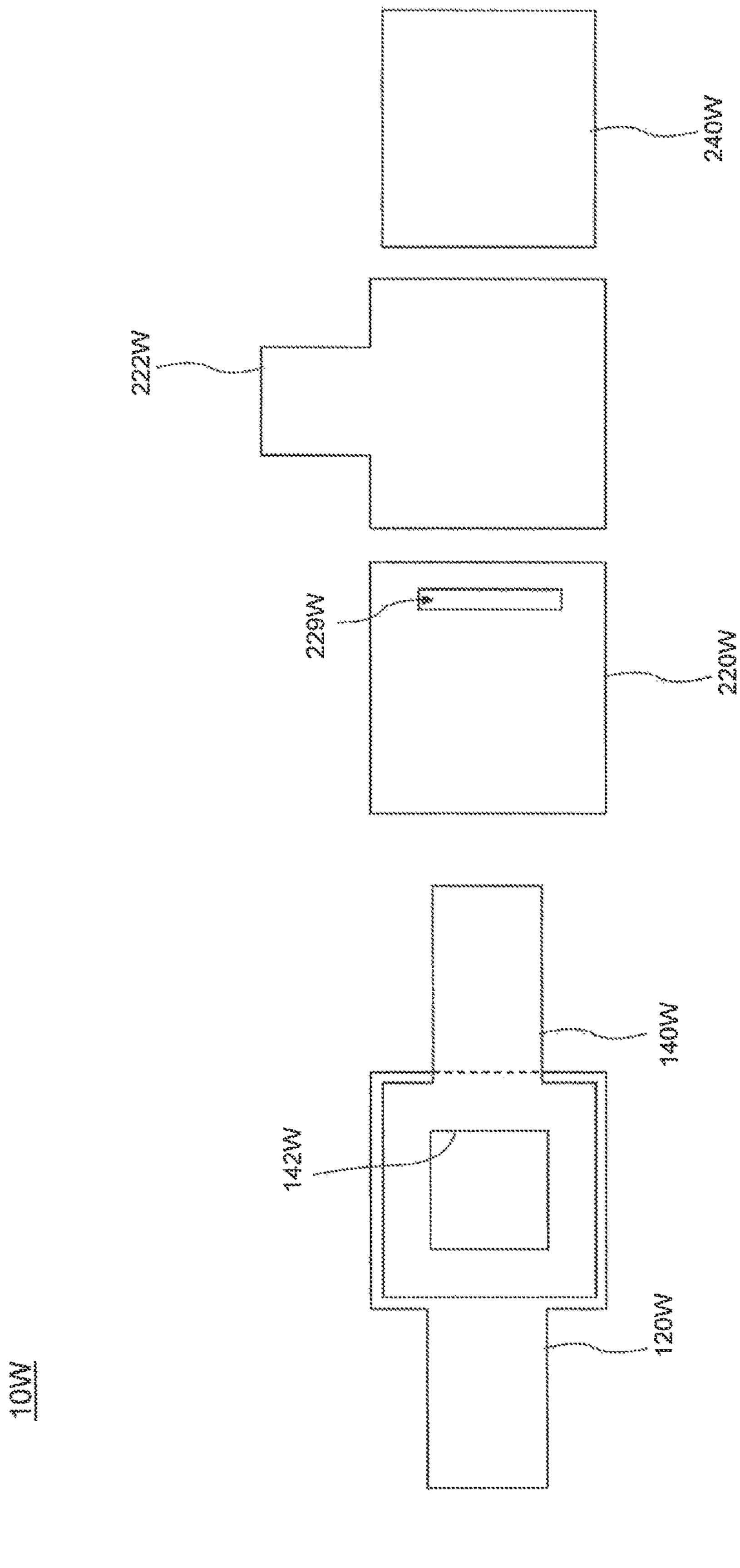
Figure 208:
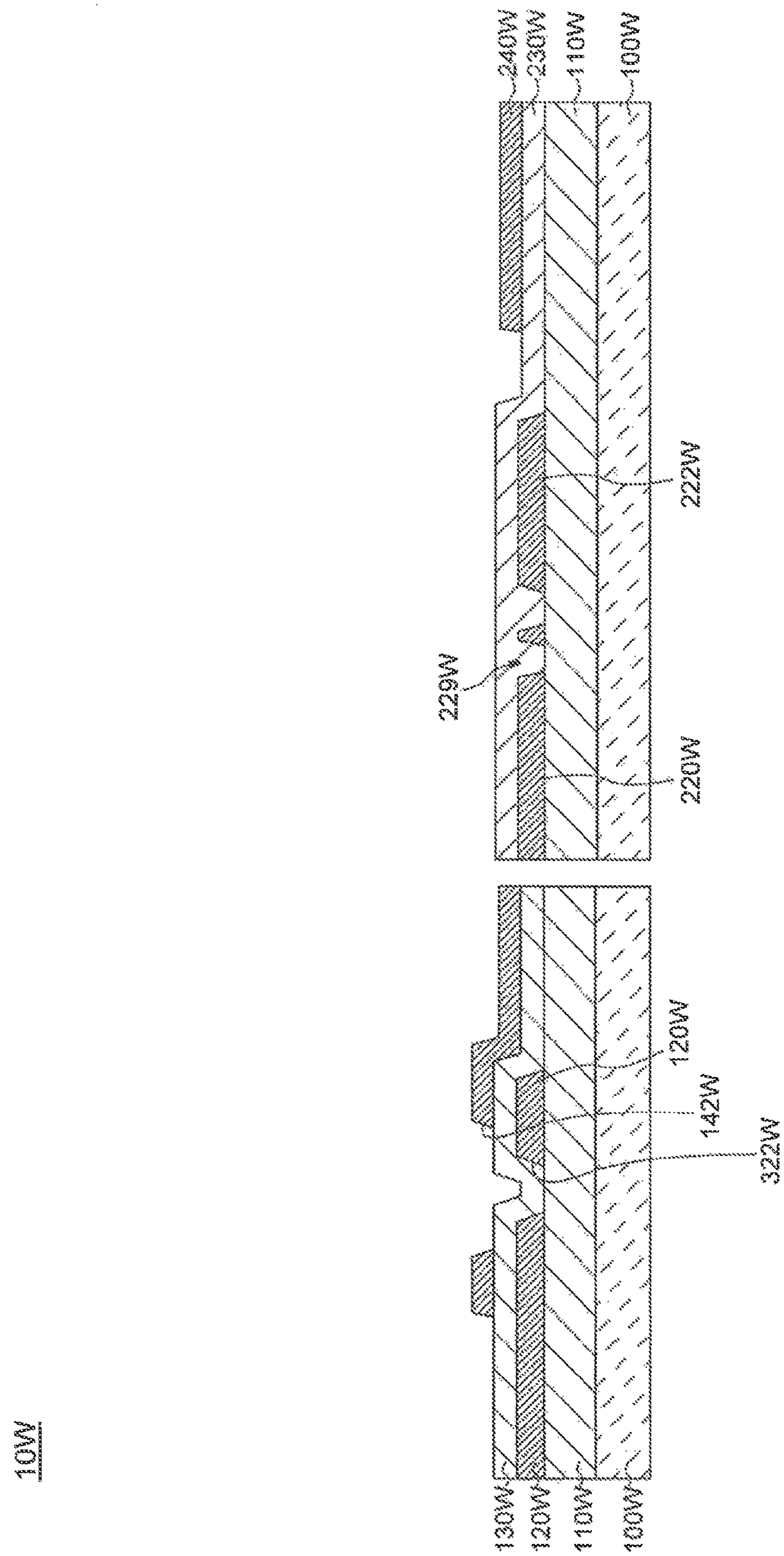
Figure 209:
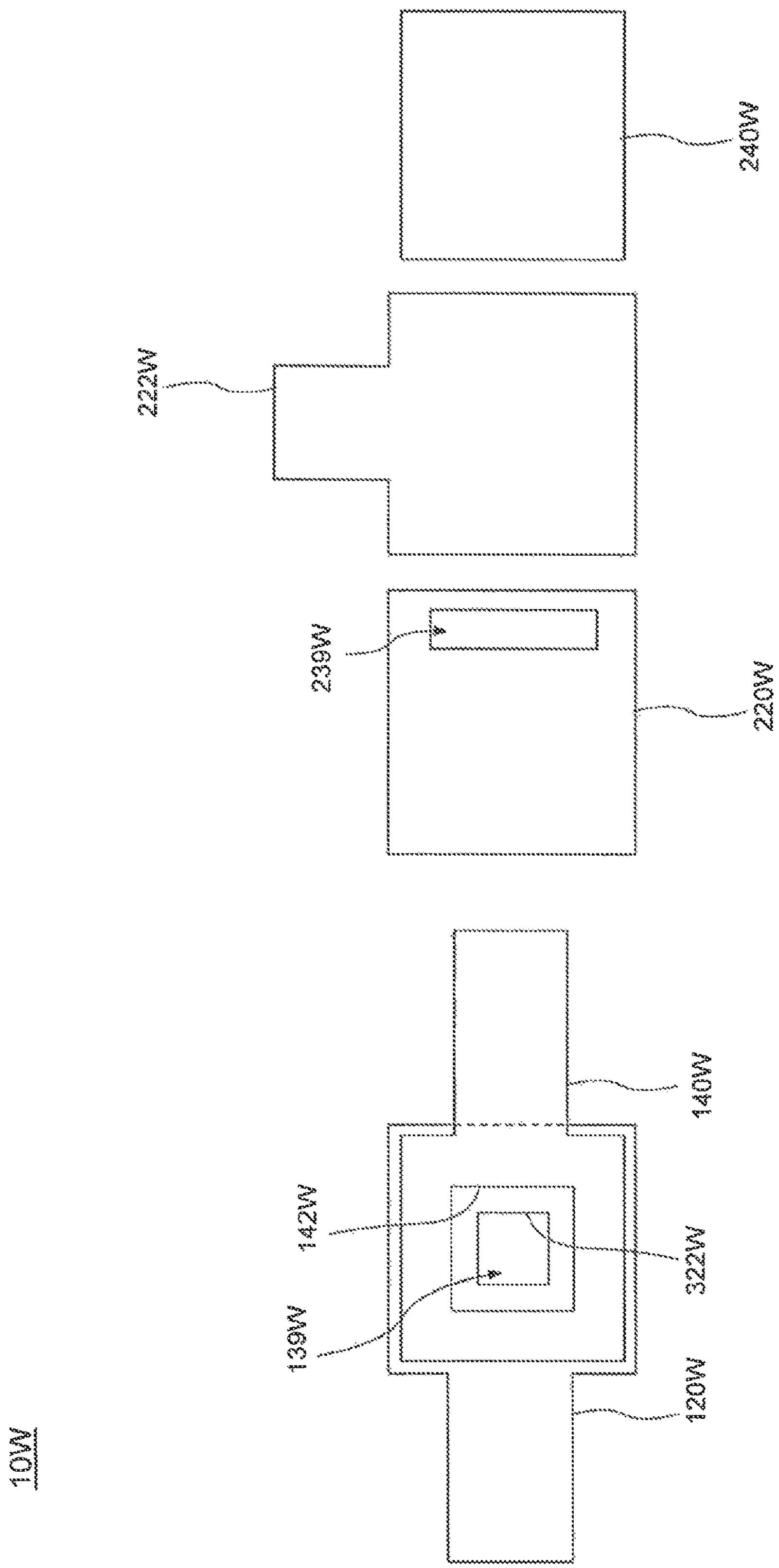
Figure 210:
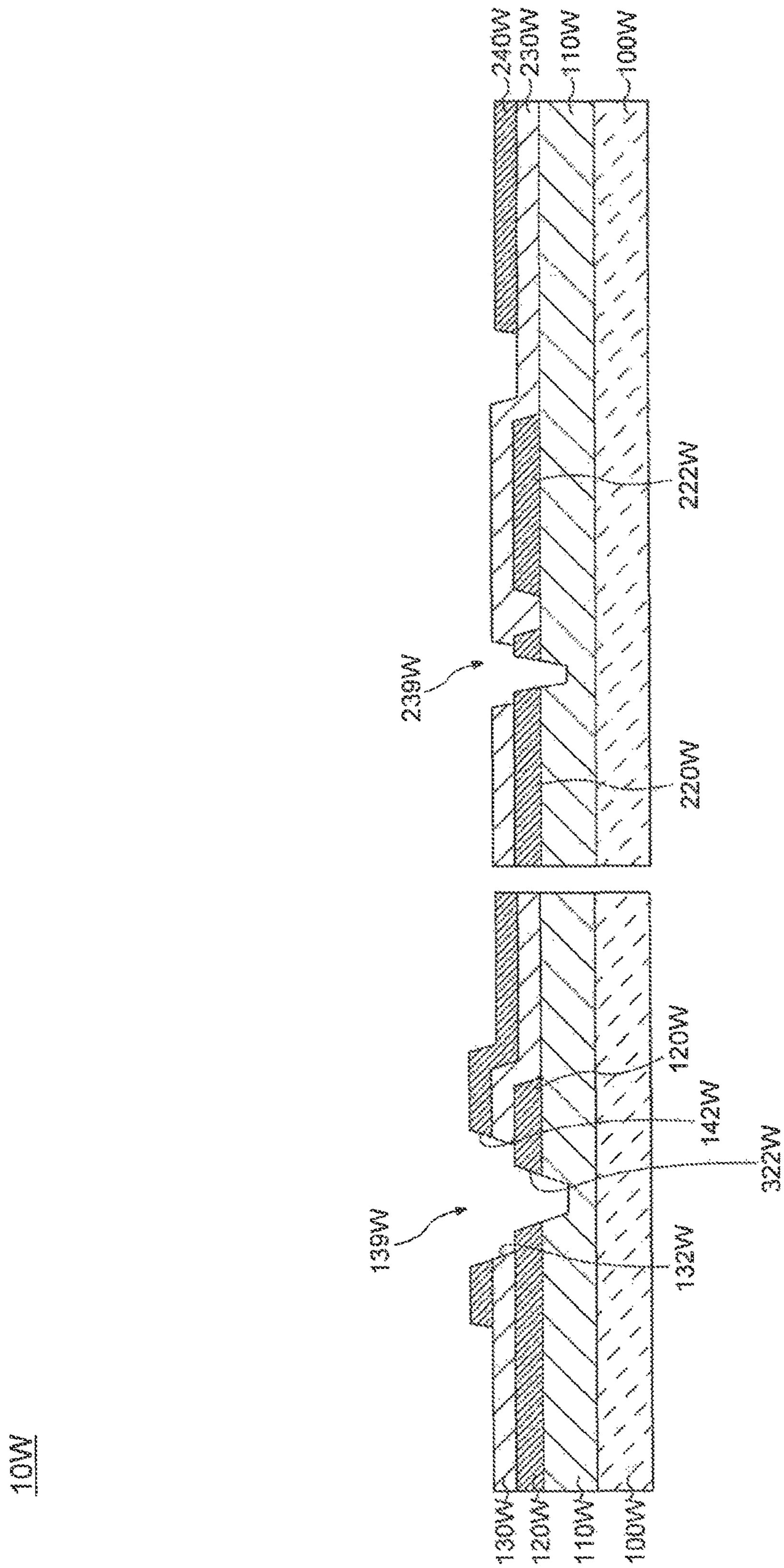
Figure 211:
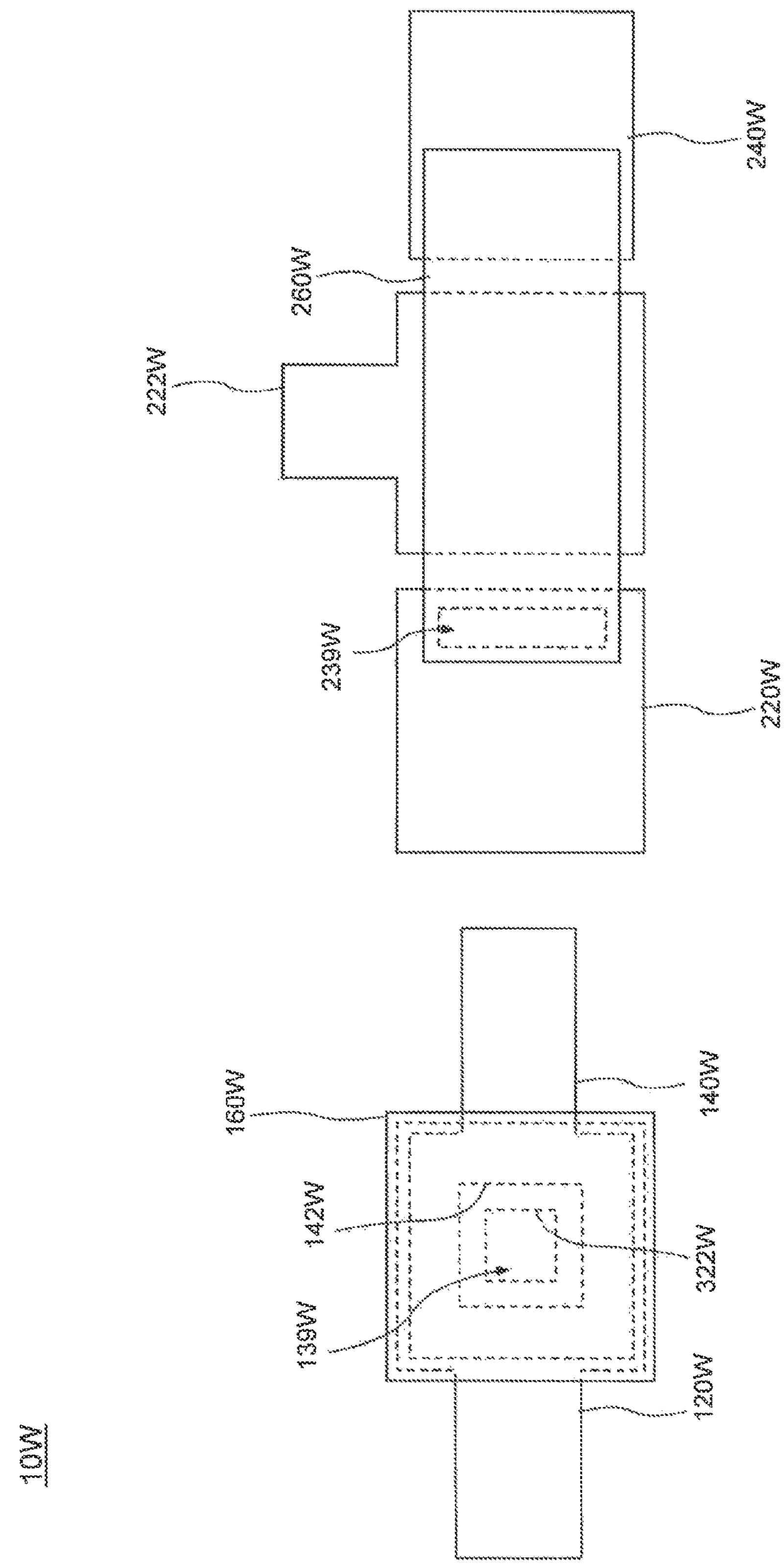
Figure 212:
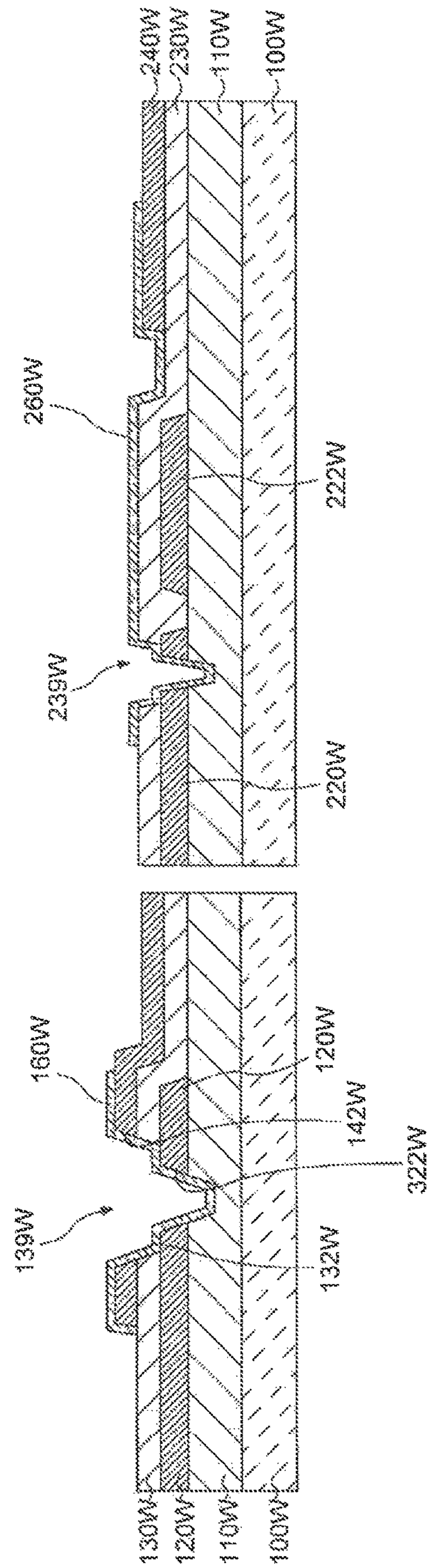
Figure 213:
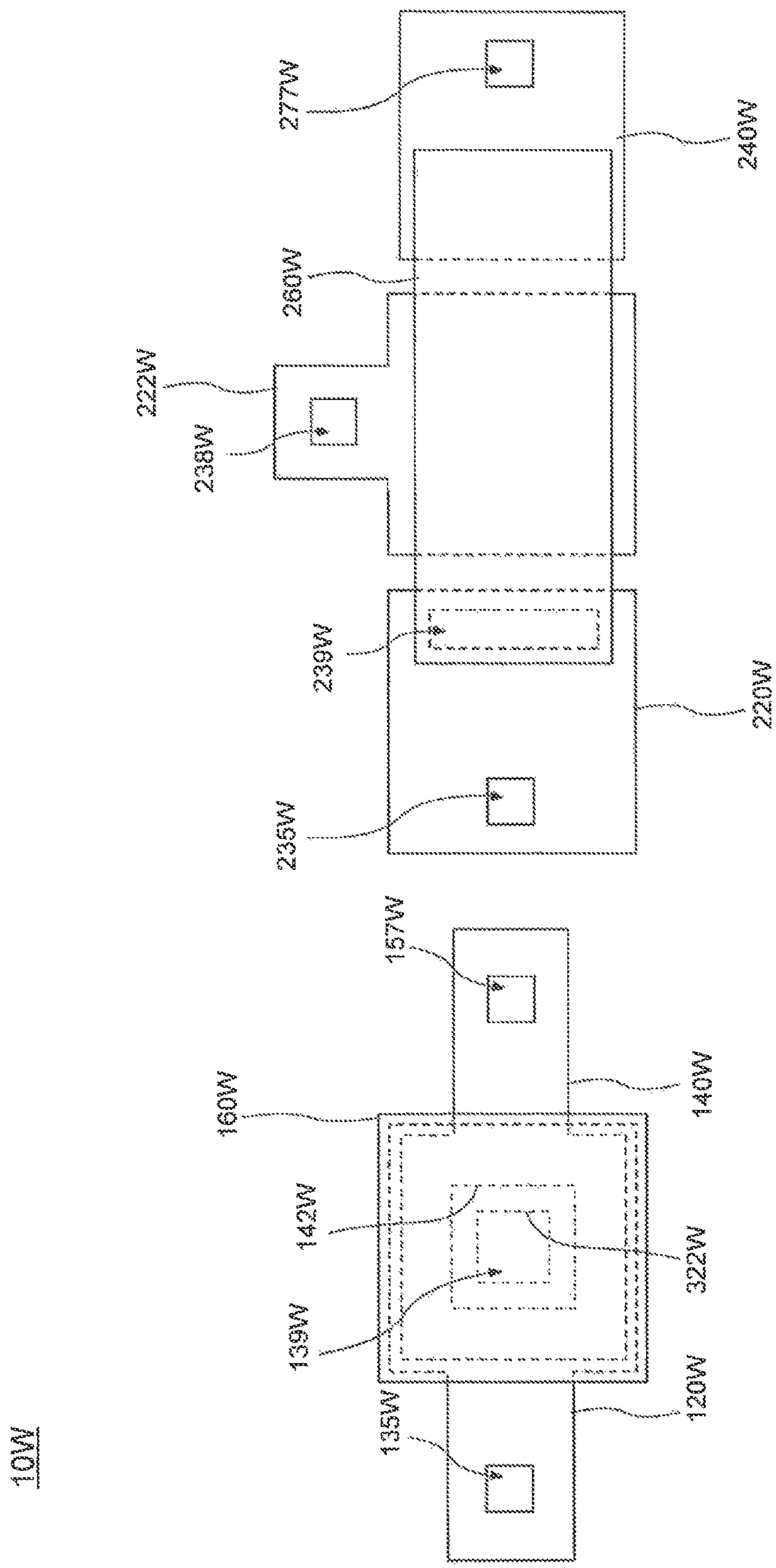
Figure 214:
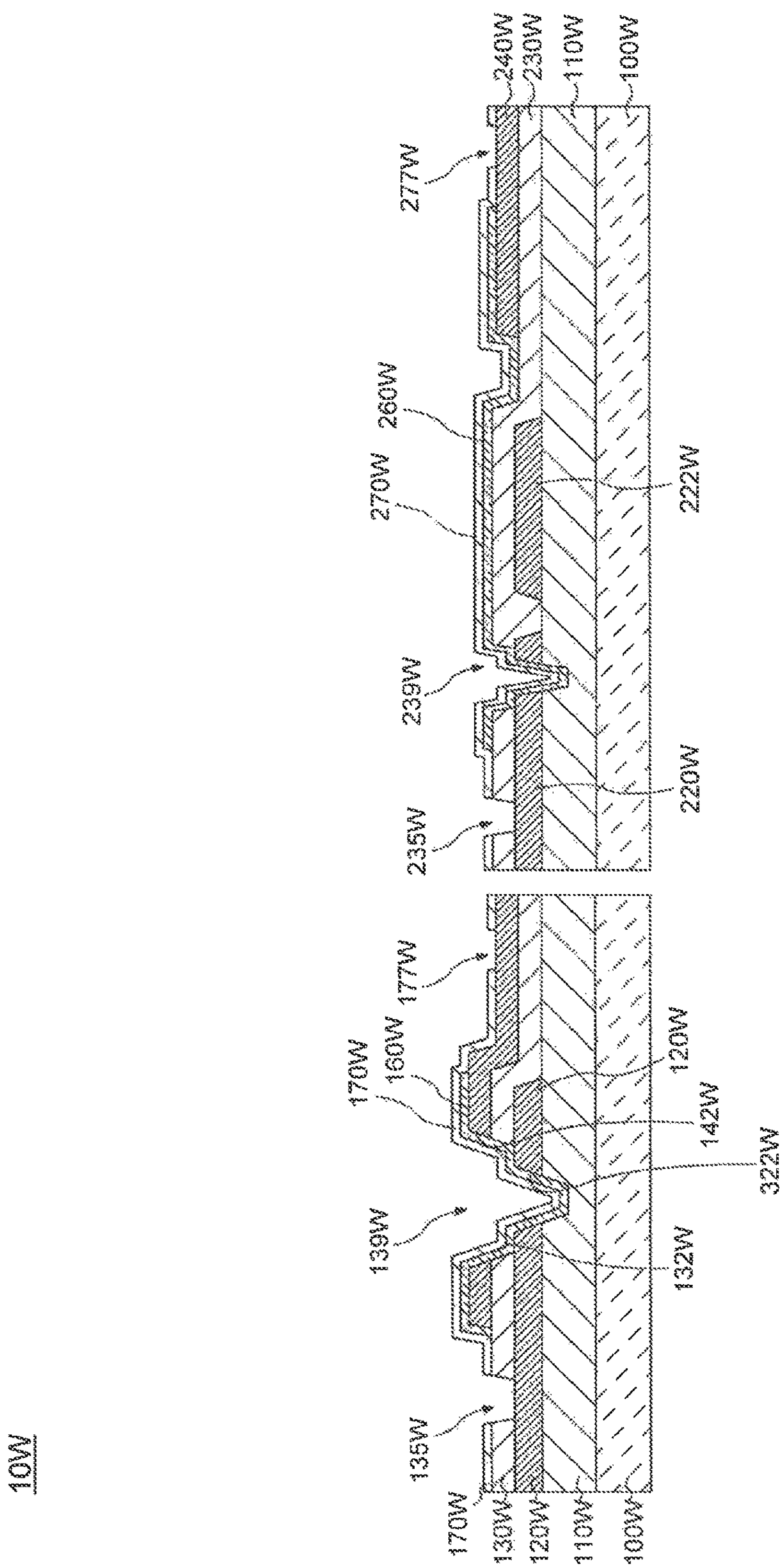
Figure 215:
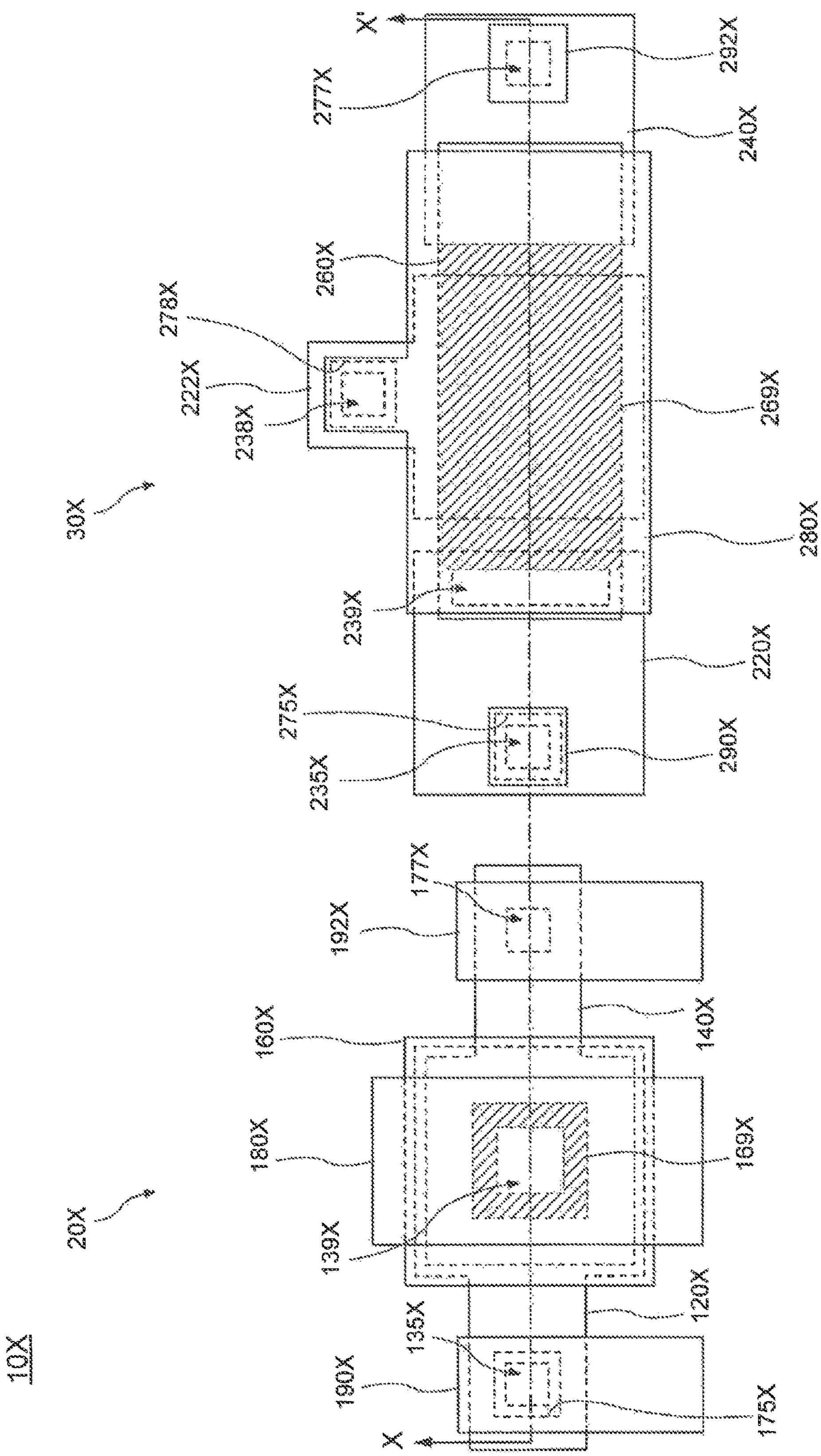
Figure 216:
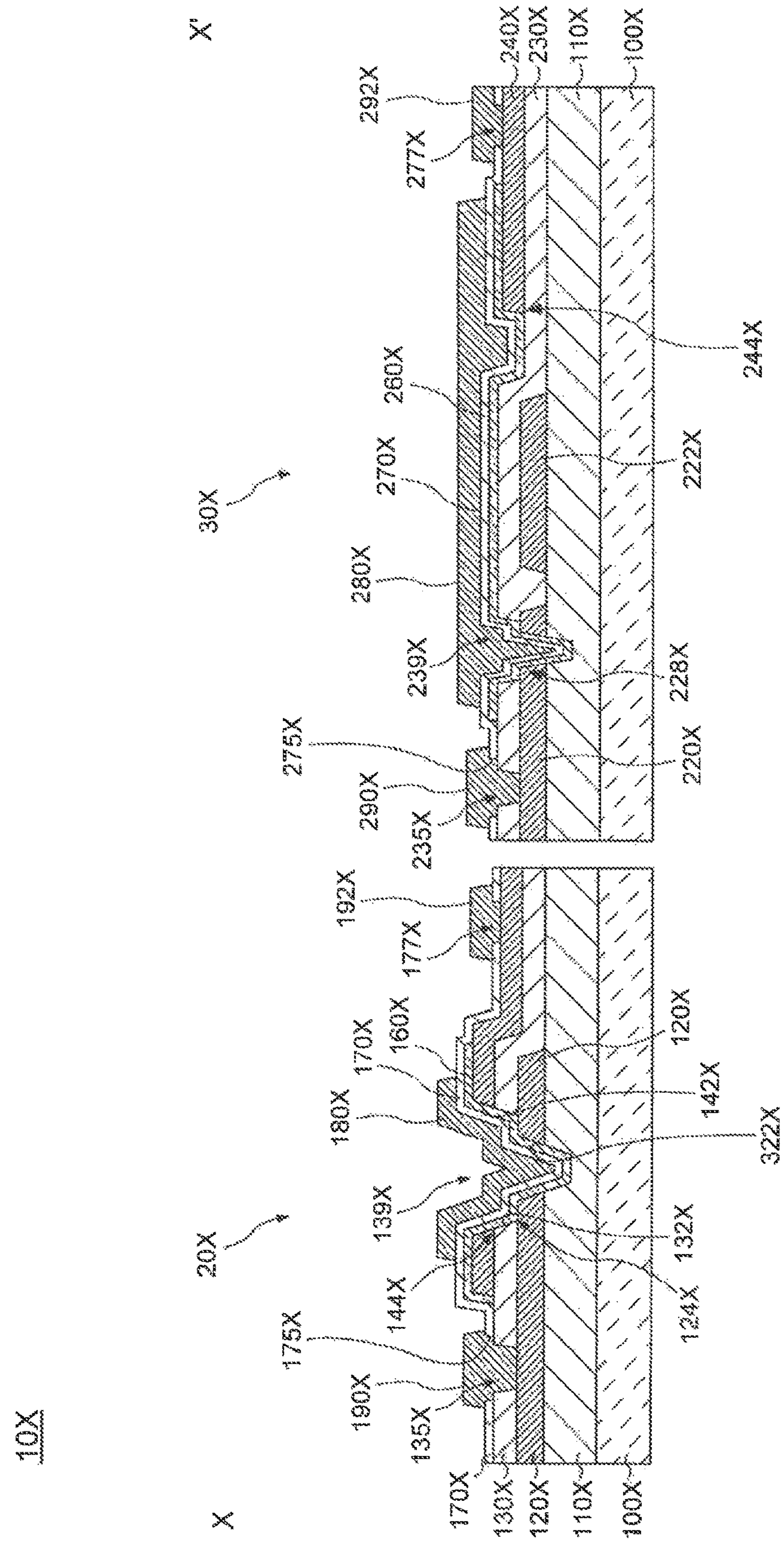
Figure 217:
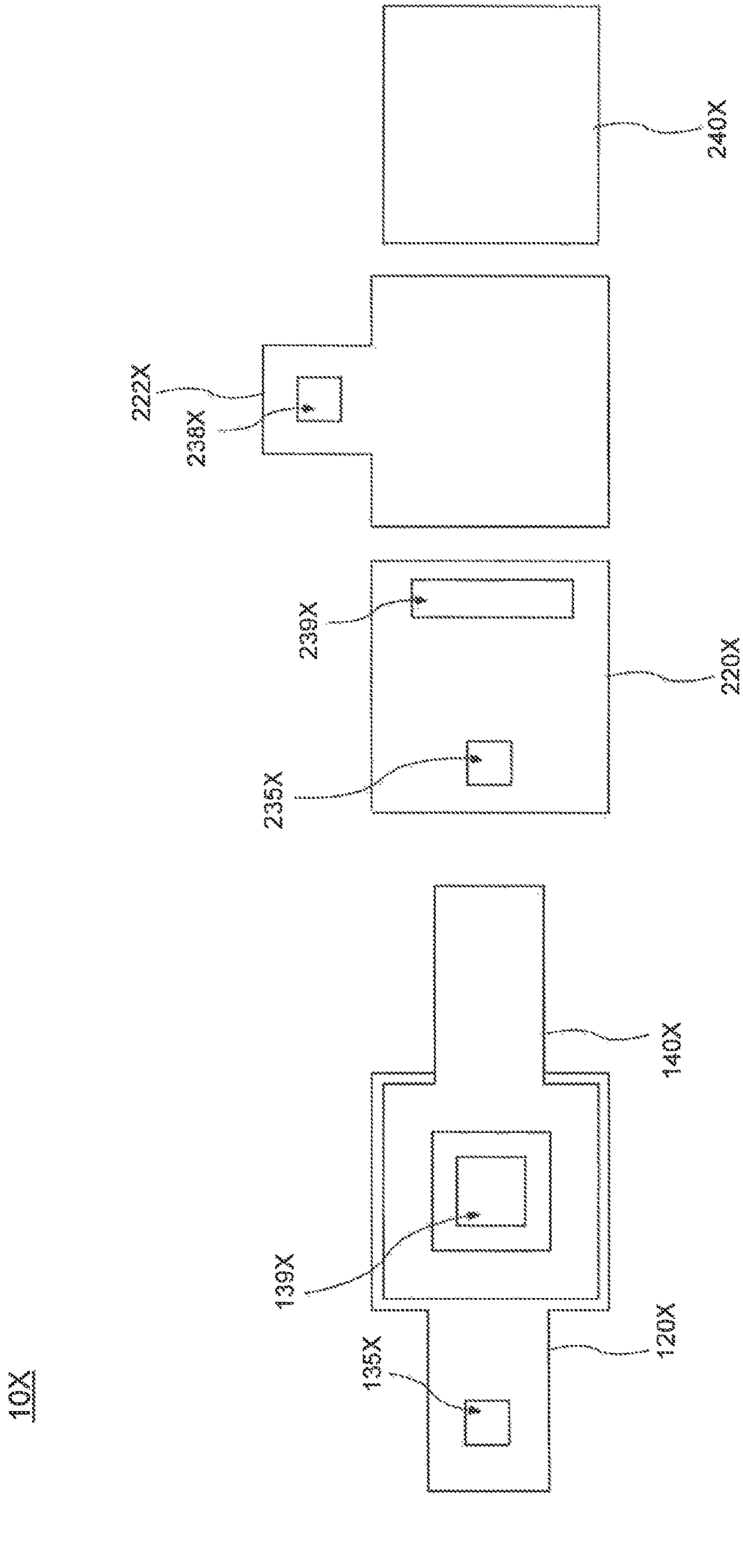
Figure 218:
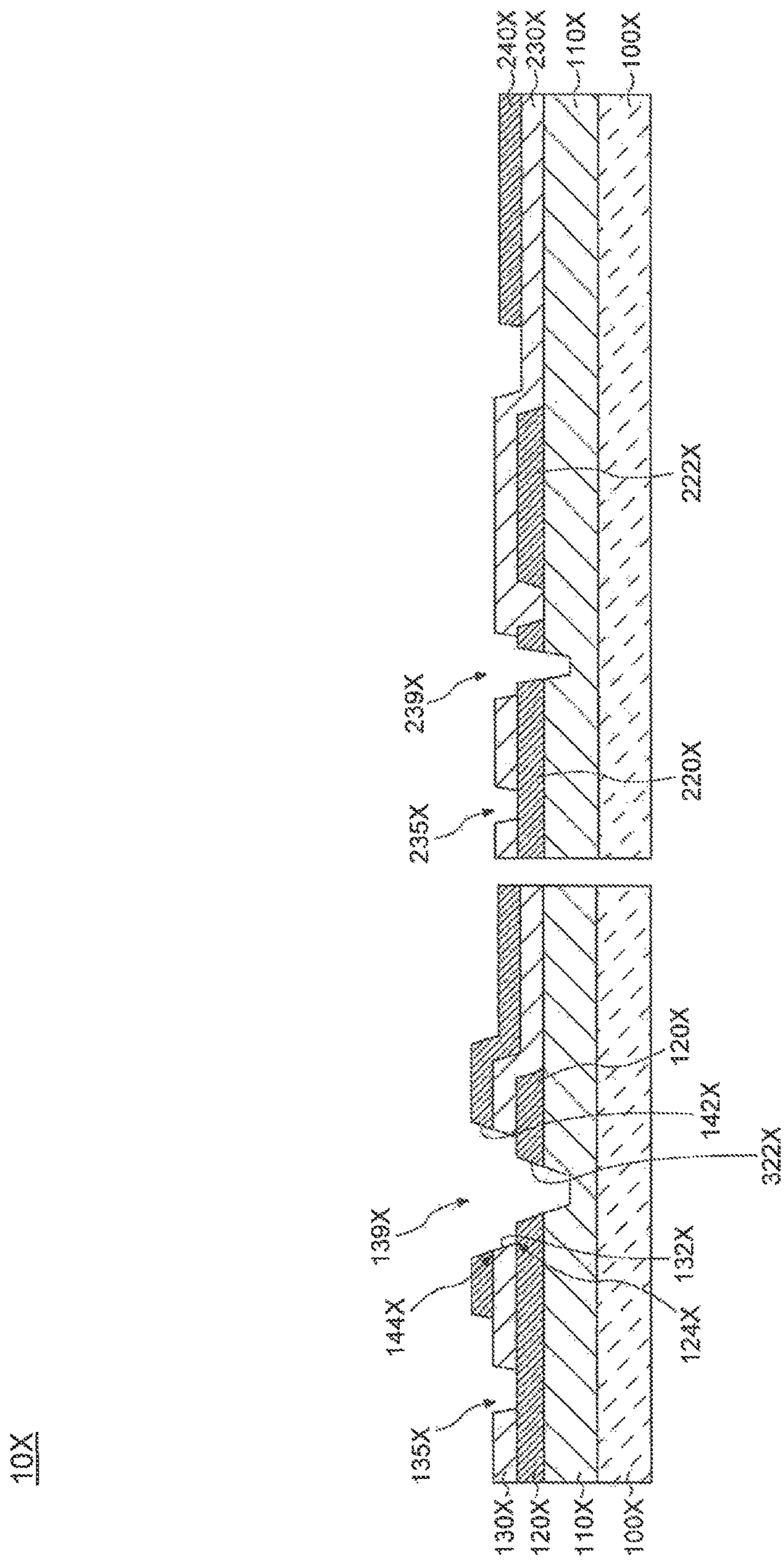
Figure 219:
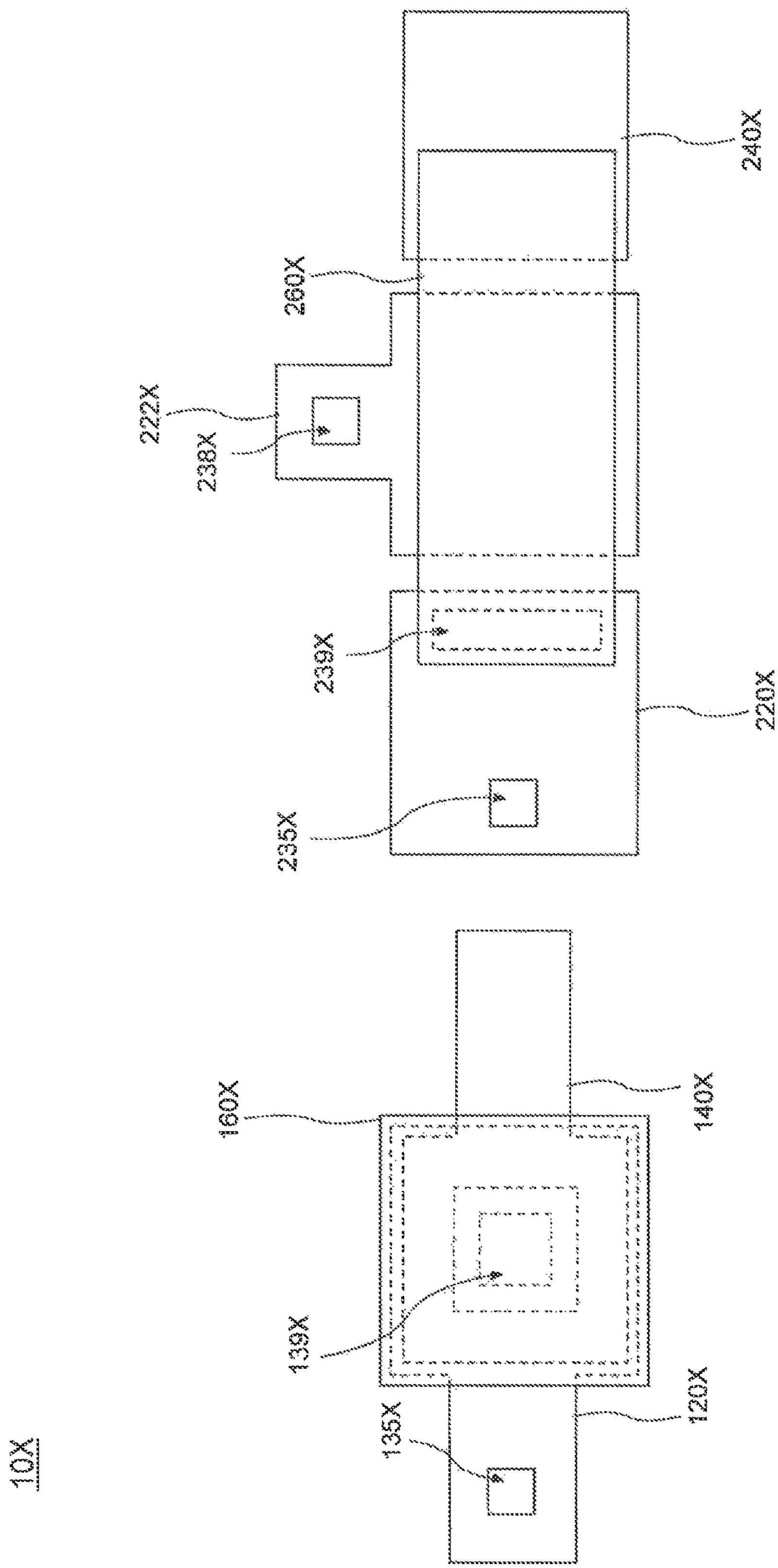
Figure 220:
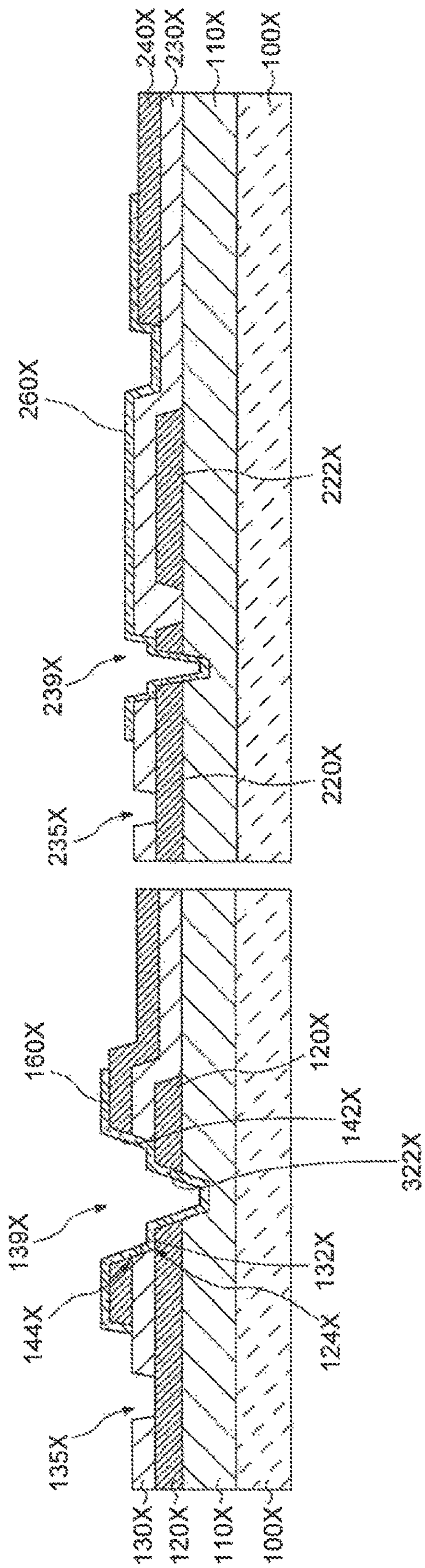
Figure 221:
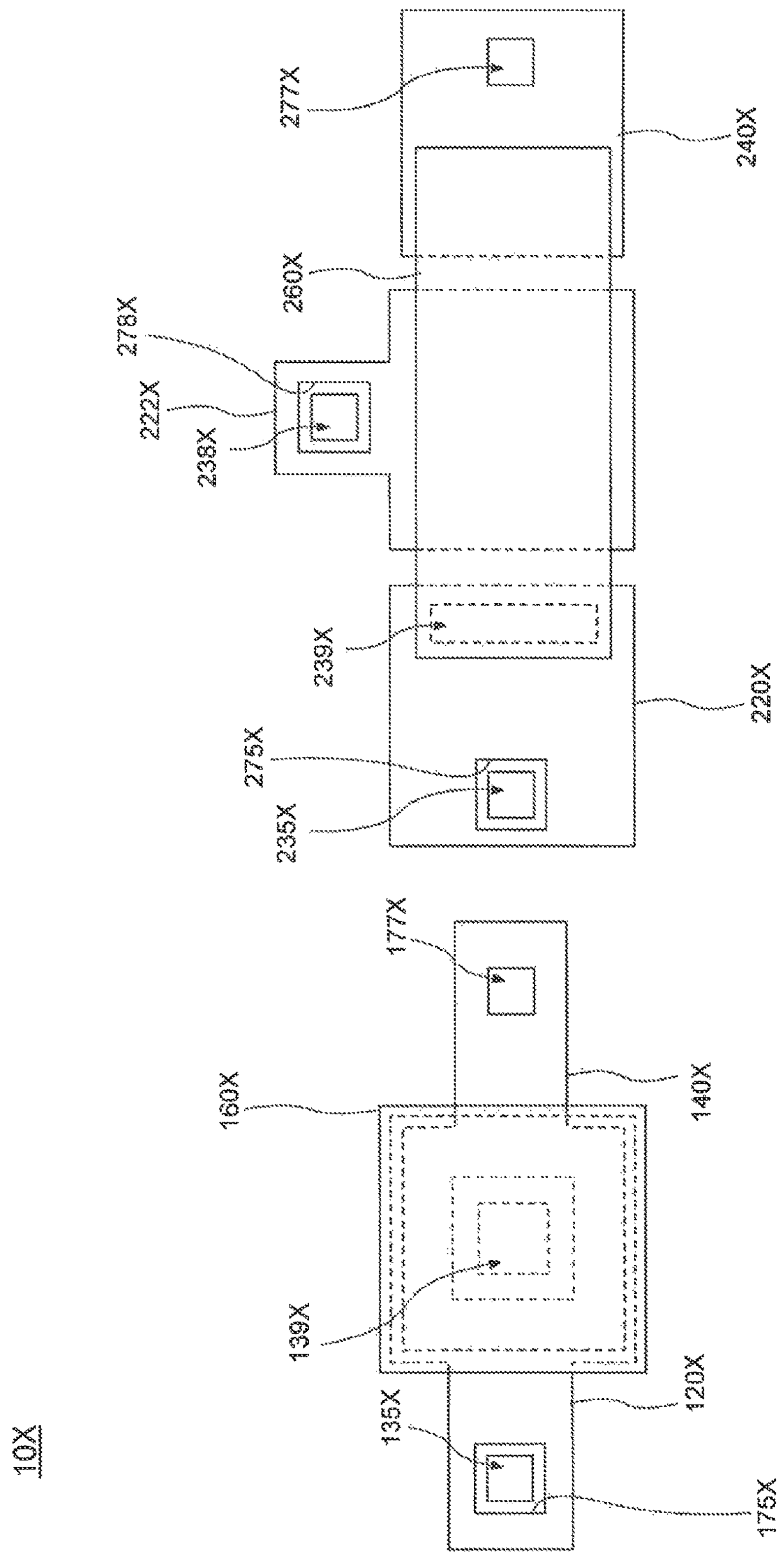
Figure 222:
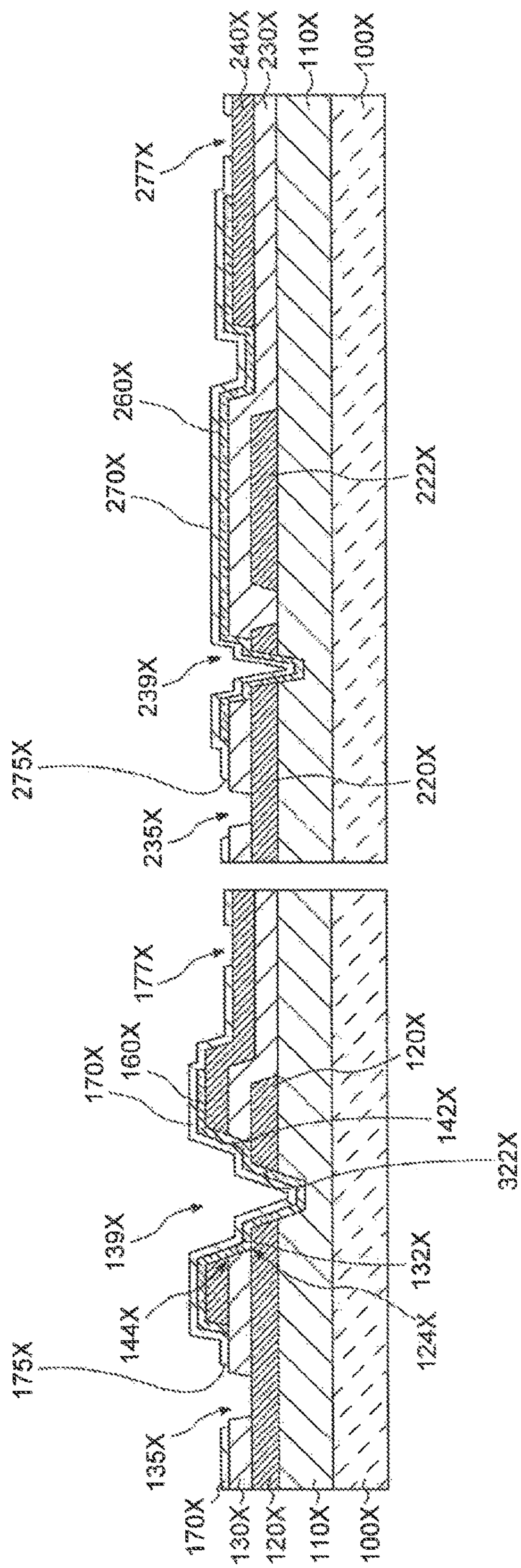
Figure 223:
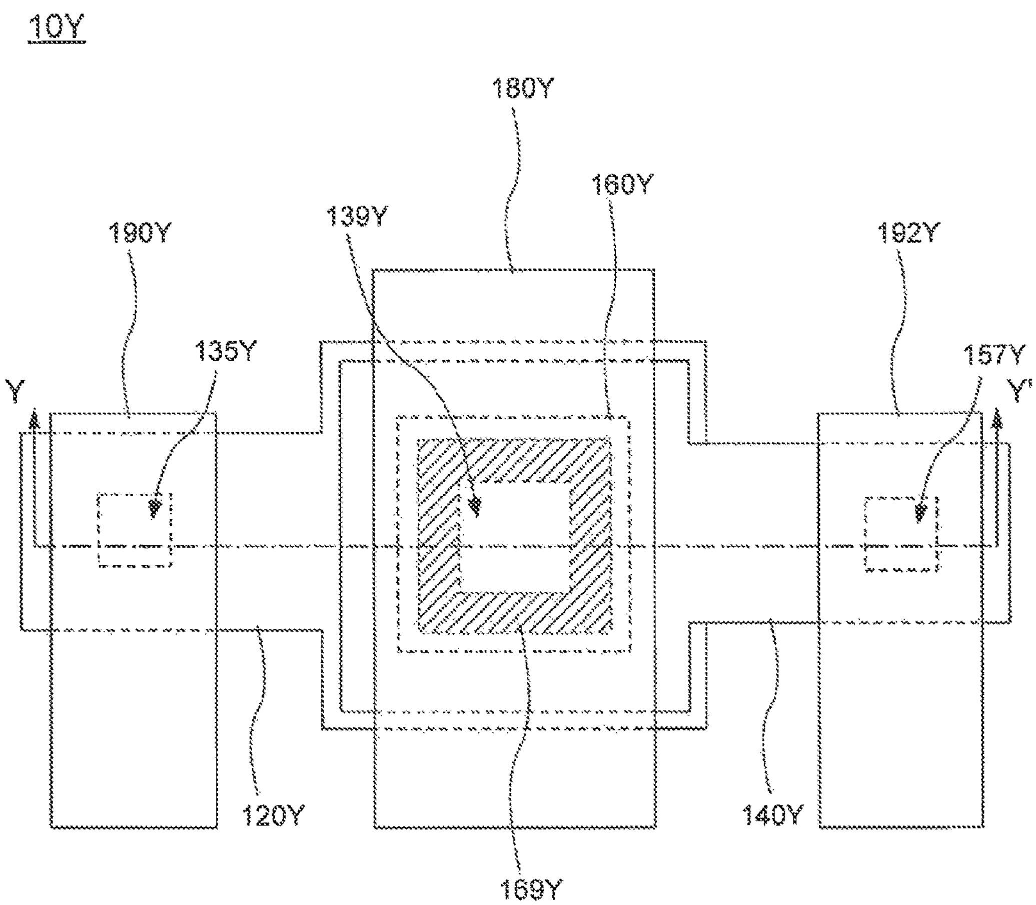
Figure 224:
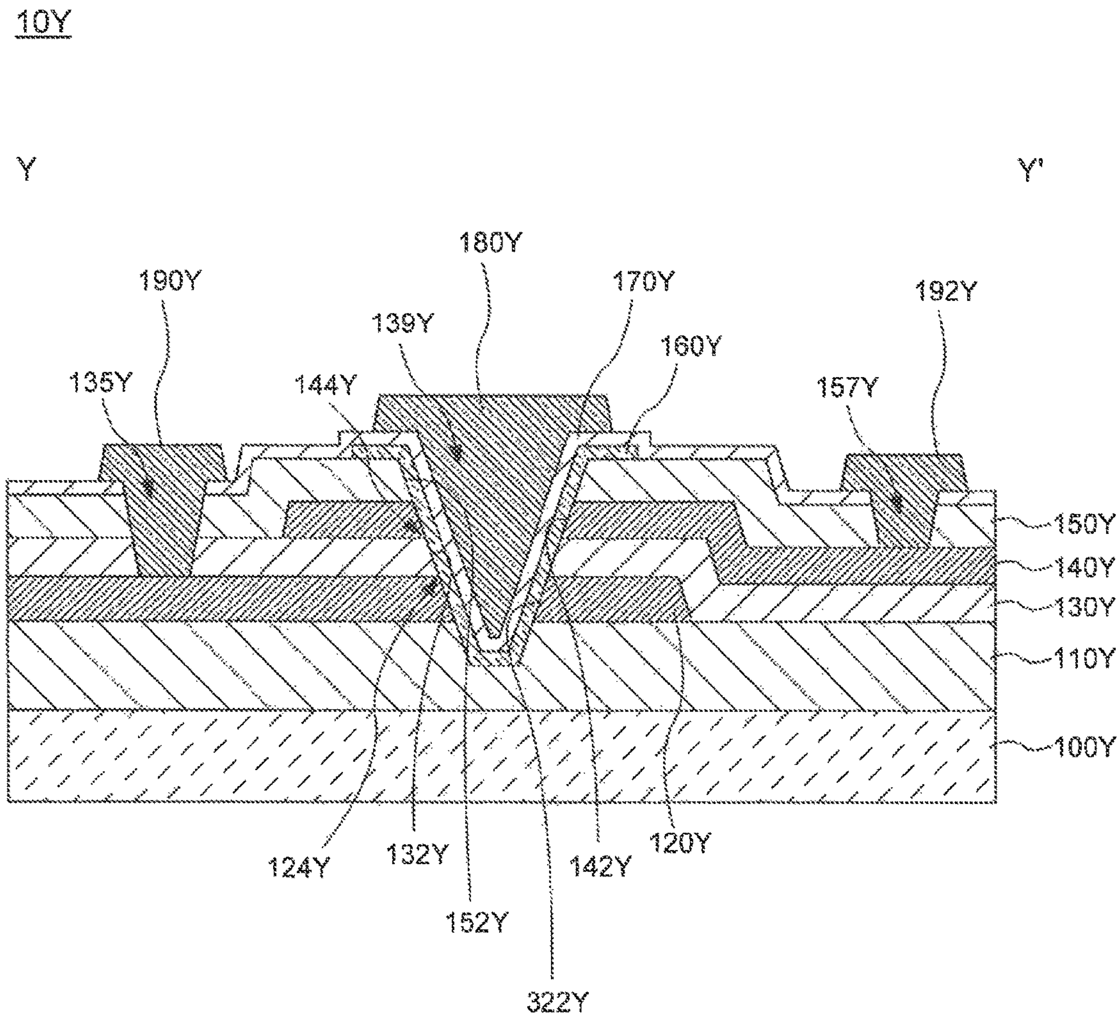
Figure 225:
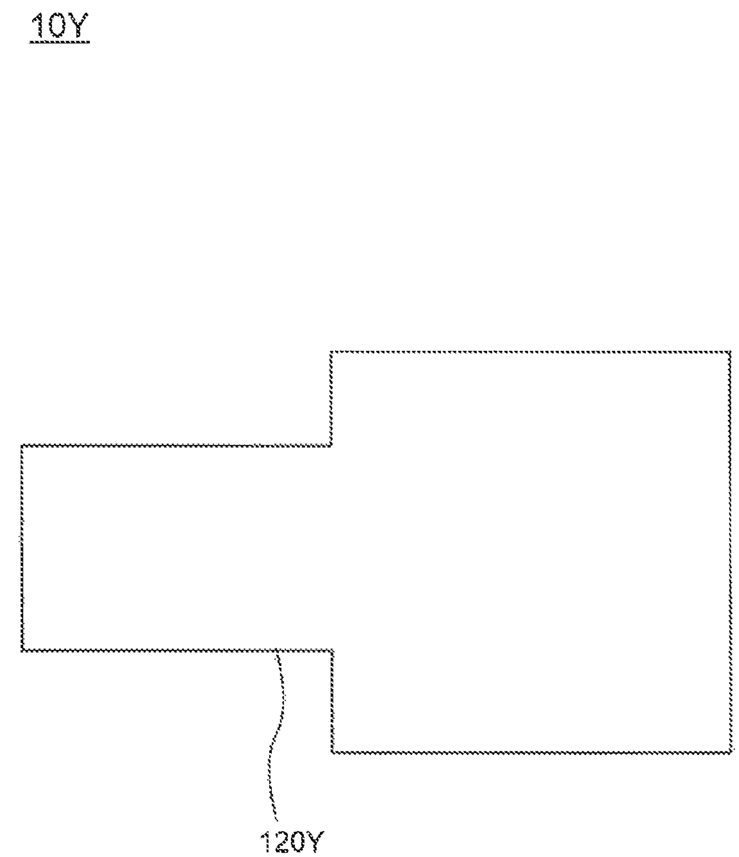
Figure 226:
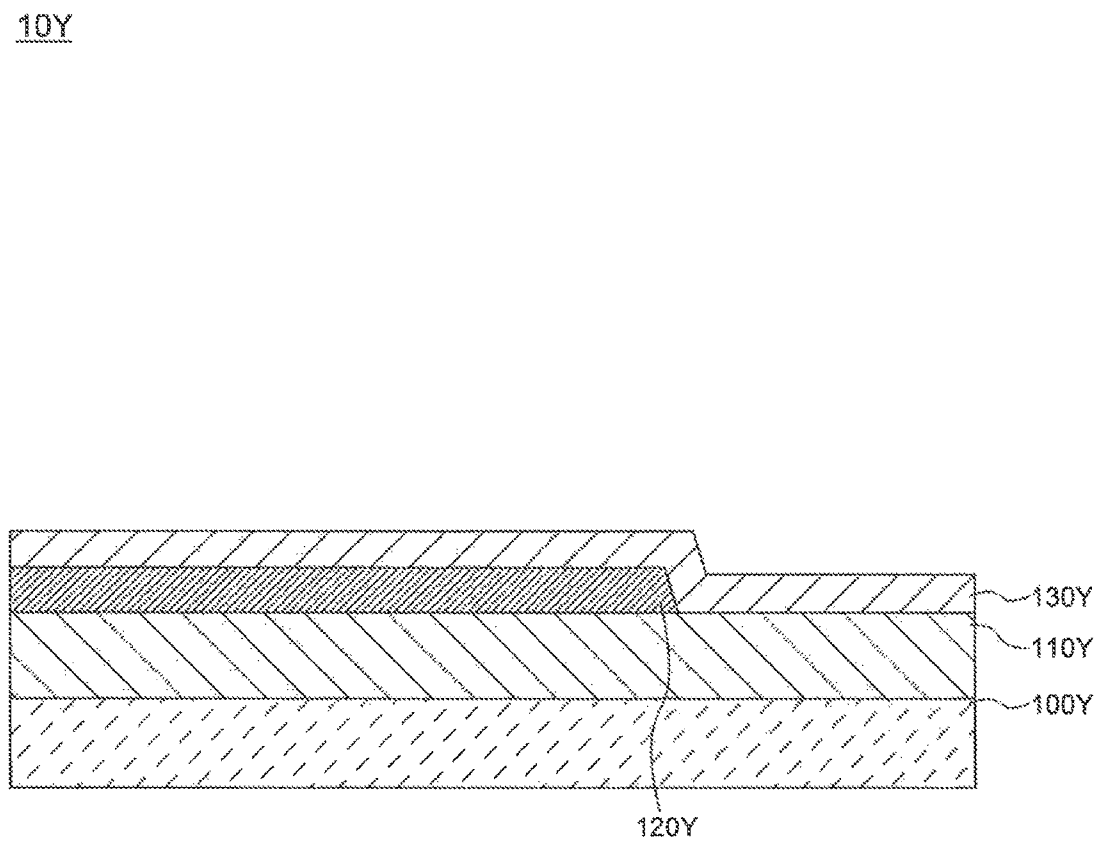
Figure 227:
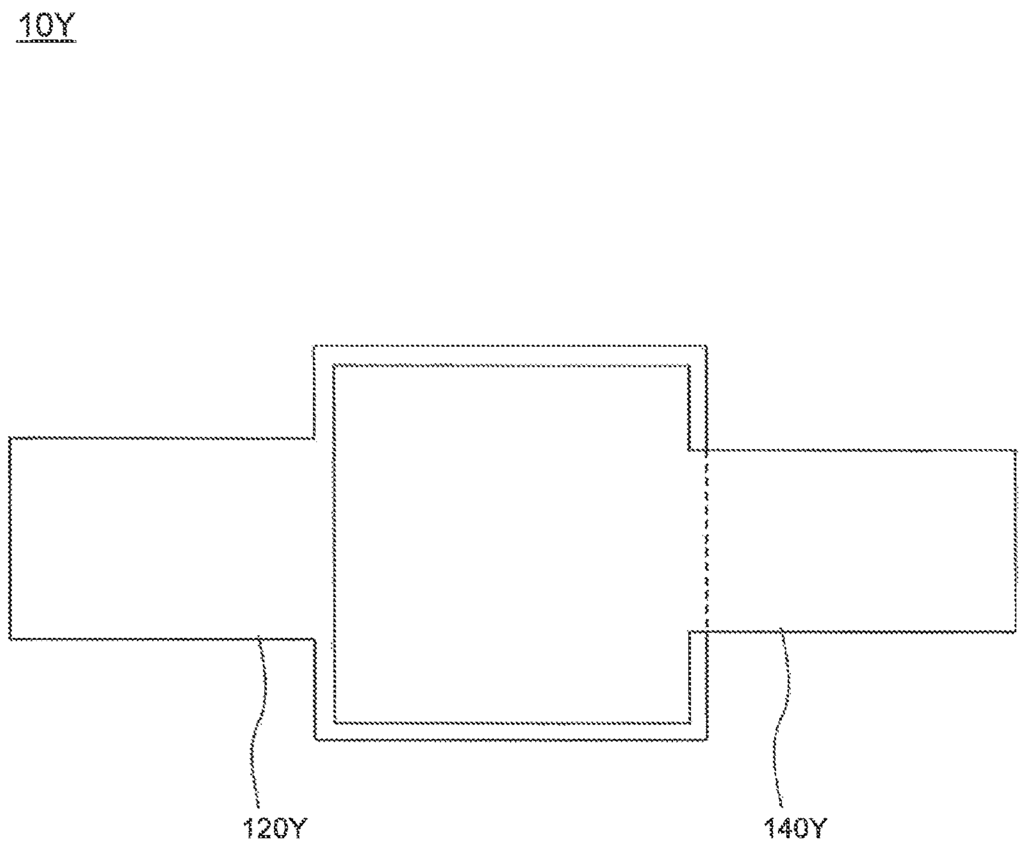
Figure 228:
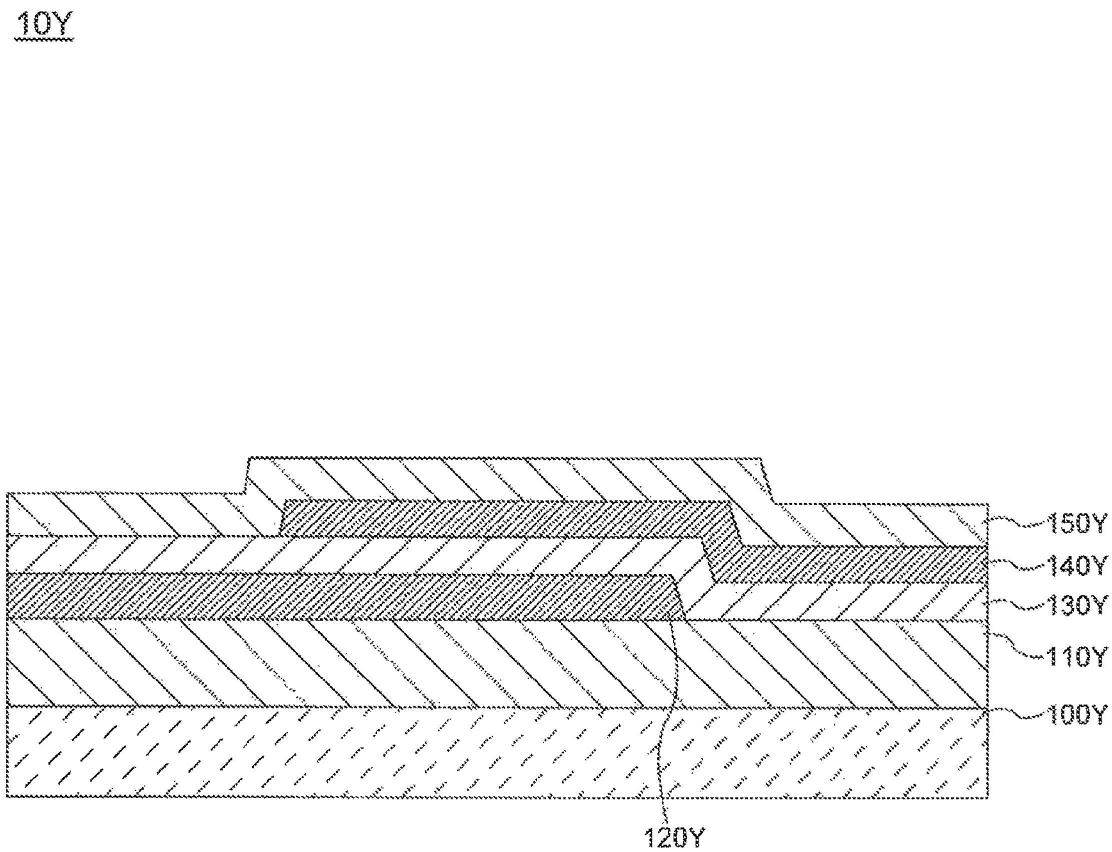
Figure 229:
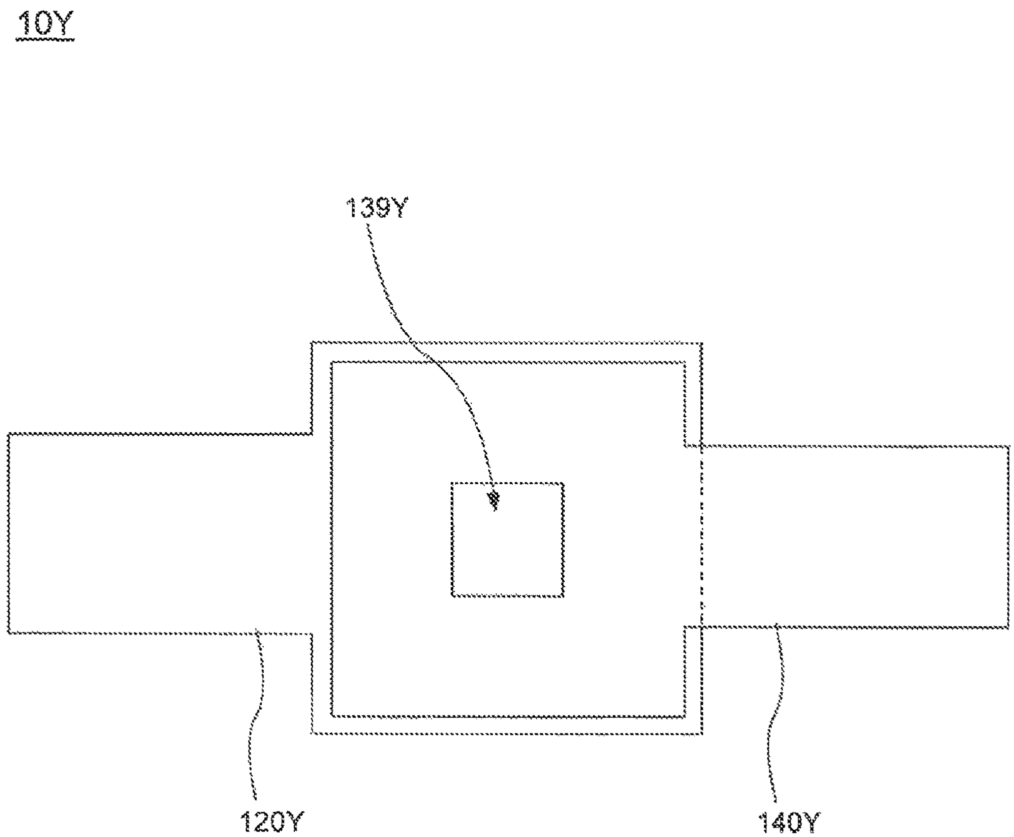
Figure 230:
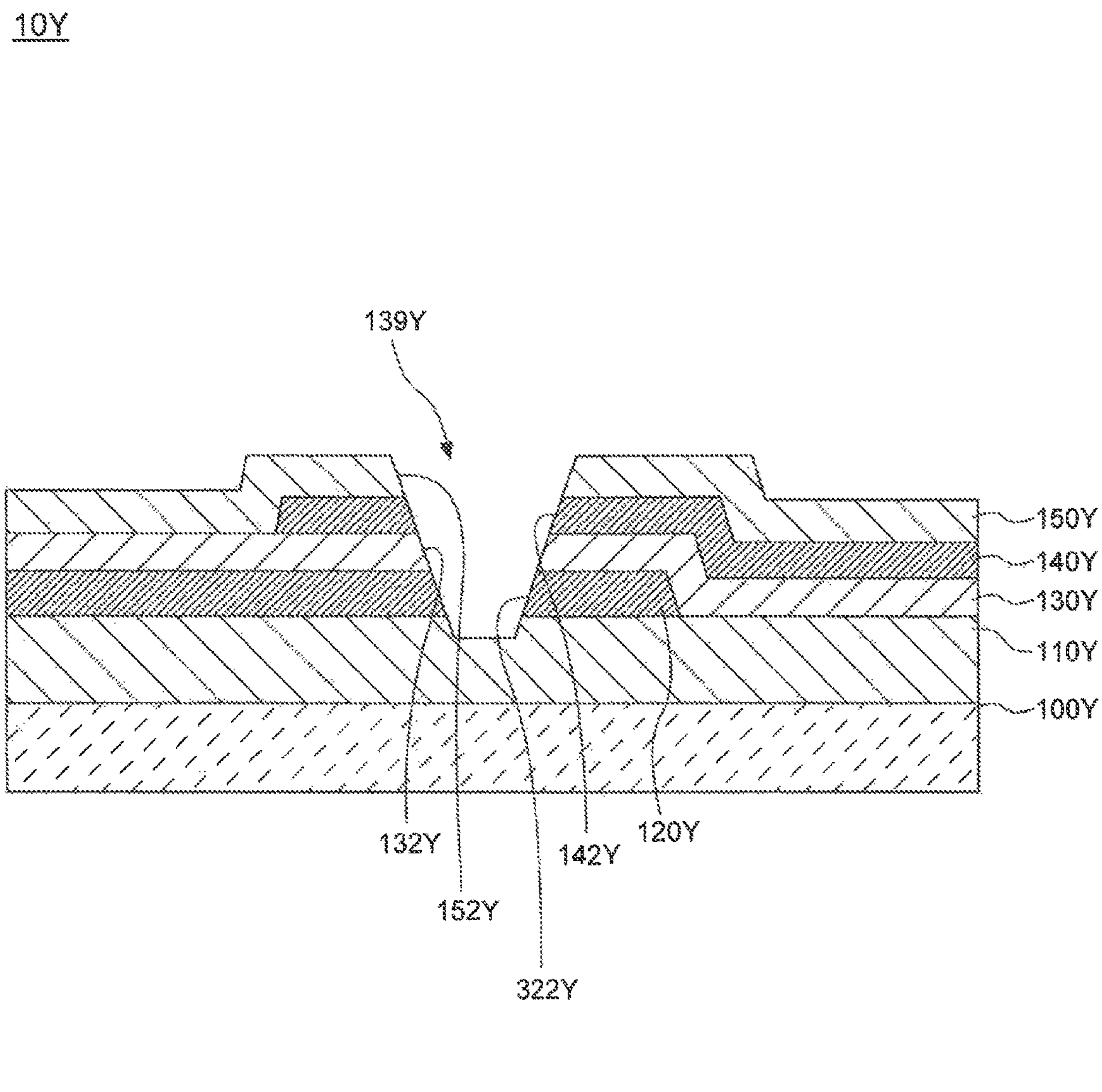
Figure 231:
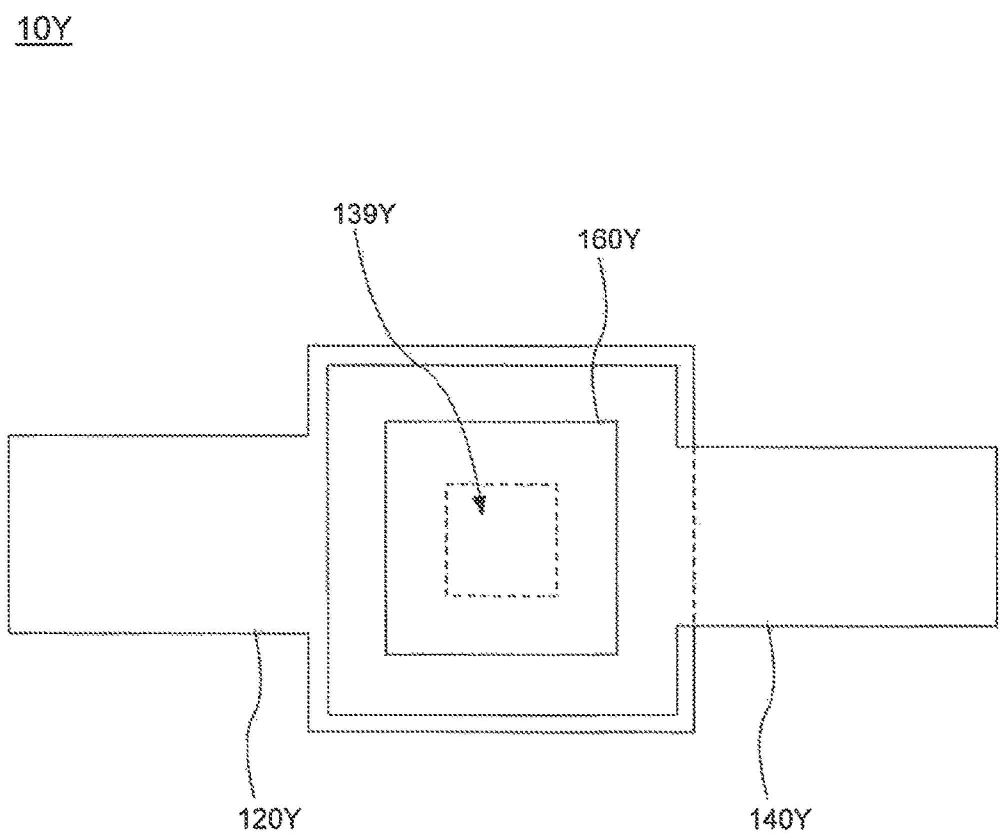
Figure 232:
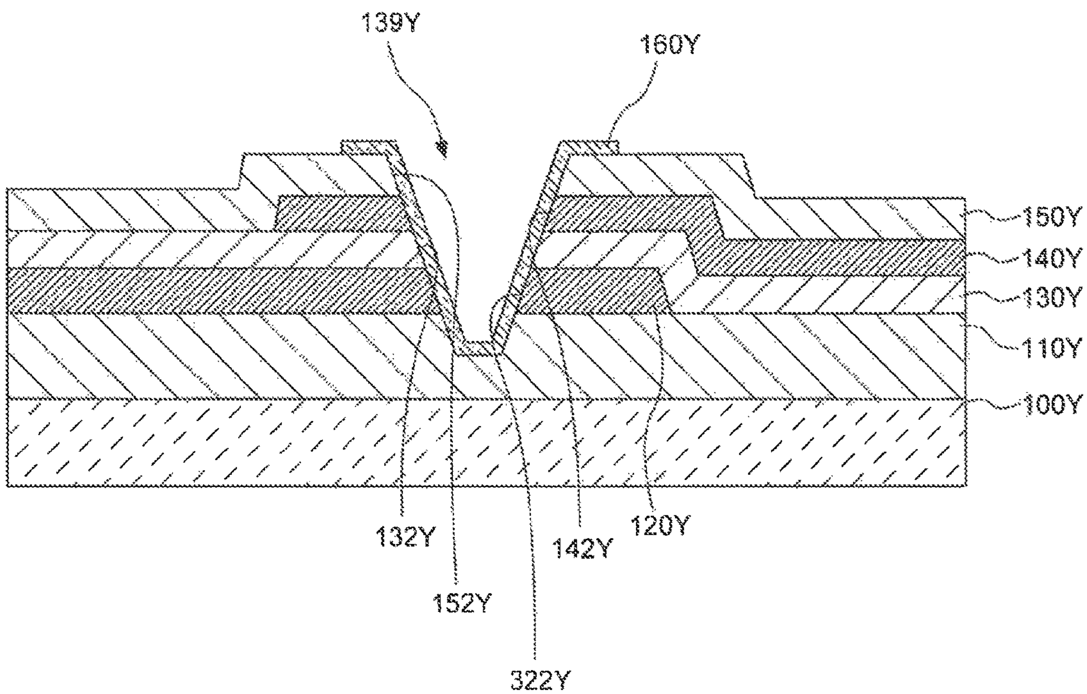
Figure 233:
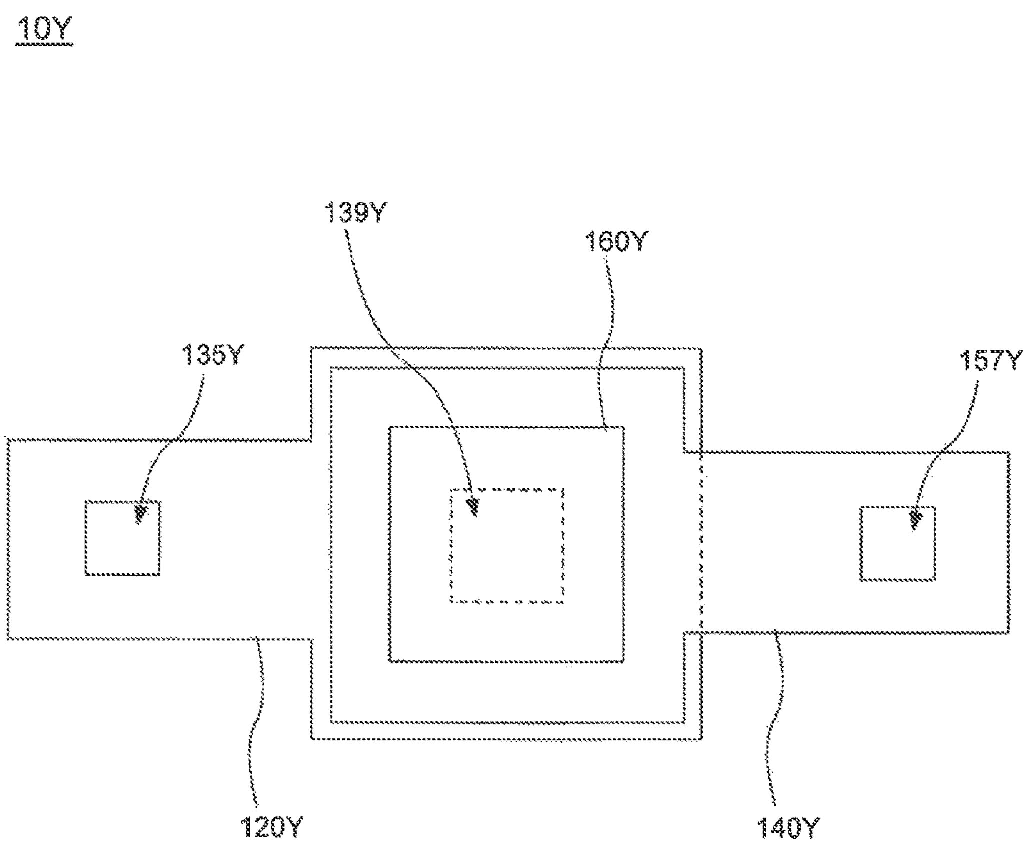
Figure 234:
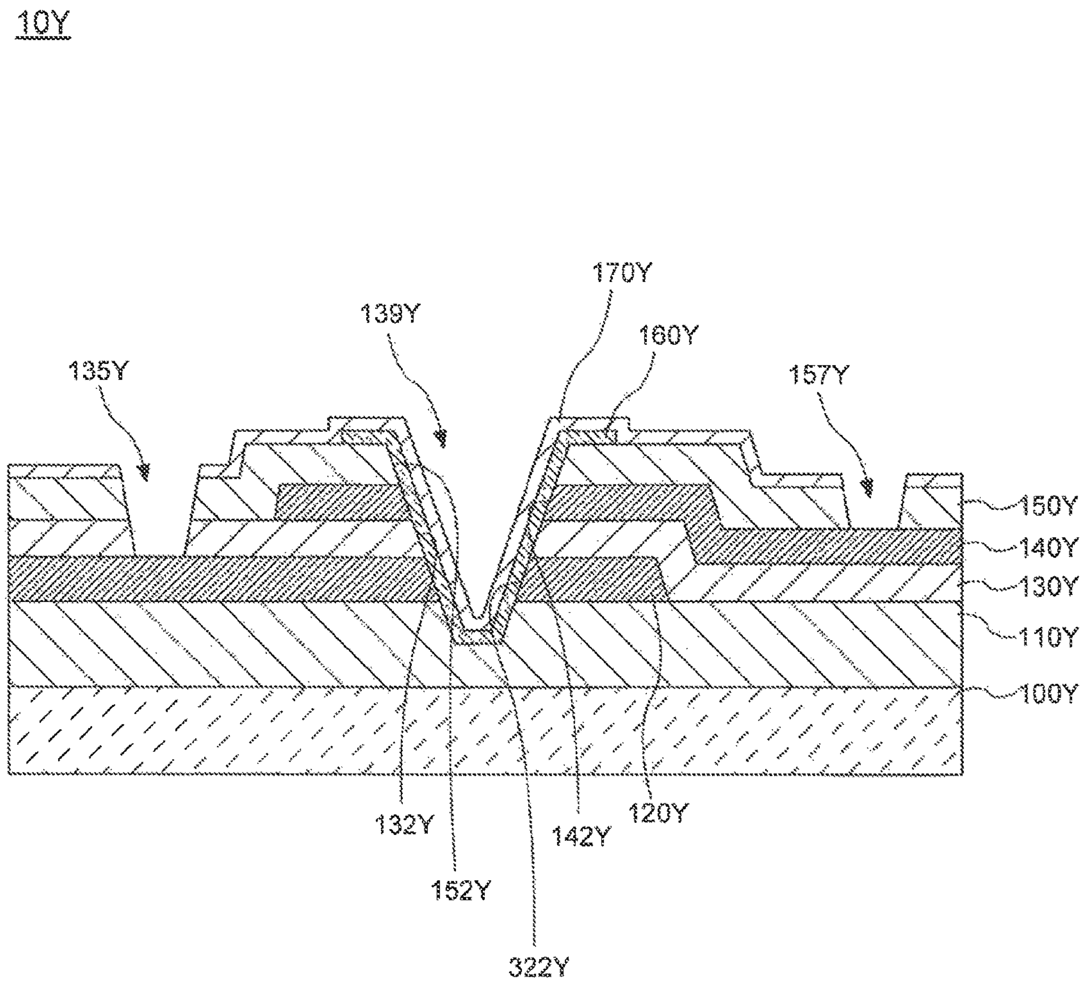
Figure 235:
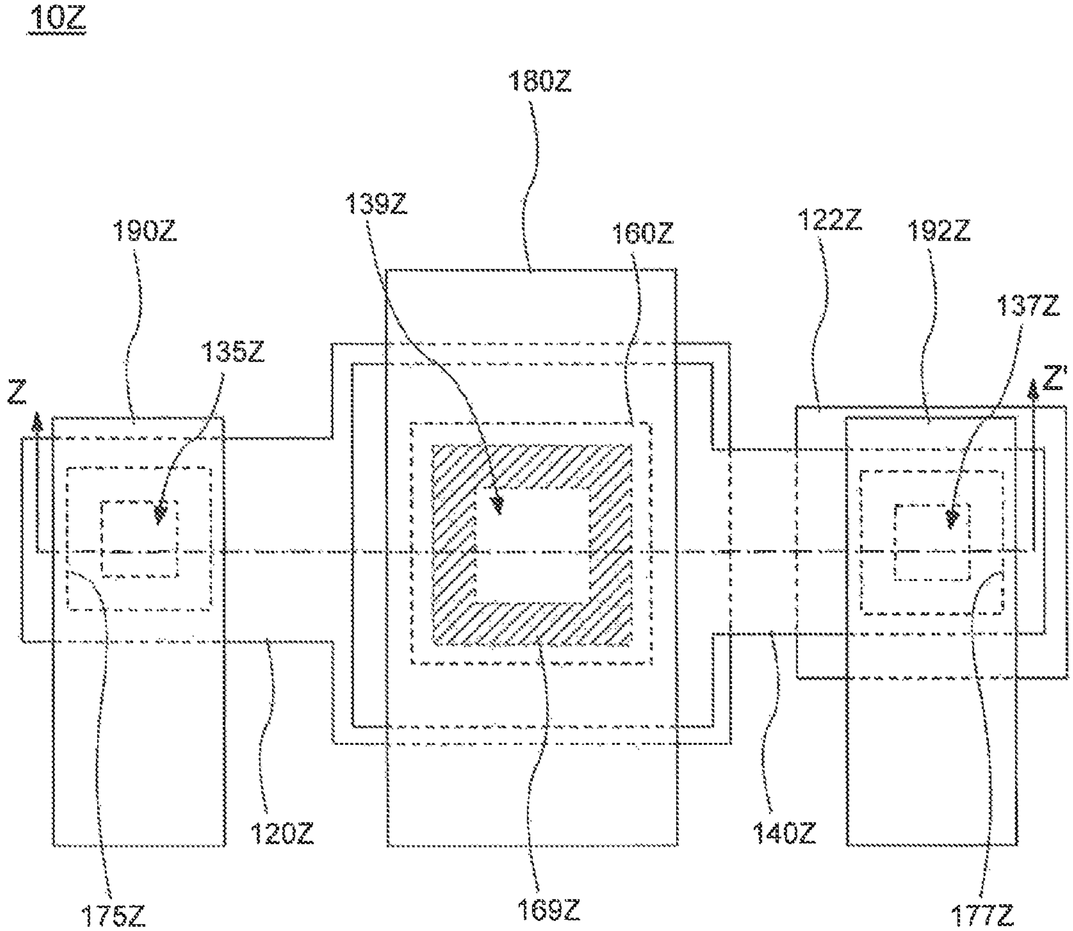
Figure 236:
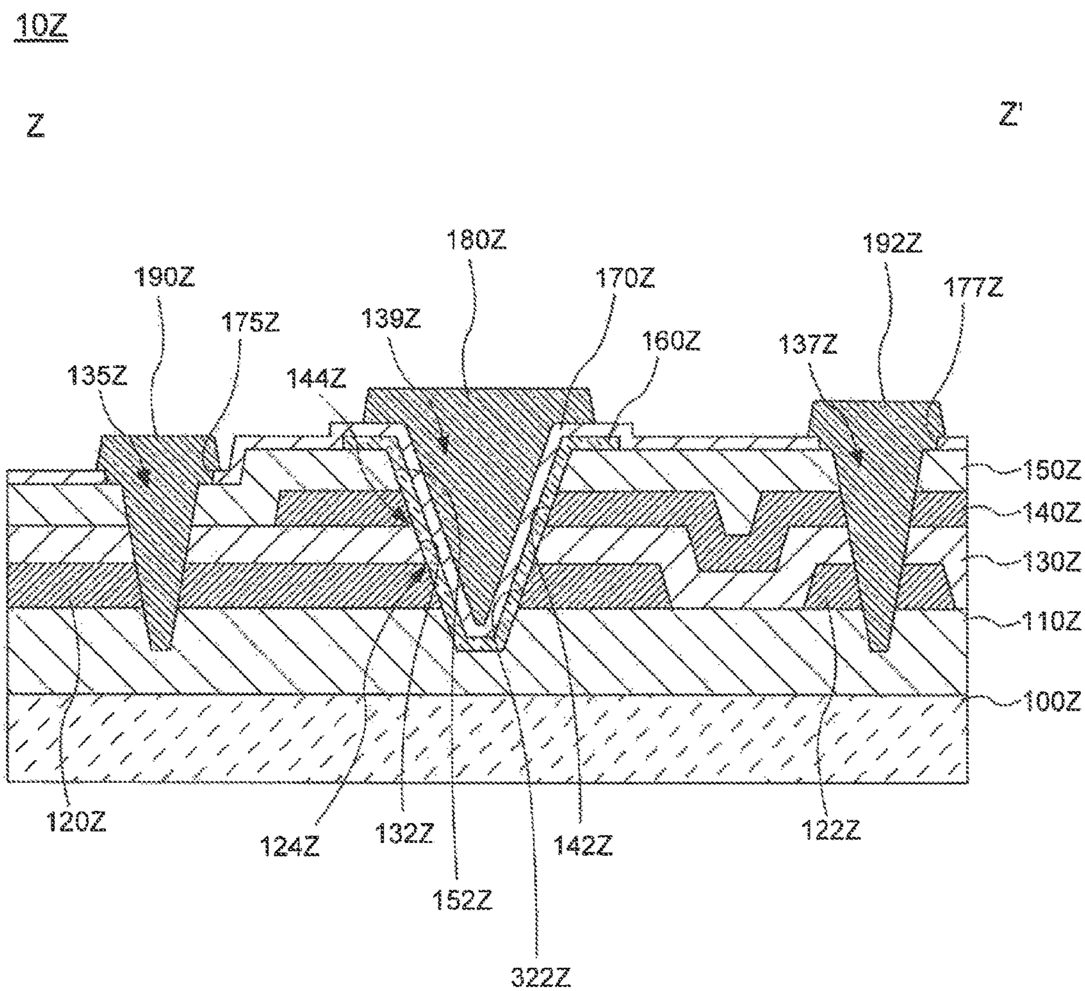
Figure 237:
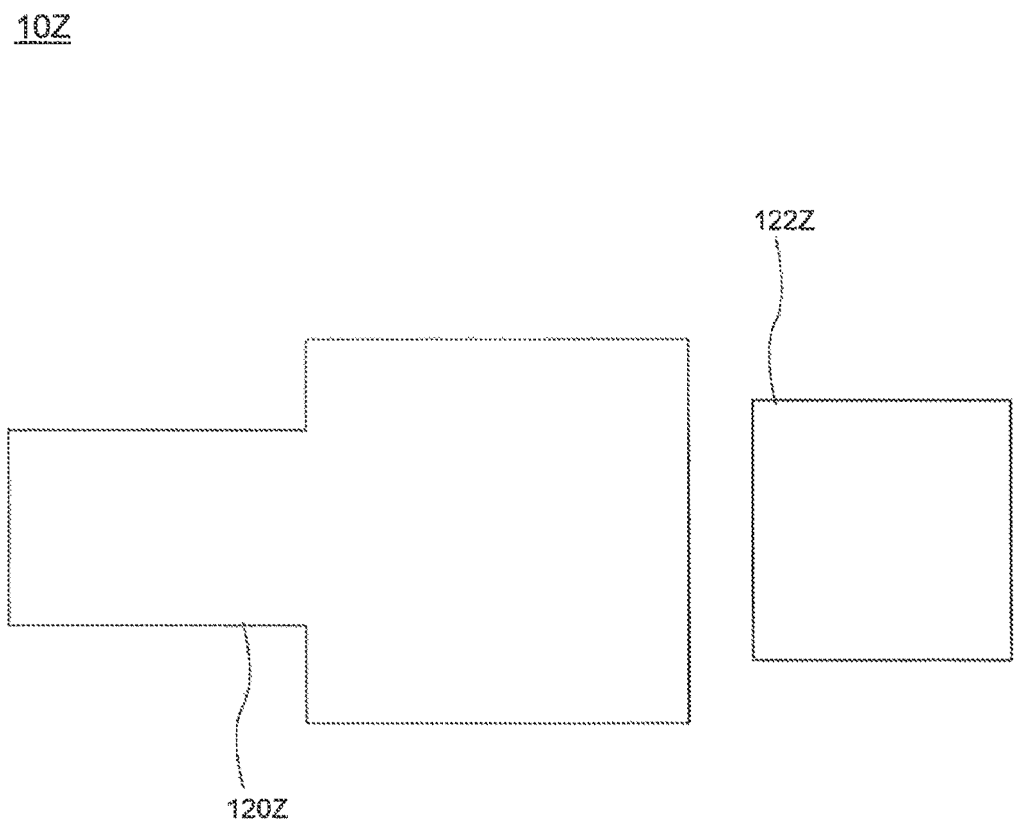
Figure 238:
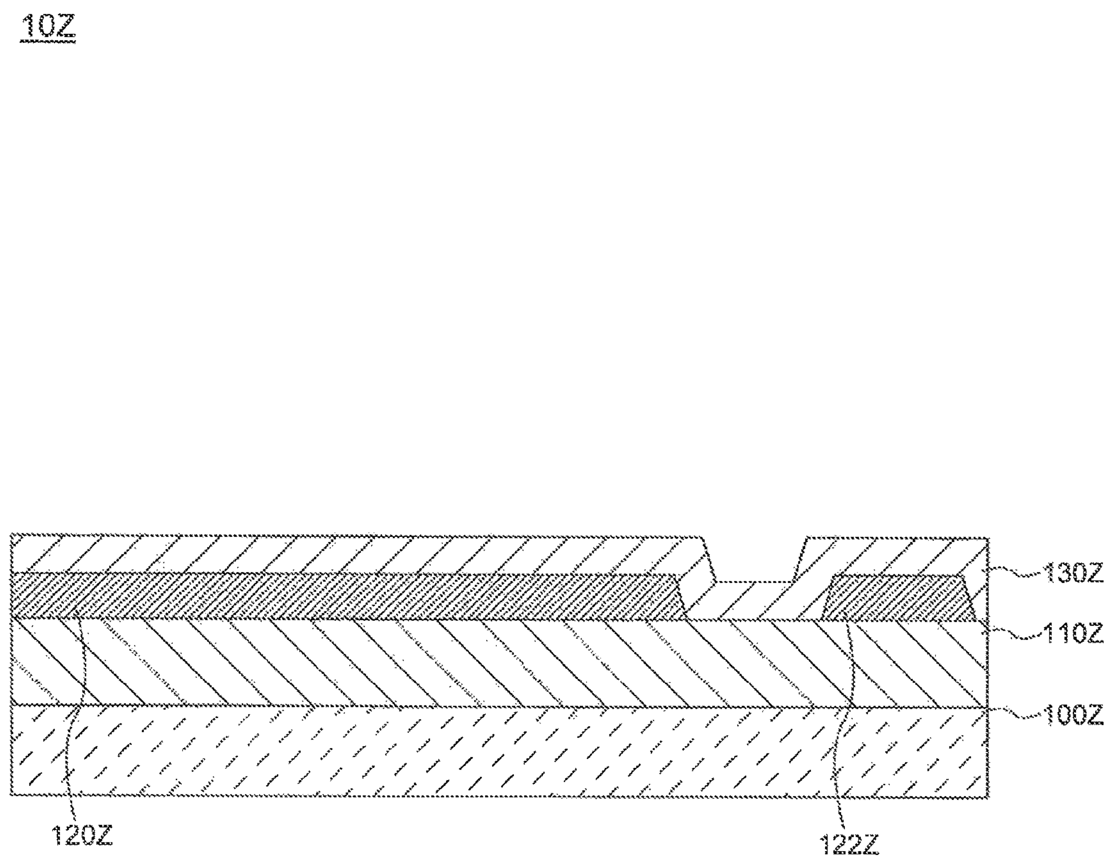
Figure 239:
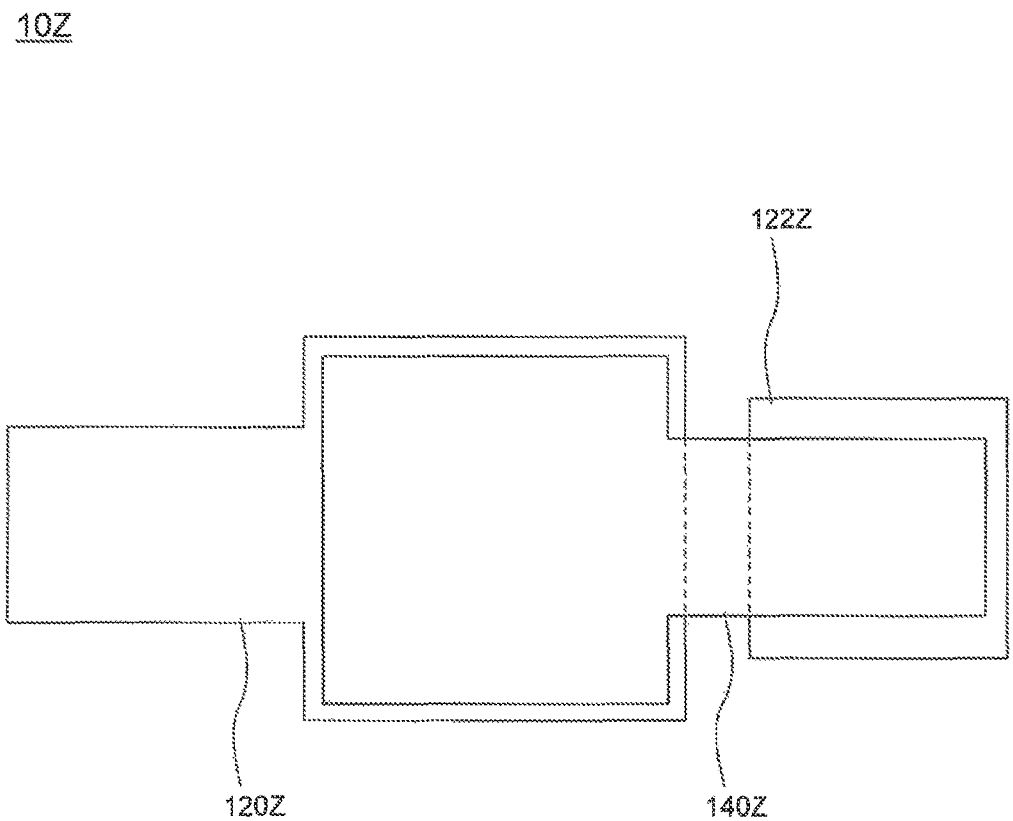
Figure 240:
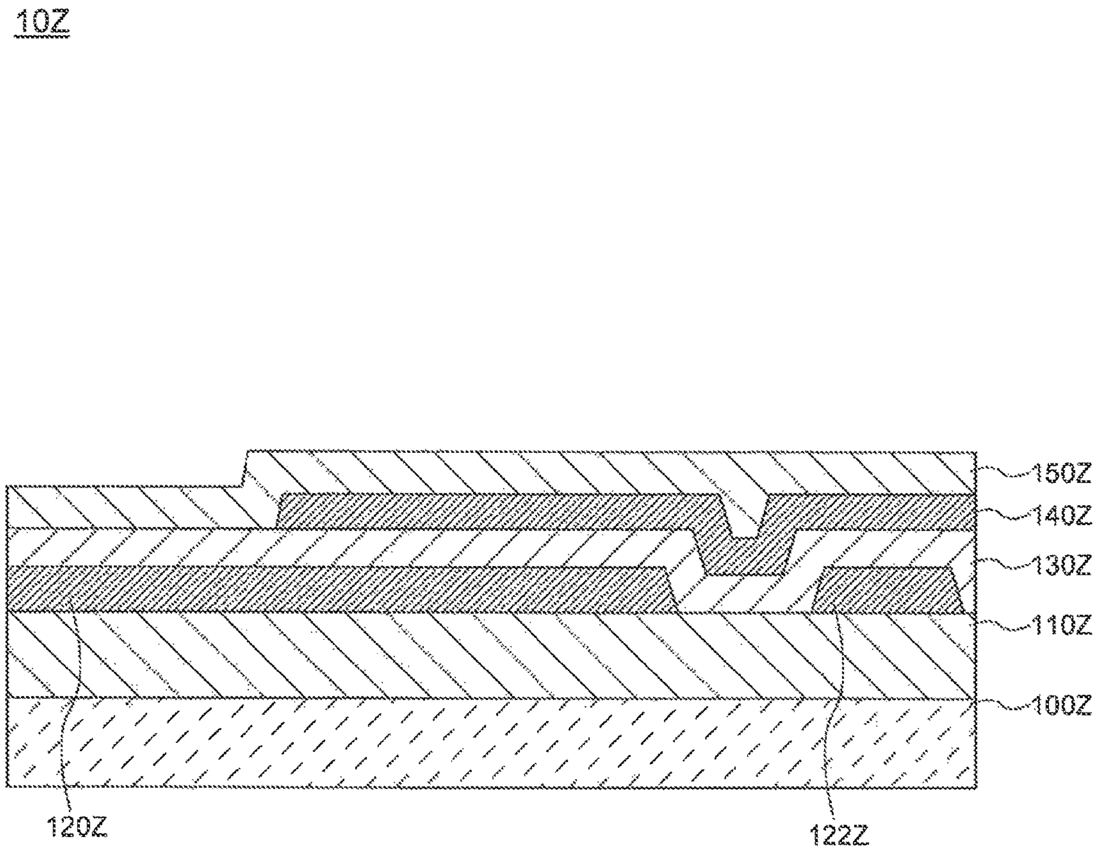
Figure 241:
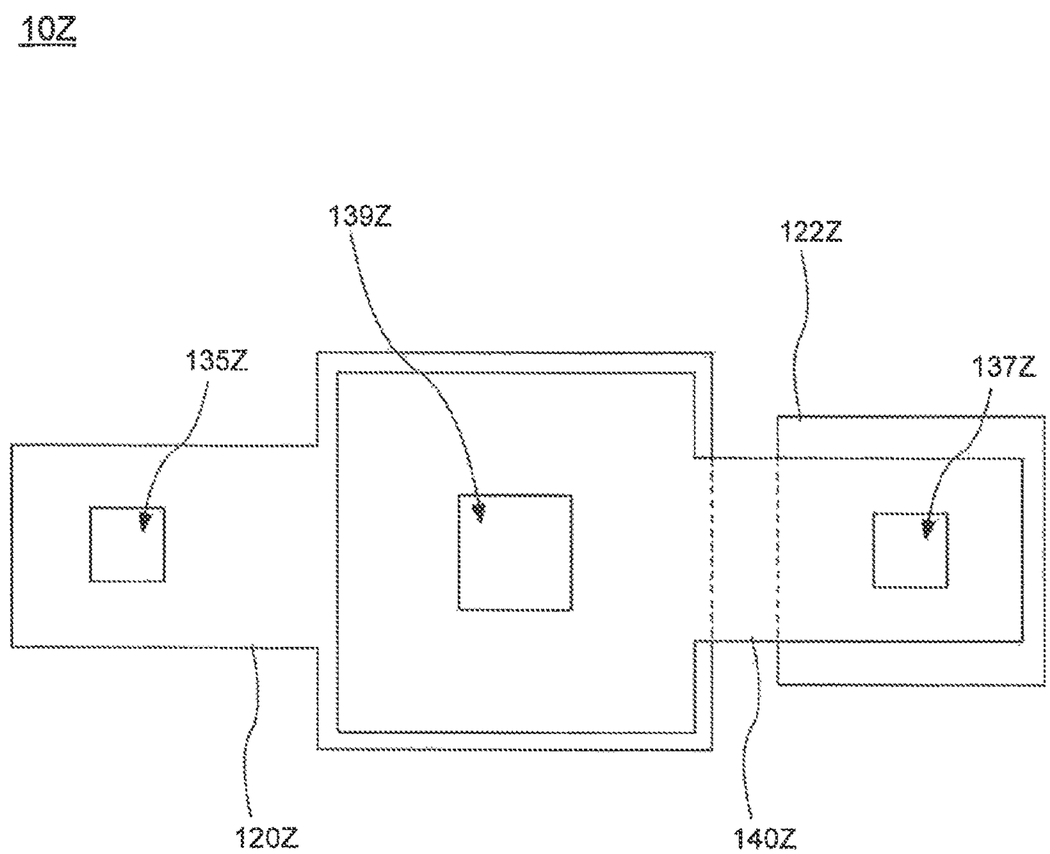
Figure 242:
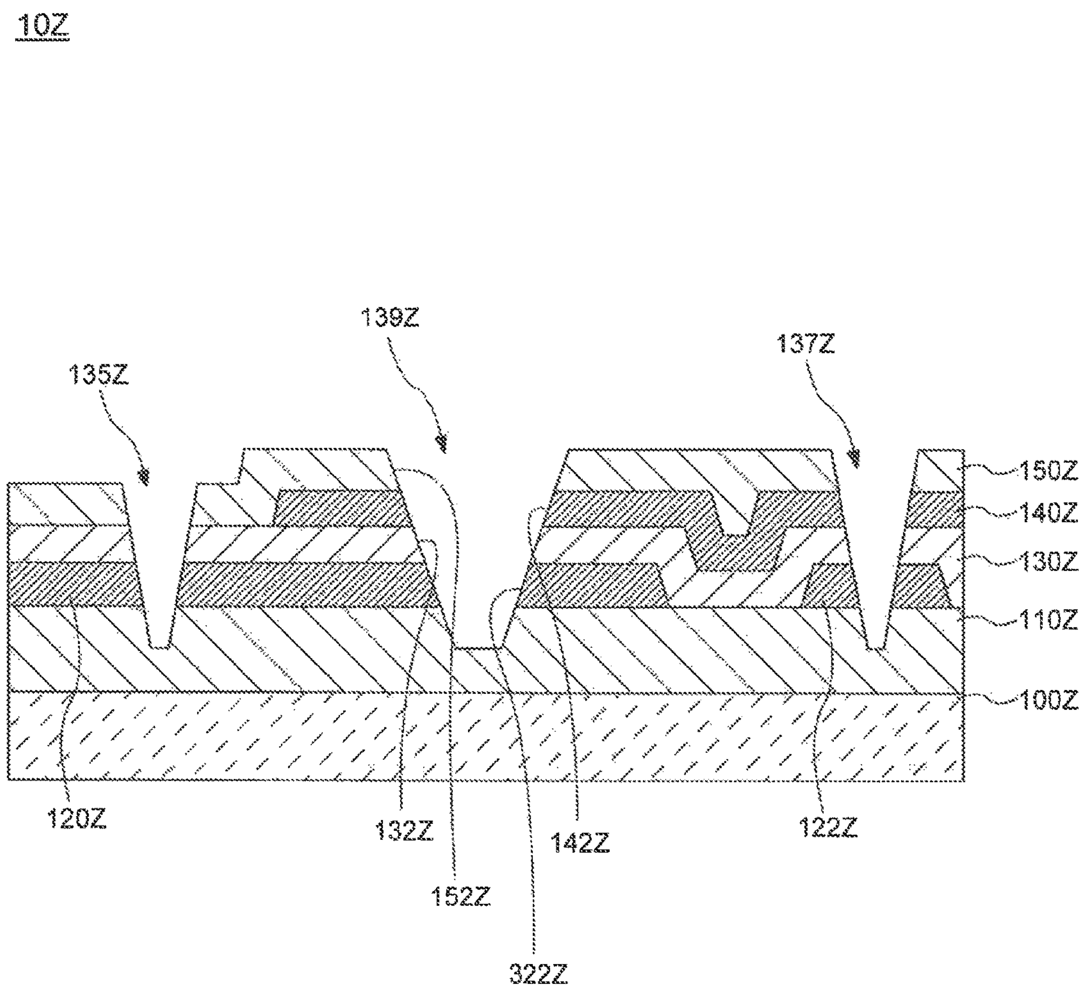
Figure 243:
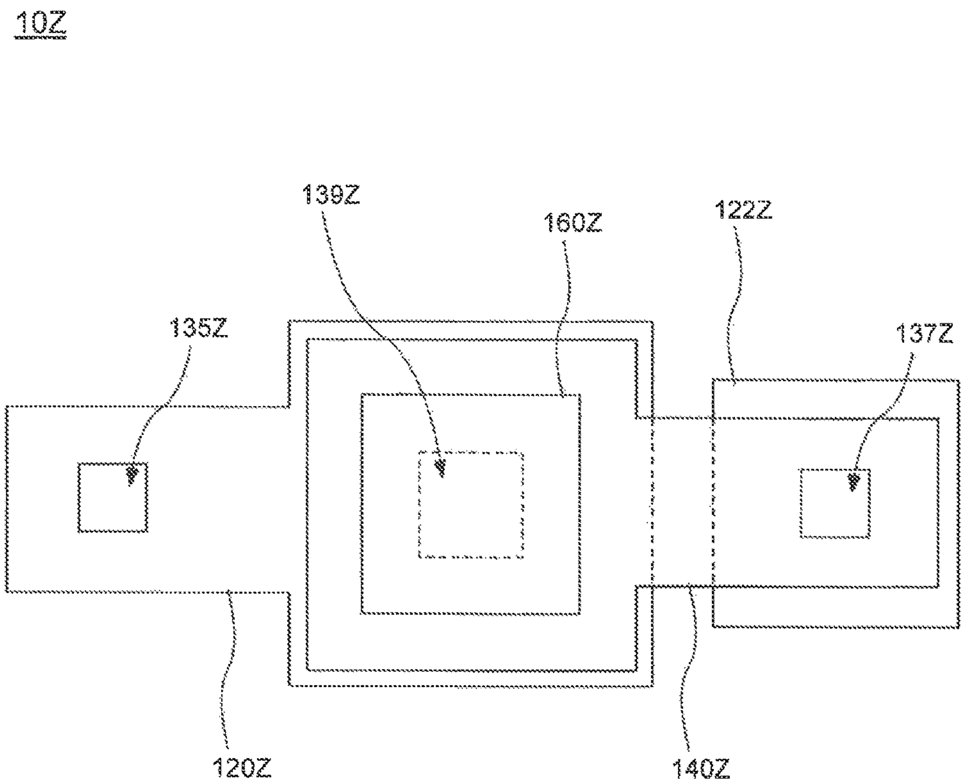
Figure 244:
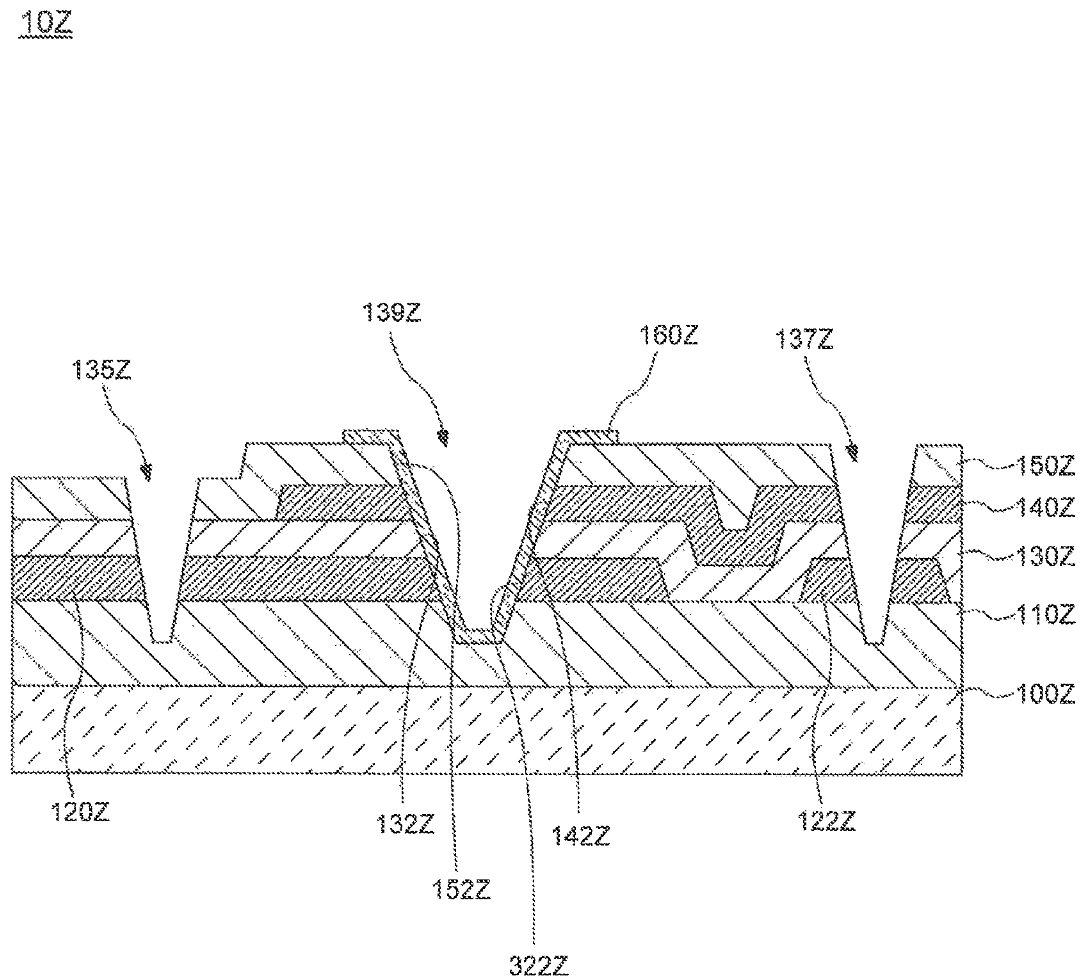
Figure 245:
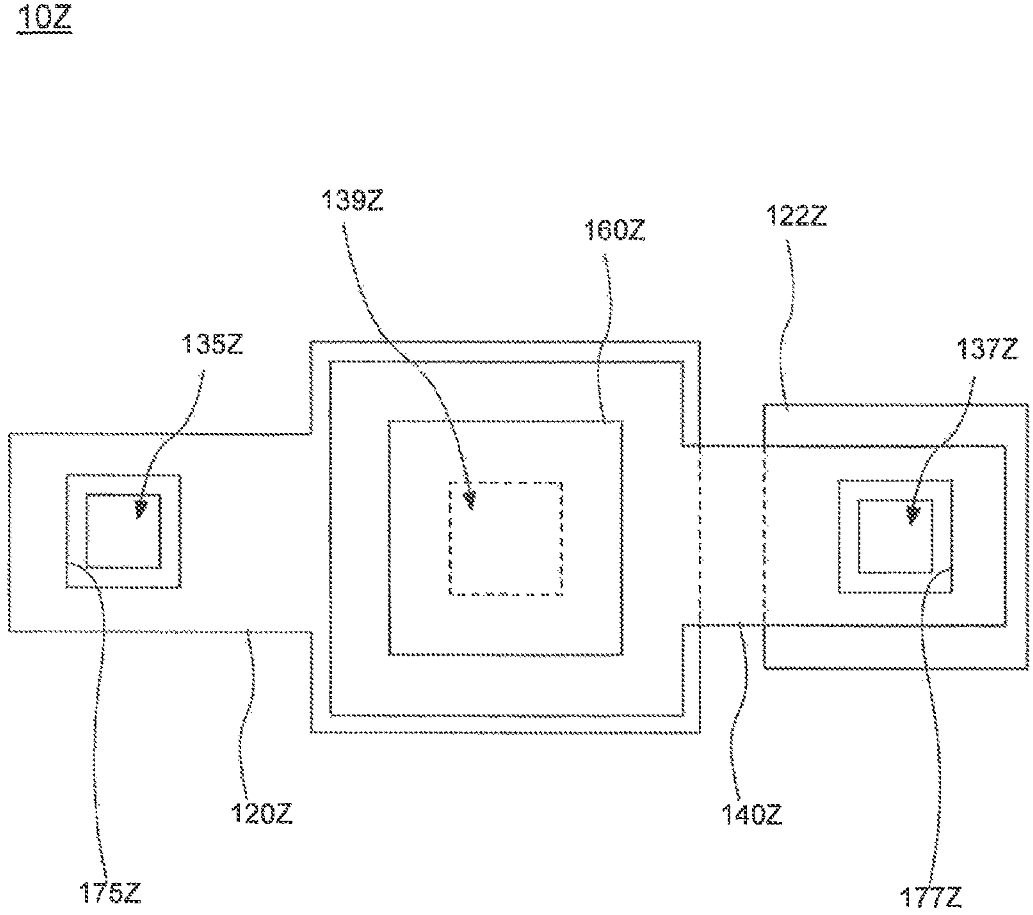
Figure 246:
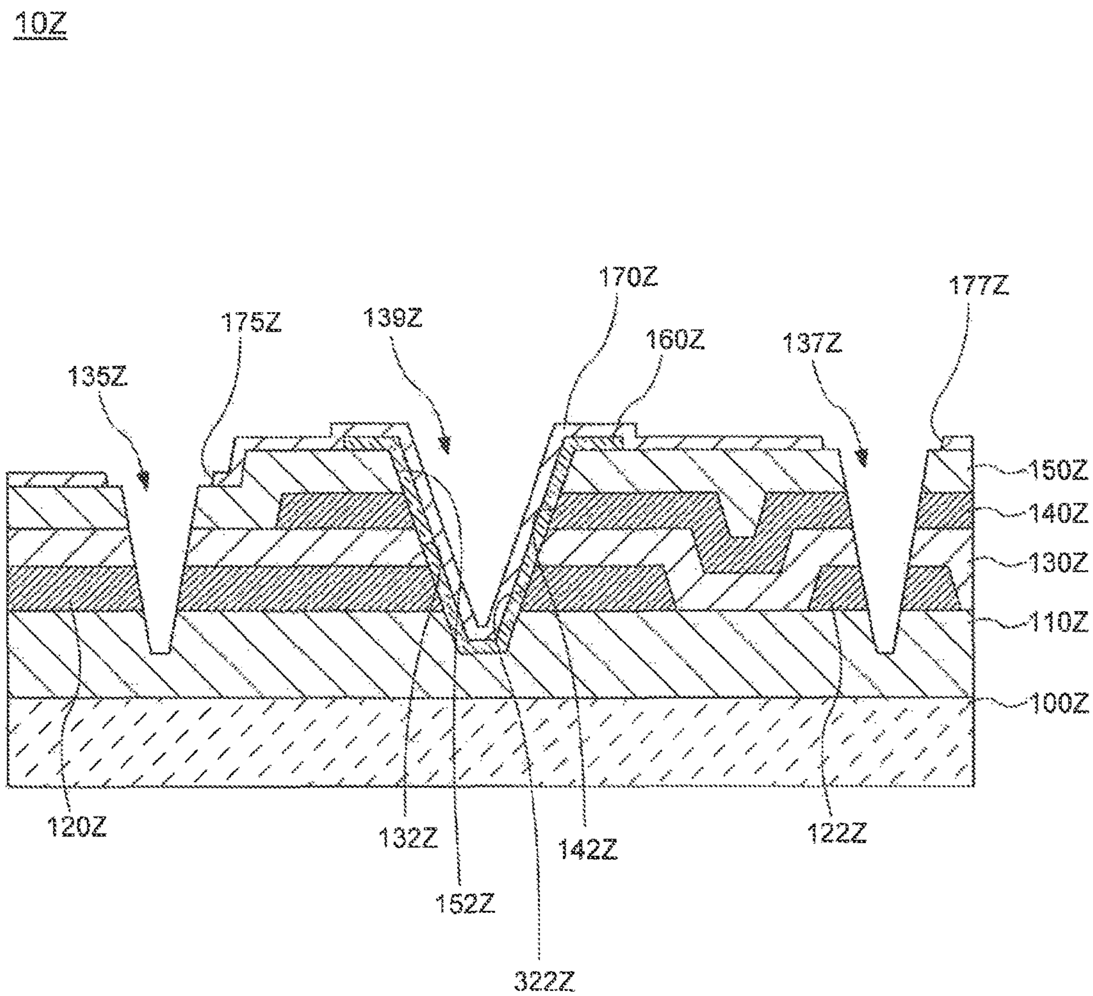
Figure 247:
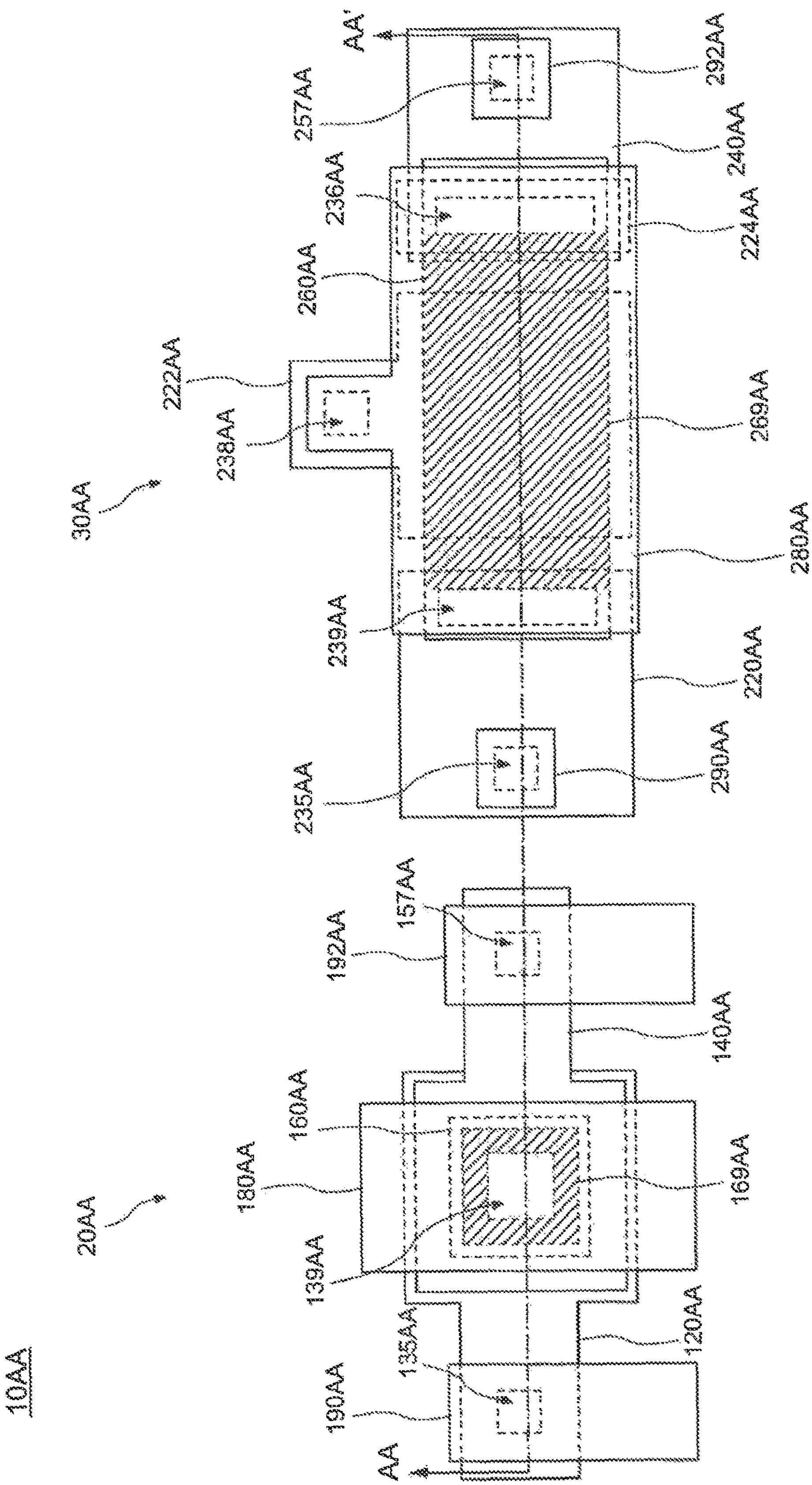
Figure 248:
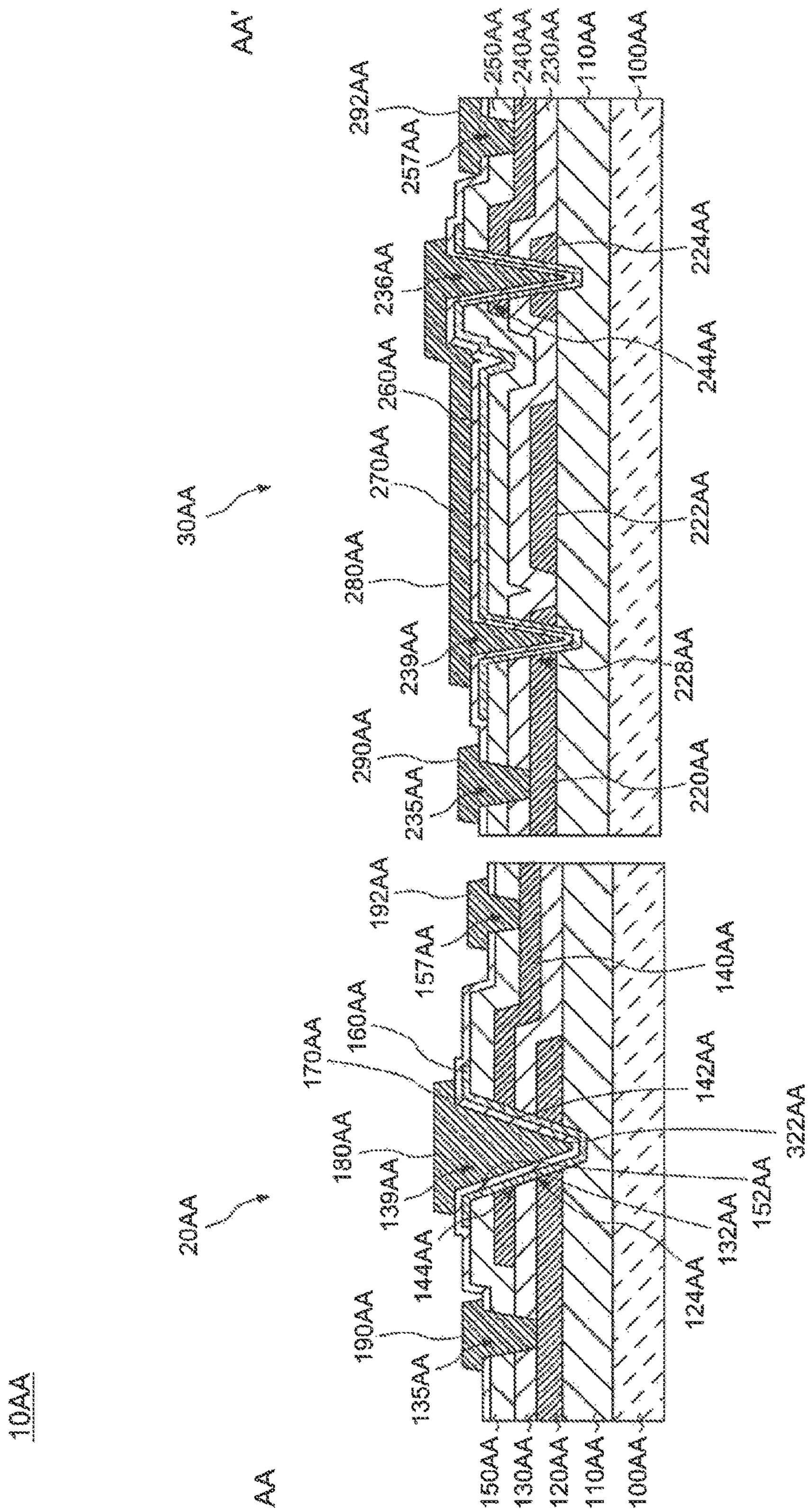
Figure 249:
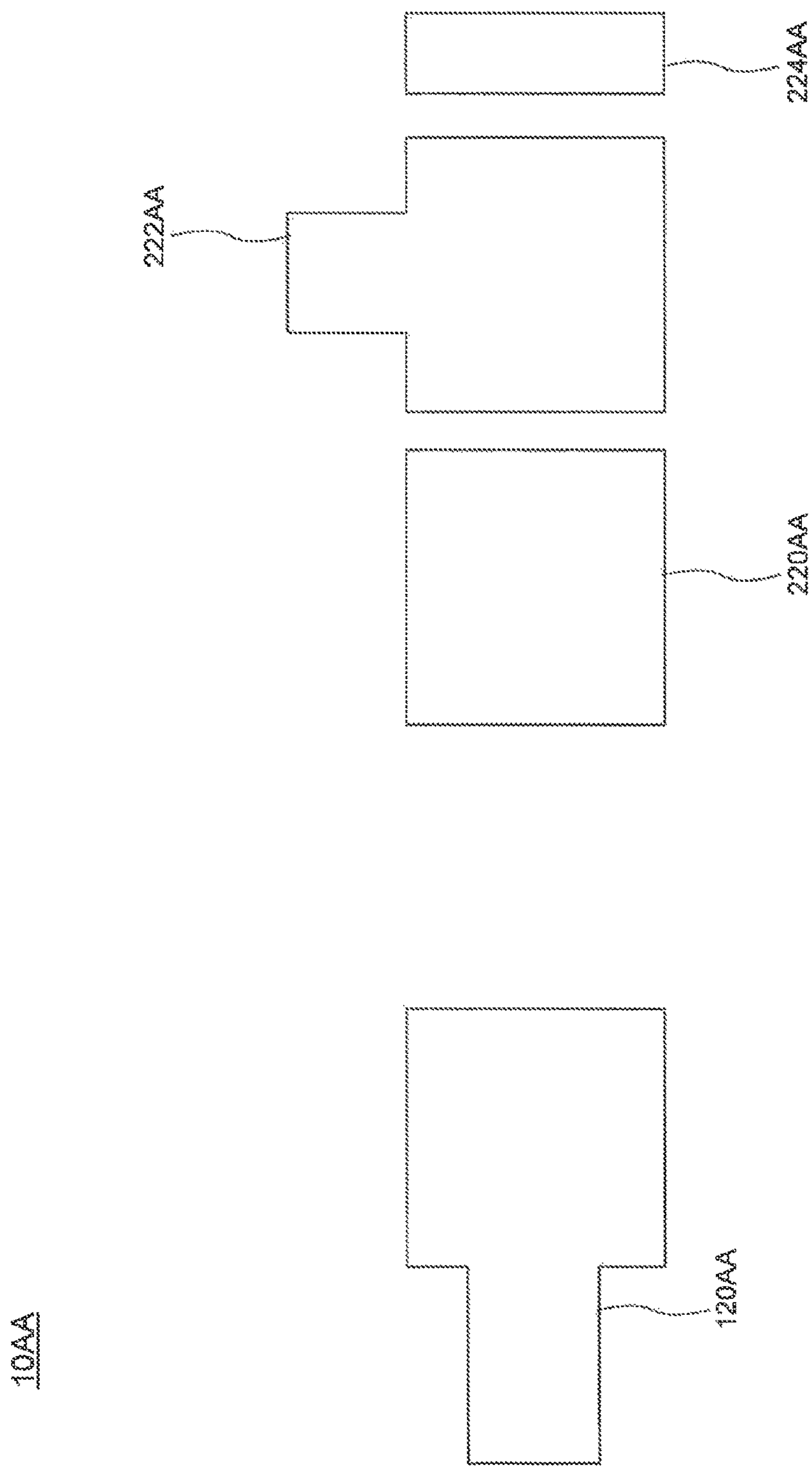
Figure 250:
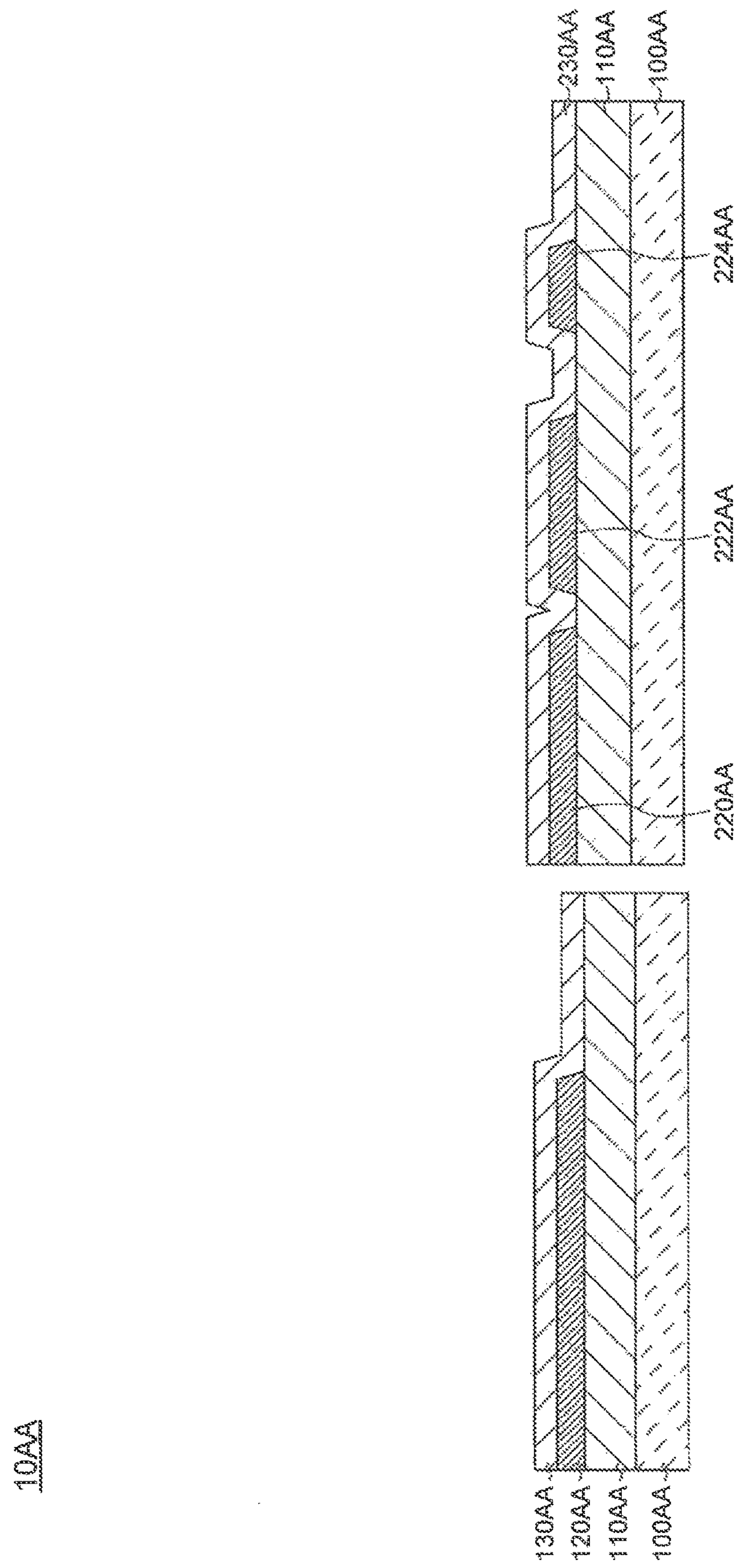
Figure 251:
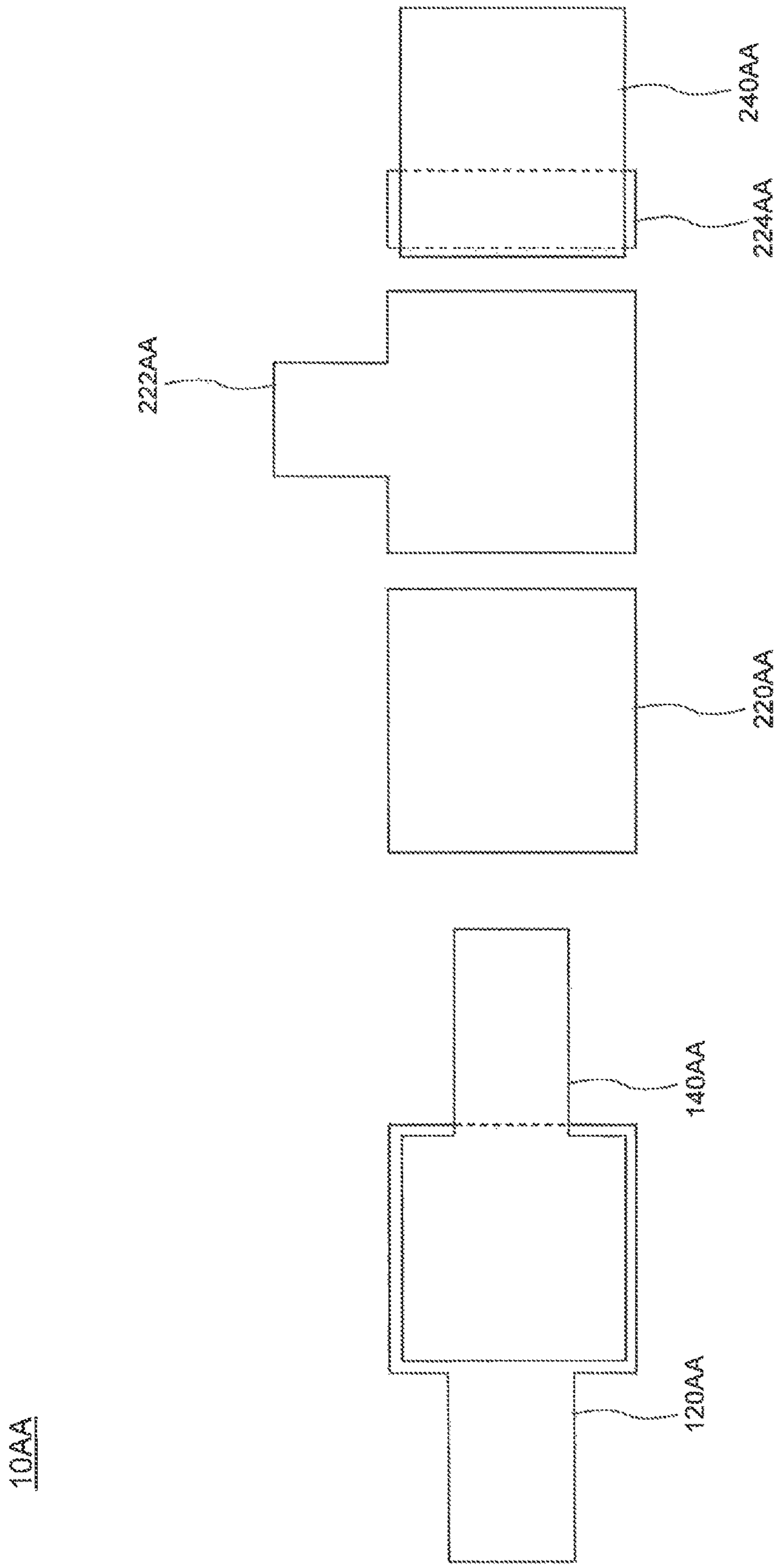
Figure 252:
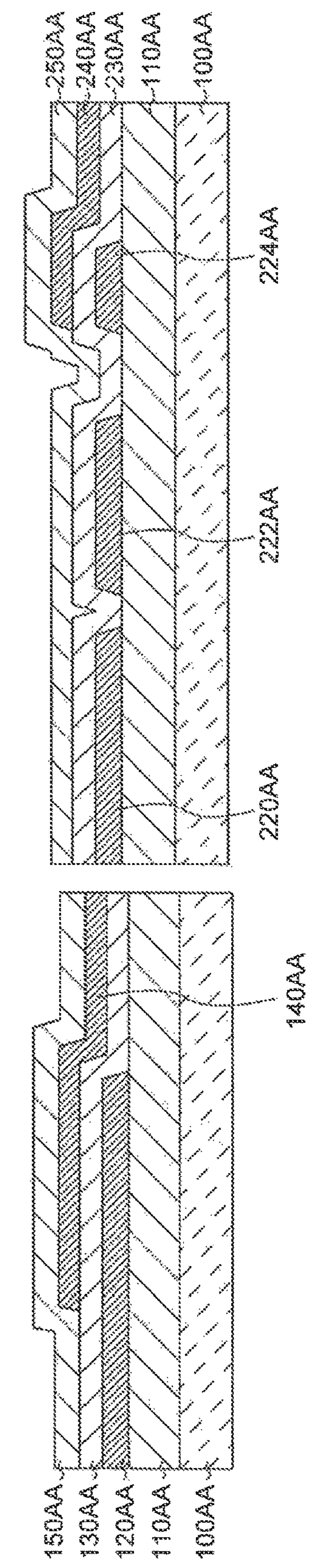
Figure 253:
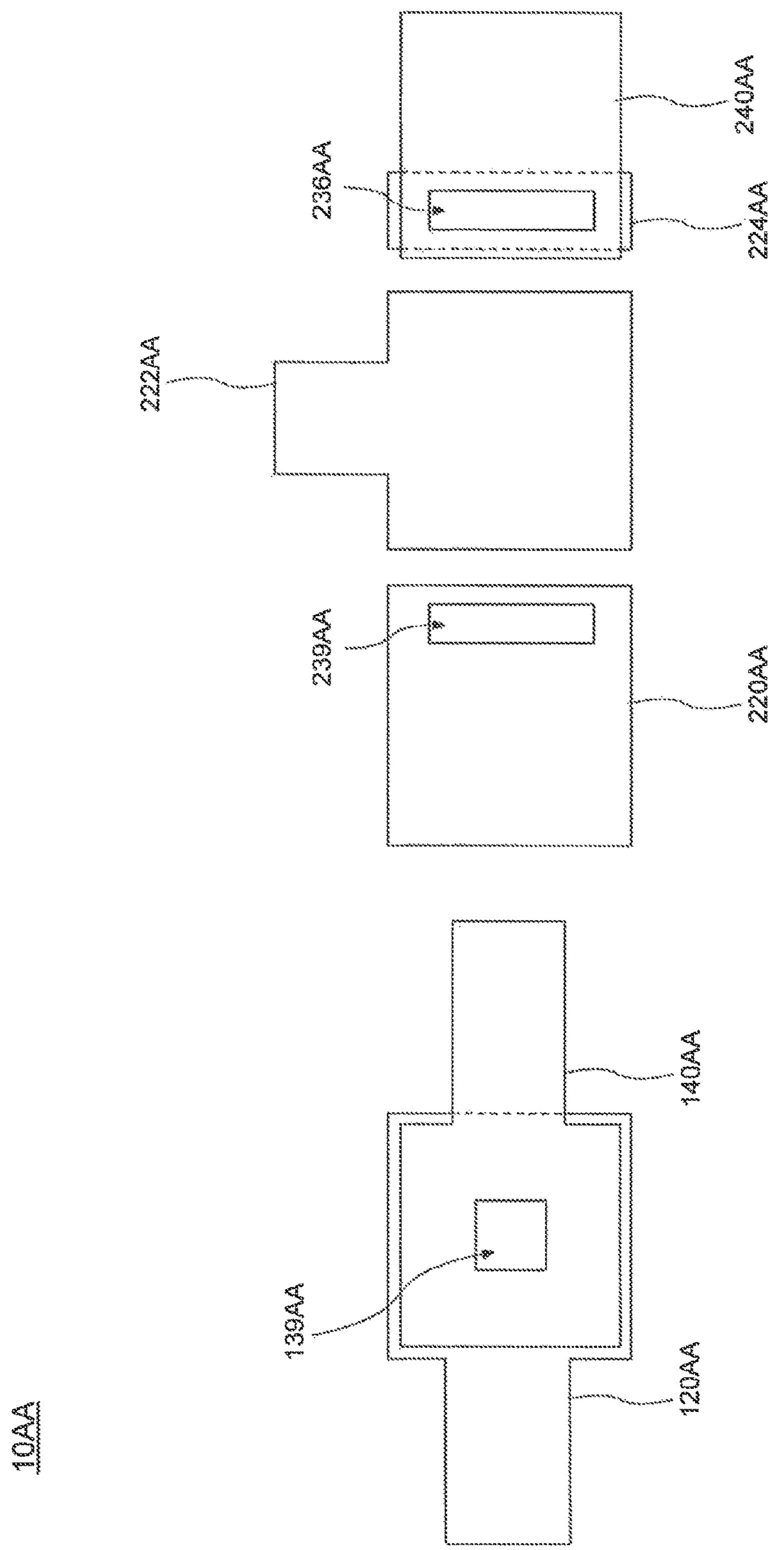
Figure 254:
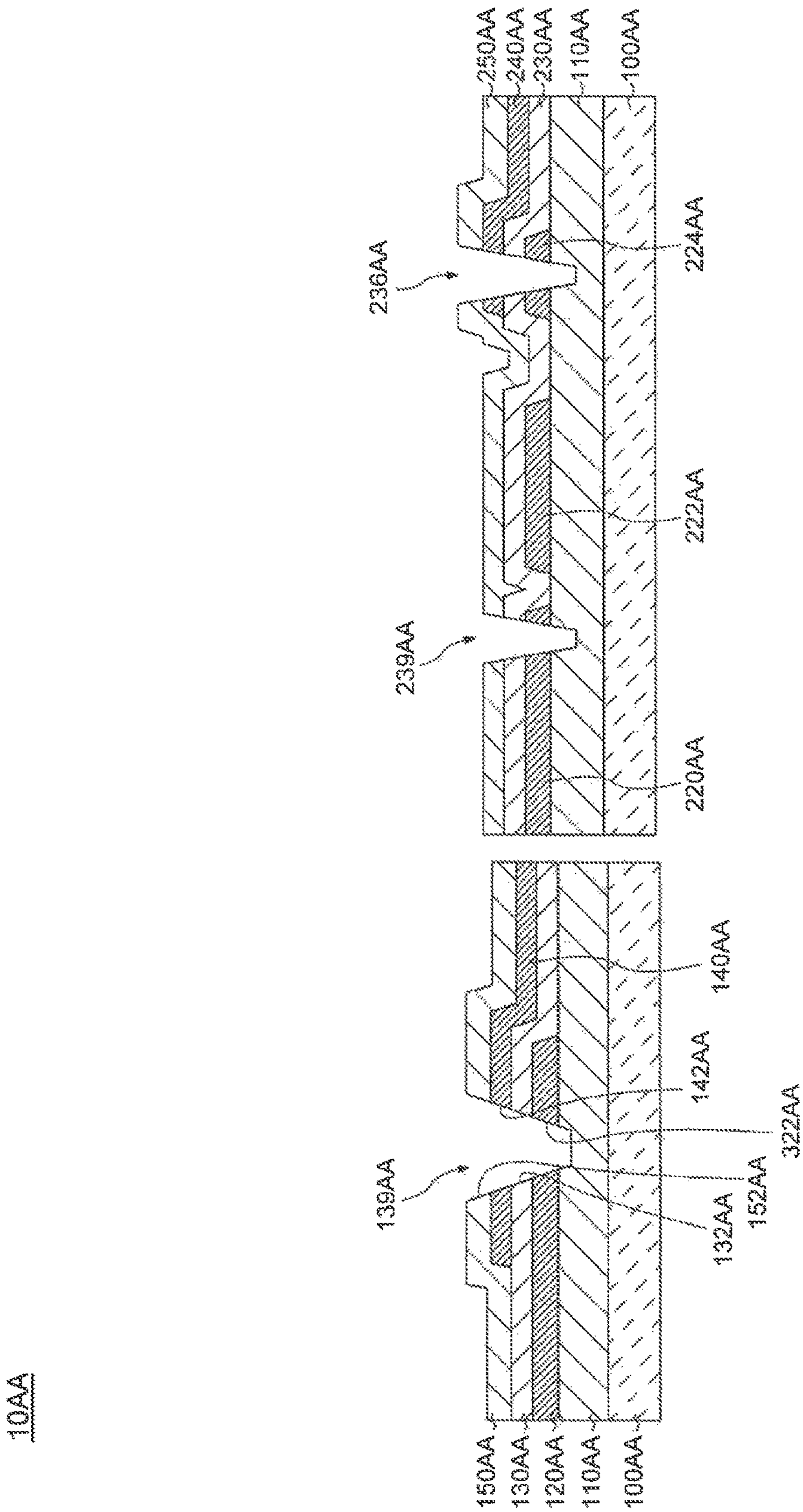
Figure 255:
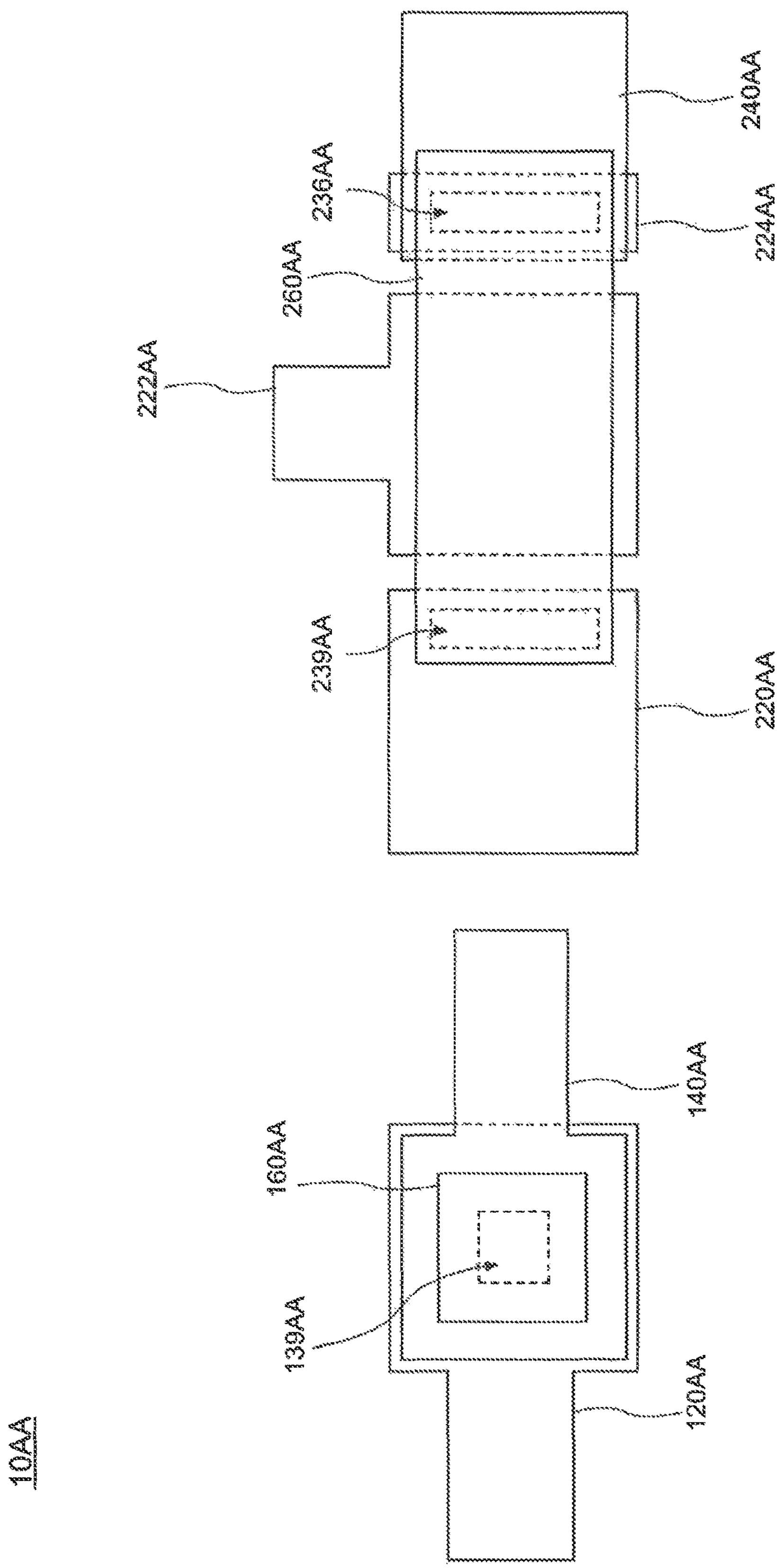
Figure 256:
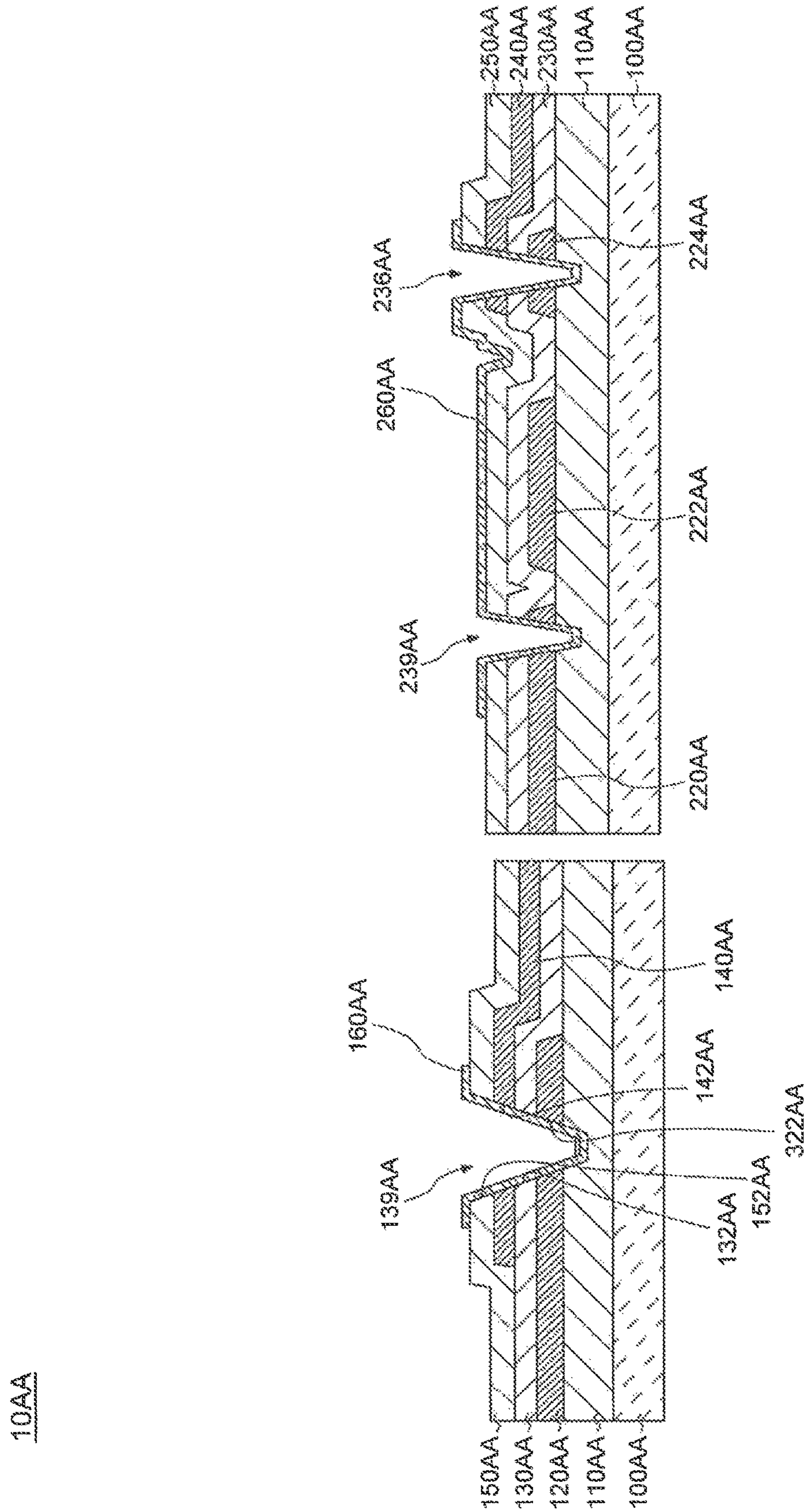
Figure 257:
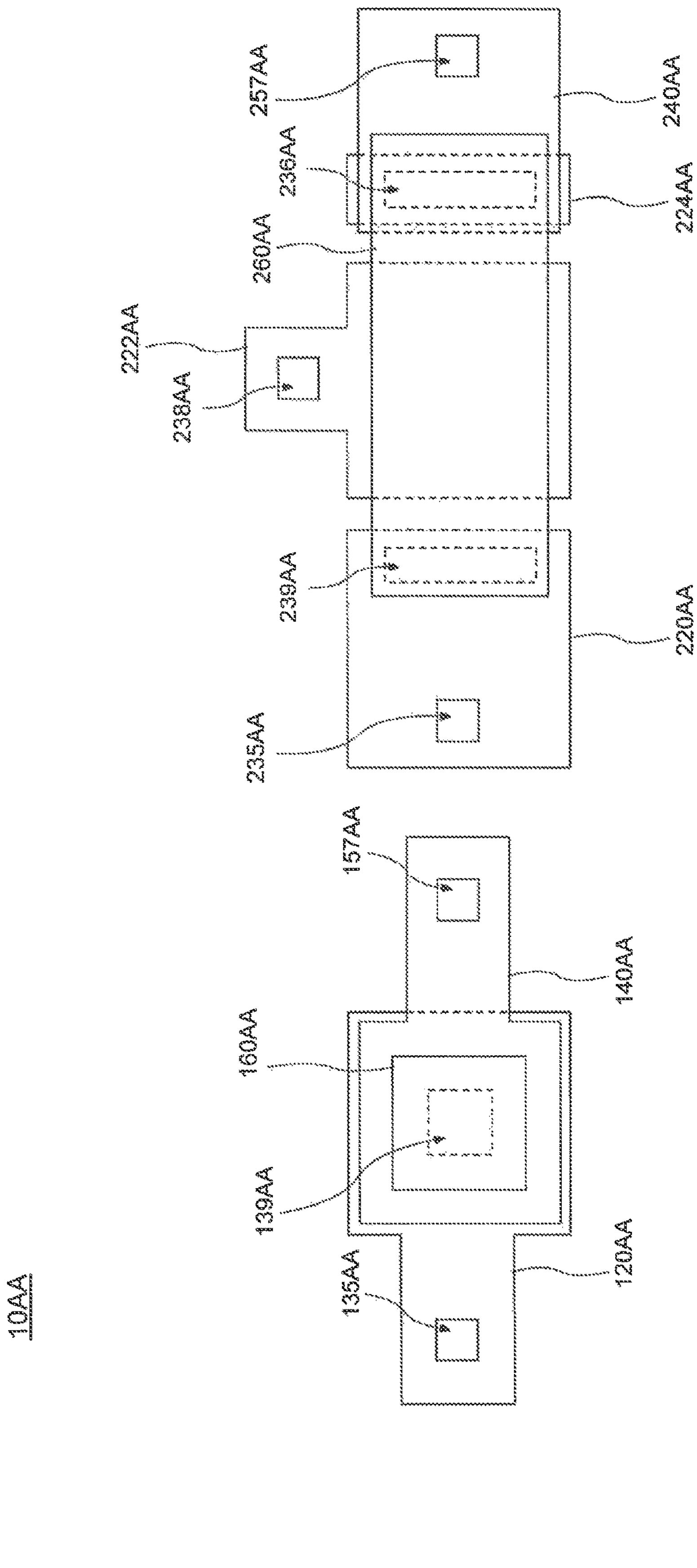
Figure 258:
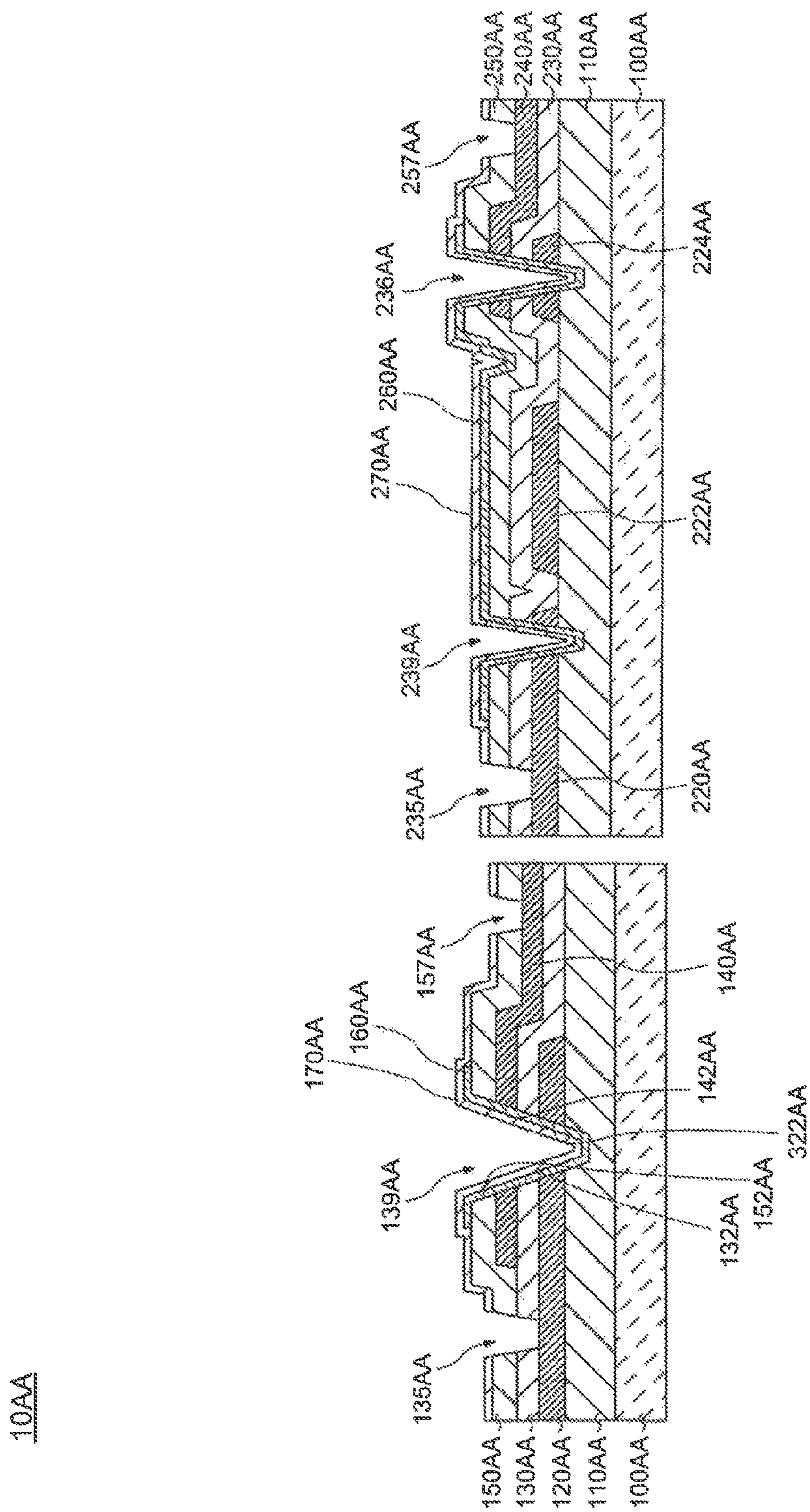
Figure 259:
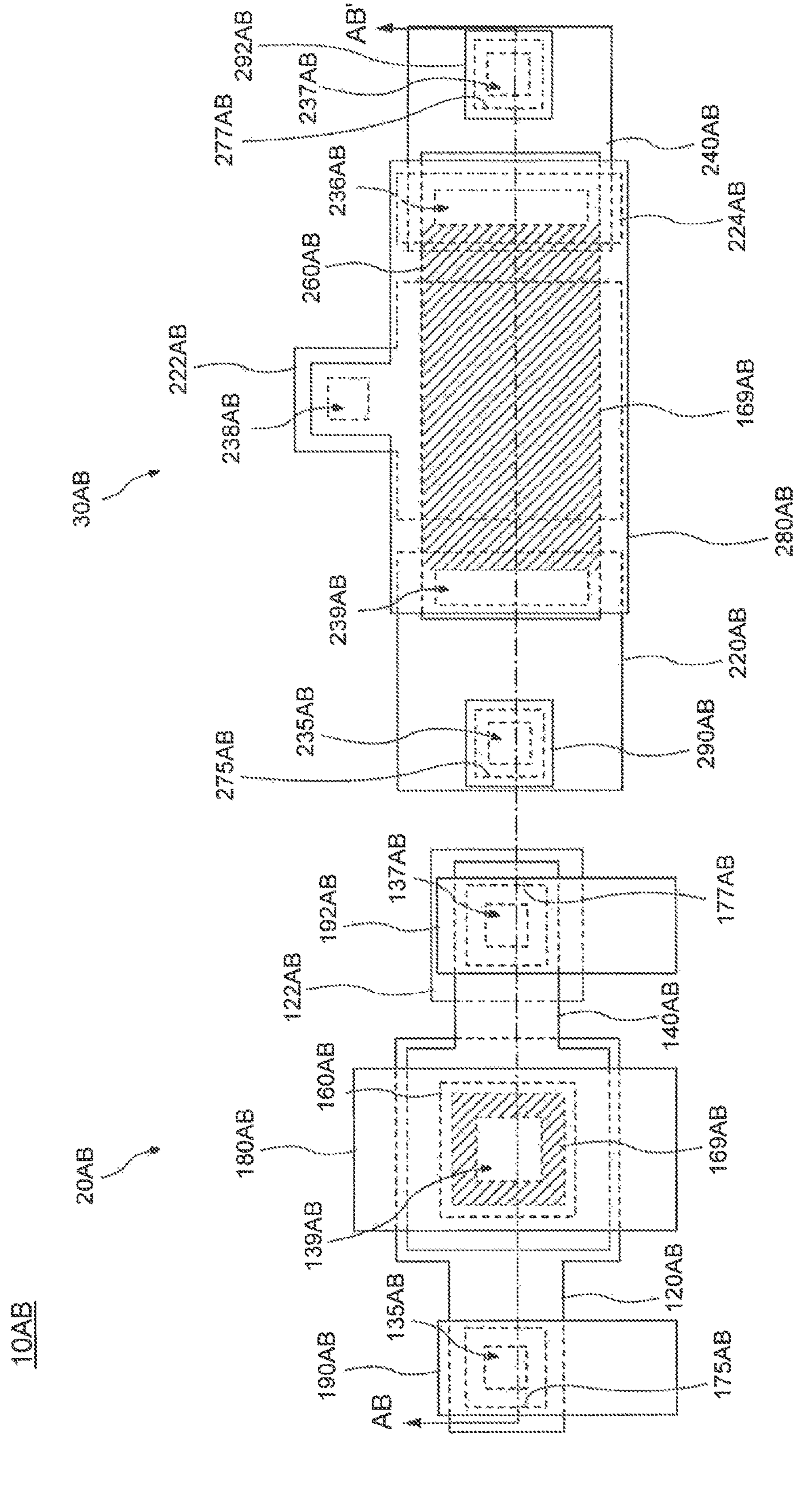
Figure 260:
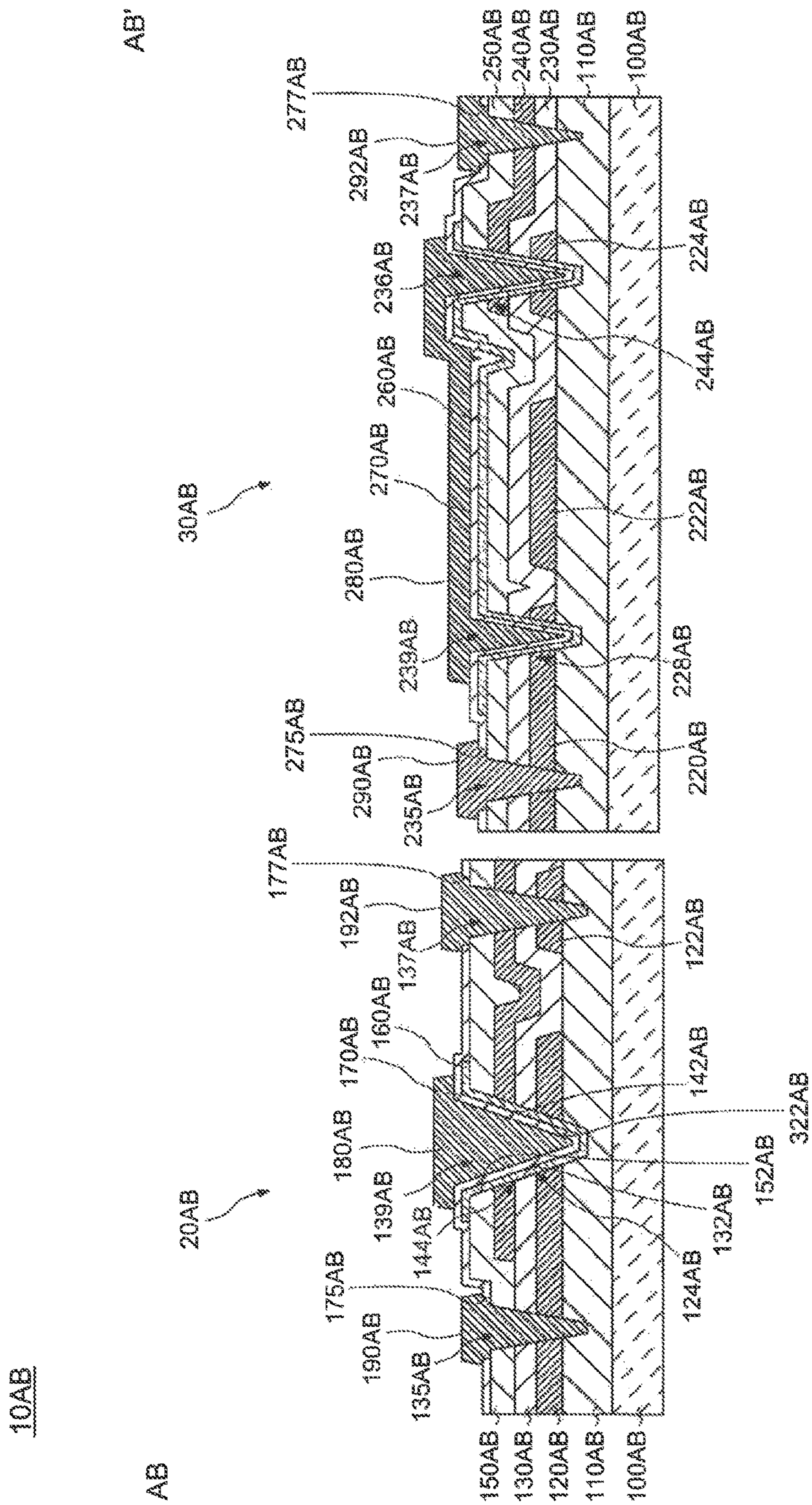
Figure 261:
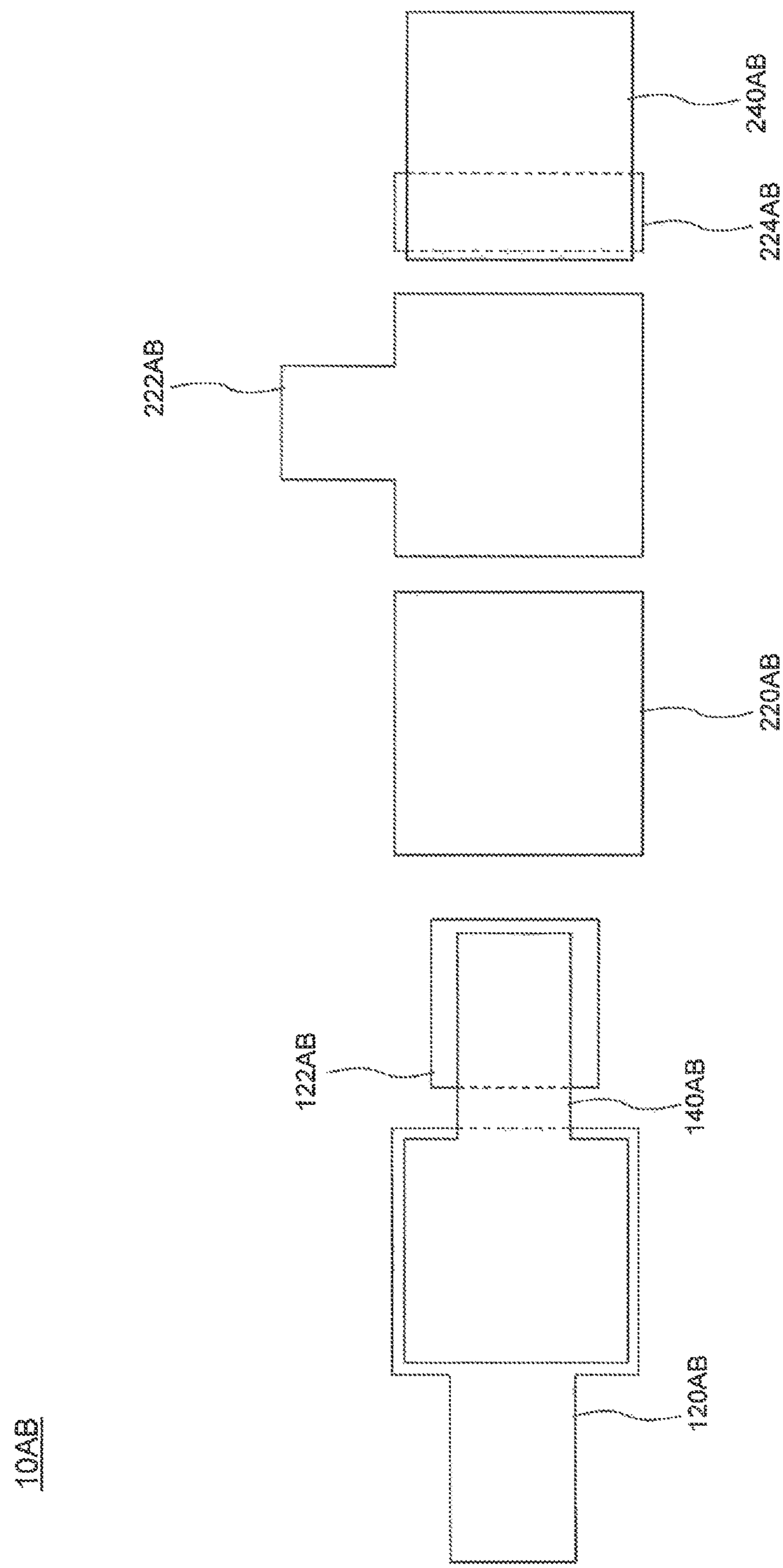
Figure 262:
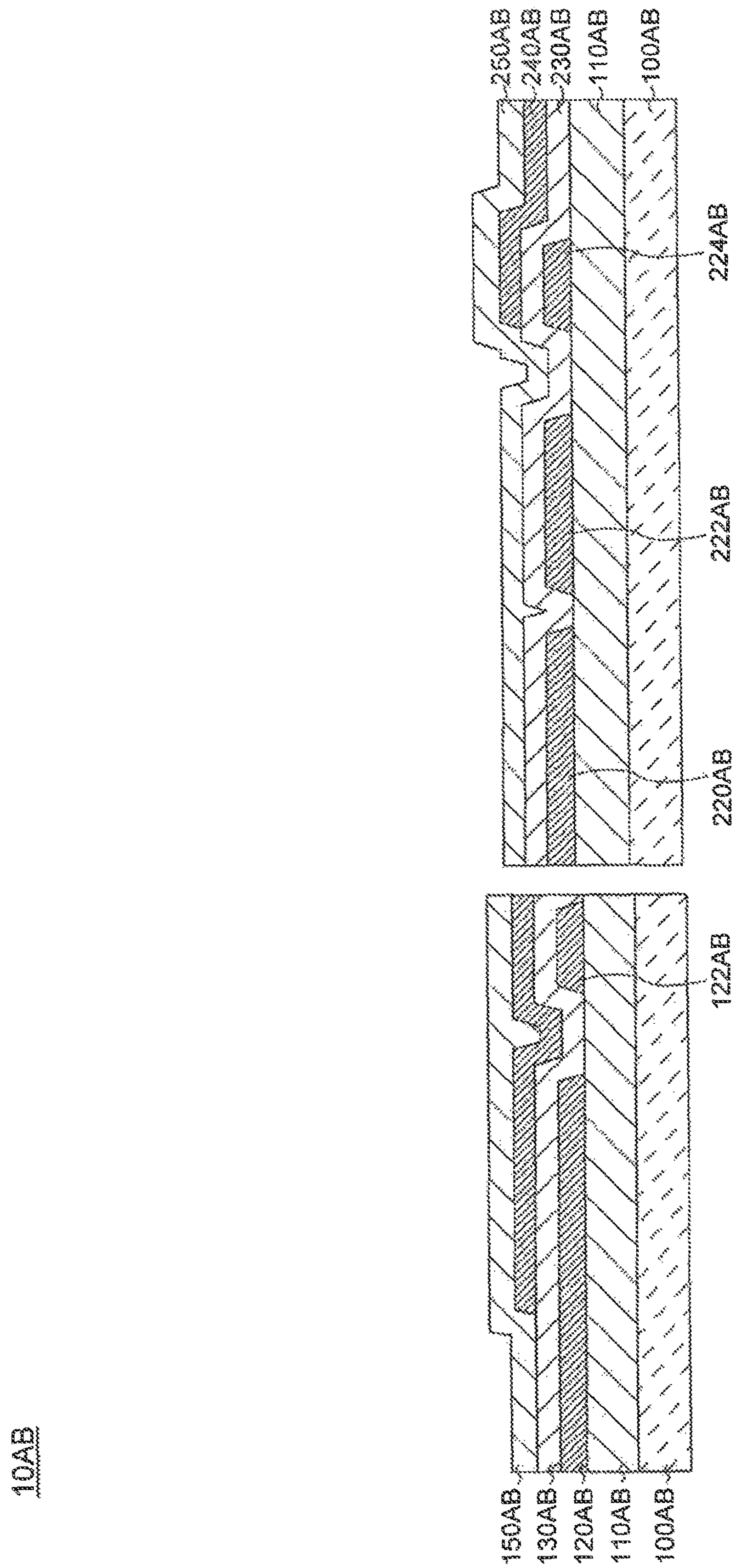
Figure 263:
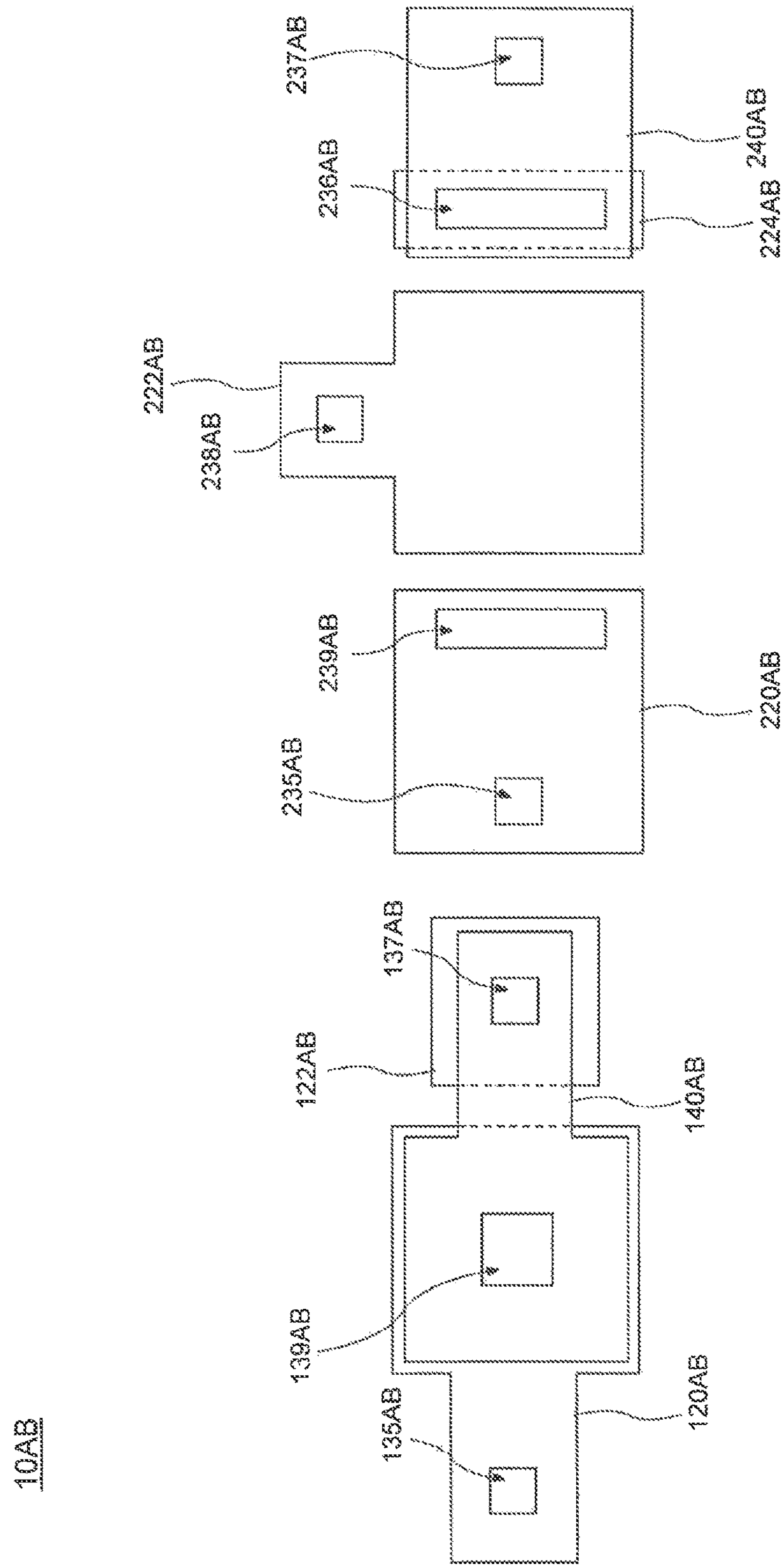
Figure 264:
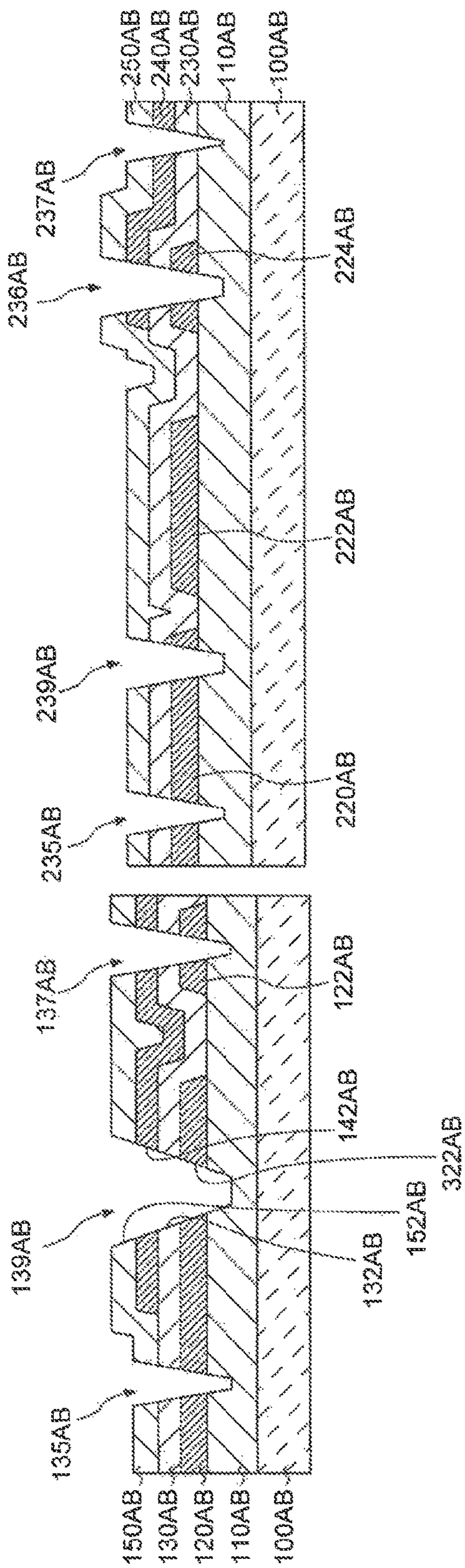
Figure 265:
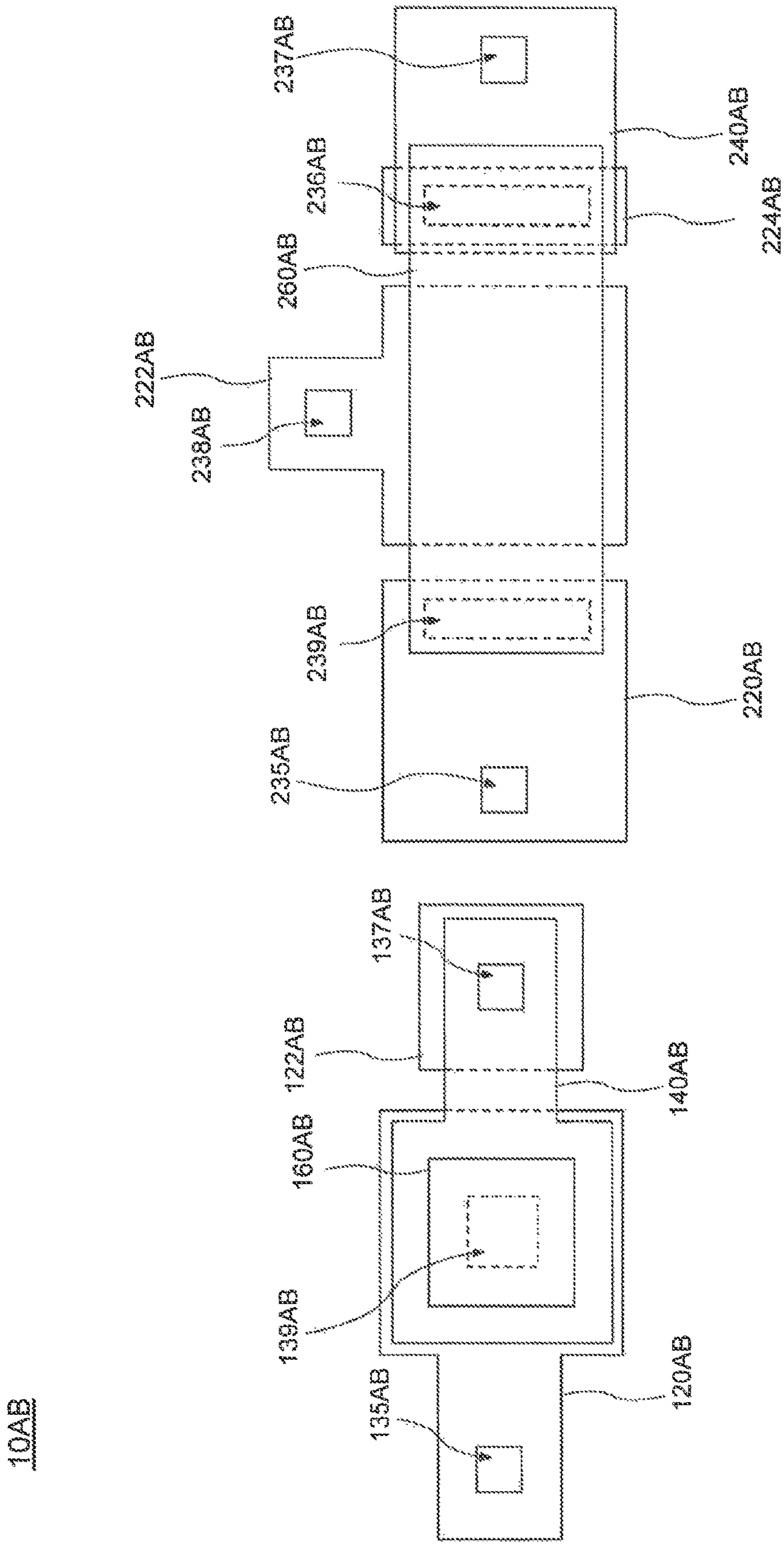
Figure 266:
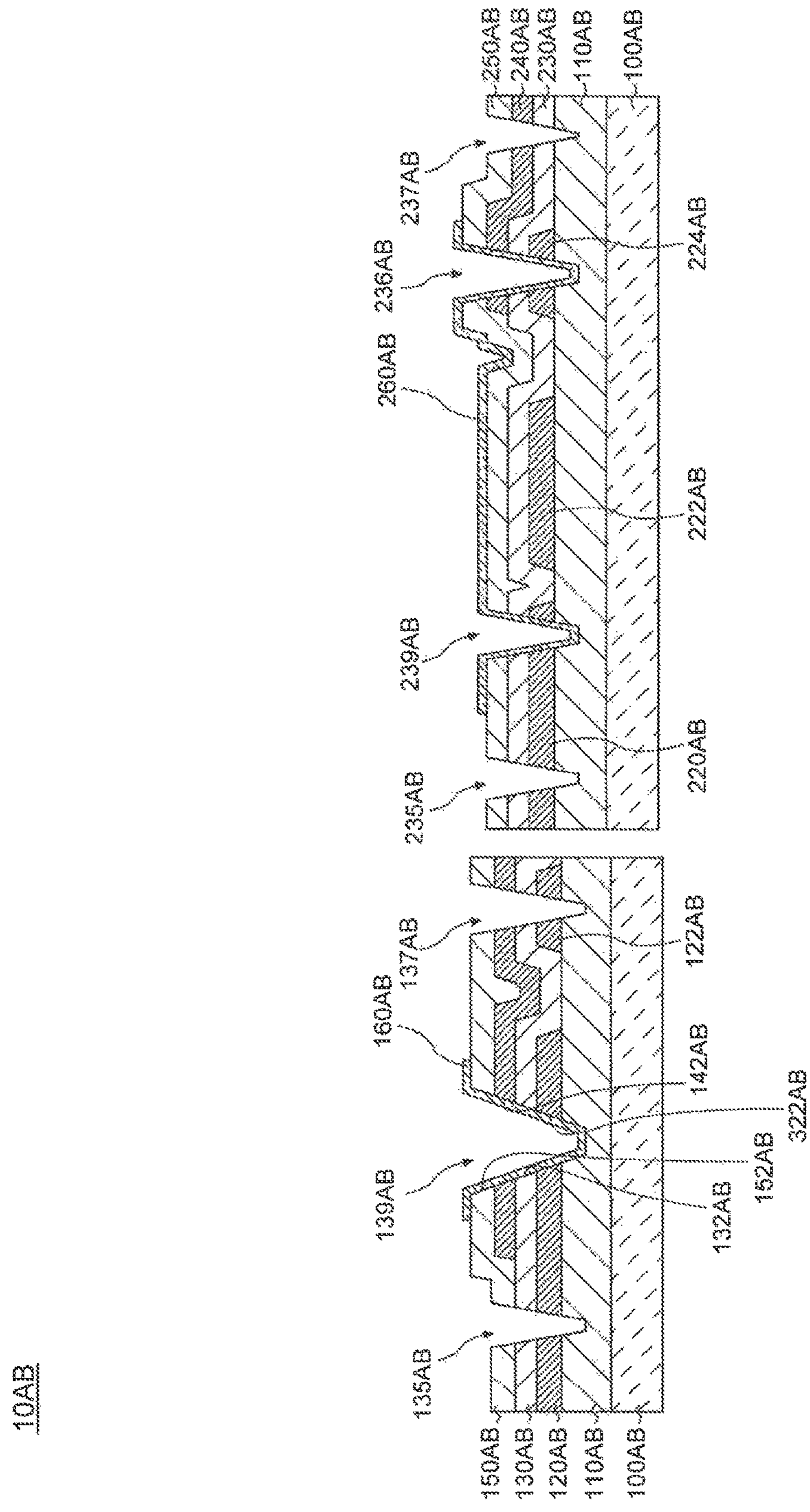
Figure 267:
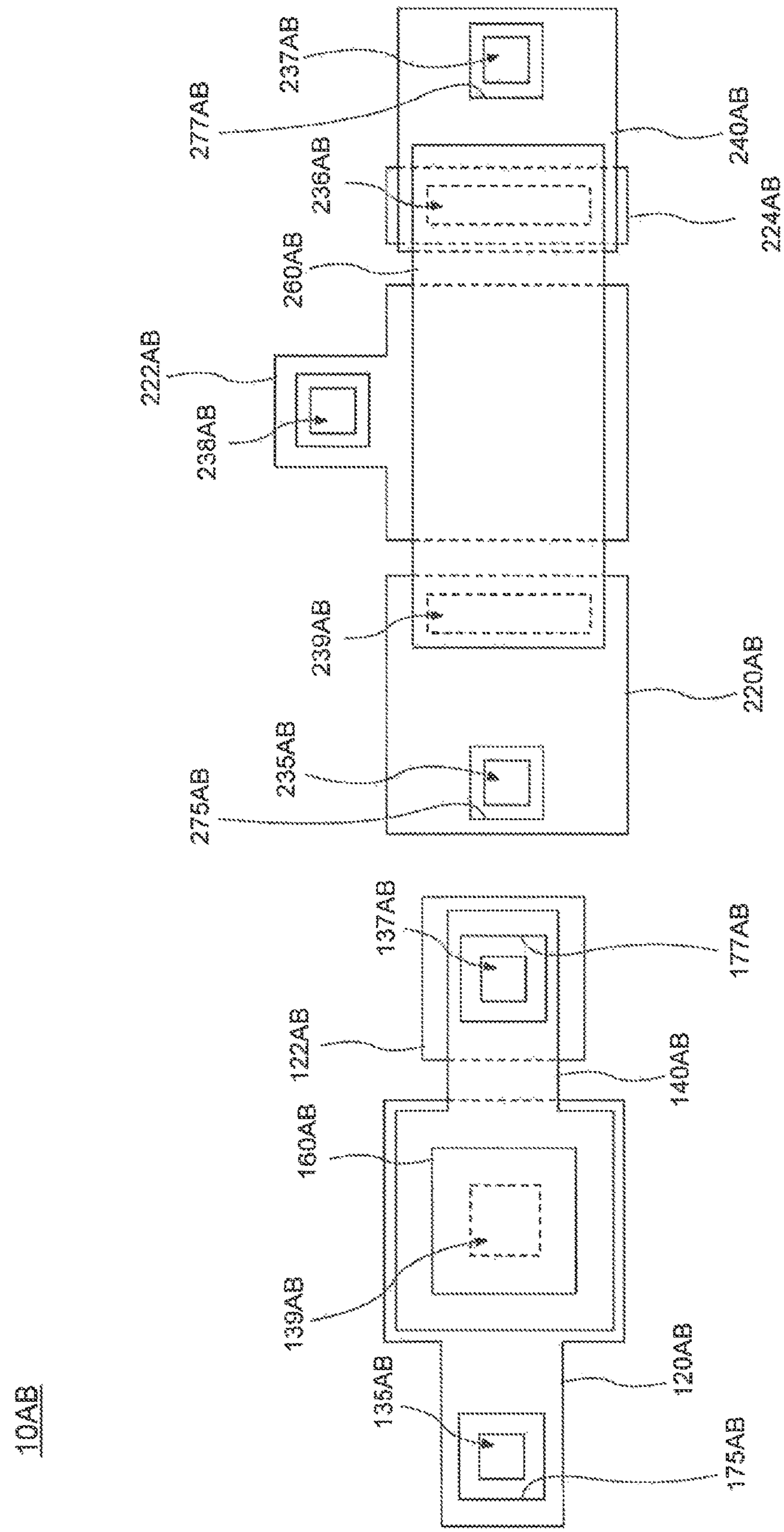
Figure 268:
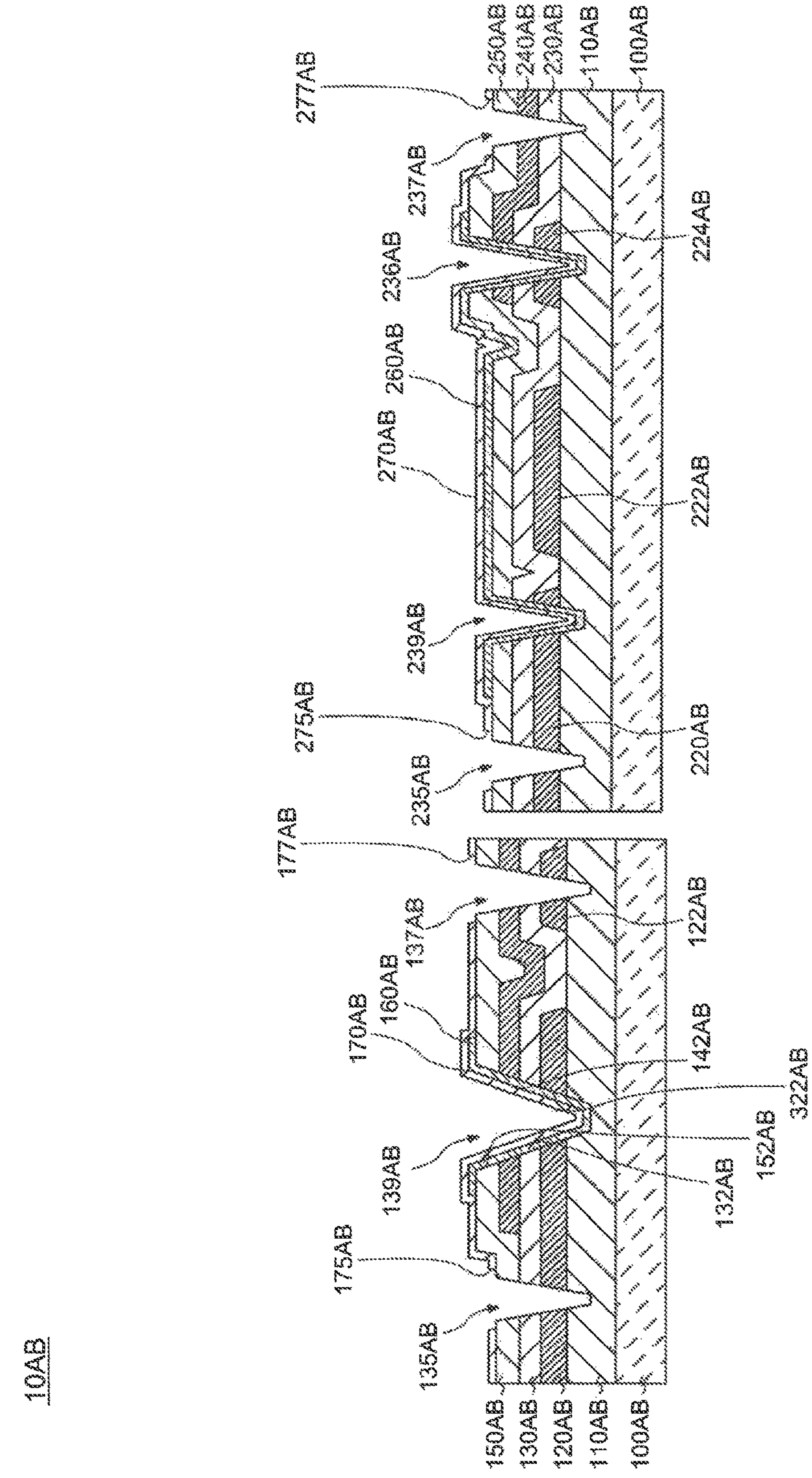
Figure 269:
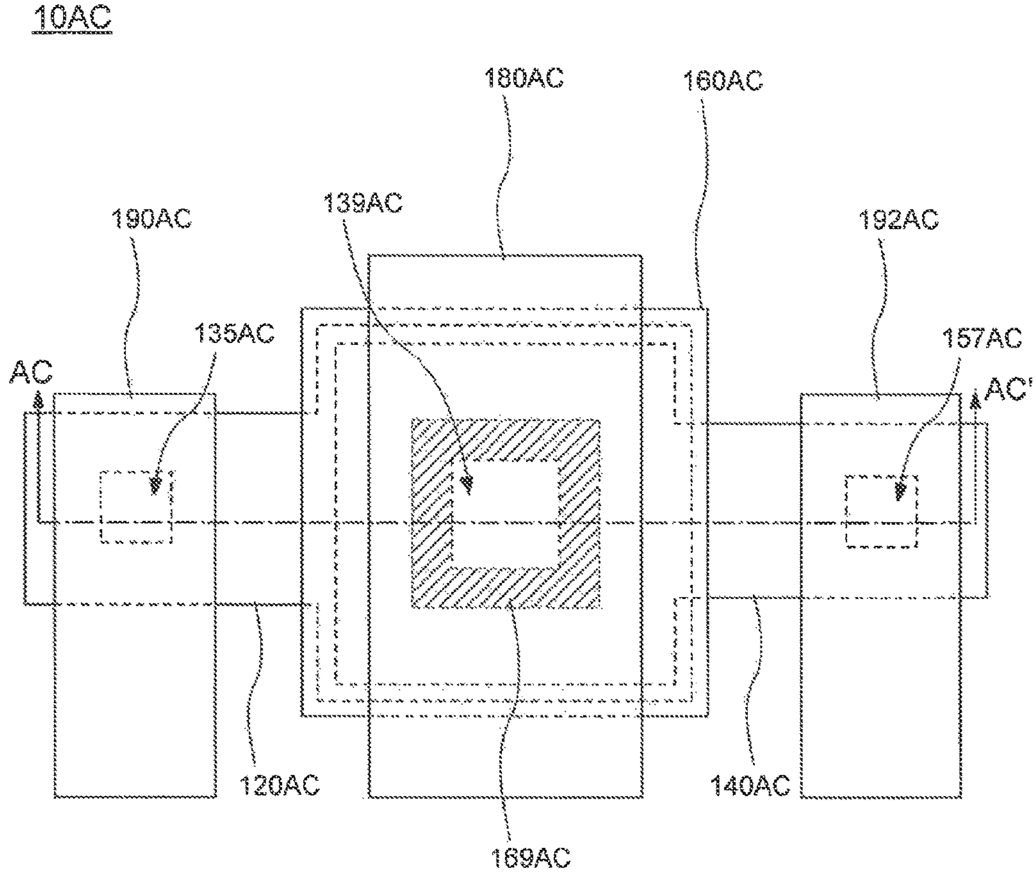
Figure 270:
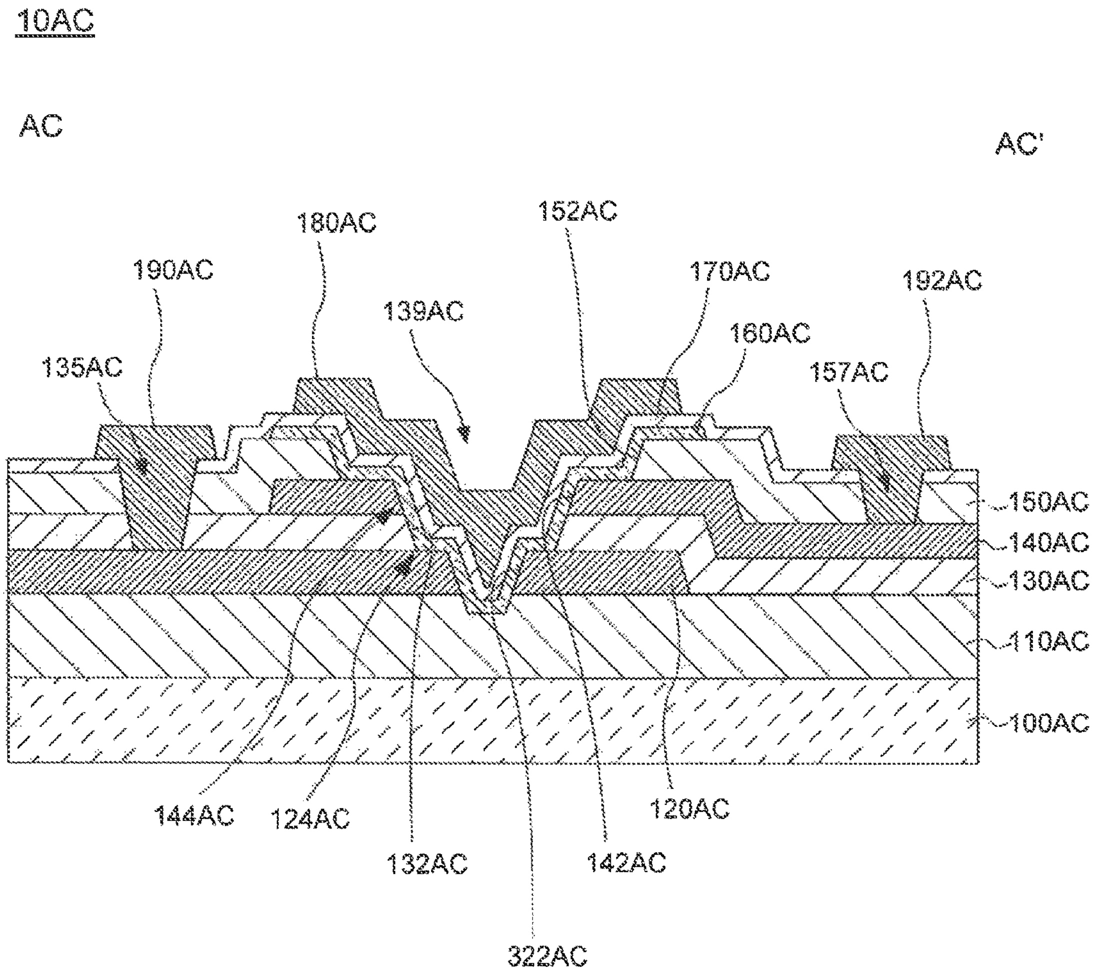
Figure 271:
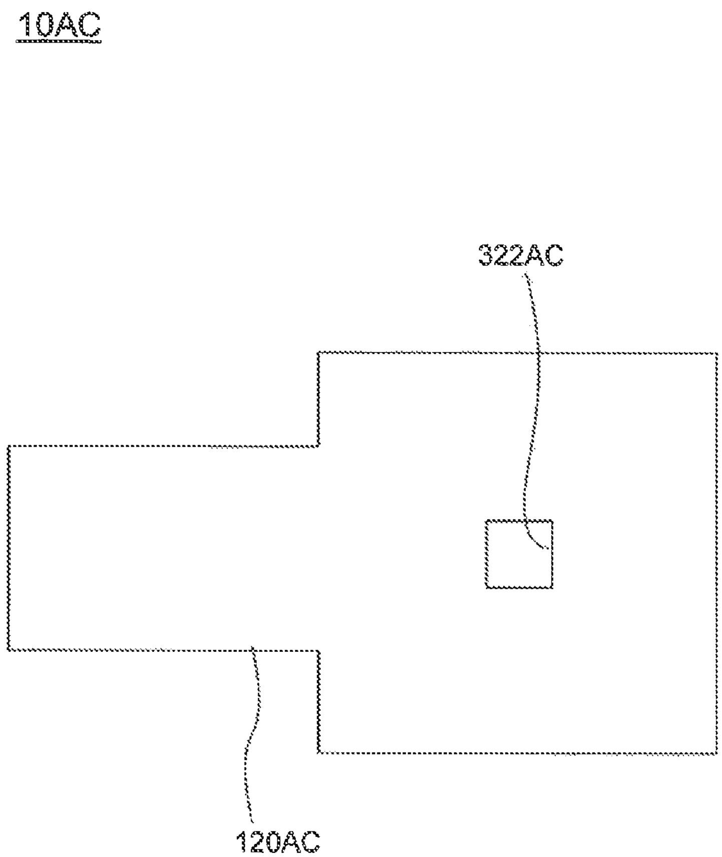
Figure 272:
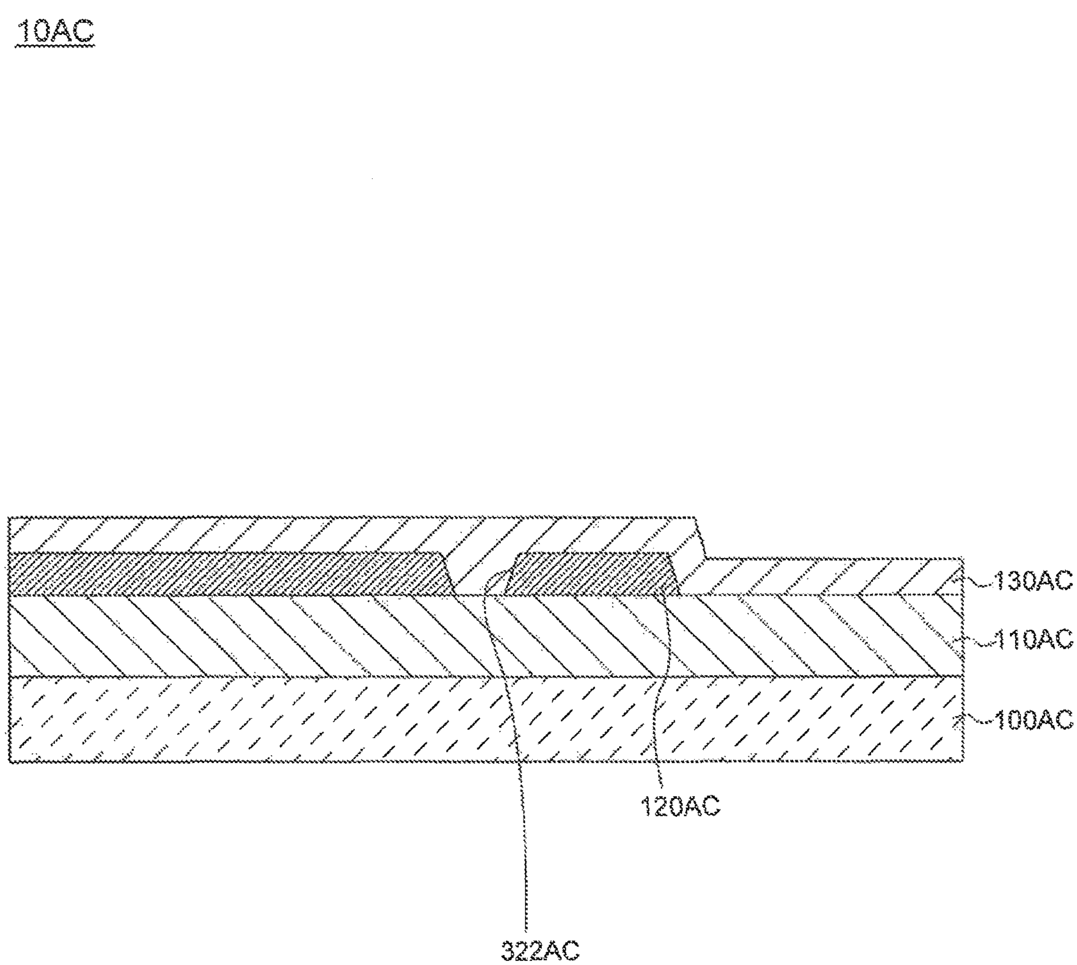
Figure 273:
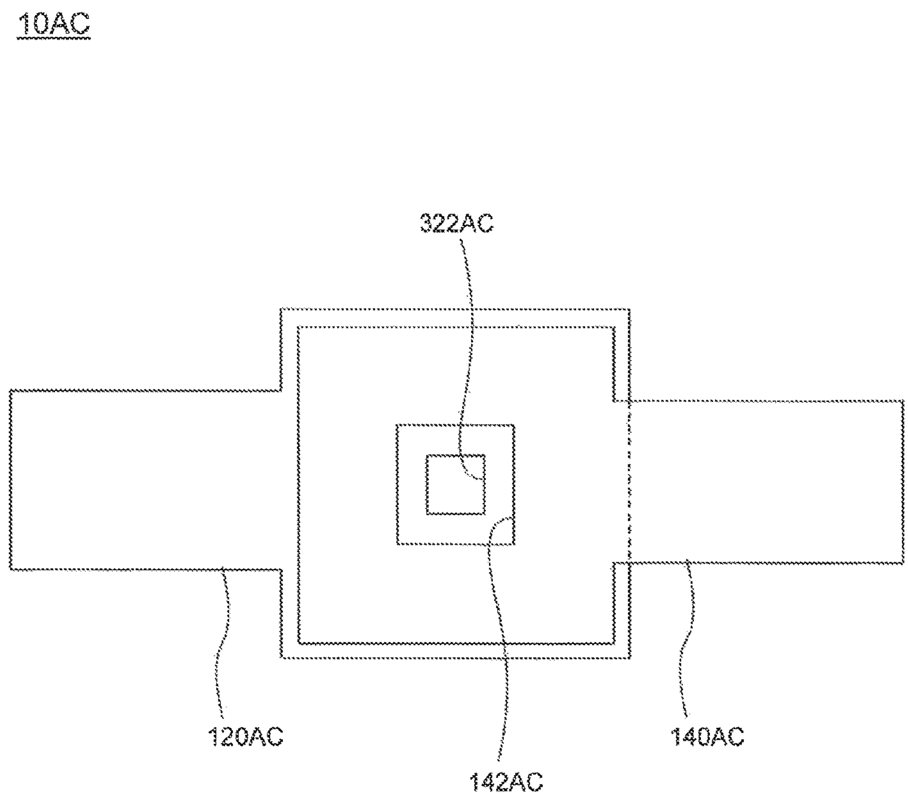
Figure 274:
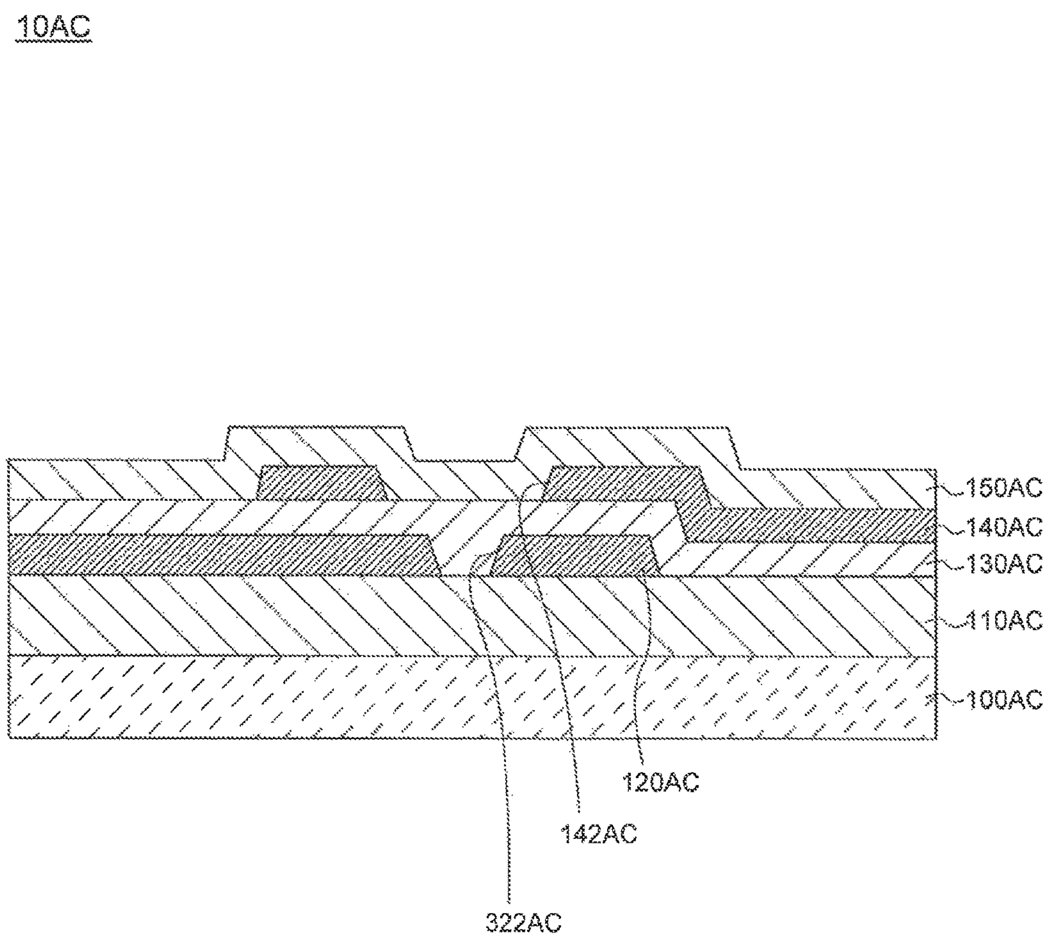
Figure 275:
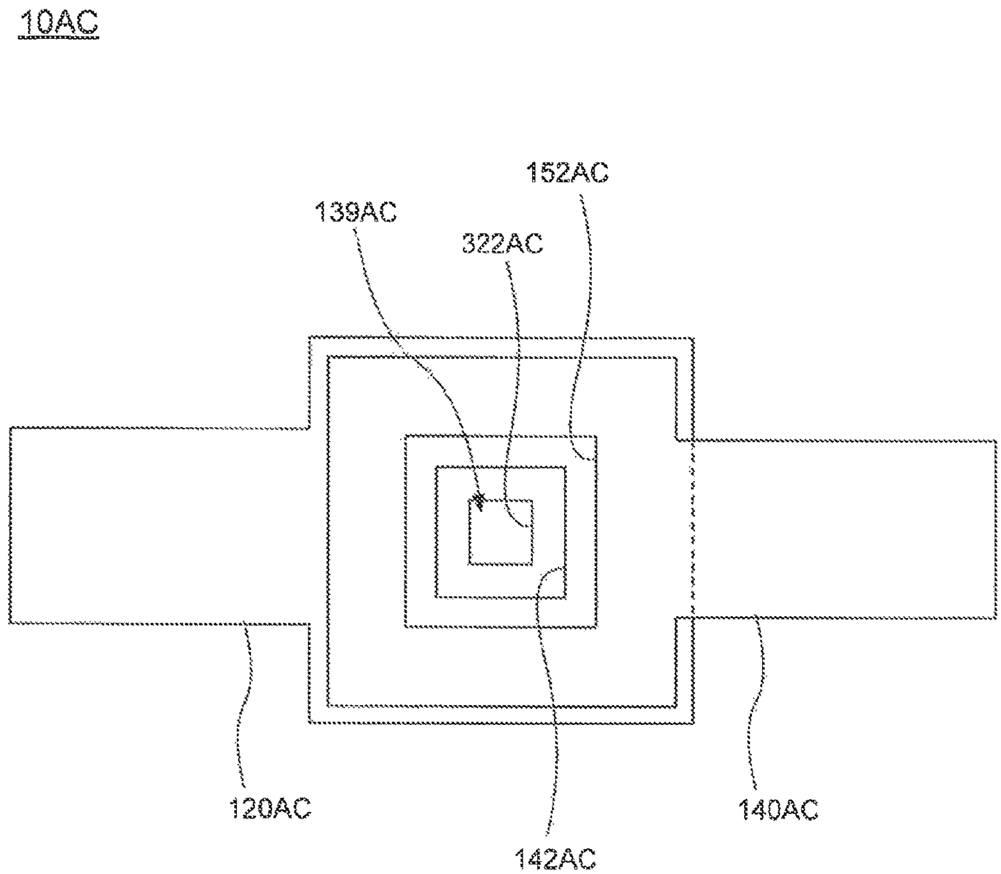
Figure 276:
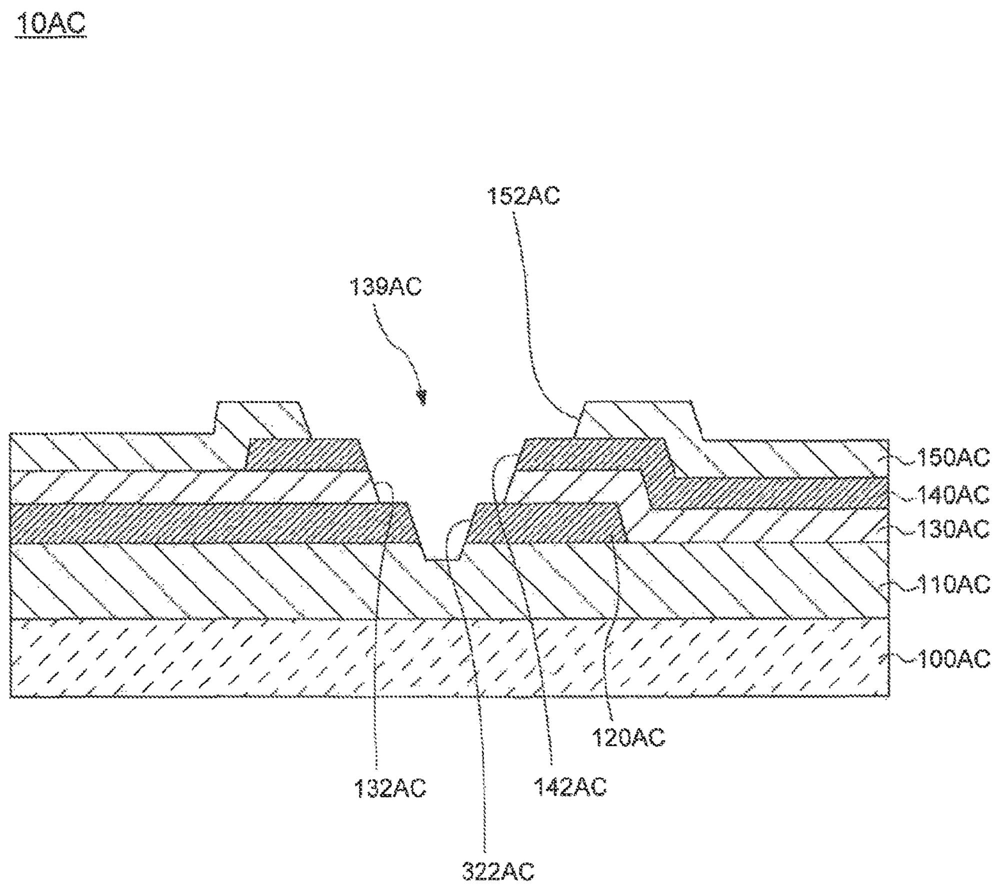
Figure 277:
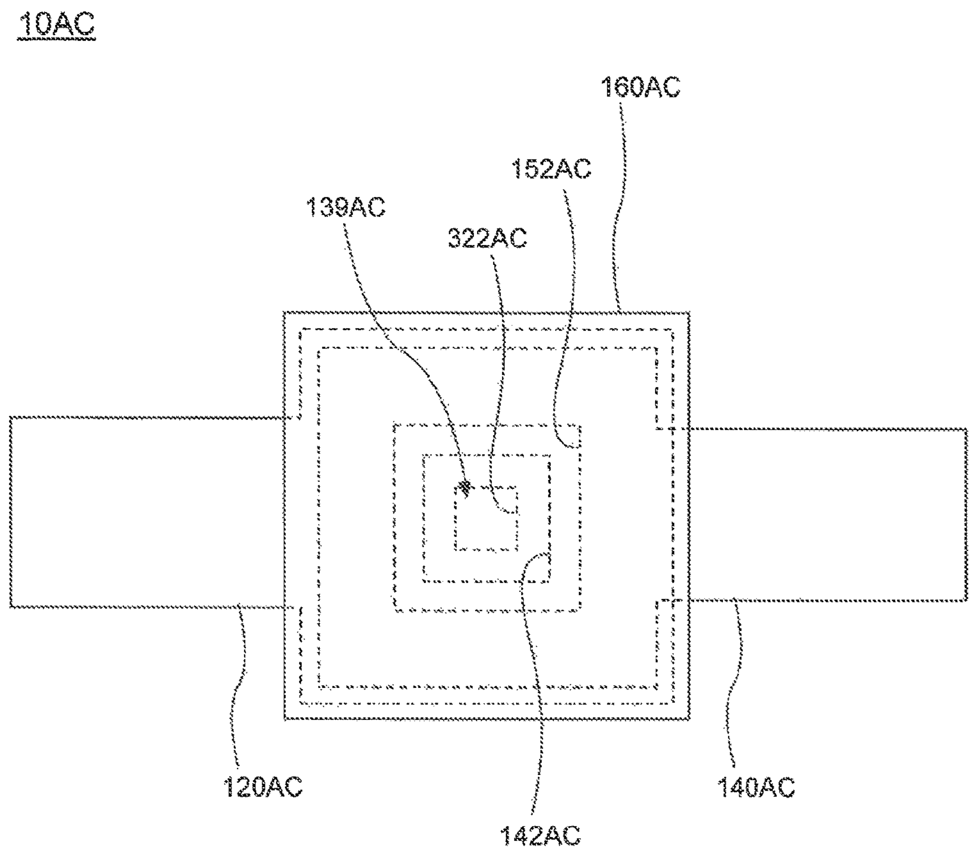
Figure 278:
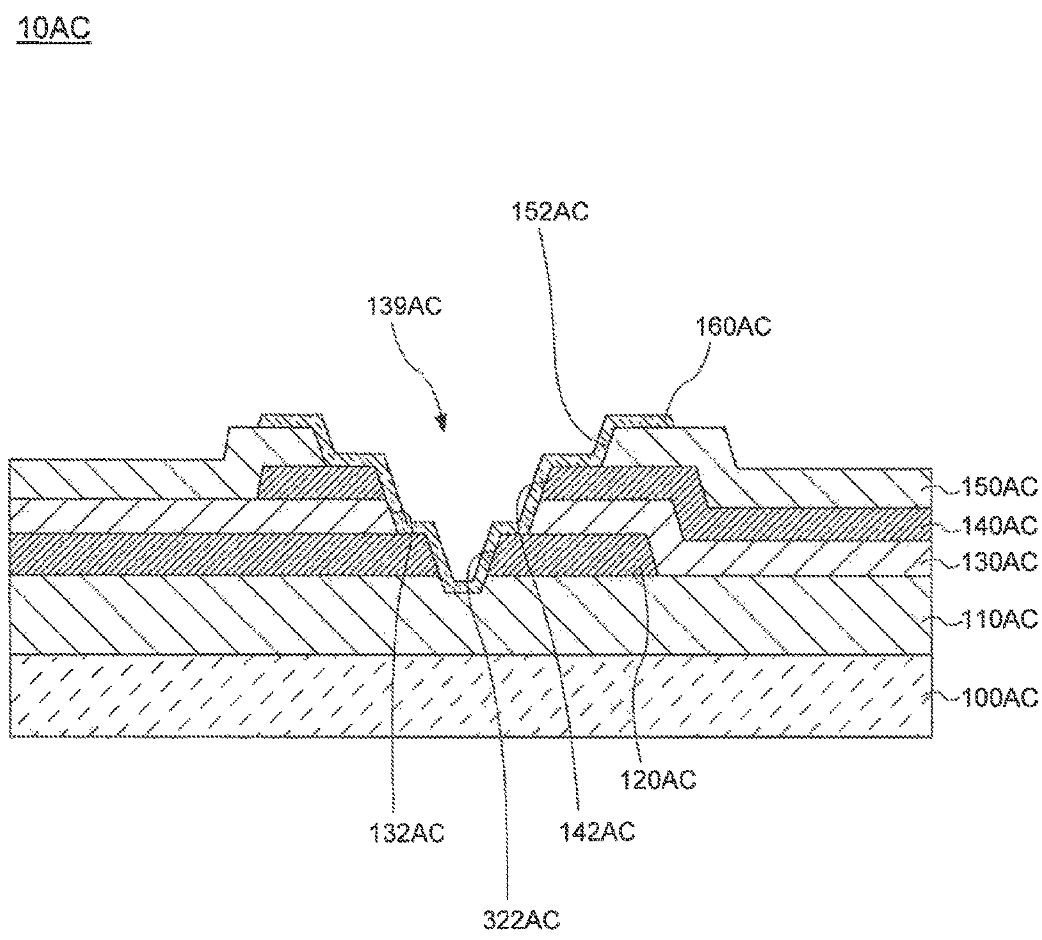
Figure 279:
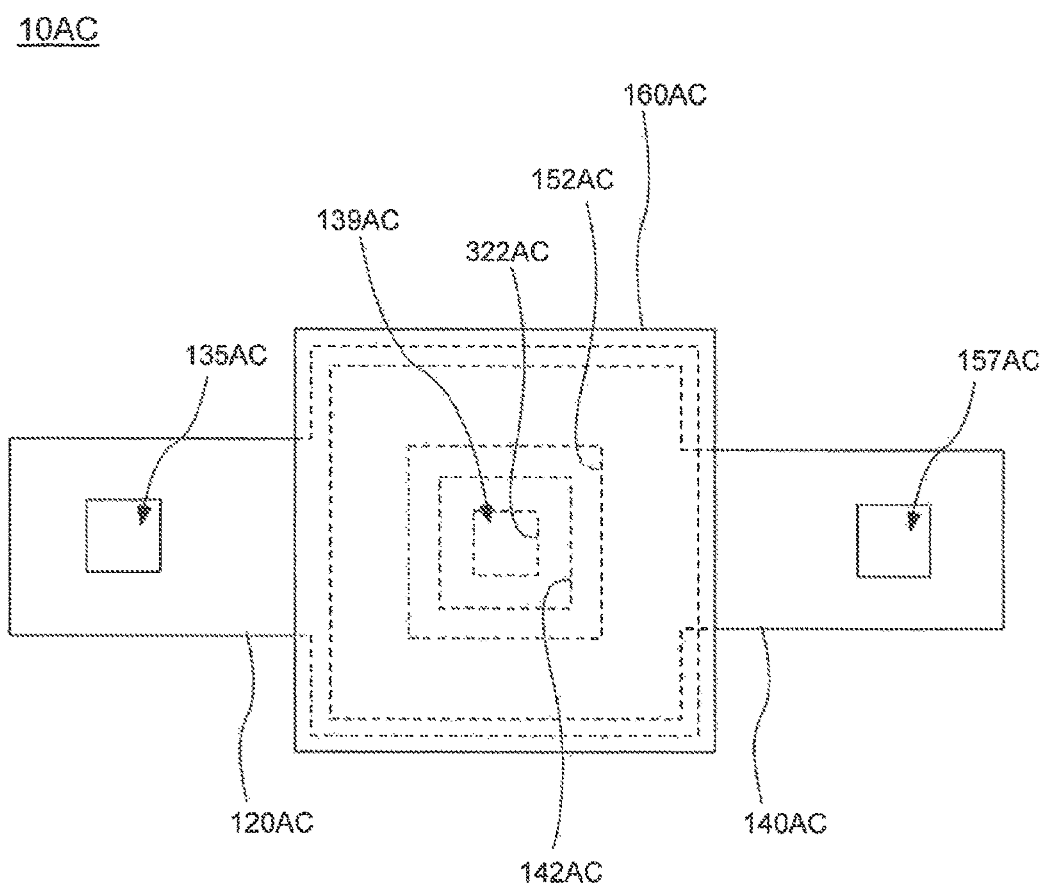
Figure 280:
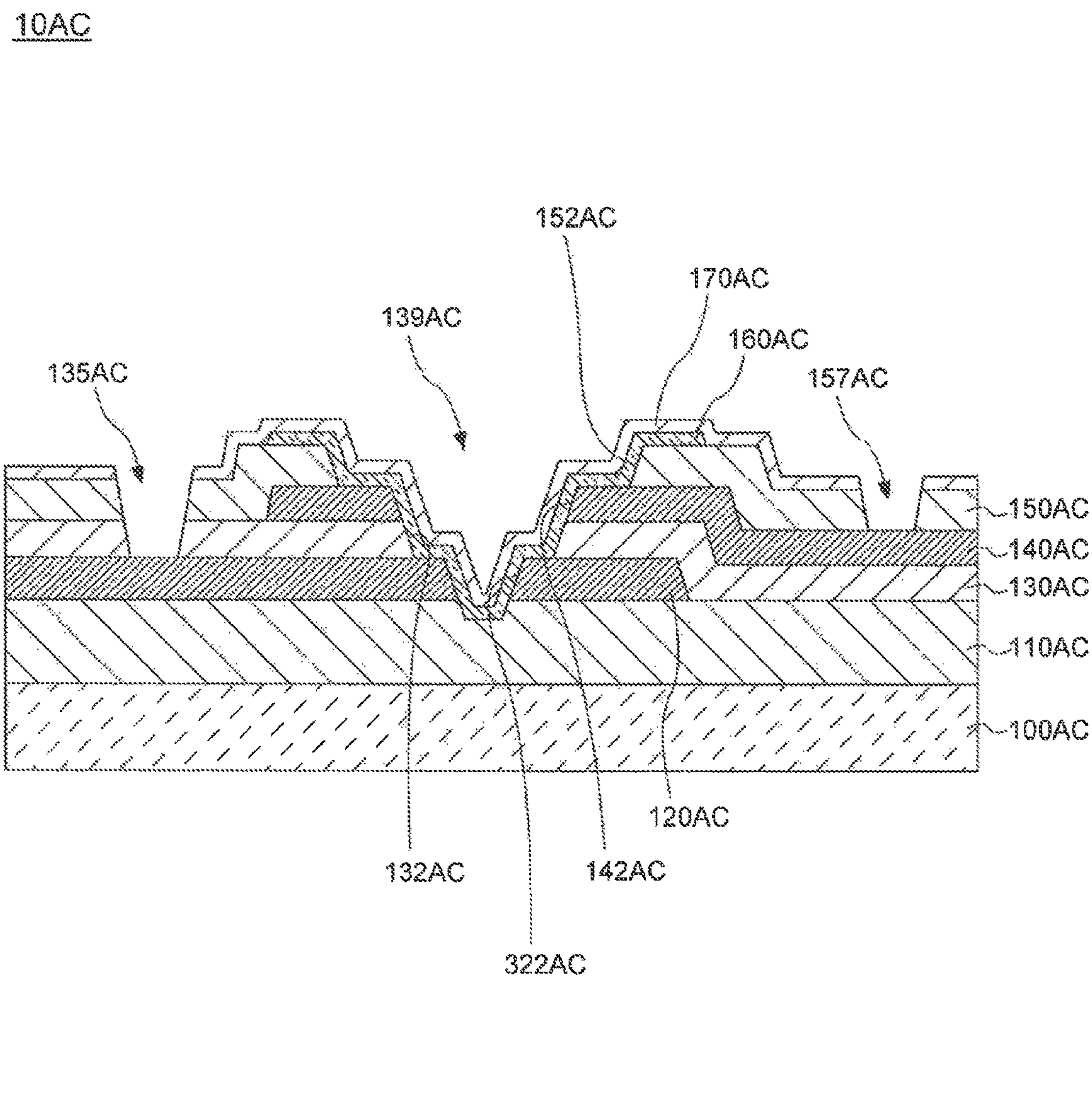
Figure 281:
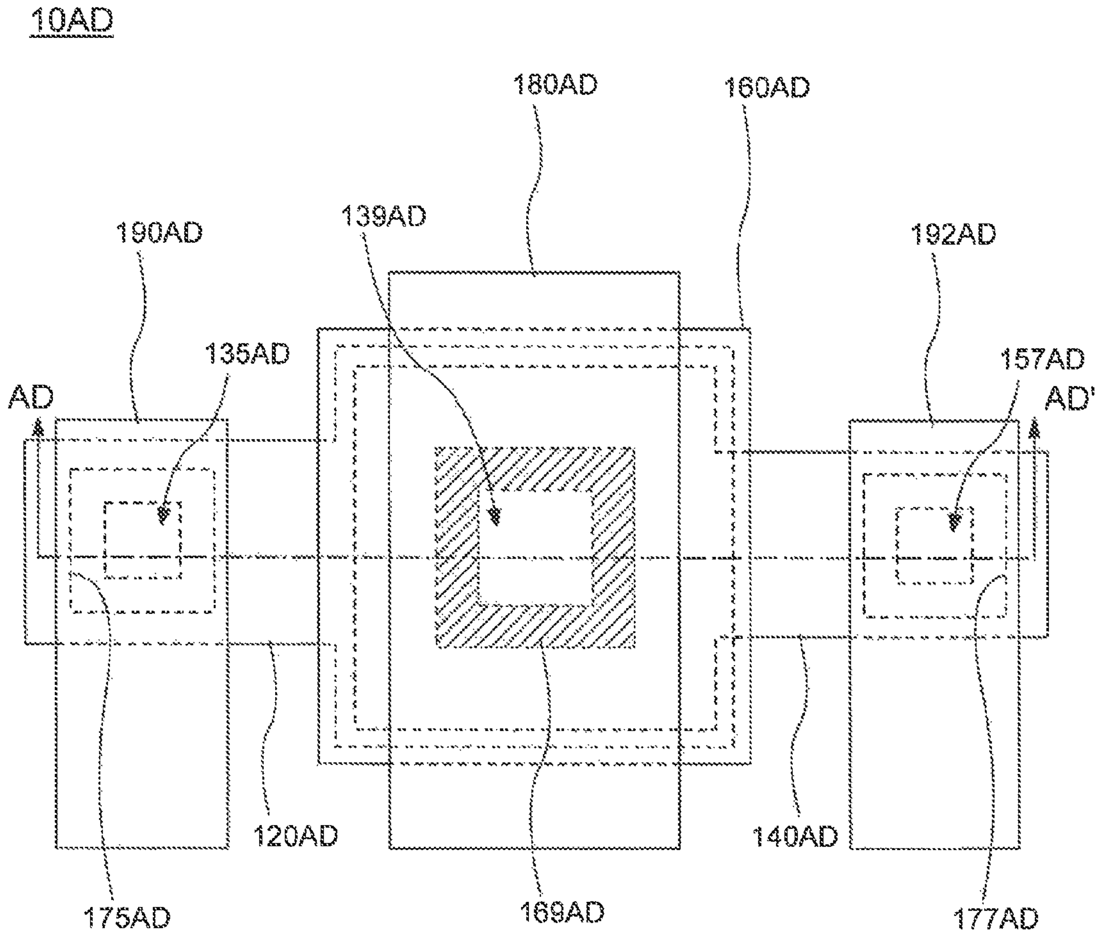
Figure 282:
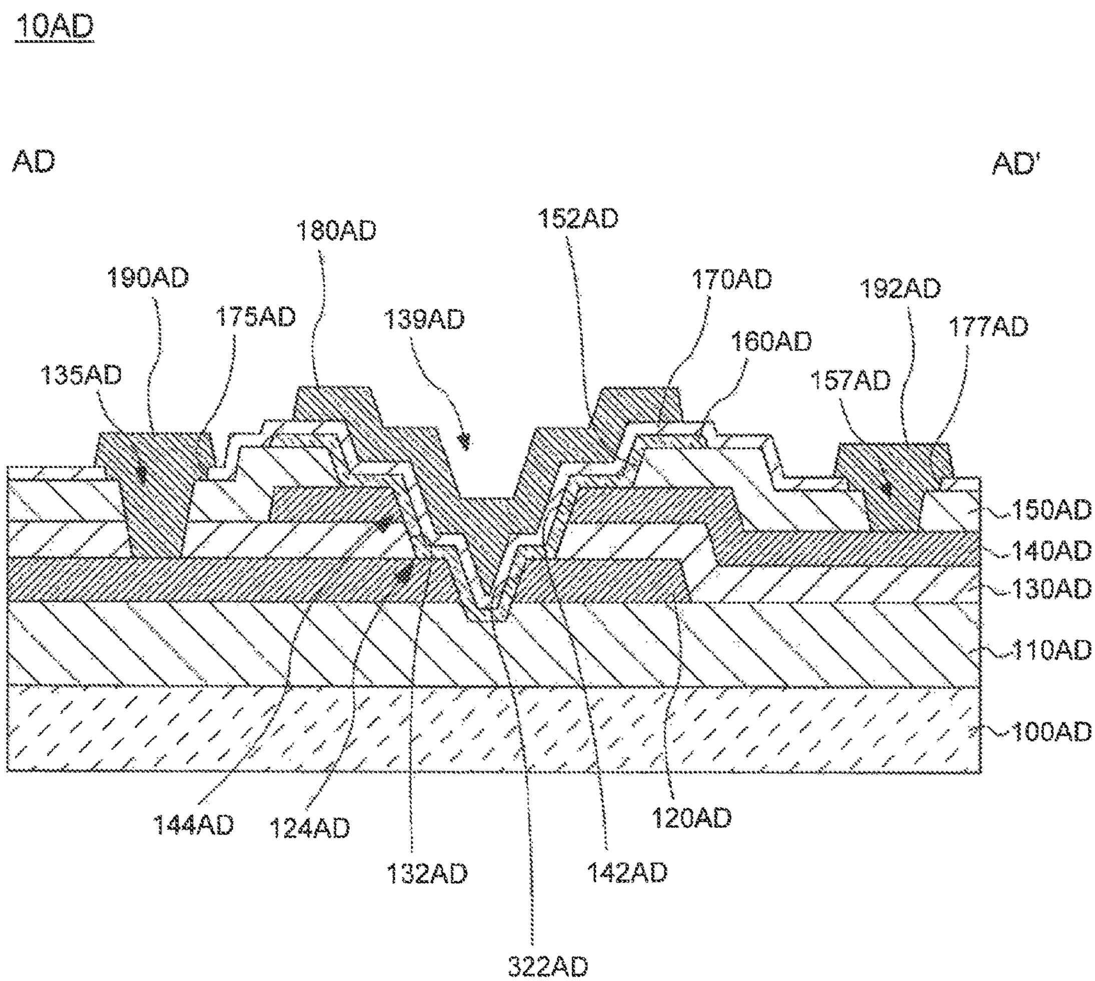
Figure 283:
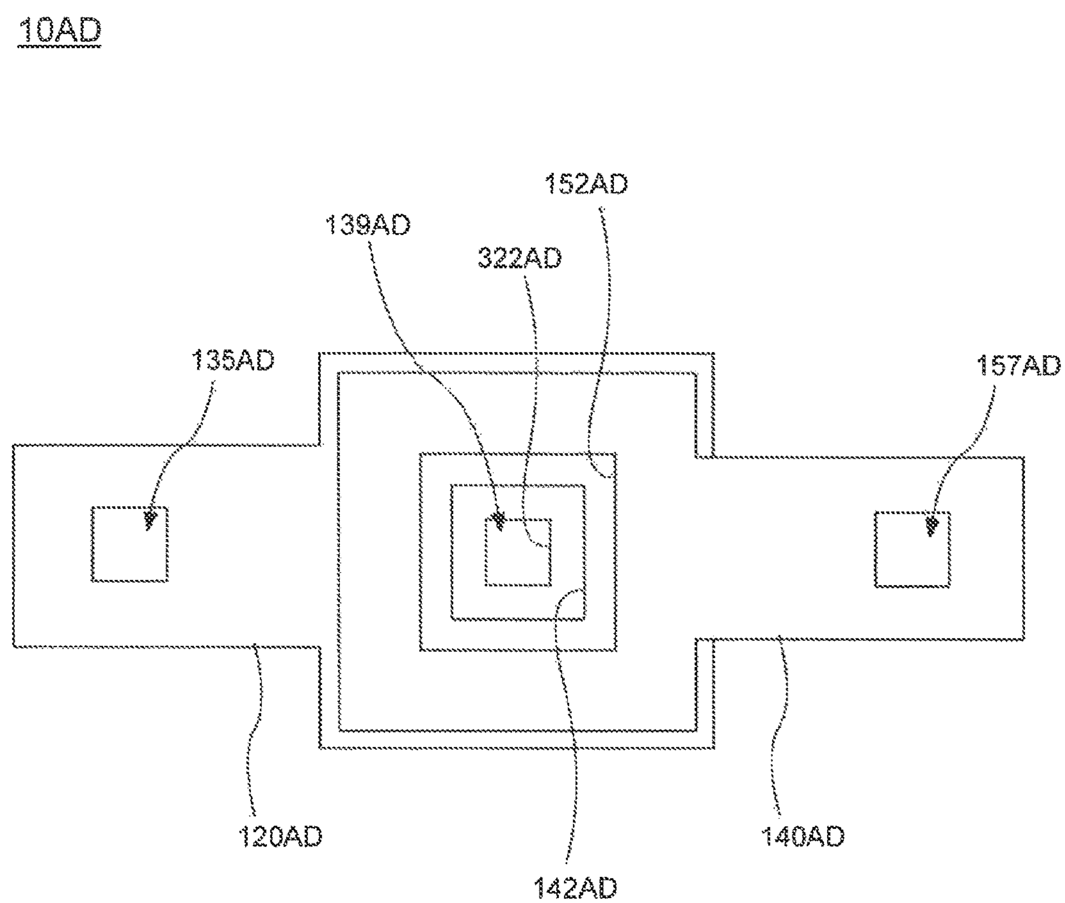
Figure 284:
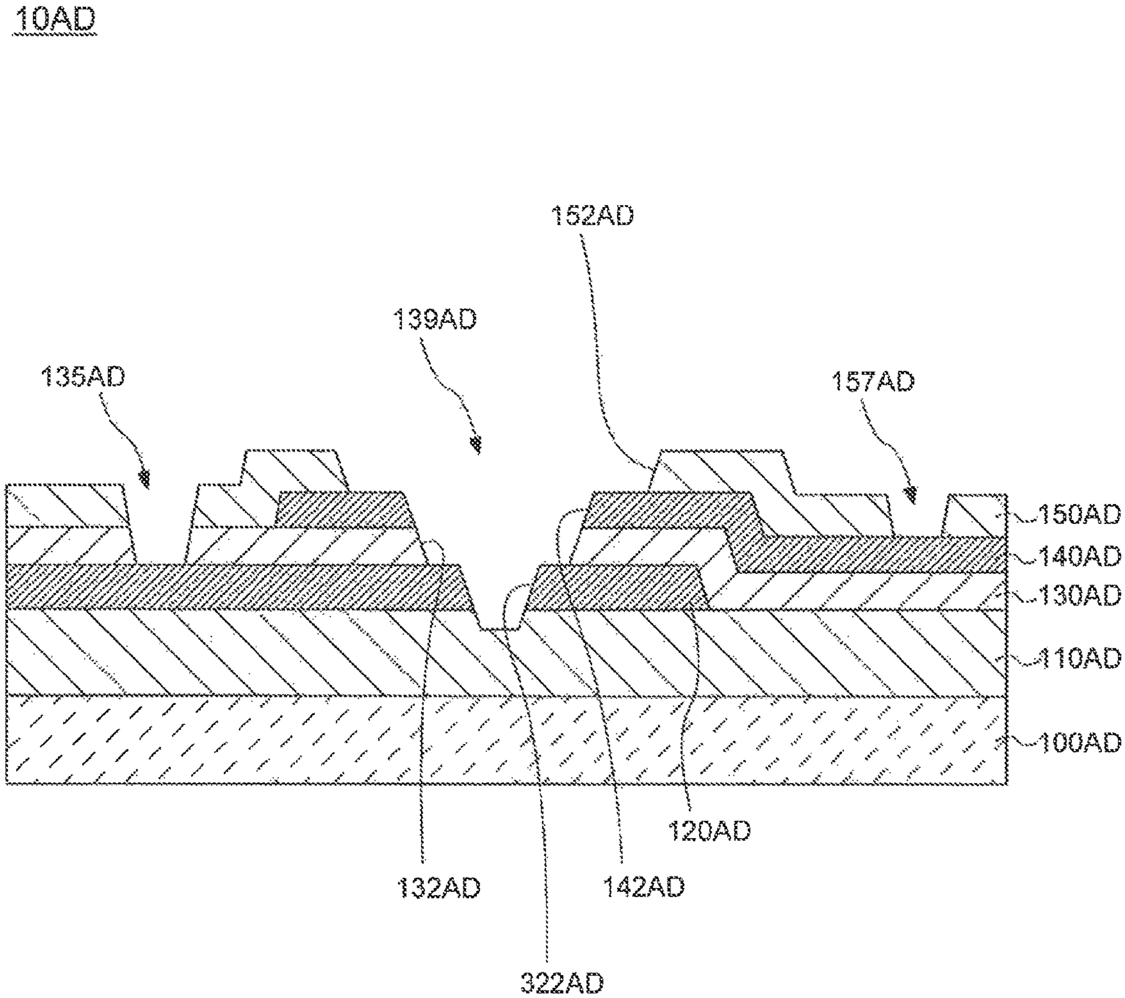
Figure 285:
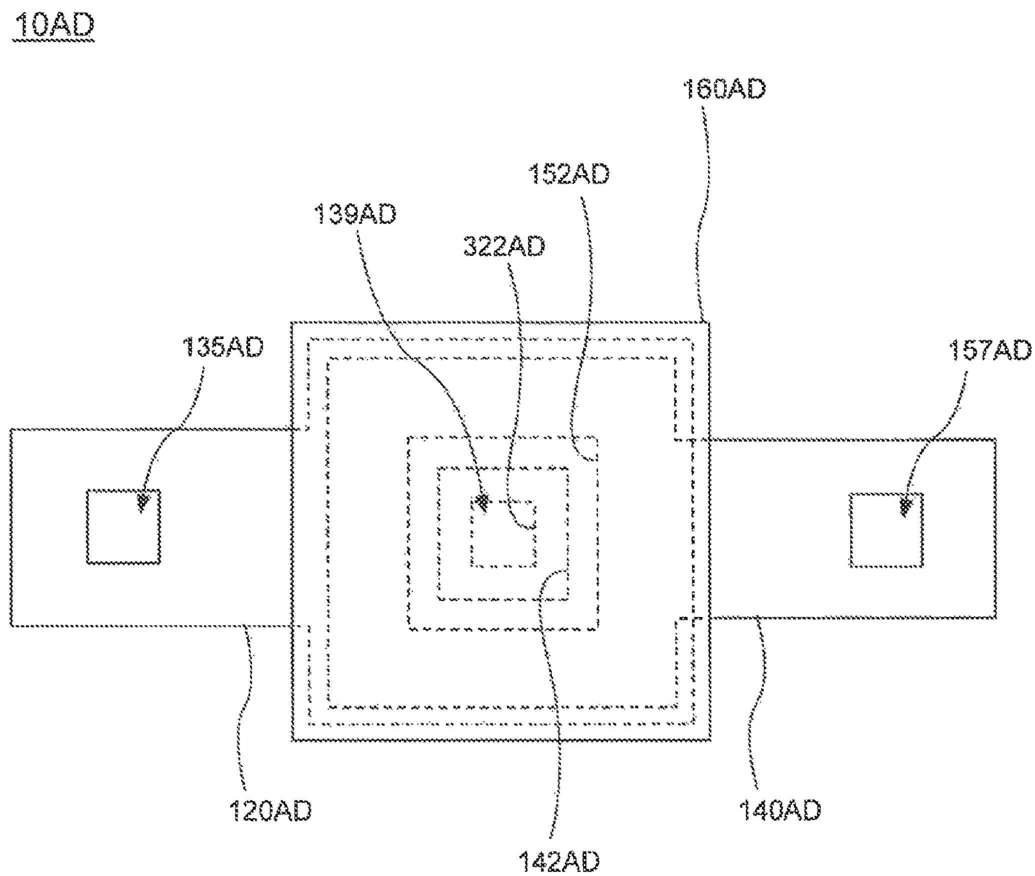
Figure 286:
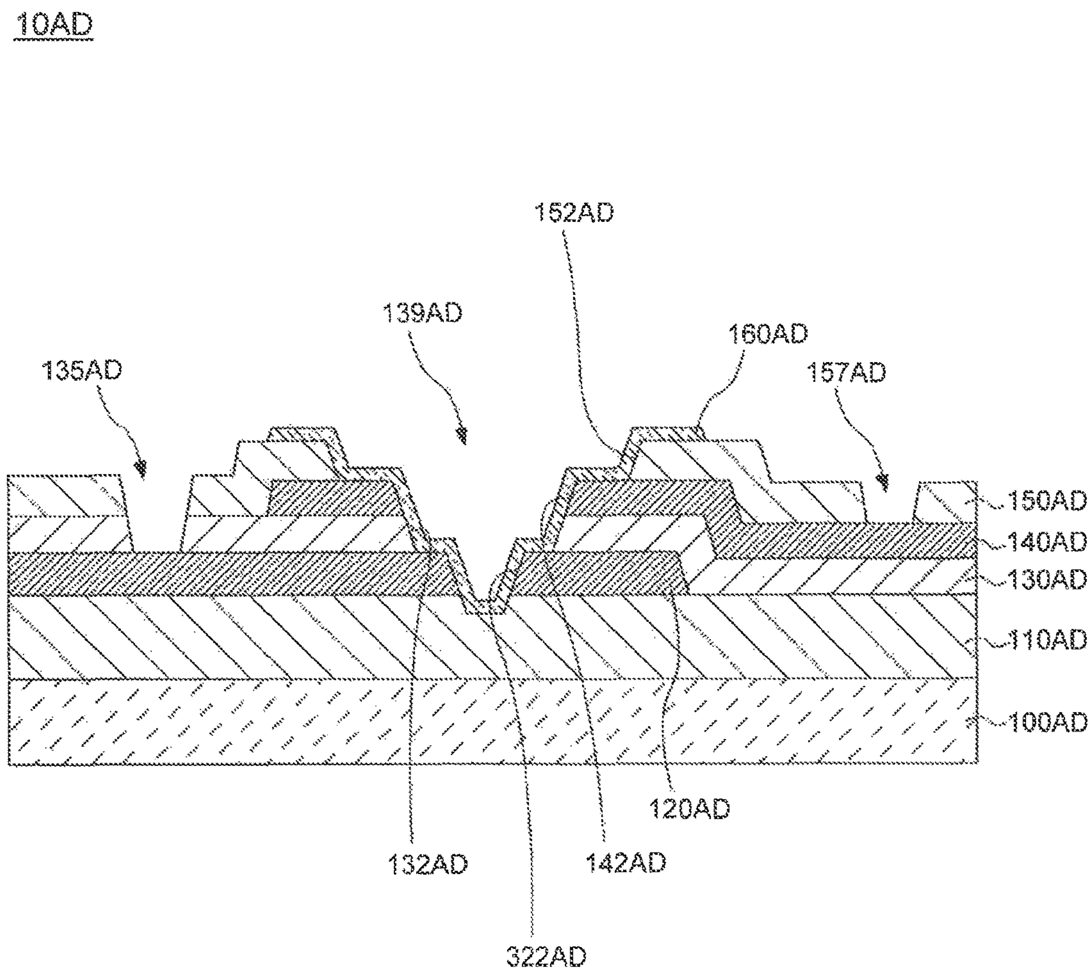
Figure 287:
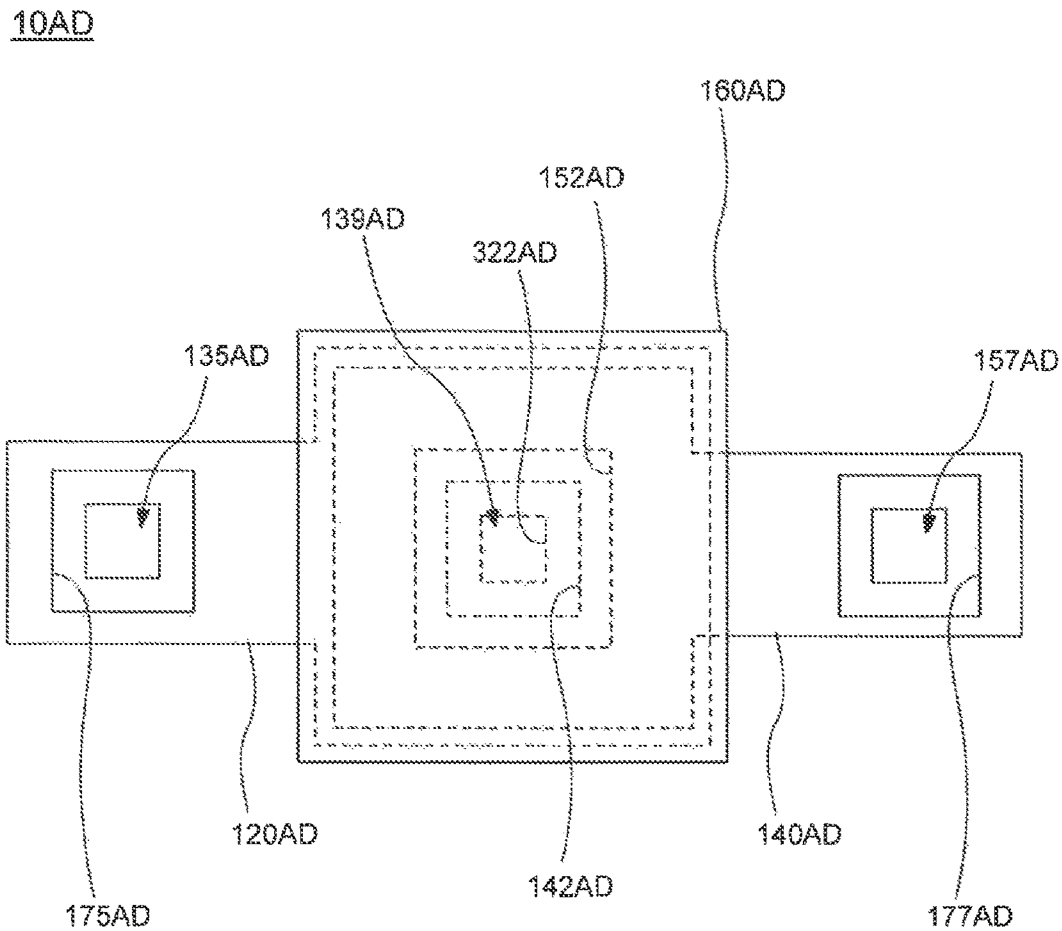
Figure 288:
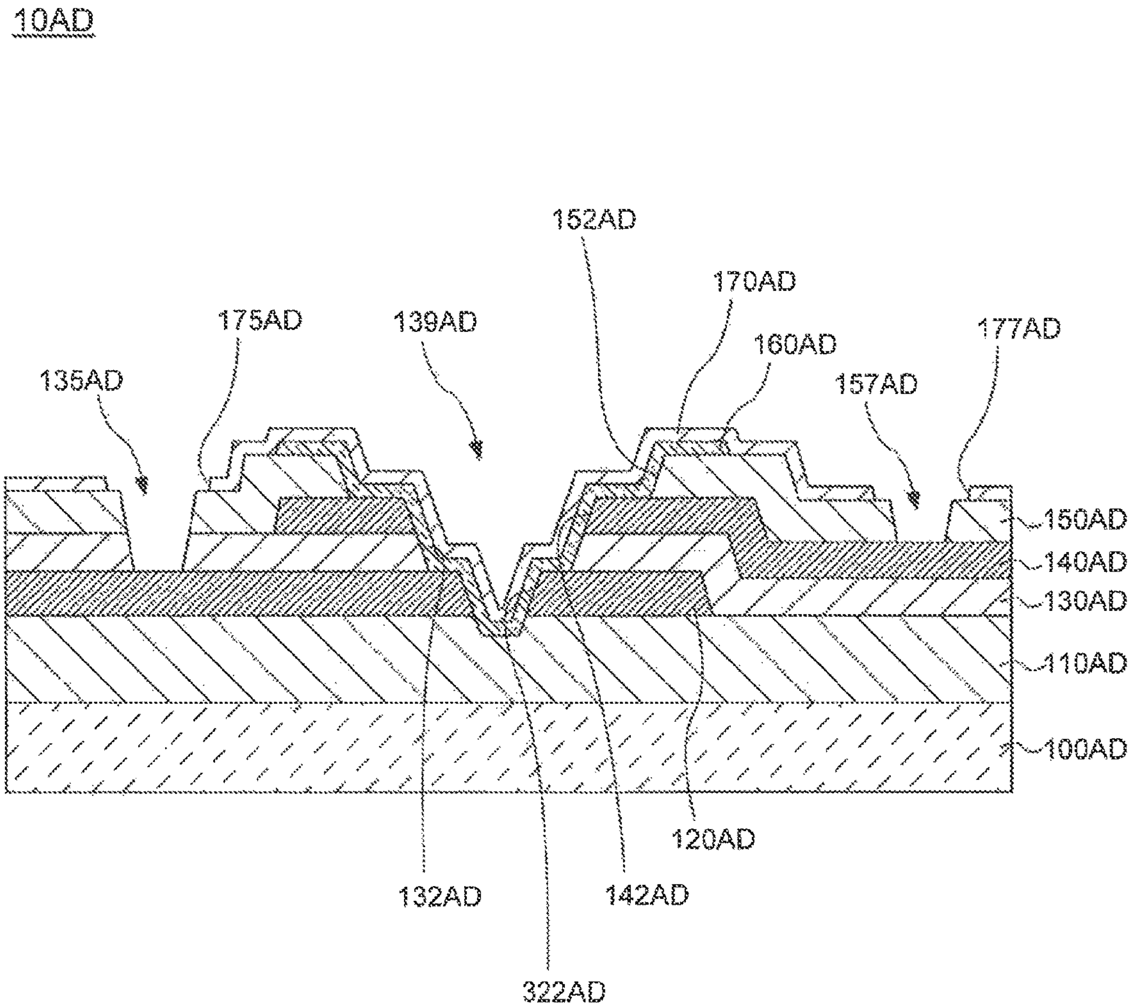
Figure 289:
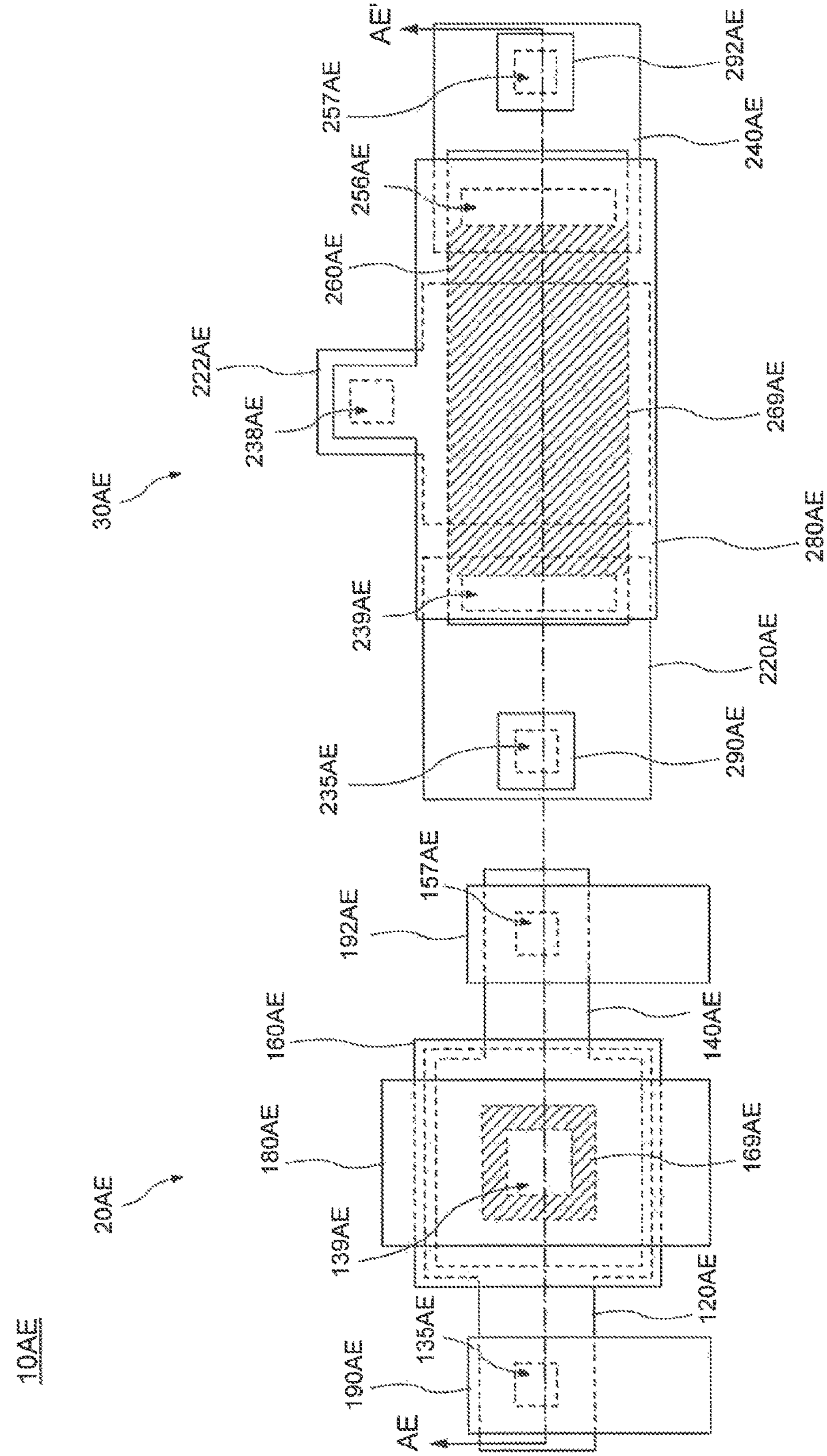
Figure 290:
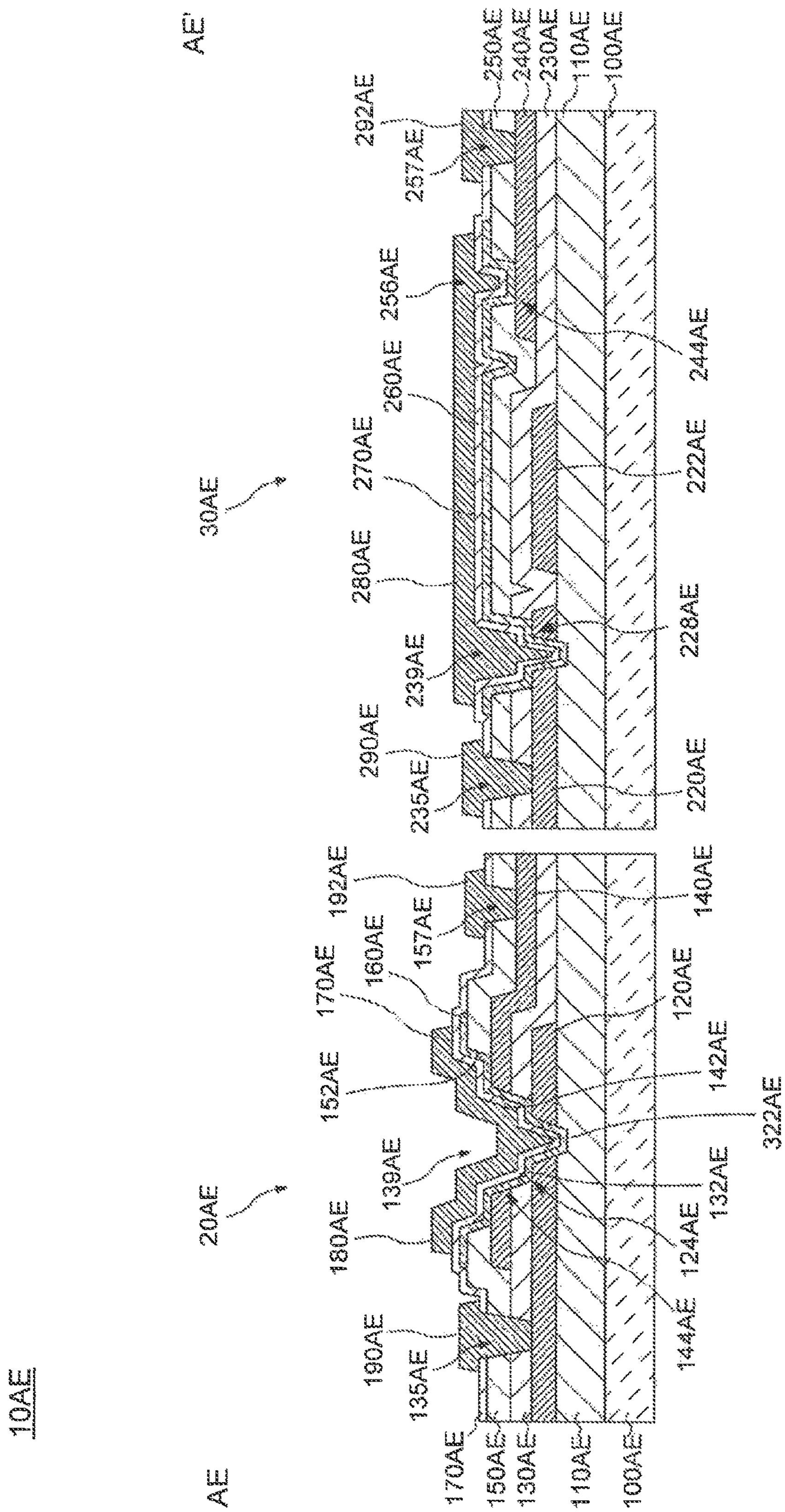
Figure 291:
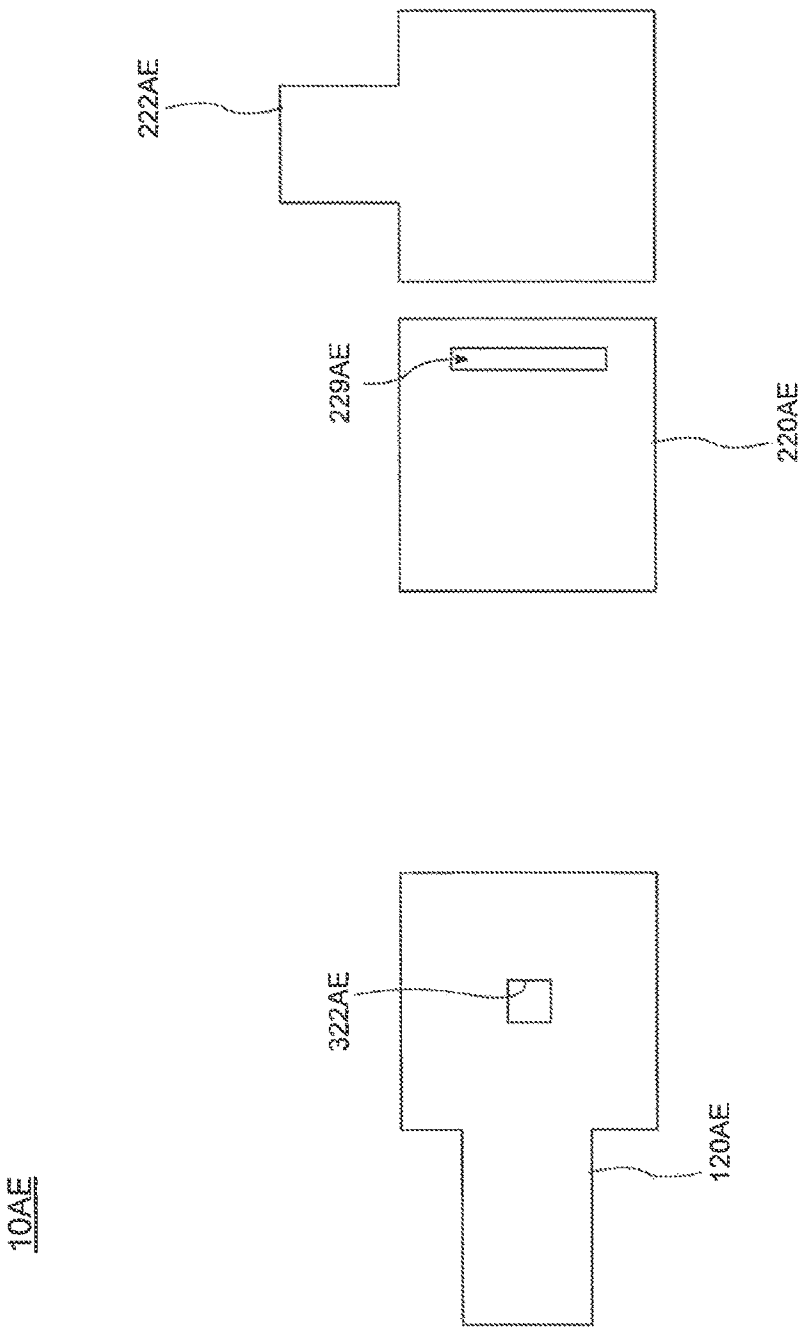
Figure 292:
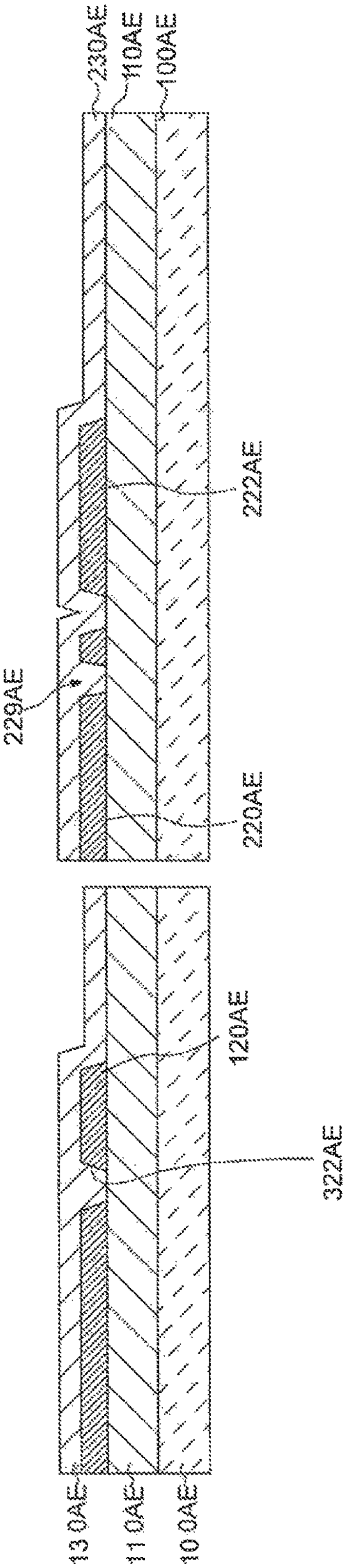
Figure 293:
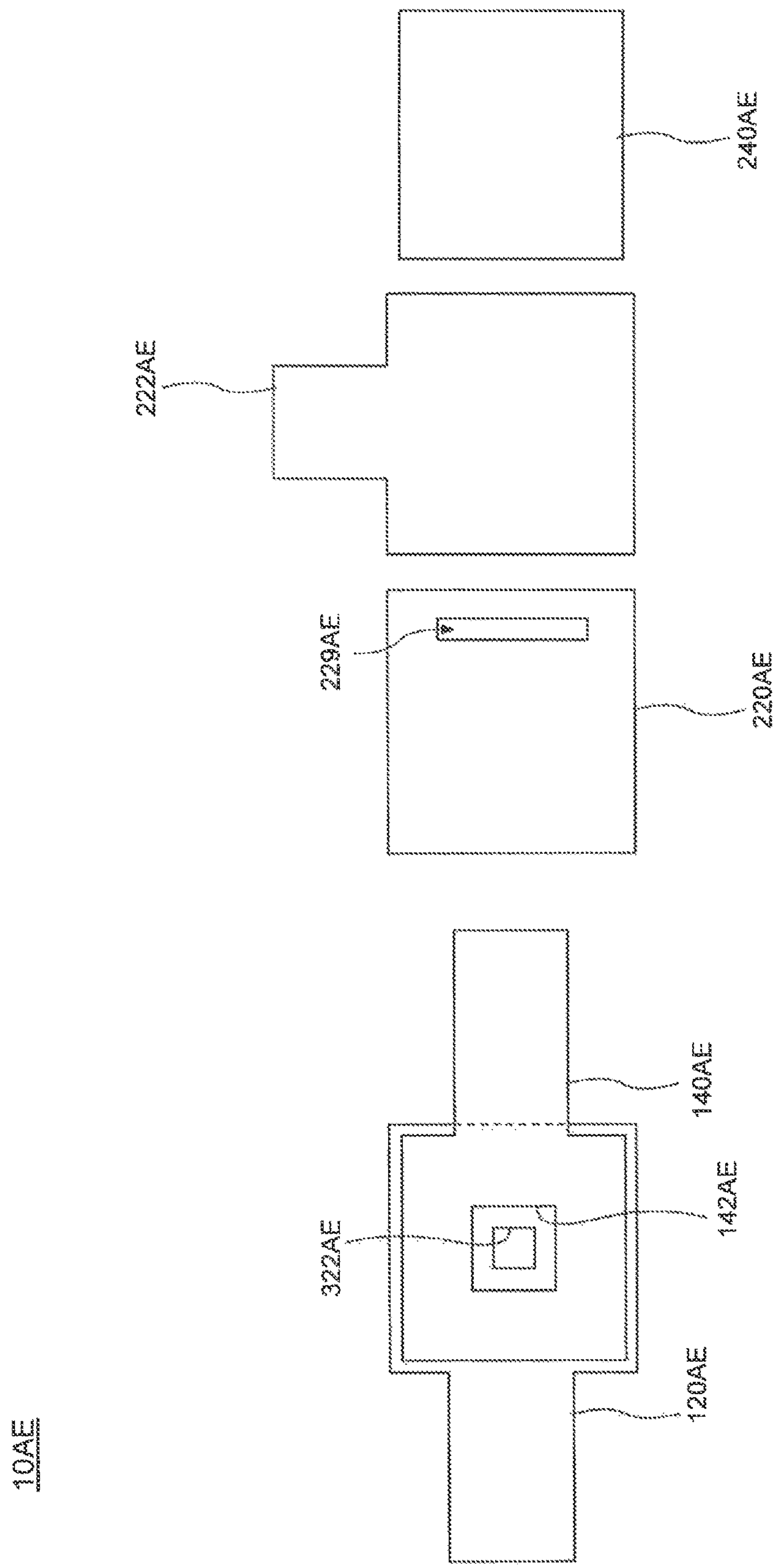
Figure 294:
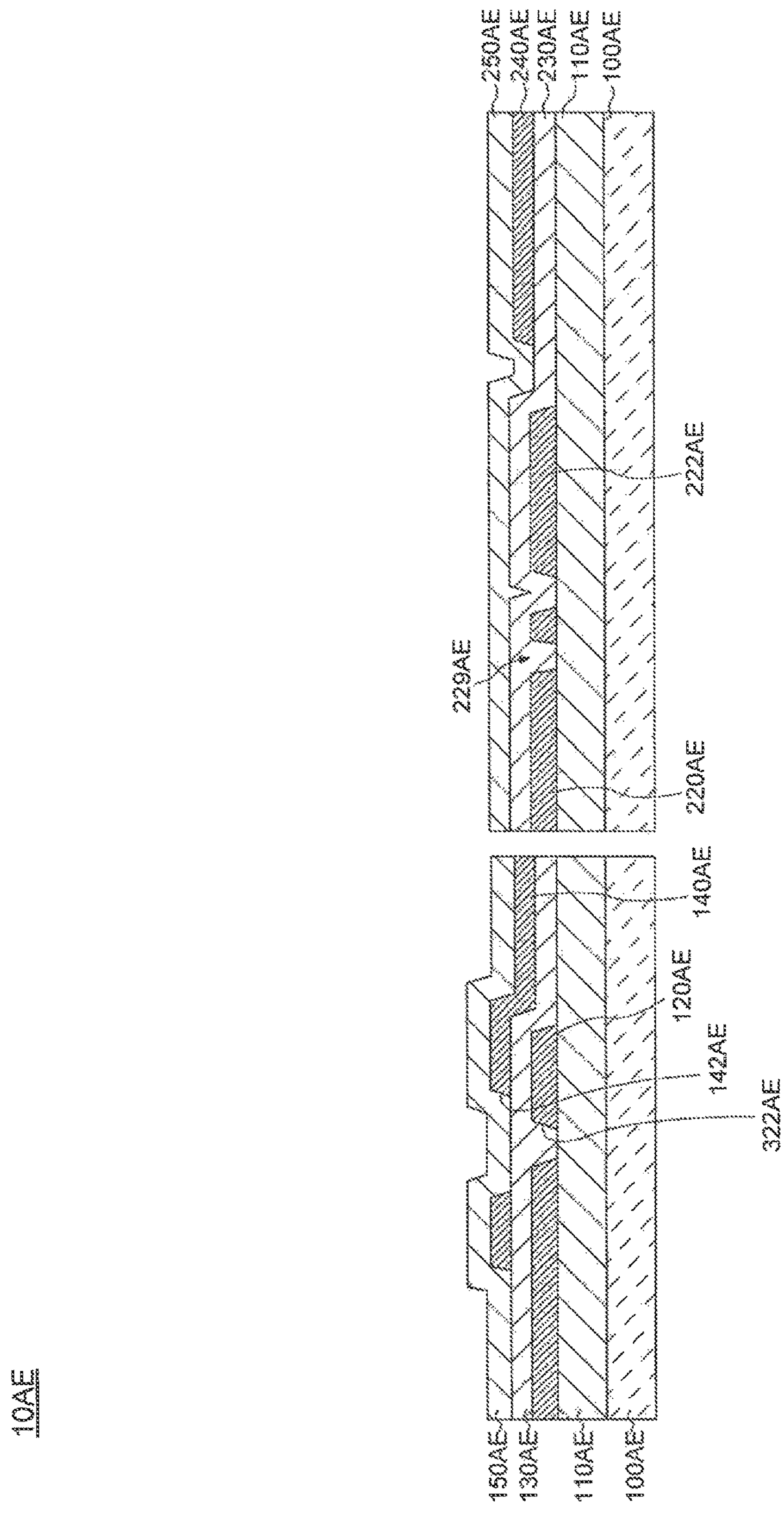
Figure 295:
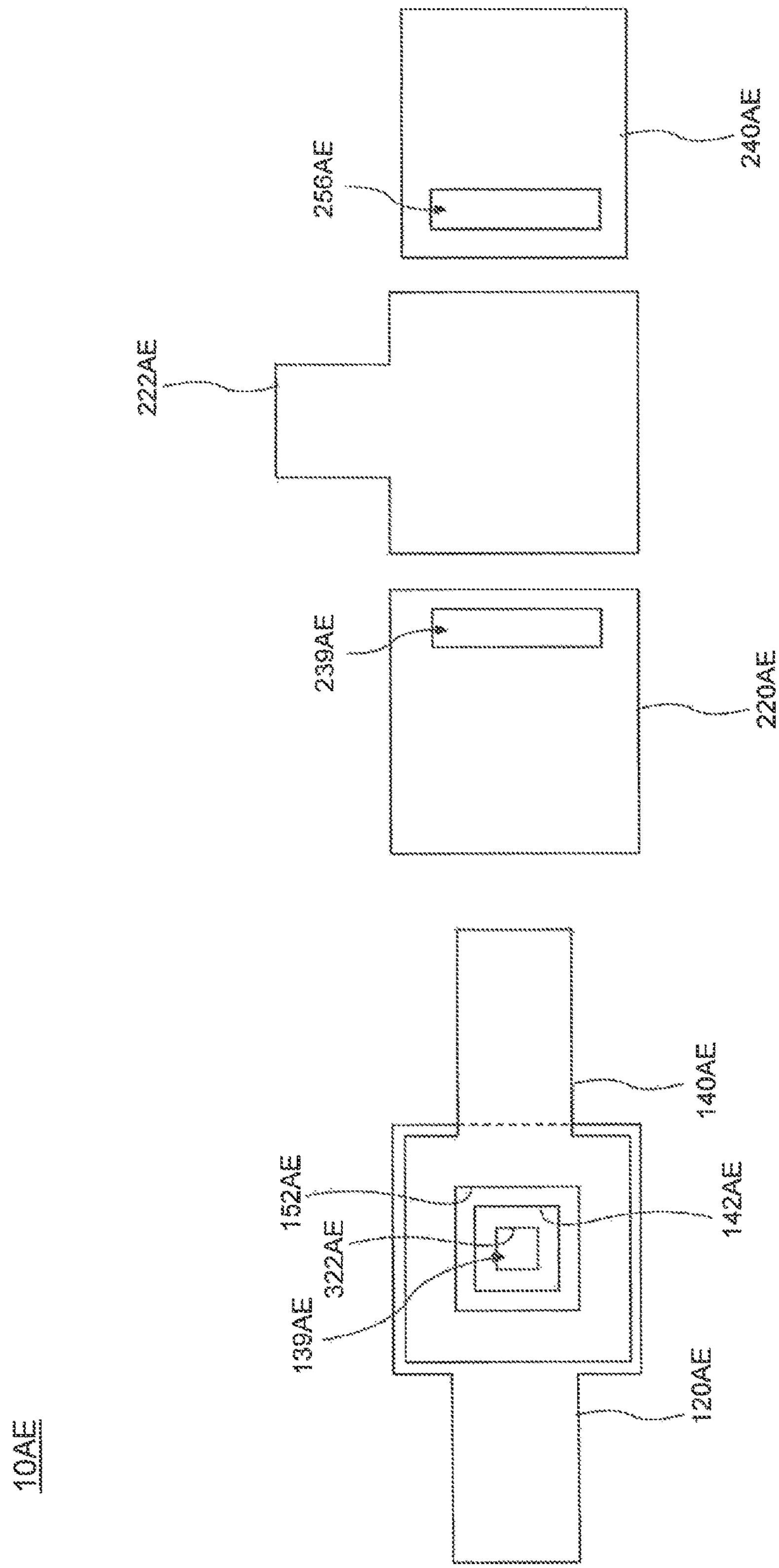
Figure 296:
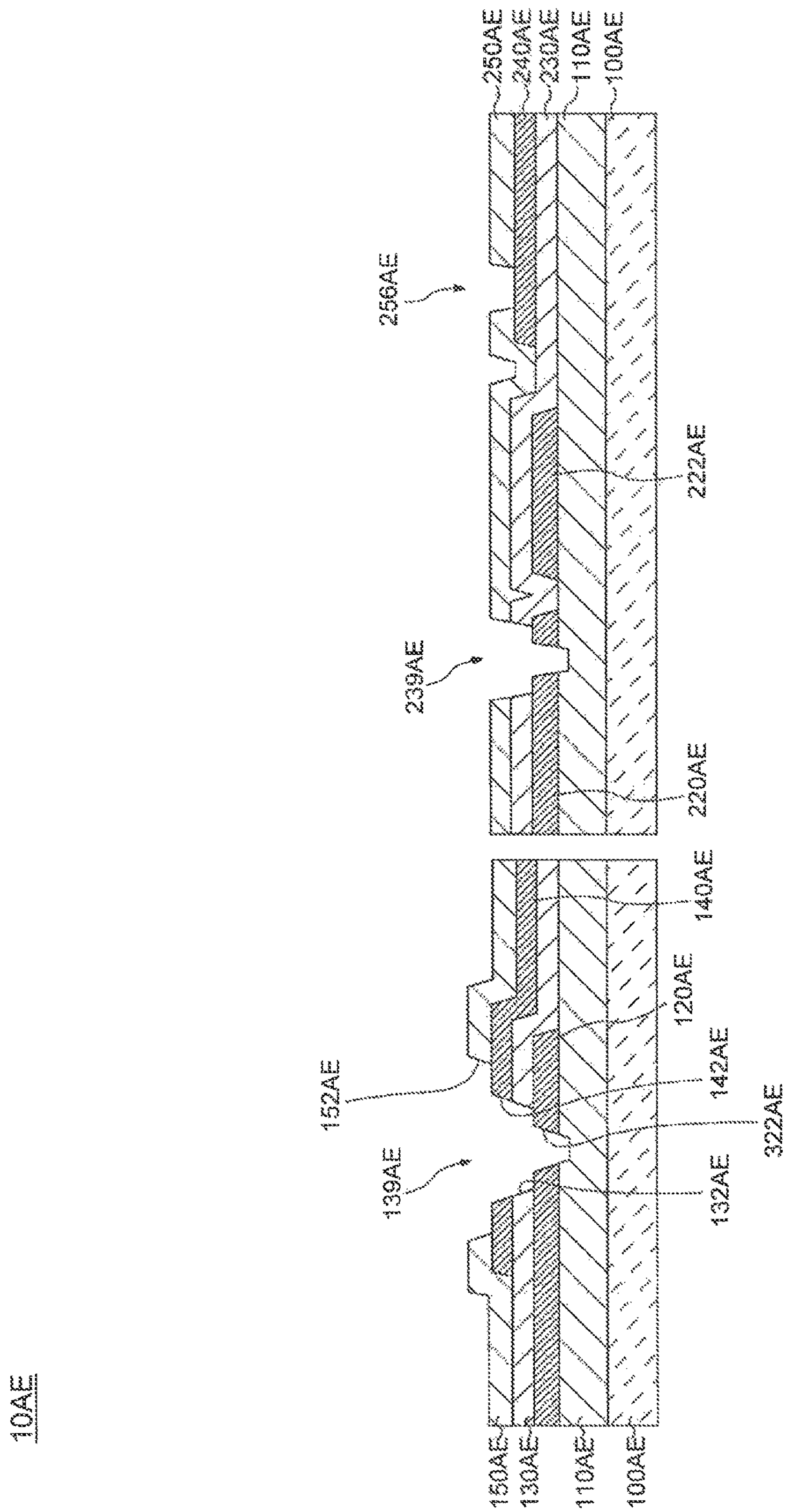
Figure 297:
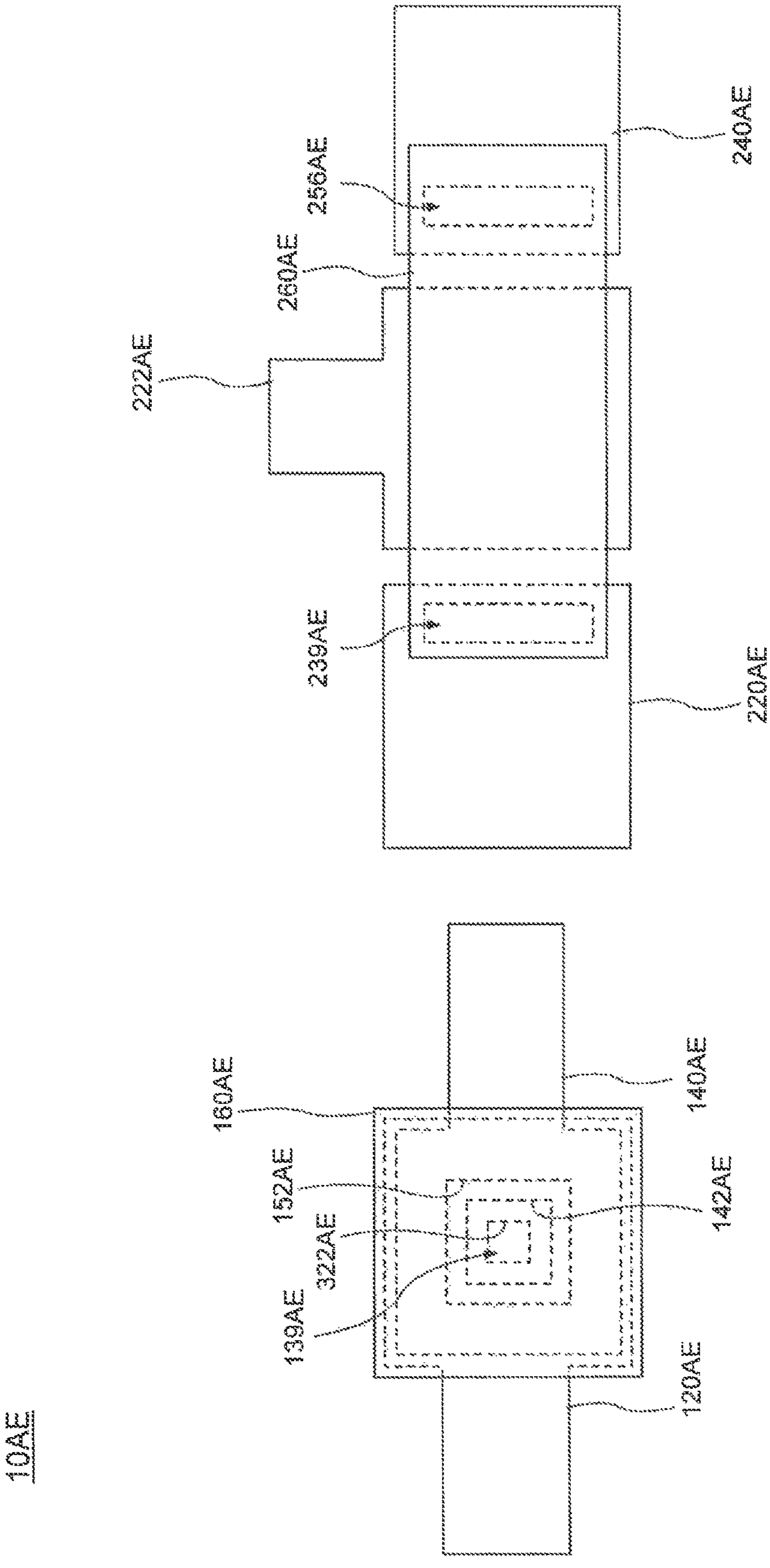
Figure 298:
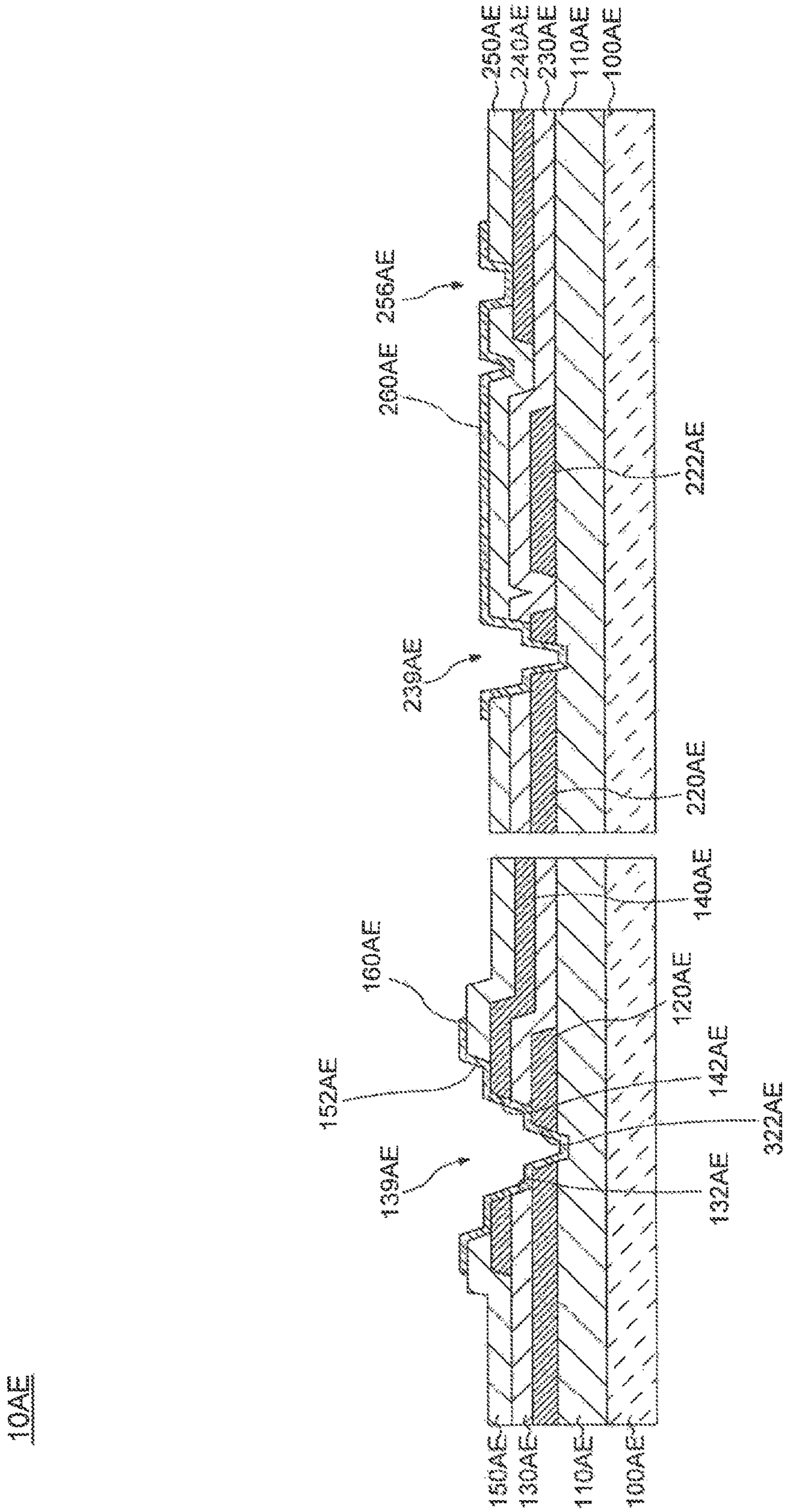
Figure 299:
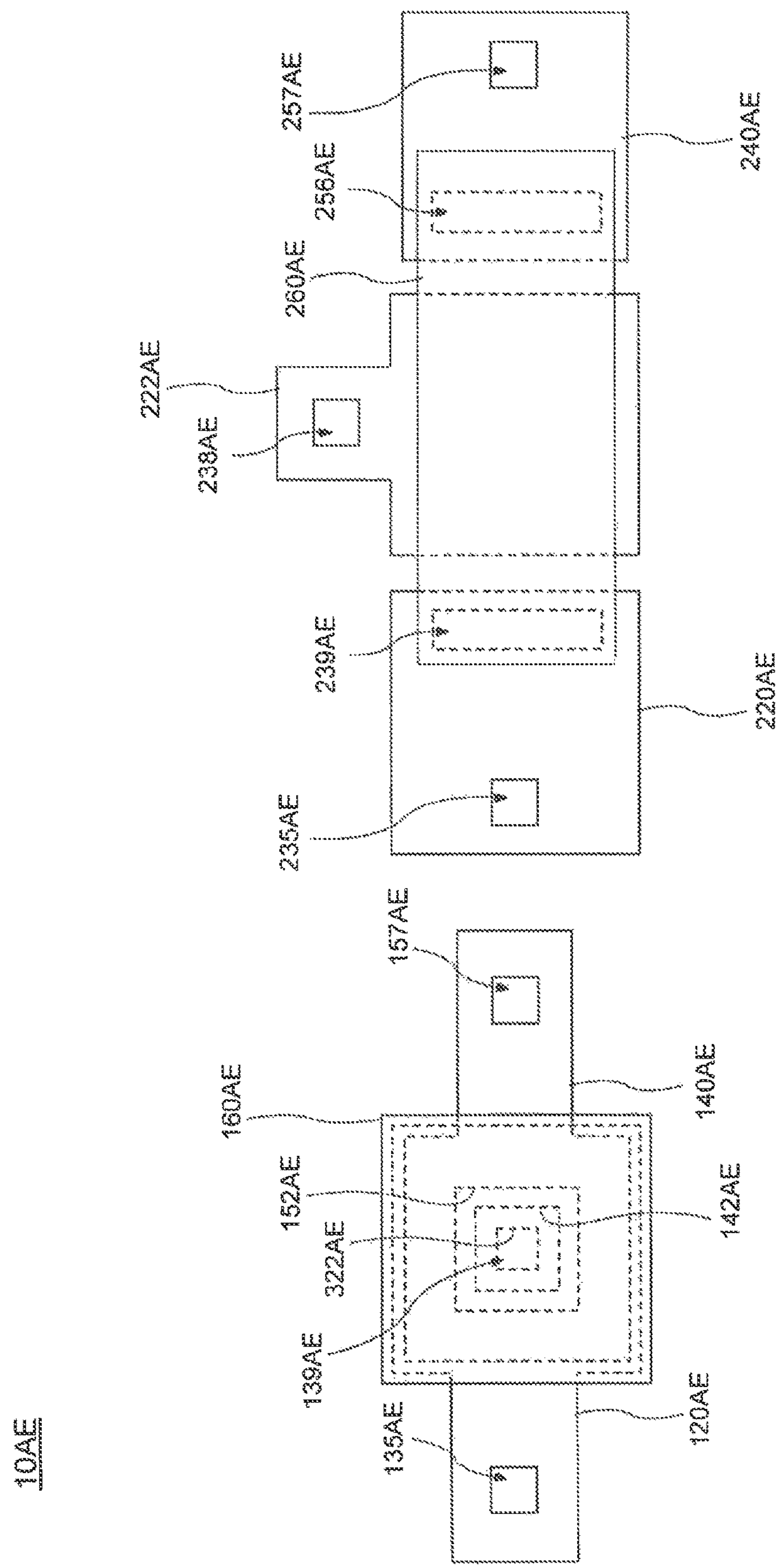
Figure 300:
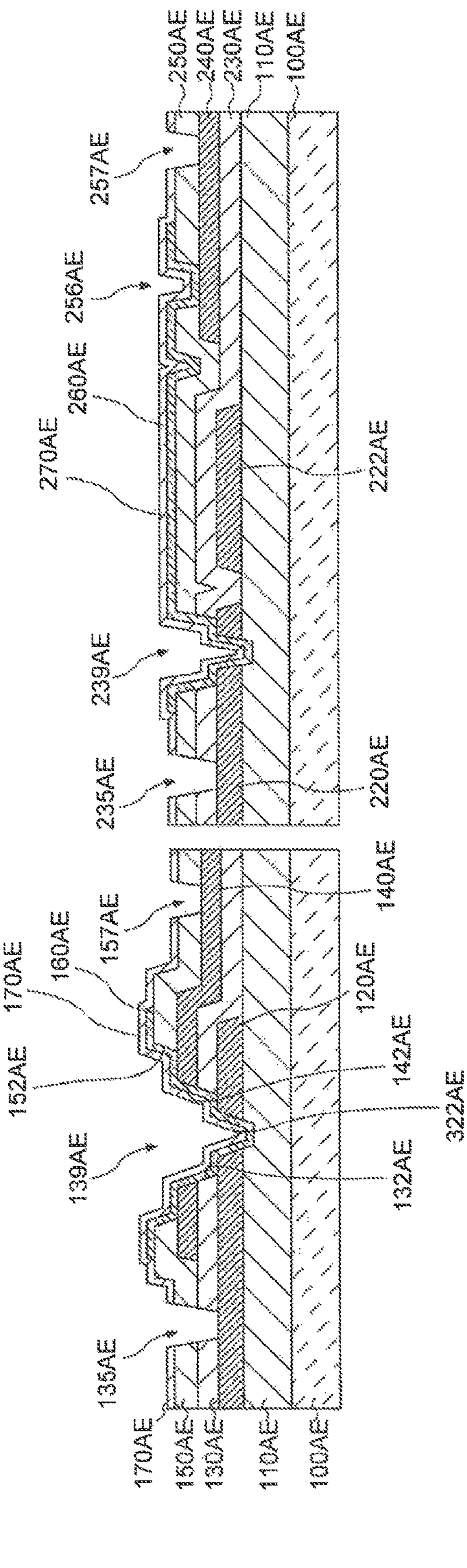
Figure 301:
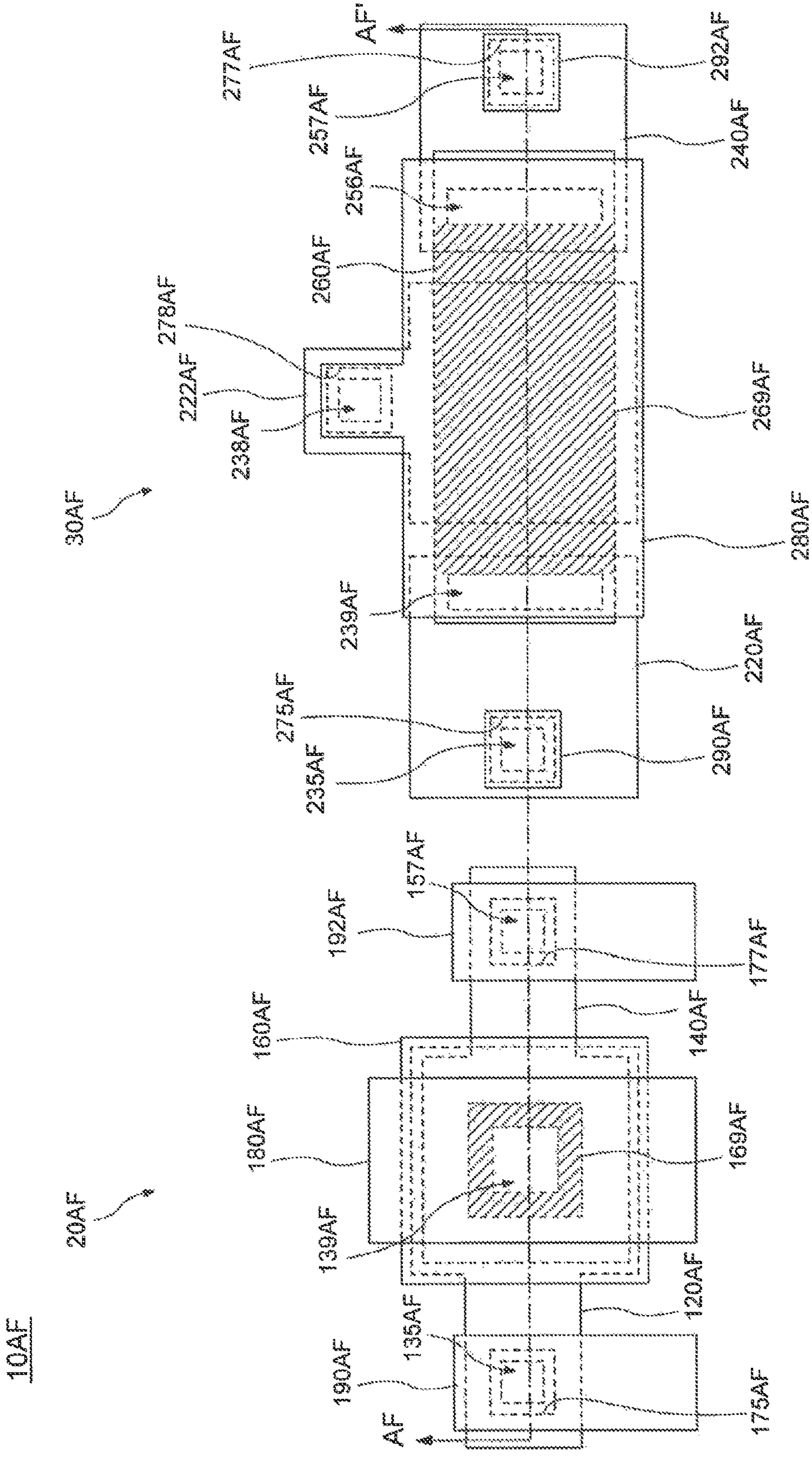
Figure 302:
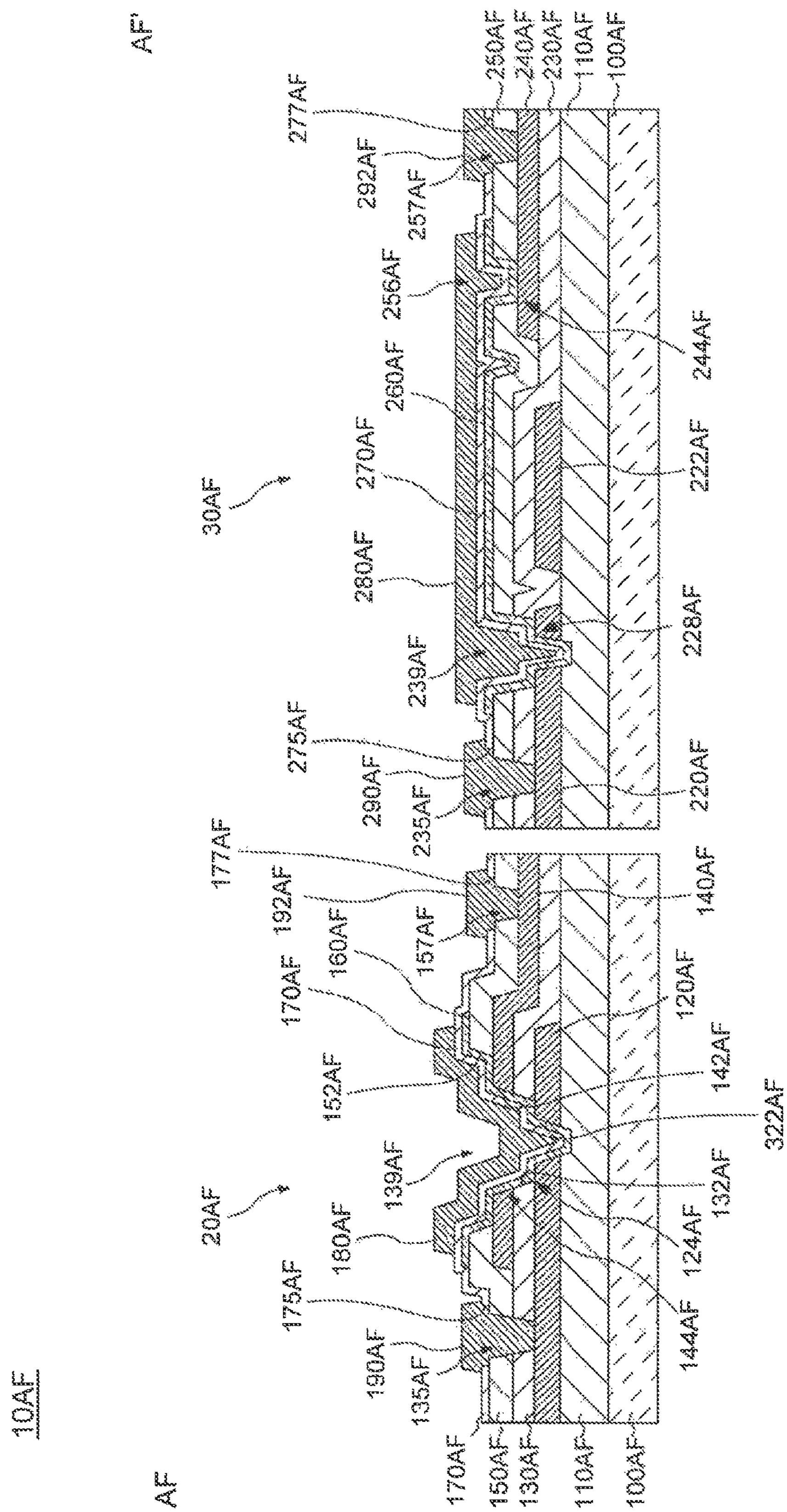
Figure 303:
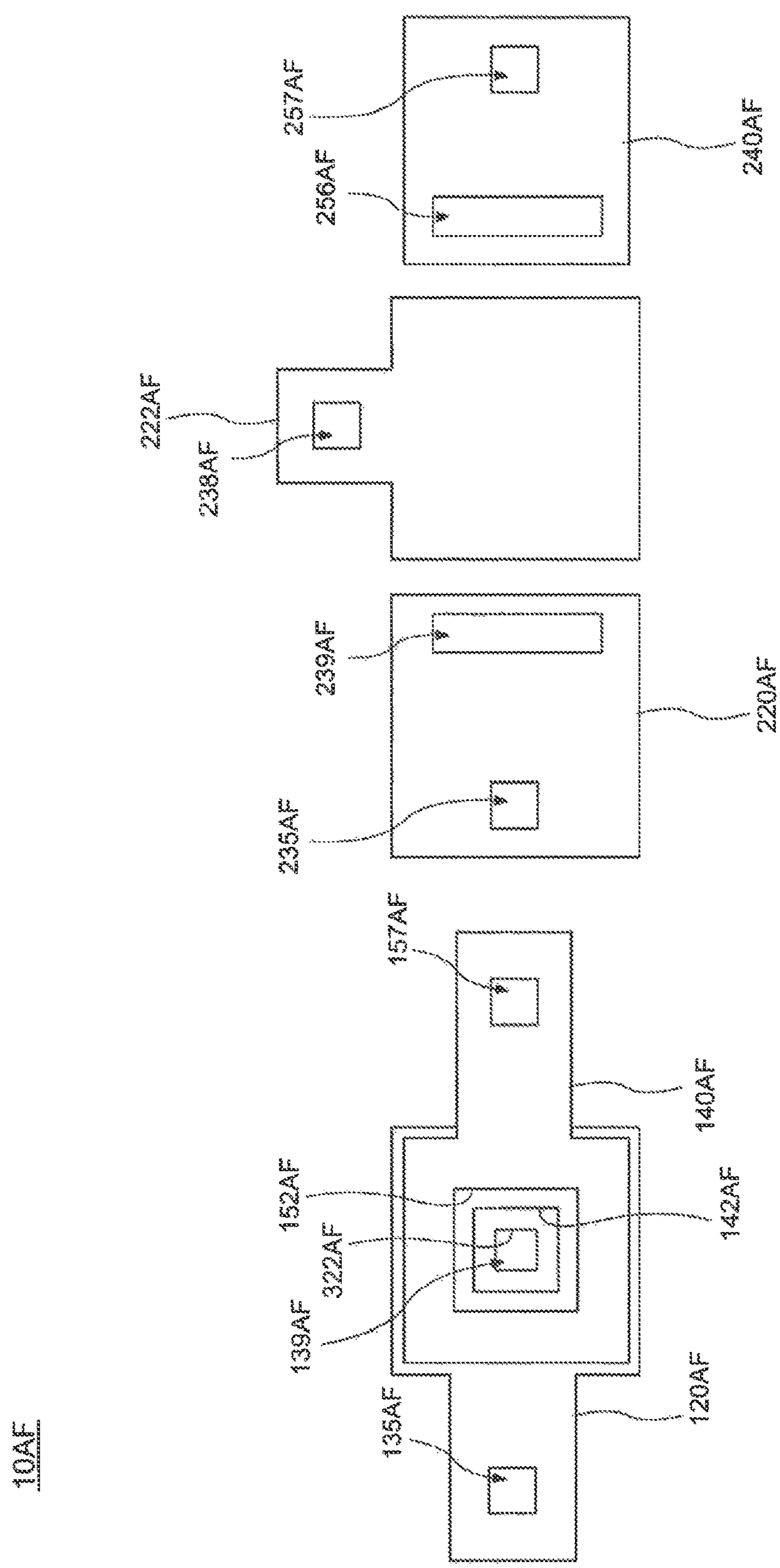
Figure 304:
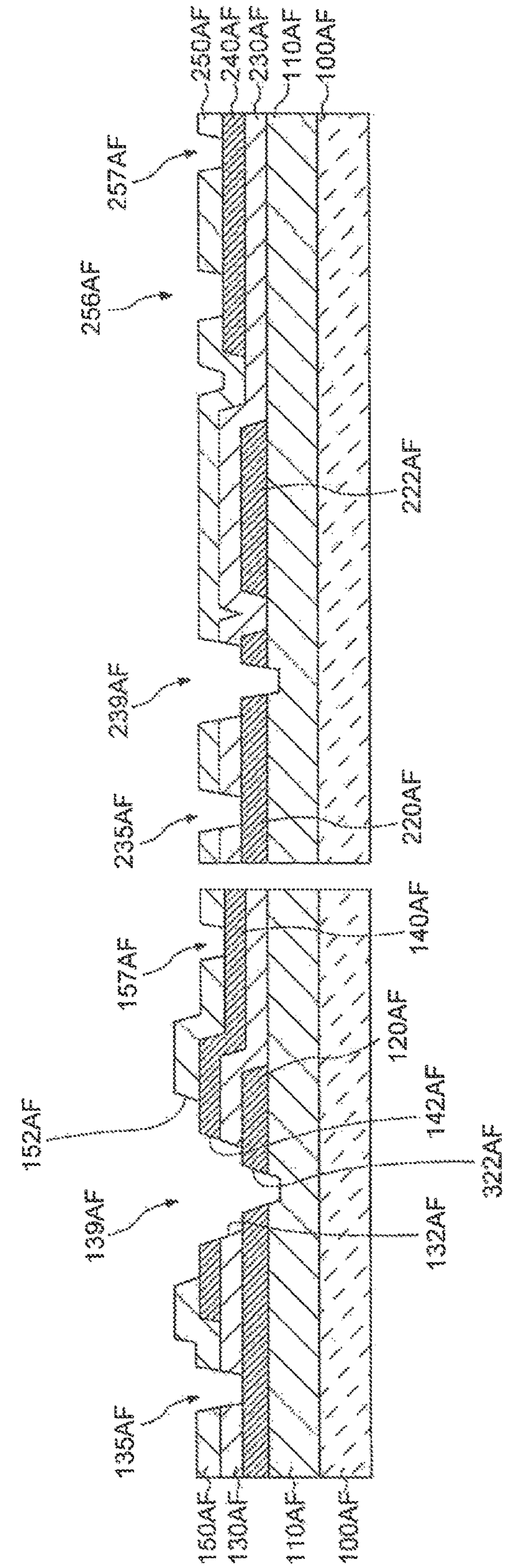
Figure 305:
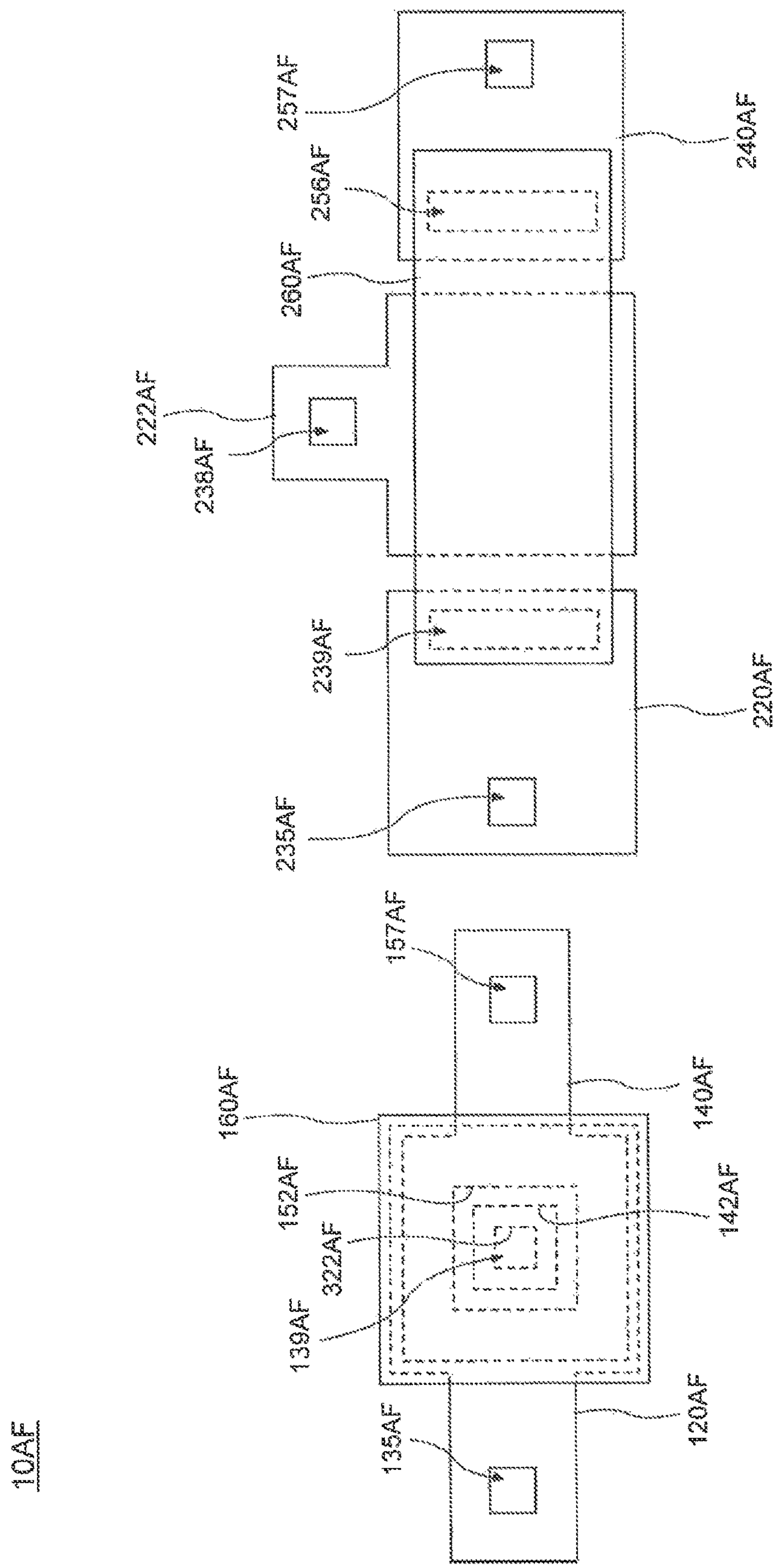
Figure 306:
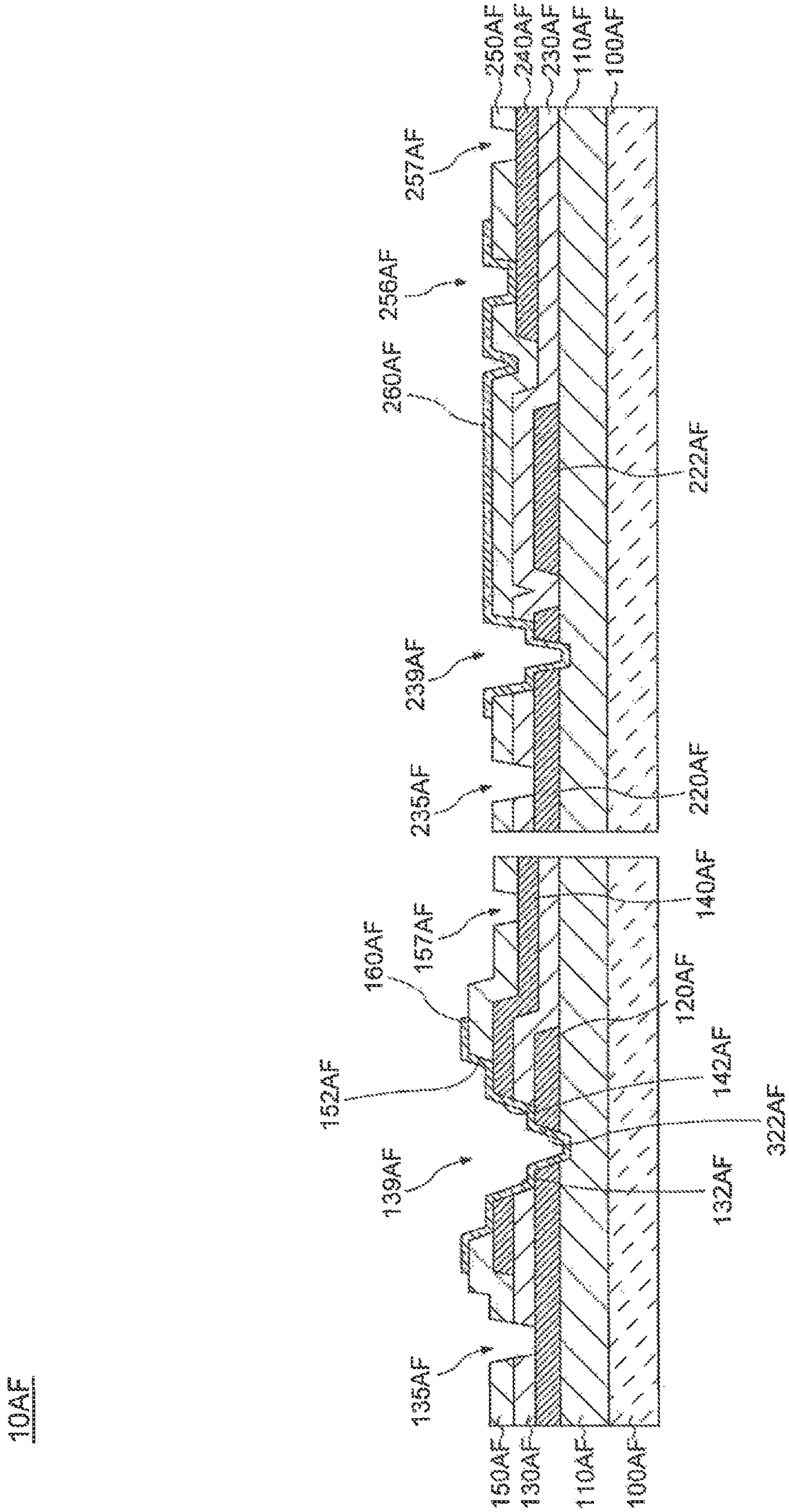
Figure 307:
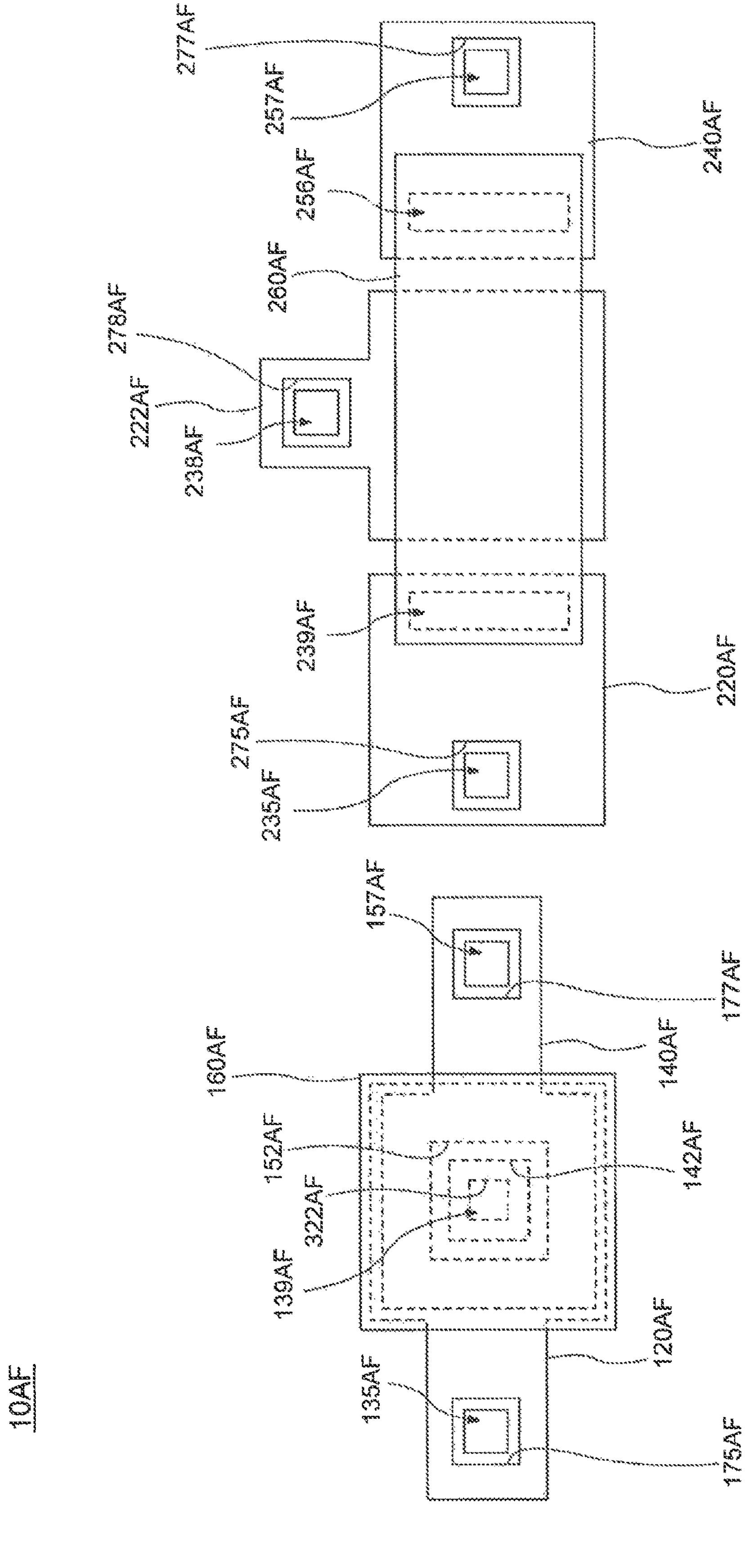
Figure 308:
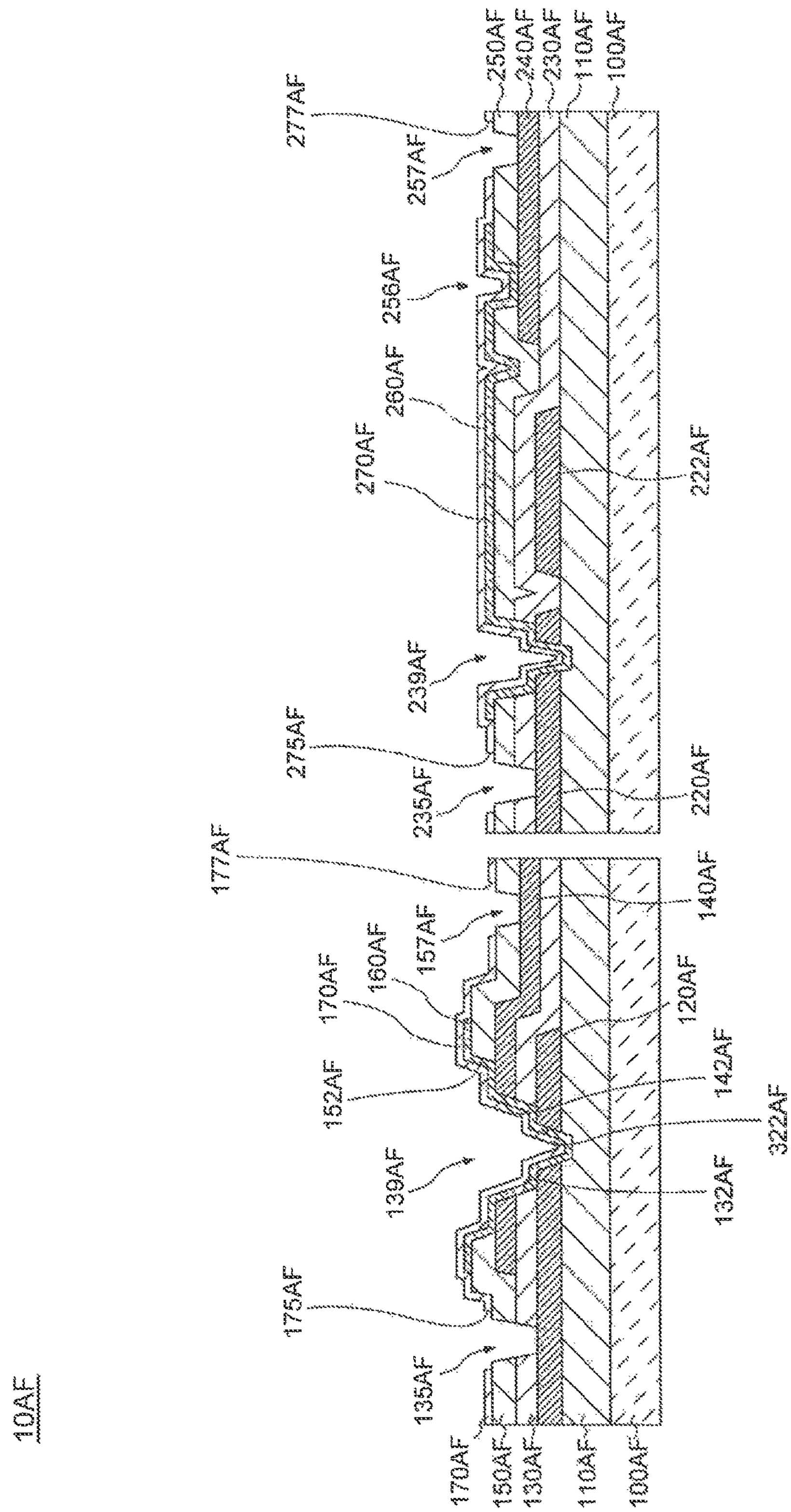
Figure 309:
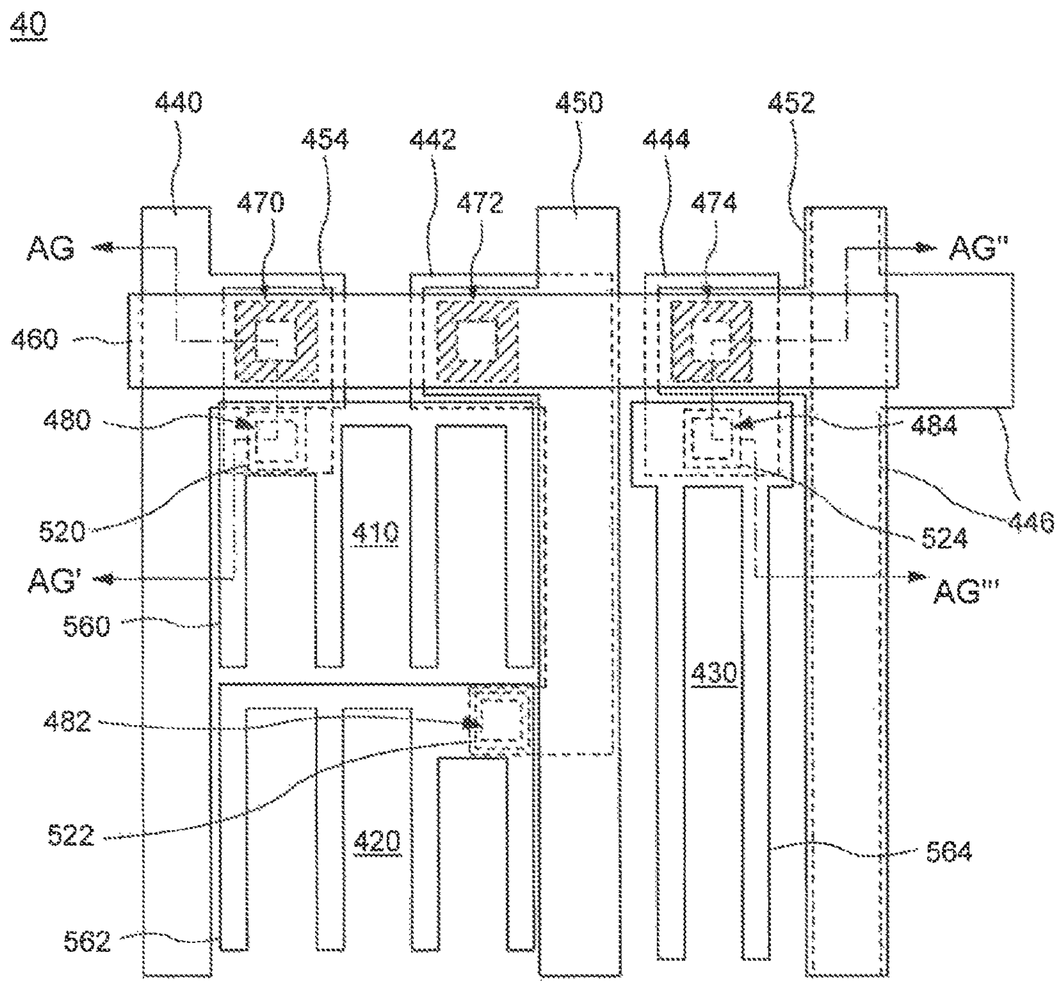
Figure 310:
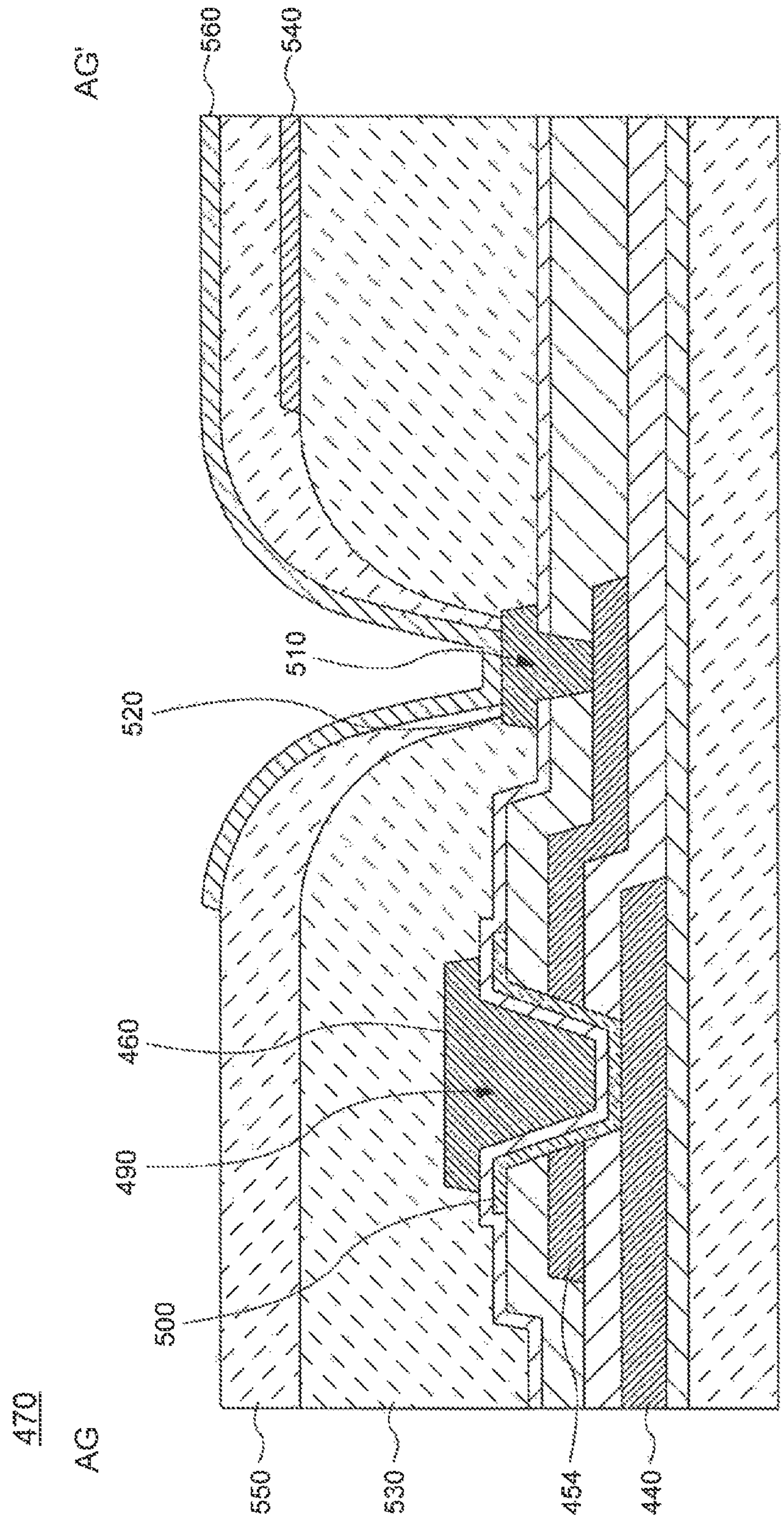
Figure 311:
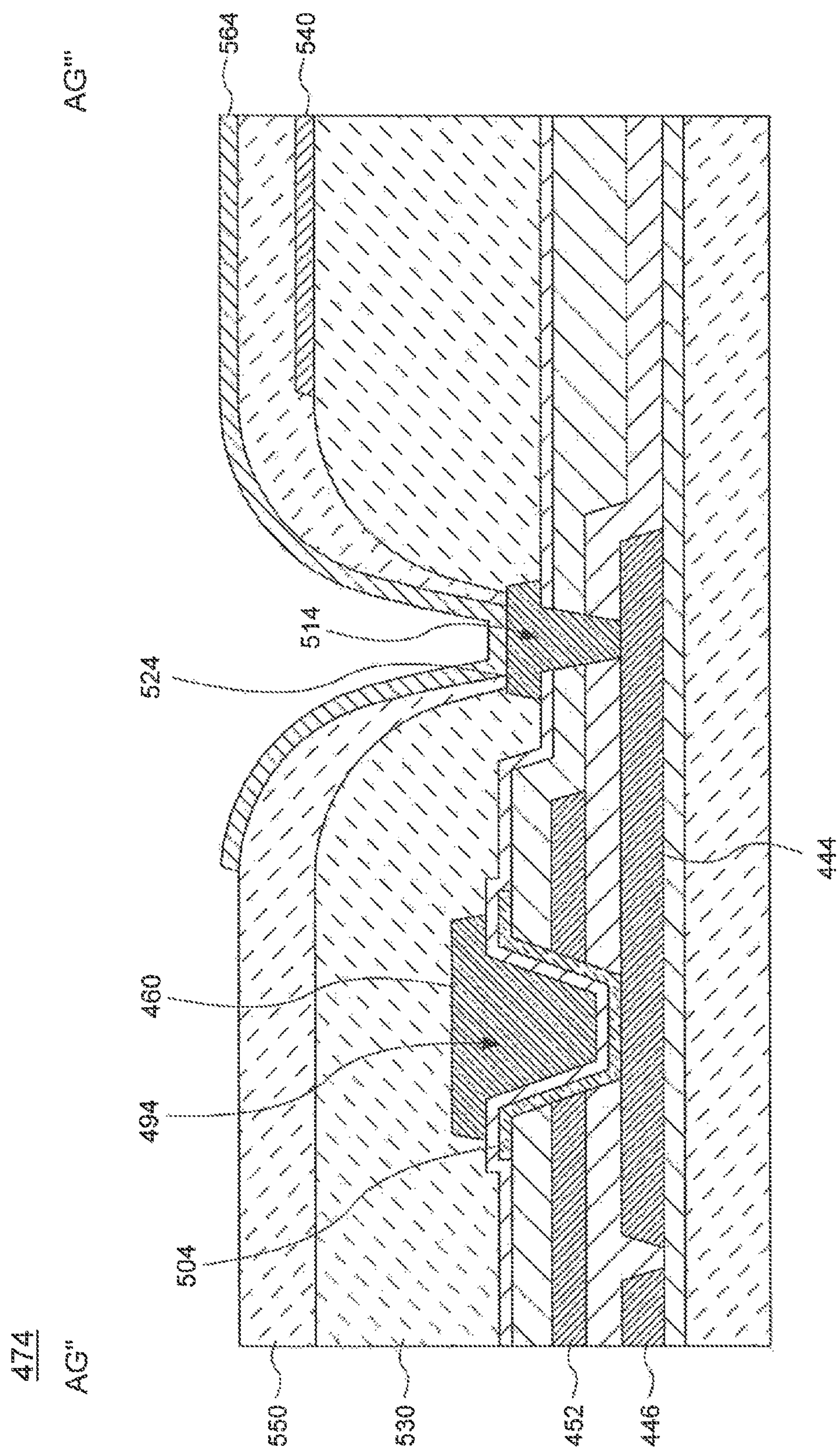
Figure 312:
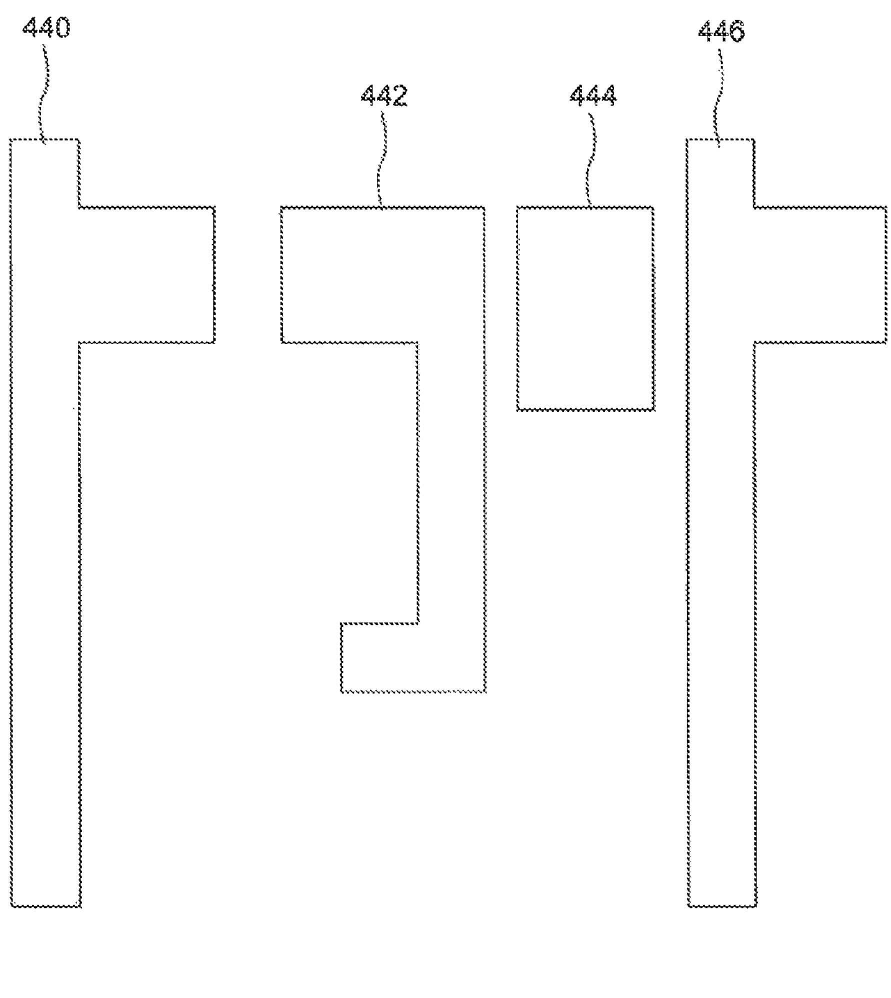
Figure 313:
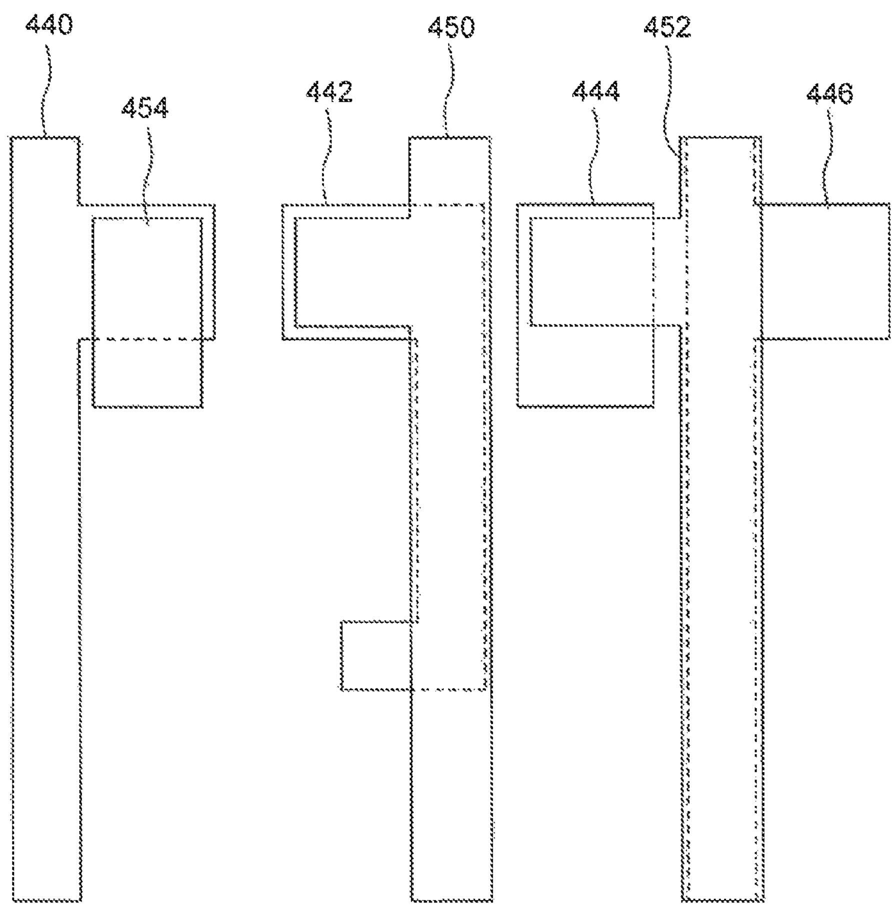
Figure 314:
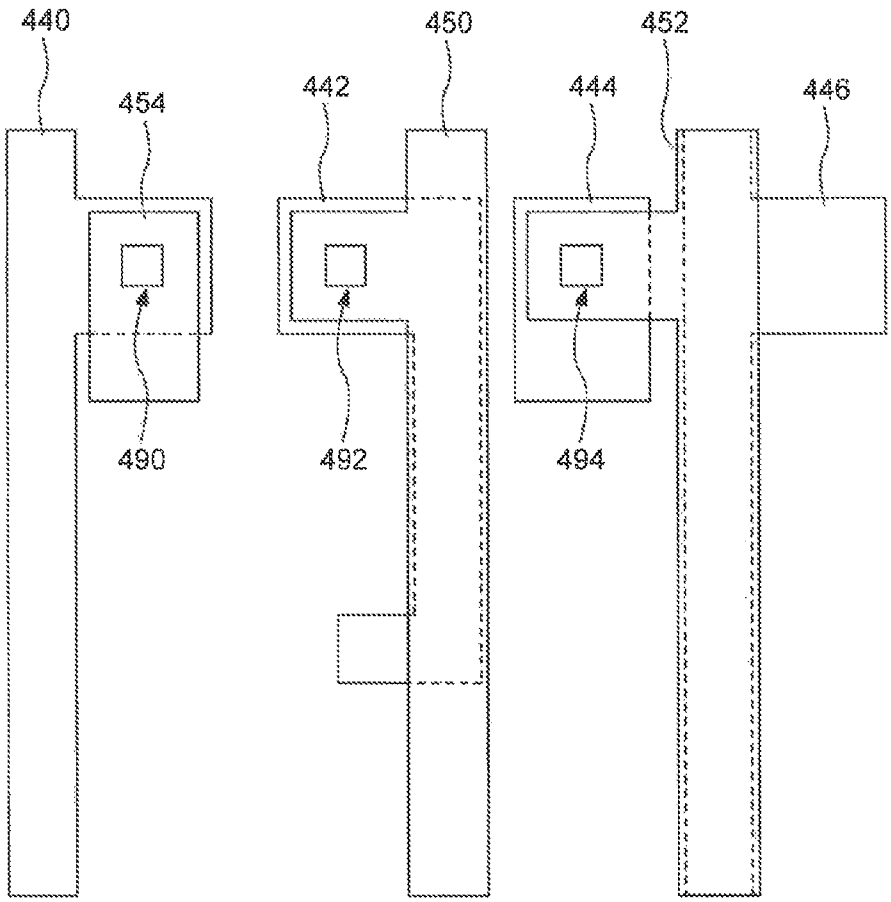
Figure 315:
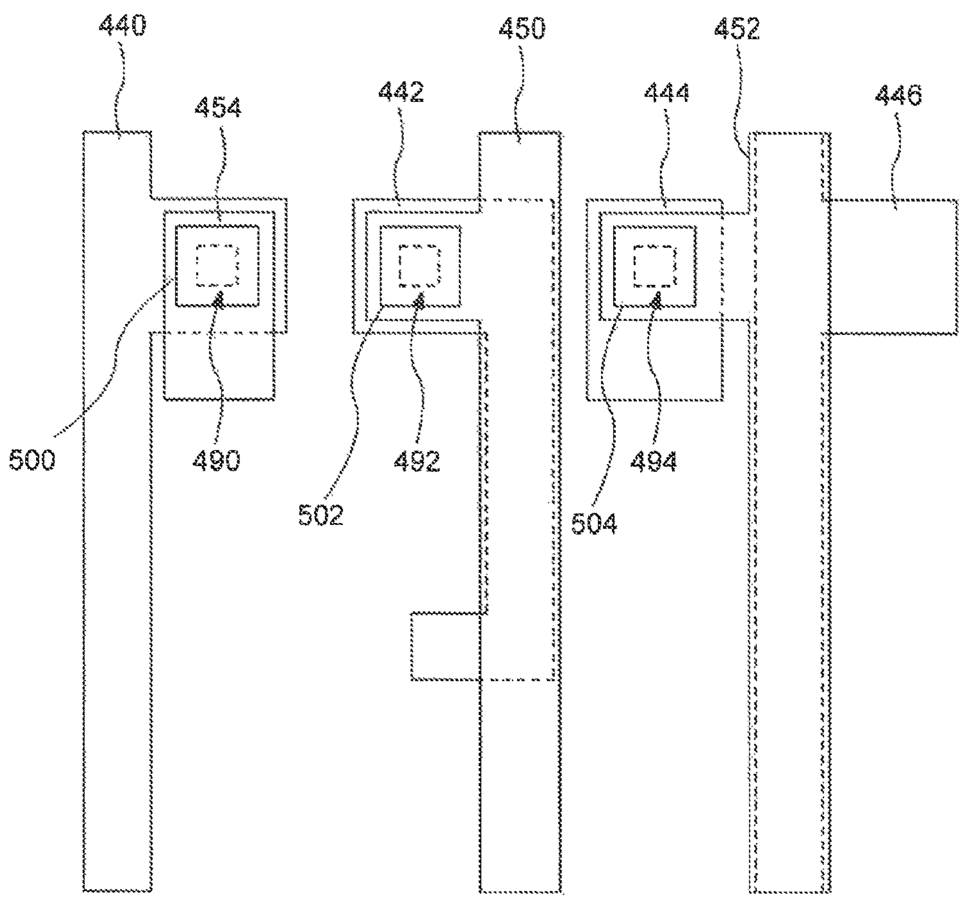
Figure 316:
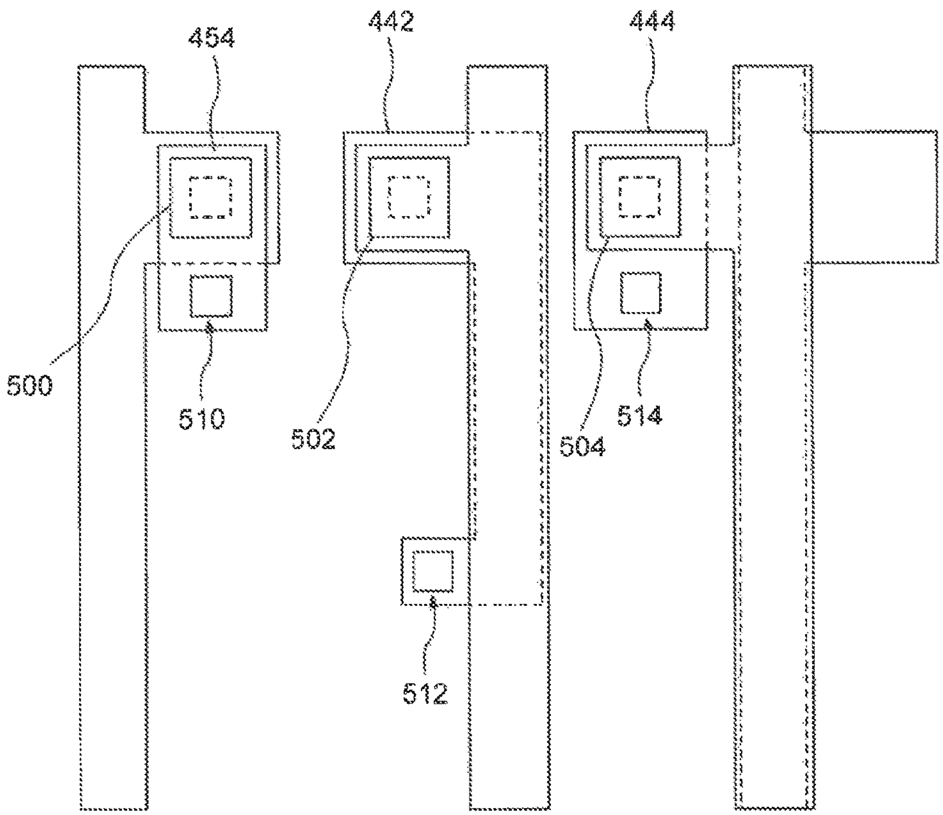
Figure 317:
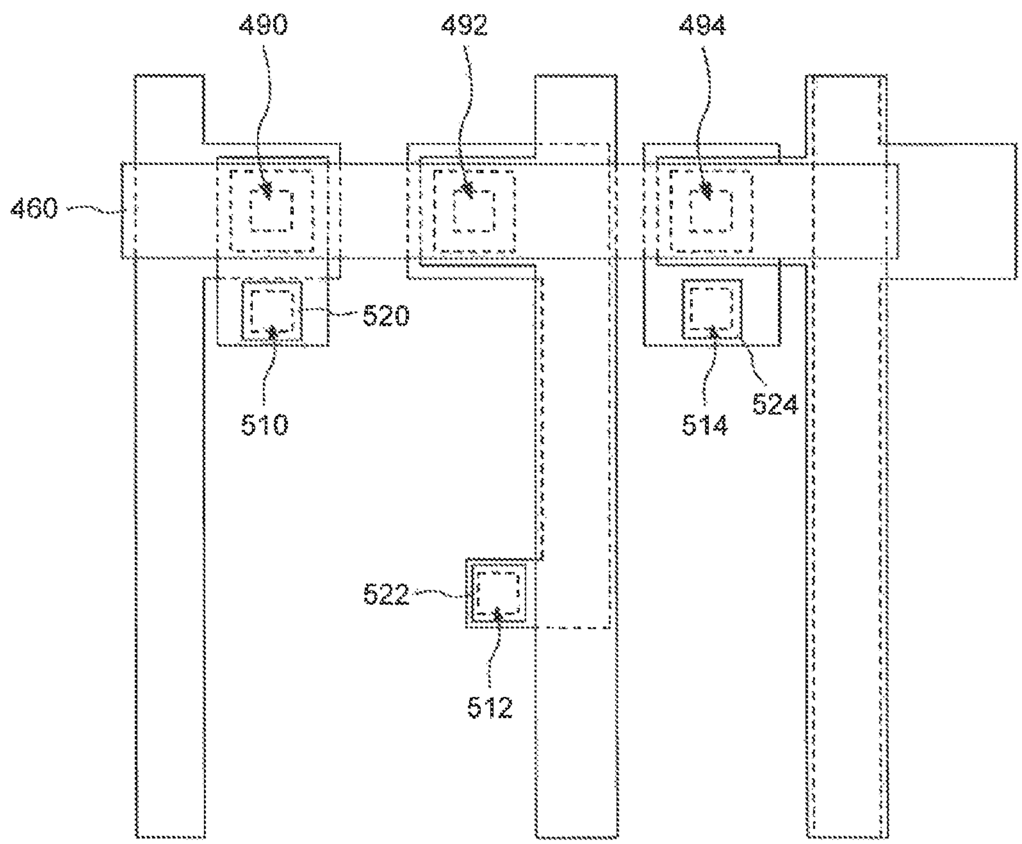

FIG. 132 is a plan view showing a step of forming an oxide semiconductor layer in the manufacturing method of the semiconductor device in the embodiment according to the present invention;

FIG. 133 is a cross-sectional view showing the step of forming the oxide semiconductor layer in the manufacturing method of the semiconductor device in the embodiment according to the present invention;

FIG. 134 is a plan view showing a step of forming openings exposing a lower electrode, an upper electrode and the like in the manufacturing method of the semiconductor device 10M in embodiment 13 according to the present invention;

FIG. 135 is a cross-sectional view showing the step of forming the openings exposing the lower electrode, the upper electrode and the like in the manufacturing method of the semiconductor device in the embodiment according to the present invention;

FIG. 136 is a plan view showing an overview of a semiconductor device in an embodiment according to the present invention;

FIG. 137 is a cross-sectional view showing the overview of the semiconductor device in the embodiment according to the present invention;

FIG. 138 is a plan view showing a step of forming a lower electrode in a manufacturing method of the semiconductor device in the embodiment according to the present invention;

FIG. 139 is a cross-sectional view showing the step of forming the lower electrode in the manufacturing method of the semiconductor device in the embodiment according to the present invention;

FIG. 140 is a plan view showing a step of forming an upper electrode in the manufacturing method of the semiconductor device in the embodiment according to the present invention;

FIG. 141 is a cross-sectional view showing the step of forming the upper electrode in the manufacturing method of the semiconductor device in the embodiment according to the present invention;

FIG. 142 is a plan view showing a step of forming an opening in the lower electrode, the upper electrode, insulating layers and an underlying insulating layer in the manufacturing method of the semiconductor device in the embodiment according to the present invention;

FIG. 143 is a cross-sectional view showing the step of forming the opening in the lower electrode, the upper electrode, the insulating layers and the underlying insulating layer in the manufacturing method of the semiconductor device in the embodiment according to the present invention;

FIG. 144 is a plan view showing a step of forming an oxide semiconductor layer in the manufacturing method of the semiconductor device in the embodiment according to the present invention;

FIG. 145 is a cross-sectional view showing the step of forming the oxide semiconductor layer in the manufacturing method of the semiconductor device in the embodiment according to the present invention;

FIG. 146 is a plan view showing a step of forming openings respectively reaching the lower electrode and the upper electrode in the manufacturing method of the semiconductor device in the embodiment according to the present invention;

FIG. 147 is a cross-sectional view showing the step of forming the openings respectively reaching the lower electrode and the upper electrode in the manufacturing method of the semiconductor device in the embodiment according to the present invention;

FIG. 148 is a plan view showing an overview of a semiconductor device in an embodiment according to the present invention;

FIG. 149 is a cross-sectional view showing the overview of the semiconductor device in the embodiment according to the present invention;

FIG. 150 is a plan view showing a step of forming a lower electrode and a contact pad in a manufacturing method of the semiconductor device in the embodiment according to the present invention;

FIG. 151 is a cross-sectional view showing the step of forming the lower electrode and the contact pad in the manufacturing method of the semiconductor device in the embodiment according to the present invention;

FIG. 152 is a plan view showing a step of forming an upper electrode in the manufacturing method of the semiconductor device in the embodiment according to the present invention;

FIG. 153 is a cross-sectional view showing the step of forming the upper electrode in the manufacturing method of the semiconductor device in the embodiment according to the present invention;

FIG. 154 is a plan view showing a step of forming openings in the lower electrode, the upper electrode, an insulating layer and an underlying insulating layer in the manufacturing method of the semiconductor device in the embodiment according to the present invention;

FIG. 155 is a cross-sectional view showing the step of forming the openings in the lower electrode, the upper electrode, the insulating layer and the underlying insulating layer in the manufacturing method of the semiconductor device in the embodiment according to the present invention;

FIG. 156 is a plan view showing a step of forming an oxide semiconductor layer in the manufacturing method of the semiconductor device in the embodiment according to the present invention;

FIG. 157 is a cross-sectional view showing the step of forming the oxide semiconductor layer in the manufacturing method of the semiconductor device in the embodiment according to the present invention;

FIG. 158 is a plan view showing a step of forming openings exposing the lower electrode, the upper electrode and the like in the manufacturing method of the semiconductor device in the embodiment according to the present invention;

FIG. 159 is a cross-sectional view showing the step of forming the openings exposing the lower electrode, the upper electrode and the like in the manufacturing method of the semiconductor device in the embodiment according to the present invention;

FIG. 160 is a plan view showing an overview of a semiconductor device in an embodiment according to the present invention;

FIG. 161 is a cross-sectional view showing the overview of the semiconductor device in the embodiment according to the present invention;

FIG. 162 is a plan view showing a step of forming a lower electrode, a back gate and a contact pad in a manufacturing method of the semiconductor device in the embodiment according to the present invention;

FIG. 163 is a cross-sectional view showing the step of forming the lower electrode, the back gate and the contact pad in the manufacturing method of the semiconductor device in the embodiment according to the present invention;

FIG. 164 is a plan view showing a step of forming an upper electrode in the manufacturing method of the semiconductor device in the embodiment according to the present invention;

FIG. 165 is a cross-sectional view showing the step of forming the upper electrode in the manufacturing method of the semiconductor device in the embodiment according to the present invention;

FIG. 166 is a plan view showing a step of forming openings in the lower electrode, the upper electrode, an insulating layer and an underlying insulating layer in the manufacturing method of the semiconductor device in the embodiment according to the present invention;

FIG. 167 is a cross-sectional view showing the step of forming the openings in the lower electrode, the upper electrode, the insulating layer and the underlying insulating layer in the manufacturing method of the semiconductor device in the embodiment according to the present invention;

FIG. 168 is a plan view showing a step of forming an oxide semiconductor layer in the manufacturing method of the semiconductor device in the embodiment according to the present invention;

FIG. 169 is a cross-sectional view showing the step of forming the oxide semiconductor layer in the manufacturing method of the semiconductor device in the embodiment according to the present invention;

FIG. 170 is a plan view showing a step of forming openings reaching the lower electrode, the upper electrode and the like in the manufacturing method of the semiconductor device in the embodiment according to the present invention;

FIG. 171 is a cross-sectional view showing the step of forming the openings reaching the lower electrode, the upper electrode and the like in the manufacturing method of the semiconductor device in the embodiment according to the present invention;

FIG. 172 is a plan view showing an overview of a semiconductor device in an embodiment according to the present invention;

FIG. 173 is a cross-sectional view showing the overview of the semiconductor device in the embodiment according to the present invention;

FIG. 174 is a plan view showing a step of forming a lower electrode, a back gate and a contact pad in a manufacturing method of the semiconductor device in the embodiment according to the present invention;

FIG. 175 is a cross-sectional view showing the step of forming the lower electrode, the back gate and the contact pad in the manufacturing method of the semiconductor device in the embodiment according to the present invention;

FIG. 176 is a plan view showing a step of forming an upper electrode in the manufacturing method of the semiconductor device in the embodiment according to the present invention;

FIG. 177 is a cross-sectional view showing the step of forming the upper electrode in the manufacturing method of the semiconductor device in the embodiment according to the present invention;

FIG. 178 is a plan view showing a step of forming openings in the lower electrode, the upper electrode, an insulating layer and an underlying insulating layer in the manufacturing method of the semiconductor device in the embodiment according to the present invention;

FIG. 179 is a cross-sectional view showing the step of forming the openings in the lower electrode, the upper electrode, the insulating layer and the underlying insulating layer in the manufacturing method of the semiconductor device in the embodiment according to the present invention;

FIG. 180 is a plan view showing a step of forming an oxide semiconductor layer in the manufacturing method of the semiconductor device in the embodiment according to the present invention;

FIG. 181 is a cross-sectional view showing the step of forming the oxide semiconductor layer in the manufacturing method of the semiconductor device in the embodiment according to the present invention;

FIG. 182 is a plan view showing a step of forming openings exposing the lower electrode, the upper electrode and the like in the manufacturing method of the semiconductor device in the embodiment according to the present invention;

FIG. 183 is a cross-sectional view showing the step of forming the openings exposing the lower electrode, the upper electrode and the like in the manufacturing method of the semiconductor device in the embodiment according to the present invention;

FIG. 184A is a cross-sectional view showing a structure of an opening in a semiconductor device in an embodiment according to the present invention;

FIG. 184B is a cross-sectional view showing a structure of an opening in a semiconductor device in a modification of the embodiment according to the present invention;

FIG. 185A is a plan view showing an overview of a semiconductor device in an embodiment according to the present invention;

FIG. 185B is a cross-sectional view showing the overview of the semiconductor device in the embodiment according to the present invention;

FIG. 186A is a plan view showing a step of forming a lower electrode in a manufacturing method of the semiconductor device in the embodiment according to the present invention;

FIG. 186B is a cross-sectional view showing the step of forming the lower electrode in the manufacturing method of the semiconductor device in the embodiment according to the present invention;

FIG. 187 is a plan view showing a step of forming an upper electrode in the manufacturing method of the semiconductor device in the embodiment according to the present invention;

FIG. 188 is a cross-sectional view showing the step of forming the upper electrode in the manufacturing method of the semiconductor device in the embodiment according to the present invention;

FIG. 189 is a plan view showing a step of forming an opening in an insulating layer and an underlying insulating layer in the manufacturing method of the semiconductor device in the embodiment according to the present invention;

FIG. 190 is a cross-sectional view showing the step of forming the opening in the insulating layer and the underlying insulating layer in the manufacturing method of the semiconductor device in the embodiment according to the present invention;

FIG. 191 is a plan view showing a step of forming an oxide semiconductor layer in the manufacturing method of the semiconductor device in the embodiment according to the present invention;

FIG. 192 is a cross-sectional view showing the step of forming the oxide semiconductor layer in the manufacturing method of the semiconductor device in the embodiment according to the present invention;

FIG. 193 is a plan view showing a step of forming openings respectively reaching the lower electrode and the upper electrode in the manufacturing method of the semiconductor device in the embodiment according to the present invention;

FIG. 194 is a cross-sectional view showing the step of forming the openings respectively reaching the lower electrode and the upper electrode in the manufacturing method of the semiconductor device in the embodiment according to the present invention;

FIG. 195 is a plan view showing an overview of a semiconductor device in an embodiment according to the present invention;

FIG. 196 is a cross-sectional view showing the overview of the semiconductor device in the embodiment according to the present invention;

FIG. 197 is a plan view showing a step of forming openings in an insulating layer and an underlying insulating layer in a manufacturing method of the semiconductor device in the embodiment according to the present invention;

FIG. 198 is a cross-sectional view showing the step of forming the openings in the insulating layer and the underlying insulating layer in the manufacturing method of the semiconductor device in the embodiment according to the present invention;

FIG. 199 is a plan view showing a step of forming an oxide semiconductor layer in the manufacturing method of the semiconductor device in the embodiment according to the present invention;

FIG. 200 is a cross-sectional view showing the step of forming the oxide semiconductor layer in the manufacturing method of the semiconductor device in the embodiment according to the present invention;

FIG. 201 is a plan view showing a step of forming openings exposing a lower electrode and an upper electrode in the manufacturing method of the semiconductor device in the embodiment according to the present invention;

FIG. 202 is a cross-sectional view showing the step of forming the openings exposing the lower electrode and the upper electrode in the manufacturing method of the semiconductor device in the embodiment according to the present invention;

FIG. 203 is a plan view showing an overview of a semiconductor device in an embodiment according to the present invention;

FIG. 204 is a cross-sectional view showing the overview of the semiconductor device in the embodiment according to the present invention;

FIG. 205 is a plan view showing a step of forming a lower electrode and a back gate in a manufacturing method of the semiconductor device in the embodiment according to the present invention;

FIG. 206 is a cross-sectional view showing the step of forming the lower electrode and the back gate in the manufacturing method of the semiconductor device in the embodiment according to the present invention;

FIG. 207 is a plan view showing a step of forming an upper electrode in the manufacturing method of the semiconductor device in the embodiment according to the present invention;

FIG. 208 is a cross-sectional view showing the step of forming the upper electrode in the manufacturing method of the semiconductor device in the embodiment according to the present invention;

FIG. 209 is a plan view showing a step of forming an opening in an insulating layer and an underlying insulating layer in the manufacturing method of the semiconductor device in the embodiment according to the present invention;

FIG. 210 is a cross-sectional view showing the step of forming the opening in the insulating layer and the underlying insulating layer in the manufacturing method of the semiconductor device in the embodiment according to the present invention;

FIG. 211 is a plan view showing a step of forming an oxide semiconductor layer in the manufacturing method of the semiconductor device in the embodiment according to the present invention;

FIG. 212 is a cross-sectional view showing the step of forming the oxide semiconductor layer in the manufacturing method of the semiconductor device in the embodiment according to the present invention;

FIG. 213 is a plan view showing a step of forming openings reaching the lower electrode, the upper electrode and the like in the manufacturing method of the semiconductor device in the embodiment according to the present invention;

FIG. 214 is a cross-sectional view showing the step of forming the openings reaching the lower electrode, the upper electrode and the like in the manufacturing method of the semiconductor device in the embodiment according to the present invention;

FIG. 215 is a plan view showing an overview of a semiconductor device in an embodiment according to the present invention;

FIG. 216 is a cross-sectional view showing the overview of the semiconductor device in the embodiment according to the present invention;

FIG. 217 is a plan view showing a step of forming openings in an insulating layer and an underlying insulating layer in the manufacturing method of the semiconductor device in the embodiment according to the present invention;

FIG. 218 is a cross-sectional view showing the step of forming the openings in the insulating layer and the underlying insulating layer in the manufacturing method of the semiconductor device in the embodiment according to the present invention;

FIG. 219 is a plan view showing a step of forming an oxide semiconductor layer in the manufacturing method of the semiconductor device in the embodiment according to the present invention;

FIG. 220 is a cross-sectional view showing the step of forming the oxide semiconductor layer in the manufacturing method of the semiconductor device in the embodiment according to the present invention;

FIG. 221 is a plan view showing a step of forming openings exposing a lower electrode, an upper electrode and the like in the manufacturing method of the semiconductor device in the embodiment according to the present invention;

FIG. 222 is a cross-sectional view showing the step of forming the openings exposing the lower electrode, the upper electrode and the like in the manufacturing method of the semiconductor device in the embodiment according to the present invention;

FIG. 223 is a plan view showing an overview of a semiconductor device in an embodiment according to the present invention;

FIG. 224 is a cross-sectional view showing the overview of the semiconductor device in the embodiment according to the present invention;

FIG. 225 is a plan view showing a step of forming a lower electrode in a manufacturing method of the semiconductor device in the embodiment according to the present invention;

FIG. 226 is a cross-sectional view showing the step of forming the lower electrode in the manufacturing method of the semiconductor device in the embodiment according to the present invention;

FIG. 227 is a plan view showing a step of forming an upper electrode in the manufacturing method of the semiconductor device in the embodiment according to the present invention;

FIG. 228 is a cross-sectional view showing the step of forming the upper electrode in the manufacturing method of the semiconductor device in the embodiment according to the present invention;

FIG. 229 is a plan view showing a step of forming an opening 139Y in the lower electrode, the upper electrode, insulating layers and an underlying insulating layer in the manufacturing method of the semiconductor device in the embodiment according to the present invention;

FIG. 230 is a cross-sectional view showing the step of forming the opening 139Y in the lower electrode, the upper electrode, the insulating layers and the underlying insulating layer in the manufacturing method of the semiconductor device in the embodiment according to the present invention;

FIG. 231 is a plan view showing a step of forming an oxide semiconductor layer in the manufacturing method of the semiconductor device in the embodiment according to the present invention;

FIG. 232 is a cross-sectional view showing the step of forming the oxide semiconductor layer in the manufacturing method of the semiconductor device in the embodiment according to the present invention;

FIG. 233 is a plan view showing a step of forming openings respectively reaching the lower electrode and the upper electrode in the manufacturing method of the semiconductor device in the embodiment according to the present invention;

FIG. 234 is a cross-sectional view showing the step of forming the openings respectively reaching the lower electrode and the upper electrode in the manufacturing method of the semiconductor device in the embodiment according to the present invention;

FIG. 235 is a plan view showing an overview of a semiconductor device in an embodiment according to the present invention;

FIG. 236 is a cross-sectional view showing the overview of the semiconductor device in the embodiment according to the present invention;

FIG. 237 is a plan view showing a step of forming a lower electrode and a contact pad in a manufacturing method of the semiconductor device in the embodiment according to the present invention;

FIG. 238 is a cross-sectional view showing the step of forming the lower electrode and the contact pad in the manufacturing method of the semiconductor device in the embodiment according to the present invention;

FIG. 239 is a plan view showing a step of forming an upper electrode in the manufacturing method of the semiconductor device in the embodiment according to the present invention;

FIG. 240 is a cross-sectional view showing the step of forming the upper electrode in the manufacturing method of the semiconductor device in the embodiment according to the present invention;

FIG. 241 is a plan view showing a step of forming openings in the lower electrode, the upper electrode, insulating layers, and an underlying insulating layer in the manufacturing method of the semiconductor device in the embodiment according to the present invention;

FIG. 242 is a cross-sectional view showing the step of forming the openings in the lower electrode, the upper electrode, the insulating layers, and the underlying insulating layer in the manufacturing method of the semiconductor device in the embodiment according to the present invention;

FIG. 243 is a plan view showing a step of forming an oxide semiconductor layer in the manufacturing method of the semiconductor device in the embodiment according to the present invention;

FIG. 244 is a cross-sectional view showing the step of forming the oxide semiconductor layer in the manufacturing method of the semiconductor device in the embodiment according to the present invention;

FIG. 245 is a plan view showing a step of forming openings exposing the lower electrode, the upper electrode and the like in the manufacturing method of the semiconductor device in the embodiment according to the present invention;

FIG. 246 is a cross-sectional view showing the step of forming the openings exposing the lower electrode, the upper electrode and the like in the manufacturing method of the semiconductor device in the embodiment according to the present invention;

FIG. 247 is a plan view showing an overview of a semiconductor device in an embodiment according to the present invention;

FIG. 248 is a cross-sectional view showing the overview of the semiconductor device in an embodiment according to the present invention;

FIG. 249 is a plan view showing a step of forming a lower electrode, a back gate and a contact pad in a manufacturing method of the semiconductor device in the embodiment according to the present invention;

FIG. 250 is a cross-sectional view showing the step of forming the lower electrode, the back gate and the contact pad in the manufacturing method of the semiconductor device in the embodiment according to the present invention;

FIG. 251 is a plan view showing a step of forming an upper electrode in the manufacturing method of the semiconductor device in the embodiment according to the present invention;

FIG. 252 is a cross-sectional view showing the step of forming the upper electrode in the manufacturing method of the semiconductor device in the embodiment according to the present invention;

FIG. 253 is a plan view showing a step of forming openings in the lower electrode, the upper electrode, insulating layers, and an underlying insulating layer in the manufacturing method of the semiconductor device in the embodiment according to the present invention;

FIG. 254 is a cross-sectional view showing the step of forming the openings in the lower electrode, the upper electrode, the insulating layers, and the underlying insulating layer in the manufacturing method of the semiconductor device in the embodiment according to the present invention;

FIG. 255 is a plan view showing a step of forming an oxide semiconductor layer in the manufacturing method of the semiconductor device in the embodiment according to the present invention;

FIG. 256 is a cross-sectional view showing the step of forming the oxide semiconductor layer in the manufacturing method of the semiconductor device in the embodiment according to the present invention;

FIG. 257 is a plan view showing a step of forming openings reaching the lower electrode, the upper electrode and the like in the manufacturing method of the semiconductor device in the embodiment according to the present invention;

FIG. 258 is a cross-sectional view showing the step of forming the openings reaching the lower electrode, the upper electrode and the like in the manufacturing method of the semiconductor device in the embodiment according to the present invention;

FIG. 259 is a plan view showing an overview of a semiconductor device in an embodiment according to the present invention;

FIG. 260 is a cross-sectional view showing the overview of the semiconductor device in the embodiment according to the present invention;

FIG. 261 is a plan view showing a step of forming a lower electrode, a back gate, a contact pad and an upper electrode in a manufacturing method of the semiconductor device in the embodiment according to the present invention;

FIG. 262 is a cross-sectional view showing the step of forming the lower electrode, the back gate, the contact pad and the upper electrode in the manufacturing method of the semiconductor device in the embodiment according to the present invention;

FIG. 263 is a plan view showing a step of forming openings in the lower electrode, the upper electrode, insulating layers, an underlying insulating layer and the like in the manufacturing method of the semiconductor device in the embodiment according to the present invention;

FIG. 264 is a cross-sectional view showing the step of forming the openings in the lower electrode, the upper electrode, the insulating layers, the underlying insulating layer and the like in the manufacturing method of the semiconductor device in the embodiment according to the present invention;

FIG. 265 is a plan view showing a step of forming an oxide semiconductor layer in the manufacturing method of the semiconductor device in the embodiment according to the present invention;

FIG. 266 is a cross-sectional view showing the step of forming the oxide semiconductor layer in the manufacturing method of the semiconductor device in the embodiment according to the present invention;

FIG. 267 is a plan view showing a step of forming openings exposing the lower electrode, the upper electrode and the like in the manufacturing method of the semiconductor device in the embodiment according to the present invention;

FIG. 268 is a cross-sectional view showing the step of forming the openings exposing the lower electrode, the upper electrode and the like in the manufacturing method of the semiconductor device in the embodiment according to the present invention;

FIG. 269 is a plan view showing an overview of a semiconductor device in an embodiment according to the present invention;

FIG. 270 is a cross-sectional view showing the overview of the semiconductor device in the embodiment according to the present invention;

FIG. 271 is a plan view showing a step of forming a lower electrode in a manufacturing method of the semiconductor device in the embodiment according to the present invention;

FIG. 272 is a cross-sectional view showing the step of forming the lower electrode in the manufacturing method of the semiconductor device in the embodiment according to the present invention;

FIG. 273 is a plan view showing a step of forming an upper electrode in the manufacturing method of the semiconductor device in the embodiment according to the present invention;

FIG. 274 is a cross-sectional view showing the step of forming the upper electrode in the manufacturing method of the semiconductor device in the embodiment according to the present invention;

FIG. 275 is a plan view showing a step of forming an opening in insulating layers and an underlying insulating layer in the manufacturing method of the semiconductor device in the embodiment according to the present invention;

FIG. 276 is a cross-sectional view showing the step of forming the opening in the insulating layers and the underlying insulating layer in the manufacturing method of the semiconductor device in the embodiment according to the present invention;

FIG. 277 is a plan view showing a step of forming an oxide semiconductor layer in the manufacturing method of the semiconductor device in the embodiment according to the present invention;

FIG. 278 is a cross-sectional view showing the step of forming the oxide semiconductor layer in the manufacturing method of the semiconductor device in the embodiment according to the present invention;

FIG. 279 is a plan view showing a step of forming openings respectively reaching the lower electrode and the upper electrode in the manufacturing method of the semiconductor device in the embodiment according to the present invention;

FIG. 280 is a cross-sectional view showing the step of forming the openings respectively reaching the lower electrode and the upper electrode in the manufacturing method of the semiconductor device in the embodiment according to the present invention;

FIG. 281 is a plan view showing an overview of a semiconductor device in an embodiment according to the present invention;

FIG. 282 is a cross-sectional view showing the overview of the semiconductor device in the embodiment according to the present invention;

FIG. 283 is a plan view showing a step of forming openings in insulating layers and an underlying insulating layer in a manufacturing method of the semiconductor device in the embodiment according to the present invention;

FIG. 284 is a cross-sectional view showing the step of forming the openings in the insulating layers and the underlying insulating layer in the manufacturing method of the semiconductor device in the embodiment according to the present invention;

FIG. 285 is a plan view showing a step of forming an oxide semiconductor layer in the manufacturing method of the semiconductor device in the embodiment according to the present invention;

FIG. 286 is a cross-sectional view showing the step of forming the oxide semiconductor layer in the manufacturing method of the semiconductor device in the embodiment according to the present invention;

FIG. 287 is a plan view showing a step of forming openings exposing a lower electrode and an upper electrode in the manufacturing method of the semiconductor device in the embodiment according to the present invention;

FIG. 288 is a cross-sectional view showing the step of forming the openings exposing the lower electrode and the upper electrode in the manufacturing method of the semiconductor device in the embodiment according to the present invention;

FIG. 289 is a plan view showing an overview of a semiconductor device in an embodiment according to the present invention;

FIG. 290 is a cross-sectional view showing the overview of the semiconductor device in the embodiment according to the present invention;

FIG. 291 is a plan view showing a step of forming a lower electrode and a back gate in a manufacturing method of the semiconductor device in the embodiment according to the present invention;

FIG. 292 is a cross-sectional view showing the step of forming the lower electrode and the back gate in the manufacturing method of the semiconductor device in the embodiment according to the present invention;

FIG. 293 is a plan view showing a step of forming an upper electrode in the manufacturing method of the semiconductor device in the embodiment according to the present invention;

FIG. 294 is a cross-sectional view showing the step of forming the upper electrode in the manufacturing method of the semiconductor device in the embodiment according to the present invention;

FIG. 295 is a plan view showing a step of forming openings in insulating layers and an underlying insulating layer in the manufacturing method of the semiconductor device in the embodiment according to the present invention;

FIG. 296 is a cross-sectional view showing the step of forming the openings in the insulating layers and the underlying insulating layer in the manufacturing method of the semiconductor device in the embodiment according to the present invention;

FIG. 297 is a plan view showing a step of forming an oxide semiconductor layer in the manufacturing method of the semiconductor device in the embodiment according to the present invention;

FIG. 298 is a cross-sectional view showing the step of forming the oxide semiconductor layer in the manufacturing method of the semiconductor device in the embodiment according to the present invention;

FIG. 299 is a plan view showing a step of forming openings exposing the lower electrode, the upper electrode and the like in the manufacturing method of the semiconductor device in the embodiment according to the present invention;

FIG. 300 is a cross-sectional view showing the step of forming the openings exposing the lower electrode, the upper electrode and the like in the manufacturing method of the semiconductor device in the embodiment according to the present invention;

FIG. 301 is a plan view showing an overview of a semiconductor device in an embodiment according to the present invention;

FIG. 302 is a cross-sectional view showing the overview of the semiconductor device in the embodiment according to the present invention;

FIG. 303 is a plan view showing a step of forming openings in insulating layers and an underlying insulating layer in the manufacturing method of the semiconductor device in the embodiment according to the present invention;

FIG. 304 is a cross-sectional view showing the step of forming the openings in the insulating layers and an underlying insulating layer in the manufacturing method of the semiconductor device in the embodiment according to the present invention;

FIG. 305 is a plan view showing a step of forming an oxide semiconductor layer in the manufacturing method of the semiconductor device in the embodiment according to the present invention;

FIG. 306 is a cross-sectional view showing the step of forming the oxide semiconductor layer in the manufacturing method of the semiconductor device in the embodiment according to the present invention;

FIG. 307 is a plan view showing a step of forming openings exposing a lower electrode, an upper electrode and the like in the manufacturing method of the semiconductor device in the embodiment according to the present invention;

FIG. 308 is a cross-sectional view showing the step of forming the openings exposing the lower electrode, the upper electrode and the like in the manufacturing method of the semiconductor device in the embodiment according to the present invention;

FIG. 309 is a plan view showing an overview of a display device in an embodiment according to the present invention;

FIG. 310 is a cross-sectional view taken along line AG-AG' in FIG. 309;

FIG. 311 is a cross-sectional view taken along line AG"-AG'" in FIG. 309;

FIG. 312 is a plan view showing a step of forming data lines and lines in a manufacturing method of the display device in the embodiment according to the present invention;

FIG. 313 is a plan view showing a step of forming data lines and a line in the manufacturing method of the display device in the embodiment according to the present invention;

FIG. 314 is a plan view showing a step of forming openings exposing the data lines and lines in the manufacturing method of the display device in the embodiment according to the present invention;

FIG. 315 is a plan view showing a step of forming oxide semiconductor layers in the openings in the manufacturing method of the display device in the embodiment according to the present invention;

FIG. 316 is a plan view showing a step of forming openings exposing the lines in the manufacturing method of the display device in the embodiment according to the present invention; and FIG. 317 is a plan view showing a step of forming pads in the manufacturing method of the display device in the embodiment according to the present invention.

DESCRIPTION OF EMBODIMENTS

Hereinafter, embodiments of the present invention will be described with reference to the drawings. The disclosure merely provides an example, and alternations and modifications easily conceivable by a person of ordinary skill in the art without departing from the gist of the present invention are duly encompassed in the scope of the present invention. In the drawings, components may be shown schematically regarding the width, thickness, shape and the like, instead of being shown in accordance with the actual sizes, for the sake of clear illustration. The drawings are merely examples and do not limit the interpretations of the present invention in any way. In the specification and the drawings, components that are substantially the same as those described previously or shown in a previous drawing(s) bear the identical reference signs thereto, and detailed descriptions thereof may be omitted. The following embodiments are presented for the purpose of providing a semiconductor device capable of increasing the on-current or providing a semiconductor device capable of suppressing the in-plane variance in the channel length.

In the description of each of the following embodiments, the expression "the first member and the second member are connected with each other" indicates that the first member and the second member are at least electrically connected with each other. Namely, the first member and the second member may be physically connected with each other, or alternatively, another member may be provided between the first member and the second member.

In each of the following embodiments, an overview of a semiconductor device will be described. A semiconductor device described in each of the following embodiments is usable for a display device such as a liquid crystal display device (LCD), a self-light emission display device using a self-light emission element such as an organic light-emitting diode (OLED), a quantum dot or the like for a display unit, or a reflection-type display device such as an electronic paper or the like.

It should be noted that a semiconductor device according to the present invention is not limited to being used in a display device, and may be used in, for example, an integrated circuit (IC) such as a microprocessing unit (MPU) or the like. The semiconductor device in each of the following embodiments is described as having a structure including a channel formed of an oxide semiconductor. A semiconductor device according to the present invention is not limited to having such a structure, and may include a channel formed of, for example, a semiconductor such as silicon or the like, a compound semiconductor such as Ga—As or the like, or an organic semiconductor such as pentacene, tetracyanoquinodimethane (TCNQ) or the like. In each of the following embodiments, the semiconductor device is a transistor. This does not limit the semiconductor device according to the present invention to a transistor.

Embodiment 1

With reference to FIG. 1 through FIG. 12, an overview of a semiconductor 10 in embodiment 1 according to the present invention will be described.

[Structure of the Semiconductor Device 10]

Figure 1:
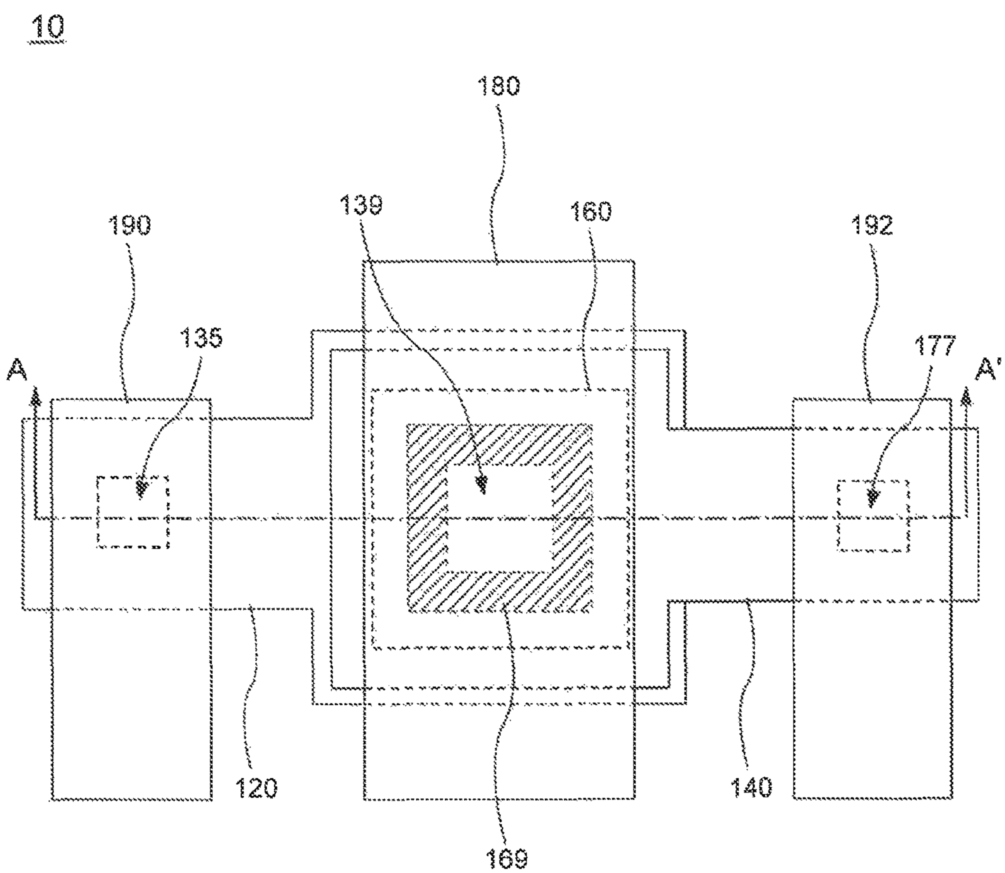
FIG. 1 is a plan view showing an overview of a semiconductor device in an embodiment according to the present invention.
Figure 2:
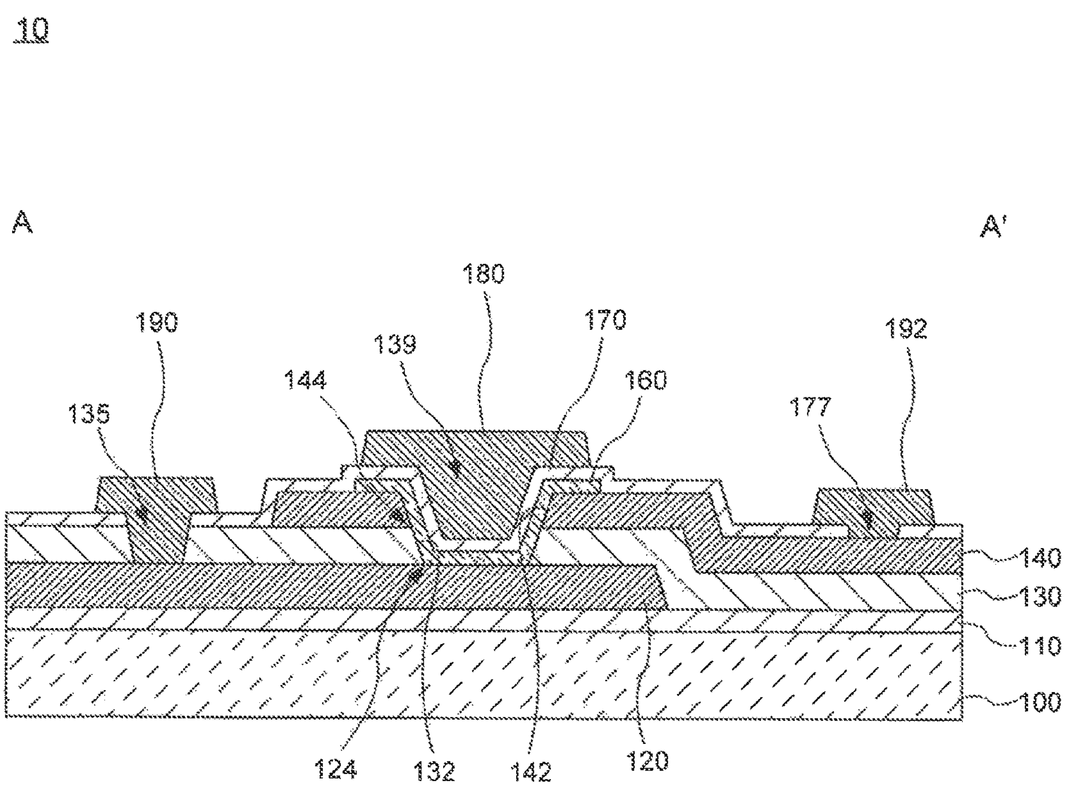
FIG. 2 is a cross-sectional view showing the overview of the semiconductor device in the embodiment according to the present invention.

FIG. 1 and FIG. 2 are respectively a plan view and a cross-sectional view showing an overview of the semiconductor device 10 in embodiment 1 according to the present invention. FIG. 2 is taken along line A-A' in FIG. 1. As shown in FIG. 1 and FIG. 2, the semiconductor device 10 includes a substrate 100, an underlying insulating layer 110, a lower electrode 120, an insulating layer 130, an upper electrode 140, an oxide semiconductor layer 160, a gate insulating layer 170, a gate electrode 180, a source line 190, and a drain line 192. An opening 139 is provided in the insulating layer 130 and the upper electrode 140, and reaches the lower electrode 120. An opening 135 is provided in the insulating layer 130 and the gate insulating layer 170, and reaches the lower electrode 120. An opening 177 is provided in the gate insulating layer 170, and reaches the upper electrode 140.

The underlying insulating layer 110 is located on the substrate 100. The lower electrode 120 is located on the underlying insulating layer 110. The insulating layer 130 is located on the lower electrode 120 and on the underlying insulating layer 110. The upper electrode 140 is located on the insulating layer 130. In the opening 139, the insulating layer 130 has an insulating layer side wall 132, and the upper electrode 140 has an electrode side wall 142. The oxide semiconductor layer 160 is located in the opening 139, and is connected with the lower electrode 120 and the upper electrode 140. In more detail, the oxide semiconductor layer 160 is located on the lower electrode 120, on the insulating layer side wall 132, and on the electrode side wall 142, and is connected with the lower electrode 120 at a top surface of the lower electrode 120 that is exposed to the opening 139 and is connected with the upper electrode 140 at the electrode side wall 142 in the opening 139 and at a top surface of the upper electrode 140. In FIG. 2, the oxide semiconductor layer 160 extends continuously from the electrode side wall 142 to the top surface of the upper electrode 140.

As shown in FIG. 1, the opening 139 is a quadrangular opening formed in the insulating layer 130. The insulating layer side wall 132 is included in an inner surface of the opening 139 and has a closed quadrangular shape along the shape of the opening 139. This shape of the insulating layer side wall 132 may be referred to as "annular" or "ring-shaped". Similar to the insulating layer side wall 132, the electrode side wall 142 also has a closed quadrangular shape along the shape of the opening 139. In the example shown in FIG. 1, the planar shape of the opening 139 is quadrangular. Alternatively, the planar shape of the opening 139 may be circular, elliptical, polygonal, curved, or of any of other various appropriate shapes.

The gate electrode 180 is located to face the oxide semiconductor layer 160. The gate insulating layer 170 is located between the oxide semiconductor layer 160 and the gate electrode 180. As described below in detail, in the semiconductor device 10, a portion of the oxide semiconductor layer 160 that is located on the insulating layer side wall 132 acts as a channel. Therefore, the gate electrode 180 is located to face at least the portion of the oxide semiconductor layer 160 that is located on the insulating layer side wall 132.

The source line 190 is connected with the lower electrode 120 via the opening 135. The drain line 192 is connected with the upper electrode 140 via the opening 177. The source line 190 and the drain line 192 may be replaced with each other. Namely, the line 190 may act as the drain line, whereas the line 192 may act as the source line.

[Shape of the Insulating Layer Side Wall 132 and the Electrode Side Wall 142]

Now, the shape of each of the insulating layer side wall 132 and the electrode side wall 142 will be described in detail. As shown in FIG. 2, the insulating layer side wall 132 and the electrode side wall 142 both have a tapered shape tending to open upward. Such a shape is referred to as being "forward-tapered". The tapered shape of the insulating layer side wall 132 and the tapered shape of the electrode side wall 142 are continuous with each other. It should be noted that the tapered shape of the insulating layer side wall 132 and the tapered shape of the electrode side wall 142 do not need to be continuous with each other. For example, the opening in the upper electrode 140 may have a diameter longer than the diameter of the opening in the insulating layer 130 such that a top surface of the insulating layer 130 is exposed from the upper electrode 140. The tapered insulating layer side wall 132 and the tapered electrode side wall 142 may have different tapering angles from each other.

In the example shown in FIG. 2, the forward-tapered insulating layer side wall 132 is linear as seen in a cross-sectional view. The insulating layer side wall 132 is not limited to having such a structure. The forward-tapered insulating layer side wall 132 may be, for example, curved as protruding outward or curved as protruding inward. Instead of being forward-tapered, the insulating layer side wall 132 may be vertical with respect to the top surface of the insulating layer 130, or may be reverse-tapered, namely, may incline while tending to open downward. The electrode side wall 142 may have substantially the same shape as described above. The insulating layer side wall 132 and the electrode side wall 142 may have the same shape as, or different shapes from, each other.

In the example shown in FIG. 2, the insulating layer 130 is formed of a single film. The insulating layer 130 is not limited to having such a structure, and may be formed of a stack including a plurality of films. In the case where the insulating layer 130 is formed of a stack of films, the tapering angle and the shape of the insulating layer side wall 132 may be different film by film. Alternatively, the insulating layer 130 may be formed of a stack of films of different properties (e.g., $SiN_x$ and $SiO_x$), so that different portions, along the insulating layer side wall 132, of the oxide semiconductor layer 160 have different properties. Namely, the semiconductor device 10 may have a channel formed of the portions of the oxide semiconductor layer 160 that are of different characteristics and are connected to each other in series.

[Materials of the Components of the Semiconductor Device 10]

The substrate 100 may be formed of glass. Alternatively, the substrate 100 may be formed of a light-transmissive insulating material such as quartz, sapphire, a resin or the like. In the case where the semiconductor device 10 is used in an integrated circuit, not in a display device, the substrate 100 may be formed of a light-blocking material, for example, a semiconductor such as silicon, silicon carbide, a compound semiconductor or the like, or a conductive material such as stainless steel or the like.

The underlying insulating layer 110 may be formed of a material that suppresses diffusion of impurities from the substrate 100 into the oxide semiconductor layer 160. For example, the underlying insulating layer 110 may be formed of silicon nitride ($SiN_x$), silicon nitride oxide ($SiN_xO_y$), silicon oxide ($SiO_x$), silicon oxide nitride ($SiO_xN_y$), aluminum nitride ($AlN_x$), aluminum nitride oxide ($AlN_xO_y$), aluminum oxide ($AlO_x$), aluminum oxide nitride ($AlO_xN_y$), or the like (x and y each represent an arbitrary value). Alternatively, the underlying insulating layer 110 may have a structure including a stack of films of such materials. In the case where the substrate 100 is formed of an insulating material, the underlying insulating layer 110 may be omitted.

$SiO_xN_y$ and $AlO_xN_y$ are respectively a silicon compound and an aluminum compound containing nitrogen (N) at a lower content than oxygen (O). $SiN_xO_y$ and $AlN_xO_y$ are respectively a silicon compound and an aluminum compound containing oxygen at a lower content than nitrogen.

The underlying insulating layer 110 described above may be formed of a PVD (Physical Vapor Deposition) method or a CVD (Chemical Vapor Deposition) method. Examples of the usable PVD method include sputtering, vacuum vapor deposition, electron beam vapor deposition, plating, molecular beam epitaxy, and the like. Examples of the usable CVD method include thermal CVD, plasma CVD, catalyst CVD (Cat (Catalytic)-CVD or hot-wire CVD), and the like. A method other than the above-listed vapor deposition methods may be used as long as the film thickness can be controlled by a nanometer order (range less than 1 μm).

Instead of the above-listed inorganic insulating materials, the underlying insulating layer 110 may be formed of a TEOS layer or an organic insulating material. The TEOS layer refers to a CVD layer formed of TEOS (Tetra Ethyl Ortho Silicate), and has an effect of alleviating the steps of, and thus flattening, a layer therebelow. Examples of the usable organic insulating material include a polyimide resin, an acrylic resin, an epoxy resin, a silicone resin, a fluorine resin, a siloxane resin, and the like. The underlying insulating layer 110 may be formed of a single film or a stack of films of such materials. For example, the underlying insulating layer 110 may include a stack of an inorganic insulating material and an organic insulating material.

The lower electrode 120 and the upper electrode 140 may each be formed of a common metal material or a common conductive semiconductor material. For example, the lower electrode 120 and the upper electrode 140 may each be formed of aluminum (Al), titanium (Ti), chromium (Cr), cobalt (Co), nickel (Ni), zinc (Zn), molybdenum (Mo), indium (In), tin (Sn), hafnium (Hf), tantalum (Ta), tungsten (W), platinum (Pt), bismuth (Bi), or the like. Alternatively, the lower electrode 120 and the upper electrode 140 may each be formed of an alloy of such materials or a nitride of such materials. Still alternatively, the lower electrode 120 and the upper electrode 140 may each be formed of a conductive oxide semiconductor such as ITO (indium tin oxide), IGO (indium gallium oxide), IZO (indium zinc oxide), GZO (zinc oxide containing gallium as a dopant), or the like. The lower electrode 120 and the upper electrode 140 may each have a structure including a stack of films of such materials.

Preferably, the material used for the lower electrode 120 is resistant to a heat treatment in a manufacturing process of a semiconductor device including a channel formed of an oxide semiconductor, and has a low contact resistance with the oxide semiconductor. As a material having a good electric contact with the oxide semiconductor layer 160, a metal material having a work function smaller than that of the oxide semiconductor layer 160 is usable.

Like the underlying insulating layer 110, the insulating layer 130 may be formed of an inorganic insulating material such as $SiO_x$, $SiN_x$, $SiO_xN_y$, $SiN_xO_y$, $AlO_x$, $AlN_x$, $AlO_xN_y$, $AlN_xO_y$, TEOS or the like, or an organic insulating material such as a polyimide resin, an acrylic resin, an epoxy resin, a silicone resin, a fluorine resin, a siloxane resin, or the like. The insulating layer 130 may be formed by substantially the same method as that of the underlying insulating layer 110. The insulating layer 130 and the underlying insulating layer 110 may be formed of the same material as, or different materials from, each other.

The oxide semiconductor layer 160 may be formed of a metal oxide material having the characteristics of a semiconductor. For example, the oxide semiconductor layer 160 may be formed of an oxide semiconductor containing indium (In), gallium (Ga), Zinc (Zn) and oxygen (O). Especially, the oxide semiconductor layer 160 may be formed of an oxide semiconductor having a composition ratio of In:Ga:Zn:0=1:1:1:4. It should be noted that the oxide semiconductor containing In, Ga, Zn and O and used in the present invention is not limited to having the above-described composition ratio. An oxide semiconductor having a different composition ratio is also usable. For example, in order to improve the mobility, the ratio of In may be increased. In order to increase the bandgap and thus decrease the influence of light, the ratio of Ga may be increased.

The oxide semiconductor containing In, Ga, Zn and O may contain another element added thereto. For example, a metal element such as Al, Sn or the like may be added. Instead of the above-described oxide semiconductor, zinc oxide (ZnO), nickel oxide (NiO), tin oxide ($SnO_2$), titanium oxide ($TiO_2$), vanadium oxide ($VO_2$), indium oxide ($In_2O_3$), strontium titanate ($SrTiO_3$), or the like may be used for the oxide semiconductor layer 160. The oxide semiconductor layer 160 may be amorphous or crystalline. Alternatively, the oxide semiconductor layer 160 may have a mixed phase of an amorphous phase and a crystalline phase.

Like the underlying insulating layer 110 and the insulating layer 130, the gate insulating layer 170 may be formed of an inorganic insulating material such as $SiO_x$, $SiN_x$, $SiO_xN_y$, $SiN_xO_y$, $AlO_x$, $AlN_x$, $AlO_xN_y$, $AlN_xO_y$, TEOS or the like. The gate insulating layer 170 may be formed by substantially the same method as that of the underlying insulating layer 110. The gate insulating layer 170 may have a structure including a stack of films of such materials. The gate insulating layer 170 may be formed of the same material as, or a different material from, that of the underlying insulating layer 110 or the insulating layer 130.

The gate electrode 180 may be formed of substantially the same material as that of the lower electrode 120. The gate electrode 180 may be formed of the same material as, or a different material from, that of the lower electrode 120. Preferably, the material used for the gate electrode 180 is resistant to a heat treatment in a manufacturing process of a semiconductor device including a channel formed of an oxide semiconductor, and has a work function with which the transistor is of an enhancement type, which is turned off when a voltage applied to the gate electrode 180 is 0 V.

The source line 190 and the drain line 192 form the same layer with the gate electrode 180. Namely, the source line 190 and the drain line 192 are formed of the same material as that of the gate electrode 180, and are located on the same insulating layer as that on which the gate electrode 180 is located. It should be noted that the source line 190 and the drain line 192 may form a layer different from that of the gate electrode 180. In this case, the source line 190 and the drain line 192 may be formed of copper (Cu), silver (Ag), gold (Au) or the like instead of any of the materials listed above regarding the lower electrode 120 and the upper electrode 140. Especially in the case where Cu is used for the source line 190 and the drain line 192, the source line 190 and the drain line 192 may be formed of a stack of Cu and a barrier layer such as Ti, TiN or the like, which suppresses diffusion of Cu caused by heat.

Preferably, the material used for the source line 190 and the drain line 192 is resistant to a heat treatment in a manufacturing process of a semiconductor device including a channel formed of an oxide semiconductor, and has a low contact resistance with the lower electrode 120 and the upper electrode 140.

[Operation of the Semiconductor Device 10]

An operation of the semiconductor device 10 shown in FIG. 1 and FIG. 2 will be described. The semiconductor device 10 is a transistor including a channel formed of the oxide semiconductor layer 160. In the semiconductor device 10, the lower electrode 120 acting as a source electrode and the upper electrode 140 acting as a drain electrode form different layers from each other. The lower electrode 120 is connected with the source line 190, which forms the same layer with the gate electrode 180, and the upper electrode 140 is connected with the drain line 192, which forms the same layer with the gate electrode 180. Namely, the conductive layers at different levels are connected with each other via the oxide semiconductor layer 160.

The semiconductor device 10 is operated as follows. A gate voltage is applied to the gate electrode 180, a source voltage is applied to the source line 190 connected with the lower electrode 120, and a drain voltage is applied to the drain line 192 connected with the upper electrode 140. It should be noted that the source voltage and the drain voltage may be applied oppositely.

When the gate voltage is applied to the gate electrode 180, an electric field in accordance with the gate voltage is formed, via the gate insulating layer 170, in the portion of the oxide semiconductor layer 160 that faces the gate electrode 180. The electric field generates carriers in the oxide semiconductor layer 160. When a potential difference is caused between the lower electrode 120 and the upper electrode 140 in the state where the carriers are generated in the oxide semiconductor layer 160 as described above, the carriers generated in the oxide semiconductor layer 160 are moved in accordance with the potential difference. Namely, electrons are moved from the lower electrode 120 to the upper electrode 140.

The electrons are supplied from the lower electrode 120 to the oxide semiconductor layer 160 in a source region 124 and are transferred from the oxide semiconductor layer 160 to the upper electrode 140 in a drain region 144. Namely, in the semiconductor device 10, the portion of the oxide semiconductor layer 160 that is located on the insulating layer side wall 132 acts as a channel. Therefore, the channel length of the semiconductor device 10 is determined by the thickness of the insulating layer 130 and the tapering angle of the insulating layer side wall 132.

Referring to FIG. 1, a channel region 169 in the oxide semiconductor layer 160 acts as the channel. The channel region 169 has a closed quadrangular shape like the planar shape of the side wall of the opening 139. The channel region 169 having such a closed shape is referred to as being of a "surround type". An end of the "oxide semiconductor layer 160 may possibly have properties thereof changed during etching performed to form the oxide semiconductor layer 160. The region having the properties thereof changed may cause a leak path, by which a current flows even if the semiconductor device 10 is turned off. In the case where the channel region 169 is of the surround type, the channel region 169 does not include the end of the oxide semiconductor layer 160. Namely, the structure in which the channel region 169 is of the "surround type" suppresses the leak path in the semiconductor device 10.

As described above, the semiconductor device 10 in embodiment 1 according to the present invention has the channel length thereof controlled by controlling the thickness of the insulating layer 130, the tapering angle of the insulating layer side wall 132, or both of the thickness of the insulating layer 130 and the tapering angle of the insulating layer side wall 132. The thickness of the insulating layer 130 formed by the PVD method or the CVD method as described above is controllable by a nanometer order. Therefore, the channel length of the semiconductor device 10 is controllable by a nanometer order. Thus, the semiconductor device 10 has a channel length shorter than the limit of patterning by photolithography, by which variance is of a micrometer order. As a result, the semiconductor device 10 increases the on-current thereof.

As described above, the thickness of the insulating layer 130 is controllable by a nanometer order. Therefore, the in-plane variance in the thickness of the insulating layer 130 is also controllable by a nanometer order. The tapering angle of the insulating layer 130 is controlled by the etching rate on the insulating layer 130 and the retraction amount of a resist used to form the insulating layer 130 (the "retraction amount of a resist" will be described below). The variance in the etching rate and the retraction amount of the resist are also controllable by substantially the same order as the variance in the thickness of the insulating layer 130. As a result, the in-plane variance in the channel length of the semiconductor device 10 is suppressed.

In the semiconductor device 10, the channel region of the oxide semiconductor layer 160 is covered with the gate electrode 180 on the upper side and is covered with the lower electrode 120 on the lower side. Therefore, the gate electrode 180 and the lower electrode 120 may be formed of a light-blocking metal material, so that the oxide semiconductor layer 160 is suppressed from being irradiated with external light. As a result, the semiconductor device 10 has the characteristics thereof fluctuate little even in an environment in which the semiconductor device 10 is irradiated with light.

[Manufacturing Method of the Semiconductor Device 10]

With reference to plan views and cross-sectional views provided in FIG. 3 through FIG. 12, a manufacturing method of the semiconductor device 10 in embodiment 1 according to the present invention will be described.

Figure 3:
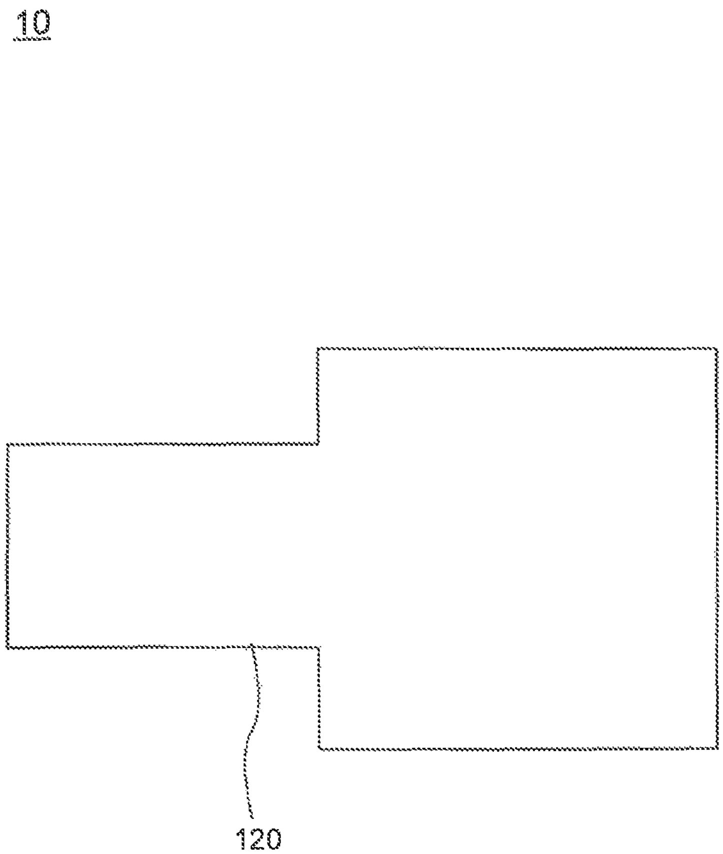
FIG. 3 is a plan view showing a step of forming a lower electrode in a manufacturing method of the semiconductor device in the embodiment according to the present invention.
Figure 4:
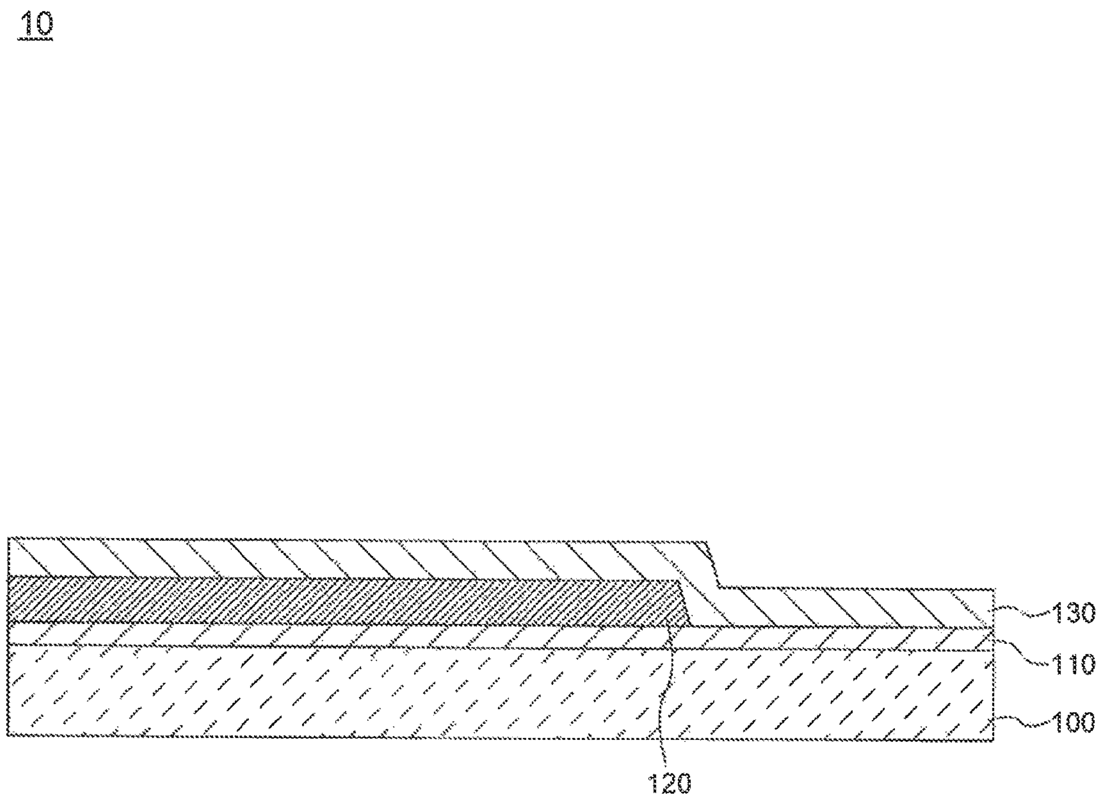
FIG. 4 is a cross-sectional view showing the step of forming the lower electrode in the manufacturing method of the semiconductor device in the embodiment according to the present invention.

FIG. 3 and FIG. 4 are respectively a plan view and a cross-sectional view showing a step of forming the lower electrode 120 in the manufacturing method of the semiconductor device 10 in embodiment 1 according to the present invention. Referring to FIG. 4, the underlying insulating layer 110 and a conductive film for the lower electrode 120 are formed on the substrate 100, and patterning is performed as shown in FIG. 3 by photolithography and etching to form the lower electrode 120. Preferably, the etching for forming the lower electrode 120 is performed under the condition that the etching rate ratio of the lower electrode 120 with respect to the underlying insulating layer 110 is high. On the lower electrode 120 formed as a result of the patterning, the insulating layer 130 is formed. In this and the following descriptions of manufacturing methods of semiconductor devices in embodiments according to the present invention, an assembly of the substrate 100 and the film(s) formed thereon at each step will be referred to as the "substrate" for the sake of convenience.

Figure 5:
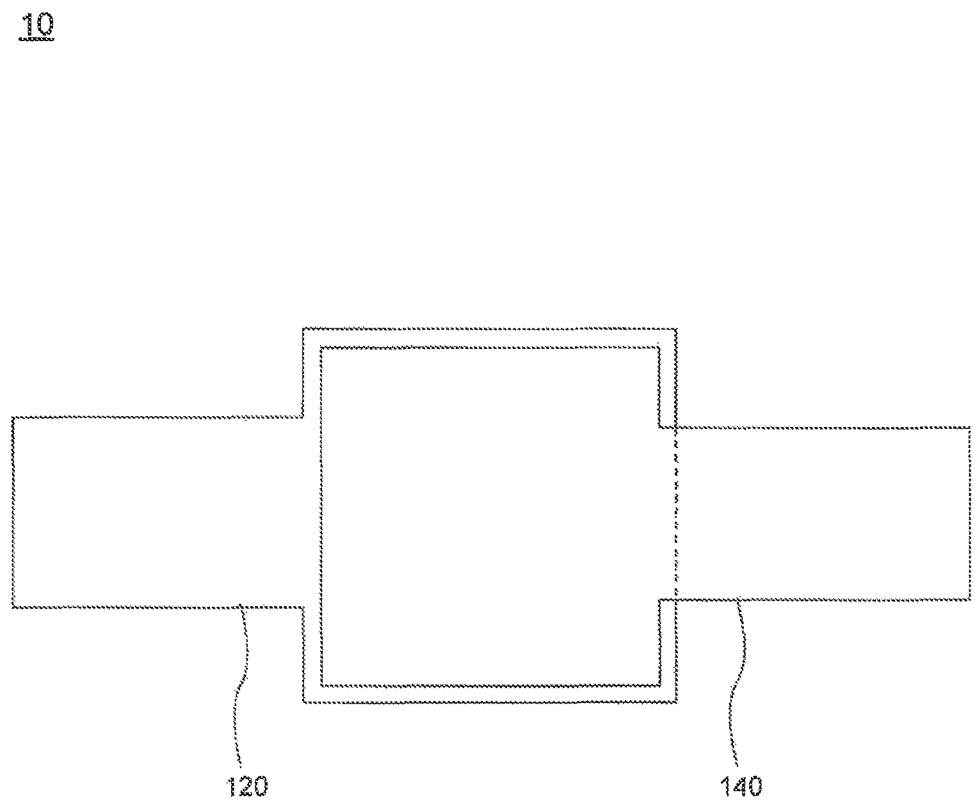
FIG. 5 is a plan view showing a step of forming an upper electrode in the manufacturing method of the semiconductor device in the embodiment according to the present invention.
Figure 6:
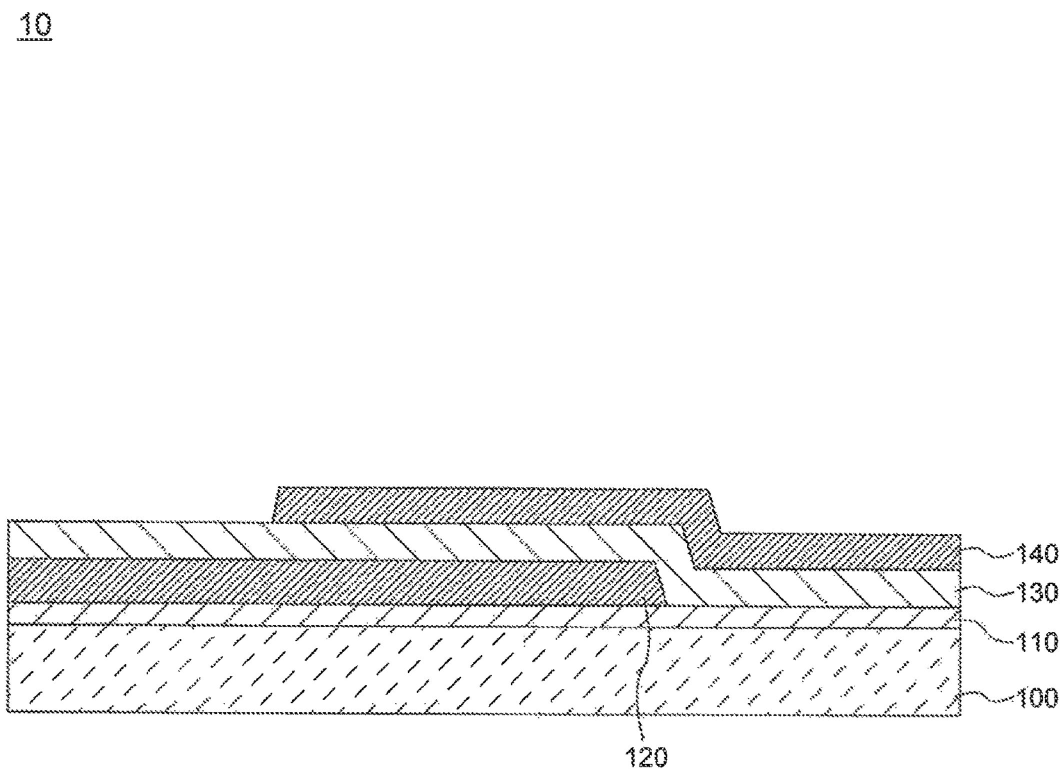
FIG. 6 is a cross-sectional view showing the step of forming the upper electrode in the manufacturing method of the semiconductor device in the embodiment according to the present invention.

FIG. 5 and FIG. 6 are respectively a plan view and a cross-sectional view showing a step of forming the upper electrode 140 in the manufacturing method of the semiconductor device 10 in embodiment 1 according to the present invention. Referring to FIG. 6, a conductive film for the upper electrode 140 is formed on the entirety of the substrate shown in FIG. 4, and patterning is performed as shown in FIG. 5 by photolithography and etching to form the upper electrode 140. Preferably, the etching for forming the upper electrode 140 is performed under the condition that the etching rate ratio of the upper electrode 140 with respect to the insulating layer 130 is high.

Figure 7:
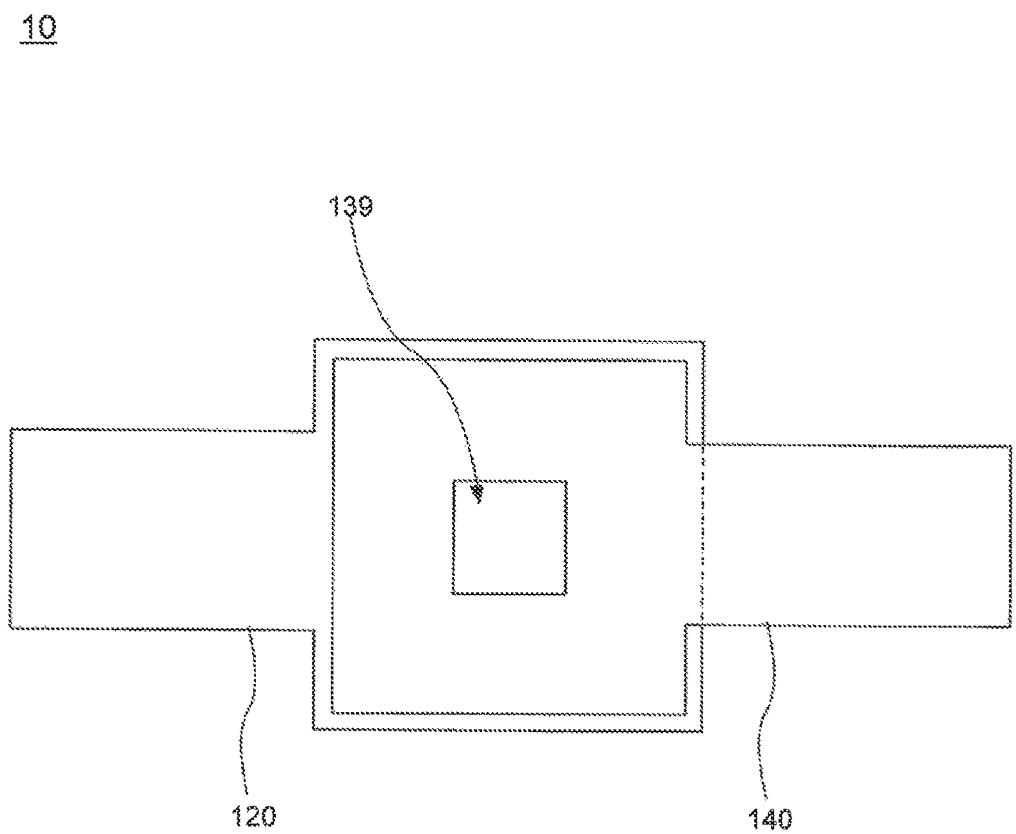
FIG. 7 is a plan view showing a step of forming an opening in the upper electrode and an insulating layer in the manufacturing method of the semiconductor device in the embodiment according to the present invention.
Figure 8:
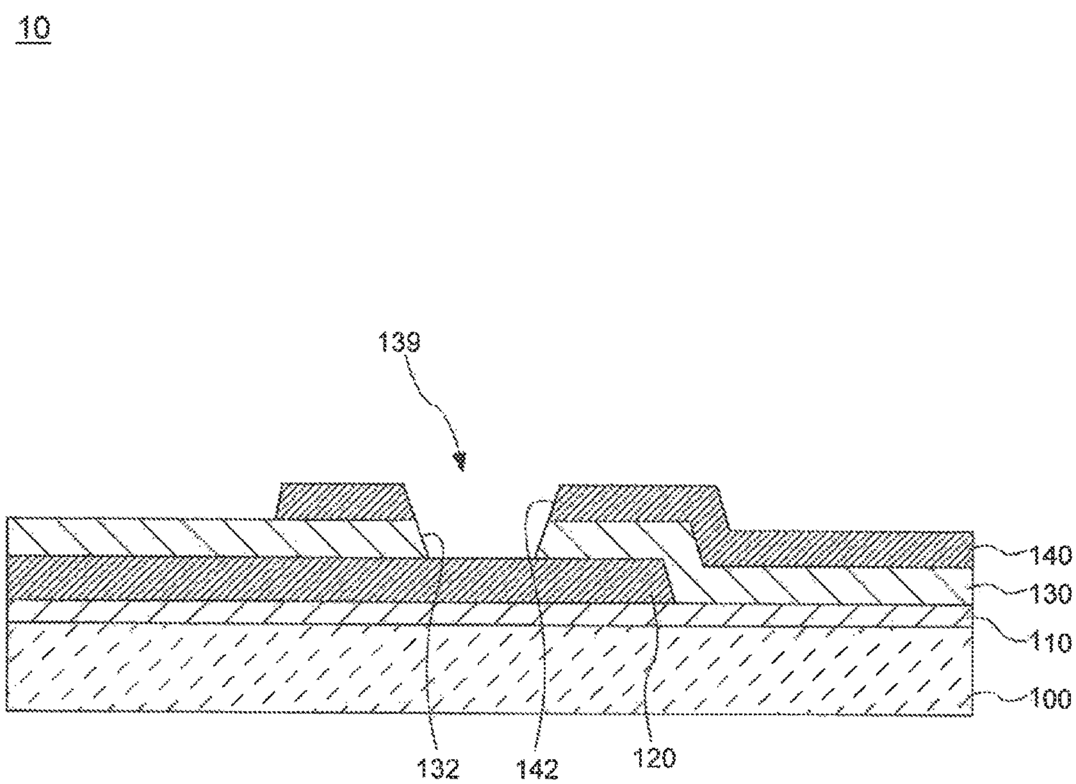
FIG. 8 is a cross-sectional view showing the step of forming the opening in the upper electrode and the insulating layer in the manufacturing method of the semiconductor device in the embodiment according to the present invention.

FIG. 7 and FIG. 8 are respectively a plan view and a cross-sectional view showing a step of forming the opening 139 in the upper electrode 140 and the insulating layer 130 in the manufacturing method of the semiconductor device 10 in embodiment 1 according to the present invention. Referring to FIG. 8, the substrate shown in FIG. 6 is subjected to photolithography and etching to form the opening 139 having the pattern shown in FIG. 7 in the upper electrode 140 and the insulating layer 130 to expose the lower electrode 120. As a result of the formation of the opening 139, the insulating layer side wall 132 of the insulating layer 130 and the electrode side wall 142 of the upper electrode 140 are formed. The etching conditions on the insulating layer 130 and the etching conditions on the upper electrode 140 may be the same, so that the opening 139 is formed in the insulating layer 130 and the upper electrode 140 at the same time. Alternatively, the etching conditions on the insulating layer 130 and the etching conditions on the upper electrode 140 may be different from each other. In the example shown in FIG. 7, the opening 139 is quadrangular. The opening 139 is not limited to having such a shape, and may be, for example, circular, elliptical, polygonal, curved, or of any of other various appropriate shapes.

Now, an etching method for forming the insulating layer side wall 132 to be tapered will be described. The tapering angle of the insulating layer side wall 132 may be controlled by the etching rate on the insulating layer 130 and the etching rate, in a horizontal direction, on a resist used as a mask for etching the insulating layer 130 (hereinafter, such an etching rate in the horizontal direction will be referred to as the "retraction amount of the resist"). In the case where, for example, the retraction amount of the resist is smaller than the etching rate on the insulating layer 130, the tapering angle of the insulating layer side wall 132 is large (close to vertical). In the case where the retraction amount of the resist is zero, the insulating layer side wall 132 is vertical. By contrast, in the case where the retraction amount of the resist is larger than the etching rate on the insulating layer 130, the tapering angle of the insulating layer side wall 132 is small (close to horizontal). The retraction amount of the resist may be adjusted by the tapering angle of an end of the resist and the etching rate on the resist. The tapered shape of the electrode side wall 142 is controllable by substantially the same method.

Figure 9:
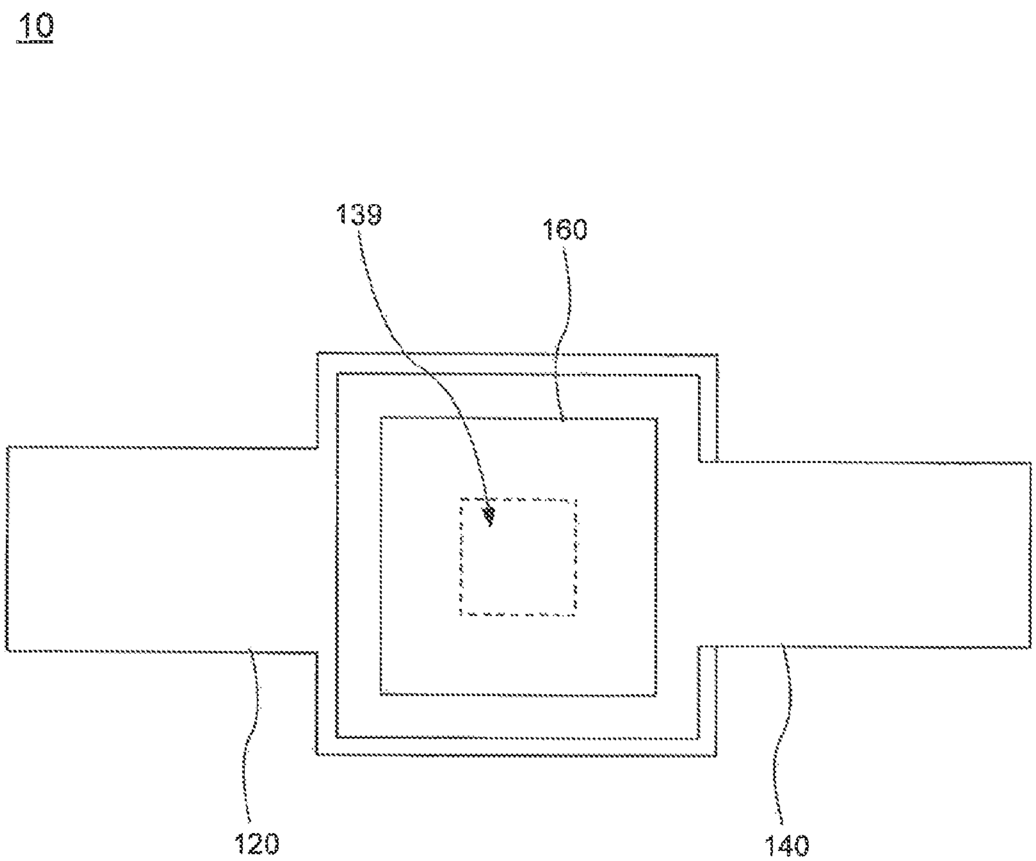
FIG. 9 is a plan view showing a step of forming an oxide semiconductor layer in the manufacturing method of the semiconductor device in the embodiment according to the present invention.
Figure 10:
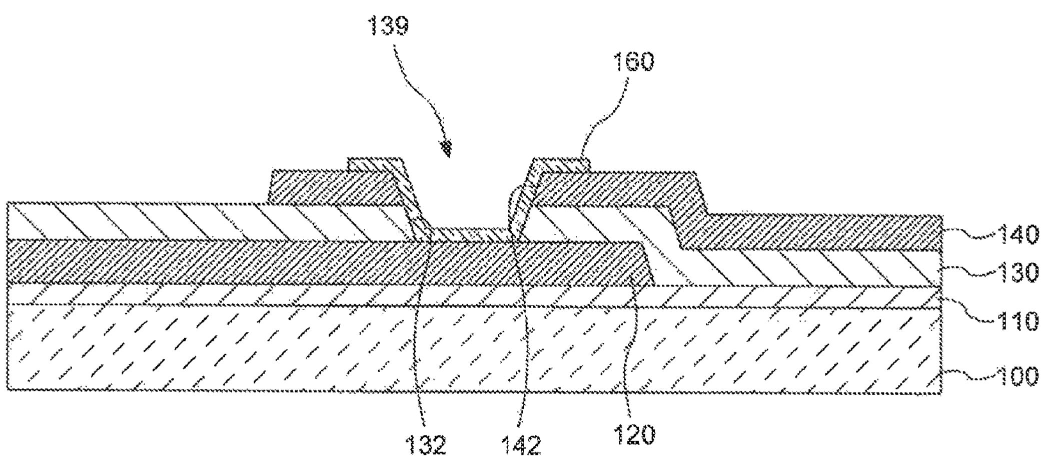
FIG. 10 is a cross-sectional view showing the step of forming the oxide semiconductor layer in the manufacturing method of the semiconductor device in the embodiment according to the present invention.

FIG. 9 and FIG. 10 are respectively a plan view and a cross-sectional view showing a step of forming the oxide semiconductor layer 160 in the manufacturing method of the semiconductor device 10 in embodiment 1 according to the present invention. Referring to FIG. 10, a film for the oxide semiconductor layer 160 is formed on the entirety of the substrate shown in FIG. 8, and patterning is performed as shown in FIG. 9 by photolithography and etching to form the oxide semiconductor layer 160.

The oxide semiconductor layer 160 may be formed by sputtering. The etching performed to form the oxide semiconductor layer 160 may be dry etching or wet etching. In the case where the oxide semiconductor layer 160 is formed by wet etching, an etchant containing oxalic acid may be used.

Figure 11:
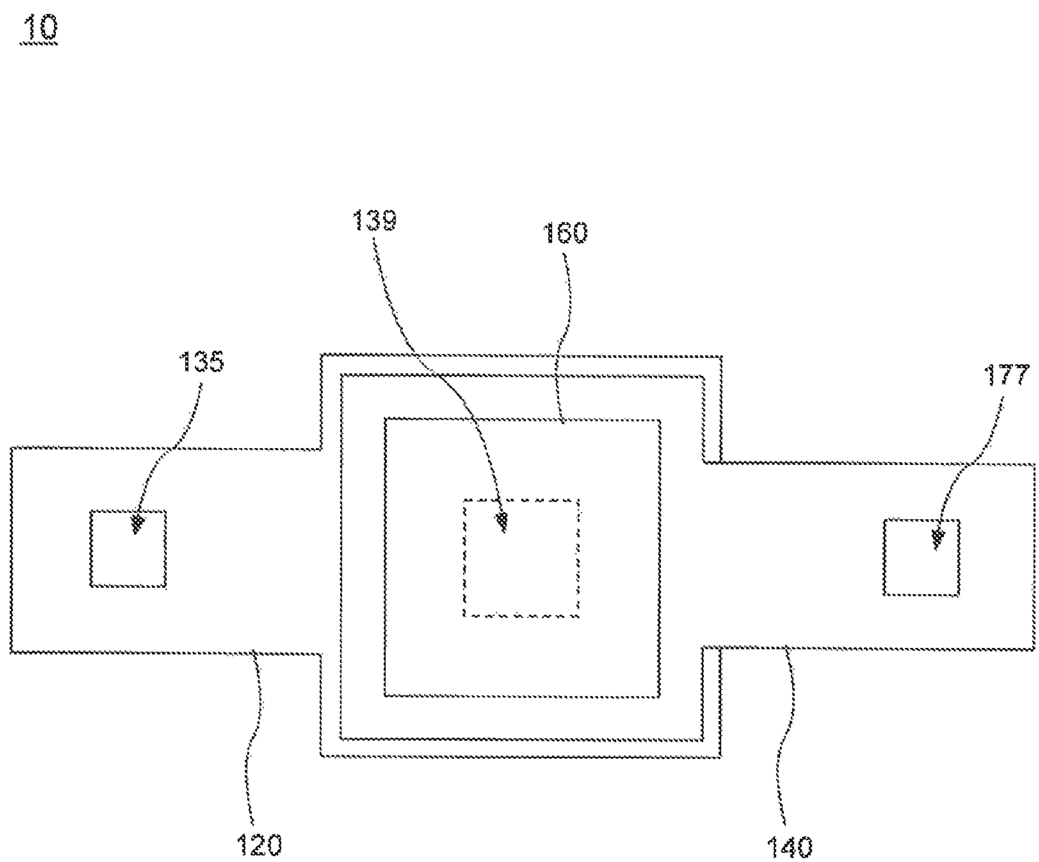
FIG. 11 is a plan view showing a step of forming openings respectively reaching the lower electrode and the upper electrode in the manufacturing method of the semiconductor device in the embodiment according to the present invention.
Figure 12:
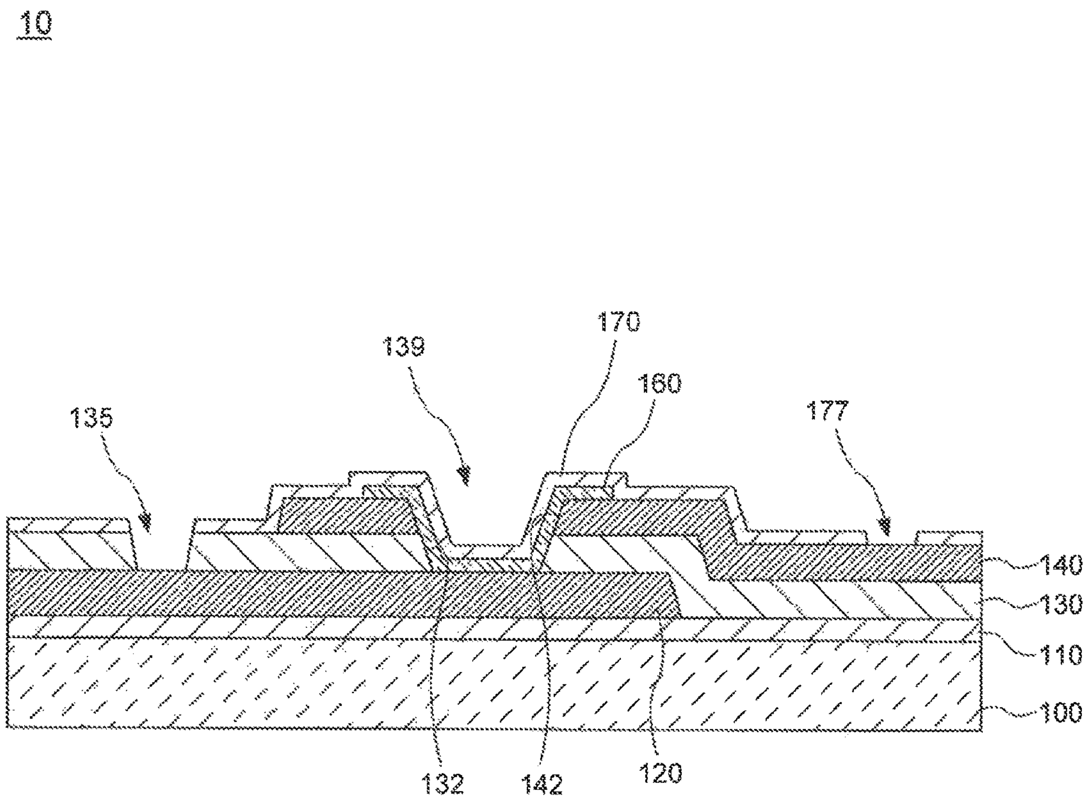
FIG. 12 is a cross-sectional view showing the step of forming the openings respectively reaching the lower electrode and the upper electrode in the manufacturing method of the semiconductor device in the embodiment according to the present invention.

FIG. 11 and FIG. 12 are respectively a plan view and a cross-sectional view showing a step of forming the openings 135 and 177 respectively reaching the lower electrode 120 and the upper electrode 120 in the manufacturing method of the semiconductor device 10 in embodiment 1 according to the present invention. Referring to FIG. 12, the gate insulating layer 170 is formed on the entirety of the substrate shown in FIG. 10, and patterning is performed as shown in FIG. 11 by photolithography and etching to form the openings 135 and 177. Preferably, the etching for forming the openings 135 and 177 is performed under the condition that the etching rate ratio of the insulating layer 130 and the gate insulating layer 170 with respect to the lower electrode 120 and the upper electrode 140 is high. Namely, in the etching performed to form the openings 135 and 177, the lower electrode 120 and the upper electrode 140 act as etching stoppers.

A conductive layer for the gate electrode 180, the source line 190 and the drain line 192 is formed on the entirety of the substrate shown in FIG. 12, and patterning is performed as shown in FIG. 1 and FIG. 2 by photolithography and etching to form the gate electrode 180, the source line 190 and the drain line 192. The semiconductor device 10 in embodiment 1 according to the present invention is manufactured by the above-described manufacturing method.

As described above, with the manufacturing method of the semiconductor device 10 in embodiment 1 according to the present invention, the thickness of the insulating layer 130, the tapering angle of the insulating layer side wall 132, or both of the thickness of the insulating layer 130 and the tapering angle of the insulating layer side wall 132 are controllable by a nanometer order. Therefore, the channel length of the semiconductor device 10 is controllable by a nanometer order. As a result, the variance in the channel length is suppressed to a nanometer order.

Embodiment 2

With reference to FIG. 13 through FIG. 16, an overview of a semiconductor 10A in embodiment 2 according to the present invention will be described. The structure of the semiconductor device 10A and the materials of the components thereof are substantially the same as those of the semiconductor device 10 in embodiment 1, and will not be described in detail. The semiconductor device 10A is manufactured by a manufacturing method different from that of the semiconductor device 10. Thus, in embodiment 2, only the manufacturing method of the semiconductor device 10A will be described. In the following description, components that are the same as, or have the same functions as, those of the semiconductor device 10 will be represented by the same reference signs (numerals) with alphabets, and detailed descriptions thereof will be omitted.

[Manufacturing Method of the Semiconductor Device 10A]

With reference to plan views and cross-sectional views provided in FIG. 13 through FIG. 16, a manufacturing method of the semiconductor device 10A in embodiment 2 according to the present invention will be described.

Figure 13:
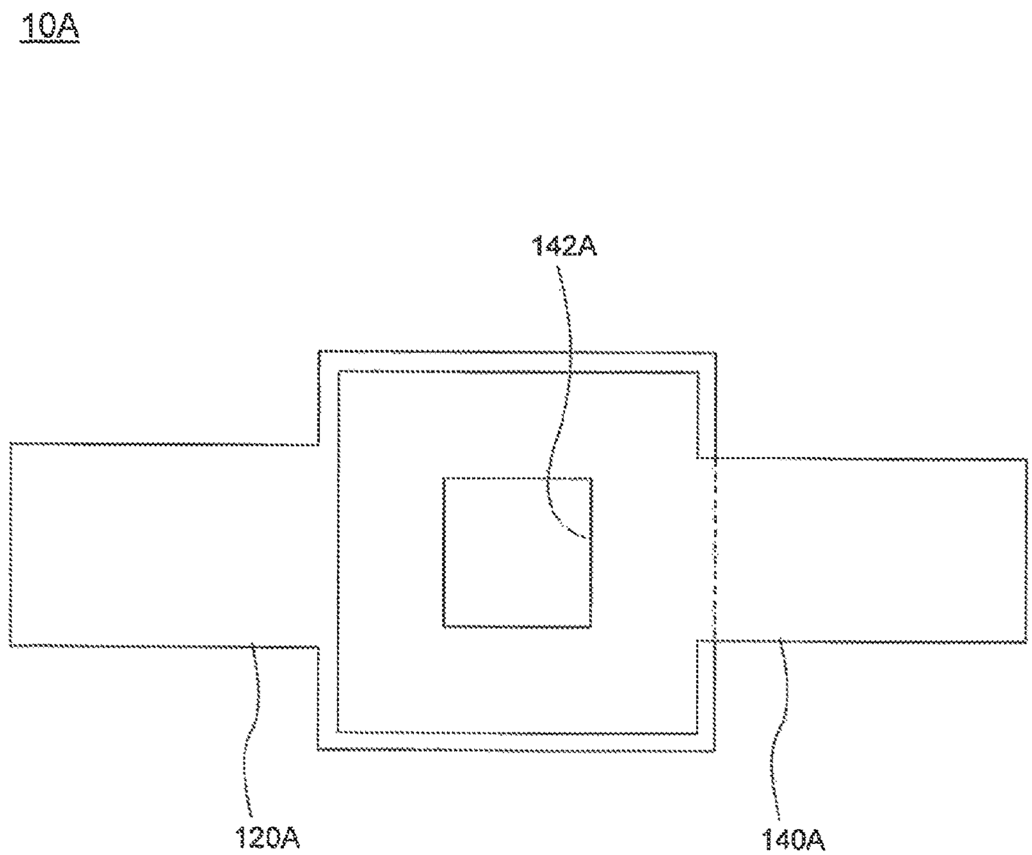
FIG. 13 is a plan view showing a step of forming an upper electrode in a manufacturing method of a semiconductor device in an embodiment according to the present invention.
Figure 14:
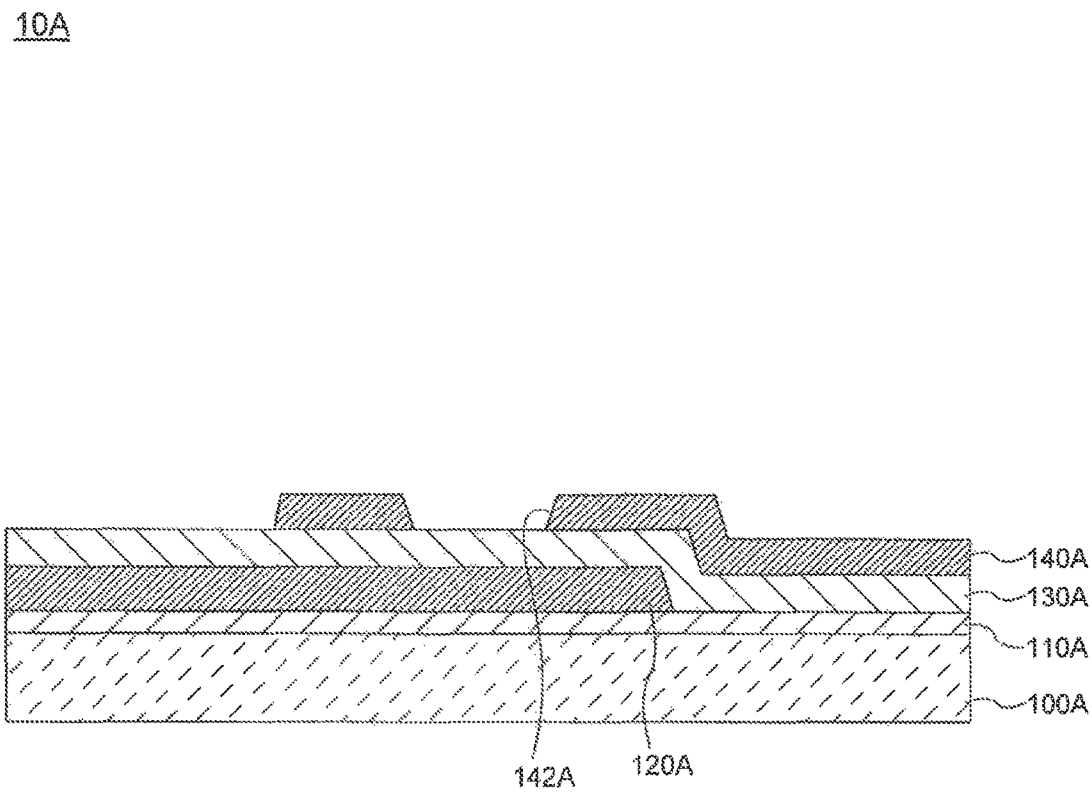
FIG. 14 is a cross-sectional view showing the step of forming the upper electrode in the manufacturing method of the semiconductor device in the embodiment according to the present invention.

FIG. 13 and FIG. 14 are respectively a plan view and a cross-sectional view showing a step of forming an upper electrode 140A in the manufacturing method of the semiconductor device 10A in embodiment 2 according to the present invention. A lower electrode 120A and an insulating layer 130A are formed by substantially the same method as shown in FIG. 3 and FIG. 4 regarding embodiment 1. Referring to FIG. 14, a conductive film for the upper electrode 140A is formed on the entirety of the resultant substrate, and patterning is performed as shown in FIG. 13 by photolithography and etching to form the upper electrode 140A. The upper electrode 140A thus formed has an electrode side wall 142A of a close shape.

Figure 15:
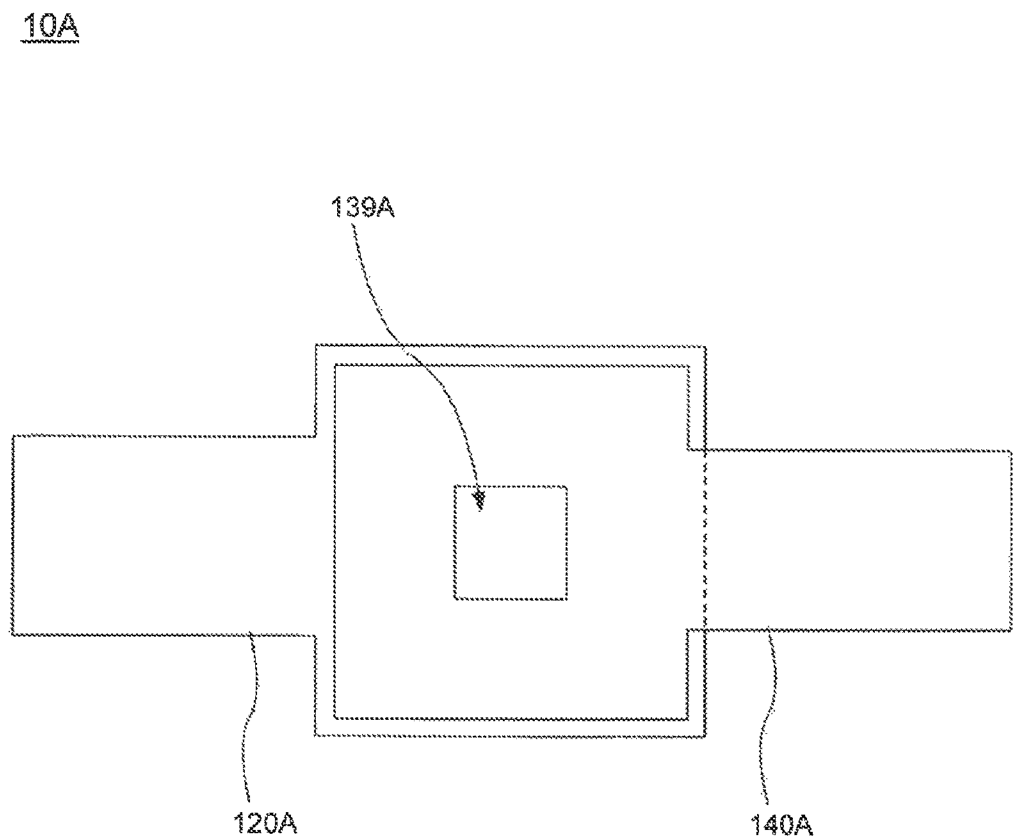
FIG. 15 is a plan view showing a step of forming an opening in an insulating layer in the manufacturing method of the semiconductor device in the embodiment according to the present invention.
Figure 16:
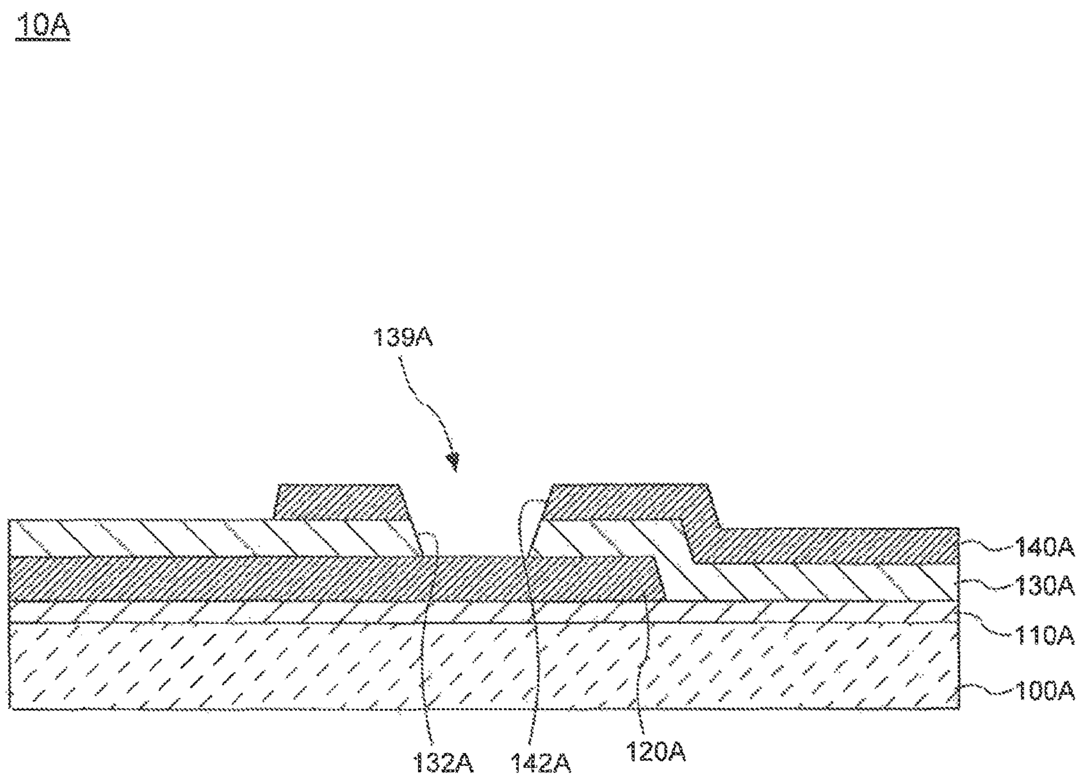
FIG. 16 is a cross-sectional view showing the step of forming the opening in the insulating layer in the manufacturing method of the semiconductor device in the embodiment according to the present invention.

FIG. 15 and FIG. 16 are respectively a plan view and a cross-sectional view showing a step of forming an opening 139A in the insulating layer 130A in the manufacturing method of the semiconductor device 10A in embodiment 2 according to the present invention. Referring to FIG. 16, the substrate shown in FIG. 14 is subjected to photolithography and etching to form the opening 139A having the pattern shown in FIG. 15. In this example, a portion of the insulating layer 130A that is enclosed by the electrode side wall 142A is etched away by use of the upper electrode 140A as a mask to form the opening 139A. The above-described etching step is performed as follows. Among portions of the insulating layer 130A that are exposed by the upper electrode 140A, a portion that is not to be etched away is covered with a resist, and the etching is performed.

As described above, in embodiment 2, the upper electrode 140A is used as a mask to perform etching on the insulating layer 130A. As a result, the same structure as that shown in FIG. 8 regarding embodiment 1 is formed. The steps after the etching step are performed by substantially the same method as shown in FIG. 9 through FIG. 12 regarding embodiment 1, and will not be described.

Now, the etching conditions on the insulating layer 130A will be described in detail. The etching is performed by use of fluorine-containing gas. For example, the etching is performed under the following conditions by use of a parallel flat-plate dry etching device manufactured by Tokyo Electron Limited.

Etching gas: $CF_4/CHF_3/Ar$=60/20/30 sccm
Etching pressure: 2.0 Torr
Etching power: 200 W
Inter-electrode distance: 10 mm
Upper electrode temperature: 25° C.
Lower electrode temperature: 5° C.

The etching rates realized by the above-described etching conditions are $SiO_2$=110 nm/min. and SiN=130 nm/min. Under the above-described etching conditions, none of Ti, MoW and Al is etched. Namely, use of the above-described etching conditions allows an insulating layer to be selectively etched without any metal layer being etched almost at all. With such etching conditions, the opening 139A having a tapered shape is formed in the insulating layer 130A.

As described above, with the manufacturing method of the semiconductor device 10A in embodiment 2 according to the present invention, the conductive layer and the insulating layer are etched in separate steps. Therefore, the load on the etching device is alleviated.

Embodiment 3

With reference to FIG. 17 through FIG. 26, an overview of a semiconductor 10B in embodiment 3 according to the present invention will be described. The semiconductor device 10B is similar to the semiconductor device 10 shown in FIG. 1 and FIG. 2, but an opening 135B has a shape different from that of the corresponding opening of the semiconductor device 10. In the following explanation, the features of the semiconductor device 10B that are the same as those of the semiconductor device 10 will not be described, and the above-described difference will be described. In the following description, components that are the same as, or have the same functions as, those of the semiconductor device 10 will be represented by the same reference signs (numerals) with alphabets, and detailed descriptions thereof will be omitted.

[Structure of the Semiconductor Device 10B]

Figure 17:
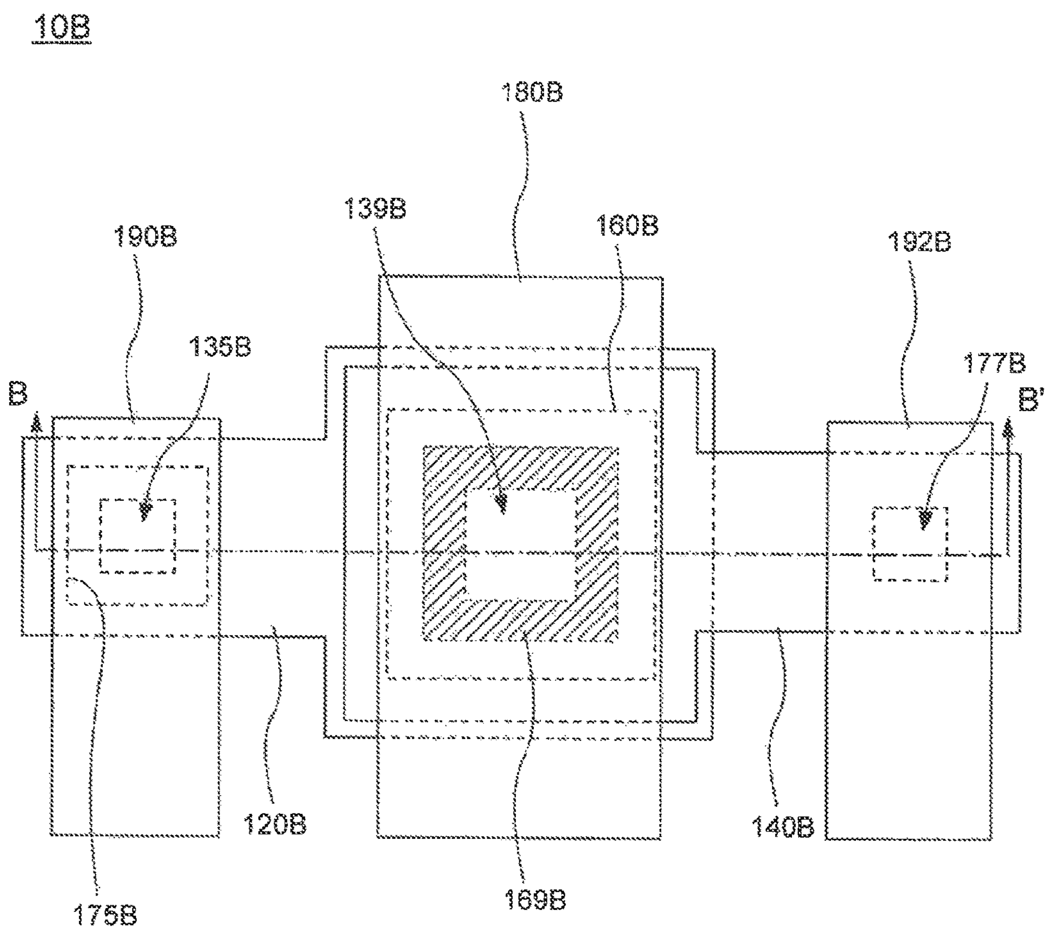
FIG. 17 is a plan view showing an overview of a semiconductor device in an embodiment according to the present invention.
Figure 18:
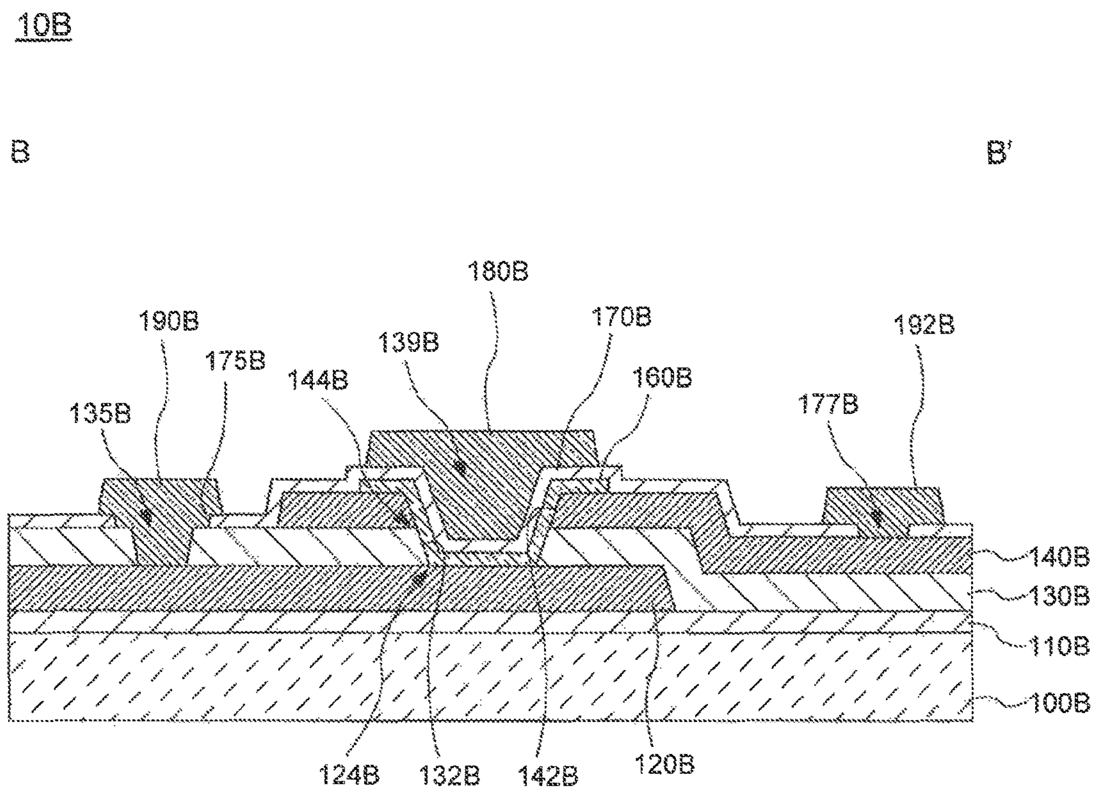
FIG. 18 is a cross-sectional view showing the overview of the semiconductor device in the embodiment according to the present invention.

FIG. 17 and FIG. 18 are respectively a plan view and a cross-sectional view showing an overview of the semiconductor device 10B in embodiment 3 according to the present invention. FIG. 18 is taken along line B-B' in FIG. 17. As shown in FIG. 17 and FIG. 18, in the semiconductor device 10B, a side wall of the opening 135B formed in an insulating layer 130B and a gate insulating layer 170B is stepped as seen in a cross-sectional view. Specifically, in the opening 135B, the opening in the gate insulating layer 170B has a diameter longer than the diameter of the opening in the insulating layer 130B. In other words, a side wall 175B of the gate insulating layer 170B that is exposed to the opening 135B is located on a top surface of the insulating layer 130B, and extends upward from the top surface of the insulating layer 130B. The opening 135B having such a shape is formed by a manufacturing method of the semiconductor device 10B described below. Specifically, the step of forming the opening in the insulating layer 130B and the step of forming the opening in the gate insulating layer 170B are performed at different timings. As a result, the opening 135B having the shape shown in FIG. 18 is formed.

[Manufacturing Method of the Semiconductor Device 10B]

With reference to plan views and cross-sectional views provided in FIG. 19 through FIG. 26, a manufacturing method of the semiconductor device 10B in embodiment 3 according to the present invention will be described.

Figure 19:
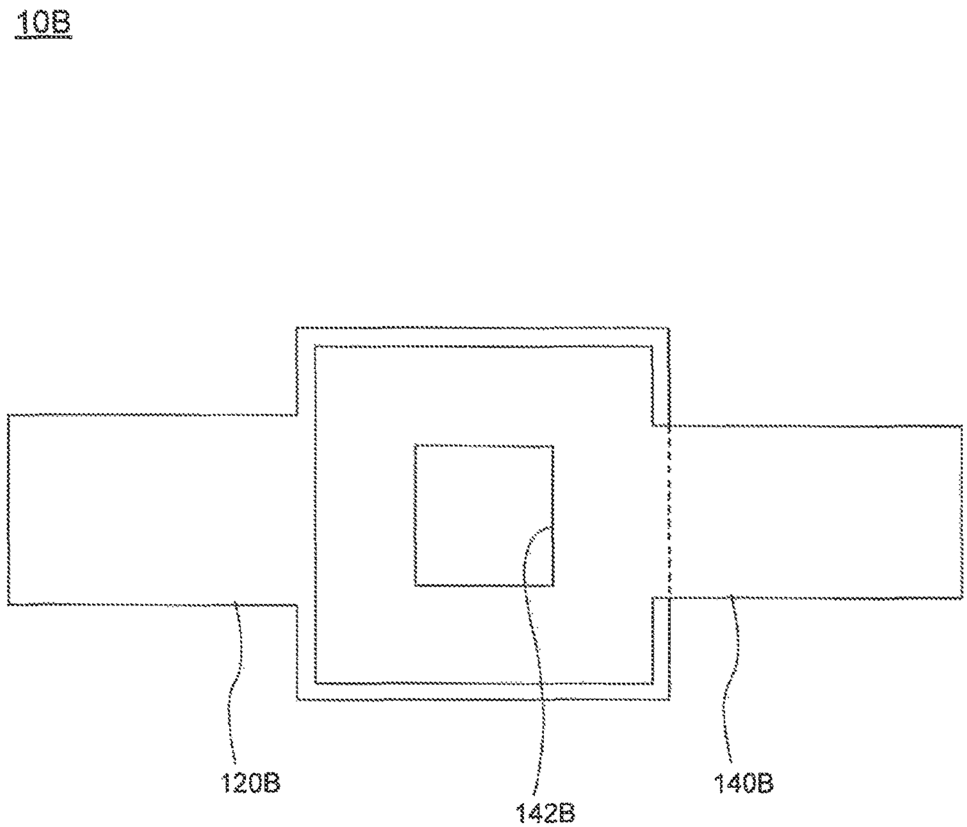
FIG. 19 is a plan view showing a step of forming an upper electrode in a manufacturing method of the semiconductor device in the embodiment according to the present invention.
Figure 20:
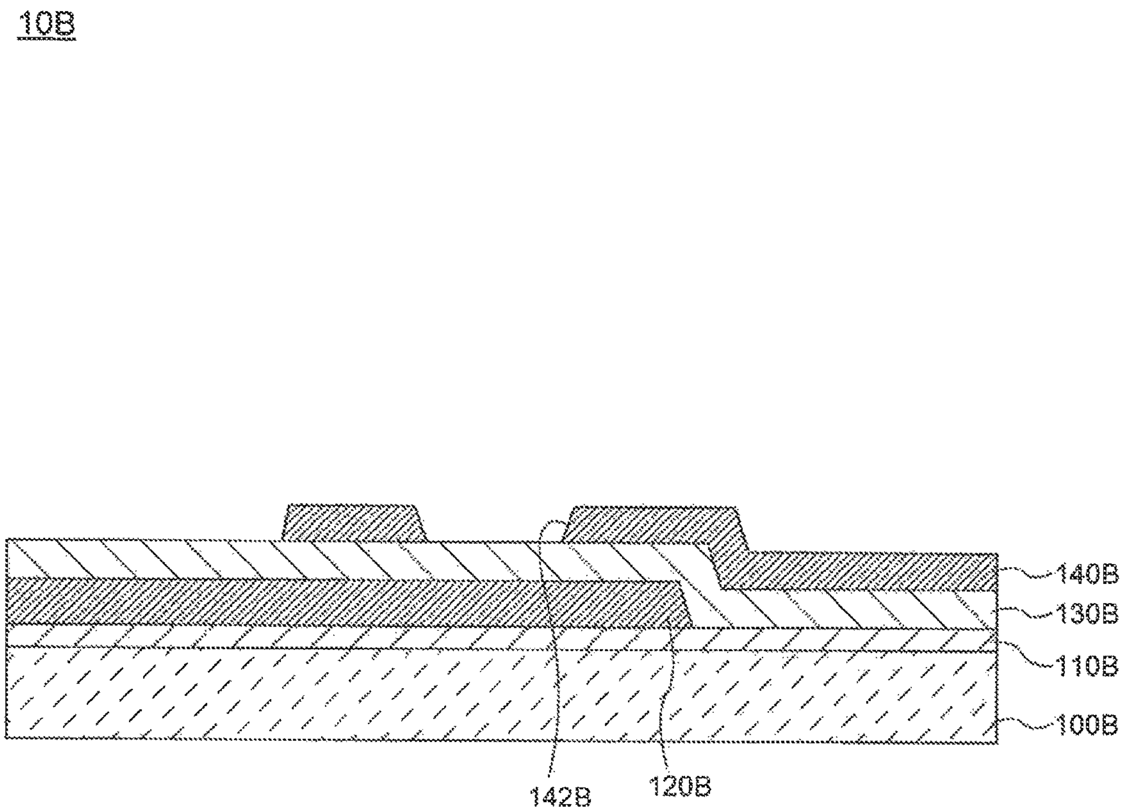
FIG. 20 is a cross-sectional view showing the step of forming the upper electrode in the manufacturing method of the semiconductor device in the embodiment according to the present invention.

FIG. 19 and FIG. 20 are respectively a plan view and a cross-sectional view showing a step of forming an upper electrode 140B in the manufacturing method of the semiconductor device 10B in embodiment 3 according to the present invention. A lower electrode 120B and the insulating layer 130B are formed by substantially the same method as shown in FIG. 3 and FIG. 4 regarding embodiment 1. Referring to FIG. 20, a conductive film for the upper electrode 140B is formed on the entirety of the resultant substrate, and patterning is performed as shown in FIG. 19 by photolithography and etching to form the upper electrode 140B having an electrode side wall 142B.

Figure 21:
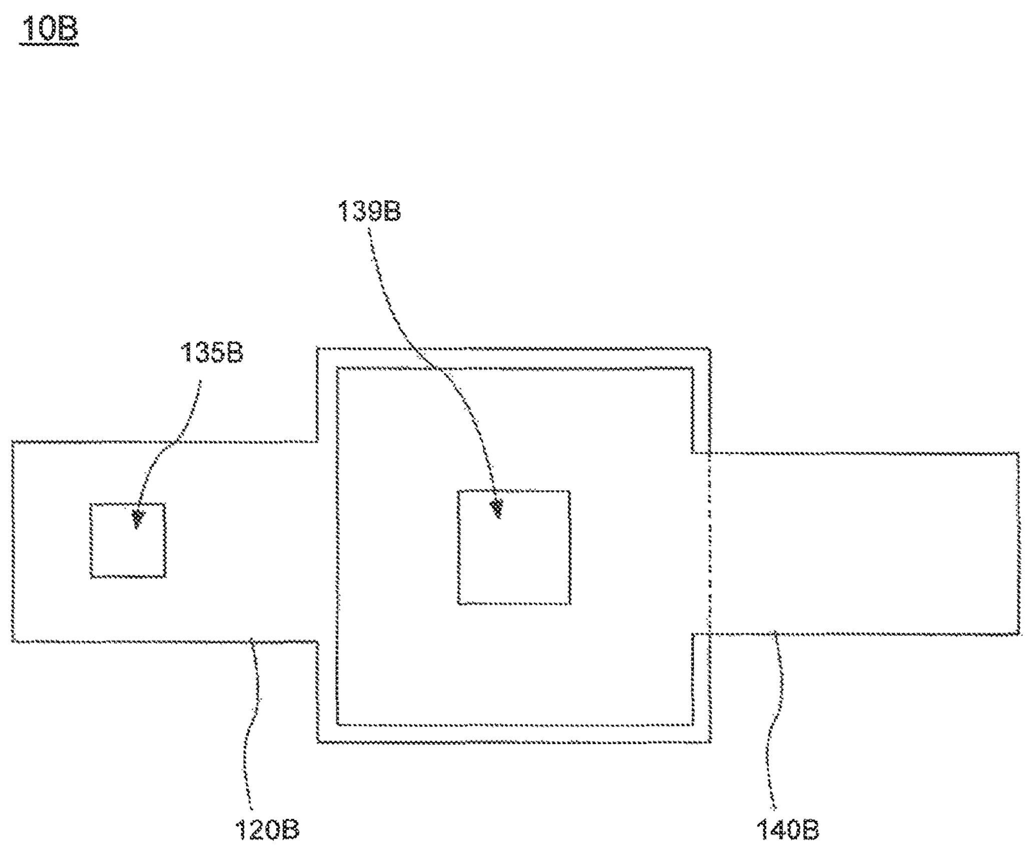
FIG. 21 is a plan view showing a step of forming openings in an insulating layer in the manufacturing method of the semiconductor device in the embodiment according to the present invention.
Figure 22:
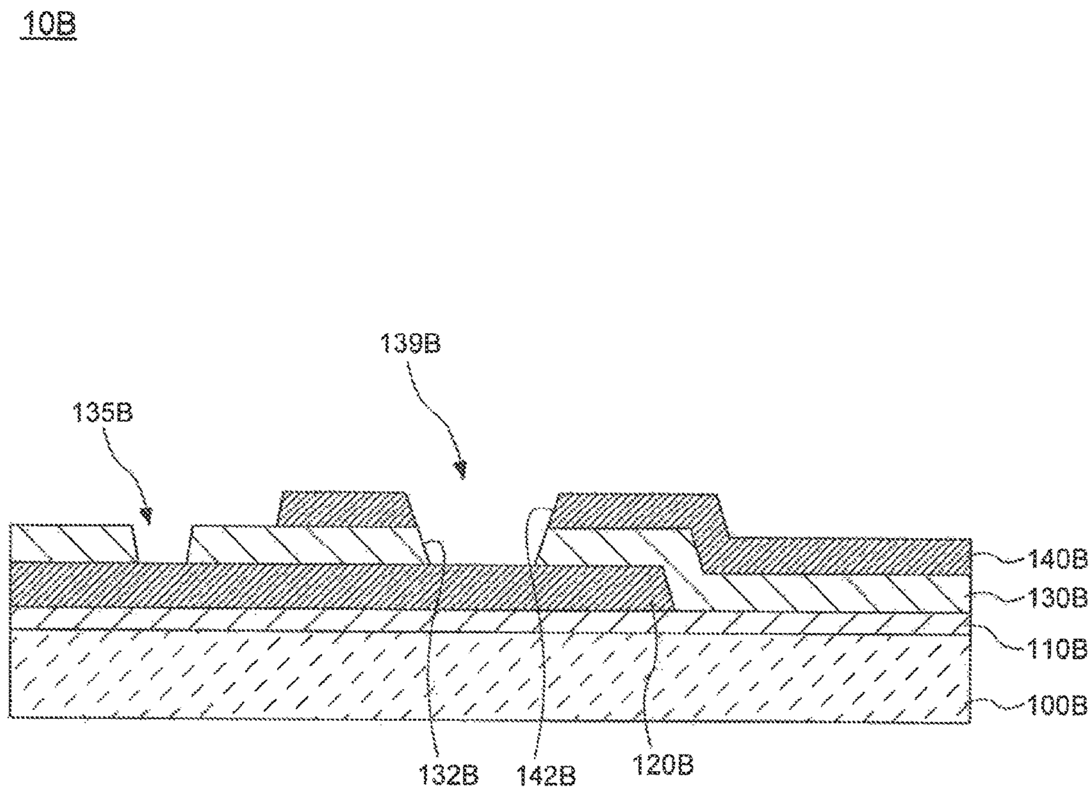
FIG. 22 is a cross-sectional view showing the step of forming the openings in the insulating layer in the manufacturing method of the semiconductor device in the embodiment according to the present invention.

FIG. 21 and FIG. 22 are respectively a plan view and a cross-sectional view showing a step of forming the opening 135B and also an opening 139B in the insulating layer 130B in the manufacturing method of the semiconductor device 10B in embodiment 3 according to the present invention. Referring to FIG. 22, the substrate shown in FIG. 20 is subjected to photolithography and etching to form the openings 135B and 139B. (The opening formed in the insulating layer 130B is a part of the opening 135B, and the opening formed in the insulating layer 130B is a part of the opening 139B. However, for the sake of convenience, such parts of the openings 135B and 139B are referred to as the "opening 135B" and the "opening 139B". This is also applicable to the openings in the following embodiments.) The openings 135B and 139B have the patterns shown in FIG. 21. Like in embodiment 2, a portion of the insulating layer 130B that is enclosed by the electrode side wall 142B is etched away by use of the upper electrode 140B as a mask to form the opening 139B. A portion of the insulating layer 130B that is exposed by the upper electrode 140A is covered with a resist having an opening in positional correspondence with the opening 135B, and the etching is performed to form the opening 139B in the same step as the opening 139B.

Figure 23:
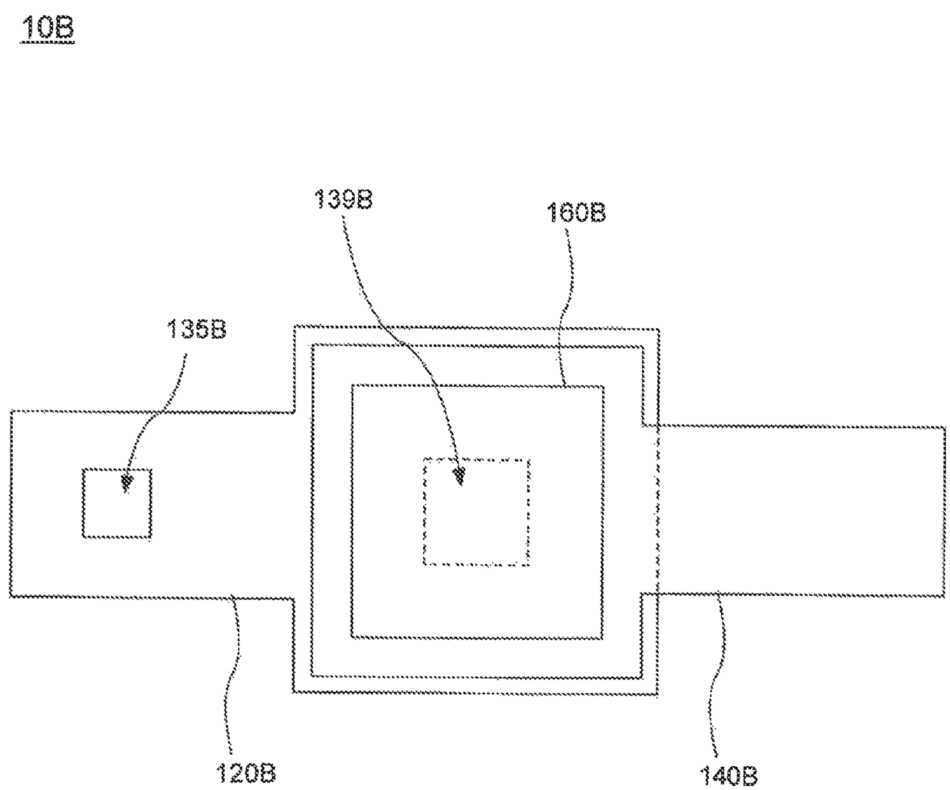
FIG. 23 is a plan view showing a step of forming an oxide semiconductor layer in the manufacturing method of the semiconductor device in the embodiment according to the present invention.
Figure 24:
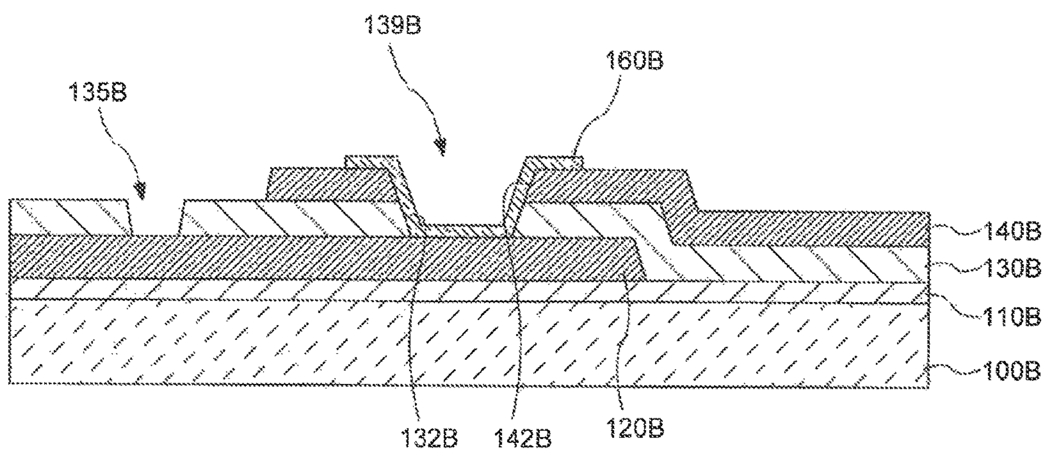
FIG. 24 is a cross-sectional view showing the step of forming the oxide semiconductor layer in the manufacturing method of the semiconductor device in the embodiment according to the present invention.

FIG. 23 and FIG. 24 are respectively a plan view and a cross-sectional view showing a step of forming an oxide semiconductor layer 160B in the manufacturing method of the semiconductor device 10B in embodiment 3 according to the present invention. Referring to FIG. 24, a film for the oxide semiconductor layer 160B is formed on the entirety of the substrate shown in FIG. 22, and patterning is performed as shown in FIG. 23 by photolithography and etching to form the oxide semiconductor layer 160B. The oxide semiconductor layer 160B is formed in the opening 139B, and a part of the film for the oxide semiconductor layer 160B that is located in the opening 135B is etched away. The formation of the oxide semiconductor layer 160B by etching may be by substantially the same method as in embodiment 1.

Figure 25:
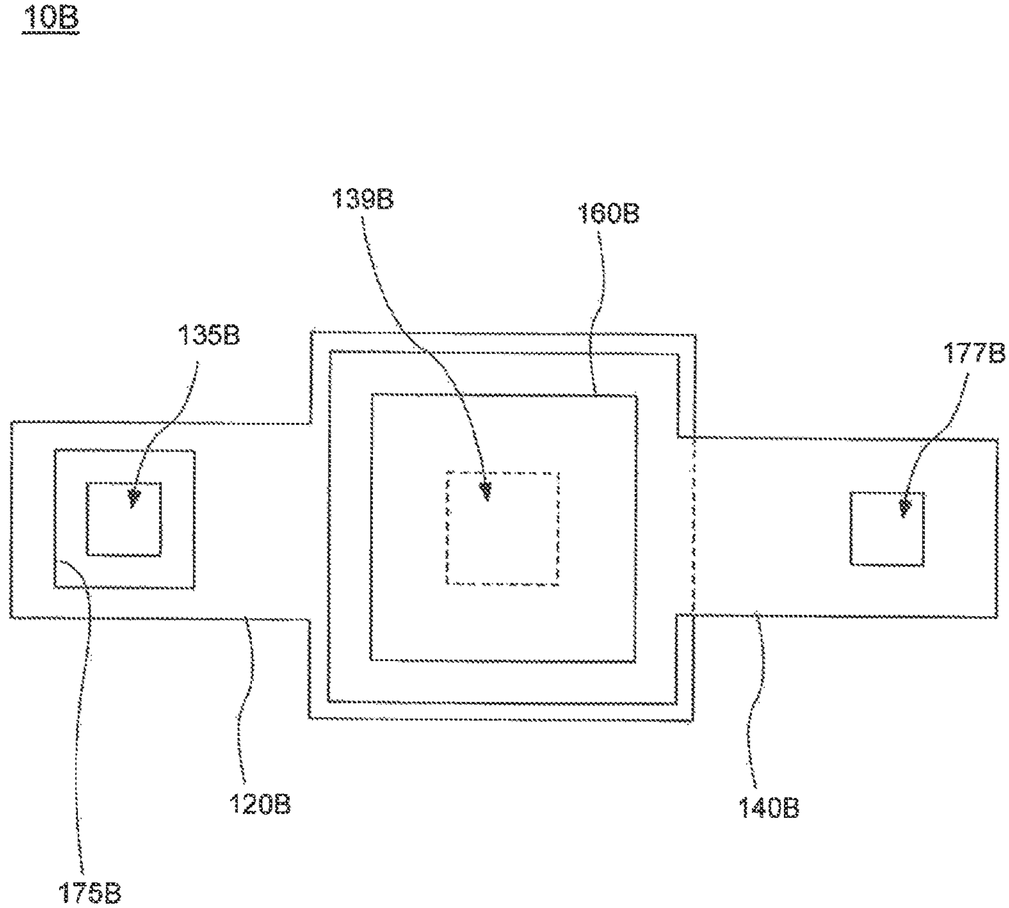
FIG. 25 is a plan view showing a step of forming openings exposing a lower electrode and the upper electrode in the manufacturing method of the semiconductor device in the embodiment according to the present invention.
Figure 26:
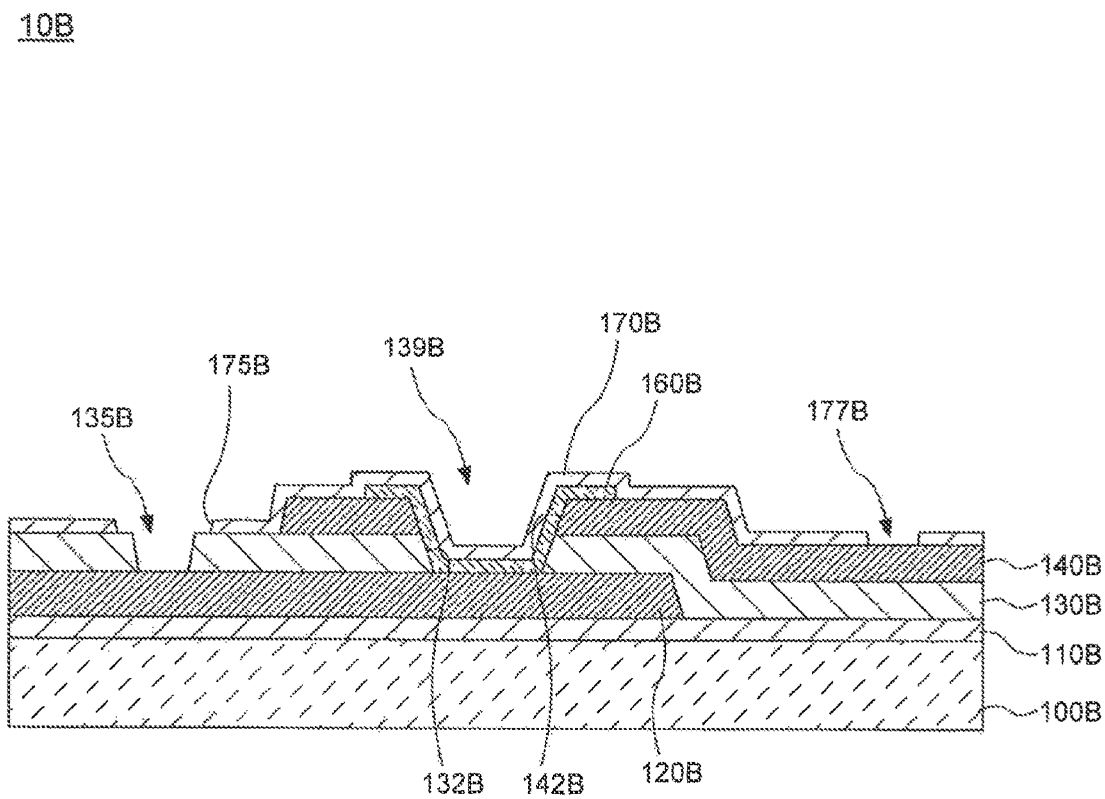
FIG. 26 is a cross-sectional view plan view showing the step of forming the openings exposing the lower electrode and the upper electrode in the manufacturing method of the semiconductor device in the embodiment according to the present invention.

FIG. 25 and FIG. 26 are respectively a plan view and a cross-sectional view showing a step of forming openings respectively exposing the lower electrode 120B and the upper electrode 140B in the manufacturing method of the semiconductor device 10B in embodiment 3 according to the present invention. Referring to FIG. 26, the gate insulating layer 170B is formed on the entirety of the substrate shown in FIG. 24, and is patterned as shown in FIG. 25 by photolithography and etching to form an opening in a region corresponding to the opening 135B and also to form an opening 177B. The resultant opening 135B exposes the lower electrode 120B, and the opening 177B exposes the upper electrode 140B.

In FIG. 26, the gate insulating layer 170B is etched down to an interface between the insulating layer 130B and the gate insulating layer 170B. Alternatively, a part of the insulating layer 130B that is exposed from the gate insulating layer 170B may be over-etched. The insulating layer 130B and the gate insulating layer 170B are often formed of substantially the same material as each other, and thus it may be occasionally difficult to stop the etching on the gate insulating layer 170B at the interface between the insulating layer 130B and the gate insulating layer 170B. For this reason, a part of the insulating layer 130B may occasionally be over-etched. Preferably, the etching in this step is performed under the condition that the etching rate ratio of the gate insulating layer 170B with respect to the lower electrode 120B and the upper electrode 140B is high. Namely, in the etching performed to form the openings 135B and 177B, the lower electrode 120B and the upper electrode 140B act as etching stoppers.

A conductive layer for a gate electrode 180B, a source line 190B and a drain line 192B is formed on the entirety of the substrate shown in FIG. 26, and patterning is performed as shown in FIG. 17 and FIG. 18 by photolithography and etching to form the gate electrode 180B, the source line 190B and the drain line 192B. The semiconductor device 10B in embodiment 3 according to the present invention is manufactured by the above-described manufacturing method.

As described above, with the manufacturing method of the semiconductor device 10B in embodiment 3 according to the present invention, the conductive layer and the insulating layers are etched in separate steps. Therefore, the load on the etching device is alleviated.

Embodiment 4

With reference to FIG. 27 through FIG. 38, an overview of a semiconductor 10C in embodiment 4 according to the present invention will be described. The semiconductor device 10C includes a first transistor 20C having a short channel length and a second transistor 30C having a long channel length. The first transistor 20C having a short channel length has substantially the same structure as that of the semiconductor device 10 in embodiment 1 shown in FIG. 1 and FIG. 2. In the following explanation, the features of the first transistor 20C will not be described, and the second transistor 30C having a long channel length will be described. In the following description, components that are the same as, or have the same functions as, those of the semiconductor device 10 will be represented by the same reference signs (numerals) with alphabets, and detailed descriptions thereof will be omitted.

[Structure of the Second Transistor 30C]

Figure 27:
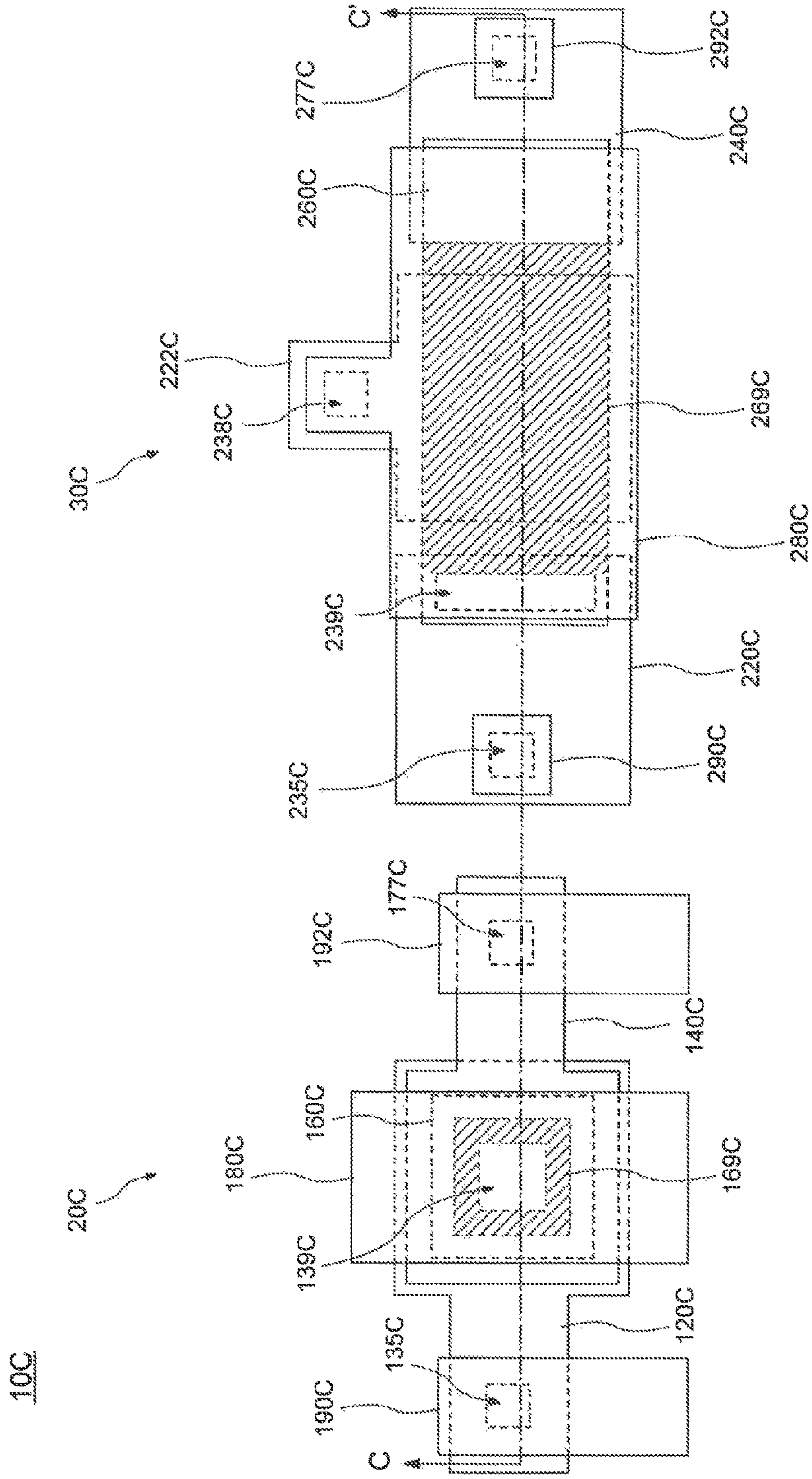
FIG. 27 is a plan view showing an overview of a semiconductor device in an embodiment according to the present invention.
Figure 28:
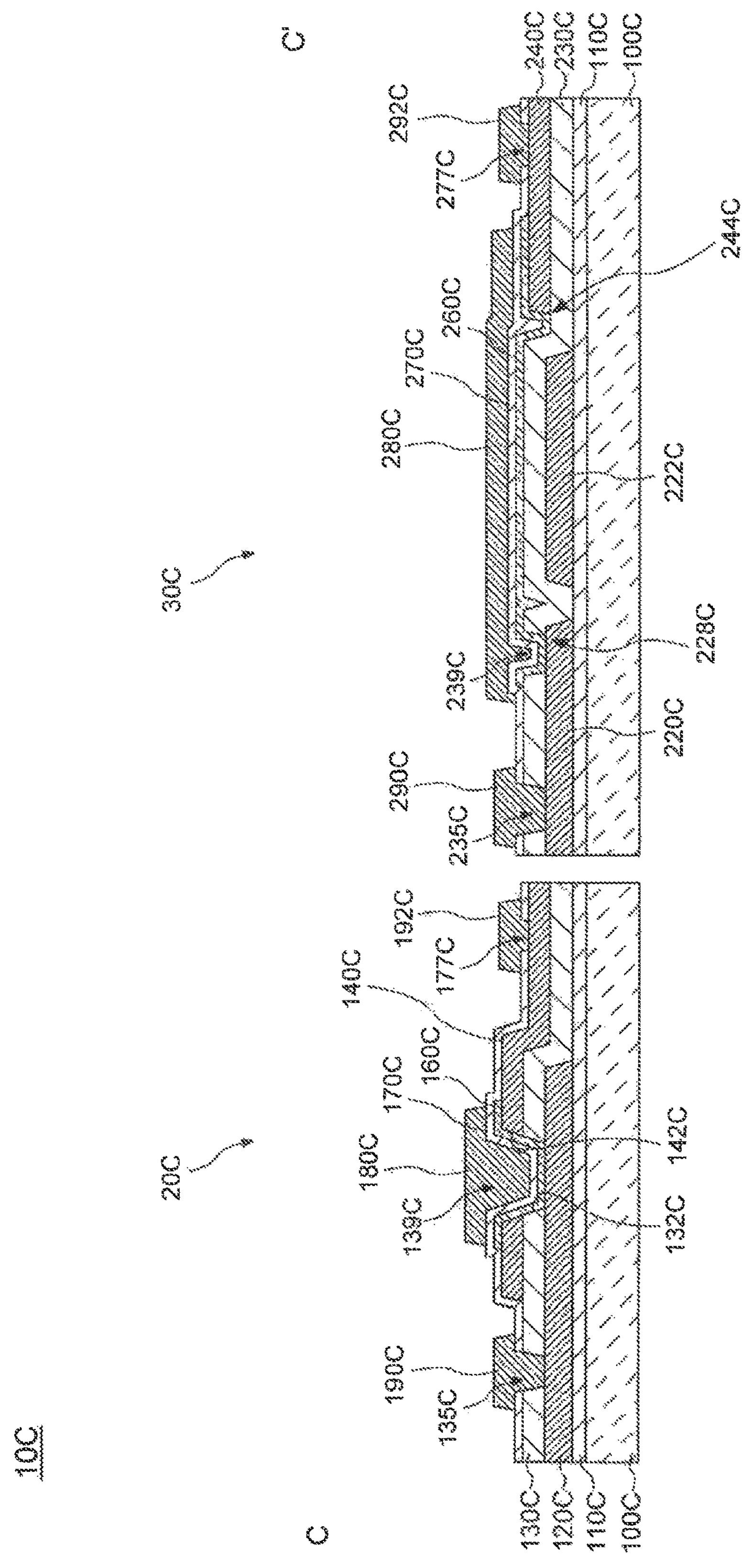
FIG. 28 is a cross-sectional view showing the overview of the semiconductor device in the embodiment according to the present invention.

FIG. 27 and FIG. 28 are respectively a plan view and a cross-sectional view showing an overview of the semiconductor device 10C in embodiment 4 according to the present invention. FIG. 28 is taken along line C-C' in FIG. 27. As shown in FIG. 27 and FIG. 28, the second transistor 30C includes a substrate 100C, an underlying insulating layer 110C, a lower electrode 220C, a back gate 222C, an insulating layer 230C, an upper electrode 240C, an oxide semiconductor layer 260C, a gate insulating layer 270C, a gate electrode 280C, a source line 290C, and a drain line 292C. The substrate 100C and the underlying insulating layer 110C are common to the first transistor 20C and the second transistor 30C, and extend continuously in the first transistor 20C and the second transistor 30C. An opening 235C is provided in the insulating layer 230C and the gate insulating layer 270C, and reaches the lower electrode 220C. An opening 239C is provided in the insulating layer 230C, and reaches the lower electrode 220C. An opening 277C is provided in the gate insulating layer 270C, and reaches the upper electrode 240C.

The lower electrode 220C and the back gate 222C are located on the underlying insulating layer 110C. The insulating layer 230C is located on the lower electrode 220C, on the back gate 222C, and on the underlying insulating layer 110C. The upper electrode 240C is located on the insulating layer 230C, and is isolated from the lower electrode 220C as seen in a plan view. The oxide semiconductor layer 260C is located on the insulating layer 230C in a region between the lower electrode 220C and the upper electrode 240C. The oxide semiconductor layer 260C is connected with the lower electrode 220C via the opening 239C, and runs onto, and thus is connected with, the upper electrode 240C at a side surface and a top surface of the upper electrodes 240C. The back gate 222C faces the oxide semiconductor layer 260C while having the insulating layer 230C therebetween.

The gate electrode 280C is located to face the oxide semiconductor layer 260C in a region between the lower electrode 220C and the upper electrode 240C. The gate insulating layer 270C is located between the oxide semiconductor layer 260C and the gate electrode 280C. As described below in detail, in the second transistor 30C, a portion of the oxide semiconductor layer 260C that is located in the region between the lower electrode 220C and the upper electrode 240C acts as a channel. In the example shown in FIG. 27 and FIG. 28, the upper electrode 240C is located so as not to overlap the back gate 222C as seen in a plan view. Alternatively, the back gate 222C and the upper electrode 240C may overlap each other as seen in a plan view. In the example shown in FIG. 27 and FIG. 28, the back gate 222C is located between the oxide semiconductor layer 260C and the substrate 100C. Alternatively, the back gate 222C may be omitted.

The source line 290C is connected with the lower electrode 220C via the opening 235C. The drain line 292C is connected with the upper electrode 240C via the opening 277C. The source line 290C and the drain line 292C may be replaced with each other. Namely, the line 290C may act as the drain line, whereas the line 292C may act as the source line.

Now, the relationship between the first transistor 20C and the second transistor 30C regarding each of the components thereof will be described. The lower electrode 220C and the back gate 222C form the same layer with a lower electrode 120C, and are both located in contact with the underlying insulating layer 110C. The insulating layer 230C forms the same layer with an insulating layer 130C, and is continuous with the insulating layer 130C. Similarly, an upper electrode 140C and the upper electrode 240C, an oxide semiconductor layer 160C and the oxide semiconductor layer 260C, a gate insulating layer 170C and the gate insulating layer 270C, a gate electrode 180C and the gate electrode 280C, a source line 190C and the source line 290C, and a drain line 192C and the drain line 292C, form the same layer with each other.

It should be noted that the semiconductor device 10B is not limited to having the above-described structure. For example, the gate insulating layer 170C and the gate insulating layer 270C do not need to completely form the same layer as each other. A part of the gate insulating layer 170C may form the same layer with the gate insulating layer 270C. For example, the gate insulating layer 270C may be formed of a stack of a layer forming the same layer with the gate insulating layer 170C and another insulating layer. Namely, the gate insulating layer 270C may have a thickness larger than that of the gate insulating layer 170C. Oppositely, the gate insulating layer 270C may have a thickness smaller than that of the gate insulating layer 170C.

In the above, the gate insulating layer 170C and the gate insulating layer 270C are described as an example. The same is applicable to the lower electrodes 120C and 220C, the insulating layers 130C and 230C, the upper electrodes 140C and 240C, the oxide semiconductor layers 160C and 260C, the gate electrodes 180C and 280C, the source lines 190C and 290C, and the drain lines 192C and 292C.

[Operation of the Second Transistor 30C]

An operation of the second transistor 30C shown in FIG. 27 and FIG. 28 will be described. The second transistor 30C is a transistor including a channel formed of the oxide semiconductor layer 260C. In the second transistor 30C, the lower electrode 220C acting as a source electrode and the upper electrode 240C acting as a drain electrode form different layers from each other. The lower electrode 220C is connected with the source line 290C, which forms the same layer with the gate electrode 280C, and the upper electrode 240C is connected with the drain line 292C, which forms the same layer with the gate electrode 280C. Namely, the conductive layers at different levels are connected with each other via the oxide semiconductor layer 260C.

The second transistor 30C is operated as follows. A gate voltage is applied to the gate electrode 280C, a source voltage is applied to the source line 290C connected with the lower electrode 220C, and a drain voltage is applied to the drain line 292C connected with the upper electrode 240C. It should be noted that the source voltage and the drain voltage may be applied oppositely. The back gate 222C is supplied with the same gate voltage as applied to the gate electrode 280C. It should be noted that the back gate 222C may be supplied with an assisting gate voltage independent from the gate voltage to control the threshold value (Vth) of the second transistor 30C.

When the gate voltage is applied to the gate electrode 280C, an electric field in accordance with the gate voltage is formed, via the gate insulating layer 270C, in the portion of the oxide semiconductor layer 260C that faces the gate electrode 280C. The electric field generates carriers in the oxide semiconductor layer 260C. When a potential difference is caused between the lower electrode 220C and the upper electrode 240C in the state where the carriers are generated in the oxide semiconductor layer 260C as described above, the carriers generated in the oxide semiconductor layer 260C are moved in accordance with the potential difference. Namely, electrons are moved from the lower electrode 220C to the upper electrode 240C.

The electrons are supplied from the lower electrode 220C to the oxide semiconductor layer 260C in a source region 228C and are transferred from the oxide semiconductor layer 260C to the upper electrode 240C in a drain region 244C. Namely, in the second transistor 30C, the portion of the oxide semiconductor layer 260C that is located in the region between the lower electrode 220C and the upper electrode 240C acts as a channel. Therefore, the channel length of the second transistor 30C is determined by the patterning precision on the lower electrode 220C and the upper electrode 240C. In FIG. 27, a channel region 269C is the portion of the oxide semiconductor layer 260C that acts as a channel.

As described above in embodiment 1, the channel length of the first transistor 20C is adjustable by the thickness of the insulating layer 130C and the tapering angle of an insulating layer side wall 132C. Therefore, the channel length of the first transistor 20C is controllable by a nanometer order. Namely, the first transistor 20C is preferable as a transistor having a short channel length.

By contrast, the channel length of the second transistor 30C is adjustable by the distance between the lower electrode 220C and the upper electrode 240C. The distance between the lower electrode 220C and the upper electrode 240C is controlled by photolithography and etching. The patterning precision by photolithography and etching is controlled by a micrometer order, and therefore, the channel length of the second transistor 30C is controllable by a micrometer order. Namely, the second transistor 30C is preferable as a transistor having a long channel length. In the semiconductor device 10C, the channel length of the second transistor 30C may be longer than the channel length of the first transistor 20C.

As described above, the semiconductor device 10C in embodiment 4 according to the present invention includes the first transistor 20C having a channel length of a nanometer order and the second transistor 30C having a channel length of a micrometer order, which are formed in the same step.

[Manufacturing Method of the Second Transistor 30C]

With reference to plan views and cross-sectional views provided in FIG. 29 through FIG. 38, a manufacturing method of the second transistor 30C of the semiconductor device 10C in embodiment 4 according to the present invention will be described. The manufacturing method of the first transistor 20C is substantially the same as that of the semiconductor device 10A in embodiment 2, and will not be described here.

Figure 29:
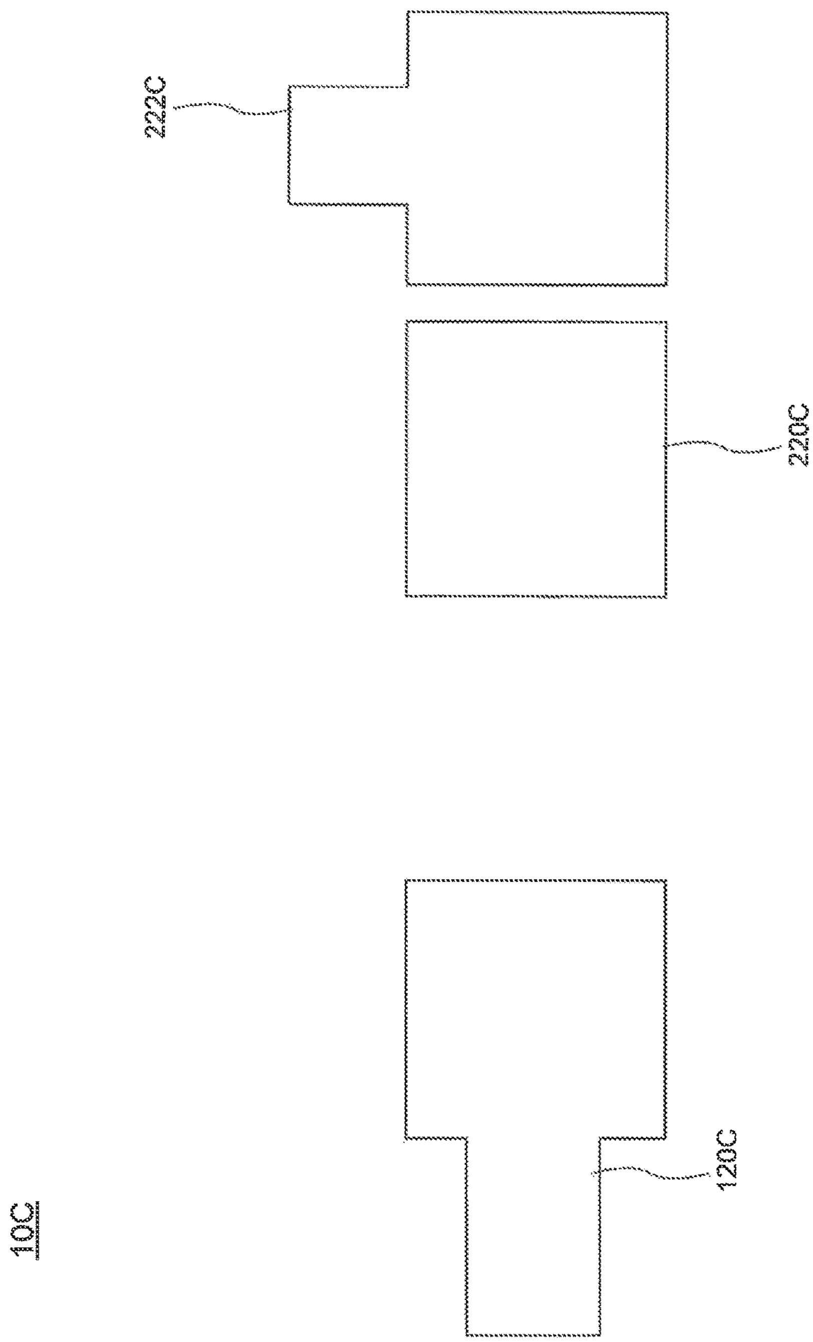
FIG. 29 is a plan view showing a step of forming a lower electrode and a back gate in a manufacturing method of the semiconductor device in the embodiment according to the present invention.
Figure 30:
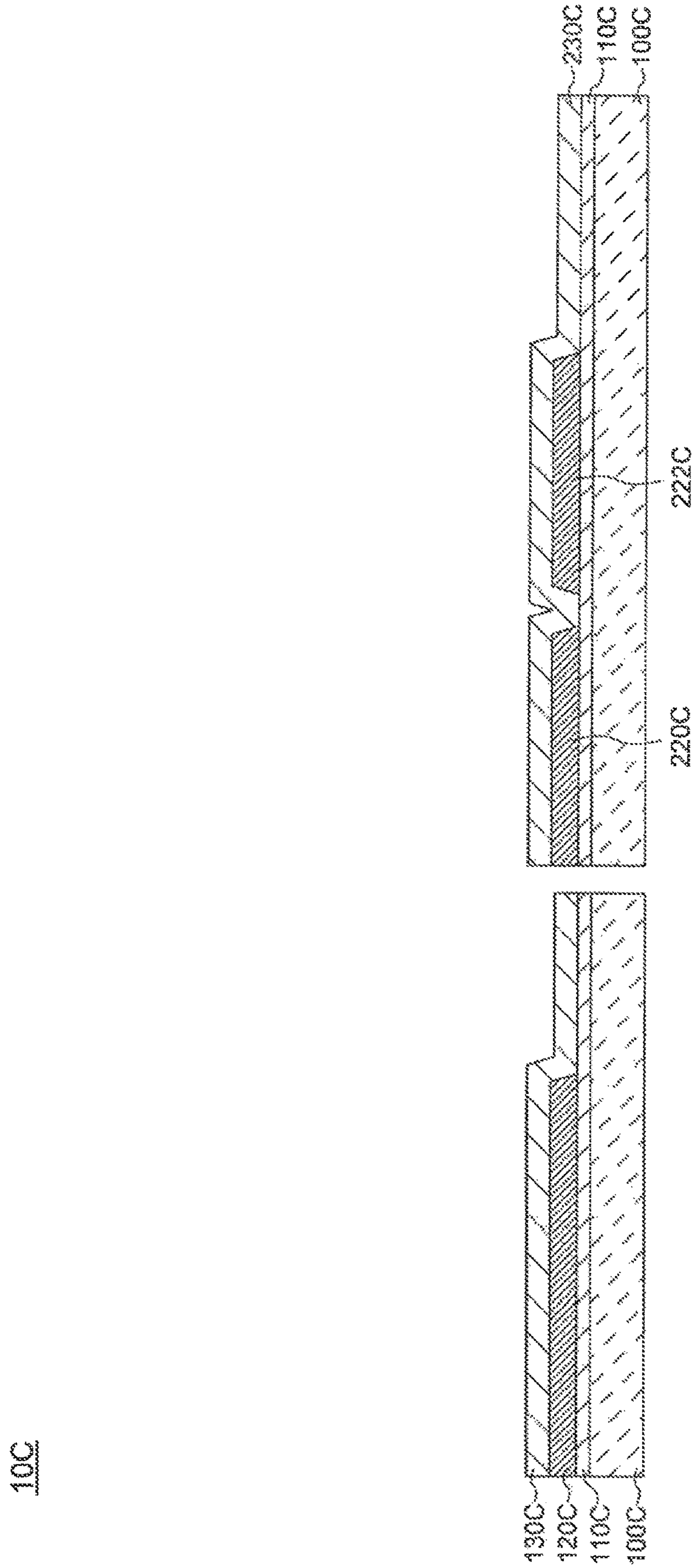
FIG. 30 is a cross-sectional view showing the step of forming the lower electrode and the back gate in the manufacturing method of the semiconductor device in the embodiment according to the present invention.

FIG. 29 and FIG. 30 are respectively a plan view and a cross-sectional view showing a step of forming the lower electrode 220C and the back gate 222C in the manufacturing method of the semiconductor device 10C in embodiment 4 according to the present invention. Referring to FIG. 30, the underlying insulating layer 110C is formed on the substrate 100C. A conductive film for the lower electrode 220C and the back gate 222C is formed thereon, and patterning is performed as shown in FIG. 29 by photolithography and etching to form the lower electrode 220C and the back gate 222C. On the lower electrode 220C and the back gate 222C formed as a result of the patterning, the insulating layer 230C is formed. The etching for forming the lower electrode 220C and the back gate 222C is performed under the same conditions as those for the lower electrode 120C.

Figure 31:
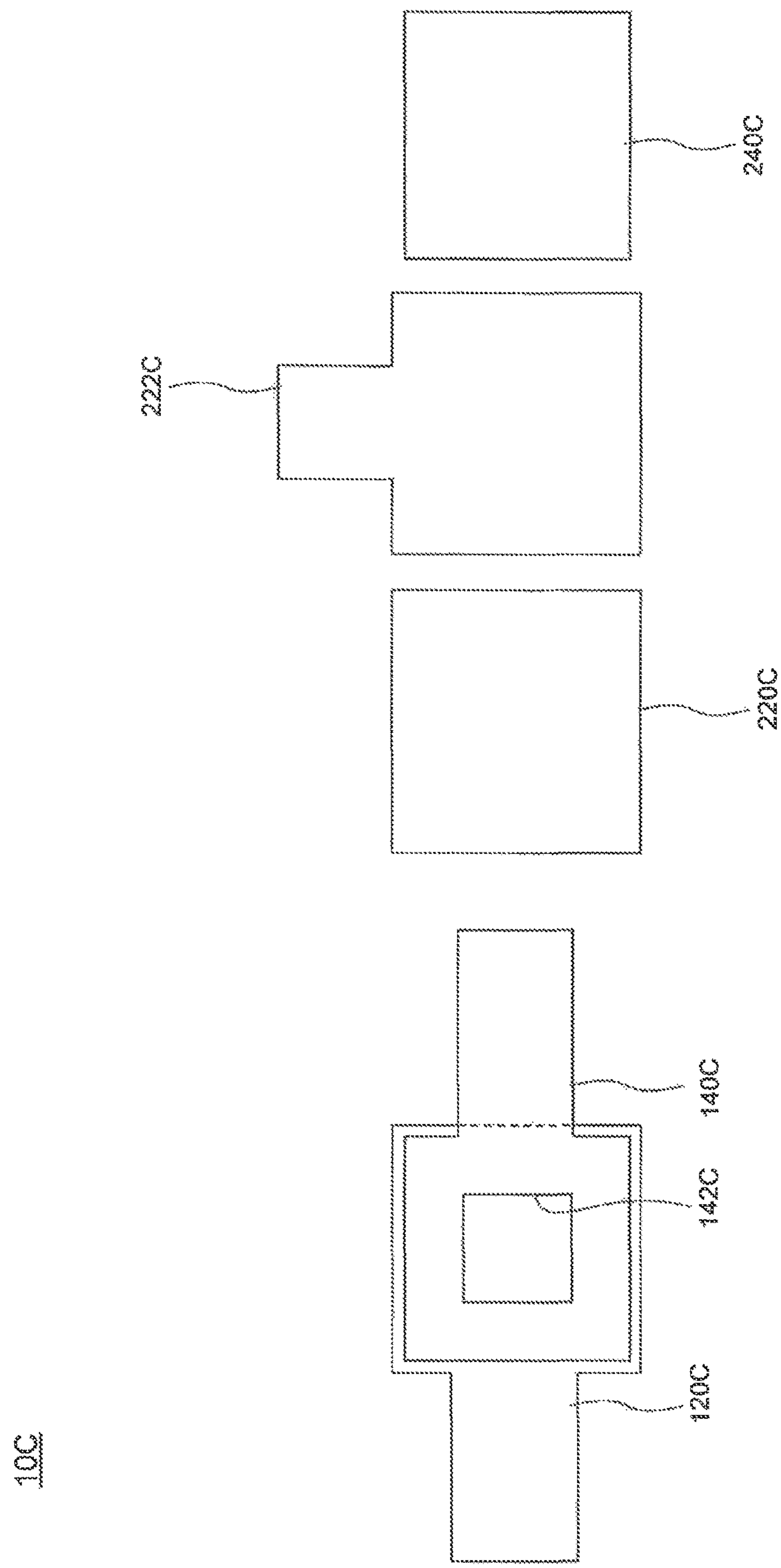
FIG. 31 is a plan view showing a step of forming an upper electrode in the manufacturing method of the semiconductor device in the embodiment according to the present invention.
Figure 32:
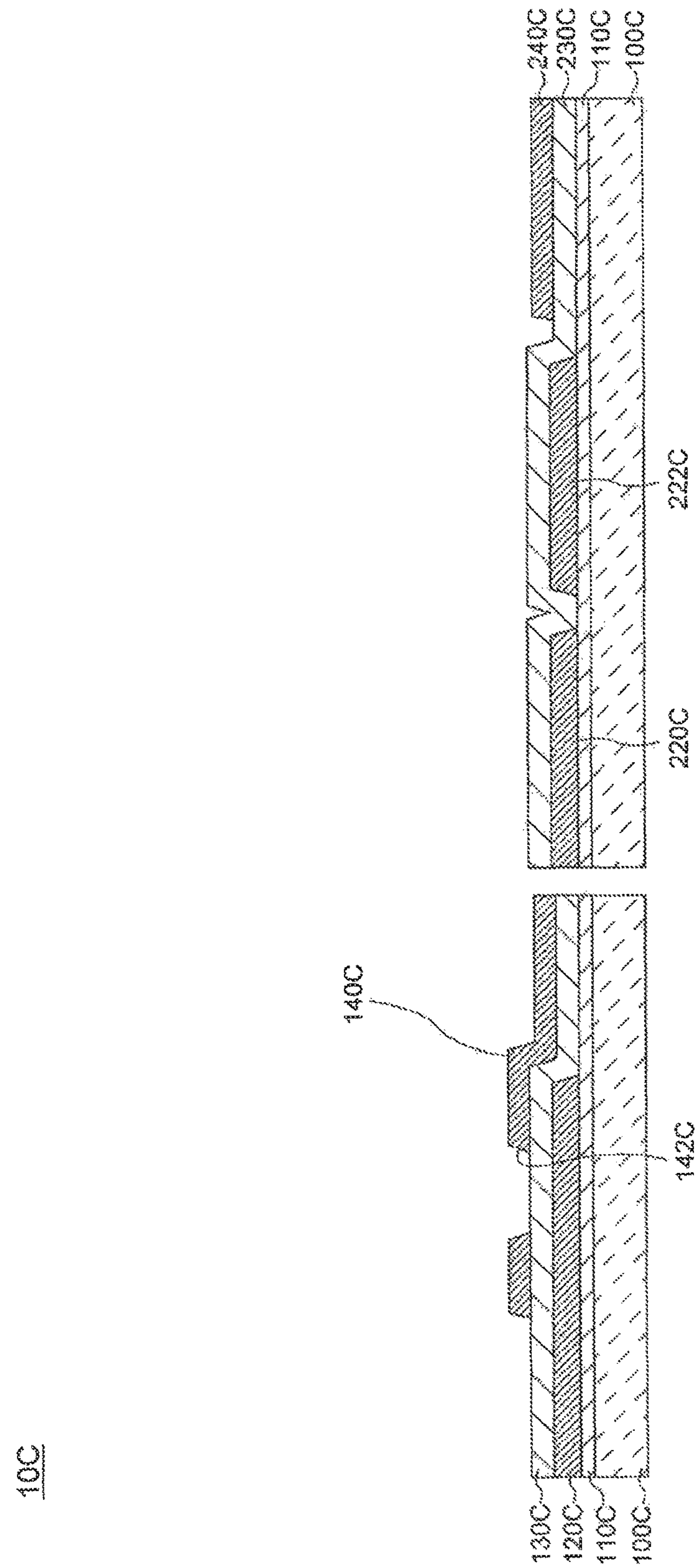
FIG. 32 is a cross-sectional view showing the step of forming the upper electrode in the manufacturing method of the semiconductor device in the embodiment according to the present invention.

FIG. 31 and FIG. 32 are respectively a plan view and a cross-sectional view showing a step of forming the upper electrode 240C in the manufacturing method of the semiconductor device 10C in embodiment 4 according to the present invention. Referring to FIG. 32, a conductive film for the upper electrode 240C is formed on the entirety of the substrate shown in FIG. 30, and patterning is performed as shown in FIG. 31 by photolithography and etching to form the upper electrode 240C. The etching for forming the upper electrode 240C is performed under the same conditions as those for the upper electrode 140C.

Figure 33:
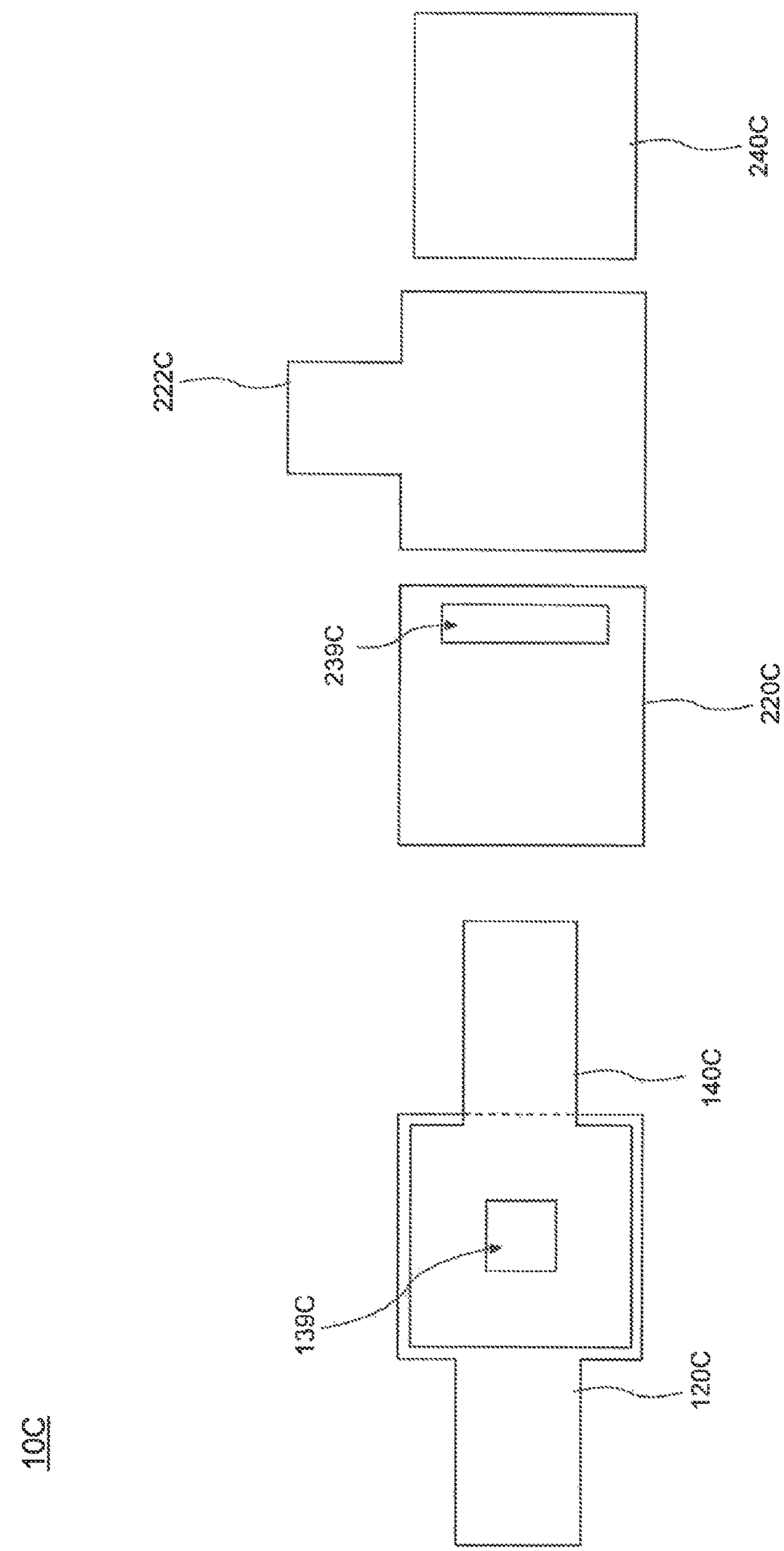
FIG. 33 is a plan view showing a step of forming an opening in an insulating layer in the manufacturing method of the semiconductor device in the embodiment according to the present invention.
Figure 34:
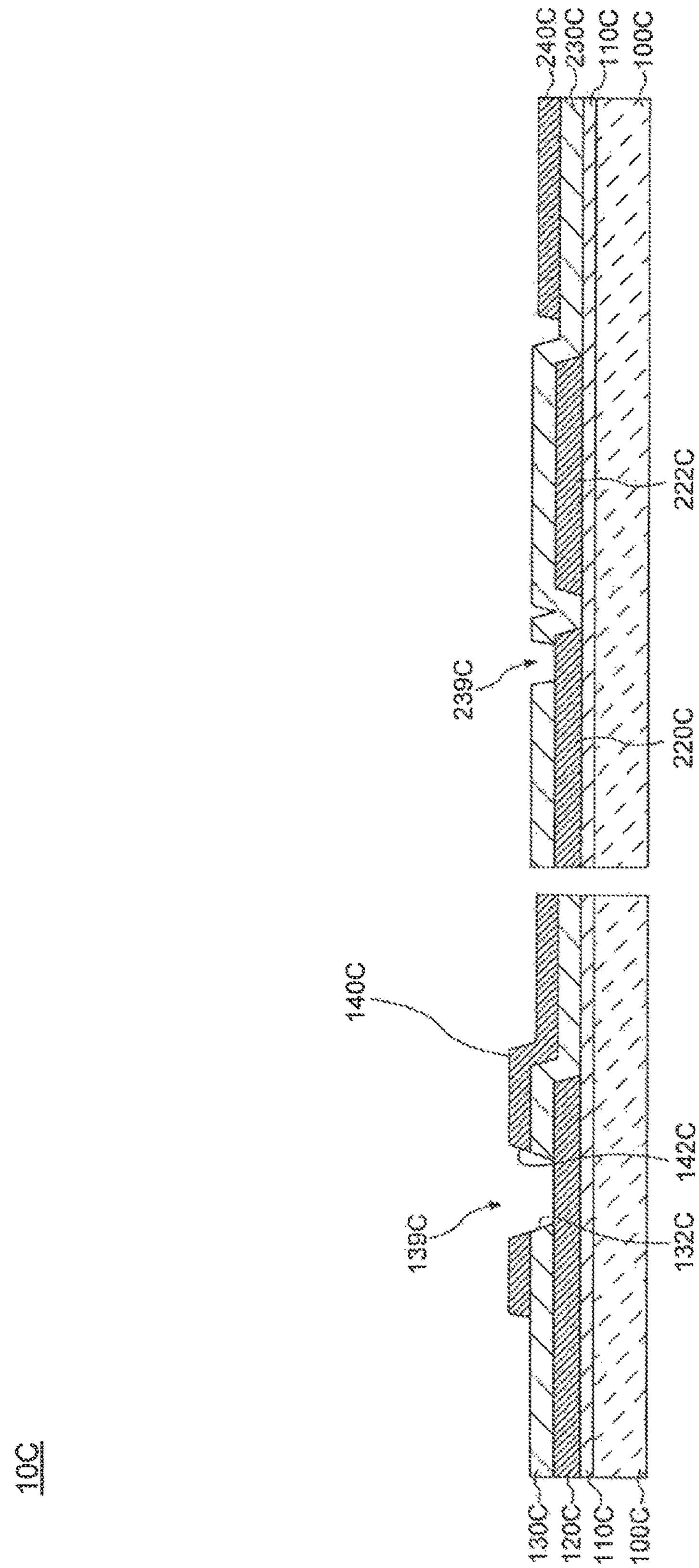
FIG. 34 is a cross-sectional view showing the step of forming the opening in the insulating layer in the manufacturing method of the semiconductor device in the embodiment according to the present invention.

FIG. 33 and FIG. 34 are respectively a plan view and a cross-sectional view showing a step of forming the opening 239C in the insulating layer 230C in the manufacturing method of the semiconductor device 10C in embodiment 4 according to the present invention. Referring to FIG. 34, the substrate shown in FIG. 32 is subjected to photolithography and etching to form the opening 239C having the pattern shown in FIG. 33 in the insulating layer 230C to expose the lower electrode 220C. The etching for forming the opening 239C is performed under the same conditions as those for an opening 139C. In the example shown in FIG. 33, the opening 239C is quadrangular. The opening 239C is not limited to having such a shape, and may be, for example, circular, elliptical, polygonal, curved, or of any of other various appropriate shapes.

Figure 35:
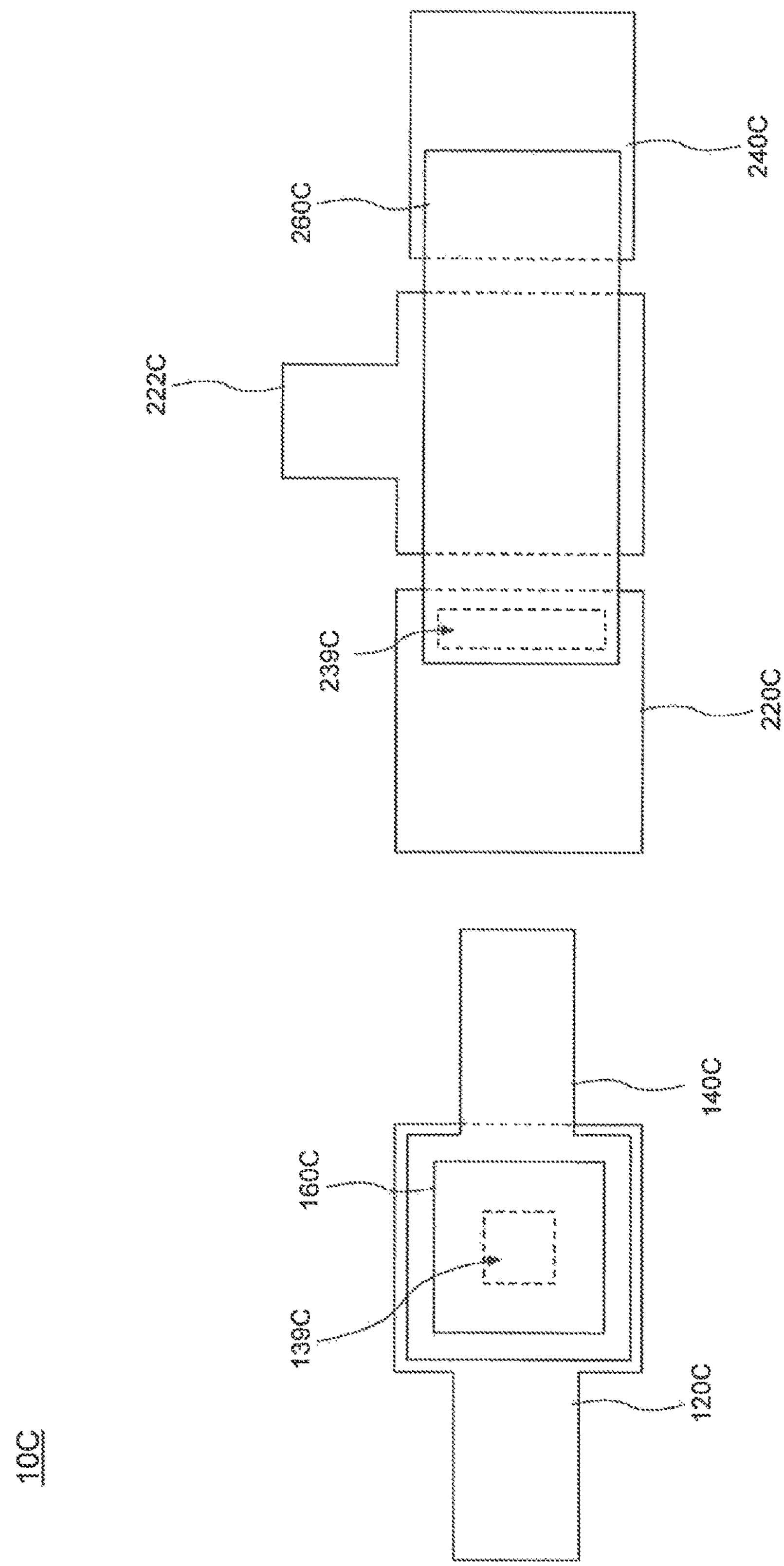
FIG. 35 is a plan view showing a step of forming an oxide semiconductor layer in the manufacturing method of the semiconductor device in the embodiment according to the present invention.
Figure 36:
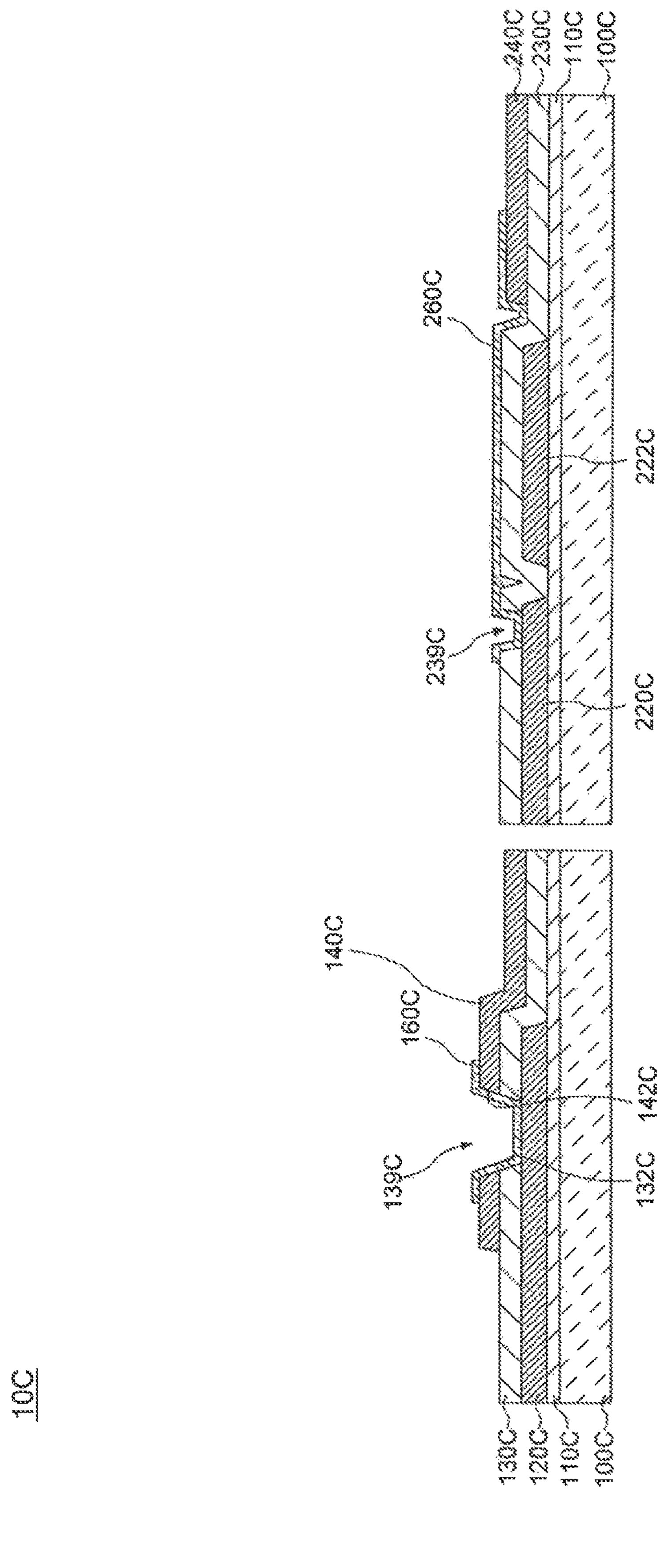
FIG. 36 is a cross-sectional view showing the step of forming the oxide semiconductor layer in the manufacturing method of the semiconductor device in the embodiment according to the present invention.

FIG. 35 and FIG. 36 are respectively a plan view and a cross-sectional view showing a step of forming the oxide semiconductor layer 260C in the manufacturing method of the semiconductor device 10C in embodiment 4 according to the present invention. Referring to FIG. 36, a film for the oxide semiconductor layer 260C is formed on the entirety of the substrate shown in FIG. 34, and patterning is performed as shown in FIG. 35 by photolithography and etching to form the oxide semiconductor layer 260C. The formation of the oxide semiconductor layer 260C by etching may be performed by substantially the same method as in embodiment 1.

Figure 37:
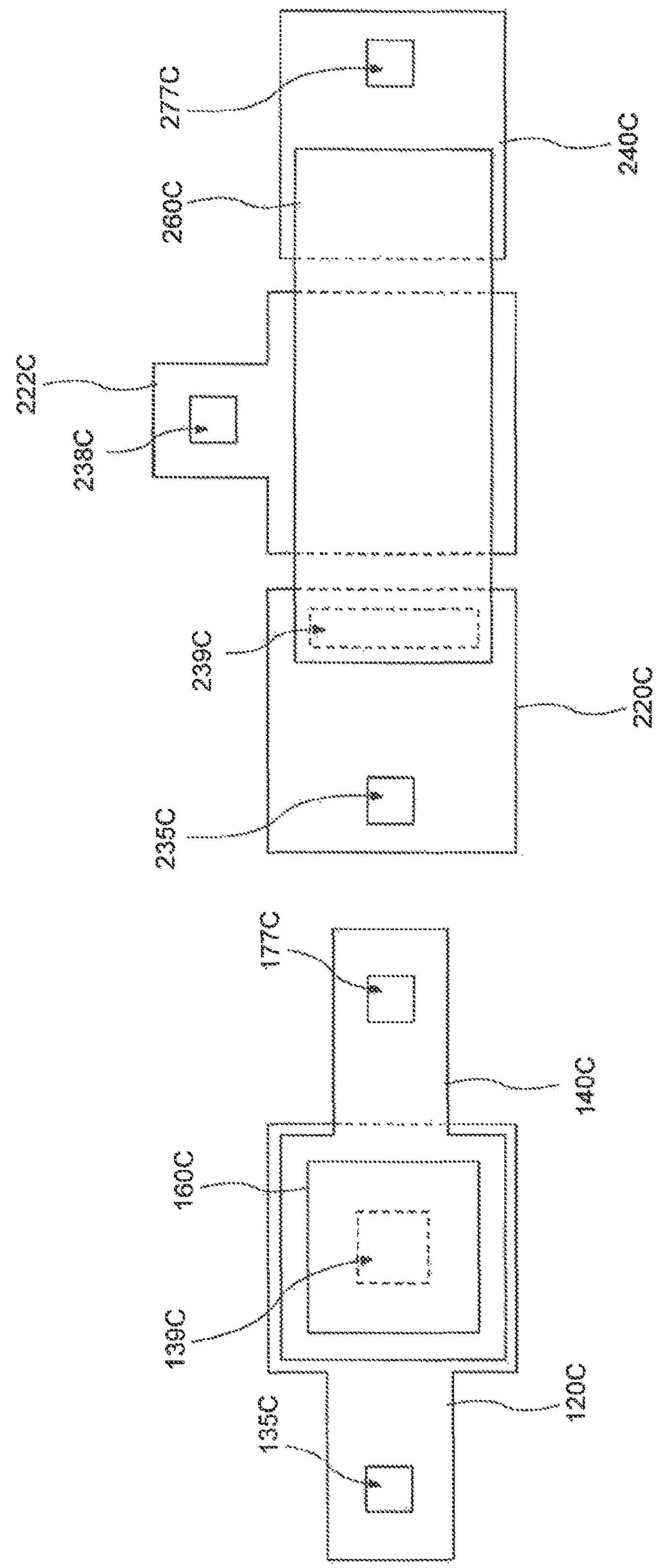
FIG. 37 is a plan view showing a step of forming openings reaching the lower electrode, the upper electrode and the like in the manufacturing method of the semiconductor device in the embodiment according to the present invention.
Figure 38:
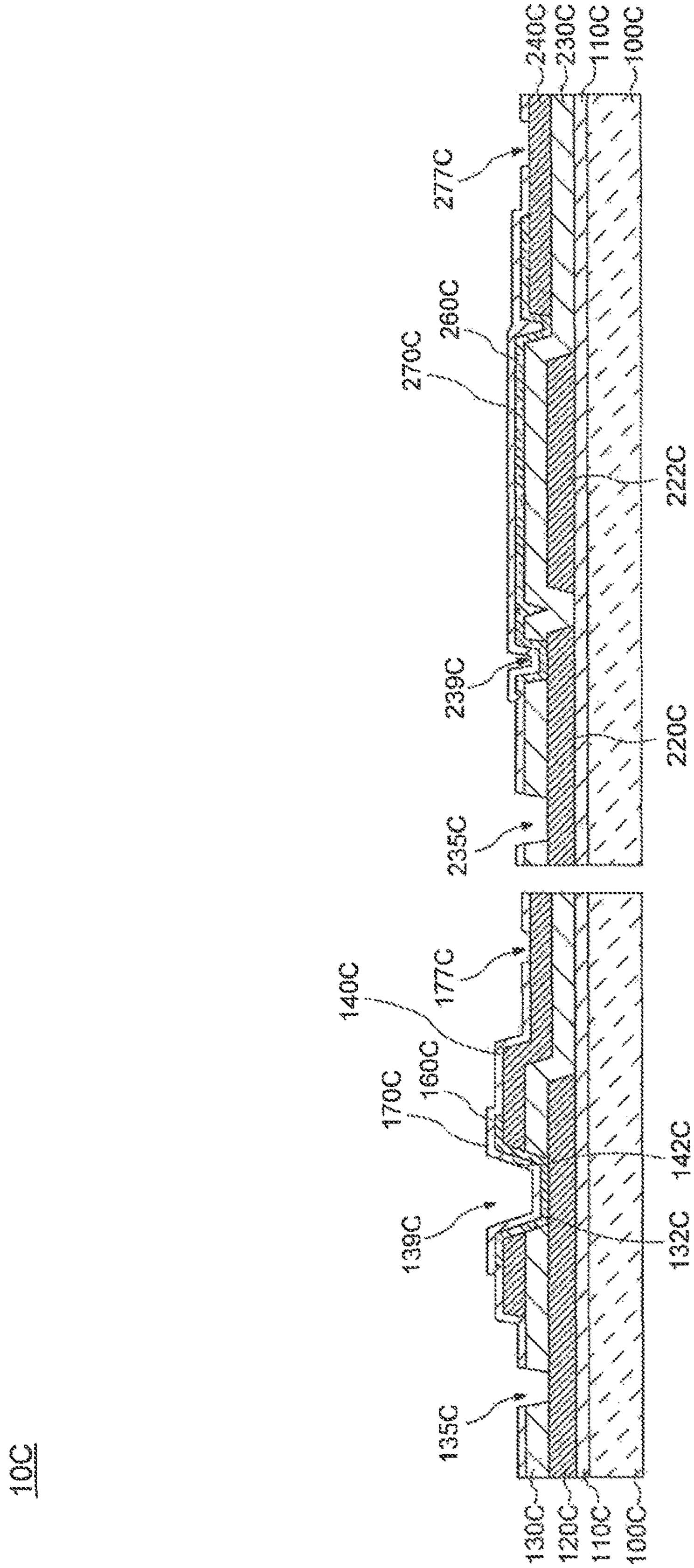
FIG. 38 is a cross-sectional view showing the step of forming the openings reaching the lower electrode, the upper electrode and the like in the manufacturing method of the semiconductor device in the embodiment according to the present invention.

FIG. 37 and FIG. 38 are respectively a plan view and a cross-sectional view showing a step of forming the openings 235C and 277C and also an opening 238C reaching the lower electrode 220C, the upper electrode 240C and the like in the manufacturing method of the semiconductor device 10C in embodiment 4 according to the present invention. Referring to FIG. 38, the gate insulating layer 270C is formed on the entirety of the substrate shown in FIG. 36, and patterning is performed as shown in FIG. 37 by photolithography and etching to form the openings 235C, 238C and 277C. The etching for forming the openings 235C, 238C and 277C is performed under the same conditions as those for openings 135C and 177C.

A conductive layer for the gate electrode 280C, the source line 290C and the drain line 292C is formed on the entirety of the substrate shown in FIG. 38, and patterning is performed as shown in FIG. 27 and FIG. 28 by photolithography and etching to form the gate electrode 280C, the source line 290C and the drain line 292C. The second transistor 30C of the semiconductor device 10C in embodiment 4 according to the present invention is manufactured by the above-described manufacturing method.

As described above, with the manufacturing method of the semiconductor device 10C in embodiment 4 according to the present invention, the first transistor 20C having a channel length of a nanometer order and the second transistor 30C having a channel length of a micrometer order are formed by the same manufacturing method. In addition, the conductive layer and the insulating layers are etched in separate steps. Therefore, the load on the etching device is alleviated.

Embodiment 5

With reference to FIG. 39 through FIG. 48, an overview of a semiconductor 10D in embodiment 5 according to the present invention will be described. The semiconductor device 10D includes a first transistor 20D having a short channel length and a second transistor 30D having a long channel length. The first transistor 20D having a short channel length has substantially the same structure as that of the semiconductor device 10B in embodiment 3. In the following explanation, the features of the first transistor 20D will not be described, and the second transistor 30D having a long channel length will be described. In the following description, components that are the same as, or have the same functions as, those of the semiconductor device 10B will be represented by the same reference signs (numerals) with alphabets, and detailed descriptions thereof will be omitted.

The second transistor 30D is similar to the second transistor 30C shown in FIG. 27 and FIG. 28, but an opening 235D has a shape different from that of the corresponding opening of the second transistor 30C. In the following explanation, the features of the second transistor 30D that are the same as those of the second transistor 30C will not be described, and the above-described difference will be described.

[Structure of the Second Transistor 30D]

Figure 39:
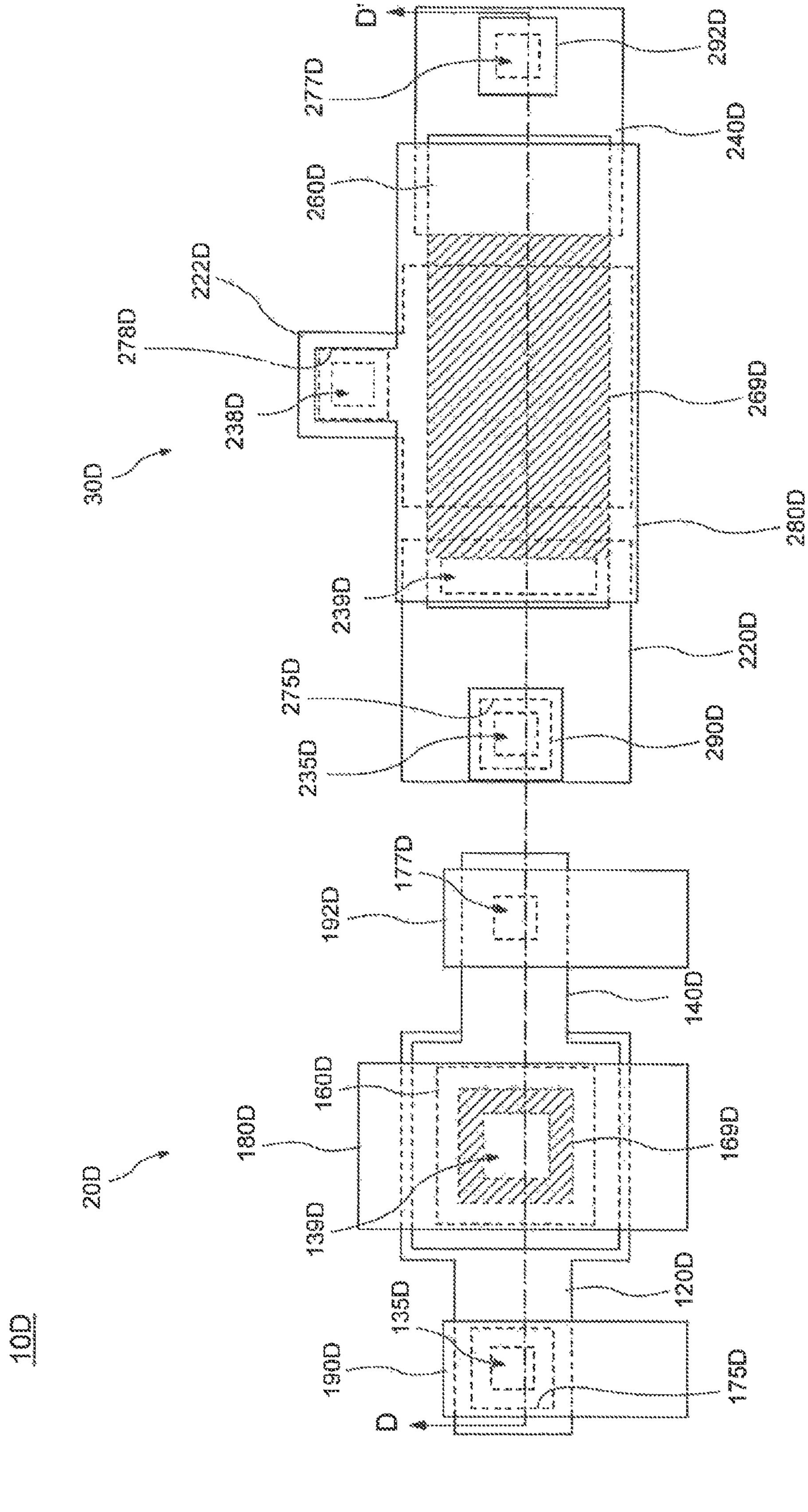
FIG. 39 is a plan view showing an overview of a semiconductor device in an embodiment according to the present invention.
Figure 40:
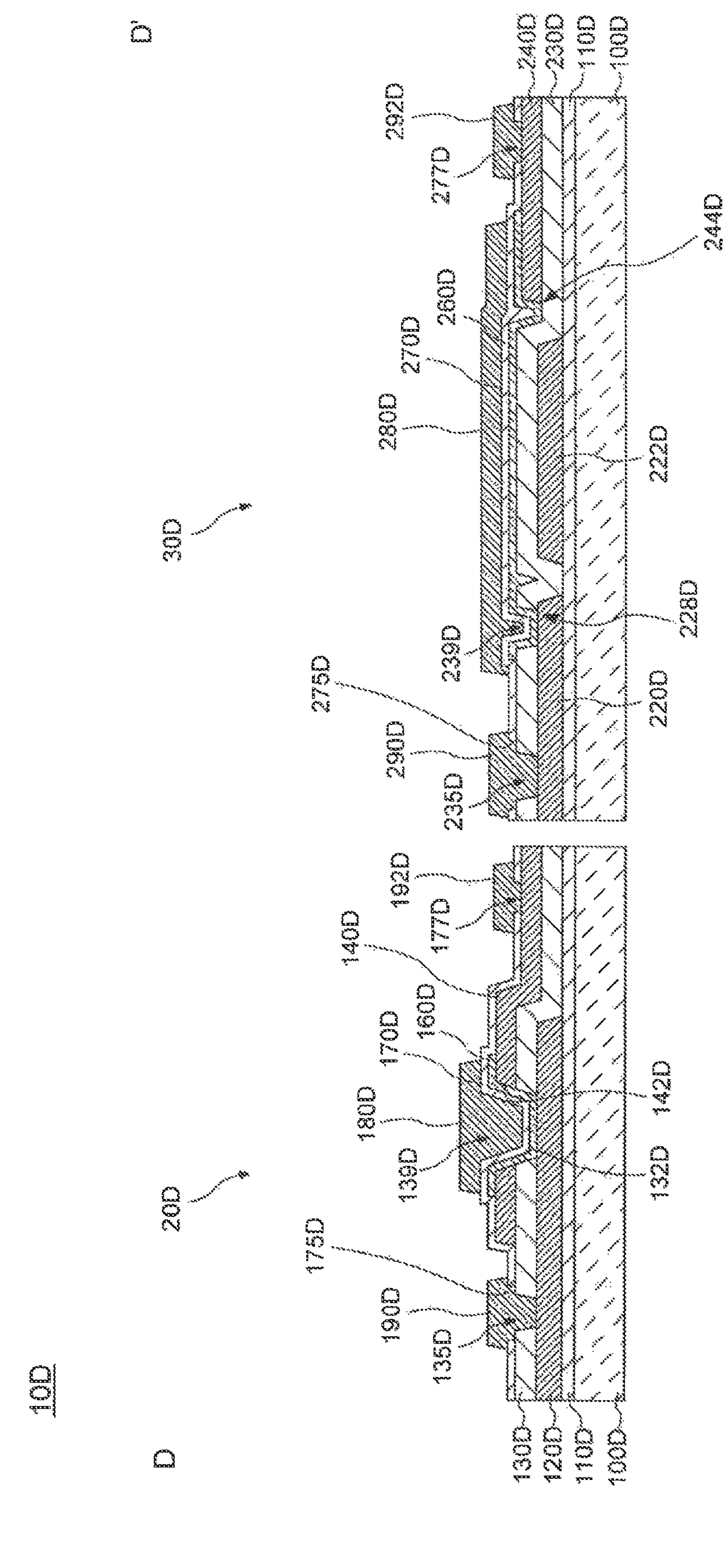
FIG. 40 is a cross-sectional view showing the overview of the semiconductor device in the embodiment according to the present invention.

FIG. 39 and FIG. 40 are respectively a plan view and a cross-sectional view showing an overview of the semiconductor device 10D in embodiment 5 according to the present invention. FIG. 39 is taken along line D-D' in FIG. 39. As shown in FIG. 39 and FIG. 40, in the second transistor 30D, a side wall of the opening 235D formed in an insulating layer 230D and a gate insulating layer 270D is stepped as seen in a cross-sectional view. Specifically, in the opening 235D, the opening in the gate insulating layer 270D has a diameter longer than the diameter of the opening in the insulating layer 230D. In other words, a side wall 275D of the gate insulating layer 270D that is exposed to the opening 235D is located on a top surface of the insulating layer 230D, and extends upward from the top surface of the insulating layer 230D. The opening 235D having such a shape is formed by a manufacturing method of the second transistor 30D described below. Specifically, the step of forming the opening in the insulating layer 230D and the step of forming the opening in the gate insulating layer 270D are performed at different timings. As a result, the opening 235D having the shape shown in FIG. 40 is formed.

[Manufacturing Method of the Second Transistor 30D]

With reference to plan views and cross-sectional views provided in FIG. 41 through FIG. 48, a manufacturing method of the second transistor 30D of the semiconductor device 10D in embodiment 5 according to the present invention will be described.

Figure 41:
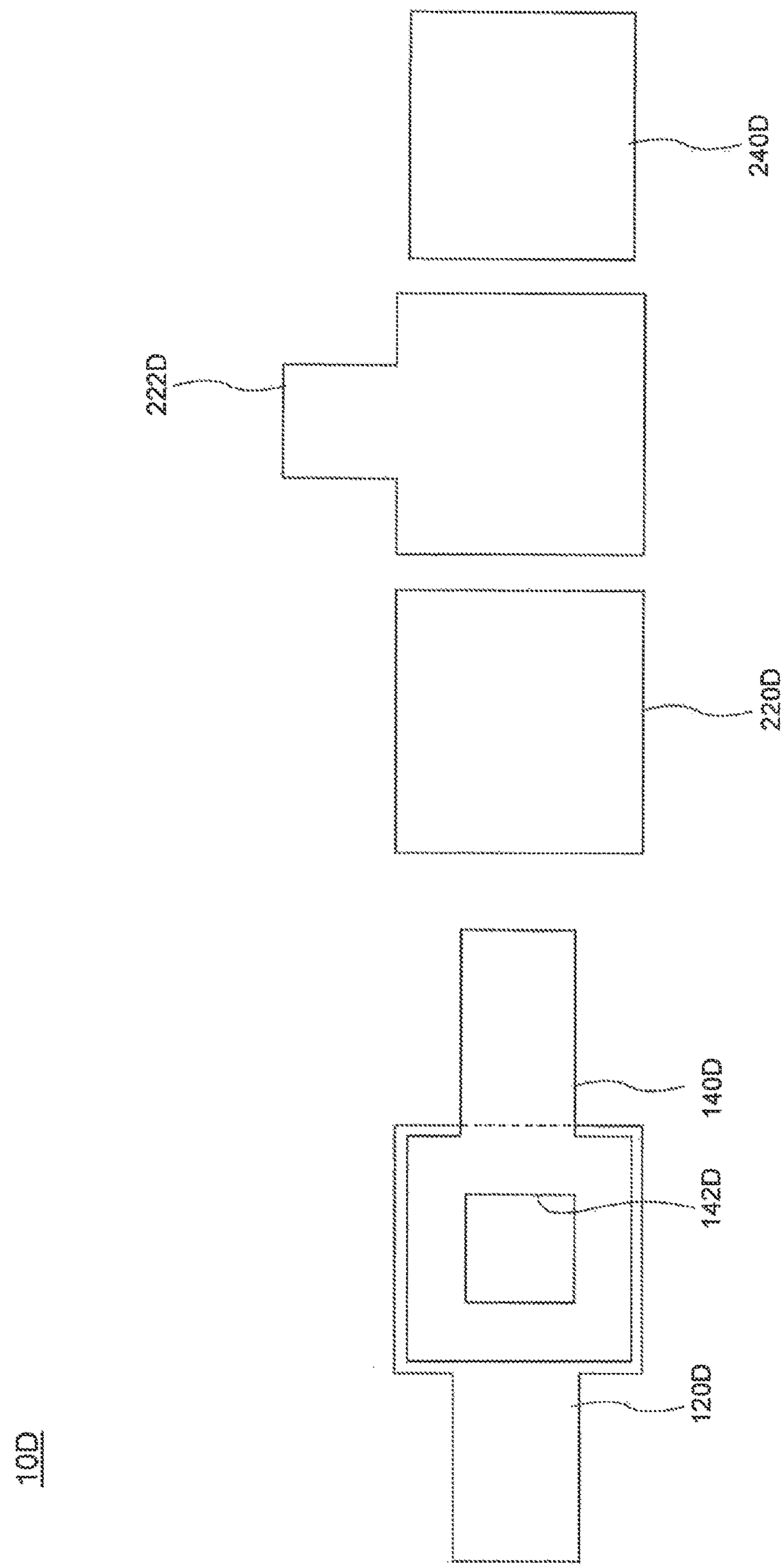
FIG. 41 is a plan view showing a step of forming an upper electrode in a manufacturing method of the semiconductor device in the embodiment according to the present invention.
Figure 42:
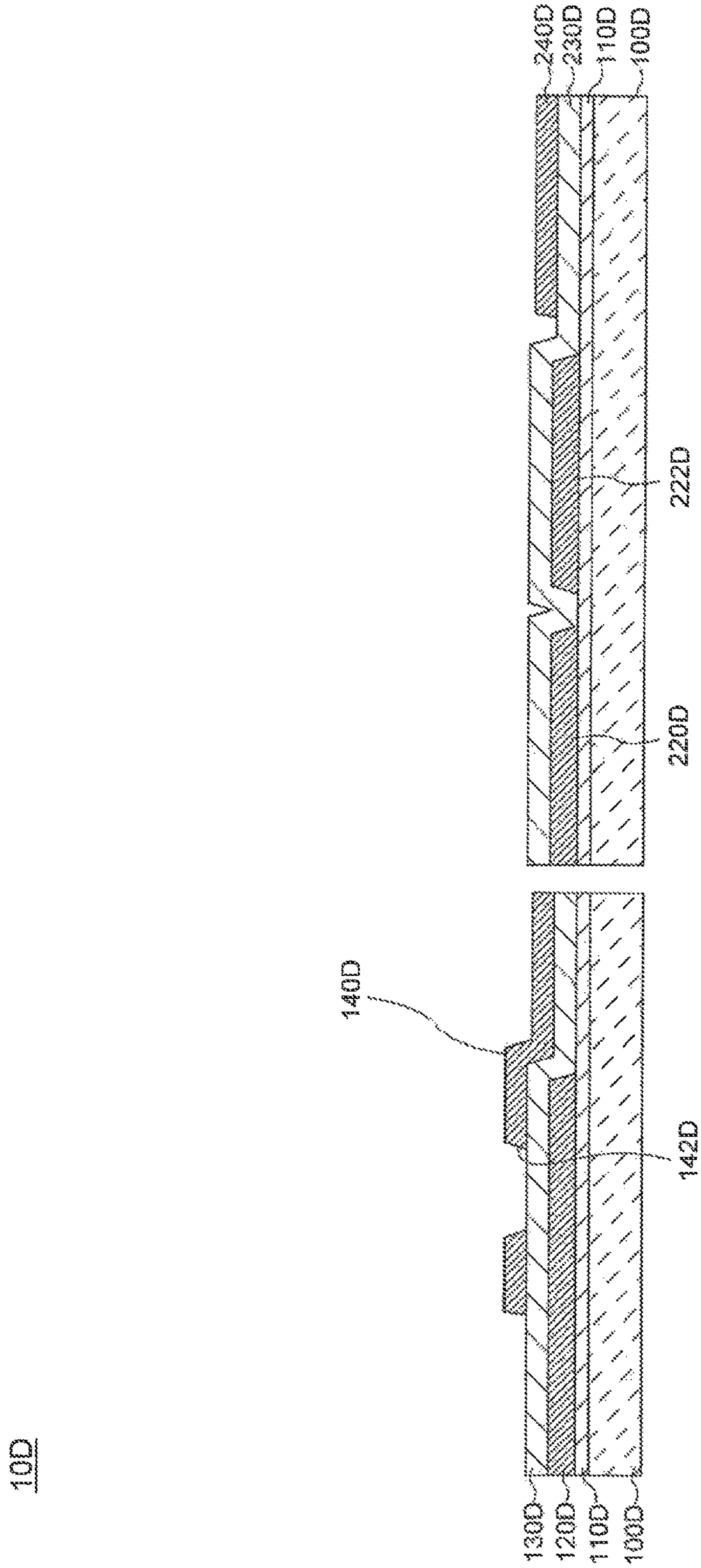
FIG. 42 is a cross-sectional view showing the step of forming the upper electrode in the manufacturing method of the semiconductor device in the embodiment according to the present invention.

FIG. 41 and FIG. 42 are respectively a plan view and a cross-sectional view showing a step of forming an upper electrode 240D in the manufacturing method of the semiconductor device 10D in embodiment 5 according to the present invention. A lower electrode 220D, a back gate 222D, and the insulating layer 230D are formed by substantially the same method as shown in FIG. 29 and FIG. 30 regarding embodiment 4. Referring to FIG. 42, a conductive film for the upper electrode 240D is formed on the entirety of the resultant substrate, and patterning is performed as shown in FIG. 41 by photolithography and etching to form the upper electrode 240D. The etching for forming the upper electrode 240D is performed under the same conditions as those for an upper electrode 140D. The back gate 222D may be omitted.

Figure 43:
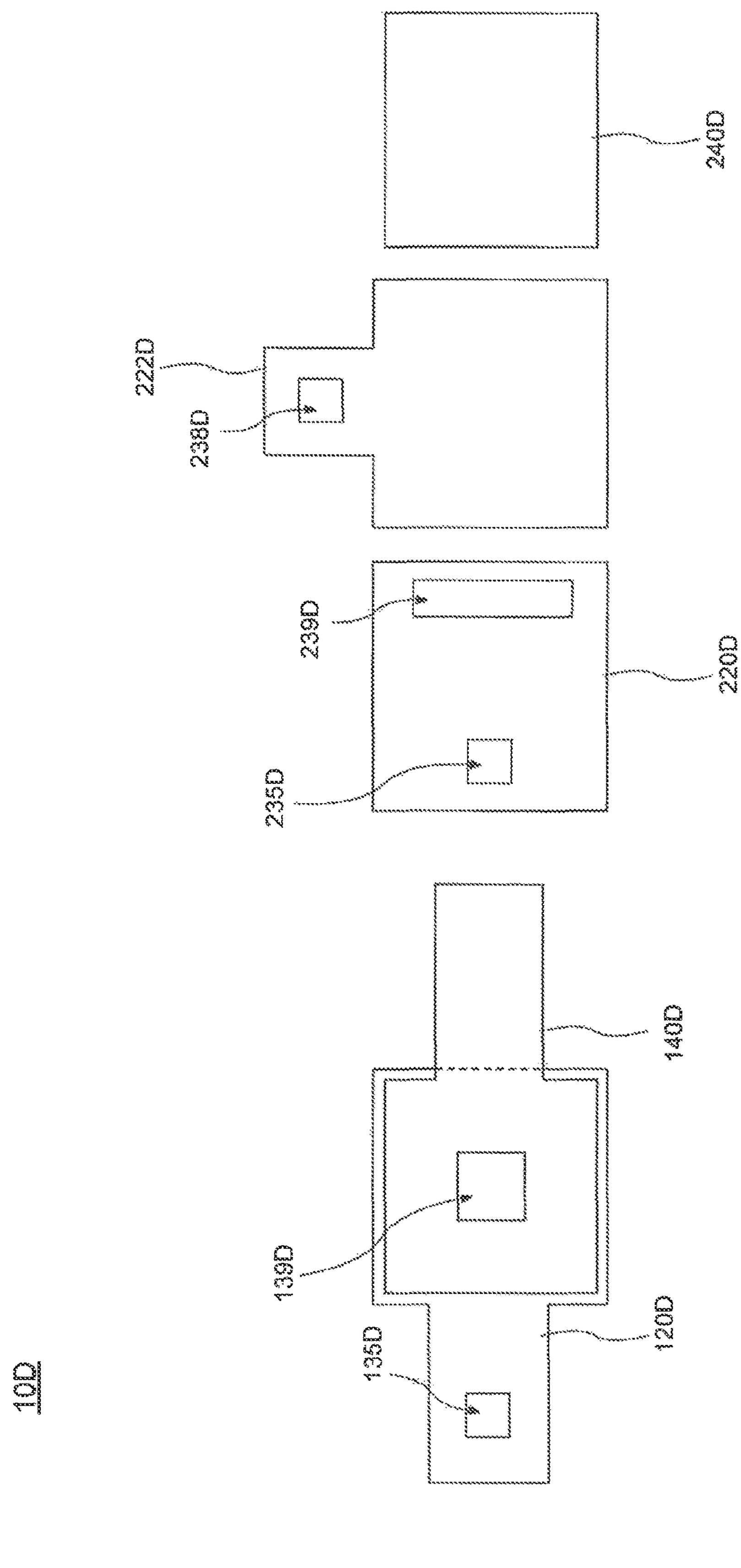
FIG. 43 is a plan view showing a step of forming openings in an insulating layer in the manufacturing method of the semiconductor device in the embodiment according to the present invention.
Figure 44:
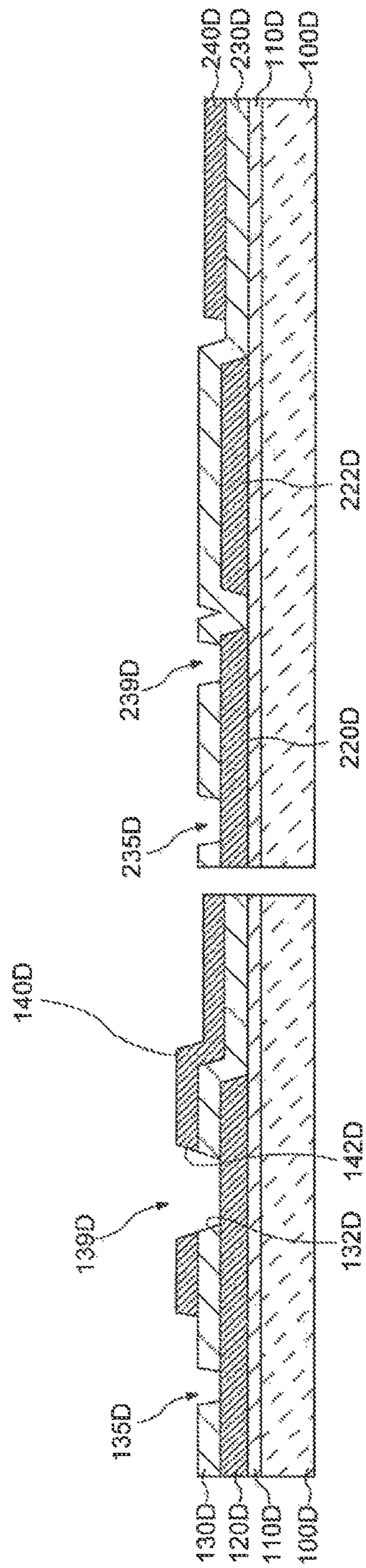
FIG. 44 is a cross-sectional view showing the step of forming the openings in the insulating layer in the manufacturing method of the semiconductor device in the embodiment according to the present invention.

FIG. 43 and FIG. 44 are respectively a plan view and a cross-sectional view showing a step of forming the opening 235D and also openings 238D and 239D in the insulating layer 230D in the manufacturing method of the semiconductor device 10D in embodiment 5 according to the present invention. Referring to FIG. 44, the substrate shown in FIG. 42 is subjected to photolithography and etching to form the openings 235D and 239D in the insulating layer 230D to expose the lower electrode 220D and to form the opening 238D to expose the back gate 222D. The openings 235D, 238D and 239D have patterns shown in FIG. 43. The etching for forming the openings 235D, 238D and 239D is performed under the same conditions as those for openings 135D and 139D.

Figure 45:
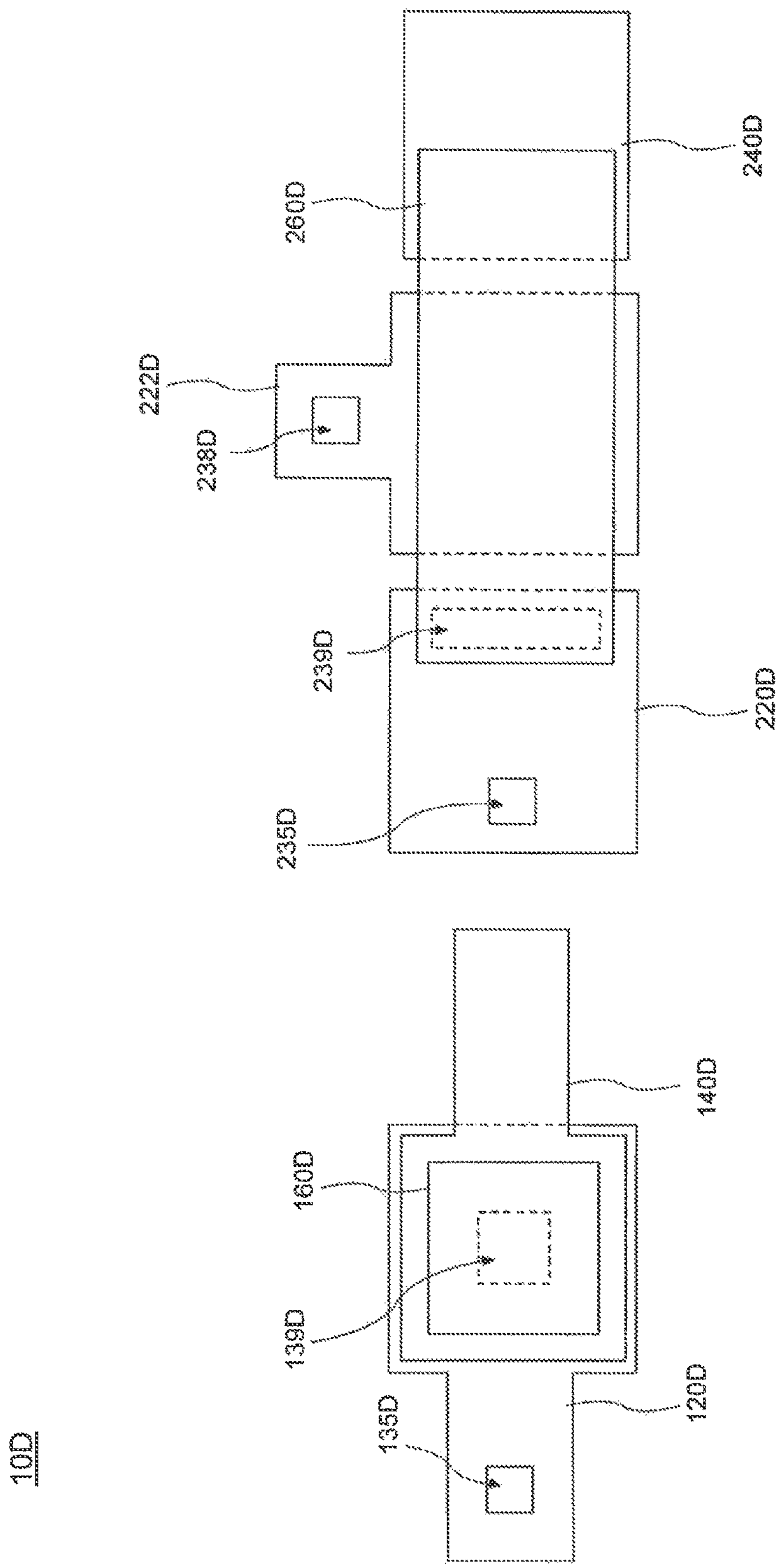
FIG. 45 is a plan view showing a step of forming an oxide semiconductor layer in the manufacturing method of the semiconductor device in the embodiment according to the present invention.
Figure 46:
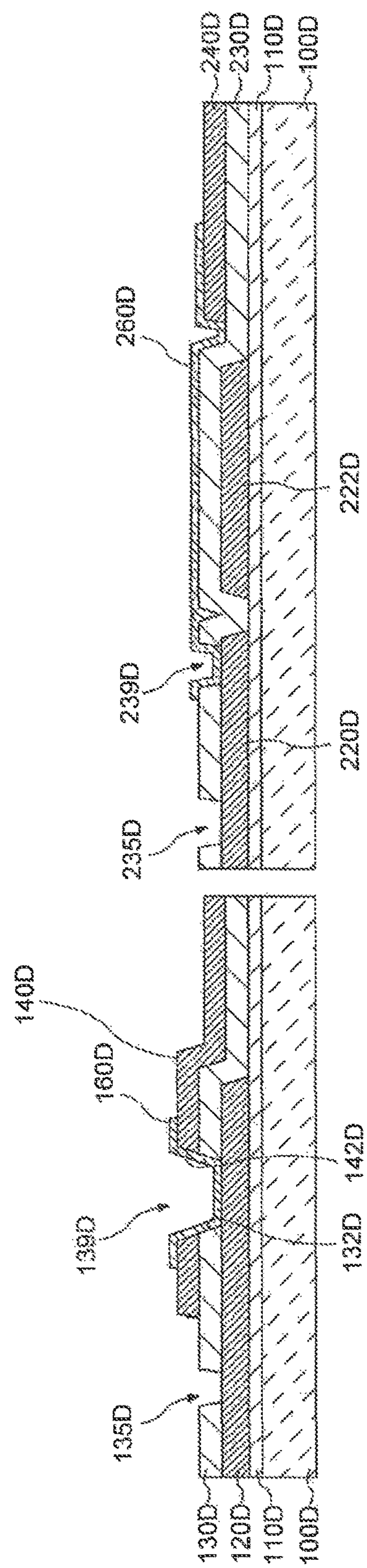
FIG. 46 is a cross-sectional view showing the step of forming the oxide semiconductor layer in the manufacturing method of the semiconductor device in the embodiment according to the present invention.

FIG. 45 and FIG. 46 are respectively a plan view and a cross-sectional view showing a step of forming an oxide semiconductor layer 260D in the manufacturing method of the semiconductor device 10D in embodiment 5 according to the present invention. Referring to FIG. 46, a film for the oxide semiconductor layer 260D is formed on the entirety of the substrate shown in FIG. 44, and patterning is performed as shown in FIG. 45 by photolithography and etching to form the oxide semiconductor layer 260D. The formation of the oxide semiconductor layer 260D by etching may be performed by substantially the same method as in embodiment 1.

Figure 47:
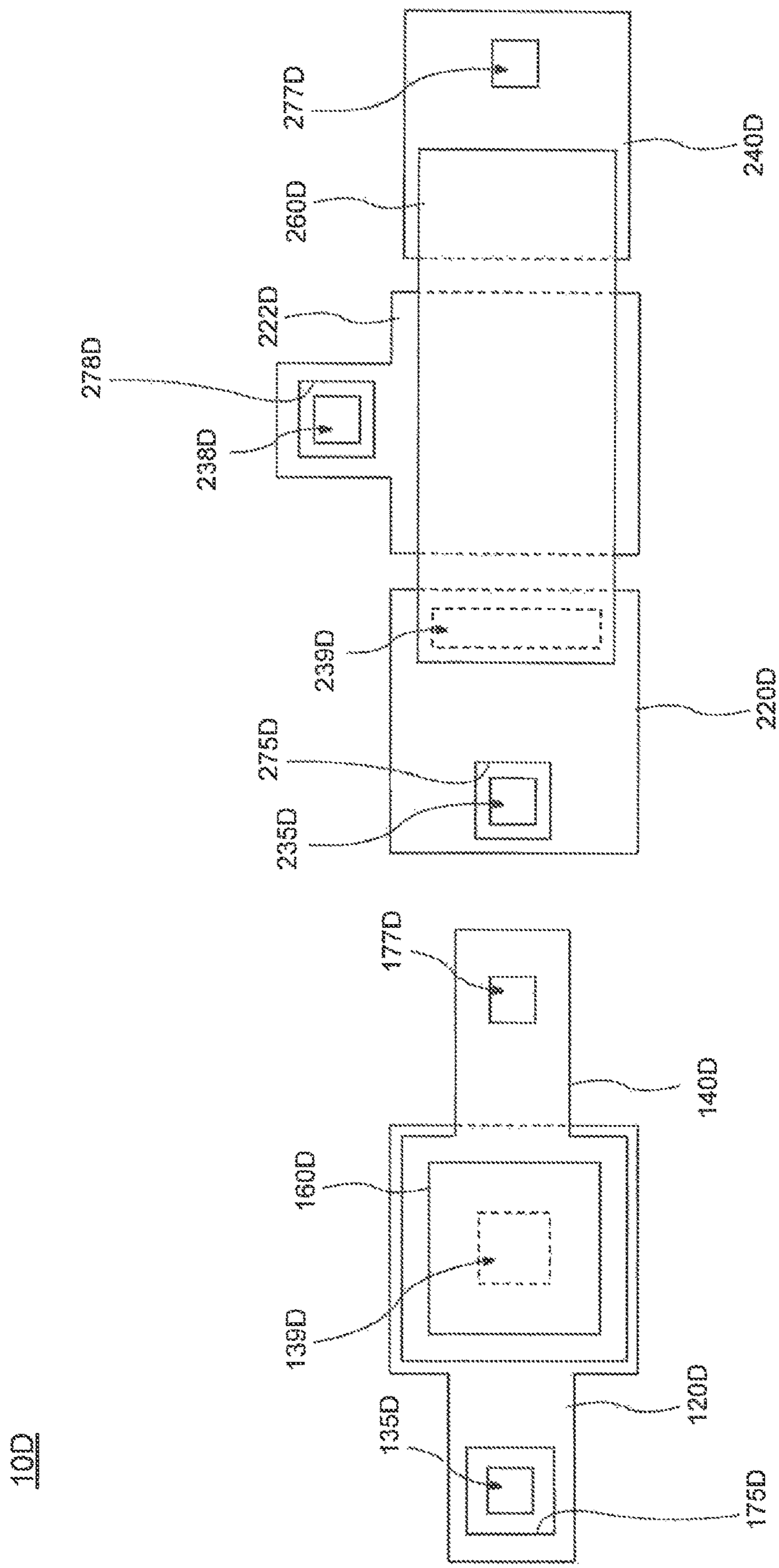
FIG. 47 is a plan view showing a step of forming openings exposing a lower electrode, the upper electrode and the like in the manufacturing method of the semiconductor device in the embodiment according to the present invention.
Figure 48:
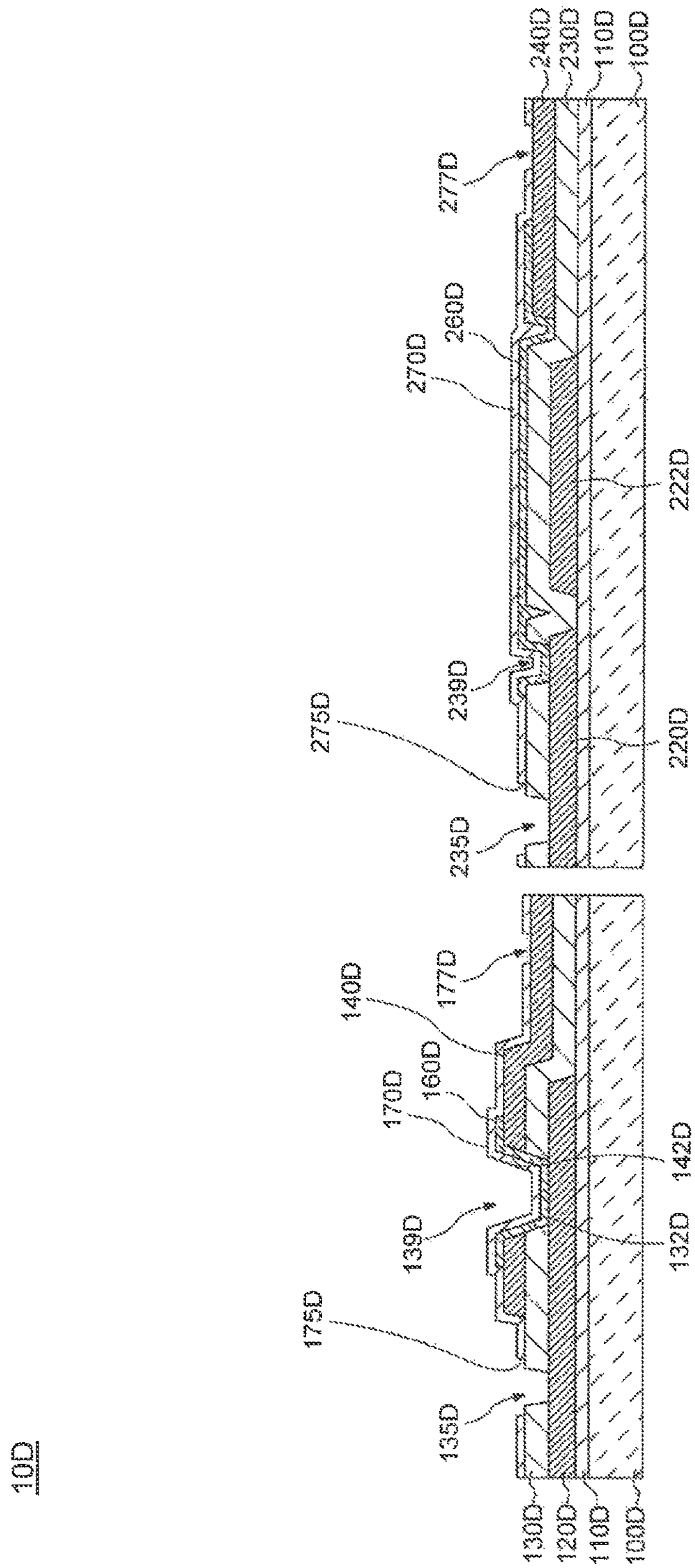
FIG. 48 is a cross-sectional view showing the step of forming the openings exposing the lower electrode, the upper electrode and the like in the manufacturing method of the semiconductor device in the embodiment according to the present invention.

FIG. 47 and FIG. 48 are respectively a plan view and a cross-sectional view showing a step of forming openings exposing the lower electrode 220D, the upper electrode 240D and the like in the manufacturing method of the semiconductor device 10D in embodiment 5 according to the present invention. Referring to FIG. 48, the gate insulating layer 270D is formed on the entirety of the substrate shown in FIG. 46, and patterning is performed as shown in FIG. 47 by photolithography and etching to form openings in regions corresponding to the opening 235D and 283D and also to form an opening 277D. The etching for forming the openings 235D, 238D and 277D is performed under the same conditions as those for openings 135D and 177D.

A conductive layer for a gate electrode 280D, a source line 290D and a drain line 292D is formed on the entirety of the substrate shown in FIG. 48, and patterning is performed as shown in FIG. 39 and FIG. 40 by photolithography and etching to form the gate electrode 280D, the source line 290D and the drain line 292D. The second transistor 30D of the semiconductor device 10D in embodiment 5 according to the present invention is manufactured by the above-described manufacturing method.

As described above, with the manufacturing method of the semiconductor device 10D in embodiment 5 according to the present invention, the first transistor 20D having a channel length of a nanometer order and the second transistor 30D having a channel length of a micrometer order are formed by the same manufacturing method. In addition, the conductive layer and the insulating layers are etched in separate steps. Therefore, the load on the etching device is alleviated.

Embodiment 6

With reference to FIG. 49 through FIG. 60, an overview of a semiconductor 10E in embodiment 6 according to the present invention will be described.

[Structure of the Semiconductor Device 10E]

Figure 49:
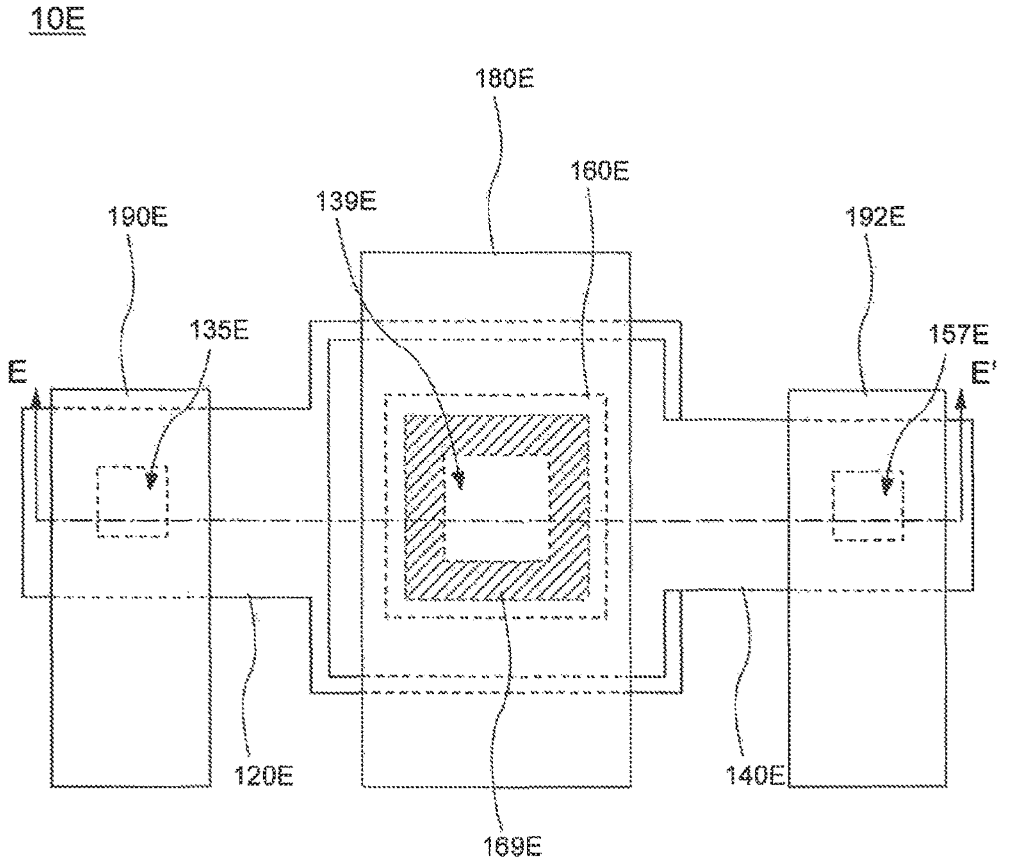
FIG. 49 is a plan view showing an overview of a semiconductor device in an embodiment according to the present invention.
Figure 50:
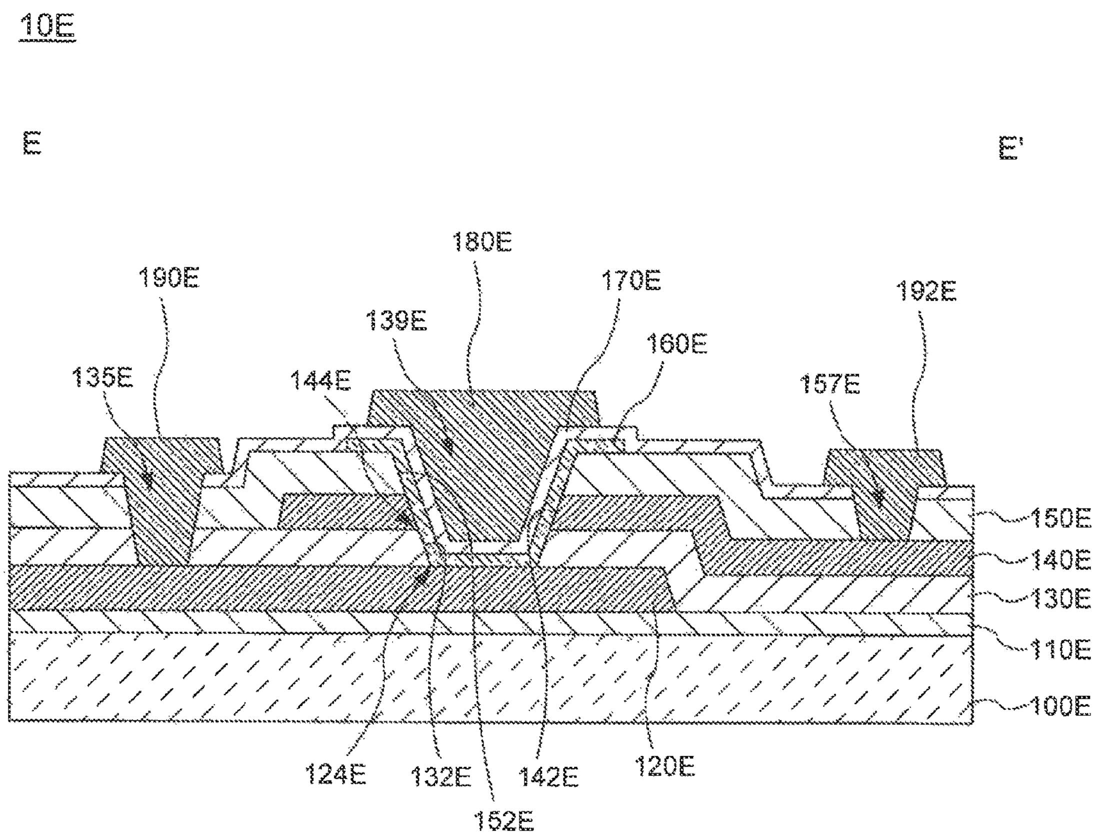
FIG. 50 is a cross-sectional view showing the overview of the semiconductor device in the embodiment according to the present invention.

FIG. 49 and FIG. 50 are respectively a plan view and a cross-sectional view showing an overview of the semiconductor device 10E in embodiment 6 according to the present invention. FIG. 50 is taken along line E-E' in FIG. 49. As shown in FIG. 49 and FIG. 50, the semiconductor device 10E includes a substrate 100E, an underlying insulating layer 110E, a lower electrode 120E, an insulating layer 130E, an upper electrode 140E, an insulating layer 150E, an oxide semiconductor layer 160E, a gate insulating layer 170E, a gate electrode 180E, a source line 190E, and a drain line 192E. An opening 139E is provided in the insulating layer 130E, the upper electrode 140E and the insulating layer 150E, and reaches the lower electrode 120E. An opening 135E is provided in the insulating layers 130E and 150E and the gate insulating layer 170E, and reaches the lower electrode 120E. An opening 157E is provided in the insulating layer 150E and the gate insulating layer 170E, and reaches the upper electrode 140E.

The underlying insulating layer 110E is located on the substrate 100E. The lower electrode 120E is located on the underlying insulating layer 110E. The insulating layer 130E is located on the lower electrode 120E and on the underlying insulating layer 110E. The upper electrode 140E is located on the insulating layer 130E. The insulating layer 150E is located on the upper electrode 140E and on the insulating layer 130E. In the opening 139E, the insulating layer 130E has an insulating layer side wall 132E, the upper electrode 140E has an electrode side wall 142E, and the insulating layer 150E has an insulating layer side wall 152E.

The oxide semiconductor layer 160E is located in the opening 139E, and is connected with the lower electrode 120E and the upper electrode 140E. In more detail, the oxide semiconductor layer 160E is located on the lower electrode 120E, on the insulating layer side wall 132E, on the electrode side wall 142E, and on the insulating layer side wall 152E. The oxide semiconductor layer 160E is in contact with a top surface of the lower electrode 120E that is exposed to the opening 139E and thus is connected with the lower electrode 120E, and is in contact with the electrode side wall 142E in the opening 139E and thus is connected with the upper electrode 140E. In FIG. 50, the oxide semiconductor layer 160E extends continuously from the insulating layer side wall 152E to a top surface of the insulating layer 150E.

As shown in FIG. 49, the insulating layer side wall 132E has a closed quadrangular shape along the shape of the opening 139E. Similar to the insulating layer side wall 132E, the electrode side wall 142E and the insulating layer side wall 152E each have a closed quadrangular shape along the shape of the opening 139E.

The gate electrode 180E is located to face the oxide semiconductor layer 160E. The gate insulating layer 170E is located between the oxide semiconductor layer 160E and the gate electrode 180E. In the semiconductor device 10E, a portion of the oxide semiconductor layer 160E that is located on the insulating layer side wall 132E acts as a channel. Therefore, the gate electrode 180E is located to face at least the portion of the oxide semiconductor layer 160E that is located on the insulating layer side wall 132E.

The source line 190E is connected with the lower electrode 120E via the opening 135E. The drain line 192E is connected with the upper electrode 140E via the opening 157E. The source line 190E and the drain line 192E may be replaced with each other. Namely, the line 190E may act as the drain line, whereas the line 192E may act as the source line. As shown in FIG. 50, the source line 190E and the drain line 192E form the same layer with the gate electrode 180E. It should be noted that the source line 190E and the drain line 192E may form a layer different from that of the gate electrode 180E.

The structure of the semiconductor device 10E may be expressed as follows. The semiconductor device 10E includes the lower electrode 120E, the insulating layer 130E having the insulating layer side wall 132E while being on the lower electrode 120E, the upper electrode 140E having the electrode side wall 142E while being on the insulating layer 130E, the insulating layer 150E on the upper electrode 140E, the oxide semiconductor layer 160E located on the insulating layer side wall 132E, the electrode side wall 142E and the top surface of the insulating layer 150E and connected with the lower electrode 120E and the upper electrode 140E, the gate electrode 180E located to face the oxide semiconductor layer 160E, and the gate insulating layer 170E located between the oxide semiconductor layer 160E and the gate electrode 180E.

[Shapes of the Insulating Layer Side Wall 132E, the Electrode Side Wall 142E and the Insulating Layer Side Wall 152E]

Now, the shape of each of the insulating layer side wall 132E, the electrode side wall 142E and the insulating layer side wall 152E will be described in detail. As shown in FIG. 50, the insulating layer side wall 132E, the electrode side wall 142E and the insulating layer side wall 152E are all forward-tapered. The tapered shapes of the insulating layer side wall 132E, the electrode side wall 142E and the insulating layer side wall 152E are continuous with each other. Namely, in a region in the vicinity of the opening 139E, a top surface of the insulating layer 130E is covered with the upper electrode 140E, and a top surface of the upper electrode 140E is covered with the insulating layer 150E. It should be noted that the tapered shapes of these side walls do not need to be continuous with each other. For example, the opening in the upper electrode 140E may have a diameter longer than the diameter of the opening in the insulating layer 130E, so that the top surface of the insulating layer 130E is exposed from the upper electrode 140E. Similarly, the opening in the insulating layer 150E may have a diameter longer than the diameter of the opening in the upper electrode 140E, so that the top surface of the upper electrode 140E is exposed from the insulating layer 150E. The tapered insulating layer side wall 132E, the tapered electrode side wall 142E and the tapered insulating layer side wall 152E may have different tapering angles from each other.

In the example shown in FIG. 50, the forward-tapered insulating layer side wall 132E and the forward-tapered insulating layer side wall 152E are linear as seen in a cross-sectional view. Neither the insulating layer side wall 132E nor the insulating layer side wall 152E is limited to having such a structure. The forward-tapered insulating layer side walls 132E and 152E may be, for example, curved as protruding outward or curved as protruding inward. Instead of being forward-tapered, namely, instead of tending to open upward, the insulating layer side walls 132E and 152E may be vertical with respect to the top surfaces of the insulating layers 130E and 150E, or may be reverse-tapered, namely, may incline while tending to open downward. The electrode side wall 142E may have substantially the same shape as described above. The insulating layer side wall 132E, the insulating layer side wall 152E and the electrode side wall 142E may have the same shape as, or different shapes from, each other.

In the example shown in FIG. 50, the insulating layer 130E and the insulating layer 150E are each formed of a single film. The insulating layers 130E and 150E are not limited to having such a structure, and may each be formed of a stack including a plurality of films. In the case where the insulating layer 130E and the insulating layer 150E are each formed of a stack of films, the tapering angle and the shape of each of the insulating layer side walls 132E and 152E may be different film by film. Alternatively, the insulating layers 130E and 150E may each be formed of a stack of films of different properties (e.g., $SiN_x$ and $SiO_x$), so that different portions, along the insulating layer side walls 132E and 152E, of the oxide semiconductor layer 160E have different properties. Namely, the semiconductor device 10E may have a channel formed of the portions of the oxide semiconductor layer 160E that are of different characteristics and are connected to each other in series. As described below, it is preferable that the upper electrode 140E is formed of a stack of conductive films having different properties from each other.

[Materials of the Components of the Semiconductor Device 10E]

The substrate 100E, the underlying insulating layer 110E, the lower electrode 120E, the insulating layer 130E, the upper electrode 140E, the oxide semiconductor layer 160E, the gate insulating layer 170E, the gate electrode 180E, the source line 190E and the drain line 192E may be formed of any of the same materials as described above in embodiment 1.

The insulating layer 150E may be formed of an inorganic insulating material such as $SiO_x$, $SiN_x$, $SiO_xN_y$, $SiN_xO_y$, $AlO_x$, $AlN_x$, $AlO_xN_y$, $AlN_xO_y$, TEOS or the like, or an organic insulating material such as a polyimide resin, an acrylic resin, an epoxy resin, a silicone resin, a fluorine resin, a siloxane resin, or the like. The insulating layer 150E may be formed by substantially the same method as that of the underlying insulating layer 110 described in embodiment 1. The insulating layer 150E may be formed of the same material as, or different materials from, the insulating layer 130E or the underlying insulating layer 110E.

As described above, the semiconductor device 10E in embodiment 6 according to the present invention has the channel length thereof controlled by a nanometer order. As a result, the semiconductor device 10E increases the on-current thereof, and suppresses the in-plane variance in the channel length thereof.

In a structure in which the oxide semiconductor layer 160E has a large area size and is in contact with a conductive layer, the properties of the oxide semiconductor layer 160E in contact with the conductive layer may occasionally be changed. When the properties of the oxide semiconductor layer 160E are changed, a part of the oxide semiconductor layer 160E may be extinguished during the production of the semiconductor device 10E due to a phenomenon that is considered as electric corrosion. In the oxide semiconductor device 10E, the oxide semiconductor layer 160E is in contact with the upper electrode 140E only along the electrode side wall 142E of the upper electrode 140E. Therefore, the above-described phenomenon is suppressed. It has been confirmed that even if the area size of a portion of the oxide semiconductor layer 160E that is in contact with the upper electrode 140E is small as shown in FIG. 50, a sufficiently low contact resistance is realized.

With the structure of the semiconductor device 10E, the insulating layer 150E and the gate insulating layer 170E are located between the upper electrode 140E and the gate electrode 180E. Therefore, a region where a line forming the same layer with the upper electrode 140E and a line forming the same layer with the gate electrode 180E cross each other has merely a small parasitic capacitance.

[Operation of the Semiconductor Device 10E]

An operation of the semiconductor device 10E shown in FIG. 49 and FIG. 50 is substantially the same as the operation of the semiconductor device 10 shown in FIG. 1 and FIG. 2, and thus will not be described in detail. In the semiconductor device 10E also, a gate voltage is applied to the gate electrode 180E, a source voltage is applied to the source line 190E connected with the lower electrode 120E, and a drain voltage is applied to the drain line 192E connected with the upper electrode 140E. It should be noted that the source voltage and the drain voltage may be applied oppositely. In other words, the lower electrode 120E is one of the source electrode and the drain electrode of a transistor having a channel formed of the oxide semiconductor layer 160E, and the upper electrode 140E is the other of the source electrode and the drain electrode of the transistor having the channel formed of the oxide semiconductor layer 160E.

[Manufacturing Method of the Semiconductor Device 10E]

With reference to plan views and cross-sectional views provided in FIG. 51 through FIG. 60, a manufacturing method of the semiconductor device 10E in embodiment 6 according to the present invention will be described.

Figure 51:
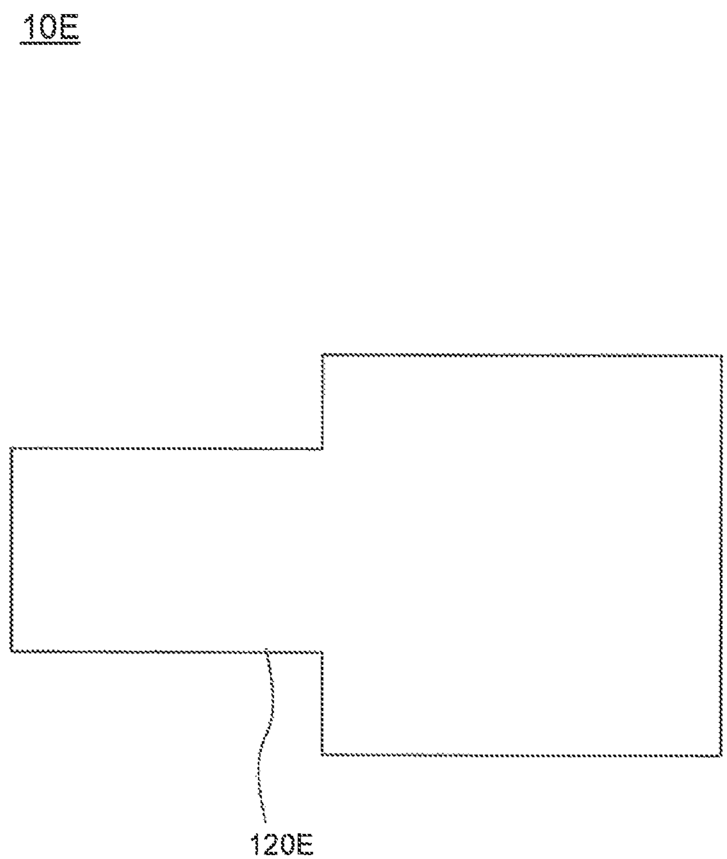
FIG. 51 is a plan view showing a step of forming a lower electrode in a manufacturing method of the semiconductor device in the embodiment according to the present invention.
Figure 52:
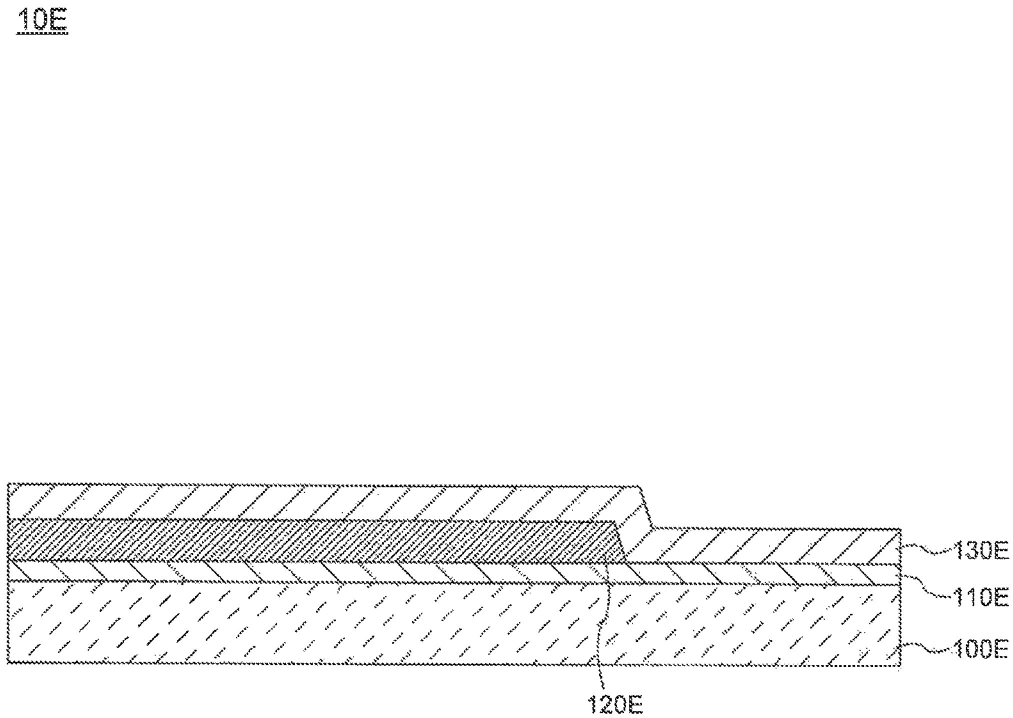
FIG. 52 is a cross-sectional view showing the step of forming the lower electrode in the manufacturing method of the semiconductor device in the embodiment according to the present invention.

FIG. 51 and FIG. 52 are respectively a plan view and a cross-sectional view showing a step of forming the lower electrode 120E in the manufacturing method of the semiconductor device 10E in embodiment 6 according to the present invention. Referring to FIG. 52, the underlying insulating layer 110E and a conductive film for the lower electrode 120E are formed on the substrate 100E, and patterning is performed as shown in FIG. 51 by photolithography and etching to form the lower electrode 120E. On the lower electrode 120E formed as a result of the patterning, the insulating layer 130E is formed.

Figure 53:
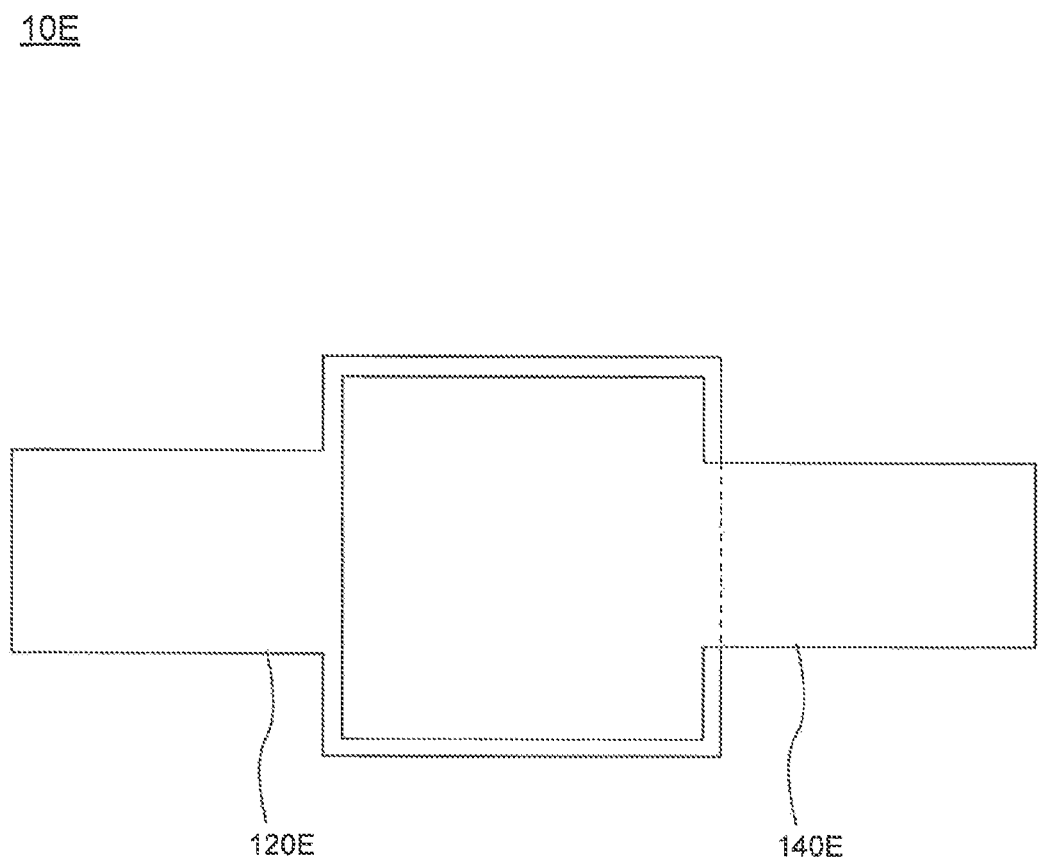
FIG. 53 is a plan view showing a step of forming an upper electrode in the manufacturing method of the semiconductor device in the embodiment according to the present invention.
Figure 54:
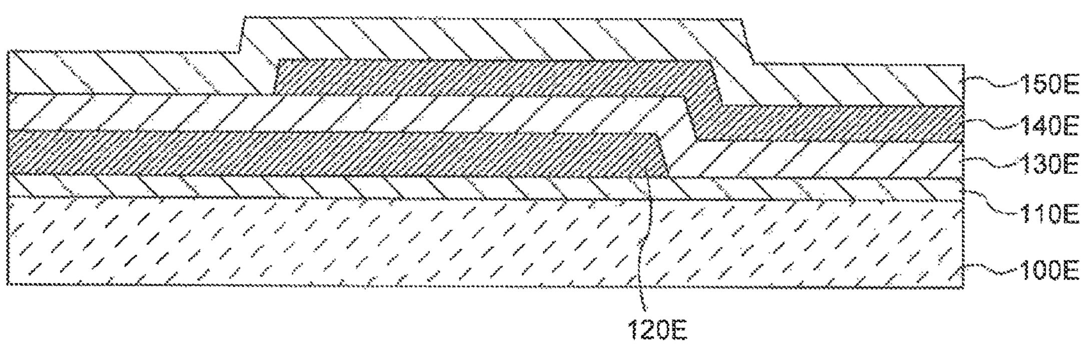
FIG. 54 is a cross-sectional view showing the step of forming the upper electrode in the manufacturing method of the semiconductor device in the embodiment according to the present invention.

FIG. 53 and FIG. 54 are respectively a plan view and a cross-sectional view showing a step of forming the upper electrode 140E in the manufacturing method of the semiconductor device 10E in embodiment 6 according to the present invention. Referring to FIG. 54, a conductive film for the upper electrode 140E is formed on the entirety of the substrate shown in FIG. 52, and patterning is performed as shown in FIG. 53 by photolithography and etching to form the upper electrode 140E. On the upper electrode 140E formed as a result of the patterning, the insulating layer 150E is formed.

Figure 55:
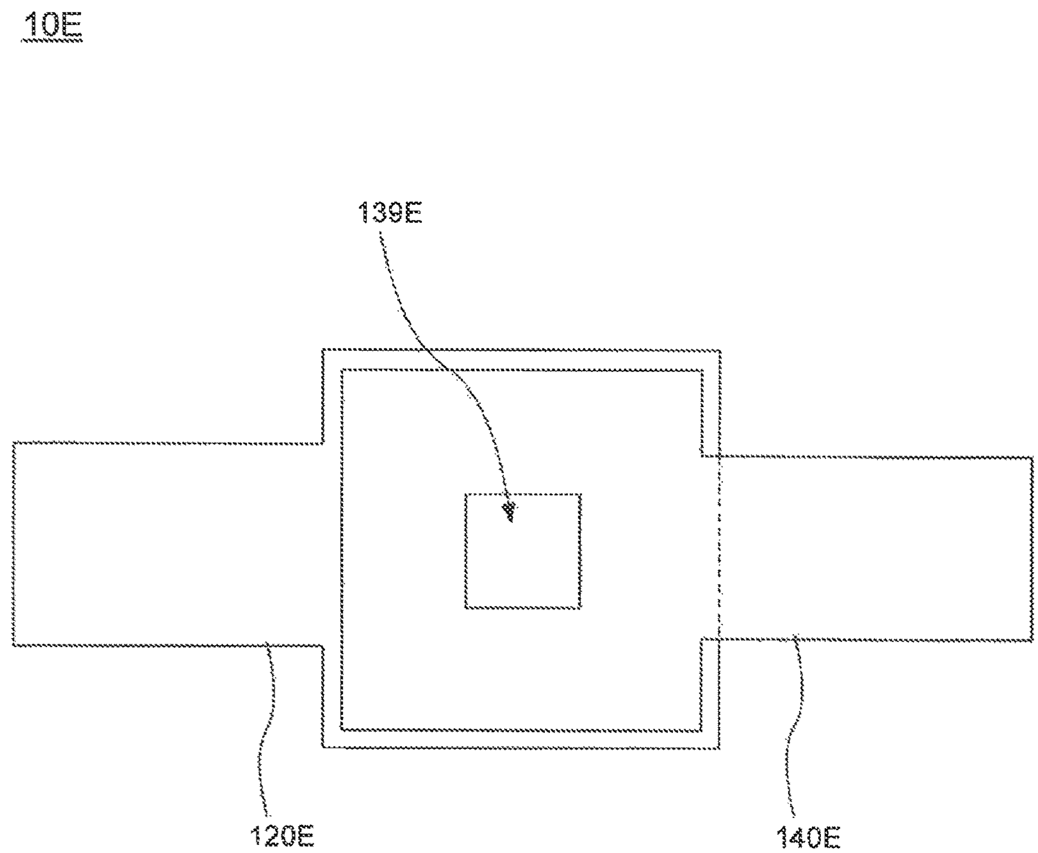
FIG. 55 is a plan view showing a step of forming an opening in the upper electrode and insulating layers in the manufacturing method of the semiconductor device in the embodiment according to the present invention.
Figure 56:
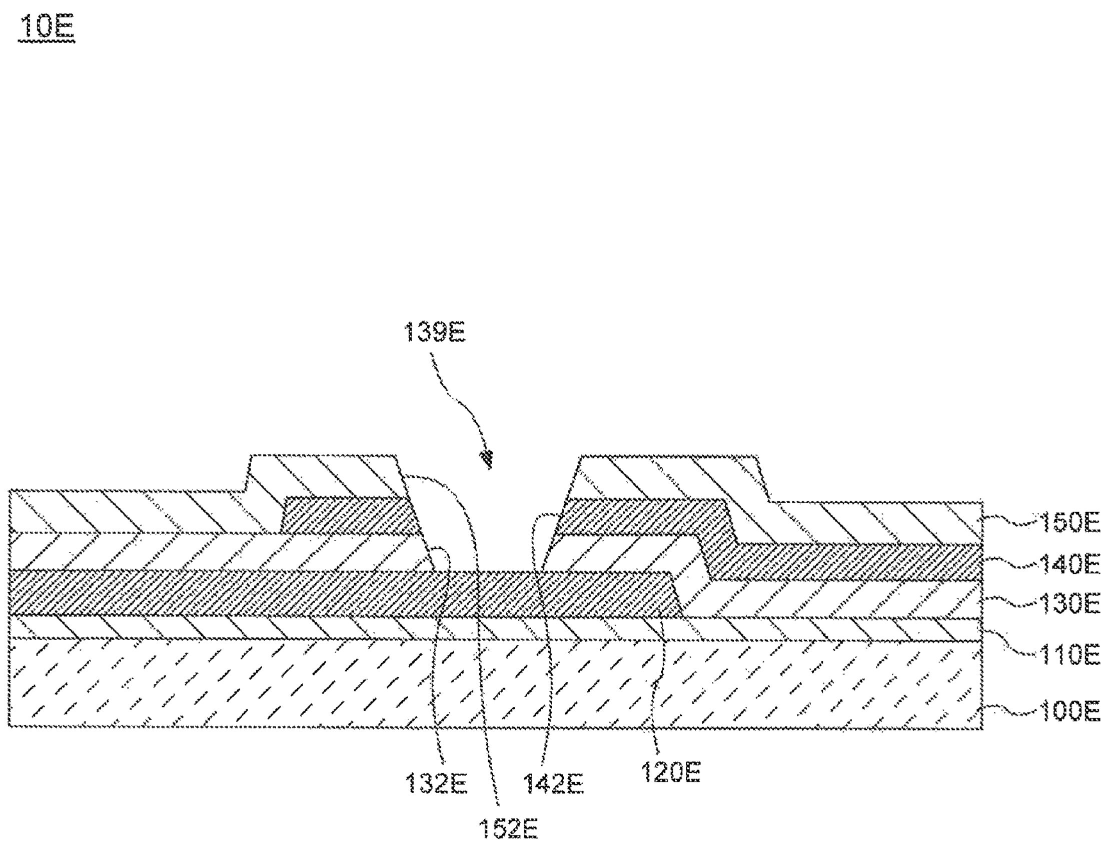
FIG. 56 is a cross-sectional view showing the step of forming the opening in the upper electrode and the insulating layers in the manufacturing method of the semiconductor device in the embodiment according to the present invention.

FIG. 55 and FIG. 56 are respectively a plan view and a cross-sectional view showing a step of forming the opening 139E, the upper electrode 140E and the insulating layers 130E and 150E in the manufacturing method of the semiconductor device 10E in embodiment 6 according to the present invention. Referring to FIG. 56, the substrate shown in FIG. 54 is subjected to photolithography and etching to form the opening 139E having the pattern shown in FIG. 55 in the insulating layer 150E, the upper electrode 140E and the insulating layer 130E to expose the lower electrode 120E. As a result of the formation of the opening 139E, the insulating layer side wall 132E, the electrode side wall 142E and the insulating layer side wall 152E are formed. The etching conditions on the insulating layer 150E, the upper electrode 140E and the insulating layer 130E may be the same, so that the opening 139E is formed in the insulating layer 150E, the upper electrode 140E and the insulating layer 130E at the same time. Alternatively, the etching conditions on the insulating layer 150E, the upper electrode 140E and the insulating layer 130E may be different from each other. The etching method for forming the insulating layer side wall 152E to be tapered may be substantially the same as described above regarding the insulating layer side wall 132 in embodiment 1.

Figure 57:
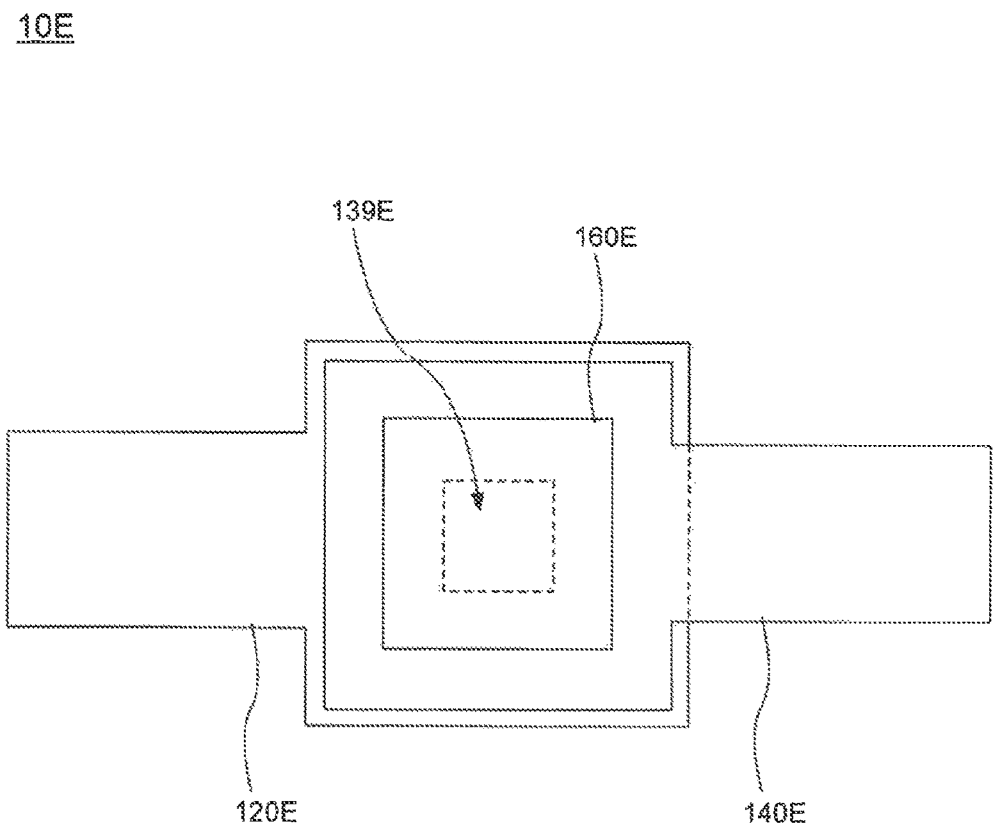
FIG. 57 is a plan view showing a step of forming an oxide semiconductor layer in the manufacturing method of the semiconductor device in the embodiment according to the present invention.
Figure 58:
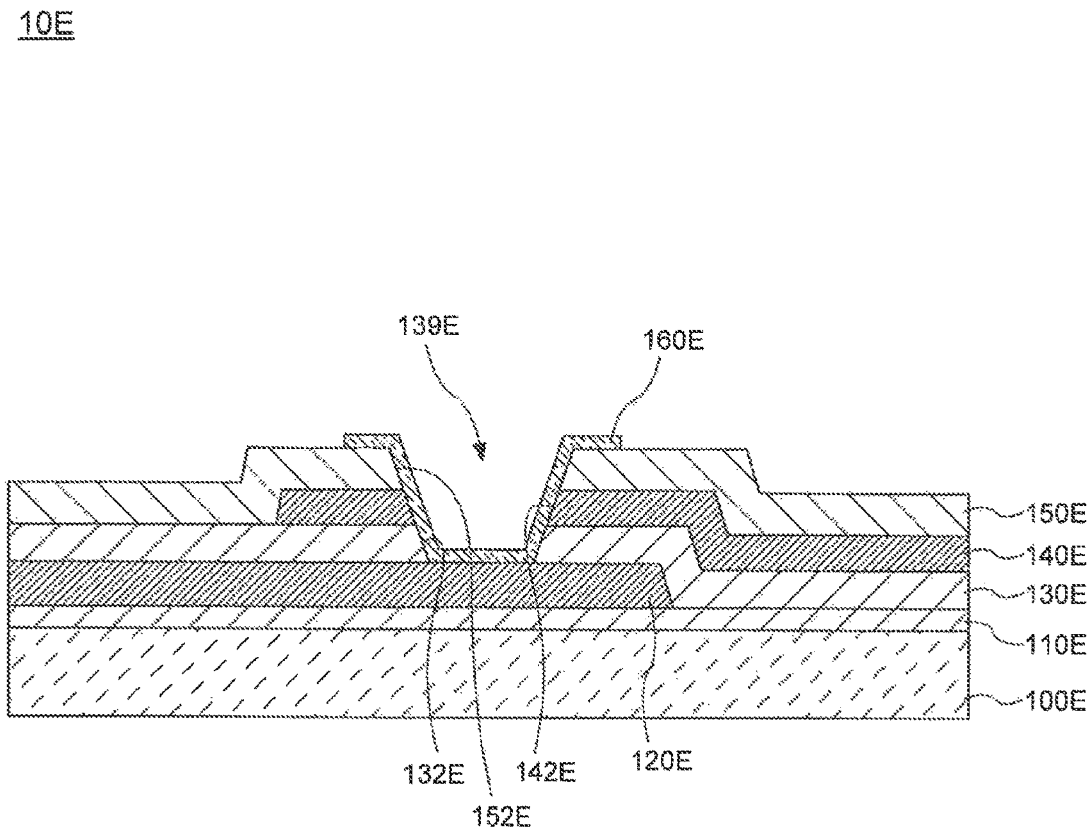
FIG. 58 is a cross-sectional view showing the step of forming the oxide semiconductor layer in the manufacturing method of the semiconductor device in the embodiment according to the present invention.

FIG. 57 and FIG. 58 are respectively a plan view and a cross-sectional view showing a step of forming the oxide semiconductor layer 160E in the manufacturing method of the semiconductor device 10E in embodiment 6 according to the present invention. Referring to FIG. 58, a film for the oxide semiconductor layer 160E is formed on the entirety of the substrate shown in FIG. 56, and patterning is performed as shown in FIG. 57 by photolithography and etching to form the oxide semiconductor layer 160E. The formation of the oxide semiconductor layer 160E by etching may be performed by substantially the same method as in embodiment 1.

Figure 59:
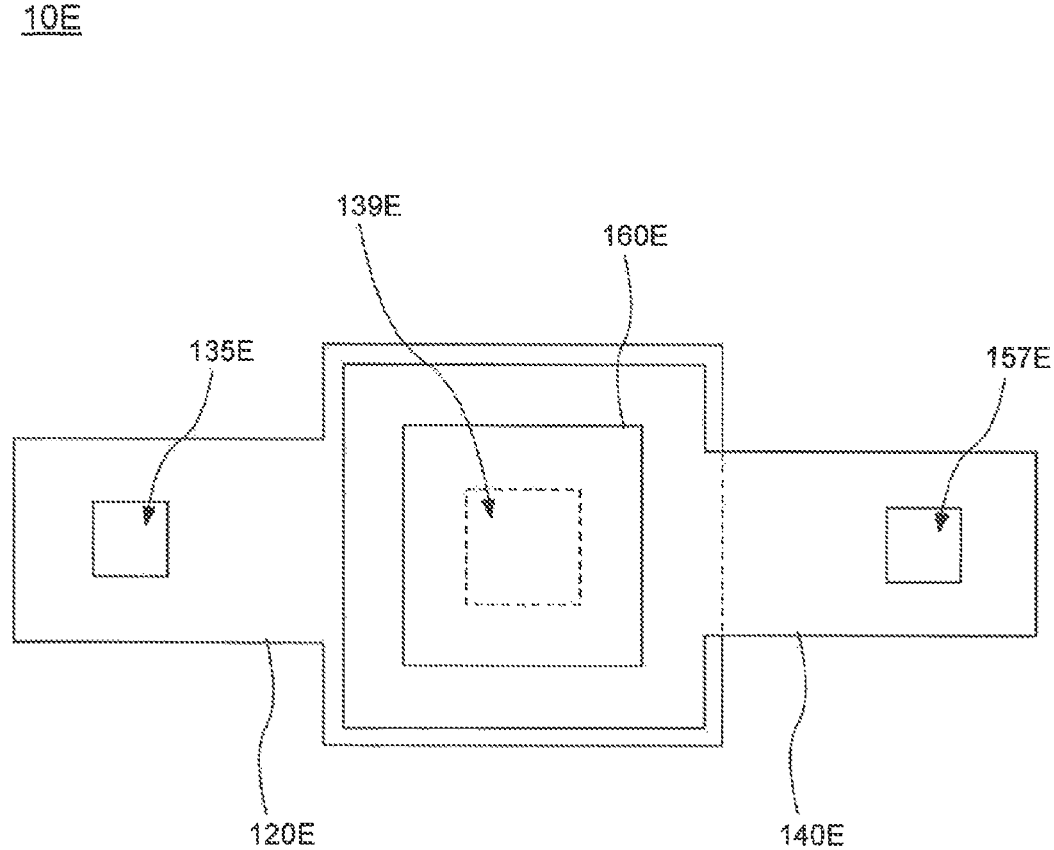
FIG. 59 is a plan view showing a step of forming openings respectively reaching the lower electrode and the upper electrode in the manufacturing method of the semiconductor device in the embodiment according to the present invention.
Figure 60:
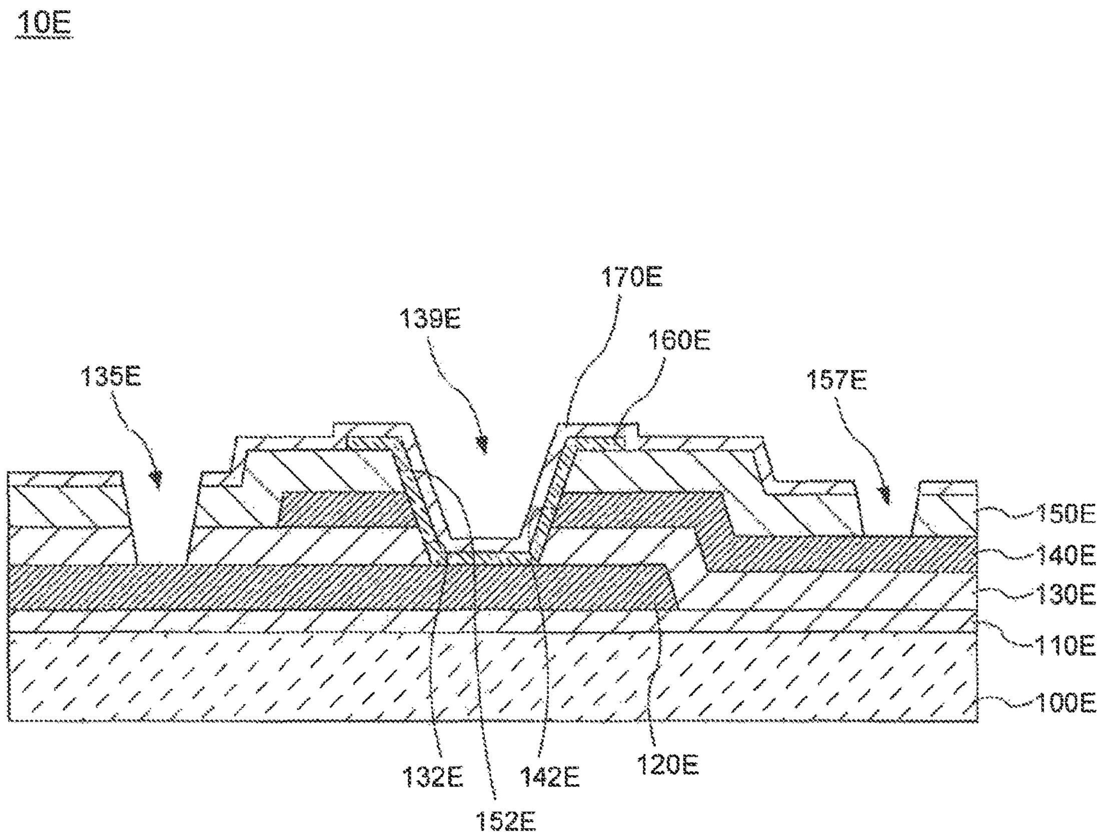
FIG. 60 is a cross-sectional view showing the step of forming the openings respectively reaching the lower electrode and the upper electrode in the manufacturing method of the semiconductor device in the embodiment according to the present invention.

FIG. 59 and FIG. 60 are respectively a plan view and a cross-sectional view showing a step of forming the openings 135E and 157E respectively reaching the lower electrode 120E and the upper electrode 140E in the manufacturing method of the semiconductor device 10E in embodiment 6 according to the present invention. Referring to FIG. 60, the gate insulating layer 170E is formed on the entirety of the substrate shown in FIG. 58, and patterning is performed as shown in FIG. 59 by photolithography and etching to form the openings 135E and 157E.

A conductive layer for the gate electrode 180E, the source line 190E and the drain line 192E is formed on the entirety of the substrate shown in FIG. 60, and patterning is performed as shown in FIG. 49 and FIG. 50 by photolithography and etching to form the gate electrode 180E, the source line 190E and the drain line 192E. The semiconductor device 10E in embodiment 6 according to the present invention is manufactured by the above-described manufacturing method.

As described above, with the manufacturing method of the semiconductor device 10E in embodiment 6 according to the present invention, the thickness of the insulating layer 130E, the tapering angle of the insulating layer side wall 132E, or both of the thickness of the insulating layer 130E and the tapering angle of the insulating layer side wall 132E are controllable by a nanometer order. Therefore, the channel length of the semiconductor device 10E is controllable by a nanometer order. As a result, the variance in the channel length is suppressed to a nanometer order.

Embodiment 7

With reference to FIG. 61 through FIG. 72, an overview of a semiconductor 10F in embodiment 7 according to the present invention will be described. The semiconductor device 10F is similar to the semiconductor device 10E shown in FIG. 49 and FIG. 50, but is different from the semiconductor device 10E on the following points. Openings 135F and 137F have shapes different from those of the corresponding openings of the semiconductor device 10E. The semiconductor device 10F includes a contact pad 122F below the opening 137F. In the semiconductor device 10F, the opening 135F passes through a pad 145F. In the following explanation, the features of the semiconductor device 10F that are the same as those of the semiconductor device 10E will not be described, and the above-described differences will be described. In the following description, components that are the same as, or have the same functions as, those of the semiconductor device 10E will be represented by the same reference signs (numerals) with alphabets, and detailed descriptions thereof will be omitted.

[Structure of the Semiconductor Device 10F]

Figure 61:
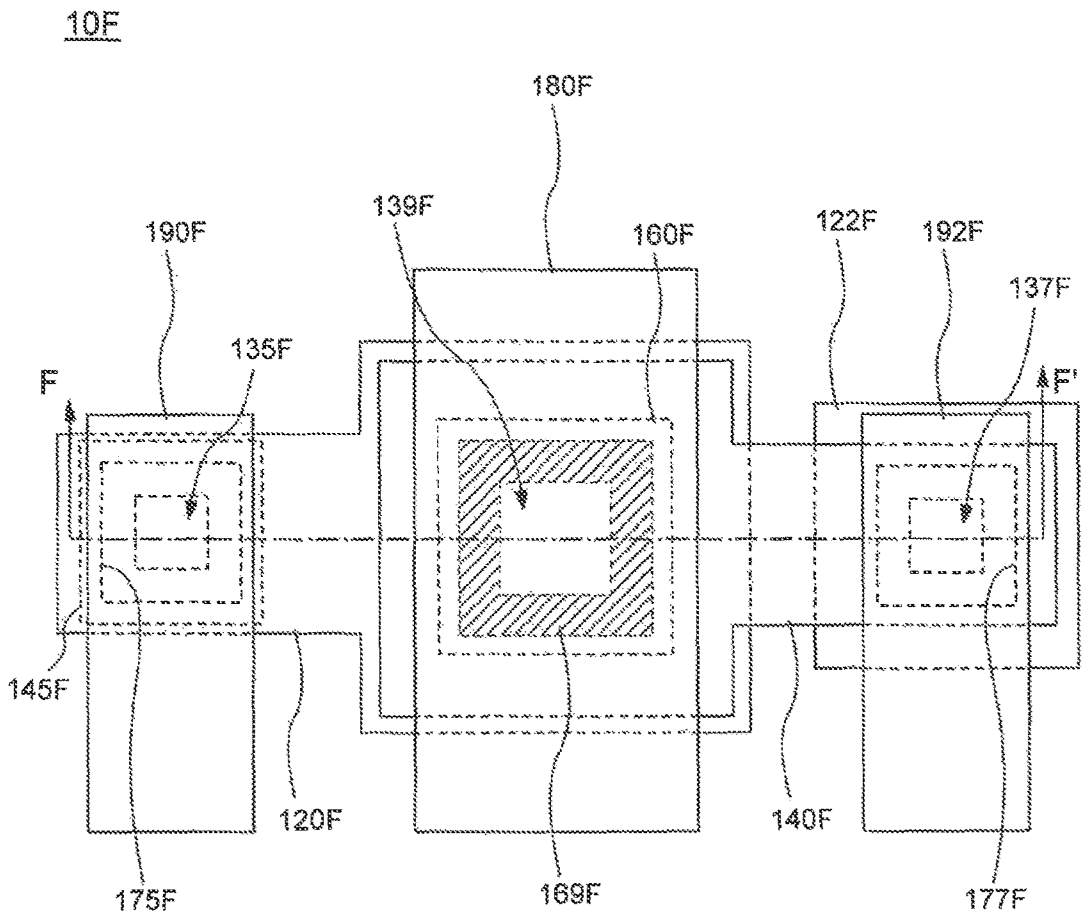
FIG. 61 is a plan view showing an overview of a semiconductor device in an embodiment according to the present invention.
Figure 62:
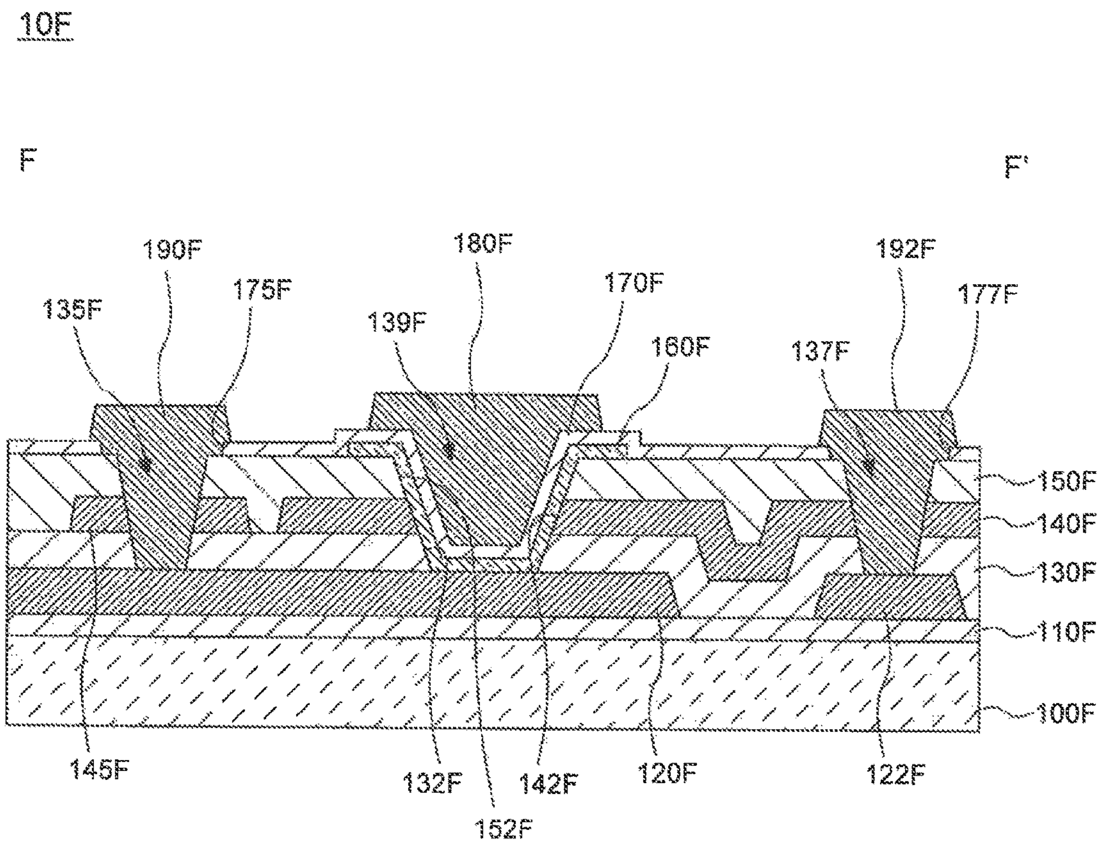
FIG. 62 is a cross-sectional view showing the overview of the semiconductor device in the embodiment according to the present invention.

FIG. 61 and FIG. 62 are respectively a plan view and a cross-sectional view showing an overview of the semiconductor device 10F in embodiment 7 according to the present invention. FIG. 62 is taken along line F-F' in FIG. 61. As shown in FIG. 61 and FIG. 62, in the semiconductor device 10F, a side wall of the opening 135F formed in insulating layers 130F and 150F, the pad 145F and a gate insulating layer 170F, and a side wall of the opening 137F formed in the insulating layers 130F and 150F, an upper electrode 140F and the gate insulating layer 170F, are stepped as seen in a cross-sectional view. Specifically, in each of the openings 135F and 137F, the opening in the gate insulating layer 170F has a diameter longer than the diameter of the opening in the insulating layer 150F. In other words, side walls 175F and 177F of the gate insulating layer 170F respectively exposed to the openings 135F and 137F are located on a top surface of the insulating layer 150F, and extend upward from the top surface of the insulating layer 150F. The openings 135F and 137F having such a shape are formed by a manufacturing method of the semiconductor device 10F described below. Specifically, the step of forming the openings in the insulating layer 150F and the step of forming the openings in the gate insulating layer 170F are performed at different timings. As a result, the openings 135F and the 137F having the shapes shown in FIG. 62 are formed.

As shown in FIG. 61 and FIG. 62, the contact pad 122F is located below the opening 137F, and the opening 137F is formed in the insulating layer 150F, the upper electrode 140F and the insulating layer 130F to reach the contact pad 122F. In the opening 137F, a drain line 192F is connected with the upper electrode 140F at a side surface of the upper electrode 140F and is connected with the contact pad 122F at a top surface of the contact pad 122F. A lower electrode 120F is located below the opening 135F. The opening 135F is formed in the insulating layer 150F, the pad 145F and the insulating layer 130F to reach the lower electrode 120F. The upper electrode 140F and the pad 145F form the same layer with each other, and therefore, the opening 137F and the opening 135F have the same depth.

As described above, the semiconductor device 10F in embodiment 7 according to the present invention increases the on-current thereof, and suppresses the in-plane variance in the channel length thereof. The semiconductor device 10F also suppresses the properties of an oxide semiconductor layer 160F from being changed in a region where the oxide semiconductor layer 160F and the upper electrode 140F contact each other. In addition, a drain electrode of the semiconductor device 10F is connectable with at least one of a line forming the same layer with the lower electrode 120F and the contact pad 122F, a line forming the same layer with the upper electrode 140F, and a line forming the same layer with the drain line 192F. Thus, the degree of freedom of line layout is improved.

[Manufacturing Method of the Semiconductor Device 10F]

With reference to plan views and cross-sectional views provided in FIG. 63 through FIG. 72, a manufacturing method of the semiconductor device 10F in embodiment 7 according to the present invention will be described.

Figure 63:
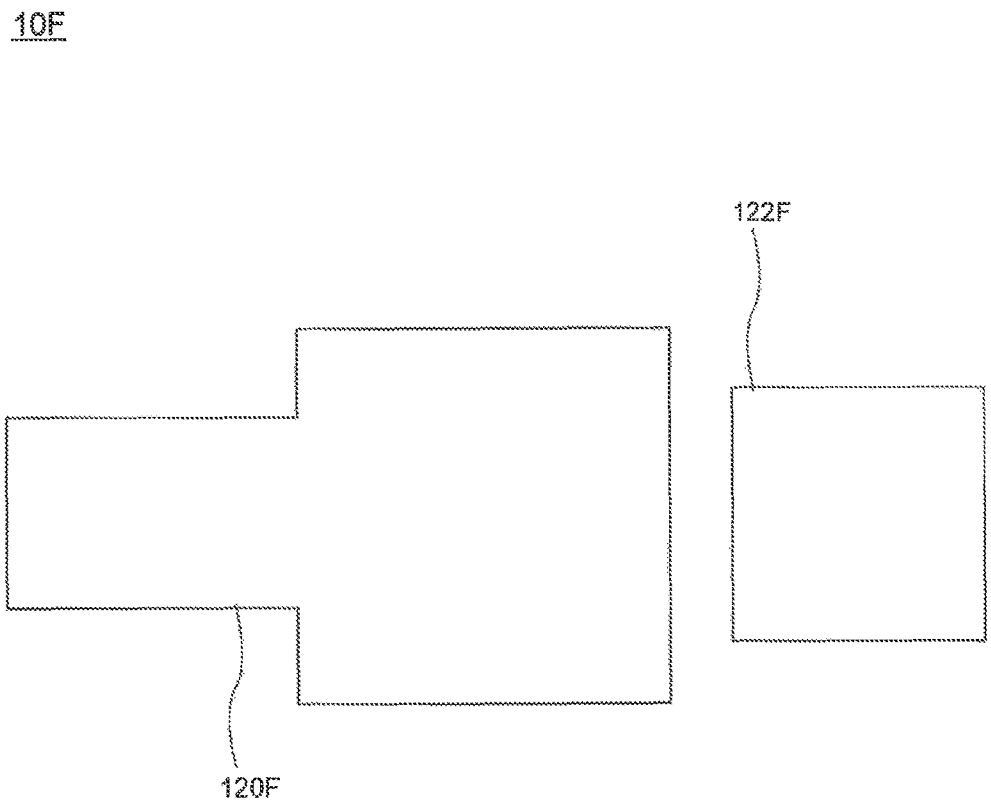
FIG. 63 is a plan view showing a step of forming a lower electrode and a contact pad in a manufacturing method of the semiconductor device in the embodiment according to the present invention.
Figure 64:
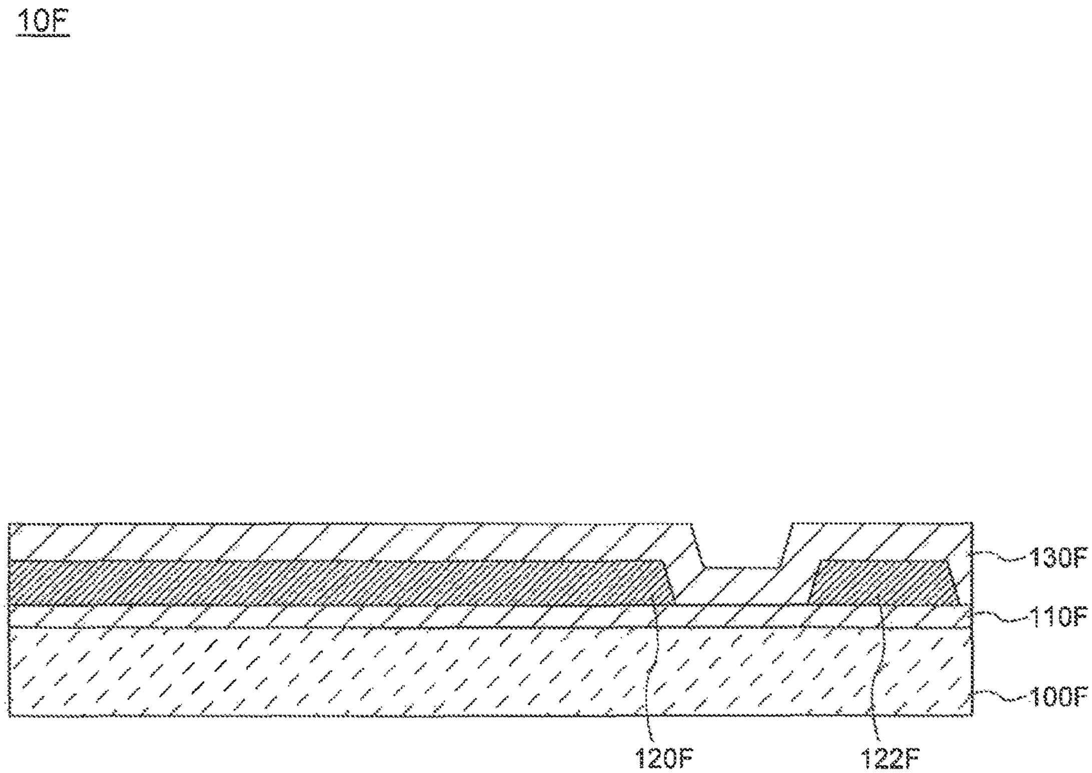
FIG. 64 is a cross-sectional view showing the step of forming the lower electrode and the contact pad in the manufacturing method of the semiconductor device in the embodiment according to the present invention.

FIG. 63 and FIG. 64 are respectively a plan view and a cross-sectional view showing a step of forming the lower electrode 120F and the contact pad 122F in the manufacturing method of the semiconductor device 10F in embodiment 7 according to the present invention. Referring to FIG. 64, an underlying insulating layer 110F is formed on a substrate 100F. A conductive film for the lower electrode 120F and the contact pad 122F is formed thereon, and patterning is performed as shown in FIG. 63 by photolithography and etching to form the lower electrode 120F and the contact pad 122F. On the lower electrode 120F and the contact pad 122F formed as a result of the patterning, the insulating layer 130F is formed.

Figure 65:
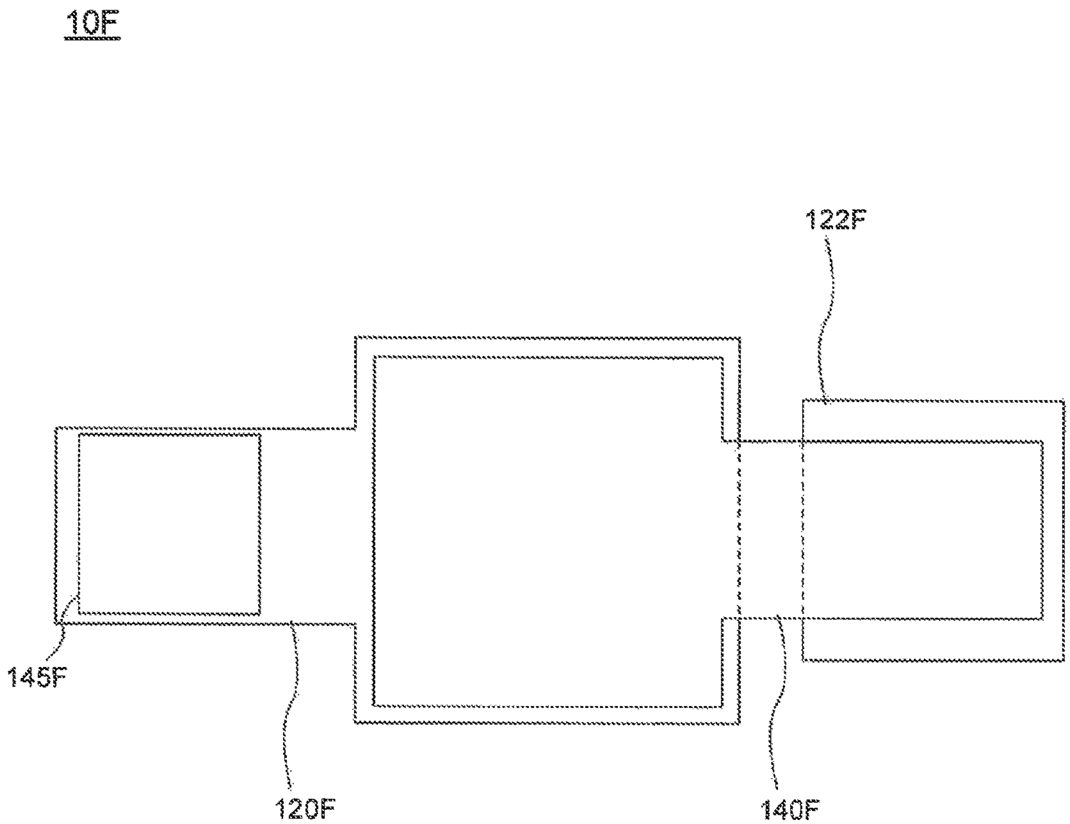
FIG. 65 is a plan view showing a step of forming an upper electrode a pad in the manufacturing method of the semiconductor device in the embodiment according to the present invention.
Figure 66:
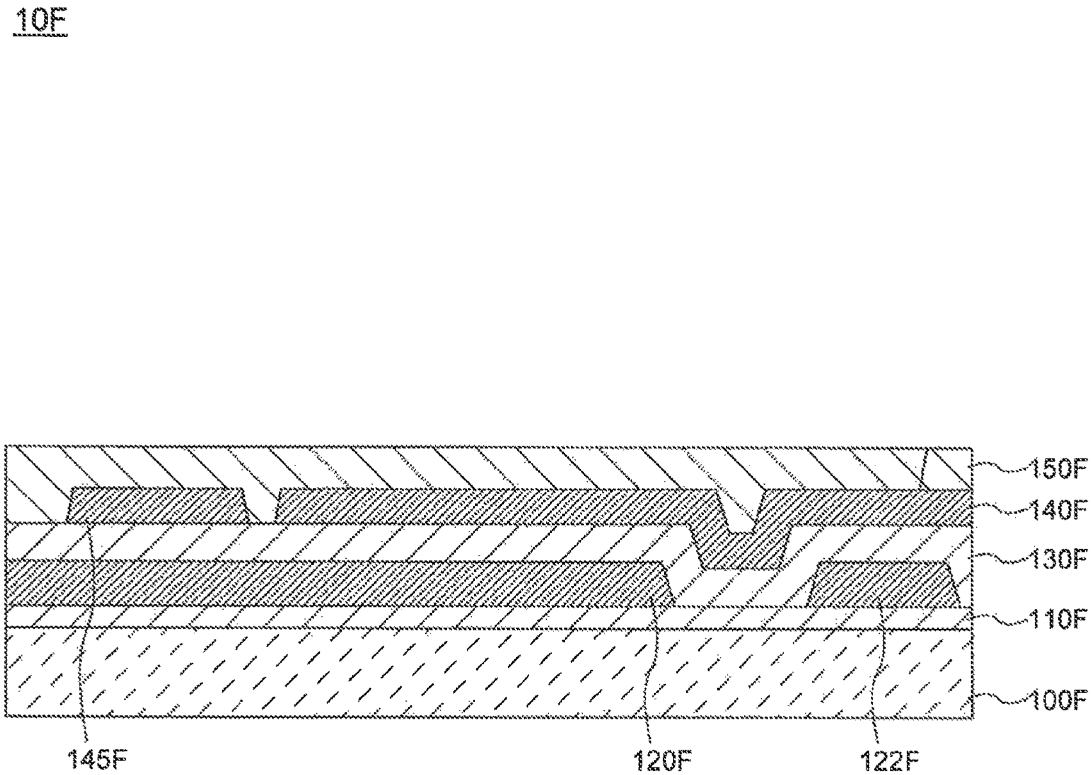
FIG. 66 is a cross-sectional view showing the step of forming the upper electrode the pad in the manufacturing method of the semiconductor device in the embodiment according to the present invention.

FIG. 65 and FIG. 66 are respectively a plan view and a cross-sectional view showing a step of forming the upper electrode 140F and the pad 145F in the manufacturing method of the semiconductor device 10F in embodiment 7 according to the present invention. Referring to FIG. 66, a conductive film for the upper electrode 140F and the pad 145F is formed on the entirety of the substrate shown in FIG. 64, and patterning is performed as shown in FIG. 65 by photolithography and etching to form the upper electrode 140F and the pad 145F. On the upper electrode 140F and the pad 145F formed as a result of the patterning, the insulating layer 150F is formed.

Figure 67:
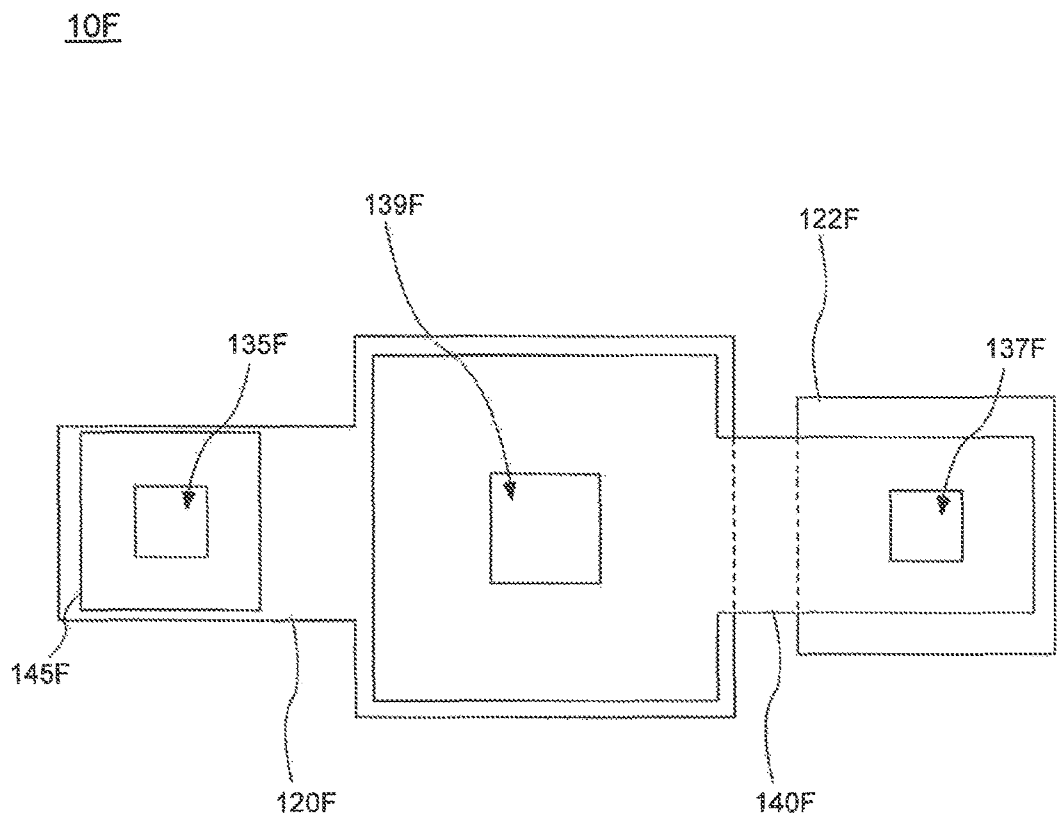
FIG. 67 is a plan view showing a step of forming openings in the upper electrode, insulating layers and the like in the manufacturing method of the semiconductor device in the embodiment according to the present invention.
Figure 68:
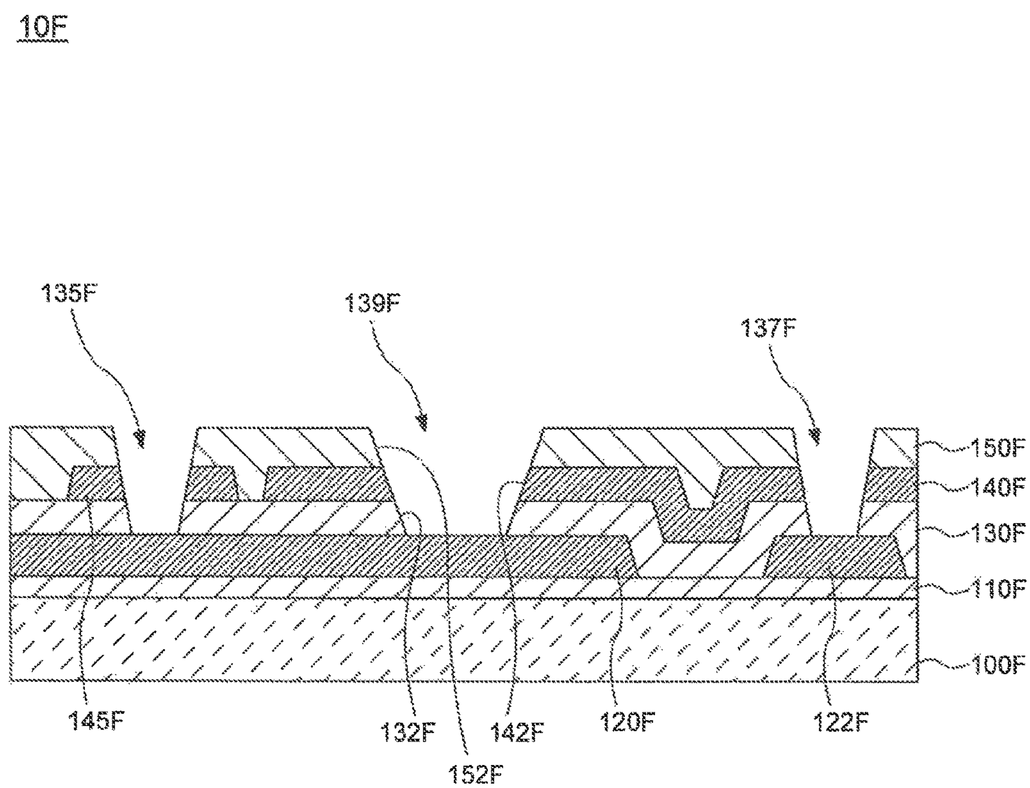
FIG. 68 is a cross-sectional view showing the step of forming the openings in the upper electrode, the insulating layers and the like in the manufacturing method of the semiconductor device in the embodiment according to the present invention.

FIG. 67 and FIG. 68 are respectively a plan view and a cross-sectional view showing a step of forming the openings 135F, 139F and 137F in the insulating layers 150F and 130F, the upper electrode 140F and the like in the manufacturing method of the semiconductor device 10F in embodiment 7 according to the present invention. Referring to FIG. 68, the substrate shown in FIG. 66 is subjected to photolithography and etching to form the opening 135F in the insulating layers 130F and 150F and the pad 145F to expose the lower electrode 120F, to form the opening 139F in the insulating layers 130F and 150F and the upper electrode 140F to expose the lower electrode 120F, and to form the opening 137F in the insulating layers 130F and 150F and the upper electrode 140F to expose the contact pad 122F. The openings 135F, 139F and 137F have the patterns shown in FIG. 67. Since the pad 145F is provided such that the opening 135F passes through the pad 145F, the layer structure of the region where the opening 135F is provided is the same as the layer structure of the regions where the openings 137F and 139F are provided.

As a result of the formation of the opening 139F, an insulating layer side wall 132F of the insulating layer 130F, an electrode side wall 142F of the upper electrode 140F, and an insulating layer side wall 152F of the insulating layer 150F are formed. The etching conditions on the insulating layer 150F, the upper electrode 140F and the insulating layer 130F may be the same, so that the openings 135F, 139F and 137F are formed in the insulating layer 150F, the upper electrode 140F and the insulating layer 130F at the same time. Alternatively, the etching conditions on the insulating layer 150F, the upper electrode 140F and the insulating layer 130F may be different from each other.

Figure 69:
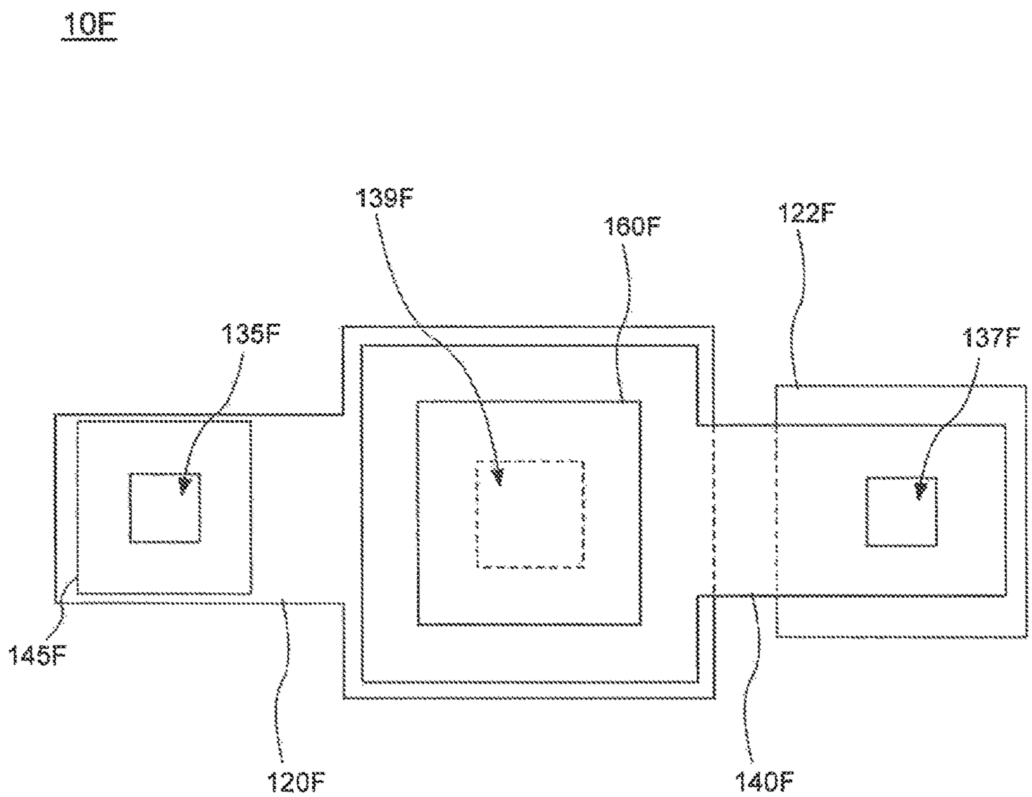
FIG. 69 is a plan view showing a step of forming an oxide semiconductor layer in the manufacturing method of the semiconductor device in the embodiment according to the present invention.
Figure 70:
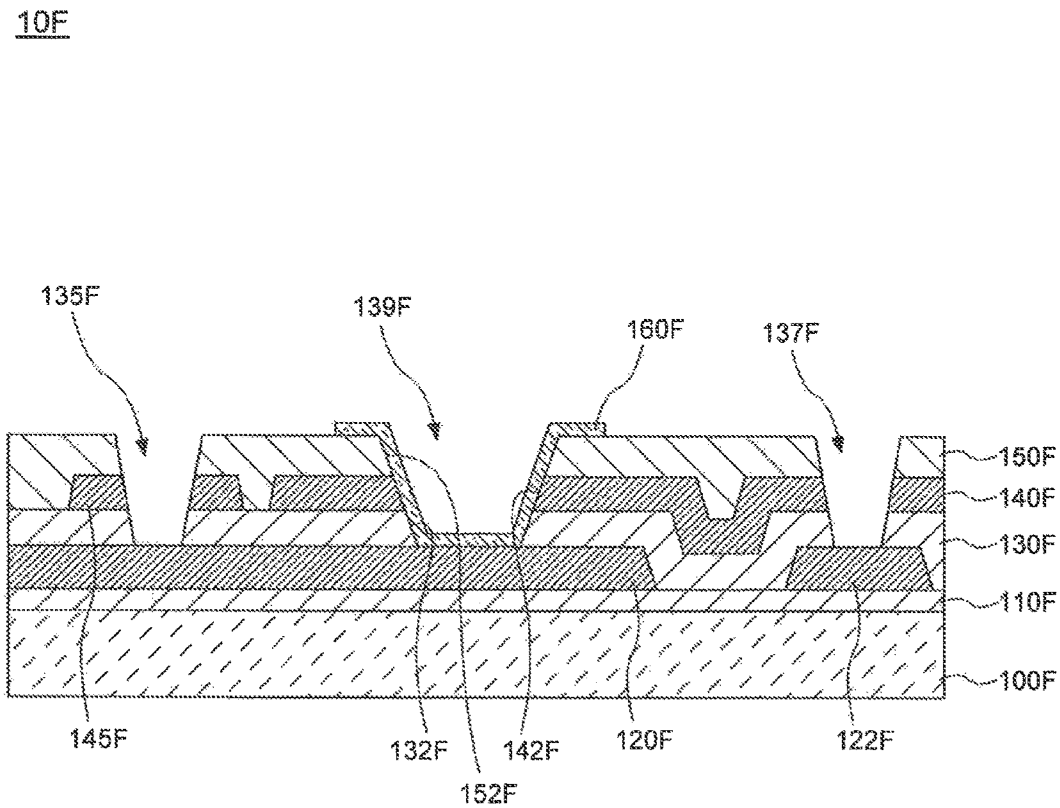
FIG. 70 is a cross-sectional view showing the step of forming the oxide semiconductor layer in the manufacturing method of the semiconductor device in the embodiment according to the present invention.

FIG. 69 and FIG. 70 are respectively a plan view and a cross-sectional view showing a step of forming the oxide semiconductor layer 160F in the manufacturing method of the semiconductor device 10F in embodiment 7 according to the present invention. Referring to FIG. 70, a film for the oxide semiconductor layer 160F is formed on the entirety of the substrate shown in FIG. 68, and patterning is performed as shown in FIG. 69 by photolithography and etching to form the oxide semiconductor layer 160F. The oxide semiconductor layer 160F is formed in the opening 139F, and a part of the film for the oxide semiconductor layer 160F that is located in the openings 135F and 137F is etched away. The formation of the oxide semiconductor layer 160F by etching may be performed by substantially the same method as in embodiment 1.

Figure 71:
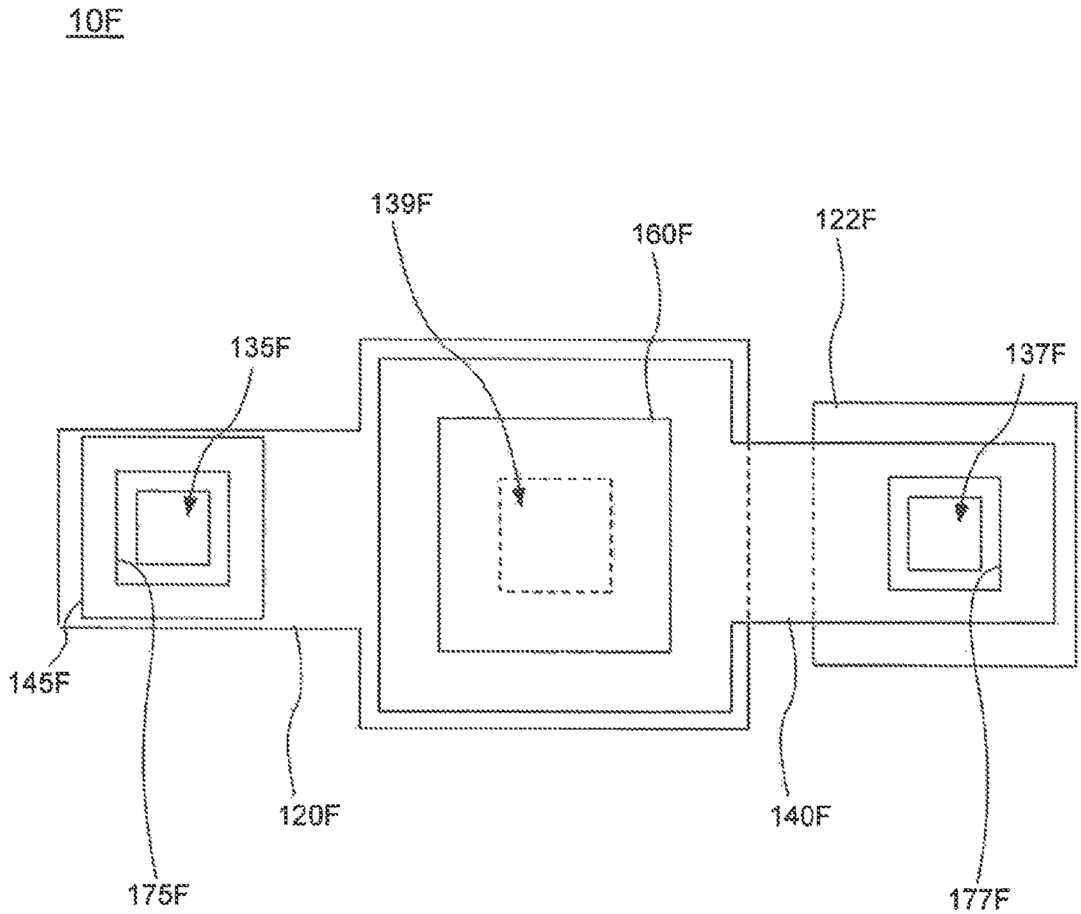
FIG. 71 is a plan view showing a step of forming openings exposing the lower electrode, the upper electrode and the like in the manufacturing method of the semiconductor device in the embodiment according to the present invention.
Figure 72:
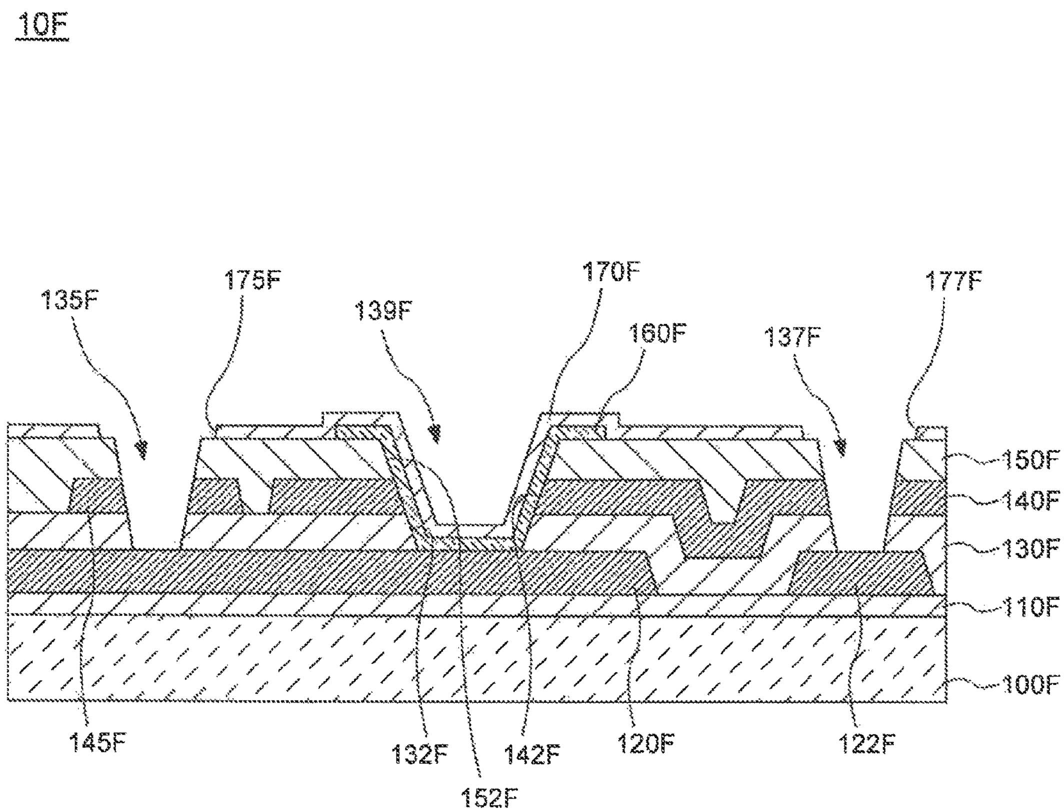
FIG. 72 is a cross-sectional view showing the step of forming the openings exposing the lower electrode, the upper electrode and the like in the manufacturing method of the semiconductor device in the embodiment according to the present invention.

FIG. 71 and FIG. 72 are respectively a plan view and a cross-sectional view showing a step of forming openings exposing the lower electrode 220F, the upper electrode 140F and the like in the manufacturing method of the semiconductor device 10F in embodiment 7 according to the present invention. Referring to FIG. 72, the gate insulating layer 170F is formed on the entirety of the substrate shown in FIG. 70, and is patterned as shown in FIG. 71 by photolithography and etching to form openings in regions corresponding to the openings 135F and 137F. The resultant opening 135F exposes the lower electrode 120F and a side wall of the pad 145F, and the resultant opening 137F exposes the contact pad 122F and a side wall of the upper electrode 140F.

In FIG. 72, the gate insulating layer 170F is etched down to an interface between the insulating layer 150F and the gate insulating layer 170F. Alternatively, a part of the insulating layer 150F that is exposed from the gate insulating layer 170F may be over-etched.

A conductive layer for a gate electrode 180F, a source line 190F and a drain line 192F is formed on the entirety of the substrate shown in FIG. 72, and patterning is performed as shown in FIG. 61 and FIG. 62 by photolithography and etching to form the gate electrode 180F, the source line 190F and the drain line 192F. The semiconductor device 10F in embodiment 7 according to the present invention is manufactured by the above-described manufacturing method.

As described above, with the manufacturing method of the semiconductor device 10F in embodiment 7 according to the present invention, the channel length of the semiconductor device 10F is controllable by a nanometer order. As a result, the variance in the channel length is suppressed to a nanometer order. In addition, the regions where the openings 135F, 137F and 139F are provided have the same layer structure as each other, and therefore, the etching conditions for the openings is more easily adjustable.

Embodiment 8

With reference to FIG. 73 through FIG. 84, an overview of a semiconductor 10G in embodiment 8 according to the present invention will be described. The semiconductor device 10G includes a first transistor 20G having a short channel length and a second transistor 30G having a long channel length. The first transistor 20G having a short channel length has substantially the same structure as that of the semiconductor device 10E in embodiment 6 shown in FIG. 49 and FIG. 50. In the following explanation, the features of the first transistor 20G will not be described, and the second transistor 30G having a long channel length will be described. In the following description, components that are the same as, or have the same functions as, those of the semiconductor device 10E will be represented by the same reference signs (numerals) with alphabets, and detailed descriptions thereof will be omitted.

[Structure of the Second Transistor 30G]

Figure 73:
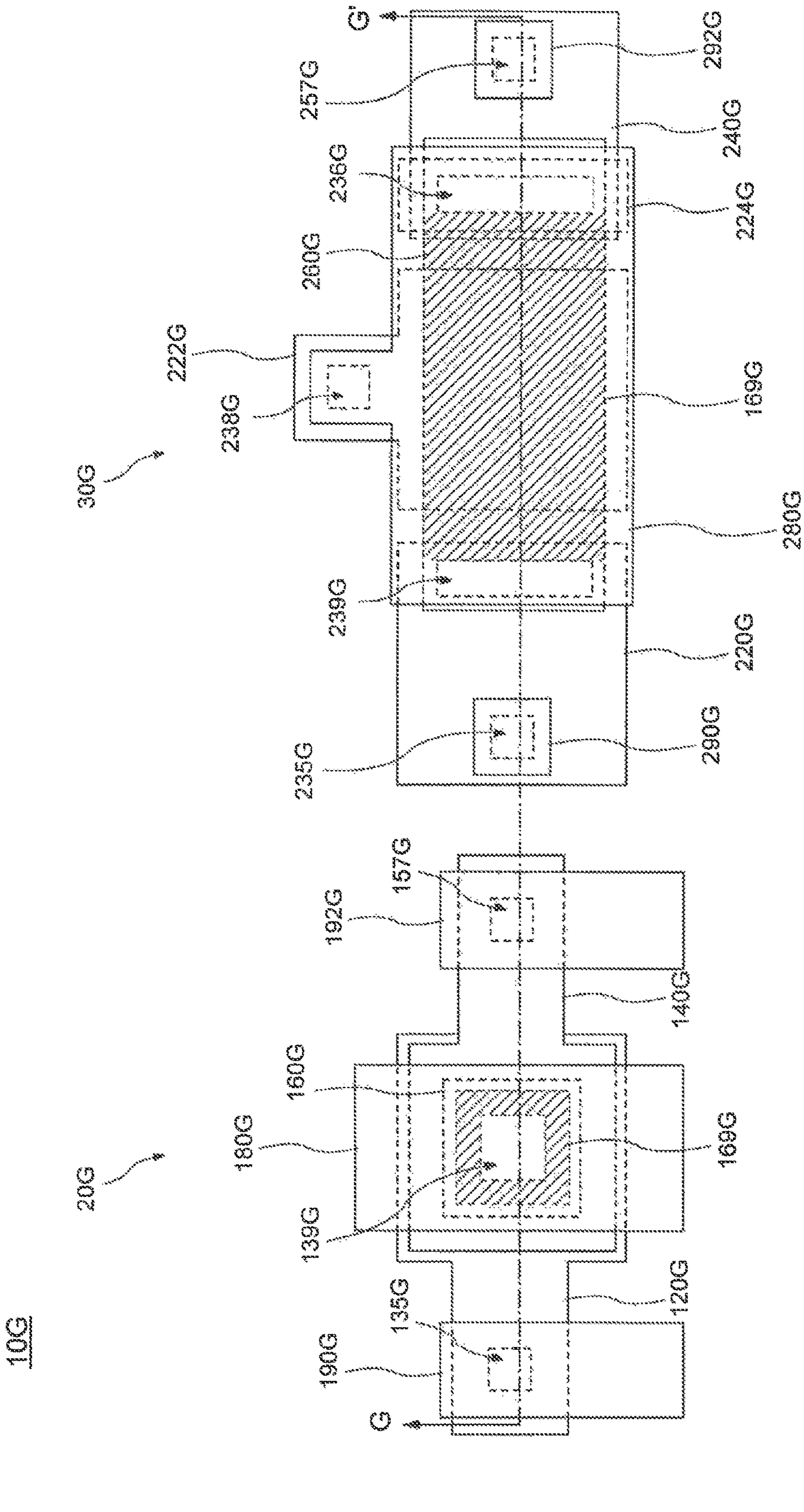
FIG. 73 is a plan view showing an overview of a semiconductor device in an embodiment according to the present invention.
Figure 74:
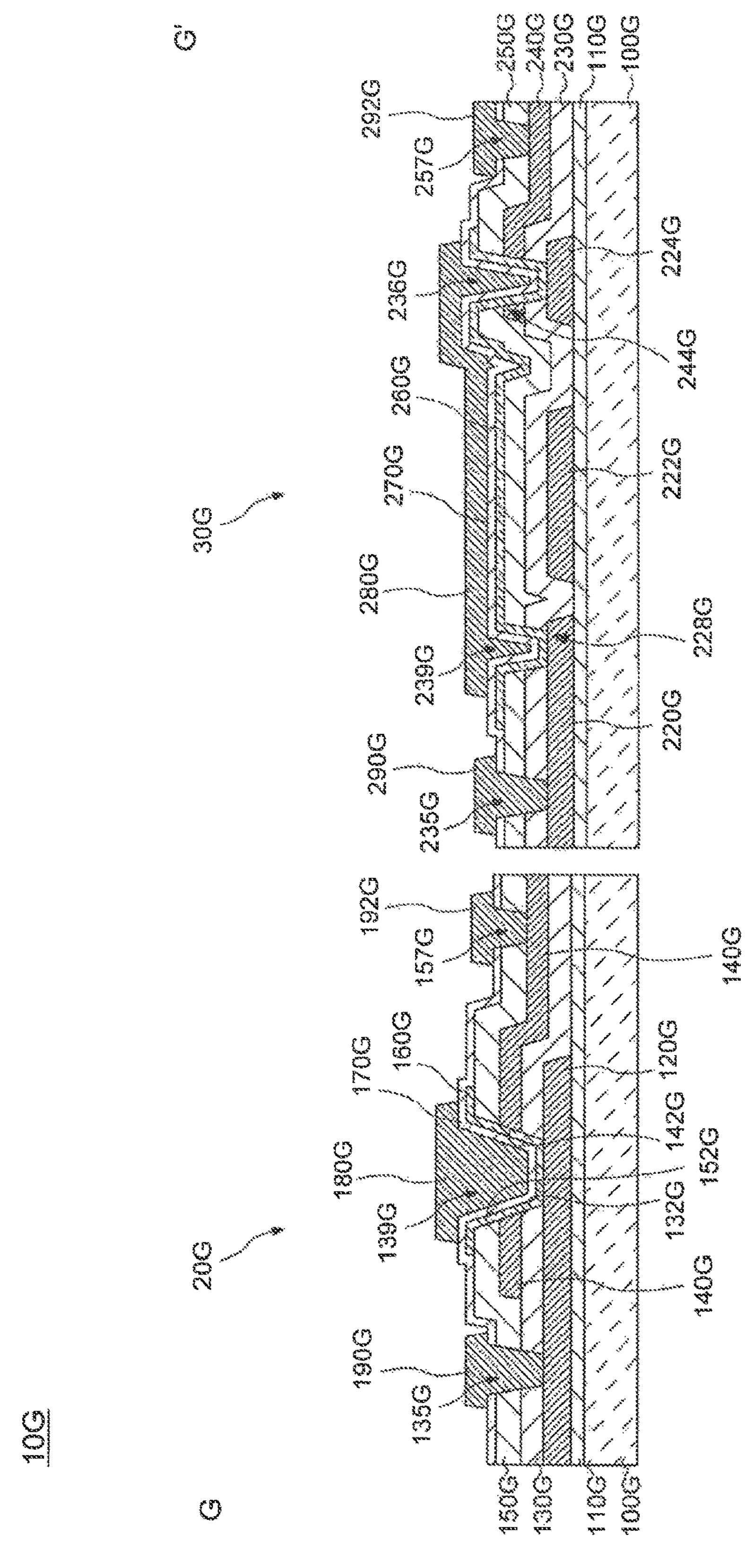
FIG. 74 is a cross-sectional view showing the overview of the semiconductor device in the embodiment according to the present invention.

FIG. 73 and FIG. 74 are respectively a plan view and a cross-sectional view showing an overview of the semiconductor device 10G in embodiment 8 according to the present invention. FIG. 74 is taken along line G-G' in FIG. 73. As shown in FIG. 73 and FIG. 74, the second transistor 30G includes a substrate 100G, an underlying insulating layer 110G, a lower electrode 220G, a back gate 222G, a contact pad 224G, an insulating layer 230G, an upper electrode 240G, an insulating layer 250G, an oxide semiconductor layer 260G, a gate insulating layer 270G, a gate electrode 280G, a source line 290G, and a drain line 292G. The substrate 100G and the underlying insulating layer 110G are common to the first transistor 20G and the second transistor 30G, and extend continuously in the first transistor 20G and the second transistor 30G.

An opening 235G is provided in the insulating layers 230G and 250G and the gate insulating layer 270G, and reaches the lower electrode 220G. An opening 239G is provided in the insulating layers 230G and 250G, and reaches the lower electrode 220G. An opening 236G is provided in the insulating layers 230G and 250G and the upper electrode 240G, and reaches the contact pad 224G. An opening 257G is provided in the insulating layer 250G and the gate insulating layer 270G, and reaches the upper electrode 240G.

The lower electrode 220G, the back gate 222G and the contact pad 224G are located on the underlying insulating layer 110G. The insulating layer 230G is located on the lower electrode 220G, on the back gate 222G, on the contact pad 224G, and on the underlying insulating layer 110G. The upper electrode 240G is located on the insulating layer 230G, and is isolated from the lower electrode 220G as seen in a plan view. The insulating layer 250G is located on the upper electrode 240G and on the insulating layer 230G. The oxide semiconductor layer 260G is located on the insulating layer 250G in a region between the lower electrode 220G and the upper electrode 240G. The oxide semiconductor layer 260G is connected with the lower electrode 220G via the opening 239G, and is connected with the upper electrode 240G and the contact pad 224G via the opening 236G.

The back gate 222G faces the oxide semiconductor layer 260G while having the insulating layers 230G and 250G therebetween. In other words, the back gate 222G is located on the side opposite to the gate electrode 280G with respect to the oxide semiconductor layer 260G in at least a part of a region where the oxide semiconductor layer 260G and the gate electrode 280G face each other. The insulating layers 230G and 250G are located between the oxide semiconductor layer 260G and the back gate 222G. The back gate 222G may be omitted.

The gate electrode 280G is located to face the oxide semiconductor layer 260G in a region between the lower electrode 220G and the upper electrode 240G. The gate insulating layer 270G is located between the oxide semiconductor layer 260G and the gate electrode 280G. In the second transistor 30G, a portion of the oxide semiconductor layer 260G that is located in the region between the lower electrode 220G and the upper electrode 240G acts as a channel.

The source line 290G is connected with the lower electrode 220G via the opening 235G. The drain line 292G is connected with the upper electrode 240G via the opening 257G. The source line 290G and the drain line 292G may be replaced with each other. Namely, the line 290G may act as the drain line, whereas the line 292G may act as the source line.

Now, the relationship between the first transistor 20G and the second transistor 30G regarding each of the components thereof will be described. The lower electrode 220G, the back gate 222G and the contact pad 224G form the same layer with a lower electrode 120G, and are all located in contact with the underlying insulating layer 110G. The insulating layer 230G forms the same layer with an insulating layer 130G, and is continuous with the insulating layer 130G. The insulating layer 250G forms the same layer with an insulating layer 150G, and is continuous with the insulating layer 150G. Similarly, an upper electrode 140G and the upper electrode 240G, an oxide semiconductor layer 160G and the oxide semiconductor layer 260G, a gate insulating layer 170G and the gate insulating layer 270G, a gate electrode 180G and the gate electrode 280G, a source line 190G and the source line 290G, and a drain line 192G and the drain line 292G, form the same layer with each other.

[Operation of the Second Transistor 30G]

An operation of the second transistor 30G shown in FIG. 73 and FIG. 74 is substantially the same as the operation of the second transistor 30C shown in FIG. 27 and FIG. 28, and thus will not be described in detail. In the second transistor 30G also, a gate voltage is applied to the gate electrode 280G, a source voltage is applied to the source line 290G connected with the lower electrode 220G, and a drain voltage is applied to the drain line 292G connected with the upper electrode 240G. It should be noted that the source voltage and the drain voltage may be applied oppositely. In other words, the lower electrode 220G is one of the source electrode and the drain electrode of the second transistor 30G having a channel formed of the oxide semiconductor layer 260G, and the upper electrode 240G is the other of the source electrode and the drain electrode of the second transistor 30G having the channel formed of the oxide semiconductor layer 260G. The back gate 222G is supplied with an assisting gate voltage independent from the gate voltage to control the threshold value (Vth) of the second transistor 30G.

[Manufacturing Method of the Second Transistor 30G]

With reference to plan views and cross-sectional views provided in FIG. 75 through FIG. 84, a manufacturing method of the second transistor 30G of the semiconductor device 10G in embodiment 8 according to the present invention will be described. The manufacturing method of the first transistor 20G is substantially the same as that of the semiconductor device 10E in embodiment 6, and will not be described here.

Figure 75:
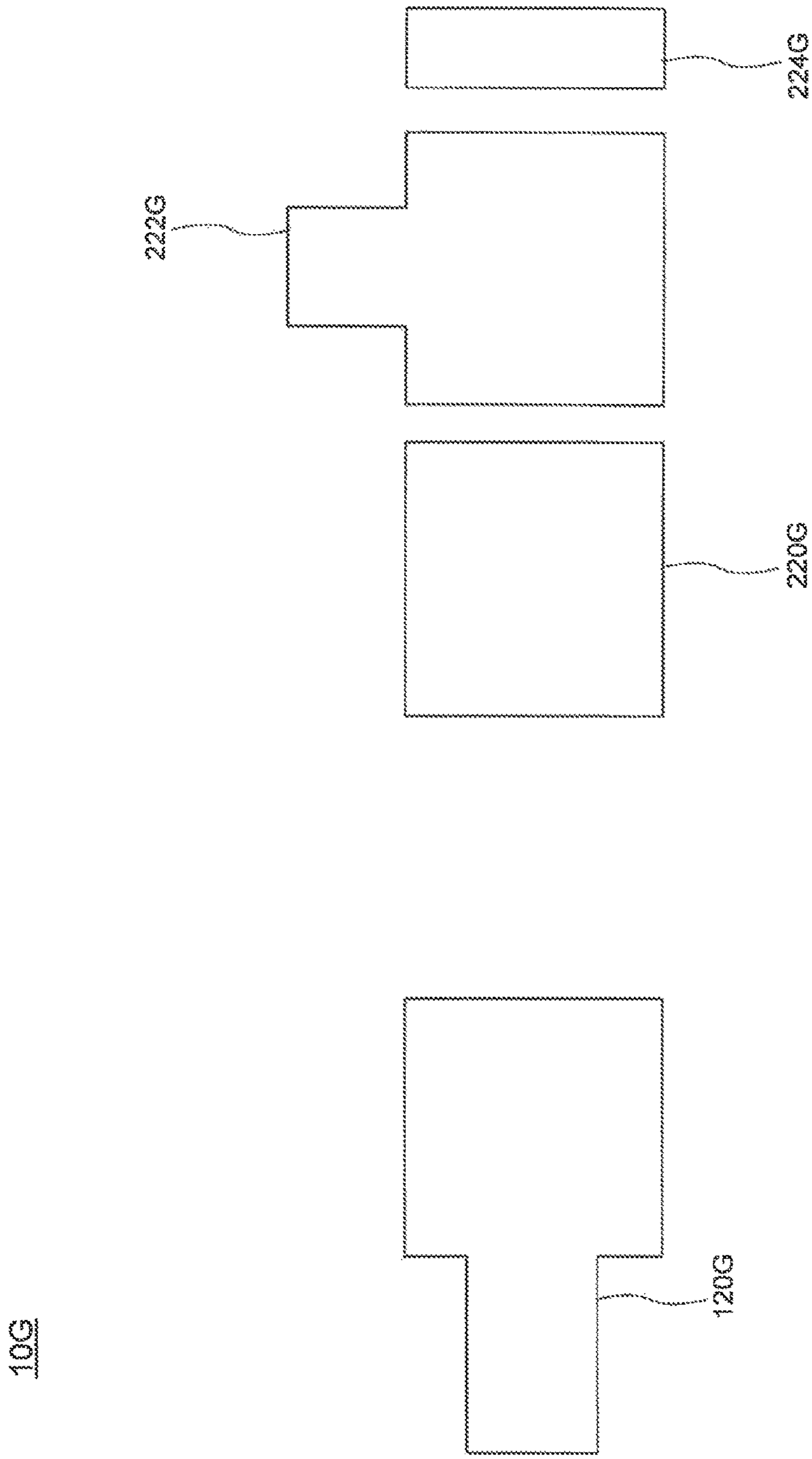
FIG. 75 is a plan view showing a step of forming a lower electrode, a back gate and a contact pad in a manufacturing method of the semiconductor device in the embodiment according to the present invention.
Figure 76:
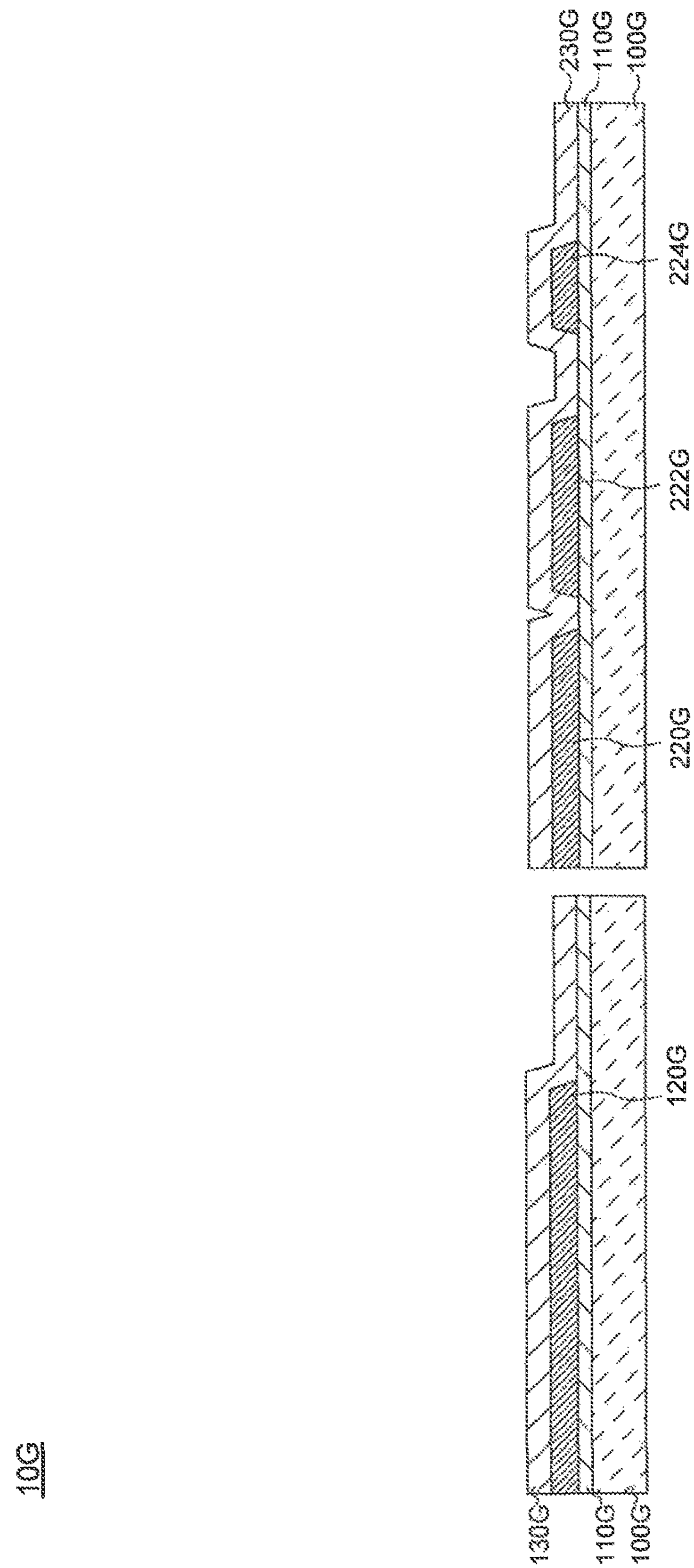
FIG. 76 is a cross-sectional view showing the step of forming the lower electrode, the back gate and the contact pad in a manufacturing method of the semiconductor device in the embodiment according to the present invention.

FIG. 75 and FIG. 76 are respectively a plan view and a cross-sectional view showing a step of forming the lower electrode 220G, the back gate 222G and the contact pad 224G in the manufacturing method of the semiconductor device 10G in embodiment 8 according to the present invention. Referring to FIG. 76, the underlying insulating layer 110G is formed on the substrate 100G. A conductive film for the lower electrode 220G, the back gate 222G and the contact pad 224G is formed thereon, and patterning is performed as shown in FIG. 75 by photolithography and etching to form the lower electrode 220G, the back gate 222G and the contact pad 224G. On the lower electrode 220G, the back gate 222G and the contact pad 224G formed as a result of the patterning, the insulating layer 230G is formed. The etching for forming the lower electrode 220G, the back gate 222G and the contact pad 224G is performed under the same conditions as those for the lower electrode 120G.

Figure 77:
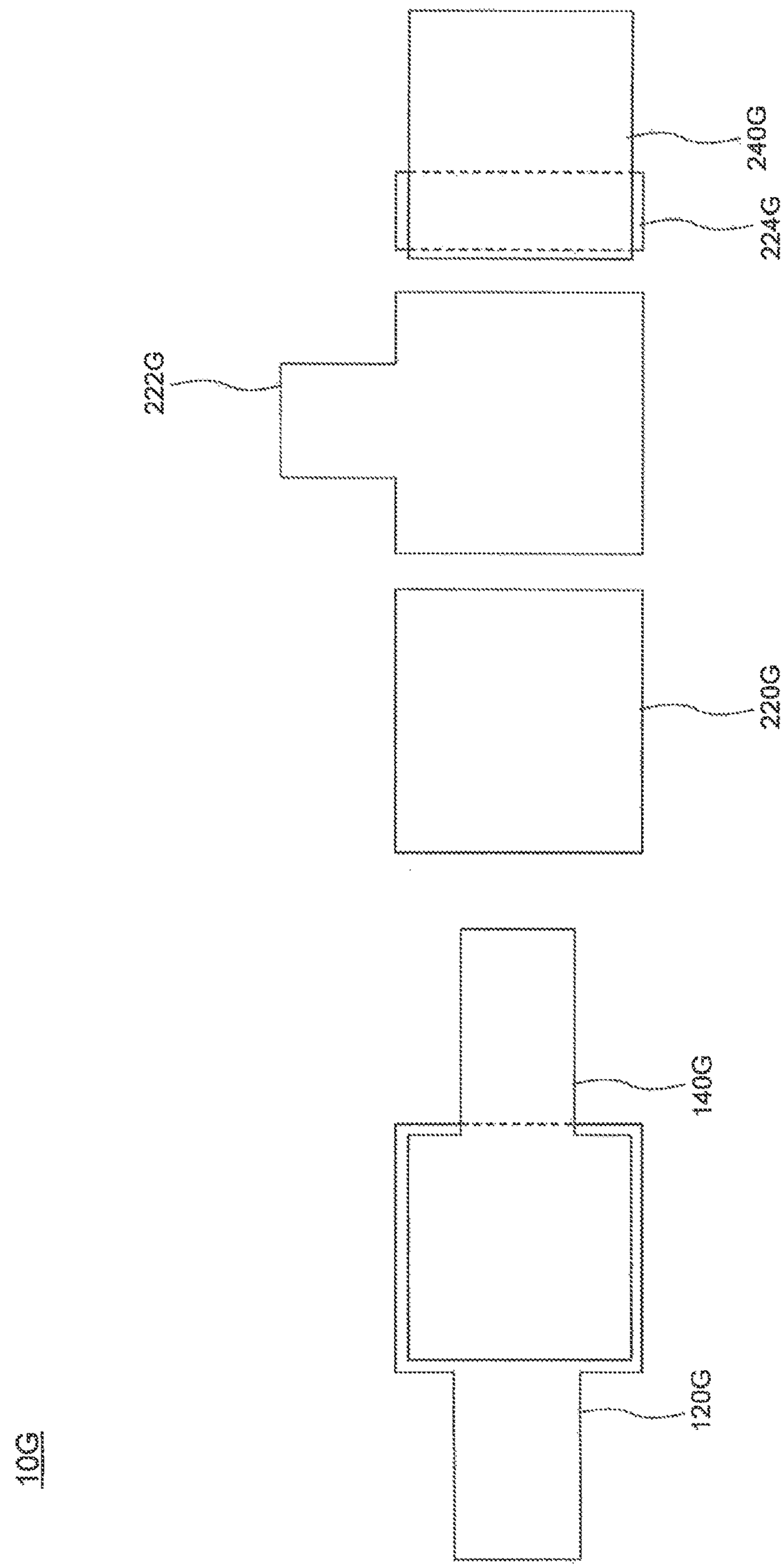
FIG. 77 is a plan view showing a step of forming an upper electrode in the manufacturing method of the semiconductor device in the embodiment according to the present invention.
Figure 78:
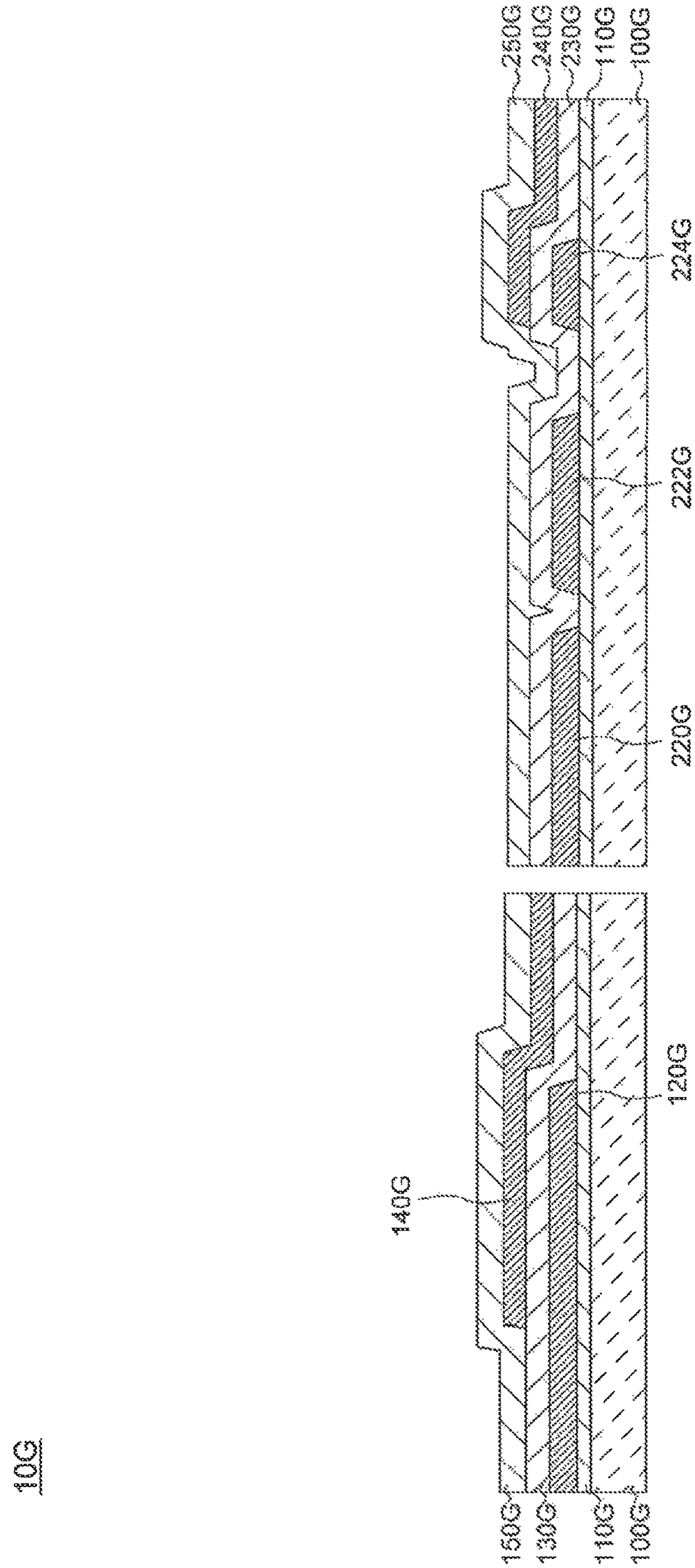
FIG. 78 is a cross-sectional view showing the step of forming the upper electrode in the manufacturing method of the semiconductor device in the embodiment according to the present invention.

FIG. 77 and FIG. 78 are respectively a plan view and a cross-sectional view showing a step of forming the upper electrode 240G in the manufacturing method of the semiconductor device 10G in embodiment 8 according to the present invention. Referring to FIG. 78, a conductive film for the upper electrode 240G is formed on the entirety of the substrate shown in FIG. 76, and patterning is performed as shown in FIG. 77 by photolithography and etching to form the upper electrode 240G. On the upper electrode 240G formed as a result of the patterning, the insulating layer 250G is formed. The etching for forming the upper electrode 240G is performed under the same conditions as those for the upper electrode 140G.

Figure 79:
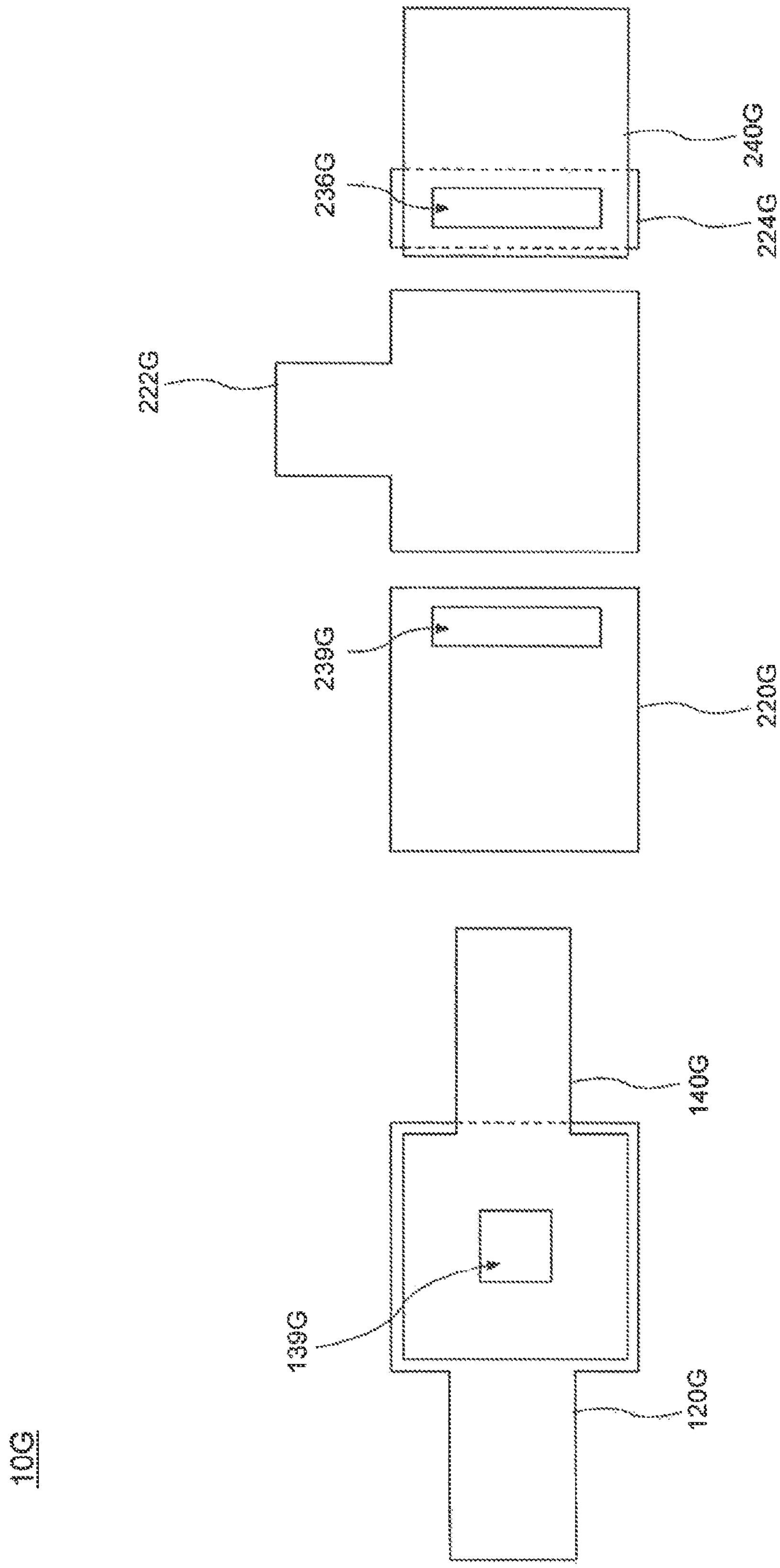
FIG. 79 is a plan view showing a step of forming openings in insulating layers and the upper electrode in the manufacturing method of the semiconductor device in the embodiment according to the present invention.
Figure 80:
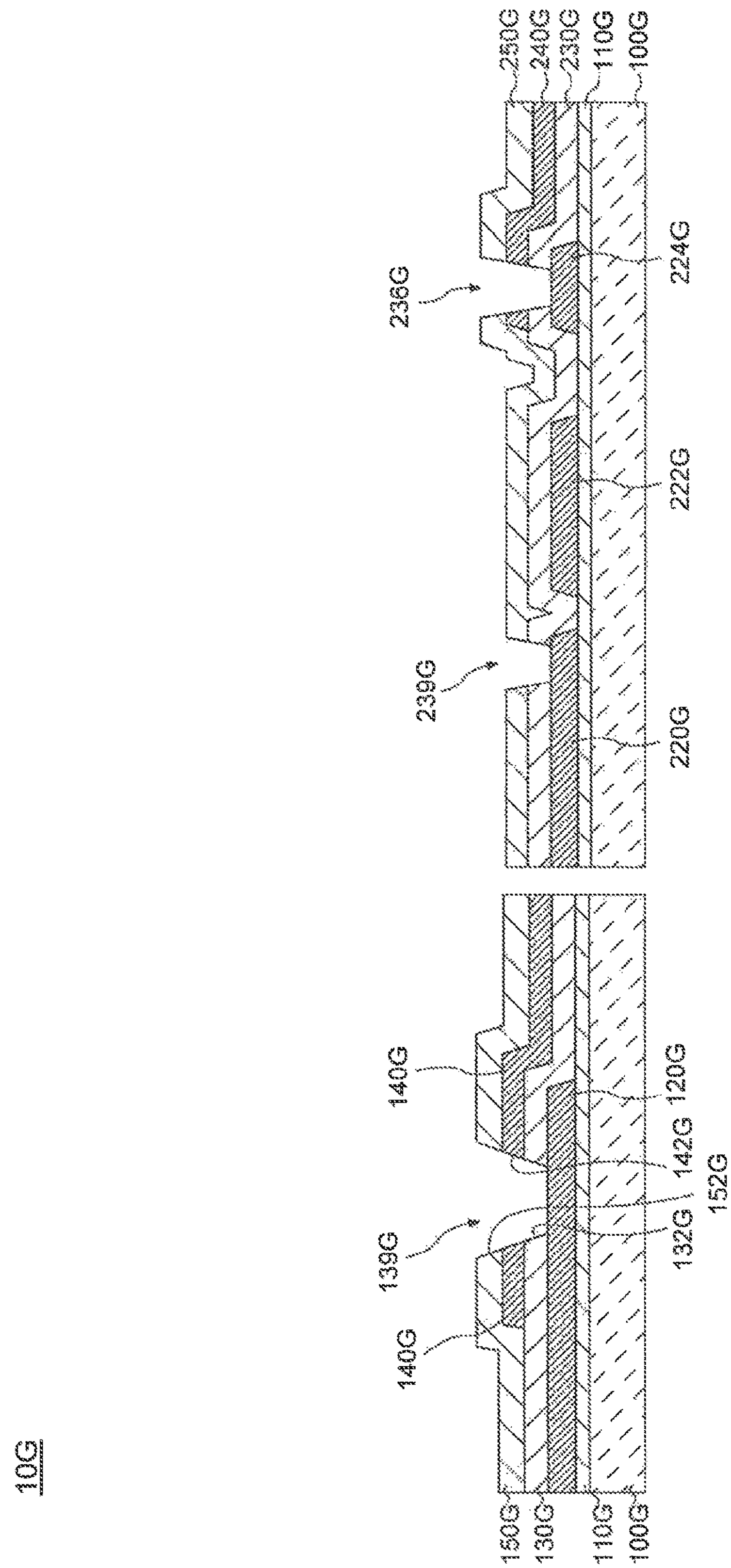
FIG. 80 is a cross-sectional view showing the step of forming the openings in the insulating layer and the upper electrode in the manufacturing method of the semiconductor device in the embodiment according to the present invention.

FIG. 79 and FIG. 80 are respectively a plan view and a cross-sectional view showing a step of forming the openings 239G and 236G in the insulating layers 230G and 250G, and the upper electrode 240G in the manufacturing method of the semiconductor device 10G in embodiment 8 according to the present invention. Referring to FIG. 80, the substrate shown in FIG. 78 is subjected to photolithography and etching to form the opening 239G in the insulating layers 230G and 250G to expose the lower electrode 220G and to form the opening 236G in the insulating layers 230G and 250G, and the upper electrode 240G to expose the contact pad 224G. The openings 239G and 236G have the patterns shown in FIG. 79. The etching for forming the openings 236G and 239G is performed under the same conditions as those for an opening 139G.

Figure 81:
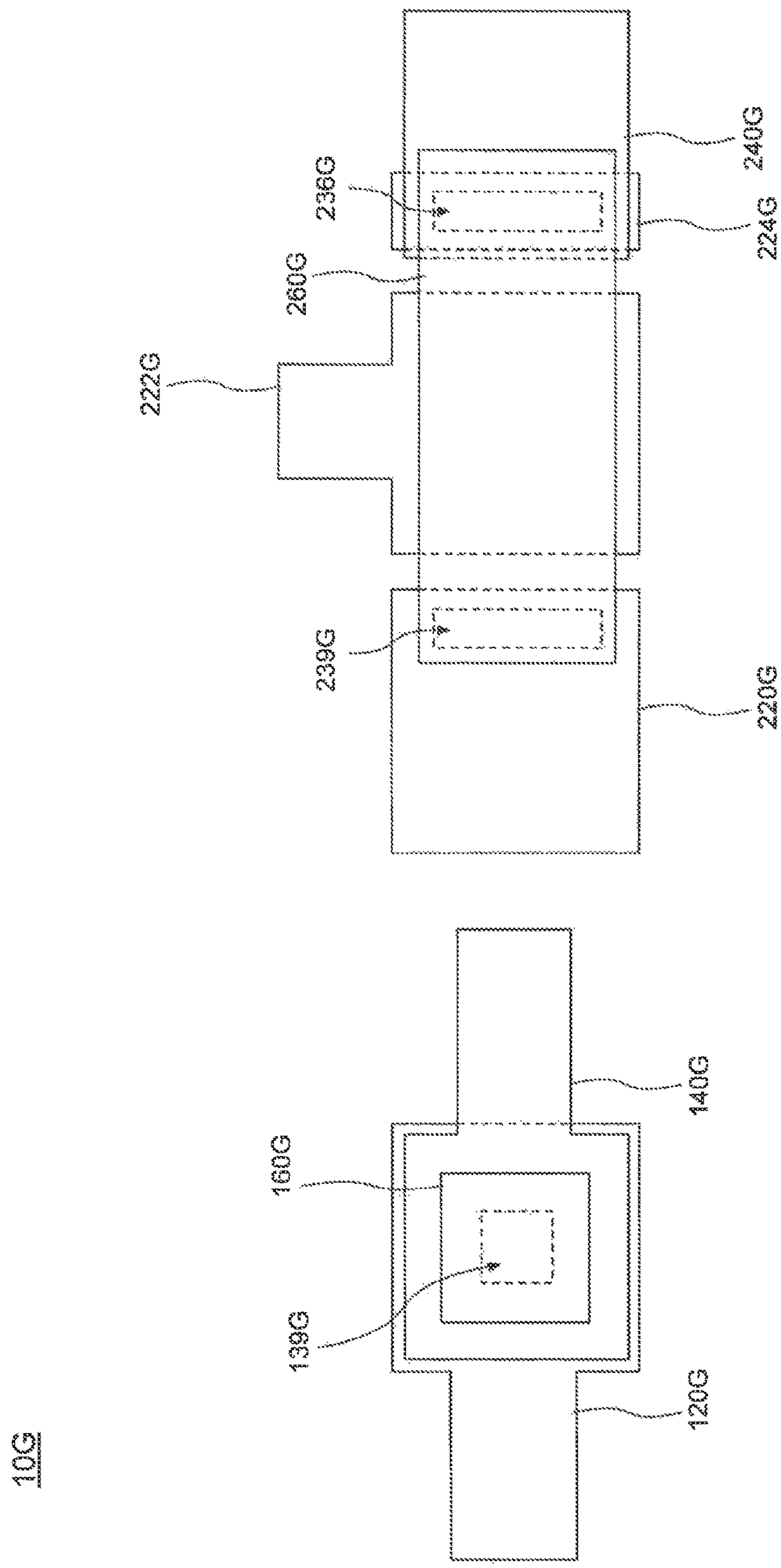
FIG. 81 is a plan view showing a step of forming an oxide semiconductor layer in the manufacturing method of the semiconductor device in the embodiment according to the present invention.
Figure 82:
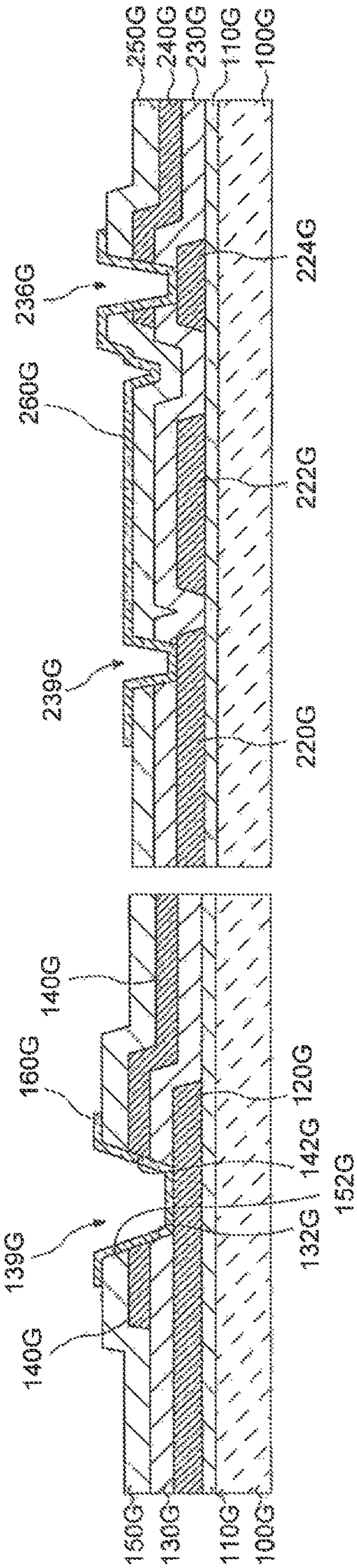
FIG. 82 is a cross-sectional view showing the step of forming the oxide semiconductor layer in the manufacturing method of the semiconductor device in the embodiment according to the present invention.

FIG. 81 and FIG. 82 are respectively a plan view and a cross-sectional view showing a step of forming the oxide semiconductor layer 260G in the manufacturing method of the semiconductor device 10G in embodiment 8 according to the present invention. Referring to FIG. 82, a film for the oxide semiconductor layer 260G is formed on the entirety of the substrate shown in FIG. 80, and patterning is performed as shown in FIG. 81 by photolithography and etching to form the oxide semiconductor layer 260G. The formation of the oxide semiconductor layer 260G by etching may be performed by substantially the same method as in embodiment 1.

Figure 83:
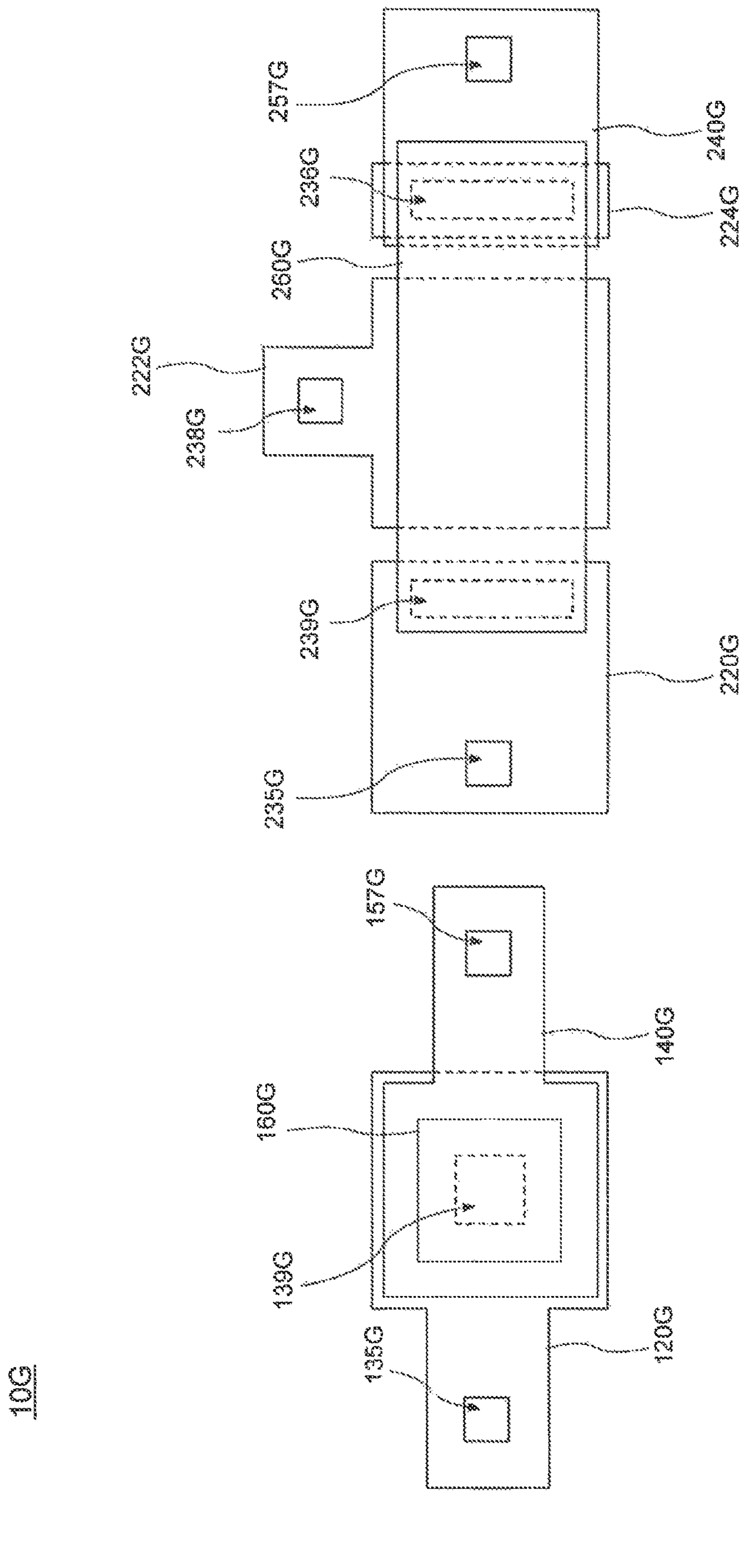
FIG. 83 is a plan view showing a step of forming openings reaching the lower electrode, the upper electrode and the like in the manufacturing method of the semiconductor device 10G in embodiment 8 according to the present invention.
Figure 84:
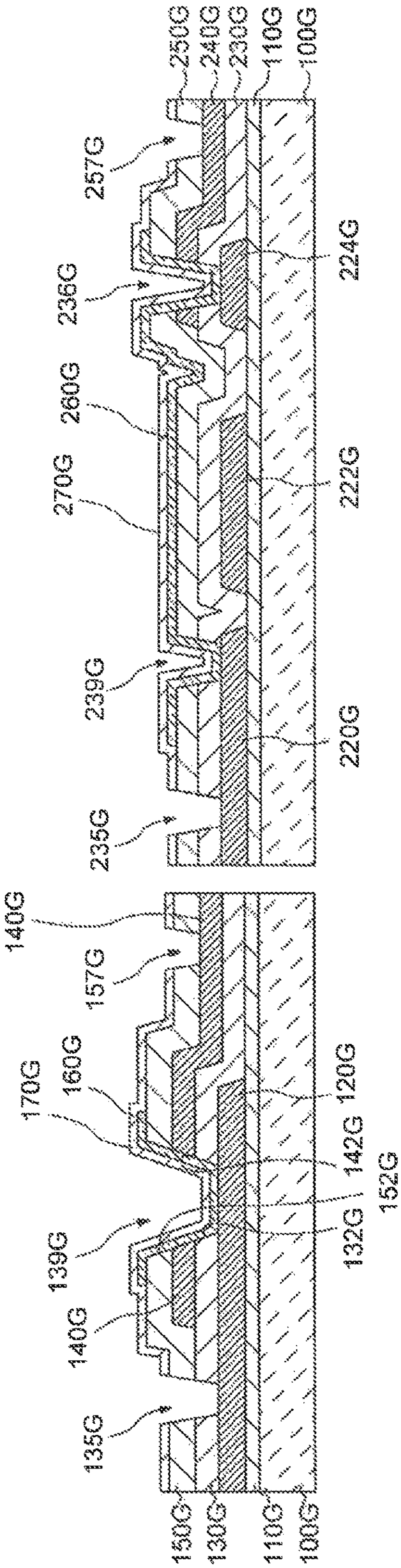
FIG. 84 is a cross-sectional view showing the step of forming the openings reaching the lower electrode, the upper electrode and the like in the manufacturing method of the semiconductor device in the embodiment according to the present invention.

FIG. 83 and FIG. 84 are respectively a plan view and a cross-sectional view showing a step of forming the openings 235G and 257G and also an opening 238G reaching the lower electrode 220G, the upper electrode 240G and the like in the manufacturing method of the semiconductor device 10G in embodiment 8 according to the present invention. Referring to FIG. 84, the gate insulating layer 270G is formed on the entirety of the substrate shown in FIG. 82, and patterning is performed as shown in FIG. 83 by photolithography and etching to form the openings 235G, 238G and 257G. The etching for forming the openings 235G, 238G and 257G is performed under the same conditions as those for openings 135G and 157G.

A conductive layer for the gate electrode 280G, the source line 290G and the drain line 292G is formed on the entirety of the substrate shown in FIG. 84, and patterning is performed as shown in FIG. 73 and FIG. 74 by photolithography and etching to form the gate electrode 280G, the source line 290G and the drain line 292G. The second transistor 30G of the semiconductor device 10G in embodiment 8 according to the present invention is manufactured by the above-described manufacturing method.

As described above, with the manufacturing method of the semiconductor device 10G in embodiment 8 according to the present invention, the first transistor 20G having a channel length of a nanometer order and the second transistor 30G having a channel length of a micrometer order are formed by the same manufacturing method.

Embodiment 9

With reference to FIG. 85 through FIG. 96, an overview of a semiconductor 10H in embodiment 9 according to the present invention will be described. The semiconductor device 10H includes a first transistor 20H having a short channel length and a second transistor 30H having a long channel length. The first transistor 20H having a short channel length has substantially the same structure as that of the semiconductor device 10F in embodiment 7. In the following explanation, the features of the first transistor 20H will not be described, and the second transistor 30H having a long channel length will be described. In the following description, components that are the same as, or have the same functions as, those of the semiconductor device 10F will be represented by the same reference signs (numerals) with alphabets, and detailed descriptions thereof will be omitted.

The second transistor 30H is similar to the second transistor 30G shown in FIG. 73 and FIG. 74, but openings 235H and 237H have shapes different from those of the corresponding openings of the second transistor 30G. In the following explanation, the features of the second transistor 30H that are the same as those of the second transistor 30G will not be described, and the above-described differences will be described.

[Structure of the Second Transistor 30H]

Figure 85:
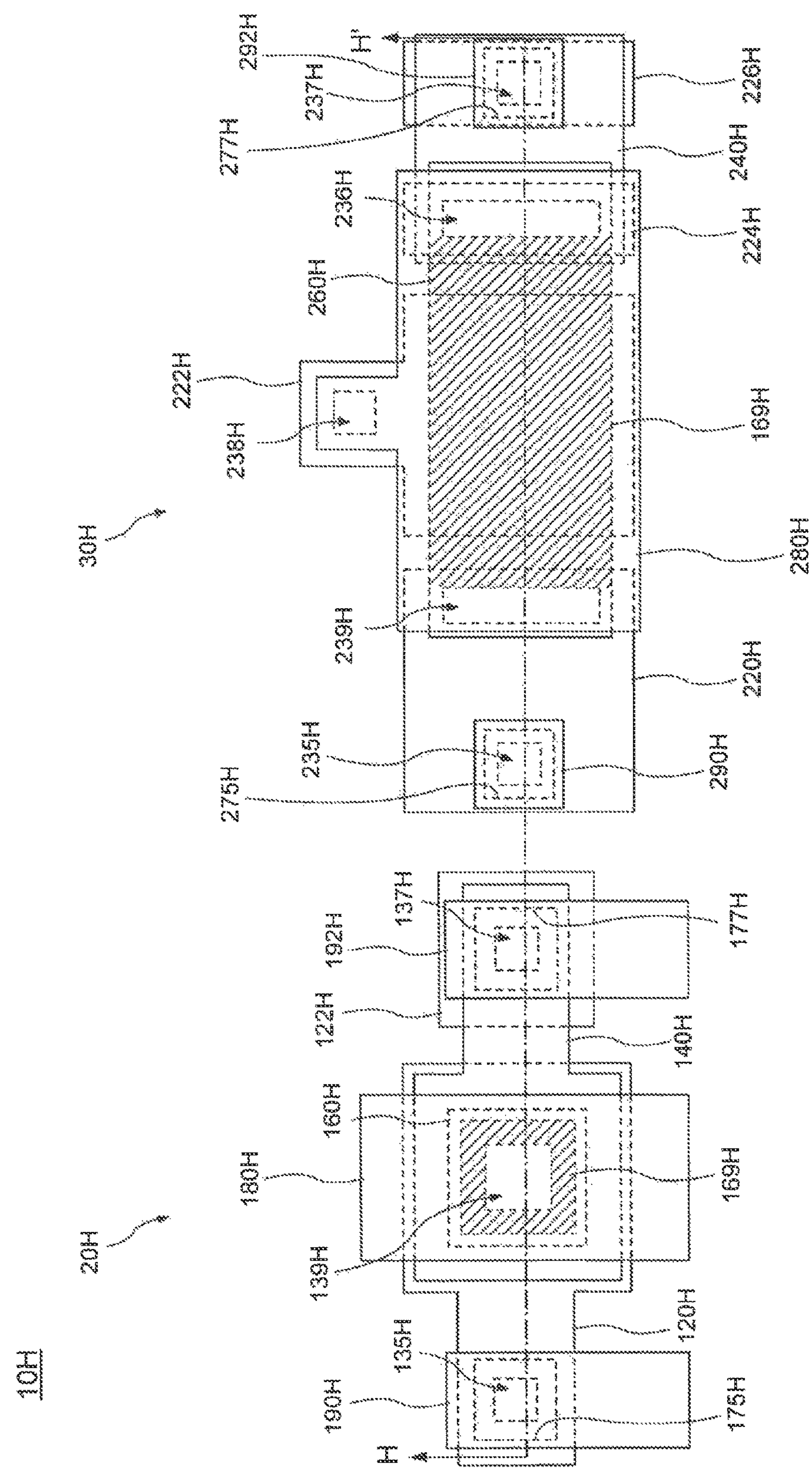
FIG. 85 is a plan view showing an overview of a semiconductor device in an embodiment according to the present invention.
Figure 86:
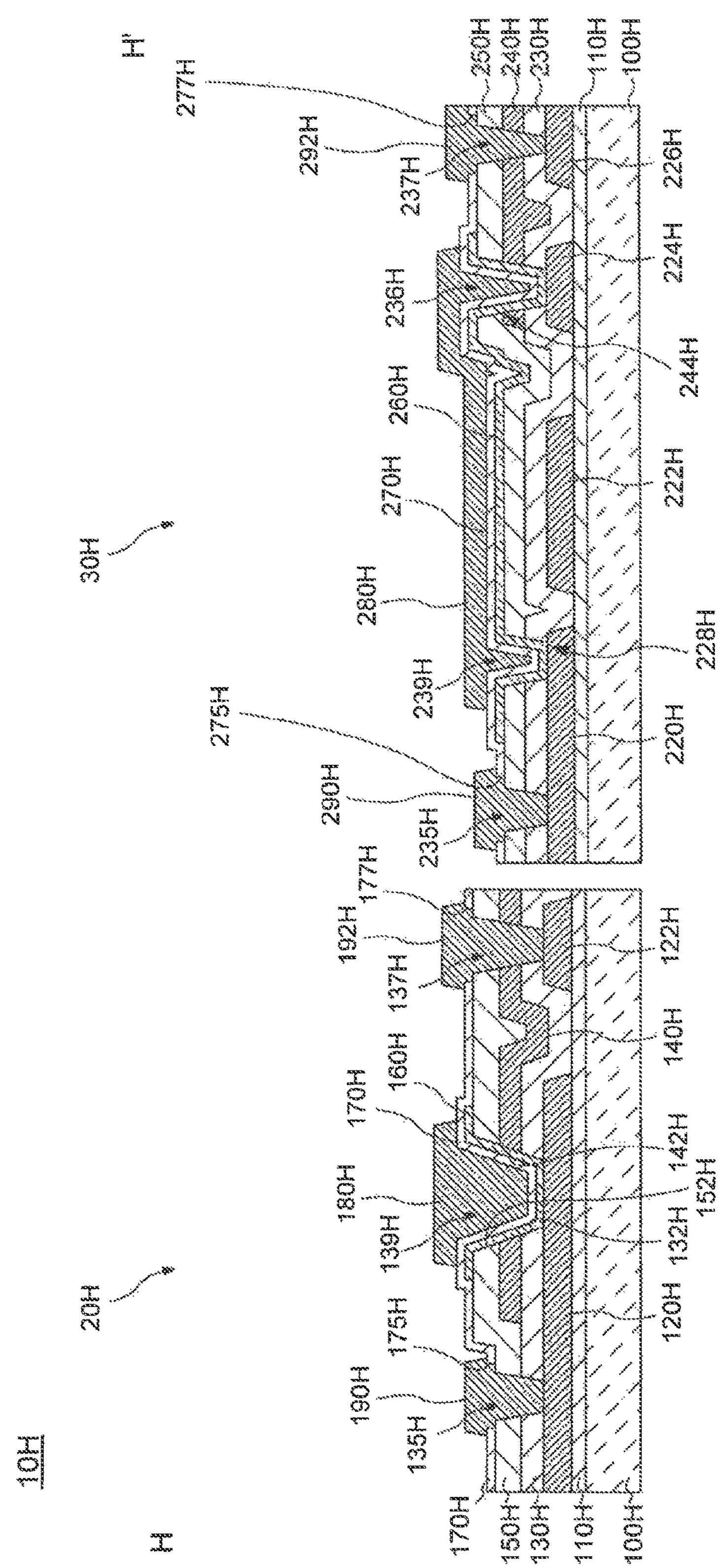
FIG. 86 is a cross-sectional view showing the overview of the semiconductor device in the embodiment according to the present invention.

FIG. 85 and FIG. 86 are respectively a plan view and a cross-sectional view showing an overview of the semiconductor device 10H in embodiment 9 according to the present invention. FIG. 86 is taken along line H-H' in FIG. 85. As shown in FIG. 85 and FIG. 86, in the second transistor 30H, a side wall of the opening 235H formed in insulating layers 230H and 250H and a gate insulating layer 270H, and a side wall of the opening 237H formed in the insulating layers 230H and 250H, an upper electrode 240H and the gate insulating layer 270H, are stepped as seen in a cross-sectional view. Specifically, in each of the openings 235H and 237H, the opening in the gate insulating layer 270H has a diameter longer than the diameter of the opening in the insulating layer 250H. In other words, side walls 275H and 277H of the gate insulating layer 270H respectively exposed to the openings 235H and 237H are located on a top surface of the insulating layer 250H, and extend upward from the top surface of the insulating layer 250H. The openings 235H and 237H having such a shape are formed by a manufacturing method of the second transistor 30H described below. Specifically, the step of forming the openings in the insulating layer 250H and the step of forming the openings in the gate insulating layer 270H are performed at different timings. As a result, the openings 235H and the 237H having the shapes shown in FIG. 86 are formed.

As shown in FIG. 85 and FIG. 86, a contact pad 226H is located below the opening 237H, and the opening 237H is formed in the insulating layer 250H, the upper electrode 240H and the insulating layer 230H to reach the contact pad 226H. In the opening 237H, a drain line 292H is connected with the upper electrode 240H at a side surface of the upper electrode 240H and is connected with the contact pad 226H at a top surface of the contact pad 226H.

[Manufacturing Method of the Second Transistor 30H]

With reference to plan views and cross-sectional views provided in FIG. 87 through FIG. 96, a manufacturing method of the second transistor 30H of the semiconductor device 10H in embodiment 9 according to the present invention will be described.

Figure 87:
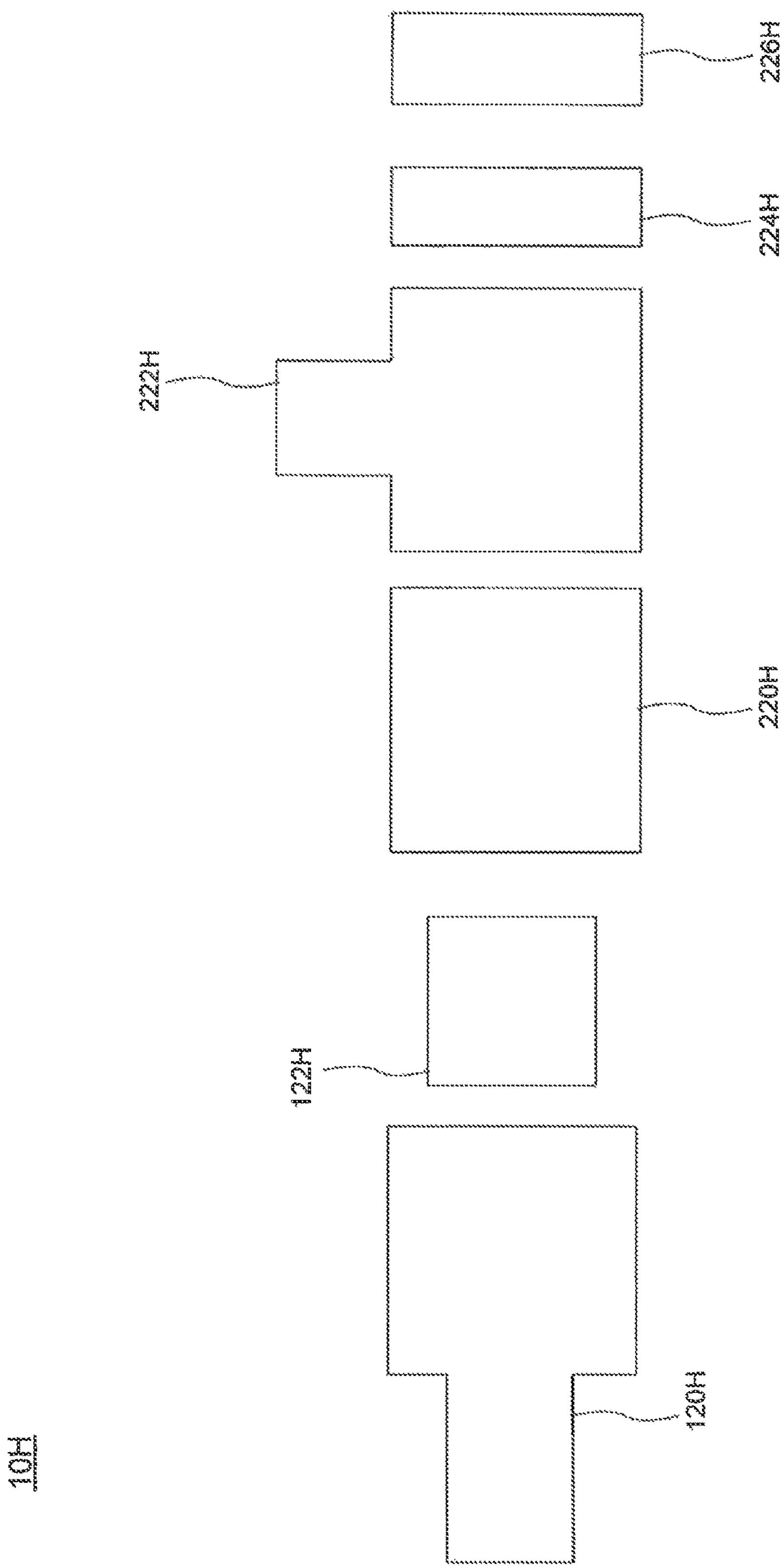
FIG. 87 is a plan view showing a step of forming a lower electrode, a back gate and contact pads in a manufacturing method of the semiconductor device in the embodiment according to the present invention.
Figure 88:
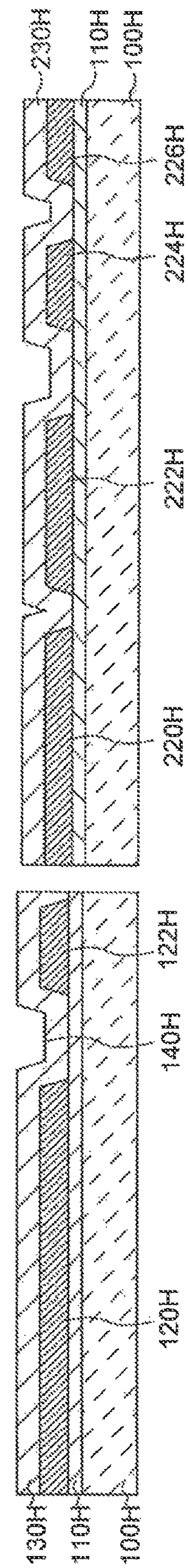
FIG. 88 is a cross-sectional view showing the step of forming the lower electrode, the back gate and the contact pads in the manufacturing method of the semiconductor device in the embodiment according to the present invention.

FIG. 87 and FIG. 88 are respectively a plan view and a cross-sectional view showing a step of forming a lower electrode 220H, a back gate 222H, a contact pad 224H and the contact pad 226H in the manufacturing method of the semiconductor device 10H in embodiment 9 according to the present invention. Referring to FIG. 88, an underlying insulating layer 110H is formed on a substrate 100H. A conductive film for the lower electrode 220H, the back gate 222H and the contact pads 224H and 226H is formed thereon, and patterning is performed as shown in FIG. 87 by photolithography and etching to form the lower electrode 220H, the back gate 222H and the contact pads 224H and 226H. On the lower electrode 220H, the back gate 222H and the contact pads 224H and 226H formed as a result of the patterning, the insulating layer 230H is formed. The etching for forming the lower electrode 220H, the back gate 222H and the contact pads 224H and 226H is performed under the same conditions as those for a lower electrode 120H and a contact pad 122H.

Figure 89:
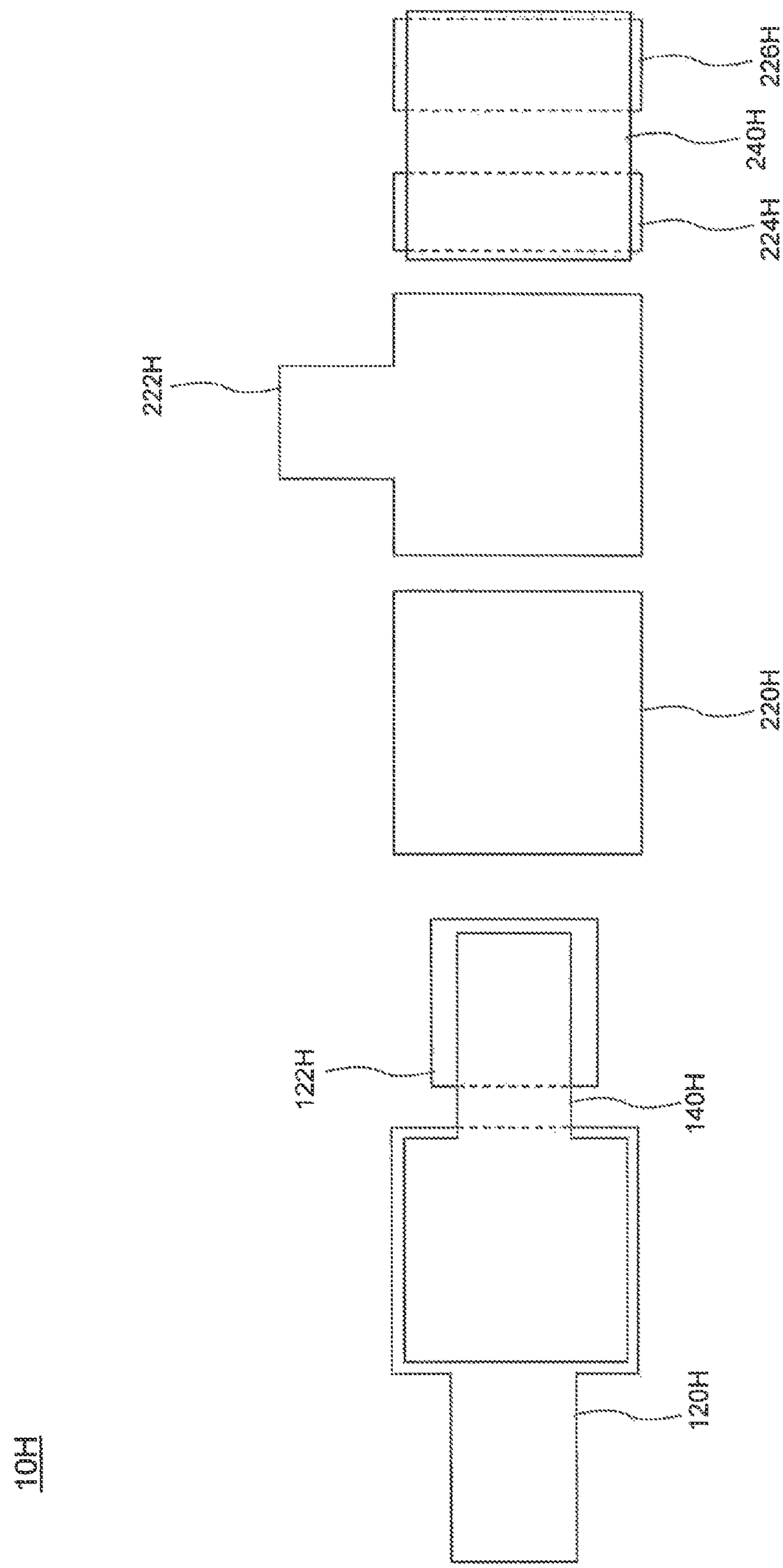
FIG. 89 is a plan view showing a step of forming an upper electrode in the manufacturing method of the semiconductor device in the embodiment according to the present invention.
Figure 90:
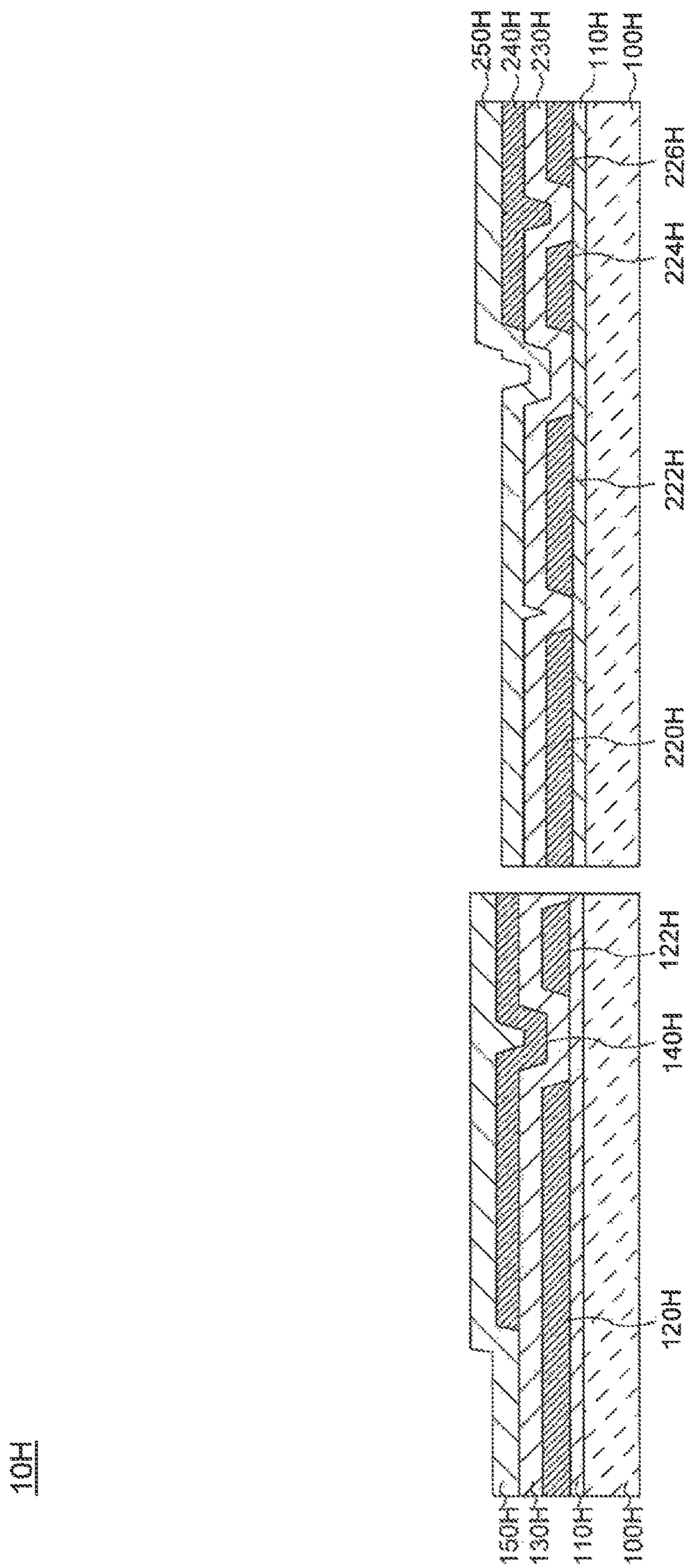
FIG. 90 is a cross-sectional view showing the step of forming the upper electrode in the manufacturing method of the semiconductor device in the embodiment according to the present invention.

FIG. 89 and FIG. 90 are respectively a plan view and a cross-sectional view showing a step of forming the upper electrode 240H in the manufacturing method of the semiconductor device 10H in embodiment 9 according to the present invention. Referring to FIG. 90, a conductive film for the upper electrode 240H is formed on the entirety of the substrate shown in FIG. 88, and patterning is performed as shown in FIG. 89 by photolithography and etching to form the upper electrode 240H. On the upper electrode 240H formed as a result of the patterning, the insulating layer 250H is formed. The etching for forming the upper electrode 240H is performed under the same conditions as those for an upper electrode 140H.

Figure 91:
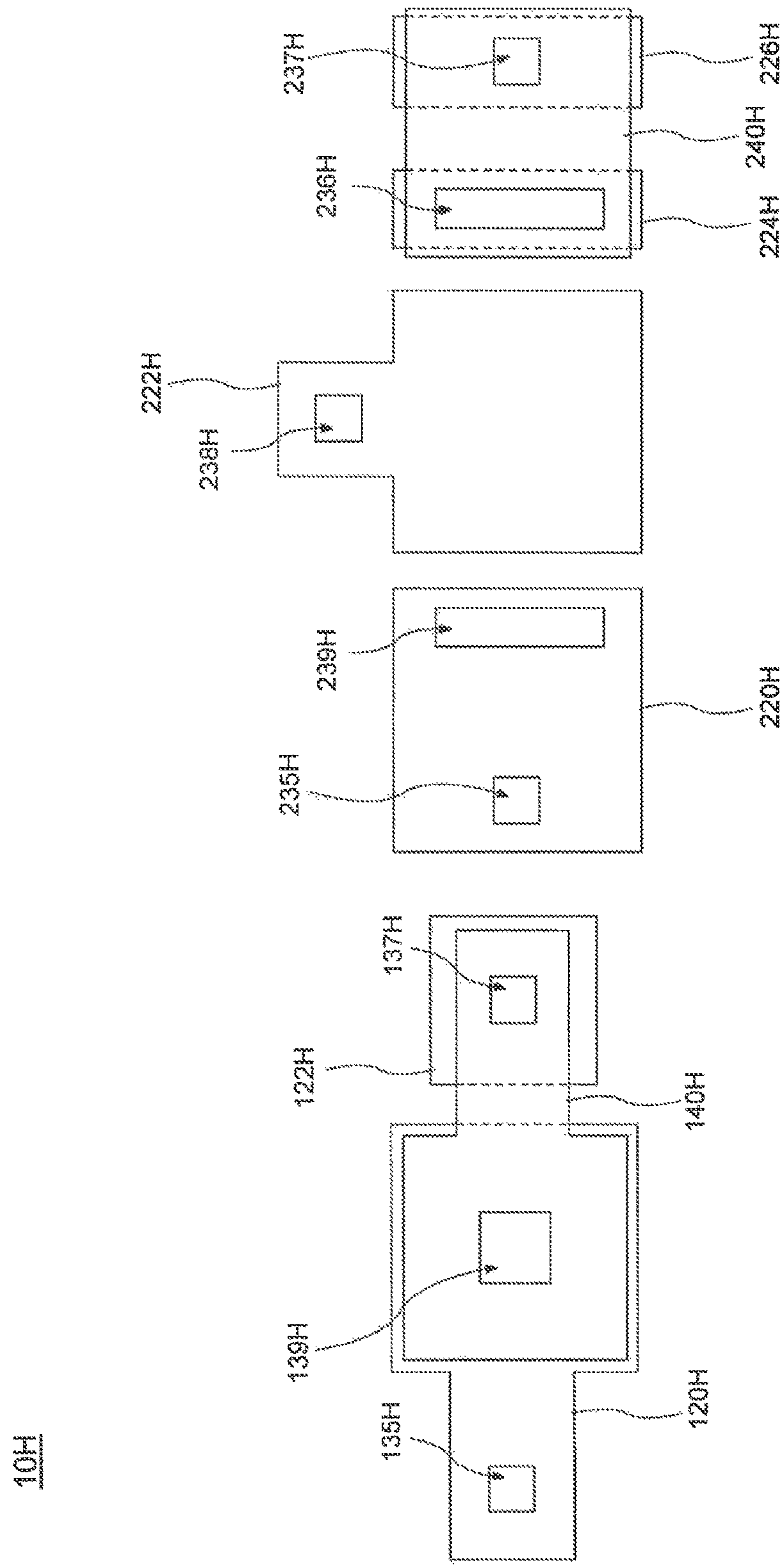
FIG. 91 is a plan view showing a step of forming openings in insulating layers in the manufacturing method of the semiconductor device in the embodiment according to the present invention.
Figure 92:
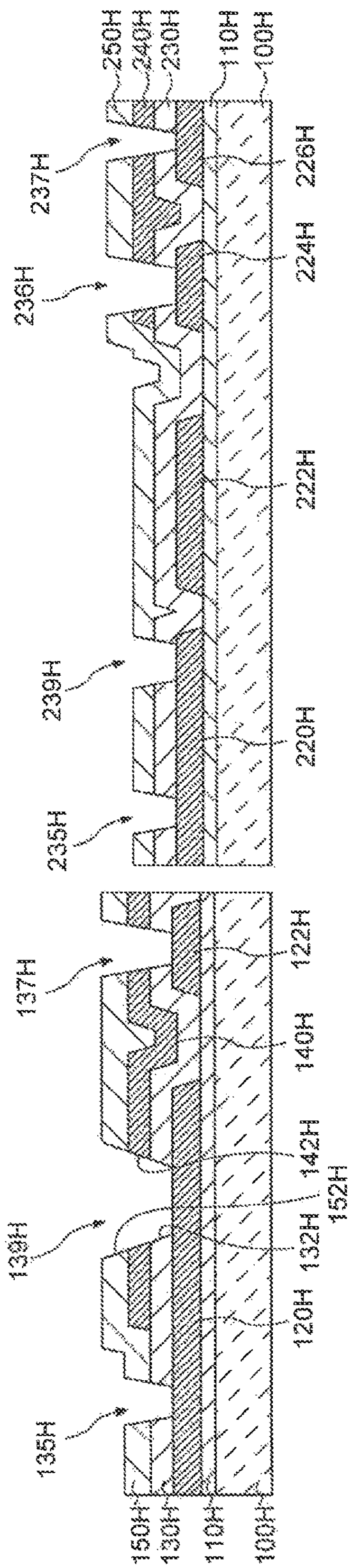
FIG. 92 is a cross-sectional view showing the step of forming the openings in the insulating layers in the manufacturing method of the semiconductor device in the embodiment according to the present invention.

FIG. 91 and FIG. 92 are respectively a plan view and a cross-sectional view showing a step of forming the openings 235H and 237H and also openings 236H, 238H and 239H in the insulating layers 230H and 250H, and the upper electrode 240H in the manufacturing method of the semiconductor device 10H in embodiment 9 according to the present invention. Referring to FIG. 92, the substrate shown in FIG. 90 is subjected to photolithography and etching to form the openings 235H and 239H in the insulating layers 230H and 250H to expose the lower electrode 220H, to form the opening 236H in the insulating layers 230H and 250H and the upper electrode 240H to expose the contact pad 224H, and to form the opening 237H in the insulating layers 230H and 250H and the upper electrode 240H to expose the contact pad 226H. The openings 235H, 236H, 237H, 238H and 239H have the patterns shown in FIG. 91. The etching for forming the openings 235H, 236H, 237H, 238H and 239H is performed under the same conditions as those for openings 135H, 137H and 139H.

Figure 93:
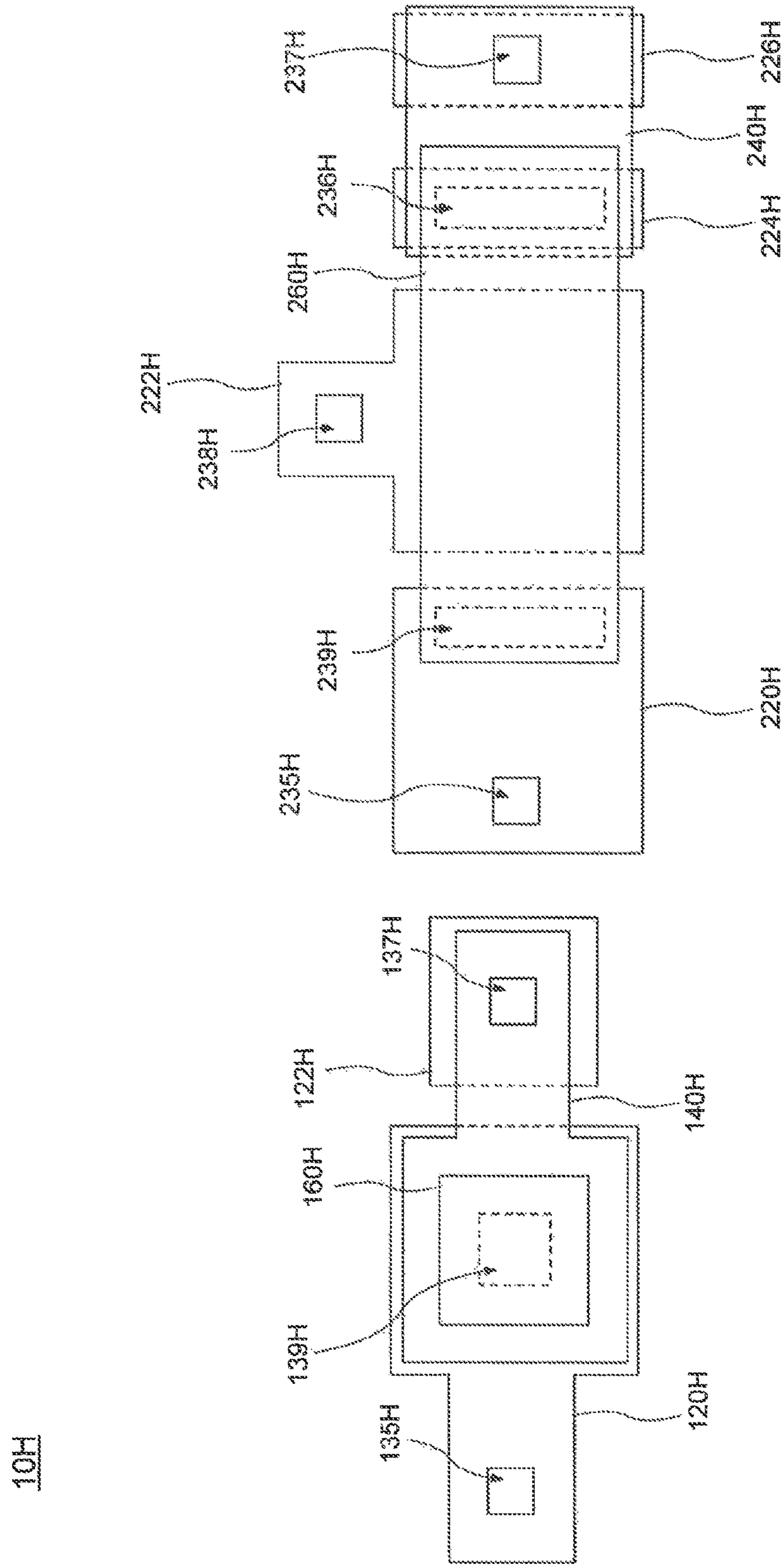
FIG. 93 is a plan view showing a step of forming an oxide semiconductor layer in the manufacturing method of the semiconductor device in the embodiment according to the present invention.
Figure 94:
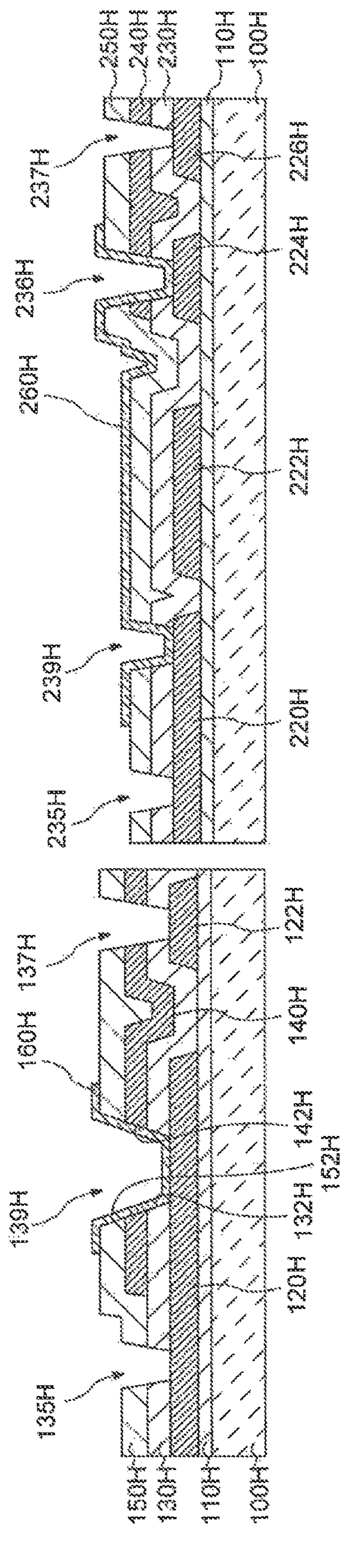
FIG. 94 is a cross-sectional view showing the step of forming the oxide semiconductor layer in the manufacturing method of the semiconductor device in the embodiment according to the present invention.

FIG. 93 and FIG. 94 are respectively a plan view and a cross-sectional view showing a step of forming an oxide semiconductor layer 260H in the manufacturing method of the semiconductor device 10H in embodiment 9 according to the present invention. Referring to FIG. 94, a film for the oxide semiconductor layer 260H is formed on the entirety of the substrate shown in FIG. 92, and patterning is performed as shown in FIG. 93 by photolithography and etching to form the oxide semiconductor layer 260H. The oxide semiconductor layer 260H is formed in the openings 236H and 239H, and a part of the film for the oxide semiconductor layer 260H that is located in the openings 235H and 237H is etched away. The formation of the oxide semiconductor layer 260H by etching may be performed by substantially the same method as in embodiment 1.

Figure 95:
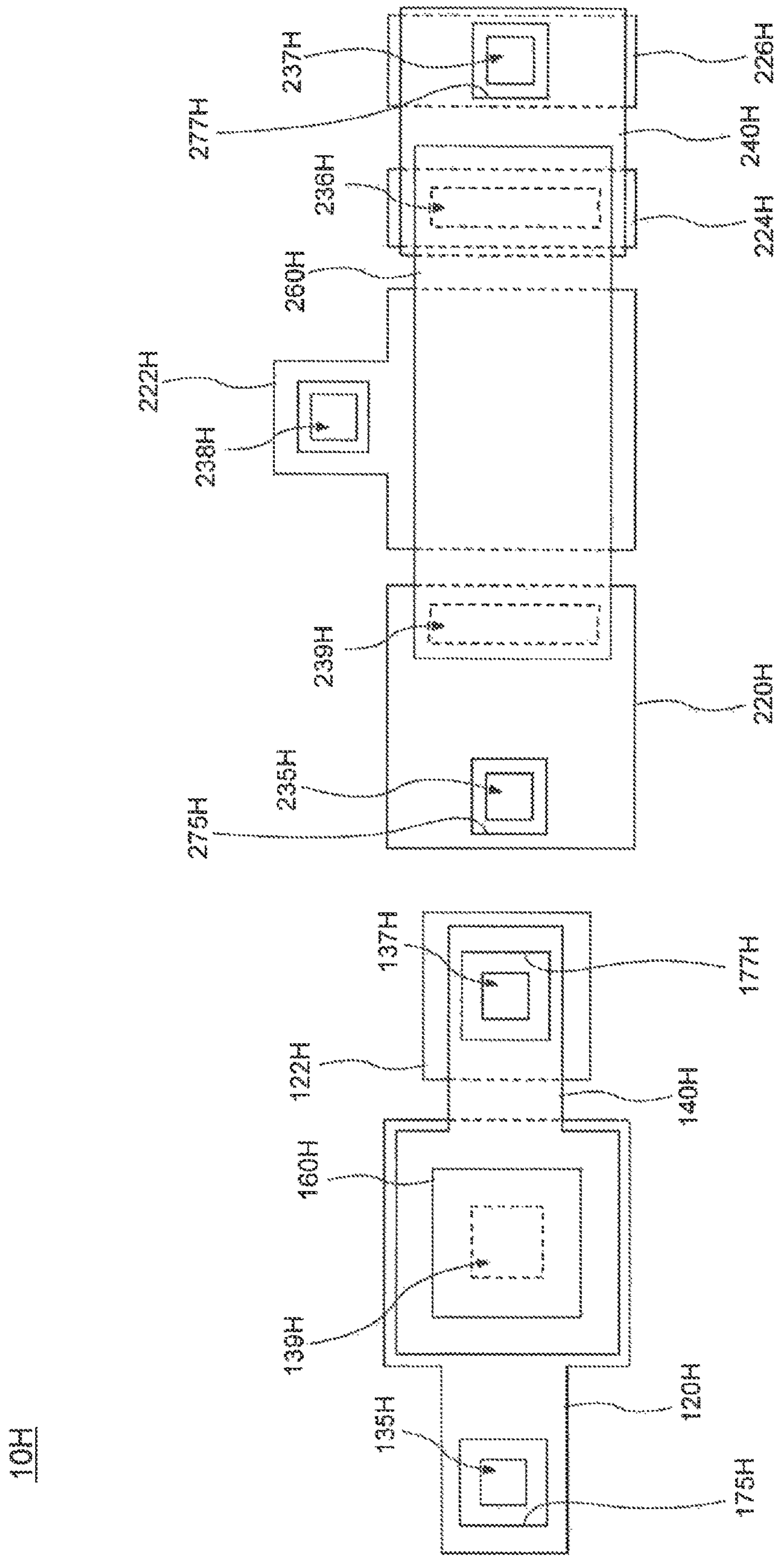
FIG. 95 is a plan view showing a step of forming openings exposing the lower electrode, the upper electrode and the like in the manufacturing method of the semiconductor device in the embodiment according to the present invention.
Figure 96:
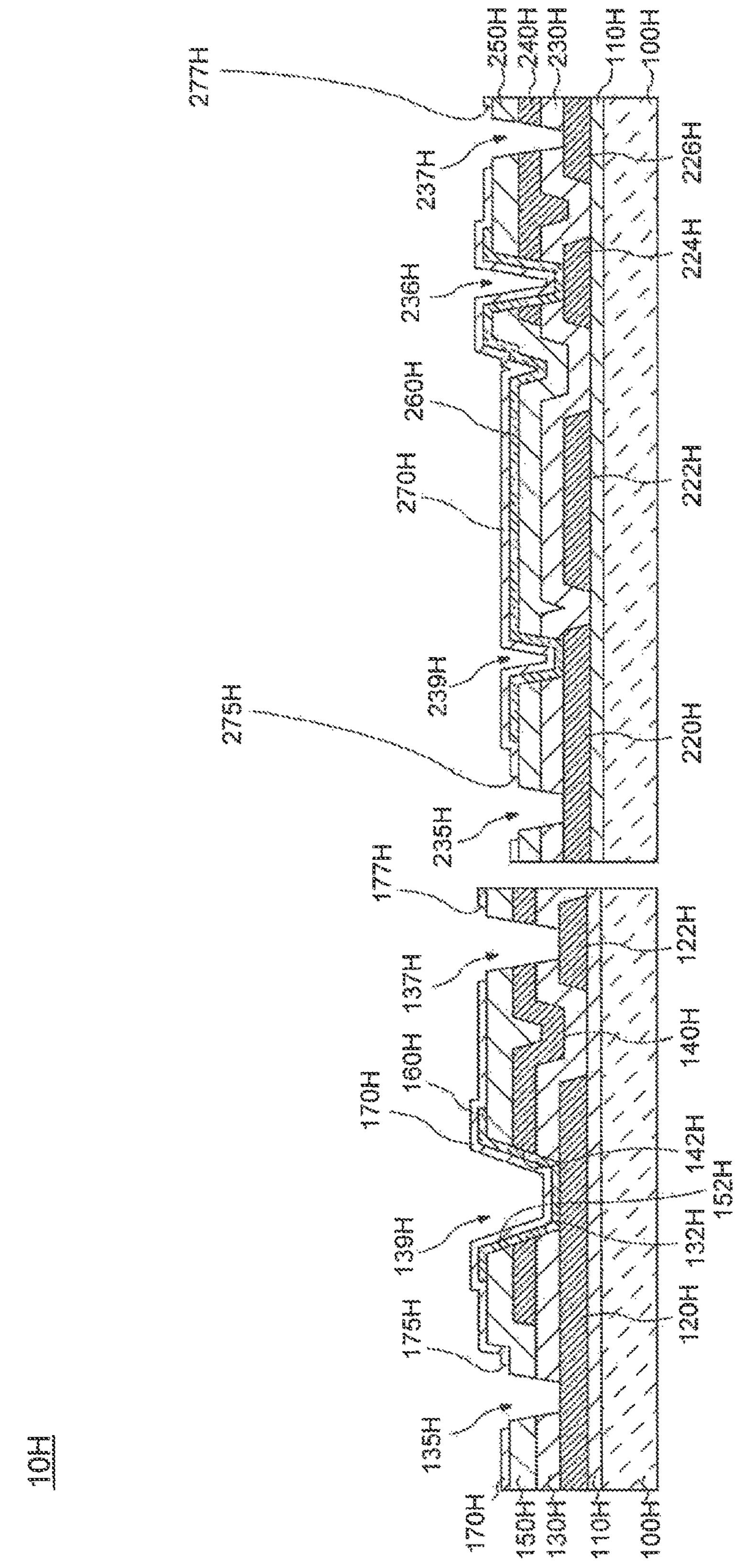
FIG. 96 is a cross-sectional view showing the step of forming the openings exposing the lower electrode, the upper electrode and the like in the manufacturing method of the semiconductor device in the embodiment according to the present invention.

FIG. 95 and FIG. 96 are respectively a plan view and a cross-sectional view showing a step of forming openings exposing the lower electrode 220H, the upper electrode 240H and the like in the manufacturing method of the semiconductor device 10H in embodiment 9 according to the present invention. Referring to FIG. 96, the gate insulating layer 270H is formed on the entirety of the substrate shown in FIG. 94, and is patterned as shown in FIG. 95 by photolithography and etching to form the openings in regions corresponding to the openings 235H, 237H and 238H. The resultant opening 235H exposes the lower electrode 220H, and the resultant opening 237H exposes a side wall of the upper electrode 240H and the contact pad 226H. The etching for forming the openings 235H, 237H and 238H in the gate insulating layer 270H is performed under the same conditions as those for forming openings 135H and 137H in a gate insulating layer 170H.

A conductive layer for a gate electrode 280H, a source line 290H and a drain line 292H is formed on the entirety of the substrate shown in FIG. 96, and patterning is performed as shown in FIG. 85 and FIG. 86 by photolithography and etching to form the gate electrode 280H, the source line 290H and the drain line 292H. The second transistor 30H of the semiconductor device 10H in embodiment 9 according to the present invention is manufactured by the above-described manufacturing method.

As described above, with the manufacturing method of the semiconductor device 10H in embodiment 9 according to the present invention, the first transistor 20H having a channel length of a nanometer order and the second transistor 30H having a channel length of a micrometer order are formed by the same manufacturing method.

[Structures of Lower Electrode 120I and Upper Electrode 140I in Embodiments 6 Through 9]

Figure 97:
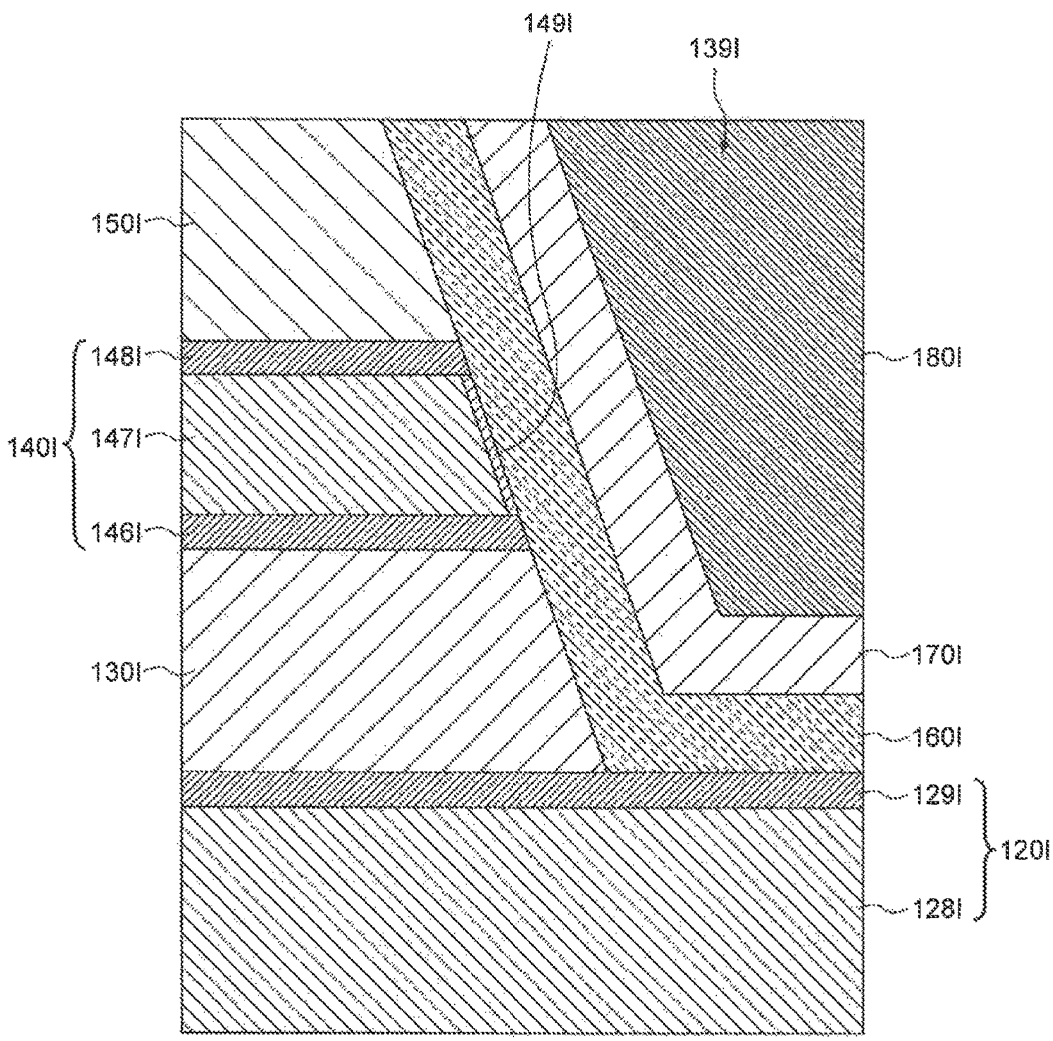
FIG. 97 is a cross-sectional view showing structures of a lower electrode and an upper electrode in a semiconductor device in an embodiment according to the present invention.

With reference to FIG. 97, the structures of the lower electrode and the upper electrode in embodiments 6 through 9 will be described. In embodiments 6 through 9, as shown in FIG. 97, an oxide semiconductor layer 160I is in contact with a lower electrode 120I at a top surface, of the lower electrode 120I, exposed to an opening 139I, and the oxide semiconductor layer 160I is in contact with an upper electrode 140I at a side wall, of the upper electrode 140I, exposed to the opening 139I. In this example, it is assumed that the lower electrode 120I and the upper electrode 140I each have a stack structure including an Al layer.

FIG. 97 is a cross-sectional view showing the structures of the lower electrode 120I and the upper electrode 140I in a semiconductor device in an embodiment according to the present invention. In this semiconductor device, layers respectively forming the same layers with the lower electrode 120I and the upper electrode 140I are used to form lines in each of circuits and between the circuits. These lines are required to have a low electric resistance, and therefore, Al is used for these lines as a material that has a low resistance and costs low. Although having a low electric resistance, Al is easily oxidized at a surface thereof to become insulating. For this reason, such a line has a stack structure including Al and another material that is less likely to be oxidized, or is less likely to have a high resistance even if being oxidized, as compared with Al, for example, Ti or the like.

For example, in the structure shown in FIG. 97, the lower electrode 120I has a two-layer structure including an Al layer 128I and a Ti layer 129I, and the upper electrode 140I has a three-layer structure including an Al layer 147I and Ti layers 146I and 148I. The lower electrode 120I includes the Ti layer 129I as the outermost layer. Therefore, the oxide semiconductor layer 160I is connected with the lower electrode 120I. Regarding the upper electrode 140I, a side surface of the Al layer 147I is exposed by the opening 139I. Therefore, the side surface of the Al layer 147I is oxidized at the time of formation of the oxide semiconductor layer 160I and is changed into an $AlO_x$ layer 149I. Namely, the side surface of the Al layer 147I becomes insulating. However, the Ti layers 146I and 148I are located above and below the Al layer 147I. Therefore, the oxide semiconductor layer 160I is connected with the upper electrode 140I at side surfaces of the Ti layers 146I and 148I.

Namely, in order to connect the upper electrode 140I and the oxide semiconductor layer 160I with each other at the side wall of the upper electrode 140I including the Al layer, a conductive layer that is less likely to be oxidized, or is less likely to have a high resistance even if being oxidized, as compared with Al, is provided as a layer above the Al layer, a layer below the Al layer, or both of the layers above and below the Al layer. In this manner, a more stable electric contact between the upper electrode 140I and the oxide semiconductor layer 160I is realized. In this example, a portion of the oxide semiconductor layer 160I that is located on the side wall of an insulating layer 130I acts as a channel. Therefore, it is preferable that a conductive layer that is less likely to be oxidized, or is less likely to have a high resistance even if being oxidized, as compared with Al, is provided as a bottom layer in the upper electrode 140I.

Embodiment 10

With reference to FIG. 98 through FIG. 107, an overview of a semiconductor 10J in embodiment 10 according to the present invention will be described. The semiconductor device 10J is similar to the semiconductor device 10E shown in FIG. 49 and FIG. 50, but an opening 139J has a shape different from that of the opening 139E of the semiconductor device 10E. In the following explanation, the features of the semiconductor device 10J that are the same as those of the semiconductor device 10E will not be described, and the above-described difference will be described. In the following description, components that are the same as, or have the same functions as, those of the semiconductor device 10E will be represented by the same reference signs (numerals) with alphabets, and detailed descriptions thereof will be omitted.

[Structure of the Semiconductor Device 10J]

Figure 98:
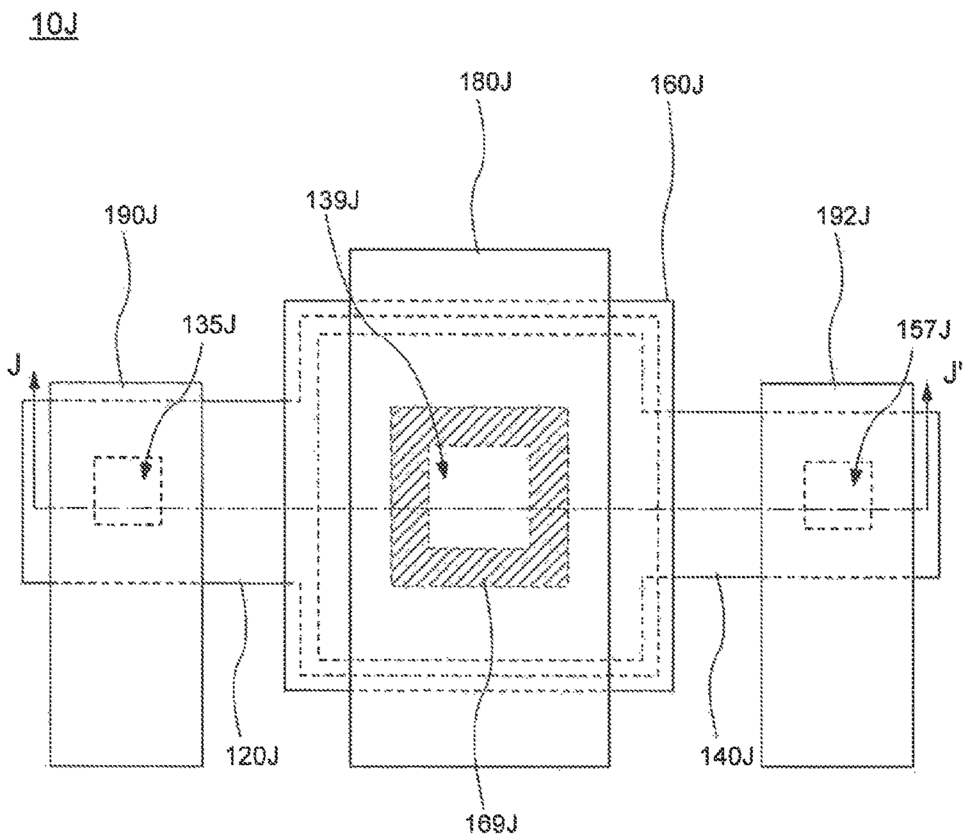
FIG. 98 is a plan view showing an overview of a semiconductor device in an embodiment according to the present invention.
Figure 99:
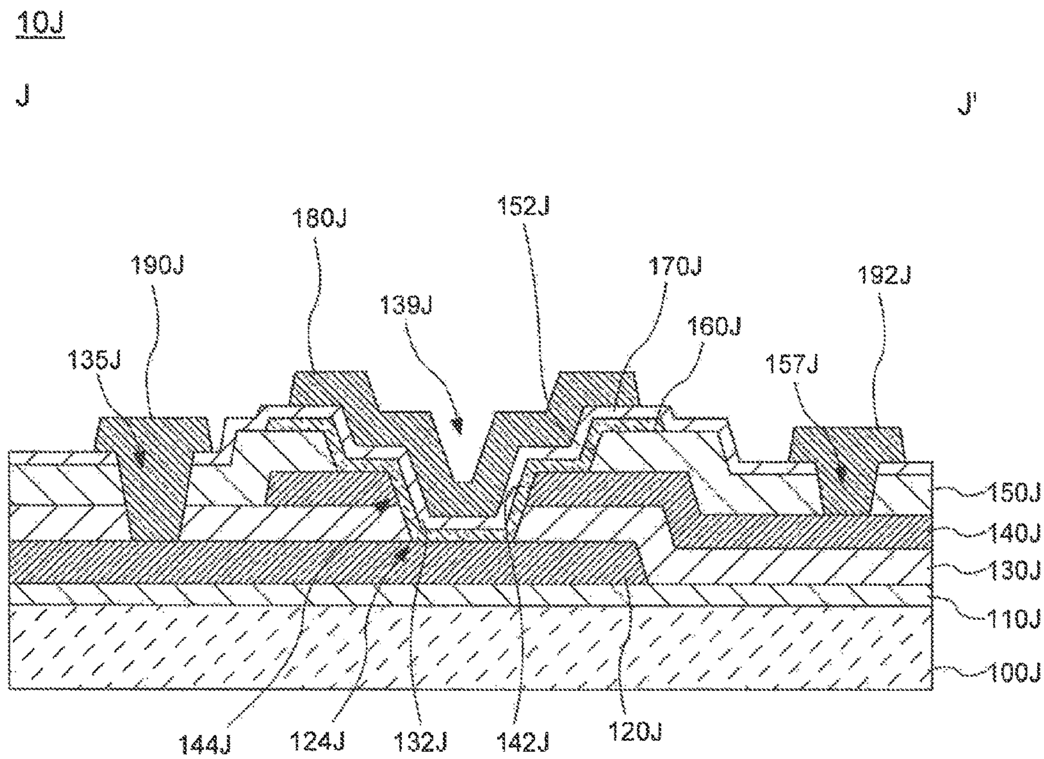
FIG. 99 is a cross-sectional view showing the overview of the semiconductor device in the embodiment according to the present invention.

FIG. 98 and FIG. 99 are respectively a plan view and a cross-sectional view showing an overview of the semiconductor device 10J in embodiment 10 according to the present invention. FIG. 99 is taken along line J-J' in FIG. 98. As shown in FIG. 98 and FIG. 99, in the semiconductor device 10J, a side wall of the opening 139J formed in insulating layers 130J and 150J and an upper electrode 140J is stepped as seen in a cross-sectional view. Specifically, in the opening 139J, the opening in the insulating layer 150J has a diameter longer than the diameter of the opening in each of the upper electrode 140J and the insulating layer 130J. In other words, a part of a top surface of the upper electrode 140J is exposed from the insulating layer 150J. In still other words, a side wall 152J of the insulating layer 150J is located on the top surface of the upper electrode 140J, and extends upward from the top surface of the upper electrode 140J. The opening 139J having such a shape is formed by a manufacturing method of the semiconductor device 10J described below. Specifically, the step of forming the opening in the upper electrode 140J and the step of forming the opening in the insulating layers 130J and 150J are performed at different timings. As a result, the opening 139J having the shape shown in FIG. 99 is formed.

As described above, the semiconductor device 10J in embodiment 10 according to the present invention increases the on-current thereof, and suppresses the in-plane variance in the channel length thereof. In addition, the area size of the region where an oxide semiconductor layer 160J contacts the top surface of the upper electrode 140J is controllable by the patterning performed on the insulating layer 150J to form the opening 139J. Therefore, the properties of a large area of the oxide semiconductor layer 160J is suppressed from being changed in the region where the oxide semiconductor layer 160J and the upper electrode 140J contact each other. A region where a line forming the same layer with the upper electrode 140J and a line forming the same layer with a gate electrode 180J cross each other has merely a small parasitic capacitance.

[Manufacturing Method of the Semiconductor Device 10J]

With reference to plan views and cross-sectional views provided in FIG. 100 through FIG. 107, a manufacturing method of the semiconductor device 10J in embodiment 10 according to the present invention will be described.

Figure 100:
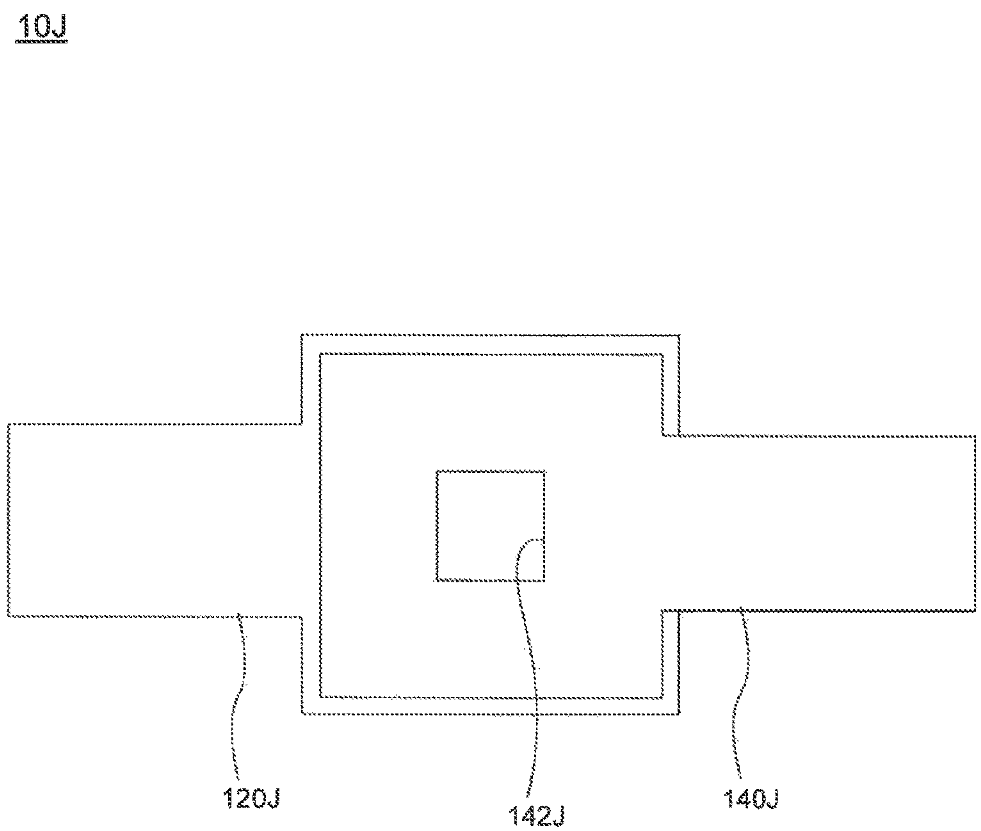
FIG. 100 is a plan view showing a step of forming an upper electrode in a manufacturing method of the semiconductor device in the embodiment according to the present invention.
Figure 101:
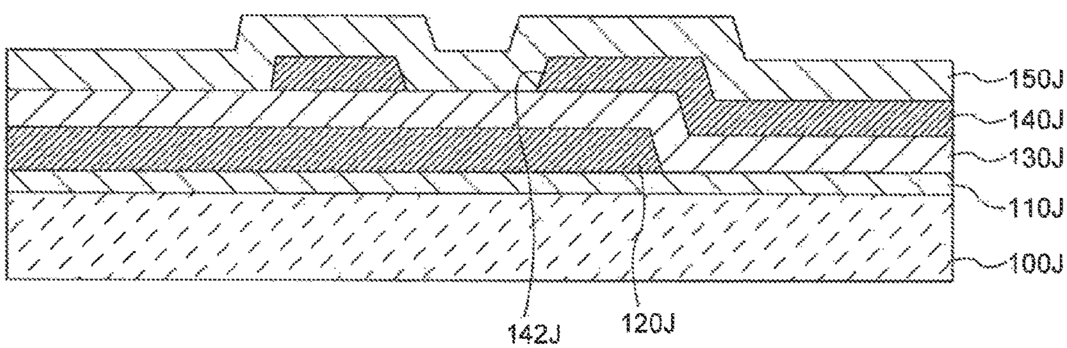
FIG. 101 is a cross-sectional view showing the step of forming the upper electrode in the manufacturing method of the semiconductor device in the embodiment according to the present invention.

FIG. 100 and FIG. 101 are respectively a plan view and a cross-sectional view showing a step of forming the upper electrode 140J in the manufacturing method of the semiconductor device 10J in embodiment 10 according to the present invention. A lower electrode 120J and the insulating layer 130J are formed by substantially the same method as shown in FIG. 3 and FIG. 4 regarding embodiment 1. Referring to FIG. 101, a conductive film for the upper electrode 140J is formed on the entirety of the resultant substrate, and patterning is performed as shown in FIG. 100 by photolithography and etching to form the upper electrode 140J. On the upper electrode 140J formed as a result of the patterning, the insulating layer 150J is formed.

Figure 102:
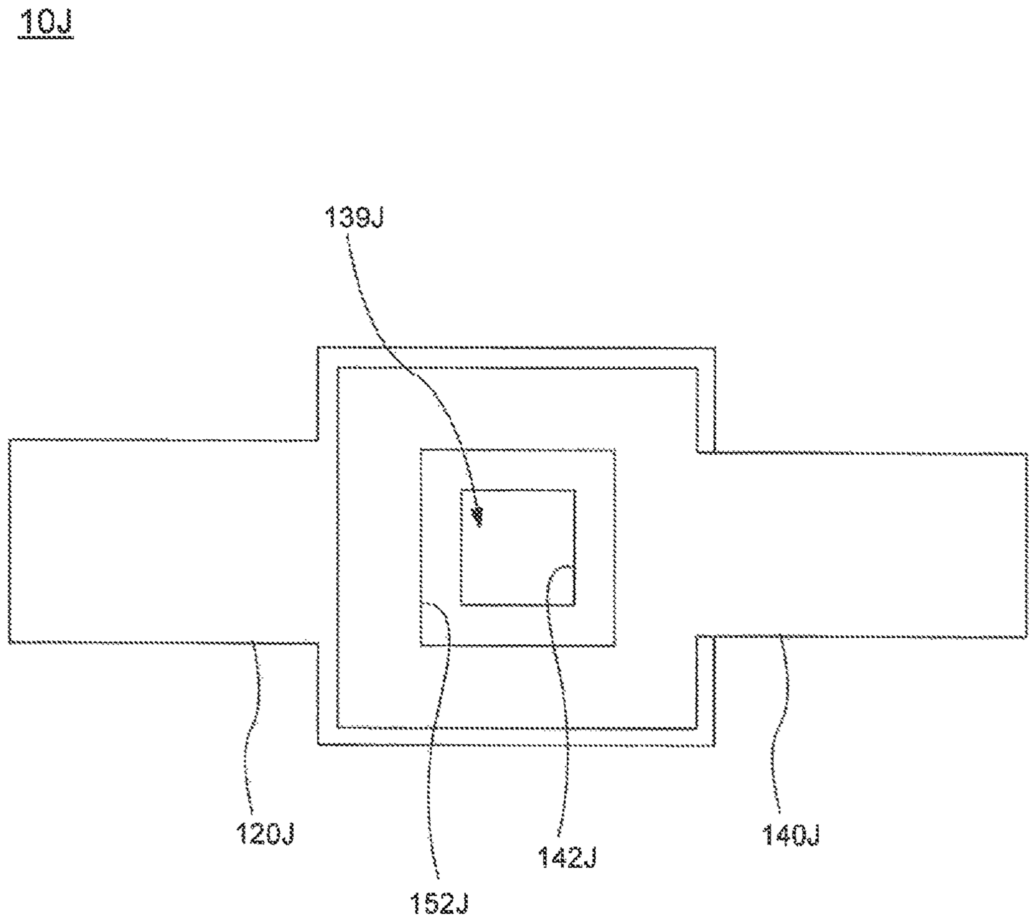
FIG. 102 is a plan view showing a step of forming an opening in insulating layers in the manufacturing method of the semiconductor device in the embodiment according to the present invention.
Figure 103:
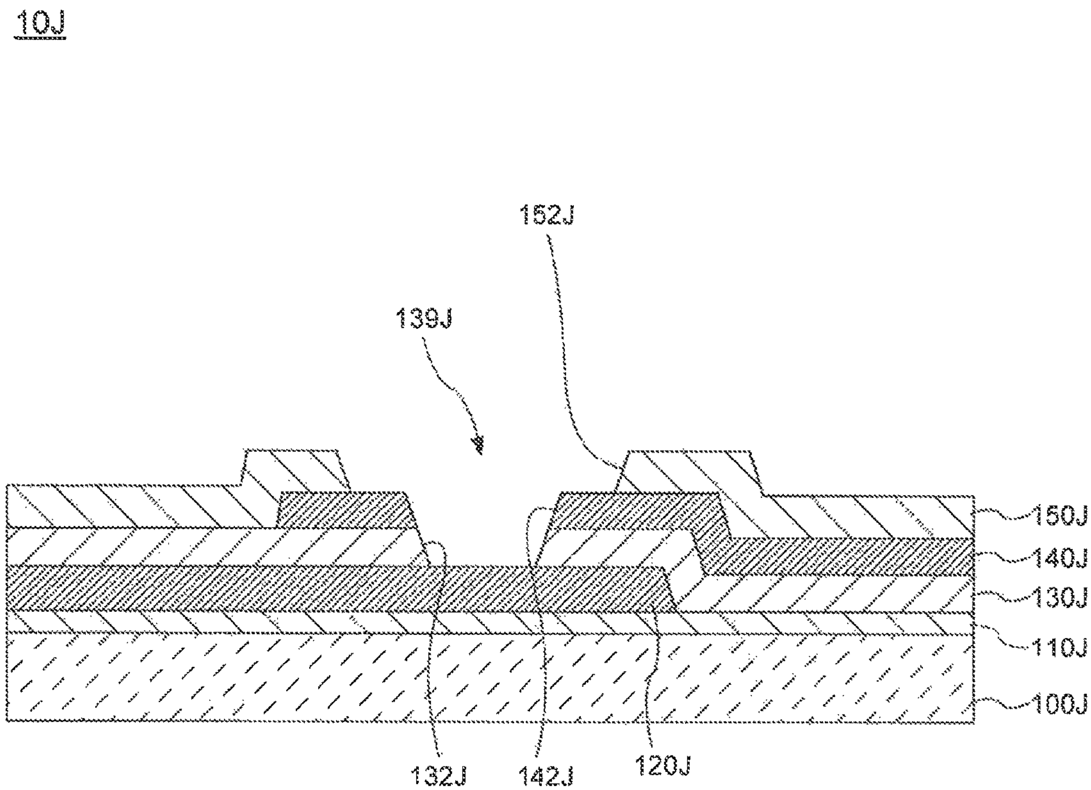
FIG. 103 is a cross-sectional view showing the step of forming the opening in the insulating layers in the manufacturing method of the semiconductor device in the embodiment according to the present invention.

FIG. 102 and FIG. 103 are respectively a plan view and a cross-sectional view showing a step of forming the opening 139J in the insulating layers 130J and 150J in the manufacturing method of the semiconductor device 10J in embodiment 10 according to the present invention. Referring to FIG. 103, the substrate shown in FIG. 101 is subjected to photolithography and etching to form the opening 139J having the pattern shown in FIG. 102. Specifically, a portion of the insulating layer 150J that is enclosed by an insulating layer side wall 152J is etched away by use of a resist formed by photolithography as a mask, and a portion of the insulating layer 130J that is enclosed by an electrode side wall 142J is etched away by use of the upper electrode 140J as a mask. Thus, the opening 139J is formed.

The etching in this step is merely performed on the insulating layers. Therefore, the insulating layers 130J and 150J may be etched at the same time under the same etching conditions. The etching in this step may be performed under the condition that the etching rate ratio of the insulating layers 130J and 150J with respect to the upper electrode 140J and the lower electrode 120J is high. In this step, it is sufficient that the upper electrode 140J and the lower electrode 120J are exposed. Therefore, plasma during the etching may be monitored, and the end point of the etching may be set based on a signal caused by the upper electrode 140J and the lower electrode 120J and detected in the plasma.

In FIG. 103, the insulating layer 150J to form the opening 139J is etched down to the top surface of the upper electrode 140J. Alternatively, a part of the upper electrode 140J that is exposed from the gate insulating layer 150J may be over-etched. It should be noted that preferably, the etching in this step is performed under the condition that the etching rate ratio of the insulating layers 130J and 150J with respect to the lower electrode 120J and the upper electrode 140J is high.

Figure 104:
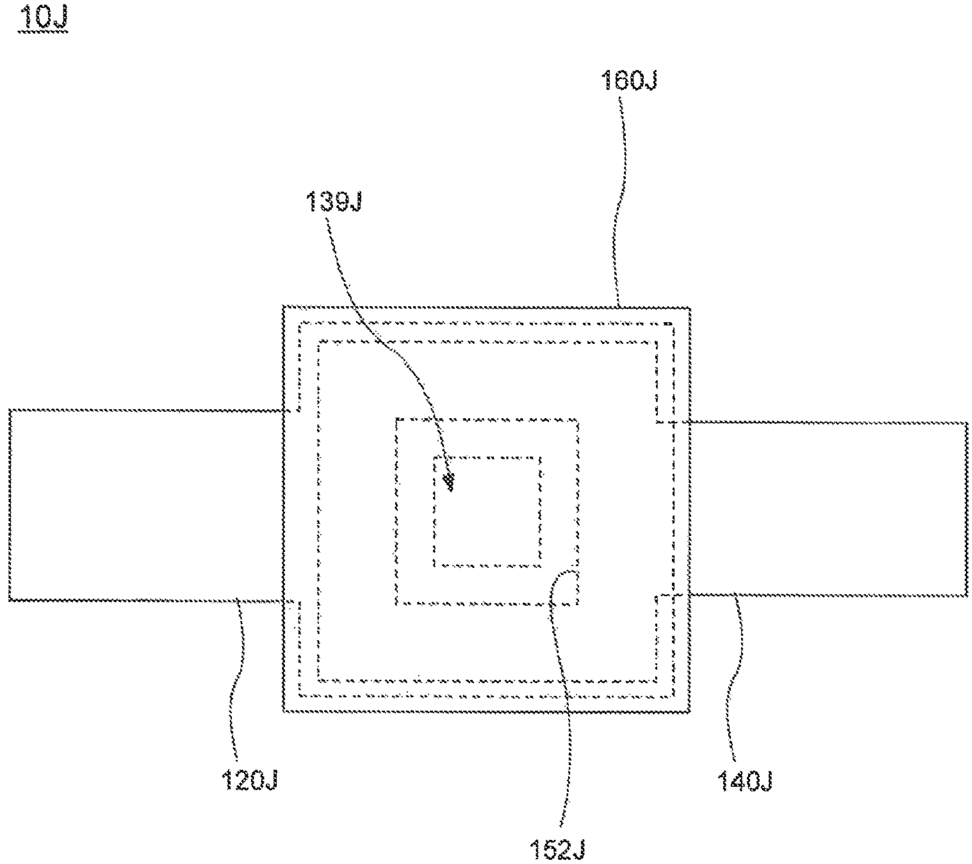
FIG. 104 is a plan view showing a step of forming an oxide semiconductor layer in the manufacturing method of the semiconductor device in the embodiment according to the present invention.
Figure 105:
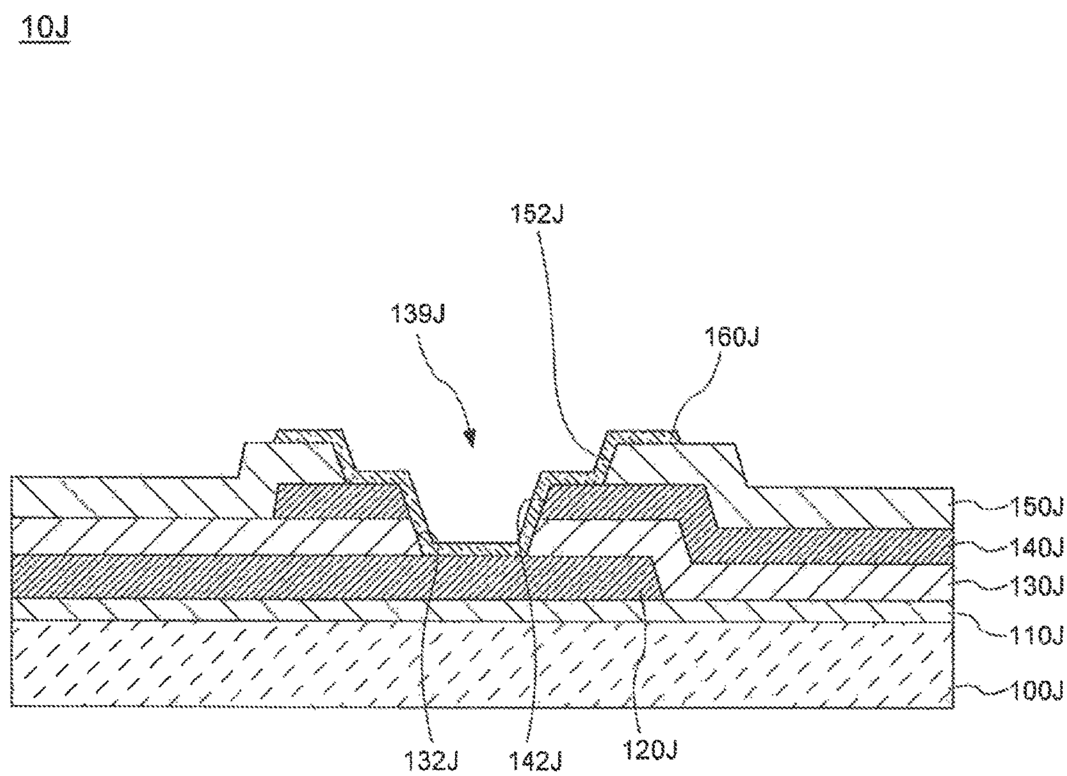
FIG. 105 is a cross-sectional view showing the step of forming the oxide semiconductor layer in the manufacturing method of the semiconductor device in the embodiment according to the present invention.

FIG. 104 and FIG. 105 are respectively a plan view and a cross-sectional view showing a step of forming the oxide semiconductor layer 160J in the manufacturing method of the semiconductor device 10J in embodiment 10 according to the present invention. Referring to FIG. 105, a film for the oxide semiconductor layer 160J is formed on the entirety of the substrate shown in FIG. 103, and patterning is performed as shown in FIG. 104 by photolithography and etching to form the oxide semiconductor layer 160J. The oxide semiconductor layer 160J is formed in the opening 139J. The formation of the oxide semiconductor layer 160J by etching may be performed by substantially the same method as in embodiment 1.

Figure 106:
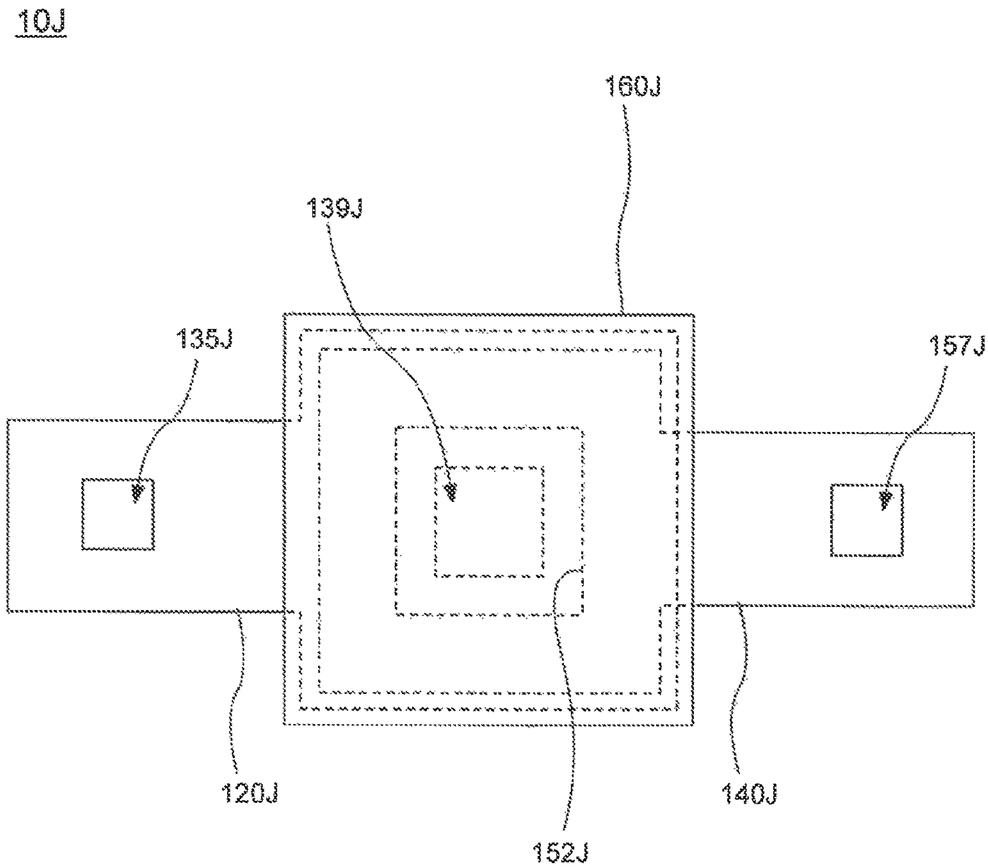
FIG. 106 is a plan view showing a step of forming openings respectively reaching a lower electrode and the upper electrode in the manufacturing method of the semiconductor device in the embodiment according to the present invention.
Figure 107:
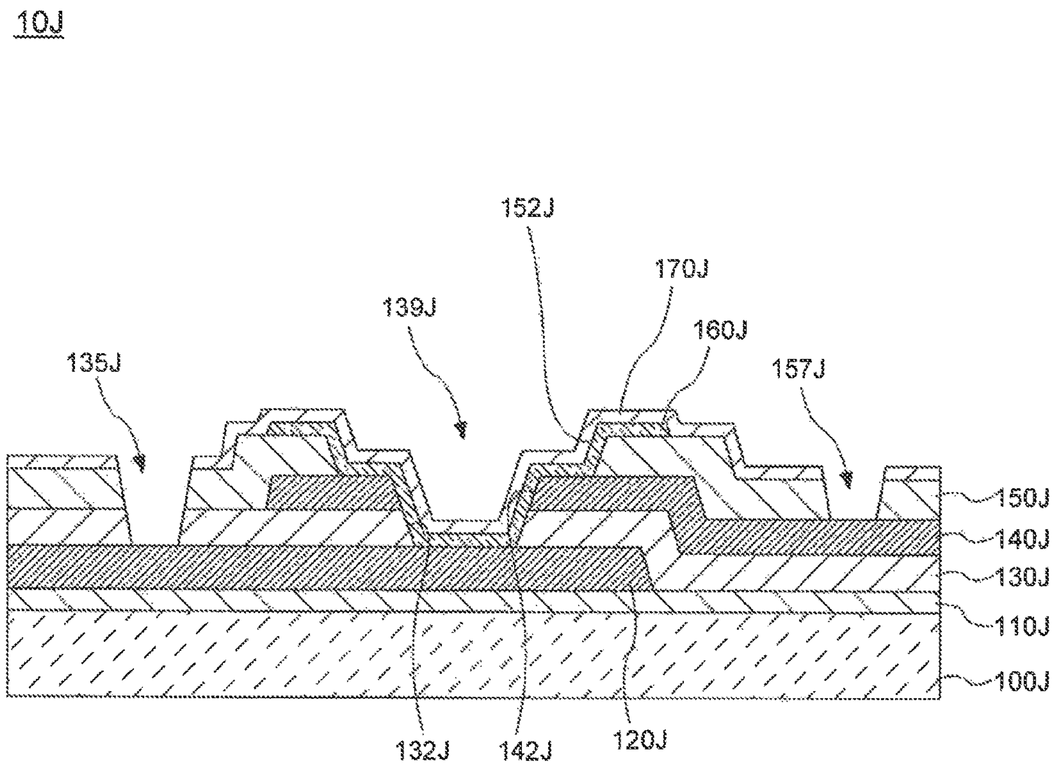
FIG. 107 is a cross-sectional view showing the step of forming the openings respectively reaching the lower electrode and the upper electrode in the manufacturing method of the semiconductor device in the embodiment according to the present invention.

FIG. 106 and FIG. 107 are respectively a plan view and a cross-sectional view showing a step of forming openings 135J and 157J respectively reaching the lower electrode 120J and the upper electrode 140J in the manufacturing method of the semiconductor device 10J in embodiment 10 according to the present invention. Referring to FIG. 107, a gate insulating layer 170J is formed on the entirety of the substrate shown in FIG. 105, and patterning is performed as shown in FIG. 106 by photolithography and etching to form the openings 135J and 157J.

A conductive layer for a gate electrode 180J, a source line 190J and a drain line 192J is formed on the entirety of the substrate shown in FIG. 107, and patterning is performed as shown in FIG. 98 and FIG. 99 by photolithography and etching to form the gate electrode 180J, the source line 190J and the drain line 192J. The semiconductor device 10J in embodiment 10 according to the present invention is manufactured by the above-described manufacturing method.

As described above, with the manufacturing method of the semiconductor device 10J in embodiment 10 according to the present invention, the conductive layer and the insulating layers are etched in separate steps. Therefore, the load on the etching device is alleviated.

Embodiment 11

With reference to FIG. 108 through FIG. 115, an overview of a semiconductor 10K in embodiment 11 according to the present invention will be described. The semiconductor device 10K is similar to the semiconductor device 10J shown in FIG. 98 and FIG. 99, but openings 135K and 157K have shapes different from those of the corresponding openings of the semiconductor device 10J. In the following explanation, the features of the semiconductor device 10K that are the same as those of the semiconductor device 10J will not be described, and the above-described differences will be described. In the following description, components that are the same as, or have the same functions as, those of the semiconductor device 10J will be represented by the same reference signs (numerals) with alphabets, and detailed descriptions thereof will be omitted.

[Structure of the Semiconductor Device 10K]

Figure 108:
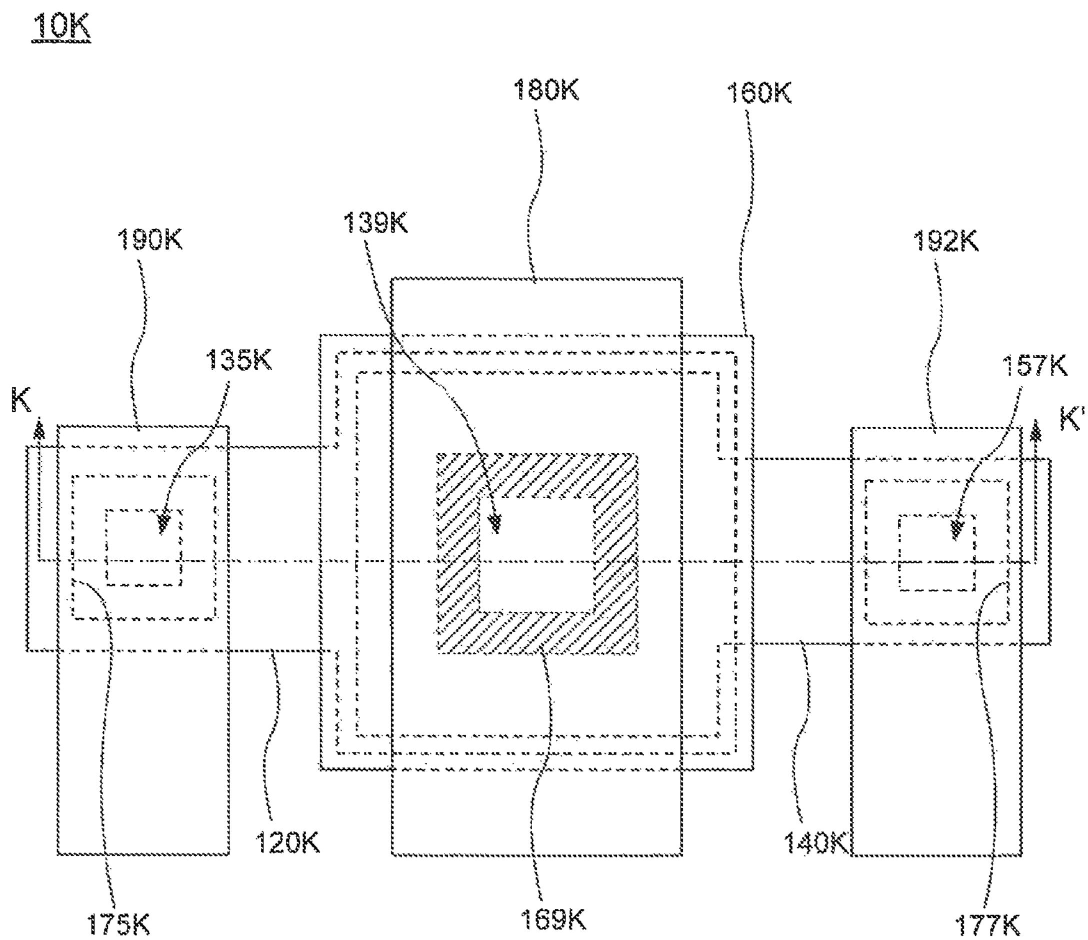
FIG. 108 is a plan view showing an overview of a semiconductor device in an embodiment according to the present invention.
Figure 109:
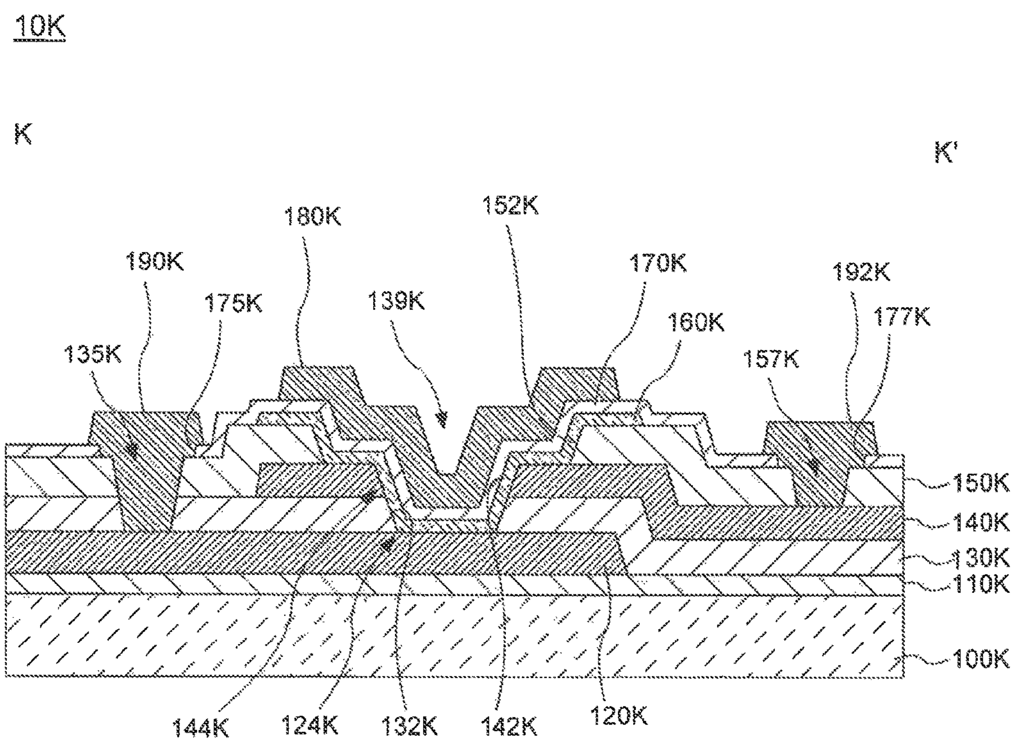
FIG. 109 is a cross-sectional view showing the overview of the semiconductor device in the embodiment according to the present invention.

FIG. 108 and FIG. 109 are respectively a plan view and a cross-sectional view showing an overview of the semiconductor device 10K in embodiment 11 according to the present invention. FIG. 109 is taken along line K-K' in FIG. 108. As shown in FIG. 108 and FIG. 109, in the semiconductor device 10K, a side wall of the opening 135K formed in insulating layers 130K and 150K and a gate insulating layer 170K, and a side wall of the opening 157K formed in the insulating layer 150K and the gate insulating layer 170K, are stepped as seen in a cross-sectional view. Specifically, in each of the openings 135K and 157K, the opening in the gate insulating layer 170K has a diameter longer than the diameter of the opening in the insulating layer 150K. In other words, side walls 175K and 177K of the gate insulating layer 170K respectively exposed to the openings 135K and 157K are located on a top surface of the insulating layer 150K, and extend upward from the top surface of the insulating layer 150K. The openings 135K and 157K having such a shape are formed by a manufacturing method of the semiconductor device 10K described below. Specifically, the step of forming the openings in the insulating layer 150K and the step of forming the openings in the gate insulating layer 170K are performed at different timings. As a result, the openings 135K and the 157K having the shapes shown in FIG. 109 are formed.

As described above, the semiconductor device 10K in embodiment 11 according to the present invention increases the on-current thereof, and suppresses the in-plane variance in the channel length thereof. In addition, the properties of a large area of an oxide semiconductor layer 160K is suppressed from being changed in the region where the oxide semiconductor layer 160K and an upper electrode 140K contact each other.

[Manufacturing Method of the Semiconductor Device 10K]

With reference to plan views and cross-sectional views provided in FIG. 110 through FIG. 115, a manufacturing method of the semiconductor device 10K in embodiment 11 according to the present invention will be described.

Figure 110:
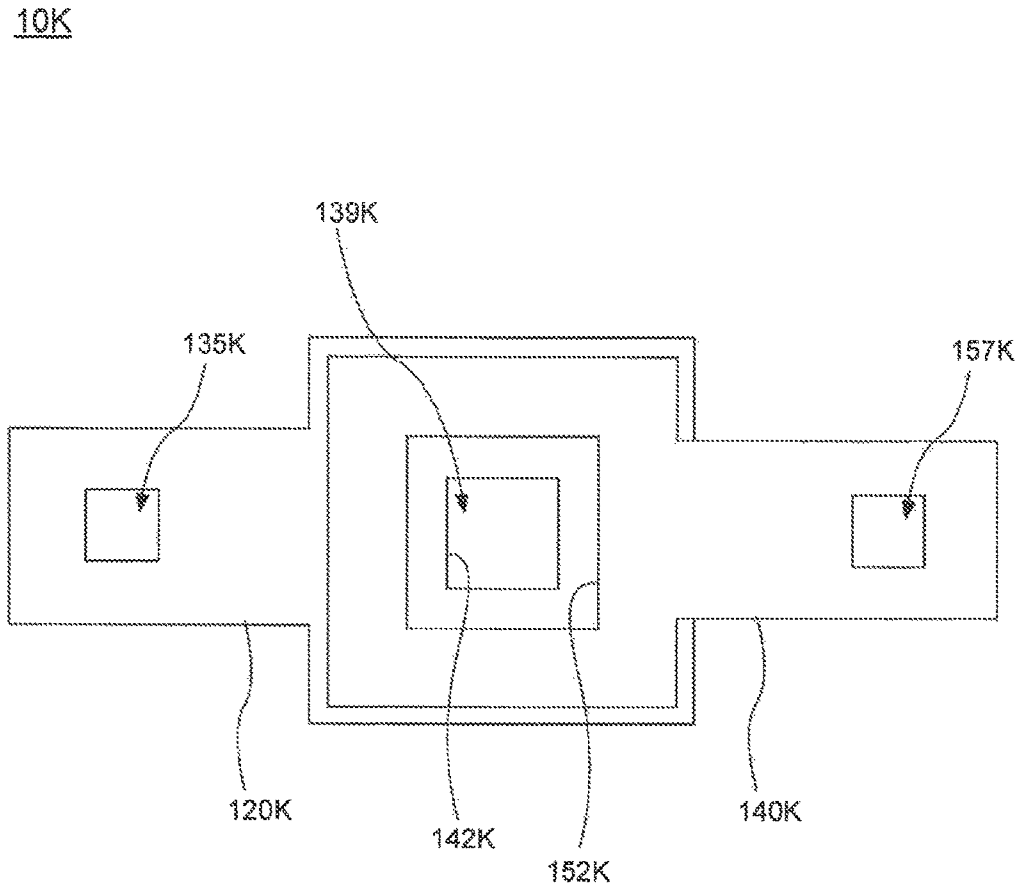
FIG. 110 is a plan view showing a step of forming openings in insulating layers in a manufacturing method of the semiconductor device in the embodiment according to the present invention.
Figure 111:
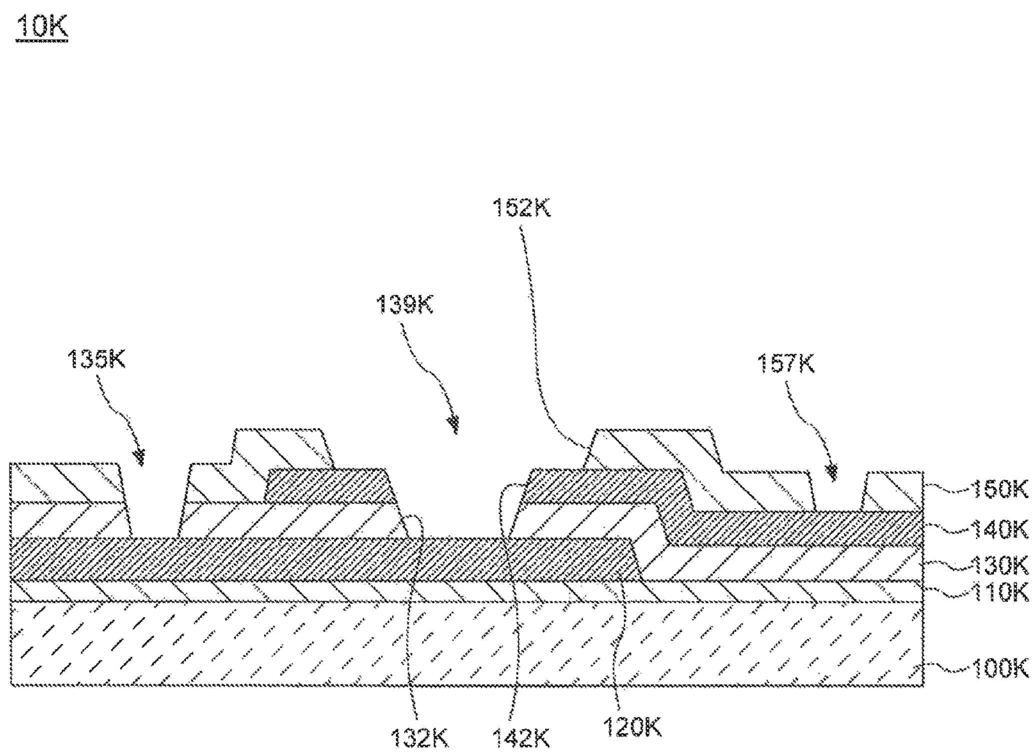
FIG. 111 is a cross-sectional view showing the step of forming the openings in the insulating layers in the manufacturing method of the semiconductor device in the embodiment according to the present invention.

FIG. 110 and FIG. 111 are respectively a plan view and a cross-sectional view showing a step of forming the openings 135K and 157K and also an opening 139K in the insulating layers 130K and 150K in the manufacturing method of the semiconductor device 10K in embodiment 11 according to the present invention. The upper electrode 140K having a side wall 142K and the insulating layer 150K are formed by substantially the same method as shown in FIG. 100 and FIG. 101 regarding embodiment 10. Referring to FIG. 111, the resultant substrate is subjected to photolithography and etching to form the openings 135K, 139K and 157K having patterns shown in FIG. 110.

Figure 112:
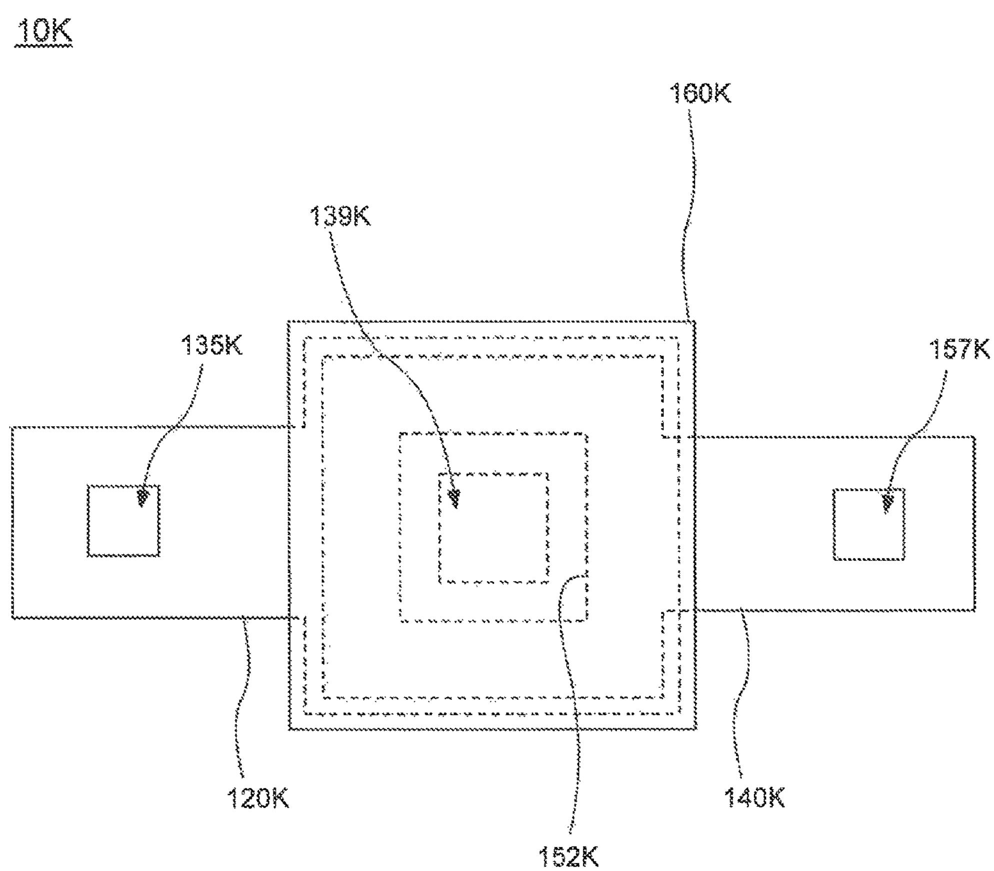
FIG. 112 is a plan view showing a step of forming an oxide semiconductor layer in the manufacturing method of the semiconductor device in the embodiment according to the present invention.
Figure 113:
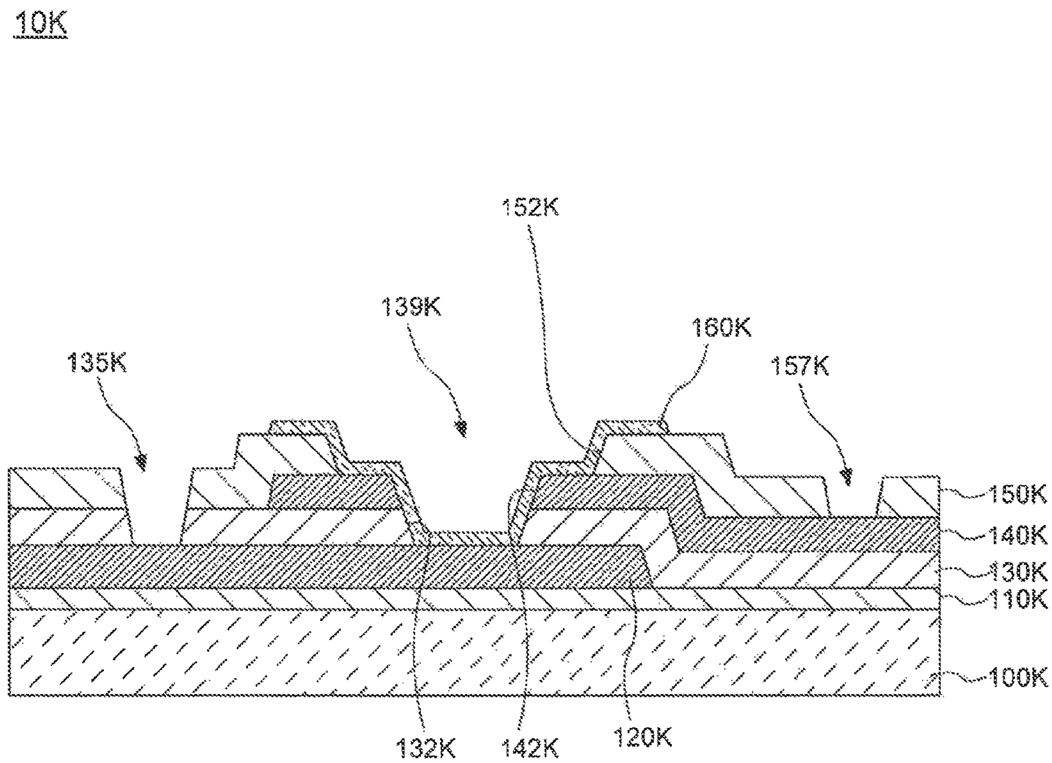
FIG. 113 is a cross-sectional view showing the step of forming the oxide semiconductor layer in the manufacturing method of the semiconductor device in the embodiment according to the present invention.

FIG. 112 and FIG. 113 are respectively a plan view and a cross-sectional view showing a step of forming the oxide semiconductor layer 160K in the manufacturing method of the semiconductor device 10K in embodiment 11 according to the present invention. Referring to FIG. 113, a film for the oxide semiconductor layer 160K is formed on the entirety of the substrate shown in FIG. 111, and patterning is performed as shown in FIG. 112 by photolithography and etching to form the oxide semiconductor layer 160K. The oxide semiconductor layer 160K is formed in the opening 139K, and a part of the film for the oxide semiconductor layer 160K that is located in the openings 135K and 157K is etched away. The formation of the oxide semiconductor layer 160K by etching may be performed by substantially the same method as in embodiment 1.

Figure 114:
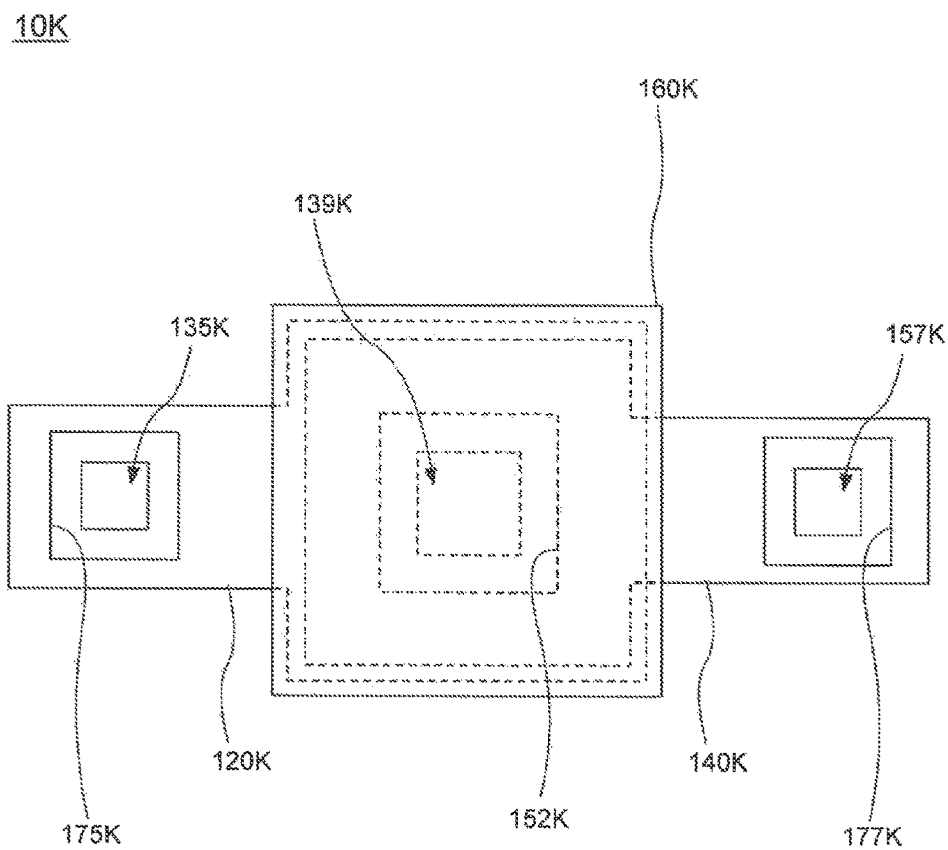
FIG. 114 is a plan view showing a step of forming openings exposing a lower electrode and an upper electrode in the manufacturing method of the semiconductor device in the embodiment according to the present invention.
Figure 115:
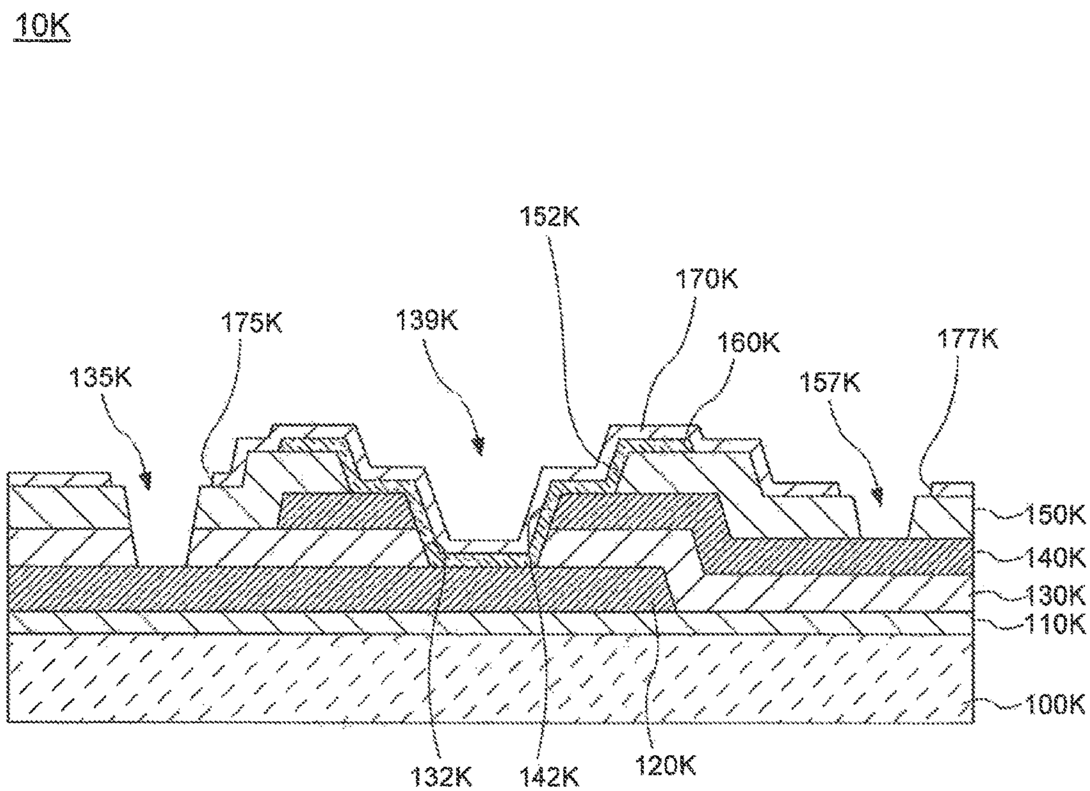
FIG. 115 is a cross-sectional view showing the step of forming the openings exposing the lower electrode and the upper electrode in the manufacturing method of the semiconductor device in the embodiment according to the present invention.

FIG. 114 and FIG. 115 are respectively a plan view and a cross-sectional view showing a step of forming openings exposing the lower electrode 120K and the upper electrode 140K in the manufacturing method of the semiconductor device 10K in embodiment 11 according to the present invention. Referring to FIG. 115, the gate insulating layer 170K is formed on the entirety of the substrate shown in FIG. 113, and is patterned as shown in FIG. 114 by photolithography and etching to form openings in regions corresponding to the openings 135K and 157K. The resultant opening 135K exposes the lower electrode 120K, and the resultant opening 157K exposes the upper electrode 140K.

A conductive layer for a gate electrode 180K, a source line 190K and a drain line 192K is formed on the entirety of the substrate shown in FIG. 115, and patterning is performed as shown in FIG. 108 and FIG. 109 by photolithography and etching to form the gate electrode 180K, the source line 190K and the drain line 192K. The semiconductor device 10K in embodiment 11 according to the present invention is manufactured by the above-described manufacturing method.

As described above, with the manufacturing method of the semiconductor device 10K in embodiment 11 according to the present invention, the conductive layer and the insulating layers are etched in separate steps. Therefore, the load on the etching device is alleviated.

Embodiment 12

With reference to FIG. 116 through FIG. 127, an overview of a semiconductor 10L in embodiment 12 according to the present invention will be described. The semiconductor device 10L includes a first transistor 20L having a short channel length and a second transistor 30L having a long channel length. The first transistor 20L having a short channel length has substantially the same structure as that of the semiconductor device 10J in embodiment 10 shown in FIG. 98 and FIG. 99. In the following explanation, the features of the first transistor 20L will not be described, and the second transistor 30L having a long channel length will be described.

The second transistor 30L is similar to the second transistor 30G shown in FIG. 73 and FIG. 74, but is different from the second transistor 30G on the following points. In the second transistor 30L, an opening 256L is stopped at an upper electrode 240L and does not reach an insulating layer 230L, and there is no contact pad corresponding to the contact pad 224G shown in FIG. 73 in a region where the opening 256L is provided. In the following explanation, the features of the second transistor 30L of the semiconductor device 10L that are the same as those of the second transistor 30G of the semiconductor device 10G will not be described, and the above-described differences will be described. In the following description, components that are the same as, or have the same functions as, those of the semiconductor device 10G will be represented by the same reference signs (numerals) with alphabets, and detailed descriptions thereof will be omitted.

[Structure of the Second Transistor 30L]

Figure 116:
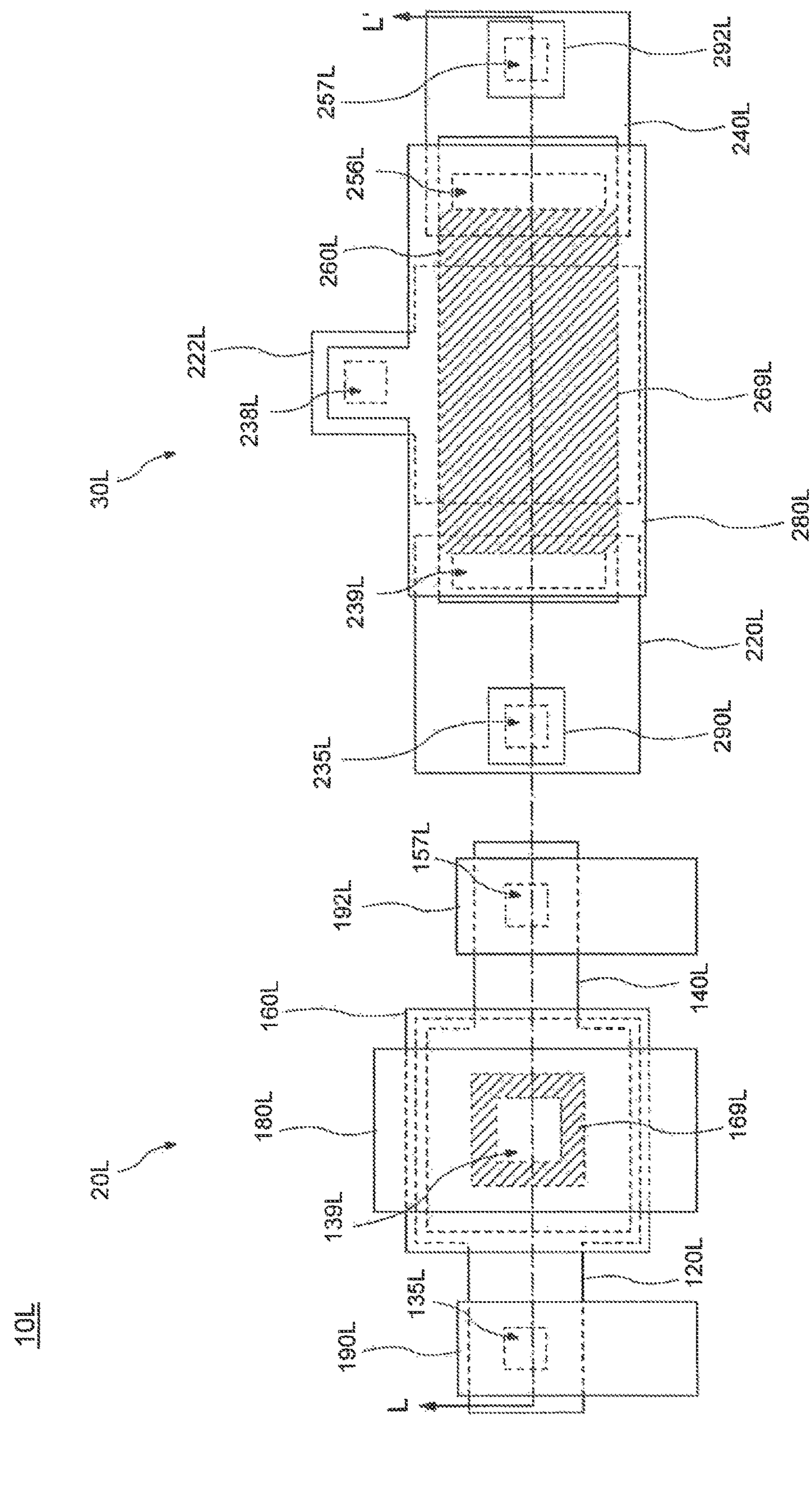
FIG. 116 is a plan view showing an overview of a semiconductor device in an embodiment according to the present invention.
Figure 117:
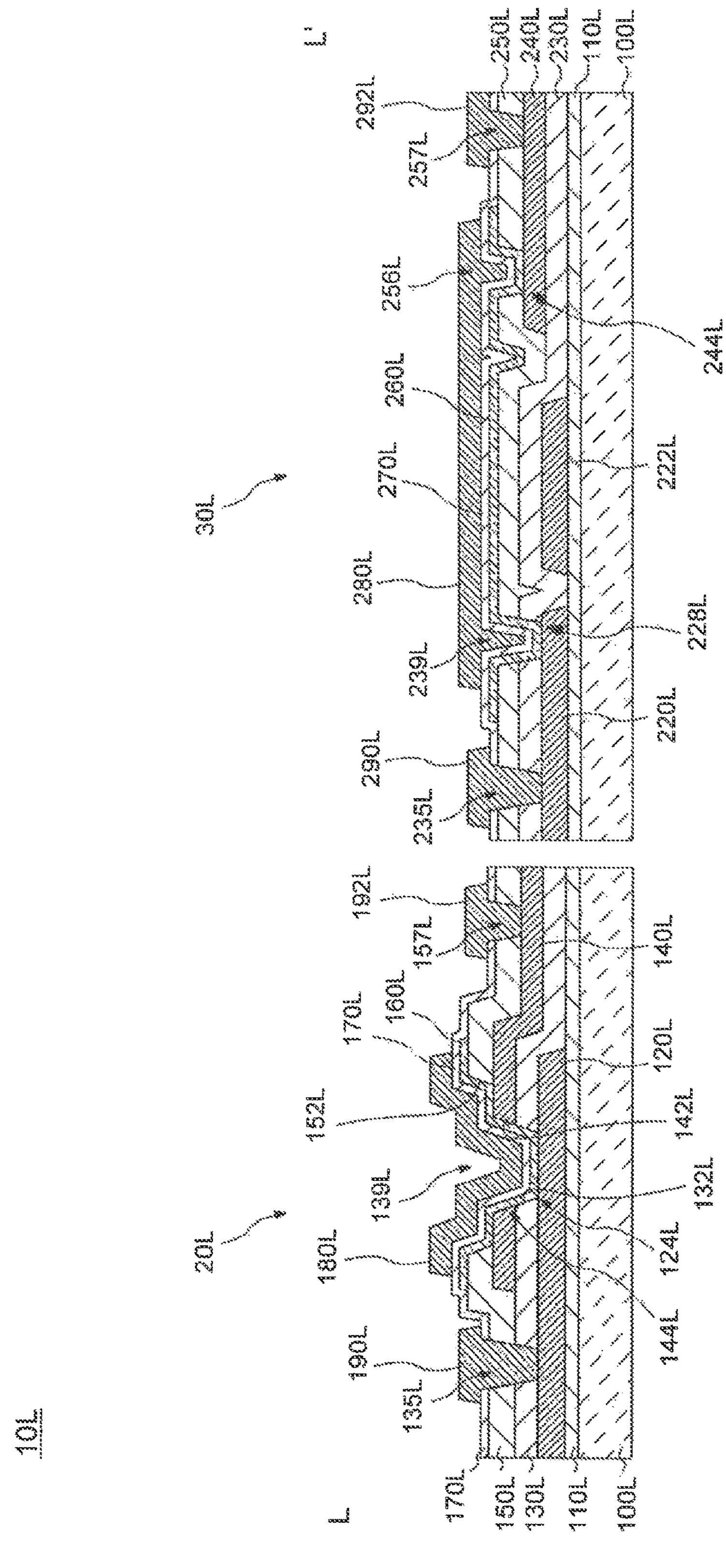
FIG. 117 is a cross-sectional view showing the overview of the semiconductor device in the embodiment according to the present invention.

FIG. 116 and FIG. 117 are respectively a plan view and a cross-sectional view showing an overview of the semiconductor device 10L in embodiment 12 according to the present invention. FIG. 117 is taken along line L-L' in FIG. 116. As shown in FIG. 116 and FIG. 117, in the semiconductor device 10L, the opening 256L is stopped at the upper electrode 240L. In other words, the opening 256L is formed to expose a top surface of the upper electrode 240L, and an oxide semiconductor layer 260L is in contact with the top surface of the upper electrode 240L. Since the opening 256L does not reach the insulating layer 230L, there is no contact pad below the opening 256L.

[Manufacturing Method of the Second Transistor 30L]

With reference to plan views and cross-sectional views provided in FIG. 118 through FIG. 127, a manufacturing method of the second transistor 30L of the semiconductor device 10L in embodiment 12 according to the present invention will be described. The manufacturing method of the first transistor 20L is substantially the same as that of the semiconductor device 10J in embodiment 10, and will not be described here.

Figure 118:
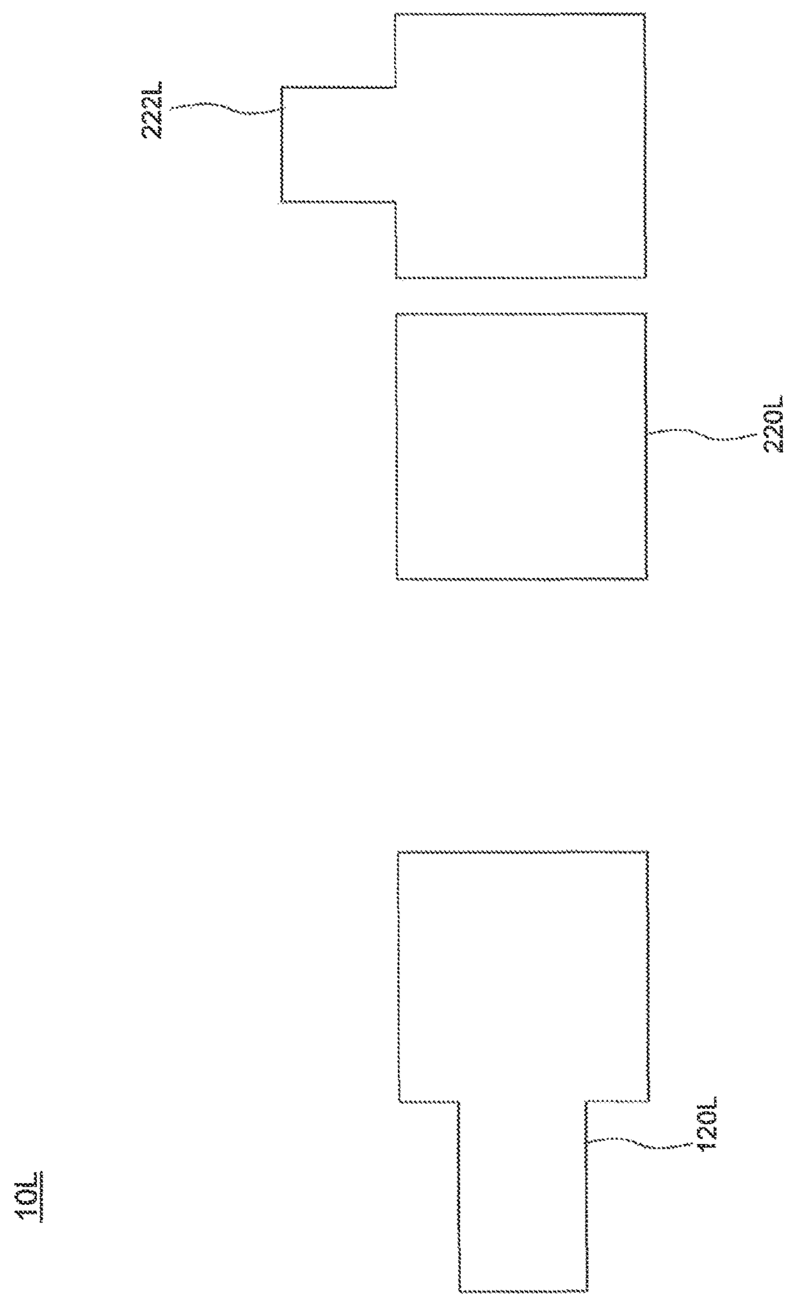
FIG. 118 is a plan view showing a step of forming a lower electrode and a back gate in a manufacturing method of the semiconductor device in the embodiment according to the present invention.
Figure 119:
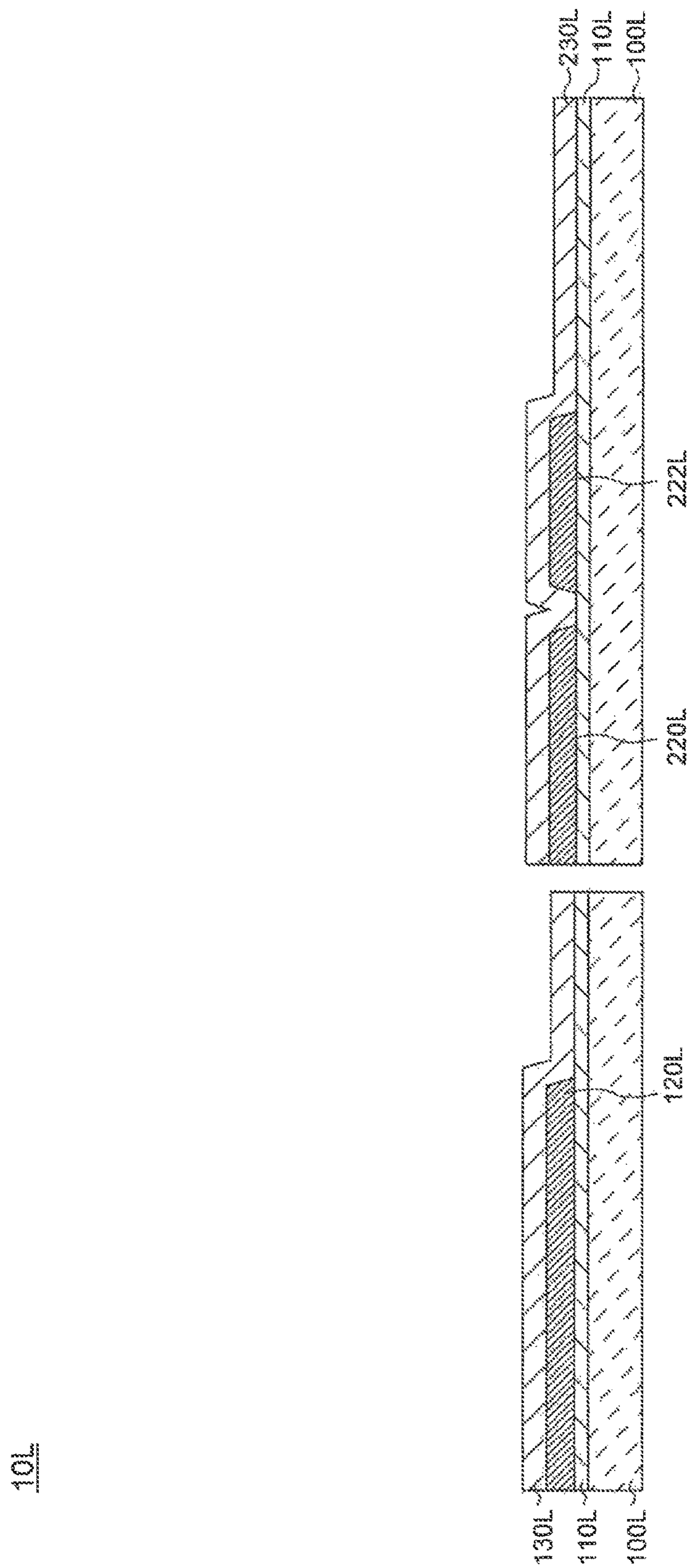
FIG. 119 is a cross-sectional view showing the step of forming the lower electrode and the back gate in the manufacturing method of the semiconductor device in the embodiment according to the present invention.

FIG. 118 and FIG. 119 are respectively a plan view and a cross-sectional view showing a step of forming a lower electrode 220L and a back gate 222L in the manufacturing method of the semiconductor device 10L in embodiment 12 according to the present invention. Referring to FIG. 119, an underlying insulating layer 110L is formed on a substrate 100L. A conductive film for the lower electrode 220L and the back gate 222L is formed thereon, and patterning is performed as shown in FIG. 118 by photolithography and etching to form the lower electrode 220L and the back gate 222L. On the lower electrode 220L and the back gate 222L formed as a result of the patterning, the insulating layer 230L is formed. The etching for forming the lower electrode 220L and the back gate 222L is performed under the same conditions as those for a lower electrode 120L.

Figure 120:
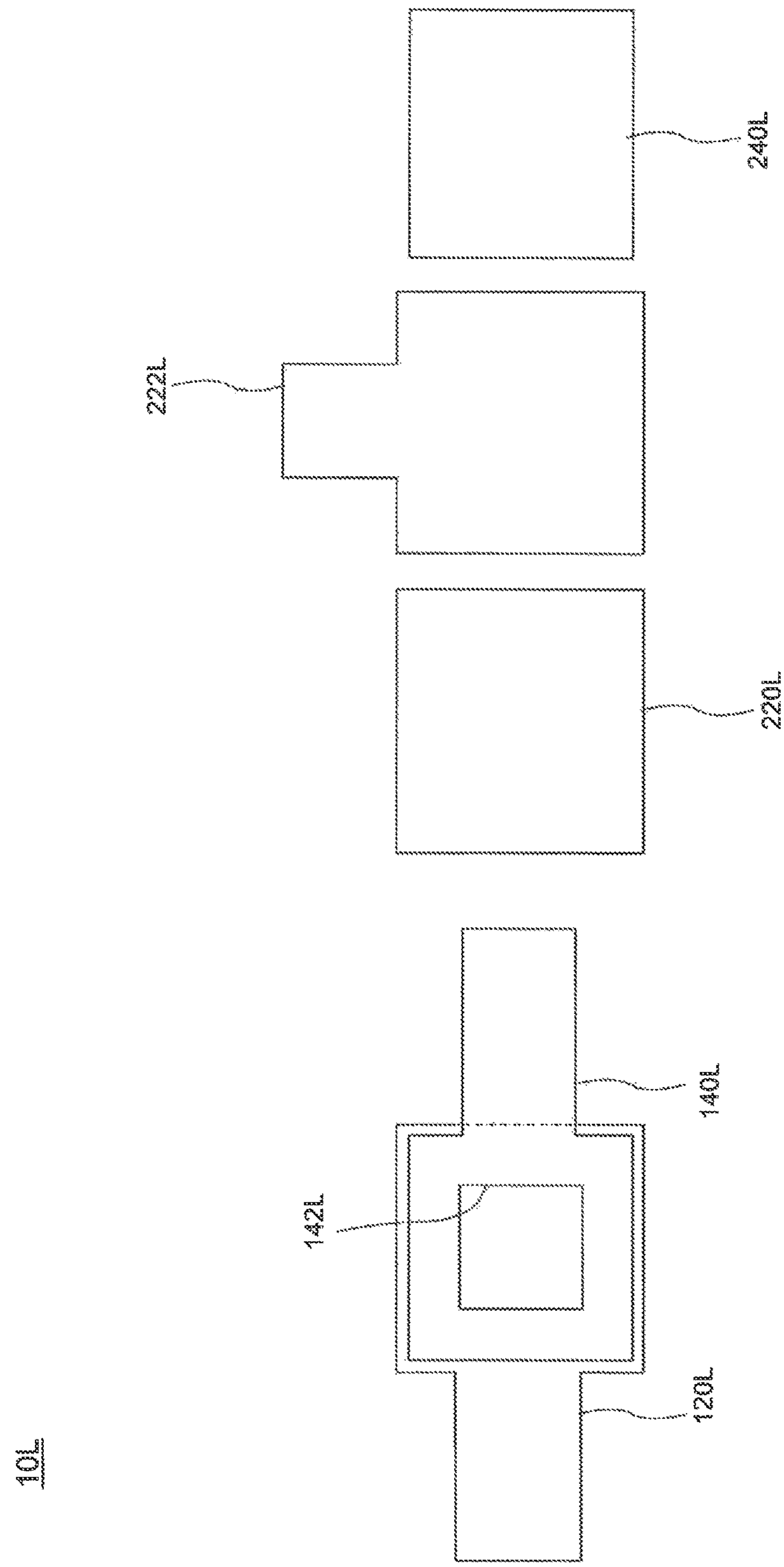
Figure 121:
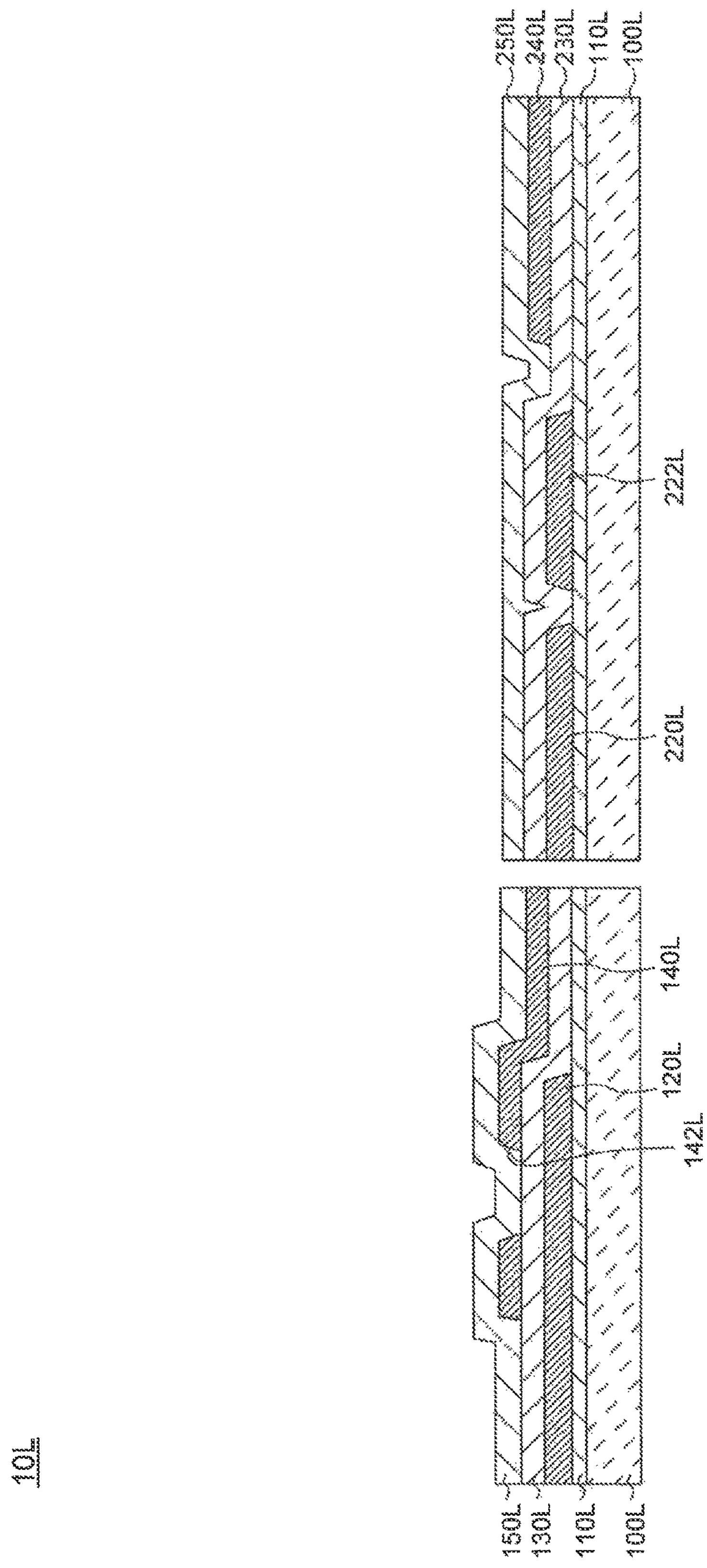

FIG. 120 and FIG. 121 are respectively a plan view and a cross-sectional view showing a step of forming the upper electrode 240L and an insulating layer 250L in the manufacturing method of the semiconductor device 10L in embodiment 12 according to the present invention. Referring to FIG. 121, a conductive film for the upper electrode 240L is formed on the entirety of the substrate shown in FIG. 119, and patterning is performed as shown in FIG. 120 by photolithography and etching to form the upper electrode 240L. On the upper electrode 240L formed as a result of the patterning, the insulating layer 250L is formed. The etching for forming the upper electrode 240L is performed under the same conditions as those for an upper electrode 140L.

Figure 122:
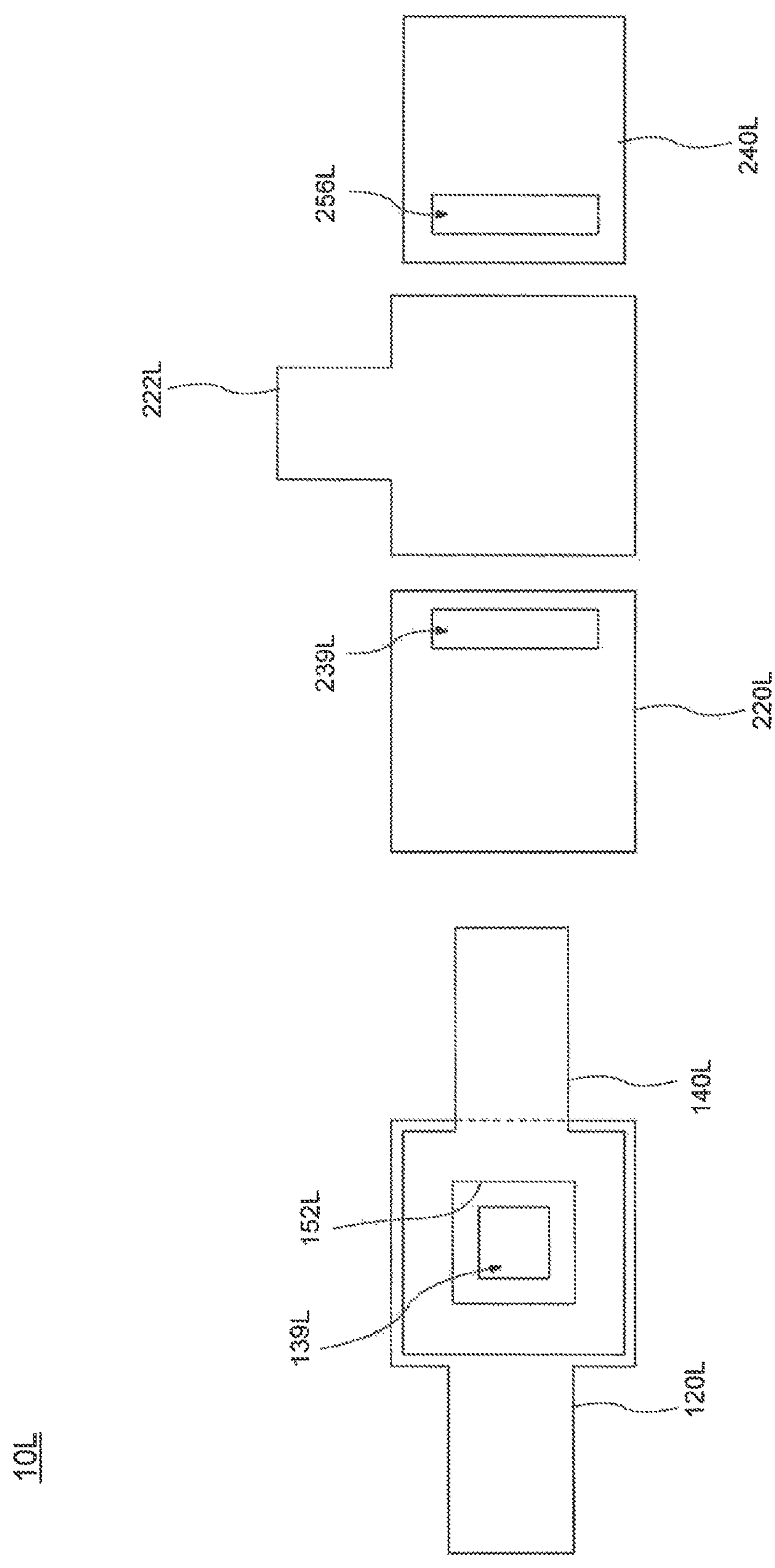
Figure 123:
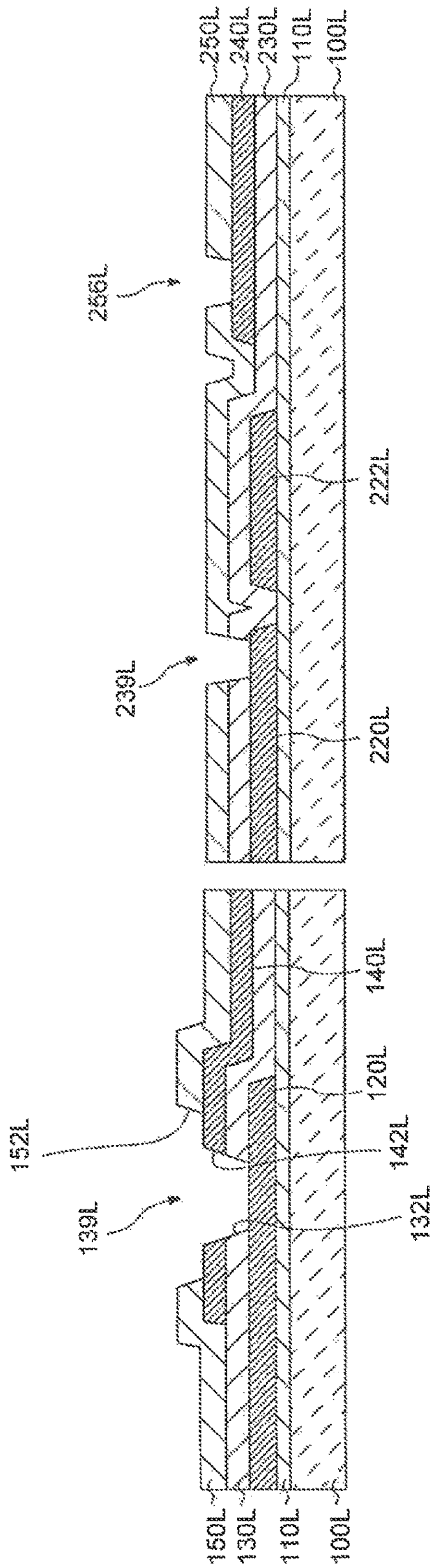

FIG. 122 and FIG. 123 are respectively a plan view and a cross-sectional view showing a step of forming the opening 256L and also an opening 239L in the insulating layers 230L and 250L in the manufacturing method of the semiconductor device 10L in embodiment 12 according to the present invention. Referring to FIG. 123, the substrate shown in FIG. 121 is subjected to photolithography and etching to form the opening 239L in the insulating layers 230L and 250L to expose the lower electrode 220L and to form the opening 256L in the insulating layer 250L to expose the upper electrode 240L. The openings 239L and 256L have patterns shown in FIG. 122. The etching for forming the openings 239L and 256L is performed under the same conditions as those for an opening 139L.

Figure 124:
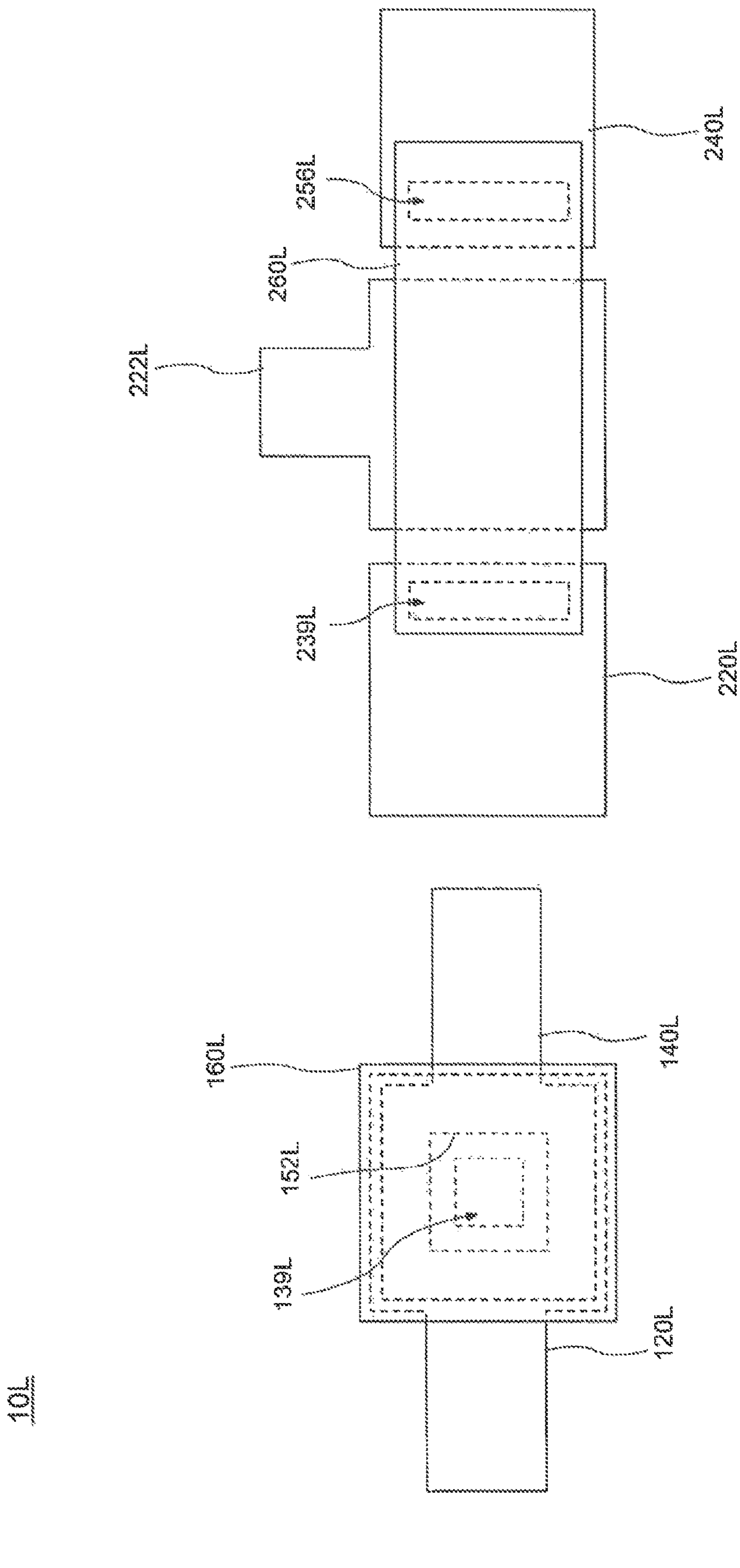
Figure 125:
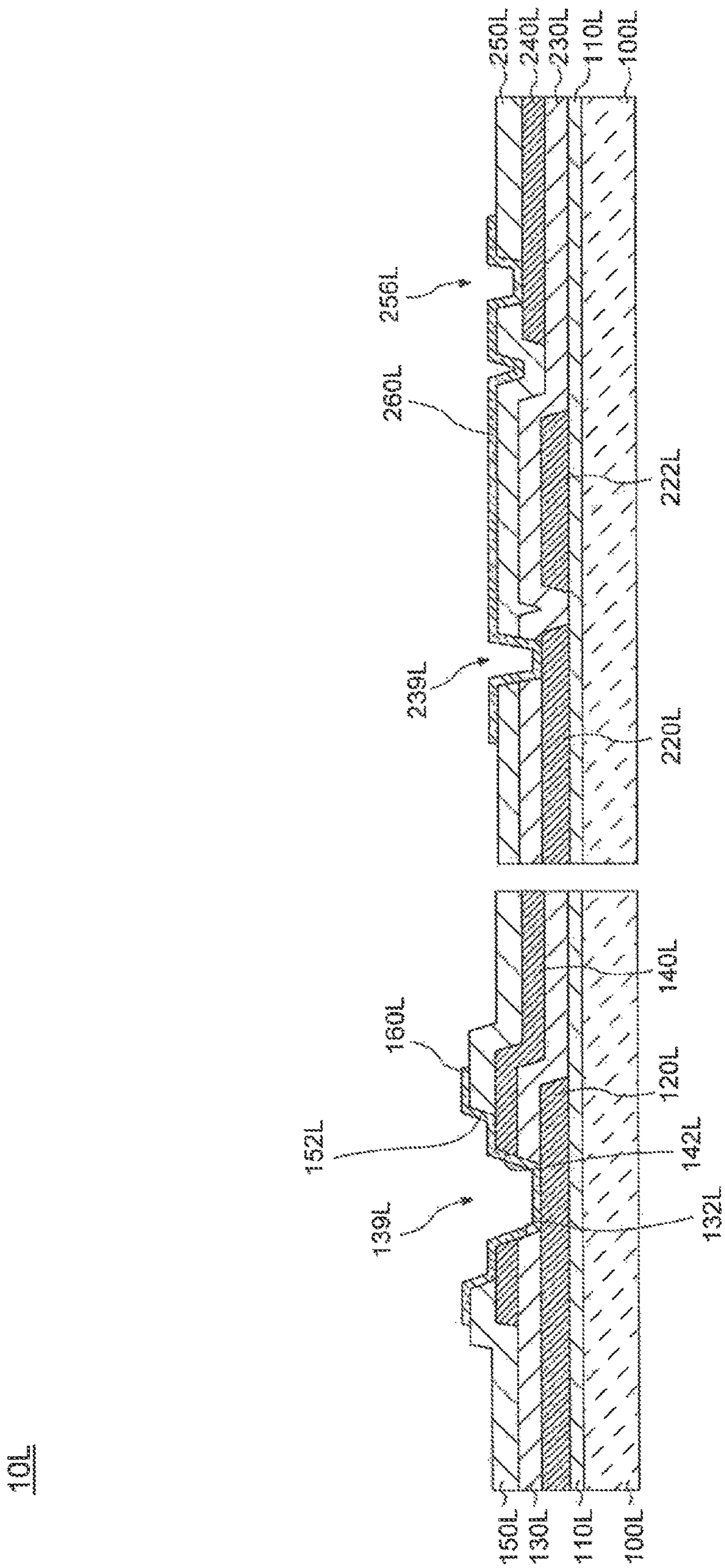

FIG. 124 and FIG. 125 are respectively a plan view and a cross-sectional view showing a step of forming the oxide semiconductor layer 260L in the manufacturing method of the semiconductor device 10L in embodiment 12 according to the present invention. Referring to FIG. 125, a film for the oxide semiconductor layer 260L is formed on the entirety of the substrate shown in FIG. 123, and patterning is performed as shown in FIG. 124 by photolithography and etching to form the oxide semiconductor layer 260L. The formation of the oxide semiconductor layer 260L by etching may be performed by substantially the same method as in embodiment 1.

Figure 126:
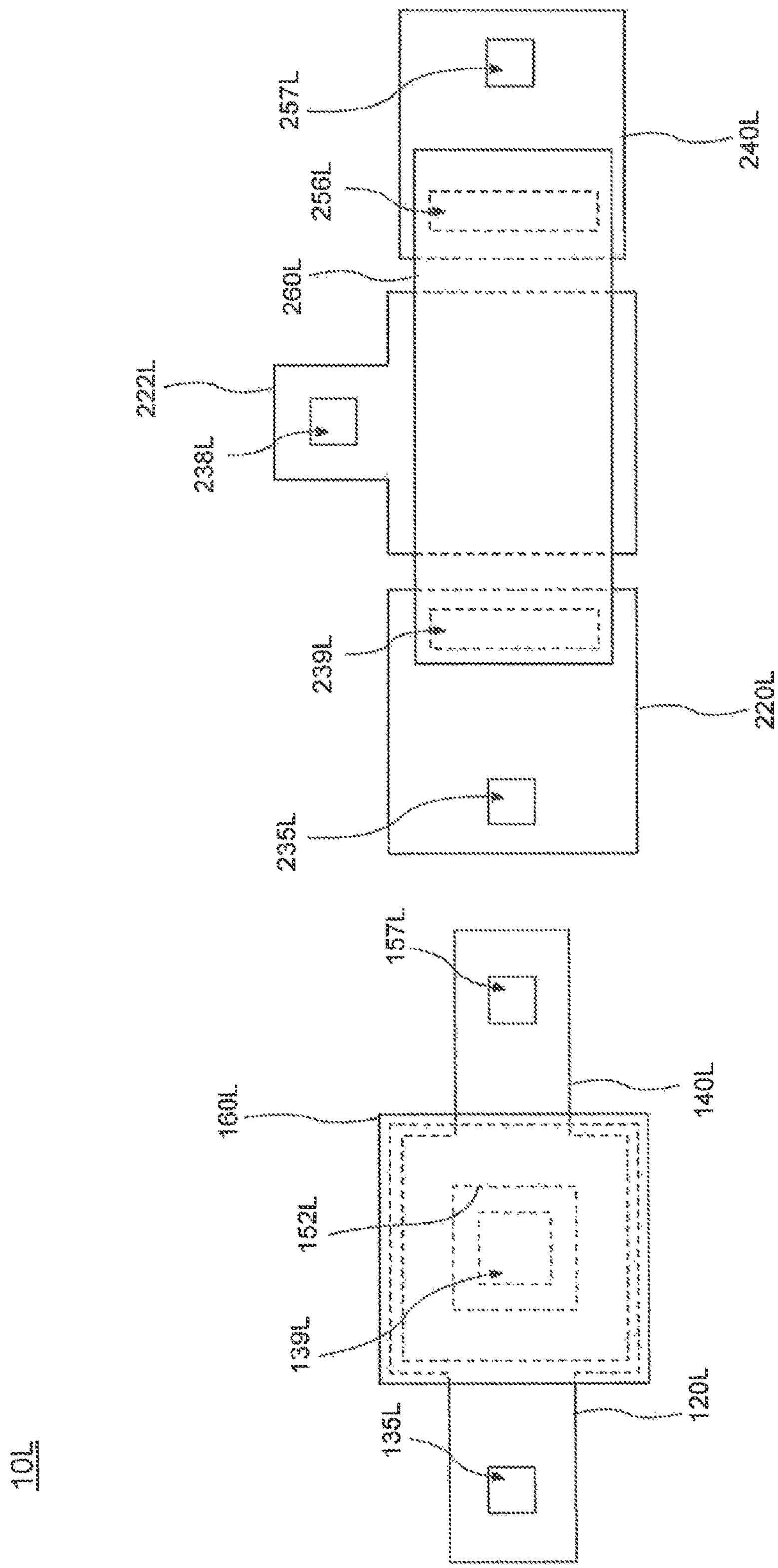
Figure 127:
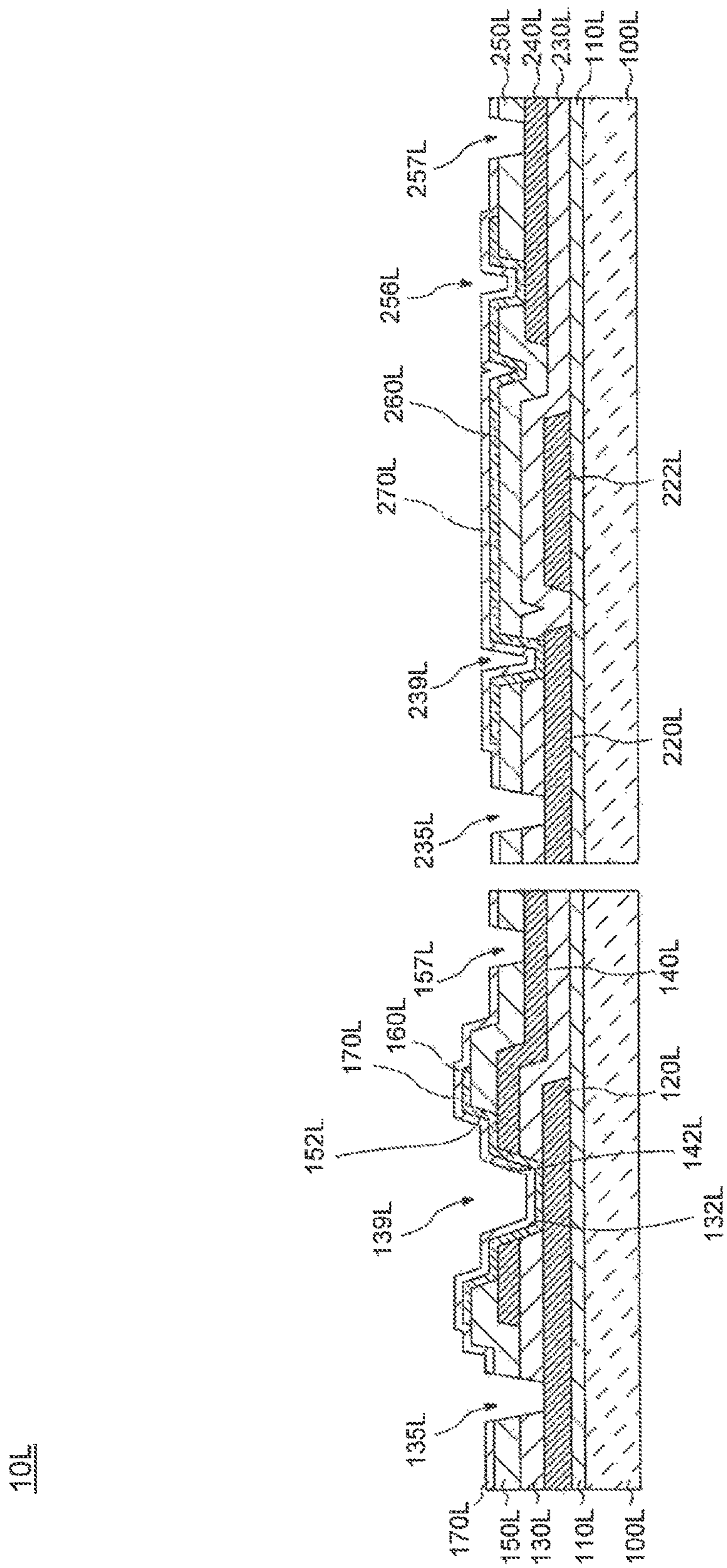

FIG. 126 and FIG. 127 are respectively a plan view and a cross-sectional view showing a step of forming openings 235L, 257L and 238L reaching the lower electrode 220L, the upper electrode 240L and the like in the manufacturing method of the semiconductor device 10L in embodiment 12 according to the present invention. Referring to FIG. 127, a gate insulating layer 270L is formed on the entirety of the substrate shown in FIG. 125, and patterning is performed as shown in FIG. 126 by photolithography and etching to form the openings 235L, 238L and 257L. The etching for forming the openings 235L, 238L and 257L is performed under the same conditions as those for openings 135L and 157L.

A conductive layer for a gate electrode 280L, a source line 290L and a drain line 292L is formed on the entirety of the substrate shown in FIG. 127, and patterning is performed as shown in FIG. 116 and FIG. 117 by photolithography and etching to form the gate electrode 280L, the source line 290L and the drain line 292L. The second transistor 30L of the semiconductor device 10L in embodiment 12 according to the present invention is manufactured by the above-described manufacturing method.

As described above, with the manufacturing method of the semiconductor device 10L in embodiment 12 according to the present invention, the first transistor 20L having a channel length of a nanometer order and the second transistor 30L having a channel length of a micrometer order are formed by the same manufacturing method. In addition, the conductive layer and the insulating layers are etched in separate steps. Therefore, the load on the etching device is alleviated.

Embodiment 13

With reference to FIG. 128 through FIG. 135, an overview of a semiconductor 10M in embodiment 13 according to the present invention will be described. The semiconductor device 10M includes a first transistor 20M having a short channel length and a second transistor 30M having a long channel length. The first transistor 20M having a short channel length has substantially the same structure as that of the semiconductor device 10K in embodiment 11 shown in FIG. 108 and FIG. 109. In the following explanation, the features of the first transistor 20M will not be described, and the second transistor 30M having a long channel length will be described. In the following description, components that are the same as, or have the same functions as, those of the semiconductor device 10K will be represented by the same reference signs (numerals) with alphabets, and detailed descriptions thereof will be omitted.

The second transistor 30M is similar to the second transistor 30L shown in FIG. 116 and FIG. 117, but openings 235M and 257M have shapes different from those of the corresponding openings of the second transistor 30L. In the following explanation, the features of the second transistor 30M that are the same as those of the second transistor 30L will not be described, and the above-described differences will be described.

[Structure of the Second Transistor 30M]

Figure 128:
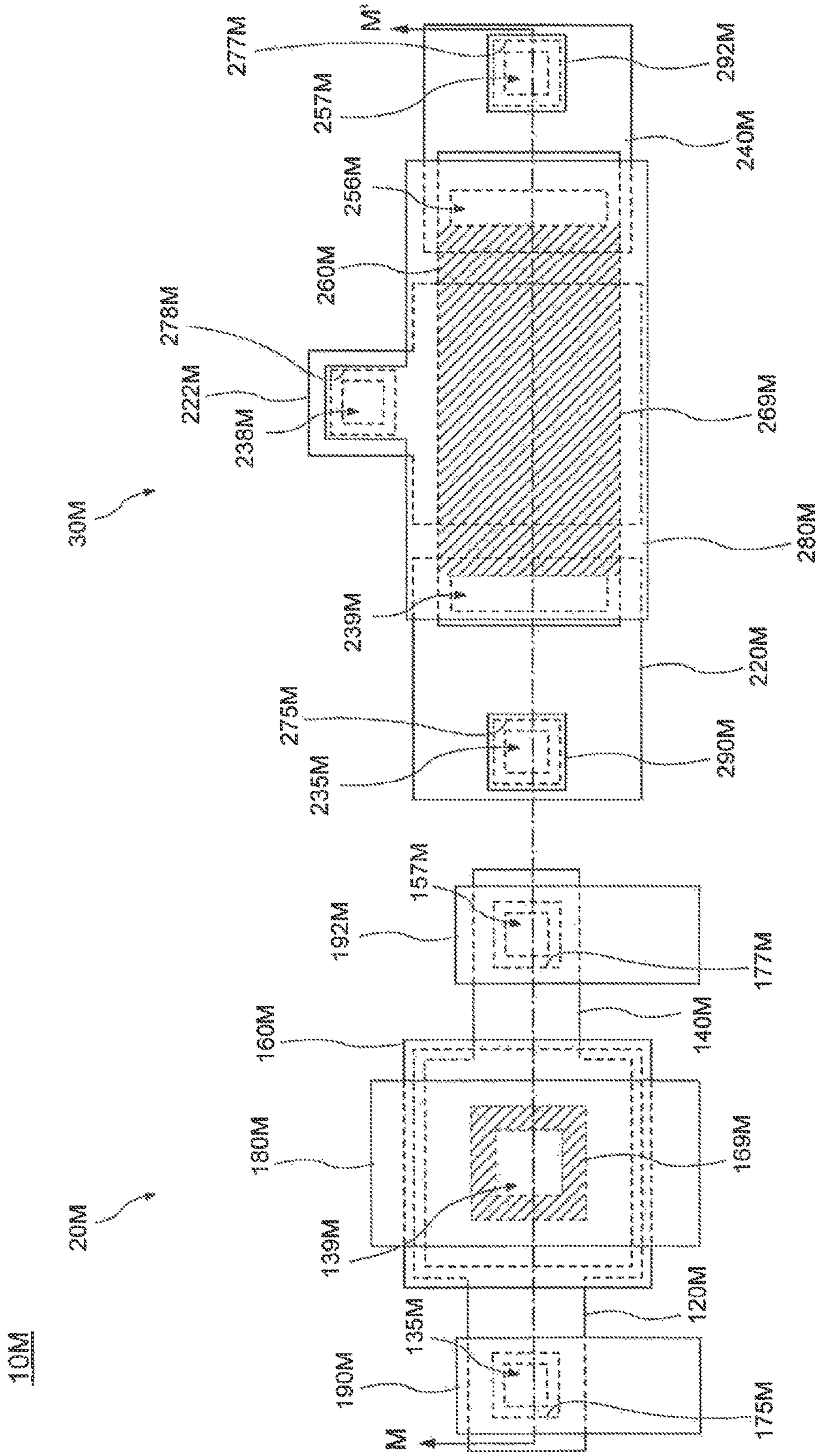
Figure 129:
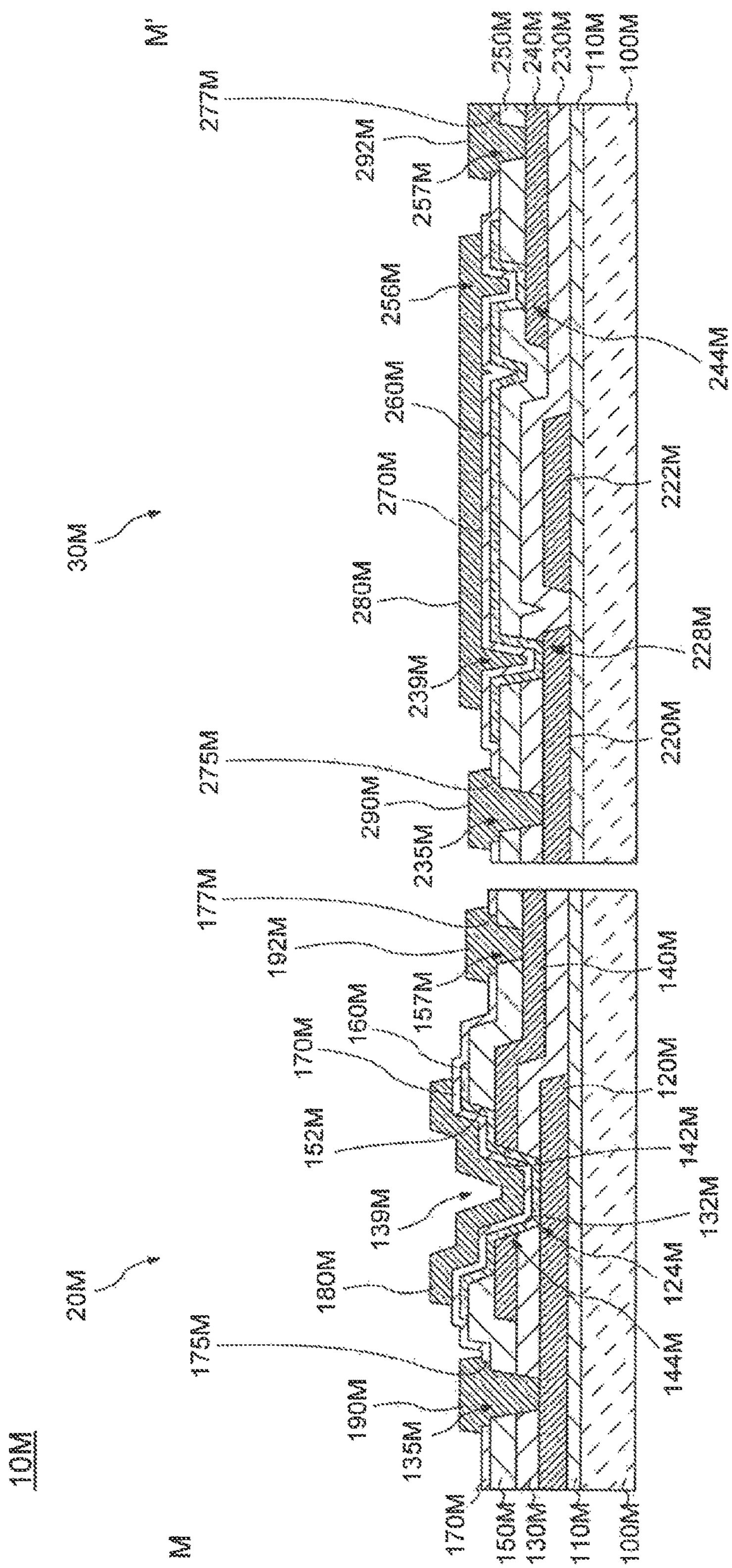

FIG. 128 and FIG. 129 are respectively a plan view and a cross-sectional view showing an overview of the semiconductor device 10M in embodiment 13 according to the present invention. FIG. 129 is taken along line M-M' in FIG. 128. As shown in FIG. 128 and FIG. 129, in the second transistor 30M, a side wall of the opening 235M formed in insulating layers 230M and 250M and a gate insulating layer 270M, and a side wall of the opening 257M formed in the insulating layer 250M and the gate insulating layer 270M, are stepped as seen in a cross-sectional view. Specifically, in each of the openings 235M and 257M, the opening in the gate insulating layer 270M has a diameter longer than the diameter of the opening in the insulating layer 250M. In other words, side walls 275M and 277M of the gate insulating layer 270M respectively exposed to the openings 235M and 257M are located on a top surface of the insulating layer 250M, and extend upward from the top surface of the insulating layer 250M. The openings 235M and 257M having such a shape are formed by a manufacturing method of the second transistor 30M described below. Specifically, the step of forming the openings in the insulating layer 250M and the step of forming the openings in the gate insulating layer 270M are performed at different timings. As a result, the openings 235M and the 257M having the shapes shown in FIG. 129 are formed.

[Manufacturing Method of the Second Transistor 30M]

With reference to plan views and cross-sectional views provided in FIG. 130 through FIG. 135, a manufacturing method of the second transistor 30M of the semiconductor device 10M in embodiment 13 according to the present invention will be described.

Figure 130:
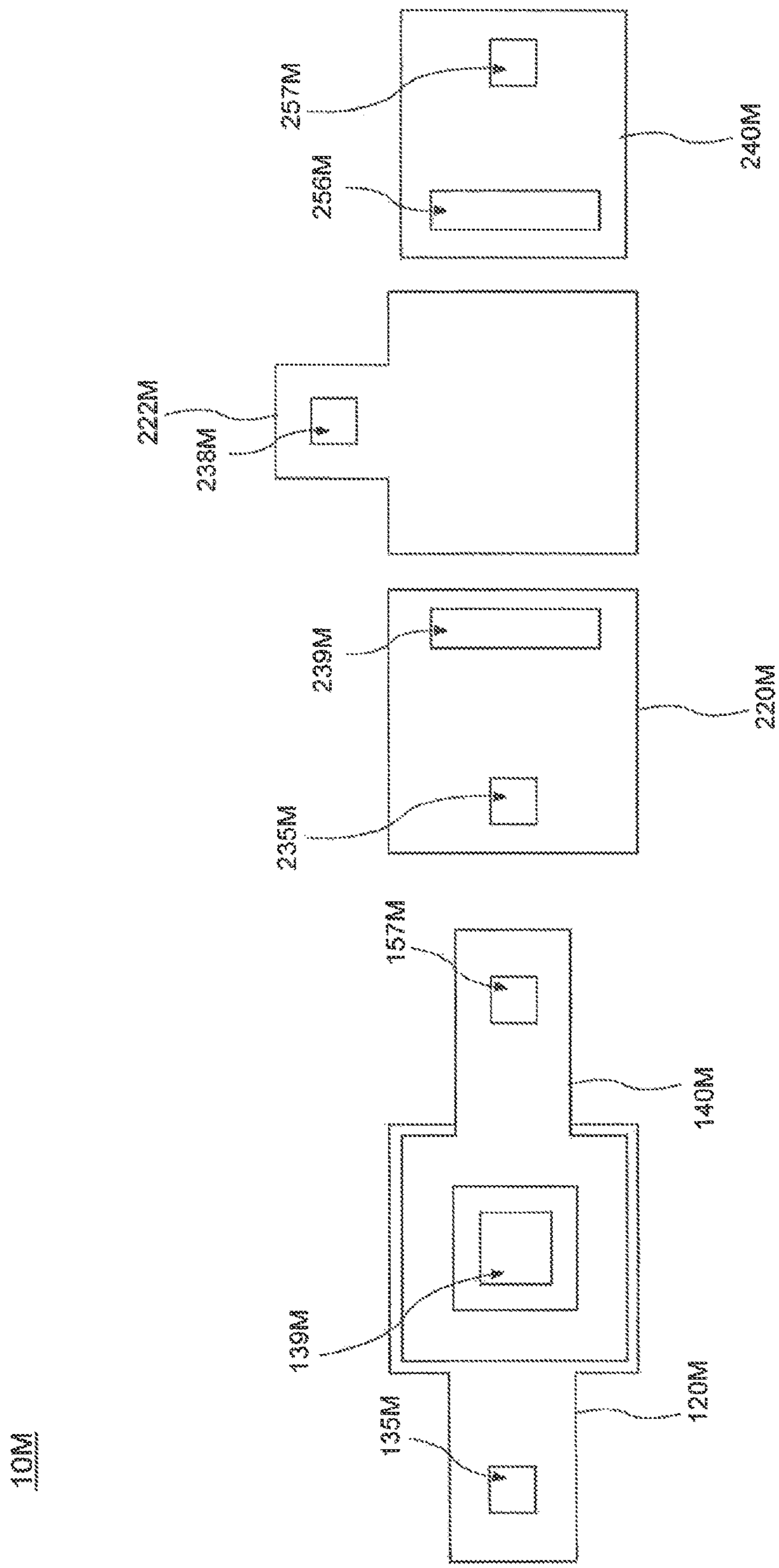
Figure 131:
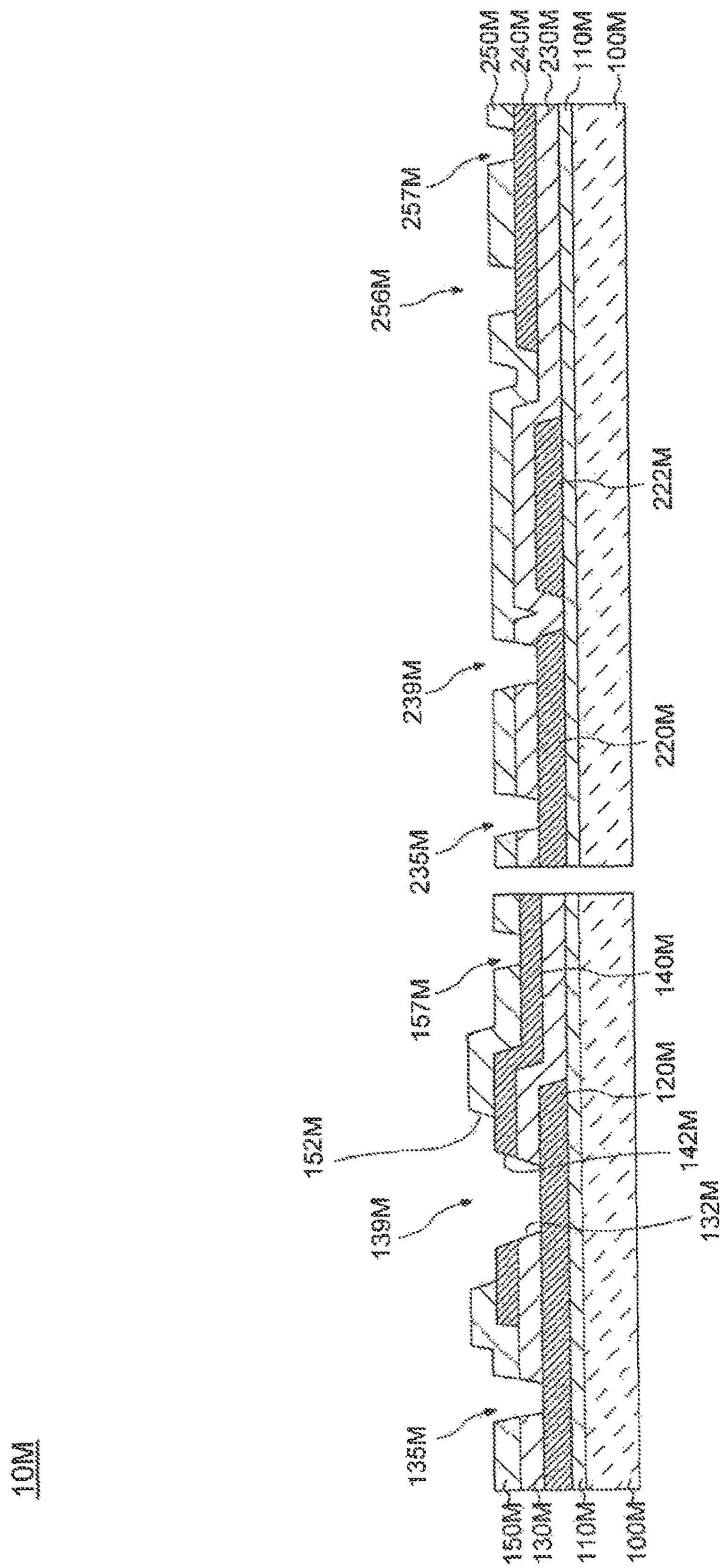

FIG. 130 and FIG. 131 are respectively a plan view and a cross-sectional view showing a step of forming the openings 235M and 257M and openings 238M, 239M and 256M in the insulating layers 230M and 250M in the manufacturing method of the semiconductor device 10M in embodiment 13 according to the present invention. A lower electrode 220M, a back gate 222M, and an upper electrode 240M are formed by substantially the same method as shown in FIG. 118 through FIG. 121 regarding embodiment 12. Referring to FIG. 131, the resultant substrate is subjected to photolithography and etching to form the openings 235M, 238M, 239M, 256M and 257M having patterns shown in FIG. 130.

FIG. 132 and FIG. 133 are respectively a plan view and a cross-sectional view showing a step of forming an oxide semiconductor layer 260M in the manufacturing method of the semiconductor device 10M in embodiment 13 according to the present invention. Referring to FIG. 133, a film for the oxide semiconductor layer 260M is formed on the entirety of the substrate shown in FIG. 131, and patterning is performed as shown in FIG. 132 by photolithography and etching to form the oxide semiconductor layer 260M. The oxide semiconductor layer 260M is formed in the openings 239M and 256M, and a part of the film for the oxide semiconductor layer 260M that is located in the openings 235M, 238M and 257M is etched away. The formation of the oxide semiconductor layer 260M by etching may be performed by substantially the same method as in embodiment 1.

FIG. 134 and FIG. 135 are respectively a plan view and a cross-sectional view showing a step of forming openings exposing the lower electrode 220M, the upper electrode 240M and the like in the manufacturing method of the semiconductor device 10M in embodiment 13 according to the present invention. Referring to FIG. 135, the gate insulating layer 270M is formed on the entirety of the substrate shown in FIG. 133, and is patterned as shown in FIG. 134 by photolithography and etching to form openings in regions corresponding to the openings 235M, 238M and 257M. The resultant opening 235M exposes the lower electrode 220M, and the resultant opening 257M exposes the upper electrode 240M.

A conductive layer for a gate electrode 280M, a source line 290M and a drain line 292M is formed on the entirety of the substrate shown in FIG. 135, and patterning is performed as shown in FIG. 128 and FIG. 129 by photolithography and etching to form the gate electrode 280M, the source line 290M and the drain line 292M. The semiconductor device 10M in embodiment 13 according to the present invention is manufactured by the above-described manufacturing method.

As described above, with the manufacturing method of the semiconductor device 10M in embodiment 13 according to the present invention, the first transistor 20M having a channel length of a nanometer order and the second transistor 30M having a channel length of a micrometer order are formed by the same manufacturing method. In addition, the conductive layer and the insulating layers are etched in separate steps. Therefore, the load on the etching device is alleviated.

Embodiment 14

With reference to FIG. 136 through FIG. 147, an overview of a semiconductor 10N in embodiment 14 according to the present invention will be described.

[Structure of the Semiconductor Device 10N]

FIG. 136 and FIG. 137 are respectively a plan view and a cross-sectional view showing an overview of the semiconductor device 10N in embodiment 14 according to the present invention. FIG. 137 is taken along line N-N' in FIG. 136. As shown in FIG. 136 and FIG. 137, the semiconductor device 10N includes a substrate 100N, an underlying insulating layer 110N, a lower electrode 120N, an insulating layer 130N, an upper electrode 140N, an oxide semiconductor layer 160N, a gate insulating layer 170N, a gate electrode 180N, a source line 190N, and a drain line 192N.

An opening 139N is provided in the lower electrode 120N, the insulating layer 130N and the upper electrode 140N, and reaches the underlying insulating layer 110N. As shown in FIG. 137, the underlying insulating layer 110N has a recessed portion in a region exposed by the opening 139N. In other words, the opening 139N is formed in a part of the underlying insulating layer 110N, and a bottom surface of the opening 139N is located on the side of the substrate 100N with respect to an interface between the lower electrode 120N and the insulating layer 130N. An opening 135N is provided in the insulating layer 130N and the gate insulating layer 170N, and reaches the lower electrode 120N. An opening 177N is provided in the gate insulating layer 170N, and reaches the upper electrode 140N.

The underlying insulating layer 110N is located on the substrate 100N. The lower electrode 120N is located on the underlying insulating layer 110N. The insulating layer 130N is located on the lower electrode 120N and on the underlying insulating layer 110N. The upper electrode 140N is located on the insulating layer 130N. In the opening 139N, the lower electrode 120N has an insulating layer side wall 322N, the insulating layer 130N has an insulating layer side wall 132N, and the upper electrode 140N has an electrode side wall 142N.

The oxide semiconductor layer 160N is located in the opening 139N, and is connected with the lower electrode 120N and the upper electrode 140N. In more detail, the oxide semiconductor layer 160N is located in the recessed portion in the underlying insulating layer 110N, on the electrode side wall 322N, on the insulating layer side wall 132N, and on the electrode side wall 142M. The oxide semiconductor layer 160N is in contact with the electrode side wall 322N, of the lower electrode 120N, exposed to the opening 139N to be connected with the lower electrode 120N, and is in contact with the electrode side wall 142N exposed to the opening 139N and a top surface of the upper electrode 140N to be connected with the upper electrode 140N. In FIG. 137, the oxide semiconductor layer 160N extends continuously from the electrode side wall 142N to the top surface of the upper electrode 140N.

As shown in FIG. 136, the insulating layer side wall 132N has a closed quadrangular shape along the shape of the opening 139N. Similar to the insulating layer side wall 132N, the electrode side walls 322N and 142N also have a closed quadrangular shape along the shape of the opening 139N.

The gate electrode 180N is located to face the oxide semiconductor layer 160N. The gate insulating layer 170N is located between the oxide semiconductor layer 160N and the gate electrode 180N. In the semiconductor device 10N, a portion of the oxide semiconductor layer 160N that is located on the insulating layer side wall 132N acts as a channel. Therefore, the gate electrode 180N is located to face at least the portion of the oxide semiconductor layer 160N that is located on the insulating layer side wall 132N. As described below in detail, a top surface of the gate insulating layer 170N at the bottom of the opening 139N is located on the side of the underlying insulating layer 110N with respect to the interface between the lower electrode 120N and the insulating layer 130N.

The source line 190N is connected with the lower electrode 120N via the opening 135N. The drain line 192N is connected with the upper electrode 140N via the opening 177N. The source line 190N and the drain line 192N may be replaced with each other. Namely, the line 190N may act as the drain line, whereas the line 192N may act as the source line. As shown in FIG. 137, the source line 190N and the drain line 192N form same layer with the gate electrode 180N. It should be noted that the source line 190N and the drain line may form a layer different from that of the gate electrode 180N.

[Shapes of the Insulating Layer Side Wall 132N and the Electrode Side Walls 142N and 332N]

Now, the shape of each of the insulating layer side wall 132N and the electrode side walls 142N and 322N will be described in detail. As shown in FIG. 137, the insulating layer side wall 132N and the electrode side walls 142N and 322N are all forward-tapered. The tapered shapes of the electrode side wall 142N, the insulating layer side wall 132N and the electrode side wall 322N are continuous with each other. Namely, in a region in the vicinity of the opening 139N, a top surface of the lower electrode 120N is covered with the insulating layer 130N, and a top surface of the insulating layer 130N is covered with the upper electrode 140N. It should be noted that the tapered shapes of these side walls do not need to be continuous with each other. Namely, the opening in the insulating layer 130N may have a diameter longer than the diameter of the opening in the lower electrode 120N, so that the top surface of the lower electrode 120N is exposed from the insulating layer 130N. Similarly, the opening in the upper electrode 140N may have a diameter longer than the diameter of the opening in the insulating layer 130N, so that the top surface of the insulating layer 130N is exposed from the upper electrode 140N. The tapered insulating layer side wall 132N, the tapered electrode side walls 142 and 322N may have different tapering angles from each other.

In the example shown in FIG. 137, the forward-tapered insulating layer side wall 132N is linear as seen in a cross-sectional view. The insulating layer side wall 132N is not limited to having such a structure. The forward-tapered insulating layer side wall 132N may be, for example, curved as protruding outward or curved as protruding inward. Instead of being forward-tapered, namely, instead of tending to open upward, the insulating layer side wall 132N may be vertical with respect to the top surface of the insulating layer 130N, or may be reverse-tapered, namely, may incline while tending to open downward. The electrode side walls 142N and 322N may have substantially the same shape as described above. The insulating layer side wall 132N and the electrode side walls 142N and 322N may have the same shape as, or different shapes from, each other.

[Materials of the Components of the Semiconductor Device 10N]

The substrate 100N, the underlying insulating layer 110N, the lower electrode 120N, the insulating layer 130N, the upper electrode 140N, the oxide semiconductor layer 160N, the gate insulating layer 170N, the gate electrode 180N, the source line 190N and the drain line 192N may be formed of any of the same materials as described above in embodiment 1.

As described above, the semiconductor device 10N in embodiment 14 according to the present invention has the channel length thereof controlled by a nanometer order like in embodiment 1. As a result, the semiconductor device 10N increases the on-current thereof, and suppresses the in-plane variance in the channel length thereof.

In a structure in which the oxide semiconductor layer 160N has a large area size and is in contact with a conductive layer, the properties of the oxide semiconductor layer 160N in contact with the conductive layer may occasionally be changed. When the properties of the oxide semiconductor layer 160N are changed, a part of the oxide semiconductor layer 160N may be extinguished during the production of the semiconductor device 10N due to a phenomenon that is considered as electric corrosion. In the oxide semiconductor device 10N, the oxide semiconductor layer 160N is in contact with the lower electrode 120N only along the electrode side wall 322N. Therefore, the above-described phenomenon is suppressed. It has been confirmed that even if the area size of a portion of the oxide semiconductor layer 160N that is in contact with the lower electrode 120N is small as shown in FIG. 137, a sufficiently low contact resistance is realized.

With the structure of the semiconductor device 10N, the opening 139N extends to a position sufficiently deep into the underlying insulating layer 110N beyond the interface between the lower electrode 120N and the insulating layer 130N. Therefore, the oxide semiconductor layer 160N and the gate insulating layer 170N formed on the insulating layer side wall 132N each have a uniform thickness. As a result, the electric field formed in the semiconductor device 10N based on the gate voltage is made uniform in the direction of the channel length. This provides a switching characteristic that allows an ON state and an OFF state to be switched to each other more rapidly.

[Operation of the Semiconductor Device 10N]

An operation of the semiconductor device 10N shown in FIG. 136 and FIG. 137 is substantially the same as the operation of the semiconductor device 10 shown in FIG. 1 and FIG. 2, and thus will not be described in detail. In the semiconductor device 10N also, a gate voltage is applied to the gate electrode 180N, a source voltage is applied to the source line 190N connected with the lower electrode 120N, and a drain voltage is applied to the drain line 192N connected with the upper electrode 140N. It should be noted that the source voltage and the drain voltage may be applied oppositely. In other words, the lower electrode 120N is one of the source electrode and the drain electrode of a transistor having a channel formed of the oxide semiconductor layer 160N, and the upper electrode 140N is the other of the source electrode and the drain electrode of the transistor having the channel formed of the oxide semiconductor layer 160N.

[Manufacturing Method of the Semiconductor Device 10N]

With reference to plan views and cross-sectional views provided in FIG. 138 through FIG. 147, a manufacturing method of the semiconductor device 10N in embodiment 14 according to the present invention will be described.

FIG. 138 and FIG. 139 are respectively a plan view and a cross-sectional view showing a step of forming the lower electrode 120N in the manufacturing method of the semiconductor device 10N in embodiment 14 according to the present invention. Referring to FIG. 139, the underlying insulating layer 110N and a conductive film for the lower electrode 120N are formed on the substrate 100N, and patterning is performed as shown in FIG. 138 by photolithography and etching to form the lower electrode 120N. On the lower electrode 120N formed as a result of the patterning, the insulating layer 130N is formed.

FIG. 140 and FIG. 141 are respectively a plan view and a cross-sectional view showing a step of forming the upper electrode 140N in the manufacturing method of the semiconductor device 10N in embodiment 14 according to the present invention. Referring to FIG. 141, a conductive film for the upper electrode 140N is formed on the entirety of the substrate shown in FIG. 139, and patterning is performed as shown in FIG. 140 by photolithography and etching to form the upper electrode 140N.

FIG. 142 and FIG. 143 are respectively a plan view and a cross-sectional view showing a step of forming the opening 139N in the lower electrode 120N, the upper electrode 140N, the insulating layer 130N and the underlying insulating layer 110N in the manufacturing method of the semiconductor device 10N in embodiment 14 according to the present invention. Referring to FIG. 143, the substrate shown in FIG. 141 is subjected to photolithography and etching to form the opening 139N in the upper electrode 140N, the insulating layer 130N and the lower electrode 120N such that the recessed portion is formed in the underlying insulating layer 110N. The opening 139N has a pattern shown in FIG. 142. As a result of the formation of the opening 139N, the insulating layer side wall 132N and the electrode side walls 142N and 322N are formed.

The etching conditions on the upper electrode 140N, the insulating layer 130N, the lower electrode 120N and the underlying insulating layer 110N may be the same, so that the opening 139N is formed in the upper electrode 140N, the insulating layer 130N, the lower electrode 120N and the underlying insulating layer 110N at the same time. Alternatively, the etching conditions on the upper electrode 140N, the insulating layer 130N, the lower electrode 120N and the underlying insulating layer 110N may be different from each other. The etching method for forming the insulating layer side wall 132N and the electrode side wall 1423N and 322N to be tapered may be substantially the same as the method for the insulating layer side wall 132 described in embodiment 1.

With the method shown in FIG. 143, the opening 139N is formed such that the bottom surface of the opening 139N is located in the underlying insulating layer 110N. The opening 139N is not limited to being formed by such a method. For example, as described below in detail, the opening 139N may be formed such that the bottom surface of the opening 139N is located in the lower electrode 120N. Alternatively, the opening 139N may be formed such that the bottom surface of the opening 139N reaches the substrate 100N.

FIG. 144 and FIG. 145 are respectively a plan view and a cross-sectional view showing a step of forming the oxide semiconductor layer 160N in the manufacturing method of the semiconductor device 10N in embodiment 14 according to the present invention. Referring to FIG. 145, a film for the oxide semiconductor layer 160N is formed on the entirety of the substrate shown in FIG. 143, and patterning is performed as shown in FIG. 144 by photolithography and etching to form the oxide semiconductor layer 160N. The formation of the oxide semiconductor layer 160N by etching may be performed by substantially the same method as in embodiment 1.

FIG. 146 and FIG. 147 are respectively a plan view and a cross-sectional view showing a step of forming the openings 135N and 177N respectively reaching the lower electrode 120N and the upper electrode 140N in the manufacturing method of the semiconductor device 10N in embodiment 14 according to the present invention. Referring to FIG. 147, the gate insulating layer 170N is formed on the entirety of the substrate shown in FIG. 145, and patterning is performed as shown in FIG. 146 by photolithography and etching to form the openings 135N and 177N.

A conductive layer for the gate electrode 180N, the source line 190N and the drain line 192N is formed on the entirety of the substrate shown in FIG. 147, and patterning is performed as shown in FIG. 136 and FIG. 137 by photolithography and etching to form the gate electrode 180N, the source line 190N and the drain line 192N. The semiconductor device 10N in embodiment 14 according to the present invention is manufactured by the above-described manufacturing method.

As described above, with the manufacturing method of the semiconductor device 10N in embodiment 14 according to the present invention, the thickness of the insulating layer 130N, the tapering angle of the insulating layer side wall 132N, or both of the thickness of the insulating layer 130N and the tapering angle of the insulating layer side wall 132N are controllable by a nanometer order. Therefore, the channel length of the semiconductor device 10N is controllable by a nanometer order. As a result, the variance in the channel length is suppressed to a nanometer order. In addition, the oxide semiconductor layer 160N and the gate insulating layer 170N formed on the insulating layer side wall 132N each have a uniform thickness.

Embodiment 15

With reference to FIG. 148 through FIG. 159, an overview of a semiconductor 10P in embodiment 15 according to the present invention will be described. The semiconductor device 10P is similar to the semiconductor device 10N shown in FIG. 136 and FIG. 137, but is different from the semiconductor device 10N on the following points. Openings 135P and 137P have shapes different from those of the corresponding openings of the semiconductor device 10N. The semiconductor device 10P includes a contact pad 122P below the opening 137P. In the following explanation, the features of the semiconductor device 10P that are the same as those of the semiconductor device 10N will not be described, and the above-described differences will be described. In the following description, components that are the same as, or have the same functions as, those of the semiconductor device 10N will be represented by the same reference signs (numerals) with alphabets, and detailed descriptions thereof will be omitted.

[Structure of the Semiconductor Device 10P]

FIG. 148 and FIG. 149 are respectively a plan view and a cross-sectional view showing an overview of the semiconductor device 10P in embodiment 15 according to the present invention. FIG. 149 is taken along line P-P' in FIG. 148. As shown in FIG. 148 and FIG. 149, in the semiconductor device 10P, the openings 135P and 137P reach the inside of an underlying insulating layer 110P. The contact pad 122P is located in a region corresponding to the opening 137P, and the opening 137P passes through the contact pad 122P.

A side wall of the opening 135P is stepped as seen in a cross-sectional view. Specifically, in the opening 135P, the opening in a gate insulating layer 170P has a diameter longer than the diameter of the opening in an insulating layer 130P. In other words, a side wall 175P of the gate insulating layer 170P exposed to the opening 135P is located on a top surface of the insulating layer 130P, and extends upward from the top surface of the insulating layer 130P. Similarly, in the opening 137P, the opening in the gate insulating layer 170P has a diameter longer than the diameter of the opening in an upper electrode 140P. In other words, a side wall 177P of the gate insulating layer 170P exposed to the opening 137P is located on a top surface of the upper electrode 140P, and extends upward from the top surface of the upper electrode 140P. The openings 135P and 137P having such a shape are formed by a manufacturing method of the semiconductor device 10P described below. Specifically, the step of forming the openings in the insulating layer 130P and the step of forming the openings in the gate insulating layer 170P are performed at different timings. As a result, the openings 135P and the 137P having the shapes shown in FIG. 149 are formed.

As described above, the semiconductor device 10P in embodiment 15 according to the present invention increases the on-current thereof, and suppresses the in-plane variance in the channel length thereof. The semiconductor device 10P also suppresses the properties of an oxide semiconductor layer 160P from being changed in a region where the oxide semiconductor layer 160P and the lower electrode 120P contact each other. In addition, a drain electrode of the semiconductor device 10P is connectable with at least one of a line forming the same layer with the lower electrode 120P and the contact pad 122P, a line forming the same layer with the upper electrode 140P, and a line forming the same layer with the drain line 192P. Thus, the degree of freedom of line layout is improved.

[Manufacturing Method of the Semiconductor Device 10P]

With reference to plan views and cross-sectional views provided in FIG. 150 through FIG. 159, a manufacturing method of the semiconductor device 10P in embodiment 15 according to the present invention will be described.

FIG. 150 and FIG. 151 are respectively a plan view and a cross-sectional view showing a step of forming the lower electrode 120P and the contact pad 122P in the manufacturing method of the semiconductor device 10P in embodiment 15 according to the present invention. Referring to FIG. 151, the underlying insulating layer 110P is formed on a substrate 100P. A conductive film for the lower electrode 120P and the contact pad 122P is formed thereon, and patterning is performed as shown in FIG. 150 by photolithography and etching to form the lower electrode 120P and the contact pad 122P. On the lower electrode 120P and the contact pad 122P formed as a result of the patterning, the insulating layer 130P is formed.

FIG. 152 and FIG. 153 are respectively a plan view and a cross-sectional view showing a step of forming the upper electrode 140P in the manufacturing method of the semiconductor device 10P in embodiment 15 according to the present invention. Referring to FIG. 153, a conductive film for the upper electrode 140P is formed on the entirety of the substrate shown in FIG. 151, and patterning is performed as shown in FIG. 152 by photolithography and etching to form the upper electrode 140P.

FIG. 154 and FIG. 155 are respectively a plan view and a cross-sectional view showing a step of forming the openings 135P and 137P and an opening 139P in the lower electrode 120P, the upper electrode 140P, the insulating layer 130P and the underlying insulating layer 110P in the manufacturing method of the semiconductor device 10P in embodiment 15 according to the present invention. Referring to FIG. 155, the substrate shown in FIG. 153 is subjected to photolithography and etching to form the opening 135P in the insulating layer 130P and the lower electrode 120P such that a recessed portion is formed in the underlying insulating layer 110P, to form the opening 137P in the upper electrode 140P, the insulating layer 130P and the contact pad 122P such that a recessed portion is formed in the underlying insulating layer 110P, and to form the opening 139P in the upper electrode 140P, the insulating layers 130P and the lower electrode 120P such that a recessed portion is formed in the underlying insulating layer 110P. The openings 135P, 137P and 139P have patterns shown in FIG. 154.

As a result of the formation of the opening 139P, an electrode side wall 322P of the lower electrode 120P, an insulating layer side wall 132P of the insulating layer 130P, and an electrode side wall 142P of the upper electrode 140P are formed. The etching conditions on the upper electrode 140P, the insulating layer 130P and the lower electrode 120P (or the contact pad 122P) may be the same, so that the openings 135P, 137P and 139P are formed in the upper electrode 140P, the insulating layer 130P and the lower electrode 120P (or the contact pad 122P) at the same time. Alternatively, the etching conditions on the upper electrode 140P, the insulating layer 130P and the lower electrode 120P (or the contact pad 122P) may be different from each other.

FIG. 156 and FIG. 157 are respectively a plan view and a cross-sectional view showing a step of forming the oxide semiconductor layer 160P in the manufacturing method of the semiconductor device 10P in embodiment 15 according to the present invention. Referring to FIG. 157, a film for the oxide semiconductor layer 160P is formed on the entirety of the substrate shown in FIG. 155, and patterning is performed as shown in FIG. 156 by photolithography and etching to form the oxide semiconductor layer 160P. The oxide semiconductor layer 160P is formed in the opening 139P, and a part of the film for the oxide semiconductor layer 160P that is located in the openings 135P and 137P is etched away. The formation of the oxide semiconductor layer 160P by etching may be performed by substantially the same method as in embodiment 1.

FIG. 158 and FIG. 159 are respectively a plan view and a cross-sectional view showing a step of forming openings exposing the lower electrode 120P, the upper electrode 140P and the like in the manufacturing method of the semiconductor device 10P in embodiment 15 according to the present invention. Referring to FIG. 159, the gate insulating layer 170P is formed on the entirety of the substrate shown in FIG. 157, and is patterned as shown in FIG. 158 by photolithography and etching to form openings in regions corresponding to the openings 135P and 137P. The resultant opening 135P exposes a side wall of the lower electrode 120P, and the resultant opening 137P exposes a side wall of the upper electrode 140P and a side wall of the contact pad 122P.

A conductive layer for a gate electrode 180P, a source line 190P and a drain line 192P is formed on the entirety of the substrate shown in FIG. 159, and patterning is performed as shown in FIG. 148 and FIG. 149 by photolithography and etching to form the gate electrode 180P, the source line 190P and the drain line 192P. The semiconductor device 10P in embodiment 15 according to the present invention is manufactured by the above-described manufacturing method.

As described above, with the manufacturing method of the semiconductor device 10P in embodiment 15 according to the present invention, the channel length of the semiconductor device 10P is controllable by a nanometer order. As a result, the variance in the channel length is suppressed to a nanometer order. In addition, the provision of the contact pad 122P suppresses the underlying insulating layer 110P at the bottom of the opening 137P from being excessively etched at the time of formation of the opening 137P. The oxide semiconductor layer 160P and the gate insulating layer 170P formed on the insulating layer side wall 132P each have a uniform thickness.

Embodiment 16

With reference to FIG. 160 through FIG. 171, an overview of a semiconductor 10R in embodiment 16 according to the present invention will be described. The semiconductor device 10R includes a first transistor 20R having a short channel length and a second transistor 30R having a long channel length. The first transistor 20R having a short channel length has substantially the same structure as that of the semiconductor device 10N in embodiment 14 shown in FIG. 136 and FIG. 137. In the following explanation, the features of the first transistor 20R will not be described, and the second transistor 30R having a long channel length will be described. In the following description, components that are the same as, or have the same functions as, those of the semiconductor device 10N will be represented by the same reference signs (numerals) with alphabets, and detailed descriptions thereof will be omitted.

[Structure of the Second Transistor 30R]

FIG. 160 and FIG. 161 are respectively a plan view and a cross-sectional view showing an overview of the semiconductor device 10R in embodiment 16 according to the present invention. FIG. 161 is taken along line R-R' in FIG. 160. As shown in FIG. 160 and FIG. 161, the second transistor 30R includes a substrate 100R, an underlying insulating layer 110R, a lower electrode 220R, a back gate 222R, a contact pad 224R, an insulating layer 230R, an upper electrode 240R, an oxide semiconductor layer 260R, a gate insulating layer 270R, a gate electrode 280R, a source line 290R, and a drain line 292R. The substrate 100R and the underlying insulating layer 110R are common to the first transistor 20R and the second transistor 30R, and extend continuously in the first transistor 20R and the second transistor 30R.

An opening 235R is provided in the insulating layer 230R and the gate insulating layer 270R, and reaches the lower electrode 220R. An opening 239R is provided in the insulating layer 230R and the lower electrode 220R, and has a recessed portion in the underlying insulating layer 110R. An opening 236R is provided in the upper electrode 240R, the insulating layer 230R and the contact pad 224R, and has a recessed portion in the underlying insulating layer 110R. An opening 277R is provided in the gate insulating layer 270G, and reaches the upper electrode 240R.

The lower electrode 220R, the back gate 222R and the contact pad 224R are located on the underlying insulating layer 110R. The insulating layer 230R is located on the lower electrode 220R, on the back gate 222R, on the contact pad 224R, and on the underlying insulating layer 110R. The upper electrode 240R is located on the insulating layer 230R, and is isolated from the lower electrode 220R as seen in a plan view. The oxide semiconductor layer 260R is located on the insulating layer 230R in a region between the lower electrode 220R and the upper electrode 240R. The oxide semiconductor layer 260R is connected with the lower electrode 220R via the opening 239R, and runs onto, and thus is connected with, the upper electrode 240R at a side surface and a top surface of the upper electrodes 240R. The oxide semiconductor layer 260R is also connected with the contact pad 224R via the opening 236R.

The back gate 222R faces the oxide semiconductor layer 260R while having the insulating layer 230R therebetween. In other words, the back gate 222R is located on the side opposite to the gate electrode 280R with respect to the oxide semiconductor layer 260R in at least a part of a region where the oxide semiconductor layer 260R and the gate electrode 280R face each other. The insulating layer 230R is located between the oxide semiconductor layer 260R and the back gate 222R. The back gate 222R may be omitted.

The gate electrode 280R is located to face the oxide semiconductor layer 260R in a region between the lower electrode 220R and the upper electrode 240R. The gate insulating layer 270R is located between the oxide semiconductor layer 260R and the gate electrode 280R. In the second transistor 30R, a portion of the oxide semiconductor layer 260R that is located in the region between the lower electrode 220R and the upper electrode 240R acts as a channel.

The source line 290R is connected with the lower electrode 220R via the opening 235R. The drain line 292R is connected with the upper electrode 240R via the opening 277R. The source line 290R and the drain line 292R may be replaced with each other. Namely, the line 290R may act as the drain line, whereas the line 292R may act as the source line.

Now, the relationship between the first transistor 20R and the second transistor 30R regarding each of the components thereof will be described. The lower electrode 220R, the back gate 222R and the contact pad 224R form the same layer with a lower electrode 120R, and are all located in contact with the underlying insulating layer 110R. The insulating layer 230R forms the same layer with an insulating layer 130R, and is continuous with the insulating layer 130R. Similarly, an upper electrode 140R and the upper electrode 240R, an oxide semiconductor layer 160R and the oxide semiconductor layer 260R, a gate insulating layer 170R and the gate insulating layer 270R, a gate electrode 180R and the gate electrode 280R, a source line 190R and the source line 290R, and a drain line 192R and the drain line 292R, form the same layer with each other.

[Operation of the Second Transistor 30R]

An operation of the second transistor 30R shown in FIG. 160 and FIG. 161 is substantially the same as the operation of the second transistor 30C shown in FIG. 27 and FIG. 28, and thus will not be described in detail. In the second transistor 30R also, a gate voltage is applied to the gate electrode 280R, a source voltage is applied to the source line 290R connected with the lower electrode 220R, and a drain voltage is applied to the drain line 292R connected with the upper electrode 240R. It should be noted that the source voltage and the drain voltage may be applied oppositely. In other words, the lower electrode 220R is one of the source electrode and the drain electrode of the second transistor 30R having a channel formed of the oxide semiconductor layer 260R, and the upper electrode 240R is the other of the source electrode and the drain electrode of the second transistor 30R having the channel formed of the oxide semiconductor layer 260R. The back gate 222R is supplied with an assisting gate voltage independent from the gate voltage to control the threshold value (Vth) of the second transistor 30R.

[Manufacturing Method of the Second Transistor 30R]

With reference to plan views and cross-sectional views provided in FIG. 162 through FIG. 171, a manufacturing method of the second transistor 30R of the semiconductor device 10R in embodiment 16 according to the present invention will be described. The manufacturing method of the first transistor 20R is substantially the same as that of the semiconductor device 10N in embodiment 14, and will not be described here.

FIG. 162 and FIG. 163 are respectively a plan view and a cross-sectional view showing a step of forming the lower electrode 220R, the back gate 222R and the contact pad 224R in the manufacturing method of the semiconductor device 10R in embodiment 16 according to the present invention. Referring to FIG. 163, the underlying insulating layer 110R is formed on the substrate 100R. A conductive film for the lower electrode 220R, the back gate 222R and the contact pad 224R is formed thereon, and patterning is performed as shown in FIG. 162 by photolithography and etching to form the lower electrode 220R, the back gate 222R and the contact pad 224R. On the lower electrode 220R, the back gate 222R and the contact pad 224R formed as a result of the patterning, the insulating layer 230R is formed. The etching for forming the lower electrode 220R, the back gate 222R and the contact pad 224R is performed under the same conditions as those for the lower electrode 120R.

FIG. 164 and FIG. 165 are respectively a plan view and a cross-sectional view showing a step of forming the upper electrode 240R in the manufacturing method of the semiconductor device 10R in embodiment 16 according to the present invention. Referring to FIG. 165, a conductive film for the upper electrode 240R is formed on the entirety of the substrate shown in FIG. 163, and patterning is performed as shown in FIG. 164 by photolithography and etching to form the upper electrode 240R. The etching for forming the upper electrode 240R is performed under the same conditions as those for the upper electrode 140R.

FIG. 166 and FIG. 167 are respectively a plan view and a cross-sectional view showing a step of forming the openings 239R and 236R in the lower electrode 220R, the upper electrode 240R, the insulating layer 230R and the underlying insulating layer 110R in the manufacturing method of the semiconductor device 10R in embodiment 16 according to the present invention. Referring to FIG. 167, the substrate shown in FIG. 165 is subjected to photolithography and etching to form the opening 239R in the insulating layer 230R and the lower electrode 220R such that the recessed portion is formed in the underlying insulating layer 110R and to form the opening 236R in the upper electrode 240R, the insulating layer 230R and the contact pad 224R such that the recessed portion is formed in the underlying insulating layer 110R. The opening 239R and 236R have patterns shown in FIG. 166. The etching for forming the openings 236R and 239R is performed under the same conditions as those for an opening 139R.

FIG. 168 and FIG. 169 are respectively a plan view and a cross-sectional view showing a step of forming the oxide semiconductor layer 260R in the manufacturing method of the semiconductor device 10R in embodiment 16 according to the present invention. Referring to FIG. 169, a film for the oxide semiconductor layer 260R is formed on the entirety of the substrate shown in FIG. 167, and patterning is performed as shown in FIG. 168 by photolithography and etching to form the oxide semiconductor layer 260R. The formation of the oxide semiconductor layer 260R by etching may be performed by substantially the same method as in embodiment 1.

FIG. 170 and FIG. 171 are respectively a plan view and a cross-sectional view showing a step of forming the openings 235R and 277R and also an opening 238R reaching the lower electrode 220R, the upper electrode 240R and the like in the manufacturing method of the semiconductor device 10R in embodiment 16 according to the present invention. Referring to FIG. 171, the gate insulating layer 270R is formed on the entirety of the substrate shown in FIG. 169, and patterning is performed as shown in FIG. 170 by photolithography and etching to form the openings 235R, 238R and 277R. The etching for forming the openings 235R, 238R and 277R is performed under the same conditions as those for openings 135R and 177R.

A conductive layer for the gate electrode 280R, the source line 290R and the drain line 292R is formed on the entirety of the substrate shown in FIG. 171, and patterning is performed as shown in FIG. 160 and FIG. 161 by photolithography and etching to form the gate electrode 280R, the source line 290R and the drain line 292R. The second transistor 30R of the semiconductor device 10R in embodiment 16 according to the present invention is manufactured by the above-described manufacturing method.

As described above, with the manufacturing method of the semiconductor device 10R in embodiment 16 according to the present invention, the first transistor 20R having a channel length of a nanometer order and the second transistor 30R having a channel length of a micrometer order are formed by the same manufacturing method.

Embodiment 17

With reference to FIG. 172 through FIG. 183, an overview of a semiconductor 10S in embodiment 17 according to the present invention will be described. The semiconductor device 10S includes a first transistor 20S having a short channel length and a second transistor 30S having a long channel length. The first transistor 20S having a short channel length has substantially the same structure as that of the semiconductor device 10P in embodiment 15. In the following explanation, the features of the first transistor 20S will not be described, and the second transistor 30S having a long channel length will be described. In the following description, components that are the same as, or have the same functions as, those of the semiconductor device 10P will be represented by the same reference signs (numerals) with alphabets, and detailed descriptions thereof will be omitted.

The second transistor 30S is similar to the second transistor 30R shown in FIG. 160 and FIG. 161, but openings 235S and 237S have shapes different from those of the corresponding openings of the second transistor 30R. In the following explanation, the features of the second transistor 30S that are the same as those of the second transistor 30R will not be described, and the above-described differences will be described.

[Structure of the Second Transistor 30S]

FIG. 172 and FIG. 173 are respectively a plan view and a cross-sectional view showing an overview of the semiconductor device 10S in embodiment 17 according to the present invention. FIG. 173 is taken along line S-S' in FIG. 172. As shown in FIG. 172 and FIG. 173, in the second transistor 30S, the openings 235S and 237S reach the inside of an underlying insulating layer 110S.

A side wall of each of the openings 235S and 237S is stepped as seen in a cross-sectional view. Specifically, in each of the openings 235S and 237S, the opening in a gate insulating layer 270S has a diameter longer than the diameter of the opening in an insulating layer 230S. In other words, for example, a side wall 275S of the gate insulating layer 270S exposed to the opening 235S is located on a top surface of the insulating layer 230S, and extends upward from the top surface of the insulating layer 230S. The opening 235S having such a shape is formed by a manufacturing method of the second transistor 30S described below. Specifically, the step of forming the opening in the insulating layer 230S and the step of forming the opening in the gate insulating layer 270S are performed at different timings. As a result, the opening 235S having the shape shown in FIG. 173 is formed. Substantially the same is applicable to the opening 237S.

[Manufacturing Method of the Second Transistor 30S]

With reference to plan views and cross-sectional views provided in FIG. 174 through FIG. 183, a manufacturing method of the second transistor 30S of the semiconductor device 10S in embodiment 17 according to the present invention will be described.

FIG. 174 and FIG. 175 are respectively a plan view and a cross-sectional view showing a step of forming a lower electrode 220S, a back gate 222S and a contact pad 224S in the manufacturing method of the semiconductor device 10S in embodiment 17 according to the present invention. Referring to FIG. 175, the underlying insulating layer 110S is formed on a substrate 100S. A conductive film for the lower electrode 220S, the back gate 222S and the contact pad 224S is formed thereon, and patterning is performed as shown in FIG. 174 by photolithography and etching to form the lower electrode 220S, the back gate 222S and the contact pad 224S. On the lower electrode 220S, the back gate 222S and the contact pad 224S formed as a result of the patterning, the insulating layer 230S is formed. The etching for forming the lower electrode 220S, the back gate 222S and the contact pad 224S is performed under the same conditions as those for a lower electrode 120S and a contact pad 122S.

FIG. 176 and FIG. 177 are respectively a plan view and a cross-sectional view showing a step of forming the upper electrode 240S in the manufacturing method of the semiconductor device 10S in embodiment 17 according to the present invention. Referring to FIG. 177, a conductive film for the upper electrode 240S is formed on the entirety of the substrate shown in FIG. 175, and patterning is performed as shown in FIG. 176 by photolithography and etching to form the upper electrode 240S. The etching for forming the upper electrode 240S is performed under the same conditions as those for an upper electrode 140S.

FIG. 178 and FIG. 179 are respectively a plan view and a cross-sectional view showing a step of forming the openings 235S and 237S and also openings 236S, 238S and 239S in the lower electrode 220S, the upper electrode 240S, the insulating layer 230S and the underlying insulating layer 110S in the manufacturing method of the semiconductor device 10S in embodiment 17 according to the present invention. Referring to FIG. 179, the substrate shown in FIG. 177 is subjected to photolithography and etching to form the openings 235S and 239S in the insulating layer 230S and the lower electrode 220S such that a recessed portion is formed in the underlying insulating layer 110S, to form the opening 236S in the upper electrode 240S, the insulating layer 230S and the contact pad 224S such that a recessed portion is formed in the underlying insulating layer 110S, and to form the opening 237S in the upper electrode 240S and the insulating layer 230S such that a recessed portion is formed in the underlying insulating layer 110S. The openings 235S, 236S, 237S, 238S and 239S have patterns shown in FIG. 178. The etching for forming the openings 235S, 236S, 237S, 238S and 239S is performed under the same conditions as those for openings 135S, 137S and 139S.

FIG. 180 and FIG. 181 are respectively a plan view and a cross-sectional view showing a step of forming an oxide semiconductor layer 260S in the manufacturing method of the semiconductor device 10S in embodiment 17 according to the present invention. Referring to FIG. 181, a film for the oxide semiconductor layer 260S is formed on the entirety of the substrate shown in FIG. 179, and patterning is performed as shown in FIG. 180 by photolithography and etching to form the oxide semiconductor layer 260S. The oxide semiconductor layer 260S is formed in the openings 236S and 239S, and a part of the film for the oxide semiconductor layer 260S that is located in the openings 235S, 237S and 238S is etched away. The formation of the oxide semiconductor layer 260S by etching may be performed by substantially the same method as in embodiment 1.

FIG. 182 and FIG. 183 are respectively a plan view and a cross-sectional view showing a step of forming openings exposing the lower electrode 220S, the upper electrode 240S and the like in the manufacturing method of the semiconductor device 10S in embodiment 17 according to the present invention. Referring to FIG. 183, the gate insulating layer 270S is formed on the entirety of the substrate shown in FIG. 181, and is patterned as shown in FIG. 182 by photolithography and etching to form the openings in regions corresponding to the openings 235S, 237S and 238S. The resultant opening 235S exposes a side wall of the lower electrode 220S, and the resultant opening 237S exposes a side wall of the upper electrode 240S. The etching for forming the openings 235S, 237S and 238S in the gate insulating layer 270S is performed under the same conditions as those for forming the openings 135S and 137S in a gate insulating layer 170S.

A conductive layer for a gate electrode 280S, a source line 290S and a drain line 292S is formed on the entirety of the substrate shown in FIG. 183, and patterning is performed as shown in FIG. 172 and FIG. 173 by photolithography and etching to form the gate electrode 280S, the source line 290S and the drain line 292S. The second transistor 30S of the semiconductor device 10S in embodiment 17 according to the present invention is manufactured by the above-described manufacturing method.

As described above, with the manufacturing method of the semiconductor device 10S in embodiment 17 according to the present invention, the first transistor 20S having a channel length of a nanometer order and the second transistor 30S having a channel length of a micrometer order are formed by the same manufacturing method.

[Structures of Opening 139T in Embodiments 14 Through 17]

With reference to FIG. 184A, the structure of an opening in embodiments 14 through 17 will be described. Especially, as shown in FIG. 184A, the positional relationship between the bottom of an opening 139T reaching an underlying insulating layer 110T and an insulating layer 130T will be described. FIG. 184A is a cross-sectional view showing a structure of the opening 130T in a semiconductor device in an embodiment according to the present invention. As shown in FIG. 184A, a top surface 375T of a gate insulating layer 170T at the bottom of the opening 139T is located on the side of the underlying insulating layer 110T with respect to an interface 325T between a lower electrode 120T and the insulating layer 130T.

In the case where an oxide semiconductor layer 160T or the gate insulating layer 170T is formed in the opening 139T by sputtering or CVD, there may occur a problem that the thickness of the oxide semiconductor layer 160T or the gate insulating layer 170T becomes non-uniform in a peripheral portion 315T of the bottom of the opening 139T. In the structure shown in FIG. 184A, a portion of the oxide semiconductor layer 160T that is located on an insulating layer side wall 132T acts as a channel. In FIG. 184A, the peripheral portion 315T is located on the side of the underlying insulating layer 110T with respect to a bottom end of the insulating layer side wall 132T (the bottom corresponds to the interface 325T). Therefore, the oxide semiconductor layer 160T and the gate insulating layer 170T formed on the insulating layer side wall 132T each have a uniform thickness.

With reference to FIG. 184B, a modification of the structure of the opening 139T in embodiments 14 through 17 will be described. FIG. 184B is a cross-sectional view showing a structure of an opening 139T in a semiconductor device in an embodiment according to the present invention. In FIG. 184B, the opening 139T is formed in the insulating layer 130T and has a recessed portion in the lower electrode 120T. The oxide semiconductor layer 160T is located on an electrode side wall 142T, on the insulating layer side wall 132T and in the recessed portion, in the lower electrode 120T, including the electrode side wall 122T. In this case also, the top surface 375T of the gate insulating layer 170T at the bottom of the opening 139T is located on the side of the underlying insulating layer 110T with respect to the interface 325T between the lower electrode 120T and the insulating layer 130T.

The structure of the semiconductor device shown in FIG. 184B having the opening 139T may be expressed as follows. The semiconductor device includes the underlying insulating layer 110T, the lower electrode 120T on the underlying insulating layer 110T, the insulating layer 130T on the lower electrode 120T, an upper electrode 140T on the insulating layer 130T, and the oxide semiconductor layer 160T located in the recessed portion, in the lower electrode 120T, that is provided in a region corresponding to the inside and the bottom of the opening 139T, the oxide semiconductor layer 160T being connected with the lower electrode 120T and the upper electrode 140T.

The structure shown in FIG. 184B is applicable to embodiments 14 through 17 and also to a structure, in any of the following embodiments, in which an opening corresponding to the opening 139T is formed in the lower electrode 120T and has a recessed portion in the underlying insulating layer 110T.

Embodiment 18

With reference to FIG. 185A through FIG. 194, an overview of a semiconductor 10U in embodiment 18 according to the present invention will be described. The semiconductor device 10U is similar to the semiconductor device 10N shown in FIG. 136 and FIG. 137, but an opening 139U has a shape different from that of the opening 139N of the semiconductor device 10N. In the following explanation, the features of the semiconductor device 10U that are the same as those of the semiconductor device 10N will not be described, and the above-described difference will be described. In the following description, components that are the same as, or have the same functions as, those of the semiconductor device 10N will be represented by the same reference signs (numerals) with alphabets, and detailed descriptions thereof will be omitted.

[Structure of the Semiconductor Device 10U]

FIG. 185A and FIG. 185B are respectively a plan view and a cross-sectional view showing an overview of the semiconductor device 10U in embodiment 18 according to the present invention. FIG. 185B is taken along line U-U' in FIG. 185A. As shown in FIG. 185A and FIG. 185B, in the semiconductor device 10U, a side wall of the opening 139U formed in a lower electrode 120U, an insulating layer 130U and an upper electrode 140U is stepped as seen in a cross-sectional view. Specifically, in the opening 139U, the opening in the insulating layer 130U has a diameter longer than the diameter of the opening in the lower electrode 120U. In other words, a part of a top surface of the lower electrode 120U is exposed from the insulating layer 130U in a region in the vicinity of the opening 139U. In still other words, a side wall 132U of the insulating layer 130U is located on the top surface of the lower electrode 120U, and extends upward from the top surface of the lower electrode 120U. The opening 139U having such a shape is formed by a manufacturing method of the semiconductor device 10U described below. Specifically, the step of forming the opening in the lower electrode 120U, the step of forming the opening in the insulating layer 130U, and the step of forming the opening in the upper electrode 140U are performed at different timings. As a result, the opening 139U having the shape shown in FIG. 185B is formed.

As described above, the semiconductor device 10U in embodiment 18 according to the present invention increases the on-current thereof, and suppresses the in-plane variance in the channel length thereof. In addition, the area size of the region where an oxide semiconductor layer 160U contacts the lower electrode 120U is limited. Therefore, the properties of a large area of the oxide semiconductor layer 160U is suppressed from being changed in the region where the oxide semiconductor layer 160U and the lower electrode 120U contact each other.

[Manufacturing Method of the Semiconductor Device 10U]

With reference to plan views and cross-sectional views provided in FIG. 186A through FIG. 194, a manufacturing method of the semiconductor device 10U in embodiment 18 according to the present invention will be described.

FIG. 186A and FIG. 186B are respectively a plan view and a cross-sectional view showing a step of forming the lower electrode 120U in the manufacturing method of the semiconductor device 10U in embodiment 18 according to the present invention. Referring to FIG. 186B, an underlying insulating layer 110U and a conductive film for the lower electrode 120U are formed on a substrate 100U, and patterning is performed as shown in FIG. 186A by photolithography and etching to form the lower electrode 120U having the opening enclosed by an electrode side wall 322U. On the lower electrode 120U formed as a result of the patterning, the insulating layer 130U is formed.

FIG. 187 and FIG. 188 are respectively a plan view and a cross-sectional view showing a step of forming the upper electrode 140U in the manufacturing method of the semiconductor device 10U in embodiment 18 according to the present invention. Referring to FIG. 188, a conductive film for the upper electrode 140U is formed on the entirety of the substrate shown in FIG. 186B, and patterning is performed as shown in FIG. 187 by photolithography and etching to form the upper electrode 140U having the opening enclosed by an electrode side wall 142U. The position of the upper electrode 140U with respect to the lower electrode 120U is adjusted such that the electrode side wall 142U encloses the electrode side wall 322U.

FIG. 189 and FIG. 190 are respectively a plan view and a cross-sectional view showing a step of forming the opening 139U in the insulating layer 130U and the underlying insulating layer 110U in the manufacturing method of the semiconductor device 10U in embodiment 18 according to the present invention. Referring to FIG. 190, the substrate shown in FIG. 188 is subjected to photolithography and etching to form the opening in the insulating layer 130U by use of the upper electrode 140U as a mask and to form a recessed portion in the underlying insulating layer 110U by use of the lower electrode 120U as a mask. As a result, the opening 139U shown in FIG. 189 is formed. Specifically, the etching is performed by use of a resist masking a portion of the insulating layer 130U that is exposed from the upper electrode 140U but does not include a region in which the opening is to be formed. As a result of the etching, a portion of the insulating layer 130U that is enclosed by the electrode side wall 142U, and a portion of the underlying insulating layer 110U that is enclosed by the electrode side wall 322U, are etched away. Thus, the opening 139U is formed.

The etching in this step is merely performed on the insulating layers. Therefore, the insulating layer 130U and the underlying insulating layer 110U may be etched at the same time under the same etching conditions. The etching in this step may be performed under the condition that the etching rate ratio of the insulating layer 130U and the underlying insulating layer 110U with respect to the upper electrode 140U and the lower electrode 120U is high. In this step, it is sufficient that the upper electrode 140U and the lower electrode 120U are exposed. Therefore, plasma during the etching may be monitored, and the end point of the etching may be set based on a signal caused by the upper electrode 140U and the lower electrode 120U and detected in the plasma.

FIG. 191 and FIG. 192 are respectively a plan view and a cross-sectional view showing a step of forming an oxide semiconductor layer 160U in the manufacturing method of the semiconductor device 10U in embodiment 18 according to the present invention. Referring to FIG. 192, a film for the oxide semiconductor layer 160U is formed on the entirety of the substrate shown in FIG. 190, and patterning is performed as shown in FIG. 191 by photolithography and etching to form the oxide semiconductor layer 160U. The oxide semiconductor layer 160U is formed in the opening 139U. The formation of the oxide semiconductor layer 160U by etching may be performed by substantially the same method as in embodiment 1.

FIG. 193 and FIG. 194 are respectively a plan view and a cross-sectional view showing a step of forming openings 135U and 177U respectively reaching the lower electrode 120U and the upper electrode 140U in the manufacturing method of the semiconductor device 10U in embodiment 18 according to the present invention. Referring to FIG. 194, a gate insulating layer 170U is formed on the entirety of the substrate shown in FIG. 192, and patterning is performed as shown in FIG. 193 by photolithography and etching to form the openings 135U and 177U.

A conductive layer for a gate electrode 180U, a source line 190U and a drain line 192U is formed on the entirety of the substrate shown in FIG. 194, and patterning is performed as shown in FIG. 185A and FIG. 185B by photolithography and etching to form the gate electrode 180U, the source line 190U and the drain line 192U. The semiconductor device 10U in embodiment 18 according to the present invention is manufactured by the above-described manufacturing method.

As described above, with the manufacturing method of the semiconductor device 10U in embodiment 18 according to the present invention, the conductive layers and the insulating layers are etched in separate steps. Therefore, the load on the etching device is alleviated.

Embodiment 19

With reference to FIG. 195 through FIG. 202, an overview of a semiconductor 10V in embodiment 19 according to the present invention will be described. The semiconductor device 10V is similar to the semiconductor device 10U shown in FIG. 185A and FIG. 185B, but an opening 135V has a shape different from that of the corresponding opening of the semiconductor device 10U. In the following explanation, the features of the semiconductor device 10V that are the same as those of the semiconductor device 10U will not be described, and the above-described difference will be described. In the following description, components that are the same as, or have the same functions as, those of the semiconductor device 10U will be represented by the same reference signs (numerals) with alphabets, and detailed descriptions thereof will be omitted.

[Structure of the Semiconductor Device 10V]

FIG. 195 and FIG. 196 are respectively a plan view and a cross-sectional view showing an overview of the semiconductor device 10V in embodiment 19 according to the present invention. FIG. 196 is taken along line V-V' in FIG.

195. As shown in FIG. 195 and FIG. 196, in the semiconductor device 10V, a side wall of the opening 135V formed in an insulating layer 130V and a gate insulating layer 170V is stepped as seen in a cross-sectional view. Specifically, in the opening 135V, the opening in the gate insulating layer 170V has a diameter longer than the diameter of the opening in the insulating layer 130V. In other words, a side wall 175V of the gate insulating layer 170V exposed to the opening 135V is located on a top surface of the insulating layer 130V, and extends upward from the top surface of the insulating layer 130V. The opening 135V having such a shape is formed by a manufacturing method of the semiconductor device 10V described below. Specifically, the step of forming the opening in the insulating layer 130V and the step of forming the opening in the gate insulating layer 170V are performed at different timings. As a result, the opening 135V having the shape shown in FIG. 196 is formed.

As described above, the semiconductor device 10V in embodiment 19 according to the present invention increases the on-current thereof, and suppresses the in-plane variance in the channel length thereof. In addition, the properties of a large area of an oxide semiconductor layer 160V is suppressed from being changed in a region where the oxide semiconductor layer 160V and a lower electrode 120V contact each other.

[Manufacturing Method of the Semiconductor Device 10V]

With reference to plan views and cross-sectional views provided in FIG. 197 through FIG. 202, a manufacturing method of the semiconductor device 10V in embodiment 19 according to the present invention will be described.

FIG. 197 and FIG. 198 are respectively a plan view and a cross-sectional view showing a step of forming the opening 135V and also an opening 139V in the insulating layer 130V and the underlying insulating layer 110V in the manufacturing method of the semiconductor device 10V in embodiment 19 according to the present invention. The lower electrode 120V having an electrode side wall 322V and an upper electrode 140V having an electrode side wall 142V are formed in substantially the same method as described in FIG. 186A through FIG. 188 regarding embodiment 18. Referring to FIG. 198, the resultant substrate is subjected to photolithography and etching to form the openings 135V and 139V.

FIG. 199 and FIG. 200 are respectively a plan view and a cross-sectional view showing a step of forming the oxide semiconductor layer 160V in the manufacturing method of the semiconductor device 10V in embodiment 19 according to the present invention. Referring to FIG. 200, a film for the oxide semiconductor layer 160V is formed on the entirety of the substrate shown in FIG. 198, and patterning is performed as shown in FIG. 199 by photolithography and etching to form the oxide semiconductor layer 160V. The oxide semiconductor layer 160V is formed in the opening 139V, and a part of the film for the oxide semiconductor layer 160V that is located in the opening 135V is etched away. The formation of the oxide semiconductor layer 160V by etching may be performed by substantially the same method as in embodiment 1.

FIG. 201 and FIG. 202 are respectively a plan view and a cross-sectional view showing a step of forming openings exposing the lower electrode 120V and the upper electrode 140V in the manufacturing method of the semiconductor device 10V in embodiment 19 according to the present invention. Referring to FIG. 202, the gate insulating layer 170V is formed on the entirety of the substrate shown in FIG. 200, and is patterned as shown in FIG. 201 by photolithography and etching to form openings in a region corresponding to the opening 135V and to form an opening 177V. The resultant opening 135V exposes the lower electrode 120V, and the opening 177V exposes the upper electrode 140V.

A conductive layer for a gate electrode 180V, a source line 190V and a drain line 192V is formed on the entirety of the substrate shown in FIG. 202, and patterning is performed as shown in FIG. 195 and FIG. 196 by photolithography and etching to form the gate electrode 180V, the source line 190V and the drain line 192V. The semiconductor device 10V in embodiment 19 according to the present invention is manufactured by the above-described manufacturing method.

As described above, with the manufacturing method of the semiconductor device 10V in embodiment 19 according to the present invention, the conductive layers and the insulating layers are etched in separate steps. Therefore, the load on the etching device is alleviated. In addition, the oxide semiconductor layer 160V and the gate insulating layer 170V formed on the insulating layer side wall 132V each have a uniform thickness.

Embodiment 20

With reference to FIG. 203 through FIG. 214, an overview of a semiconductor 10W in embodiment 20 according to the present invention will be described. The semiconductor device 10W includes a first transistor 20W having a short channel length and a second transistor 30W having a long channel length. The first transistor 20W having a short channel length has substantially the same structure as that of the semiconductor device 10U in embodiment 18 shown in FIG. 185A and FIG. 185B. In the following explanation, the features of the first transistor 20W will not be described, and the second transistor 30W having a long channel length will be described.

The second transistor 30W is similar to the second transistor 30R shown in FIG. 160 and FIG. 161, but is different from the second transistor 30R on the following points. An opening 239W has a shape different from that of the corresponding opening of the second transistor 30R. The second transistor 30W does not include an opening corresponding to the opening 236R. In the following explanation, the features of the semiconductor device 10W that are the same as those of the semiconductor device 10R will not be described, and the above-described differences will be described. In the following description, components that are the same as, or have the same functions as, those of the semiconductor device 10R will be represented by the same reference signs (numerals) with alphabets, and detailed descriptions thereof will be omitted.

[Structure of the Second Transistor 30W]

FIG. 203 and FIG. 204 are respectively a plan view and a cross-sectional view showing an overview of the semiconductor device 10W in embodiment 20 according to the present invention. FIG. 204 is taken along line W-W' in FIG. 203. As shown in FIG. 203 and FIG. 204, in the second transistor 30W, a side wall of the opening 239W is stepped as seen in a cross-sectional view, like a side wall of an opening 139W in the first transistor 20W. The second transistor 30W does not include an opening corresponding to the opening 236R or a contact pad corresponding to the contact pad 224R in the second transistor 30R shown in FIG. 161. An oxide semiconductor layer 260W runs onto, and thus is connected with, an upper electrode 240W at a side surface and a top surface of the upper electrodes 240W. It should be noted that the second transistor 30W may include an opening corresponding to the opening 236R and a contact pad corresponding to the contact pad 224R in the second transistor 30R.

[Manufacturing Method of the Second Transistor 30W]

With reference to plan views and cross-sectional views provided in FIG. 205 through FIG. 214, a manufacturing method of the second transistor 30W of the semiconductor device 10W in embodiment 20 according to the present invention will be described. The manufacturing method of the first transistor 20W is substantially the same as that of the semiconductor device 10U in embodiment 18, and will not be described here.

FIG. 205 and FIG. 206 are respectively a plan view and a cross-sectional view showing a step of forming a lower electrode 220W and a back gate 222W in the manufacturing method of the semiconductor device 10W in embodiment 20 according to the present invention. Referring to FIG. 206, an underlying insulating layer 110W is formed on a substrate 100W. A conductive film for the lower electrode 220W and the back gate 222W is formed thereon, and patterning is performed as shown in FIG. 205 by photolithography and etching to form the lower electrode 220W having an opening 229W and the back gate 222W. On the lower electrode 220W and the back gate 222W formed as a result of the patterning, an insulating layer 230W is formed. The etching for forming the lower electrode 220W and the back gate 222W is performed under the same conditions as those for a lower electrode 120W.

FIG. 207 and FIG. 208 are respectively a plan view and a cross-sectional view showing a step of forming the upper electrode 240W in the manufacturing method of the semiconductor device 10W in embodiment 20 according to the present invention. Referring to FIG. 208, a conductive film for the upper electrode 240W is formed on the entirety of the substrate shown in FIG. 206, and patterning is performed as shown in FIG. 207 by photolithography and etching to form the upper electrode 240W.

FIG. 209 and FIG. 210 are respectively a plan view and a cross-sectional view showing a step of forming the opening 239W in the insulating layer 230W and the underlying insulating layer 110W in the manufacturing method of the semiconductor device 10W in embodiment 20 according to the present invention. Referring to FIG. 210, the substrate shown in FIG. 208 is subjected to photolithography and etching to form the opening 239W in the insulating layer 230W such that a recessed portion is formed in the underlying insulating layer 110W. The opening 239W has a pattern shown in FIG. 209. Specifically, the etching is performed by use of a resist masking a portion of the insulating layer 230W that is exposed from the upper electrode 140W but does not include a region in which the opening 239W is to be formed. In FIG. 209 and FIG. 210, an assembly of the opening provided in the insulating layer 230W and the opening provided in the lower electrode 220W is represented as the opening 239W. The etching for forming the opening 239W is performed under the same conditions as those for the opening 139W.

FIG. 211 and FIG. 212 are respectively a plan view and a cross-sectional view showing a step of forming the oxide semiconductor layer 260W in the manufacturing method of the semiconductor device 10W in embodiment 20 according to the present invention. Referring to FIG. 212, a film for the oxide semiconductor layer 260W is formed on the entirety of the substrate shown in FIG. 210, and patterning is performed as shown in FIG. 211 by photolithography and etching to form the oxide semiconductor layer 260W. The formation of the oxide semiconductor layer 260W by etching may be performed by substantially the same method as in embodiment 1.

FIG. 213 and FIG. 214 are respectively a plan view and a cross-sectional view showing a step of forming the openings 235W, 277W and 238W reaching the lower electrode 220W, the upper electrode 240W and the like in the manufacturing method of the semiconductor device 10W in embodiment 20 according to the present invention. Referring to FIG. 214, a gate insulating layer 270W is formed on the entirety of the substrate shown in FIG. 212, and patterning is performed as shown in FIG. 213 by photolithography and etching to form the openings 235W, 238W and 277W. The etching for forming the openings 235W, 238W and 277W is performed under the same conditions as those for openings 135W and 177W.

A conductive layer for a gate electrode 280W, a source line 290W and a drain line 292W is formed on the entirety of the substrate shown in FIG. 214, and patterning is performed as shown in FIG. 203 and FIG. 204 by photolithography and etching to form the gate electrode 280W, the source line 290W and the drain line 292W. The second transistor 30W of the semiconductor device 10W in embodiment 20 according to the present invention is manufactured by the above-described manufacturing method.

As described above, with the manufacturing method of the semiconductor device 10W in embodiment 20 according to the present invention, the first transistor 20W having a channel length of a nanometer order and the second transistor 30W having a channel length of a micrometer order are formed by the same manufacturing method. In addition, the conductive layers and the insulating layers are etched in separate steps. Therefore, the load on the etching device is alleviated.

Embodiment 21

With reference to FIG. 215 through FIG. 222, an overview of a semiconductor 10X in embodiment 21 according to the present invention will be described. The semiconductor device 10X includes a first transistor 20X having a short channel length and a second transistor 30X having a long channel length. The first transistor 20X having a short channel length has substantially the same structure as that of the semiconductor device 10V in embodiment 19 shown in FIG. 195 and FIG. 196. In the following explanation, the features of the first transistor 20X will not be described, and the second transistor 30X having a long channel length will be described. In the following description, components that are the same as, or have the same functions as, those of the semiconductor device 10V will be represented by the same reference signs (numerals) with alphabets, and detailed descriptions thereof will be omitted.

The second transistor 30X is similar to the second transistor 30W shown in FIG. 203 and FIG. 204, but an opening 235X has a shape different from that of the corresponding opening of the second transistor 30W. In the following explanation, the features of the second transistor 30X that are the same as those of the second transistor 30W will not be described, and the above-described difference will be described.

[Structure of the Second Transistor 30X]

FIG. 215 and FIG. 216 are respectively a plan view and a cross-sectional view showing an overview of the semiconductor device 10X in embodiment 21 according to the present invention. FIG. 216 is taken along line X-X' in FIG. 215. As shown in FIG. 215 and FIG. 216, in the second transistor 30X, a side wall of the opening 235X formed in an insulating layer 230X and a gate insulating layer 270X is stepped as seen in a cross-sectional view. Specifically, in the opening 235X, the opening in the gate insulating layer 270X has a diameter longer than the diameter of the opening in the insulating layer 230X. In other words, a side wall 275X of the gate insulating layer 270X that is exposed to the opening 235X is located on a top surface of the insulating layer 230X, and extends upward from the top surface of the insulating layer 230X. The opening 235X having such a shape is formed by a manufacturing method of the second transistor 30X described below. Specifically, the step of forming the opening in the insulating layer 230X and the step of forming the opening in the gate insulating layer 270X are performed at different timings. As a result, the opening 235X having the shape shown in FIG. 216 is formed.

[Manufacturing Method of the Second Transistor 30X]

With reference to plan views and cross-sectional views provided in FIG. 217 through FIG. 222, a manufacturing method of the second transistor 30X of the semiconductor device 10X in embodiment 21 according to the present invention will be described.

FIG. 217 and FIG. 218 are respectively a plan view and a cross-sectional view showing a step of forming the opening 235X and also openings 239X and 238X in the insulating layer 230X and an underlying insulating layer 110X in the manufacturing method of the semiconductor device 10X in embodiment 21 according to the present invention. A lower electrode 220X and an upper electrode 240X are formed by substantially the same method as shown in FIG. 205 through FIG. 208 regarding embodiment 20. Referring to FIG. 218, the resultant substrate is subjected to photolithography and etching to form the openings 235X, 238X and 239X.

FIG. 219 and FIG. 220 are respectively a plan view and a cross-sectional view showing a step of forming an oxide semiconductor layer 260X in the manufacturing method of the semiconductor device 10X in embodiment 21 according to the present invention. Referring to FIG. 220, a film for the oxide semiconductor layer 260X is formed on the entirety of the substrate shown in FIG. 218, and patterning is performed as shown in FIG. 219 by photolithography and etching to form the oxide semiconductor layer 260X. The oxide semiconductor layer 260X is formed in the opening 239X, and a part of the film for the oxide semiconductor layer 260X that is located in the openings 235X and 238X is etched away. The formation of the oxide semiconductor layer 260X by etching may be performed by substantially the same method as in embodiment 1.

FIG. 221 and FIG. 222 are respectively a plan view and a cross-sectional view showing a step of forming openings exposing the lower electrode 220X, the upper electrode 240X and the like in the manufacturing method of the semiconductor device 10X in embodiment 21 according to the present invention. Referring to FIG. 222, the gate insulating layer 270X is formed on the entirety of the substrate shown in FIG. 220, and patterning is performed as shown in FIG. 221 by photolithography and etching to form openings in regions corresponding to the opening 235X and 238X and to form an opening 277X. The resultant opening 235X exposes the lower electrode 220X, and the opening 277X exposes the upper electrode 240X.

A conductive layer for a gate electrode 280X, a source line 290X and a drain line 292X is formed on the entirety of the substrate shown in FIG. 222, and patterning is performed as shown in FIG. 215 and FIG. 216 by photolithography and etching to form the gate electrode 280X, the source line 290X and the drain line 292X. The second transistor 30X of the semiconductor device 10X in embodiment 21 according to the present invention is manufactured by the above-described manufacturing method.

As described above, with the manufacturing method of the semiconductor device 10X in embodiment 21 according to the present invention, the first transistor 20X having a channel length of a nanometer order and the second transistor 30X having a channel length of a micrometer order are formed by the same manufacturing method. In addition, the conductive layers and the insulating layers are etched in separate steps. Therefore, the load on the etching device is alleviated.

Embodiment 22

With reference to FIG. 223 through FIG. 234, an overview of a semiconductor 10Y in embodiment 22 according to the present invention will be described.

[Structure of the Semiconductor Device 10Y]

FIG. 223 and FIG. 224 are respectively a plan view and a cross-sectional view showing an overview of the semiconductor device 10Y in embodiment 22 according to the present invention. FIG. 224 is taken along line Y-Y' in FIG. 223. As shown in FIG. 223 and FIG. 224, the semiconductor device 10Y includes a substrate 100Y, an underlying insulating layer 110Y, a lower electrode 120Y, an insulating layer 130Y, an upper electrode 140Y, an insulating layer 150Y, an oxide semiconductor layer 160Y, a gate insulating layer 170Y, a gate electrode 180Y, a source line 190Y, and a drain line 192Y.

An opening 139Y is provided in the lower electrode 120Y, the insulating layer 130Y, the upper electrode 140Y and the insulating layer 150Y, and reaches the inside of the underlying insulating layer 110Y. As shown in FIG. 224, the underlying insulating layer 110Y has a recessed portion in a region exposed by the opening 139Y. In other words, the opening 139Y is formed in a part of the underlying insulating layer 110Y, and a bottom surface of the opening 139Y is located on the side of the substrate 100Y with respect to an interface between the lower electrode 120Y and the insulating layer 130Y. An opening 135Y is provided in the insulating layers 130Y and 150Y and the gate insulating layer 170Y, and reaches the lower electrode 120Y. An opening 157Y is provided in the insulating layer 150Y and the gate insulating layer 170Y, and reaches the upper electrode 140Y.

The underlying insulating layer 110Y is located on the substrate 100Y. The lower electrode 120Y is located on the underlying insulating layer 110Y. The insulating layer 130Y is located on the lower electrode 120Y and on the underlying insulating layer 110Y. The upper electrode 140Y is located on the insulating layer 130Y. The insulating layer 150Y is located on the upper electrode 140Y and on the insulating layer 130Y. In the opening 139Y, the lower electrode 120Y has an electrode side wall 322Y, the insulating layer 130Y has an insulating layer side wall 132Y, the upper electrode 140Y has an electrode side wall 142Y, and the insulating layer 150Y has an insulating layer side wall 152Y.

The oxide semiconductor layer 160Y is located in the opening 139Y, and is connected with the lower electrode 120Y and the upper electrode 140Y. In more detail, the oxide semiconductor layer 160Y is located in the recessed portion in the underlying insulating layer 110Y, on the electrode side wall 322Y, on the insulating layer side wall 132Y, on the electrode side wall 142Y, and on the insulating layer side wall 152Y. The oxide semiconductor layer 160Y is in contact with the electrode side wall 322Y, of the lower electrode 120Y, exposed to the opening 139Y and thus is connected with the lower electrode 120Y, and is in contact with the electrode side wall 142Y in the opening 139Y and thus is connected with the upper electrode 140Y. In FIG. 224, the oxide semiconductor layer 160Y extends continuously from the insulating layer side wall 152Y to a top surface of the insulating layer 150Y. Namely, the oxide semiconductor layer 160Y is located on the insulating layer 150Y.

As shown in FIG. 223, the insulating layer side wall 132Y has a closed quadrangular shape along the shape of the opening 139Y. Similar to the insulating layer side wall 132Y, the electrode side walls 322Y and 142Y and the insulating layer side wall 152Y each have a closed quadrangular shape along the shape of the opening 139Y.

The gate electrode 180Y is located to face the oxide semiconductor layer 160Y. The gate insulating layer 170Y is located between the oxide semiconductor layer 160Y and the gate electrode 180Y. In the semiconductor device 10Y, a portion of the oxide semiconductor layer 160Y that is located on the insulating layer side wall 132Y acts as a channel. Therefore, the gate electrode 180Y is located to face at least the portion of the oxide semiconductor layer 160Y that is located on the insulating layer side wall 132Y. A top surface of the gate insulating layer 170Y at the bottom of the opening 139Y is located on the side of the underlying insulating layer 110Y with respect to the interface between the lower electrode 120Y and the insulating layer 130Y.

The source line 190Y is connected with the lower electrode 120Y via the opening 135Y. The drain line 192Y is connected with the upper electrode 140Y via the opening 157Y. The source line 190Y and the drain line 192Y may be replaced with each other. Namely, the line 190Y may act as the drain line, whereas the line 192Y may act as the source line. As shown in FIG. 224, the source line 190Y and the drain line 192Y form the same layer with the gate electrode 180Y. It should be noted that the source line 190Y and the drain line 192Y may form a layer different from that of the gate electrode 180Y.

[Shapes of the Insulating Layer Side Walls 132Y and 152Y and the Electrode Side Walls 142Y and 322Y]

Now, the shapes of the insulating layer side walls 132Y and 152Y and the electrode side walls 142Y and 322Y will be described in detail. As shown in FIG. 224, the insulating layer side walls 132Y and 152Y and the electrode side walls 142Y and 322Y are all forward-tapered. The tapered shapes of the insulating layer side walls 132Y and 152Y and the electrode side walls 142Y and 322Y are continuous with each other. Namely, in a region in the vicinity of the opening 139Y, a top surface of the underlying insulating layer 110Y is covered with the lower electrode 120Y, a top surface of the lower electrode 120Y is covered with the insulating layer 130Y, a top surface of the insulating layer 130Y is covered with the upper electrode 140Y, and a top surface of the upper electrode 140Y is covered with the insulating layer 150Y. It should be noted that the tapered shapes of these side walls do not need to be continuous with each other. For example, the opening in the insulating layer 130Y may have a diameter longer than the diameter of the opening in the lower electrode 120Y, so that the top surface of the lower electrode 120Y is exposed from the insulating layer 130Y. The tapered insulating layer side walls 132Y and 152Y and the tapered electrode side walls 142Y and 322Y may have different tapering angles from each other.

In the example shown in FIG. 224, the forward-tapered insulating layer side wall 132Y is linear as seen in a cross-sectional view. The insulating layer side wall 132Y is not limited to having such a structure. The forward-tapered insulating layer side wall 132Y may be, for example, curved as protruding outward or curved as protruding inward. Instead of being forward-tapered, namely, instead of tending to open upward, the insulating layer side wall 132Y may be vertical with respect to the top surface of the insulating layer 130Y, or may be reverse-tapered, namely, may incline while tending to open downward. The electrode side walls 142Y and 322Y and the insulating layer side wall 152Y may have substantially the same shape as described above. The insulating layer side walls 132Y and 152Y and the electrode side walls 142Y and 322Y may have the same shape as, or different shapes from, each other.

[Materials of the Components of the Semiconductor Device 10Y]

The substrate 100Y, the underlying insulating layer 110Y, the lower electrode 120Y, the insulating layer 130Y, the upper electrode 140Y, the insulating layer 150Y, the oxide semiconductor layer 160Y, the gate insulating layer 170Y, the gate electrode 180Y, the source line 190Y and the drain line 192Y may be formed of any of the same materials as described above in embodiment 1.

As described above, the semiconductor device 10Y in embodiment 22 according to the present invention has the channel length thereof controlled by a nanometer order like in embodiment 1. As a result, the semiconductor device 10Y increases the on-current thereof, and suppresses the in-plane variance in the channel length thereof. Like in embodiment 14, the semiconductor device 10Y also suppresses the properties of the oxide semiconductor layer 160Y from being changed in a region where the oxide semiconductor layer 160Y and the lower electrode 120Y contact each other and in a region where the oxide semiconductor layer 160Y and the upper electrode 140Y contact each other. In addition, the oxide semiconductor layer 160Y and the gate insulating layer 170Y in the channel region each have a uniform thickness. A region where a line forming the same layer with the upper electrode 140Y and a line forming the same layer with the gate electrode 180Y cross each other has merely a small parasitic capacitance.

[Operation of the Semiconductor Device 10Y]

An operation of the semiconductor device 10Y shown in FIG. 223 and FIG. 224 is substantially the same as the operation of the semiconductor device 10 shown in FIG. 1 and FIG. 2, and thus will not be described in detail. In the semiconductor device 10Y also, a gate voltage is applied to the gate electrode 180Y, a source voltage is applied to the source line 190Y connected with the lower electrode 120Y, and a drain voltage is applied to the drain line 192Y connected with the upper electrode 140Y. It should be noted that the source voltage and the drain voltage may be applied oppositely. In other words, the lower electrode 120Y is one of the source electrode and the drain electrode of a transistor having a channel formed of the oxide semiconductor layer 160Y, and the upper electrode 140Y is the other of the source electrode and the drain electrode of the transistor having the channel formed of the oxide semiconductor layer 160Y.

[Manufacturing Method of the Semiconductor Device 10Y]

With reference to plan views and cross-sectional views provided in FIG. 225 through FIG. 234, a manufacturing method of the semiconductor device 10Y in embodiment 22 according to the present invention will be described.

FIG. 225 and FIG. 226 are respectively a plan view and a cross-sectional view showing a step of forming the lower electrode 120Y in the manufacturing method of the semiconductor device 10Y in embodiment 22 according to the present invention. Referring to FIG. 226, the underlying insulating layer 110Y and a conductive film for the lower electrode 120Y are formed on the substrate 100Y, and patterning is performed as shown in FIG. 225 by photolithography and etching to form the lower electrode 120Y. On the lower electrode 120Y formed as a result of the patterning, the insulating layer 130Y is formed.

FIG. 227 and FIG. 228 are respectively a plan view and a cross-sectional view showing a step of forming the upper electrode 140Y in the manufacturing method of the semiconductor device 10Y in embodiment 22 according to the present invention. Referring to FIG. 228, a conductive film for the upper electrode 140Y is formed on the entirety of the substrate shown in FIG. 226, and patterning is performed as shown in FIG. 227 by photolithography and etching to form the upper electrode 140Y. On the upper electrode 140Y formed as a result of the patterning, the insulating layer 150Y is formed.

FIG. 229 and FIG. 230 are respectively a plan view and a cross-sectional view showing a step of forming the opening 139Y in the lower electrode 120Y, the upper electrode 140Y, the insulating layers 130Y and 150Y and the underlying insulating layer 110Y in the manufacturing method of the semiconductor device 10Y in embodiment 22 according to the present invention. Referring to FIG. 230, the substrate shown in FIG. 228 is subjected to photolithography and etching to form the opening 139Y in the insulating layer 150Y, the upper electrode 140Y, the insulating layer 130Y and the lower electrode 120Y such that the recessed portion is formed in the underlying insulating layer 110Y. The opening 139Y has a pattern shown in FIG. 229. As a result of the formation of the opening 139Y, the insulating layer side walls 132Y and 152Y and the electrode side walls 142Y and 322Y are formed.

The etching conditions on the insulating layer 150Y, the upper electrode 140Y, the insulating layer 130Y, the lower electrode 120Y and the underlying insulating layer 110Y be the same, so that the opening 139Y is formed in the insulating layer 150Y, the upper electrode 140Y, the insulating layer 130Y, the lower electrode 120Y and the underlying insulating layer 110Y at the same time. Alternatively, the etching conditions on the insulating layer 150Y, the upper electrode 140Y, the insulating layer 130Y, the lower electrode 120Y and the underlying insulating layer 110Y may be different from each other. The etching method for forming the insulating layer side walls 132Y and 152Y and the electrode side walls 142Y and 322Y to be tapered may be substantially the same as described above regarding the insulating layer side wall 132 in embodiment 1.

With the method shown in FIG. 230, the opening 139Y is formed such that the bottom surface of the opening 139Y is located in the underlying insulating layer 110Y. The opening 139Y is not limited to being formed by such a method. For example, as shown in FIG. 184B, the opening 139Y may be formed such that the bottom surface of the opening 139Y is located in the lower electrode 120Y. Alternatively, the opening 139Y may be formed such that the bottom surface of the opening 139Y reaches the substrate 100Y.

FIG. 231 and FIG. 232 are respectively a plan view and a cross-sectional view showing a step of forming the oxide semiconductor layer 160Y in the manufacturing method of the semiconductor device 10Y in embodiment 22 according to the present invention. Referring to FIG. 232, a film for the oxide semiconductor layer 160Y is formed on the entirety of the substrate shown in FIG. 230, and patterning is performed as shown in FIG. 231 by photolithography and etching to form the oxide semiconductor layer 160Y. The formation of the oxide semiconductor layer 160Y by etching may be performed by substantially the same method as in embodiment 1.

FIG. 233 and FIG. 234 are respectively a plan view and a cross-sectional view showing a step of forming the openings 135Y and 157Y respectively reaching the lower electrode 120Y and the upper electrode 140Y in the manufacturing method of the semiconductor device 10Y in embodiment 22 according to the present invention. Referring to FIG. 234, the gate insulating layer 170Y is formed on the entirety of the substrate shown in FIG. 232, and patterning is performed as shown in FIG. 233 by photolithography and etching to form the openings 135Y and 157Y.

A conductive layer for the gate electrode 180Y, the source line 190Y and the drain line 192Y is formed on the entirety of the substrate shown in FIG. 234, and patterning is performed as shown in FIG. 223 and FIG. 224 by photolithography and etching to form the gate electrode 180Y, the source line 190Y and the drain line 192Y. The semiconductor device 10Y in embodiment 22 according to the present invention is manufactured by the above-described manufacturing method.

As described above, with the manufacturing method of the semiconductor device 10Y in embodiment 22 according to the present invention, the thickness of the insulating layer 130Y, the tapering angle of the insulating layer side wall 132Y, or both of the thickness of the insulating layer 130Y and the tapering angle of the insulating layer side wall 132Y are controllable by a nanometer order. Therefore, the channel length of the semiconductor device 10Y is controllable by a nanometer order. As a result, the variance in the channel length is suppressed to a nanometer order. In addition, the oxide semiconductor layer 160Y and the gate insulating layer 170Y formed on the insulating layer side wall 132Y each have a uniform thickness.

Embodiment 23

With reference to FIG. 235 through FIG. 246, an overview of a semiconductor 10Z in embodiment 23 according to the present invention will be described. The semiconductor device 10Z is similar to the semiconductor device 10Y shown in FIG. 223 and FIG. 224, but openings 135Z and 137Z have shapes different from those of the corresponding openings of the semiconductor device 10Y. In the following explanation, the features of the semiconductor device 10Z that are the same as those of the semiconductor device 10Y will not be described, and the above-described differences will be described. In the following description, components that are the same as, or have the same functions as, those of the semiconductor device 10Y will be represented by the same reference signs (numerals) with alphabets, and detailed descriptions thereof will be omitted.

[Structure of the Semiconductor Device 10Z]

FIG. 235 and FIG. 236 are respectively a plan view and a cross-sectional view showing an overview of the semiconductor device 10Z in embodiment 23 according to the present invention. FIG. 236 is taken along line Z-Z' in FIG. 235. As shown in FIG. 235 and FIG. 236, in the semiconductor device 10Z, the openings 135Z and 137Z reach the inside of an underlying insulating layer 110Z. A contact pad 122Z is located in a region corresponding to the opening 137Z, and the opening 137Z passes through the contact pad 122Z.

A side wall of the opening 135Z and a side wall of the opening 137Z are stepped as seen in a cross-sectional view. Specifically, in each of the openings 135Z and 137Z, the opening in a gate insulating layer 170Z has a diameter longer than the diameter of the opening in an insulating layer 150Z. In other words, side walls 175Z and 177Z of the gate insulating layer 170Z respectively exposed to the openings 135Z and 137Z are located on a top surface of the insulating layer 150Z, and extend upward from the top surface of the insulating layer 150Z. The openings 135Z and 137Z having such a shape are formed by a manufacturing method of the semiconductor device 10Z described below. Specifically, the step of forming the openings in the insulating layer 150Z and the step of forming the openings in the gate insulating layer 170Z are performed at different timings. As a result, the openings 135Z and the 137Z having the shapes shown in FIG. 236 are formed.

As described above, the semiconductor device 10Z in embodiment 23 according to the present invention increases the on-current thereof, and suppresses the in-plane variance in the channel length thereof. The semiconductor device 10Z also suppresses the properties of an oxide semiconductor layer 160Z from being changed. In addition, a region where a line forming the same layer with the upper electrode 140Z and a line forming the same layer with a gate electrode 180Z cross each other has merely a small parasitic capacitance. A drain electrode of the semiconductor device 10Z is connectable with at least one of a line forming the same layer with the lower electrode 120Z and the contact pad 122Z, a line forming the same layer with the upper electrode 140Z, and a line forming the same layer with the drain line 192Z. Thus, the degree of freedom of line layout is improved.

[Manufacturing Method of the Semiconductor Device 10Z]

With reference to plan views and cross-sectional views provided in FIG. 237 through FIG. 246, a manufacturing method of the semiconductor device 10Z in embodiment 23 according to the present invention will be described.

FIG. 237 and FIG. 238 are respectively a plan view and a cross-sectional view showing a step of forming the lower electrode 120Z and the contact pad 122Z in the manufacturing method of the semiconductor device 10Z in embodiment 23 according to the present invention. Referring to FIG. 238, the underlying insulating layer 110Z is formed on a substrate 100Z. A conductive film for the lower electrode 120Z and the contact pad 122Z is formed thereon, and patterning is performed as shown in FIG. 237 by photolithography and etching to form the lower electrode 120Z and the contact pad 122Z. On the lower electrode 120Z and the contact pad 122Z formed as a result of the patterning, the insulating layer 130Z is formed.

FIG. 239 and FIG. 240 are respectively a plan view and a cross-sectional view showing a step of forming the upper electrode 140Z in the manufacturing method of the semiconductor device 10Z in embodiment 23 according to the present invention. Referring to FIG. 240, a conductive film for the upper electrode 140Z is formed on the entirety of the substrate shown in FIG. 238, and patterning is performed as shown in FIG. 239 by photolithography and etching to form the upper electrode 140Z. On the upper electrode 140Z formed as a result of the patterning, the insulating layer 150Z is formed.

FIG. 241 and FIG. 242 are respectively a plan view and a cross-sectional view showing a step of forming the openings 135Z and 137Z and an opening 139Z in the lower electrode 120Z, the upper electrode 140Z, the insulating layers 130Z and 150Z, and the underlying insulating layer 110Z in the manufacturing method of the semiconductor device 10Z in embodiment 23 according to the present invention. Referring to FIG. 242, the substrate shown in FIG. 240 is subjected to photolithography and etching to form the opening 135Z in the insulating layers 130Z and 150Z, and the lower electrode 120Z such that a recessed portion is formed in the underlying insulating layer 110Z, to form the opening 137Z, the upper electrode 140Z, the insulating layers 130Z and 150Z, and the contact pad 122Z such that a recessed portion is formed in the underlying insulating layer 110Z, and to form the opening 139Z, the upper electrode 140Z, the insulating layers 130Z and 150Z, and the lower electrode 120Z such that a recessed portion is formed in the underlying insulating layer 110Z. The openings 135Z, 137Z and 139Z have patterns shown in FIG. 241.

As a result of the formation of the opening 139Z, an electrode side wall 322Z of the lower electrode 120Z, an insulating layer side wall 132Z of the insulating layer 130Z, an electrode side wall 142Z of the upper electrode 140Z, and an insulating layer side wall 152Z of the insulating layer 152Z are formed. The etching conditions on the upper electrode 140Z, the insulating layers 130Z and 150Z and the lower electrode 120Z (or the contact pad 122Z) may be the same, so that the openings 135Z, 137Z and 139Z are formed in the upper electrode 140Z, the insulating layers 130Z and 150Z and the lower electrode 120Z (or the contact pad 122Z) at the same time. Alternatively, the etching conditions on the upper electrode 140Z, the insulating layers 130Z and 150Z and the lower electrode 120Z (or the contact pad 122Z) may be different from each other.

FIG. 243 and FIG. 244 are respectively a plan view and a cross-sectional view showing a step of forming the oxide semiconductor layer 160Z in the manufacturing method of the semiconductor device 10Z in embodiment 23 according to the present invention. Referring to FIG. 244, a film for the oxide semiconductor layer 160Z is formed on the entirety of the substrate shown in FIG. 242, and patterning is performed as shown in FIG. 243 by photolithography and etching to form the oxide semiconductor layer 160Z. The oxide semiconductor layer 160Z is formed in the opening 139Z, and a part of the film for the oxide semiconductor layer 160Z that is located in the openings 135Z and 137Z is etched away. The formation of the oxide semiconductor layer 160Z by etching may be performed by substantially the same method as in embodiment 1.

FIG. 245 and FIG. 246 are respectively a plan view and a cross-sectional view showing a step of forming openings exposing the lower electrode 120Z, the upper electrode 140Z and the like in the manufacturing method of the semiconductor device 10Z in embodiment 23 according to the present invention. Referring to FIG. 246, the gate insulating layer 170Z is formed on the entirety of the substrate shown in FIG. 244, and is patterned as shown in FIG. 245 by photolithography and etching to form openings in regions corresponding to the openings 135Z and 137Z. The resultant opening 135Z exposes a side wall of the lower electrode 120Z, and the resultant opening 137Z exposes a side wall of the upper electrode 140Z and a side wall of the contact pad 122Z.

A conductive layer for the gate electrode 180Z, a source line 190Z and a drain line 192Z is formed on the entirety of the substrate shown in FIG. 246, and patterning is performed as shown in FIG. 235 and FIG. 236 by photolithography and etching to form the gate electrode 180Z, the source line 190Z and the drain line 192Z. The semiconductor device 10Z in embodiment 23 according to the present invention is manufactured by the above-described manufacturing method.

As described above, with the manufacturing method of the semiconductor device 10Z in embodiment 23 according to the present invention, the channel length of the semiconductor device 10Z is controllable by a nanometer order. As a result, the variance in the channel length is suppressed to a nanometer order. In addition, the provision of the contact pad 122Z suppresses the underlying insulating layer 110Z at the bottom of the opening 137Z from being excessively etched at the time of formation of the opening 137Z. The oxide semiconductor layer 160Z and the gate insulating layer 170Z formed on the insulating layer side wall 132Z each have a uniform thickness.

Embodiment 24

With reference to FIG. 247 through FIG. 258, an overview of a semiconductor 10AA in embodiment 24 according to the present invention will be described. The semiconductor device 10AA includes a first transistor 20AA having a short channel length and a second transistor 30AA having a long channel length. The first transistor 20AA having a short channel length has substantially the same structure as that of the semiconductor device 10Y in embodiment 22 shown in FIG. 223 and FIG. 224. In the following explanation, the features of the first transistor 20AA will not be described, and the second transistor 30AA having a long channel length will be described. In the following description, components that are the same as, or have the same functions as, those of the semiconductor device 10Y will be represented by the same reference signs (numerals) with alphabets, and detailed descriptions thereof will be omitted.

[Structure of the Second Transistor 30AA]

FIG. 247 and FIG. 248 are respectively a plan view and a cross-sectional view showing an overview of the semiconductor device 10AA in embodiment 24 according to the present invention. FIG. 248 is taken along line AA-AA' in FIG. 247. As shown in FIG. 247 and FIG. 248, the second transistor 30AA includes a substrate 100AA, an underlying insulating layer 110AA, a lower electrode 220AA, a back gate 222AA, a contact pad 224AA, an insulating layer 230AA, an upper electrode 240AA, an insulating layer 250AA, an oxide semiconductor layer 260AA, a gate insulating layer 270AA, a gate electrode 280AA, a source line 290AA, and a drain line 292AA. The substrate 100AA and the underlying insulating layer 110AA are common to the first transistor 20AA and the second transistor 30AA, and extend continuously in the first transistor 20AA and the second transistor 30AA.

An opening 235AA is provided in the insulating layers 230AA and 250AA and the gate insulating layer 270AA, and reaches the lower electrode 220AA. An opening 239AA is provided in the insulating layers 230AA and 250AA and the lower electrode 220AA, and has a recessed portion in the underlying insulating layer 110AA. An opening 236AA is provided in the upper electrode 240AA, the insulating layers 230AA and 250AA and the contact pad 224AA, and has a recessed portion in the underlying insulating layer 110AA. An opening 257AA is provided in the insulating layer 250AA and the gate insulating layer 270AA, and reaches the upper electrode 240AA.

The lower electrode 220AA, the back gate 222AA and the contact pad 224AA are located on the underlying insulating layer 110AA. The insulating layer 230AA is located on the lower electrode 220AA, on the back gate 222AA, on the contact pad 224AA, and on the underlying insulating layer 110AA. The upper electrode 240AA is located on the insulating layer 230AA, and is isolated from the lower electrode 220AA as seen in a plan view. The insulating layer 250AA is located on the upper electrode 240AA and on the insulating layer 230AA. The oxide semiconductor layer 260AA is located on the insulating layer 250AA in a region between the lower electrode 220AA and the upper electrode 240AA. The oxide semiconductor layer 260AA is connected with the lower electrode 220AA via the opening 239AA, and is connected with the upper electrode 240AA via the opening 236AA. The oxide semiconductor layer 260AA is also connected with the contact pad 224AA via the opening 236AA.

The back gate 222AA faces the oxide semiconductor layer 260AA while having the insulating layers 230AA and 250AA therebetween. In other words, the back gate 222AA is located on the side opposite to the gate electrode 280AA with respect to the oxide semiconductor layer 260AA in at least a part of a region where the oxide semiconductor layer 260AA and the gate electrode 280AA face each other. The insulating layers 230AA and 250AA are located between the oxide semiconductor layer 260AA and the back gate 222AA. The back gate 222AA may be omitted.

The gate electrode 280AA is located to face the oxide semiconductor layer 260AA in a region between the lower electrode 220AA and the upper electrode 240AA. The gate insulating layer 270AA is located between the oxide semiconductor layer 260AA and the gate electrode 280AA. In the second transistor 30AA, a portion of the oxide semiconductor layer 260AA that is located in the region between the lower electrode 220AA and the upper electrode 240AA acts as a channel.

The source line 290AA is connected with the lower electrode 220AA via the opening 235AA. The drain line 292AA is connected with the upper electrode 240AA via the opening 257AA. The source line 290AA and the drain line 292AA may be replaced with each other. Namely, the line 290AA may act as the drain line, whereas the line 292AA may act as the source line.

Now, the relationship between the first transistor 20AA and the second transistor 30AA regarding each of the components thereof will be described. The lower electrode 220AA, the back gate 222AA and the contact pad 224AA form the same layer with a lower electrode 120AA, and are all located in contact with the underlying insulating layer 110AA. The insulating layer 230AA forms the same layer with an insulating layer 130AA, and is continuous with the insulating layer 130AA. Similarly, an upper electrode 140AA and the upper electrode 240AA, an insulating layer 150AA and the insulating layer 250AA, an oxide semiconductor layer 160AA and the oxide semiconductor layer 260AA, a gate insulating layer 170AA and the gate insulating layer 270AA, a gate electrode 180AA and the gate electrode 280AA, a source line 190AA and the source line 290AA, and a drain line 192AA and the drain line 292AA, form the same layer with each other.

[Operation of the Second Transistor 30AA]

An operation of the second transistor 30AA shown in FIG. 247 and FIG. 248 is substantially the same as the operation of the second transistor 30C shown in FIG. 27 and FIG. 28, and thus will not be described in detail. In the second transistor 30AA also, a gate voltage is applied to the gate electrode 280AA, a source voltage is applied to the source line 290AA connected with the lower electrode 220AA, and a drain voltage is applied to the drain line 292AA connected with the upper electrode 240AA. It should be noted that the source voltage and the drain voltage may be applied oppositely. In other words, the lower electrode 220AA is one of the source electrode and the drain electrode of the second transistor 30AA having a channel formed of the oxide semiconductor layer 260AA, and the upper electrode 240AA is the other of the source electrode and the drain electrode of the second transistor 30AA having the channel formed of the oxide semiconductor layer 260AA. The back gate 222AA is supplied with an assisting gate voltage independent from the gate voltage to control the threshold value (Vth) of the second transistor 30AA.

[Manufacturing Method of the Second Transistor 30AA]

With reference to plan views and cross-sectional views provided in FIG. 249 through FIG. 258, a manufacturing method of the second transistor 30AA of the semiconductor device 10AA in embodiment 24 according to the present invention will be described. The manufacturing method of the first transistor 20AA is substantially the same as that of the semiconductor device 10Y in embodiment 22, and will not be described here.

FIG. 249 and FIG. 250 are respectively a plan view and a cross-sectional view showing a step of forming the lower electrode 220AA, the back gate 222AA and the contact pad 224AA in the manufacturing method of the semiconductor device 10AA in embodiment 24 according to the present invention. Referring to FIG. 250, the underlying insulating layer 110AA is formed on the substrate 100AA. A conductive film for the lower electrode 220AA, the back gate 222AA and the contact pad 224AA is formed thereon, and patterning is performed as shown in FIG. 249 by photolithography and etching to form the lower electrode 220AA, the back gate 222AA and the contact pad 224AA. On the lower electrode 220AA, the back gate 222AA and the contact pad 224AA formed as a result of the patterning, the insulating layer 230AA is formed. The etching for forming the lower electrode 220AA, the back gate 222AA and the contact pad 224AA is performed under the same conditions as those for the lower electrode 120AA.

FIG. 251 and FIG. 252 are respectively a plan view and a cross-sectional view showing a step of forming the upper electrode 240AA in the manufacturing method of the semiconductor device 10AA in embodiment 24 according to the present invention. Referring to FIG. 252, a conductive film for the upper electrode 240AA is formed on the entirety of the substrate shown in FIG. 250, and patterning is performed as shown in FIG. 251 by photolithography and etching to form the upper electrode 240AA. The etching for forming the upper electrode 240AA is performed under the same conditions as those for the upper electrode 140AA. On the upper electrode 240AA formed as a result of the patterning, the insulating layer 250AA is formed.

FIG. 253 and FIG. 254 are respectively a plan view and a cross-sectional view showing a step of forming the openings 239AA and 236AA in the lower electrode 220AA, the upper electrode 240AA, the insulating layers 230AA and 250AA, and the underlying insulating layer 110AA in the manufacturing method of the semiconductor device 10AA in embodiment 24 according to the present invention. Referring to FIG. 254, the substrate shown in FIG. 252 is subjected to photolithography and etching to form the opening 239AA in the insulating layer 230AA and 250AA, and the lower electrode 220AA such that the recessed portion is formed in the underlying insulating layer 110AA and to form the opening 236AA in the insulating layers 230AA and 250AA, the upper electrode 240AA, and the contact pad 224AA such that the recessed portion is formed in the underlying insulating layer 110AA. The opening 239AA and 236AA have patterns shown in FIG. 253. The etching for forming the openings 236AA and 239AA is performed under the same conditions as those for an opening 139AA.

FIG. 255 and FIG. 256 are respectively a plan view and a cross-sectional view showing a step of forming the oxide semiconductor layer 260AA in the manufacturing method of the semiconductor device 10AA in embodiment 24 according to the present invention. Referring to FIG. 256, a film for the oxide semiconductor layer 260AA is formed on the entirety of the substrate shown in FIG. 254, and patterning is performed as shown in FIG. 255 by photolithography and etching to form the oxide semiconductor layer 260AA. The formation of the oxide semiconductor layer 260AA by etching may be performed by substantially the same method as in embodiment 1.

FIG. 257 and FIG. 258 are respectively a plan view and a cross-sectional view showing a step of forming openings 235AA and 257AA and also an opening 238AA reaching the lower electrode 220AA, the upper electrode 240AA and the like in the manufacturing method of the semiconductor device 10AA in embodiment 24 according to the present invention. Referring to FIG. 258, the gate insulating layer 270AA is formed on the entirety of the substrate shown in FIG. 256, and patterning is performed as shown in FIG. 257 by photolithography and etching to form the openings 235AA, 238AA and 257AA. The etching for forming the openings 235AA, 238AA and 257AA is performed under the same conditions as those for openings 135AA and 157AA.

A conductive layer for the gate electrode 280AA, the source line 290AA and the drain line 292AA is formed on the entirety of the substrate shown in FIG. 258, and patterning is performed as shown in FIG. 247 and FIG. 248 by photolithography and etching to form the gate electrode 280AA, the source line 290AA and the drain line 292AA. The second transistor 30AA of the semiconductor device 10AA in embodiment 24 according to the present invention is manufactured by the above-described manufacturing method.

As described above, with the manufacturing method of the semiconductor device 10AA in embodiment 24 according to the present invention, the first transistor 20AA having a channel length of a nanometer order and the second transistor 30AA having a channel length of a micrometer order are formed by the same manufacturing method.

Embodiment 25

With reference to FIG. 259 through FIG. 268, an overview of a semiconductor 10AB in embodiment 25 according to the present invention will be described. The semiconductor device 10AB includes a first transistor 20AB having a short channel length and a second transistor 30AB having a long channel length. The first transistor 20AB having a short channel length has substantially the same structure as that of the semiconductor device 10Z in embodiment 23. In the following explanation, the features of the first transistor 20AB will not be described, and the second transistor 30AB having a long channel length will be described. In the following description, components that are the same as, or have the same functions as, those of the semiconductor device 10Z will be represented by the same reference signs (numerals) with alphabets, and detailed descriptions thereof will be omitted.

The second transistor 30AB is similar to the second transistor 30AA shown in FIG. 247 and FIG. 248, but openings 235AB and 237AB have shapes different from those of the corresponding openings of the second transistor 30AA. In the following explanation, the features of the second transistor 30AB that are the same as those of the second transistor 30AA will not be described, and the above-described differences will be described.

[Structure of the Second Transistor 30AB]

FIG. 259 and FIG. 260 are respectively a plan view and a cross-sectional view showing an overview of the semiconductor device 10AB in embodiment 25 according to the present invention. FIG. 260 is taken along line AB-AB' in FIG. 259. As shown in FIG. 259 and FIG. 260, in the second transistor 30AB, openings 235AB and 237AB reach the inside of an underlying insulating layer 110AB.

A side wall of the opening 235AB and a side wall of the opening 237AB are stepped as seen in a cross-sectional view. Specifically, in each of the openings 235AB and 237AB, the opening in a gate insulating layer 270AB has a diameter longer than the diameter of the opening in an insulating layer 250AB. In other words, side walls 275AB and 237AB of the gate insulating layer 270AB respectively exposed to the openings 235AB and 237AB are located on a top surface of the insulating layer 250AB, and extend upward from the top surface of the insulating layer 250AB. The openings 235AB and 237AB having such a shape are formed by a manufacturing method of the second transistor 30AB described below. Specifically, the step of forming the openings in the insulating layer 250AB and the step of forming the openings in the gate insulating layer 270AB are performed at different timings. As a result, the openings 235AB and the 237AB having the shapes shown in FIG. 260 are formed.

[Manufacturing Method of the Second Transistor 30AB]

With reference to plan views and cross-sectional views provided in FIG. 261 through FIG. 268, a manufacturing method of the second transistor 30AB of the semiconductor device 10AB in embodiment 25 according to the present invention will be described.

FIG. 261 and FIG. 262 are respectively a plan view and a cross-sectional view showing a step of forming a lower electrode 220AB, a back gate 222AB, a contact pad 224AB and an upper electrode 240AB in the manufacturing method of the semiconductor device 10AB in embodiment 25 according to the present invention. Referring to FIG. 262, the underlying insulating layer 110AB is formed on a substrate 100AB. A conductive film for the lower electrode 220AB, the back gate 222AB and the contact pad 224AB is formed thereon, and patterning is performed as shown in FIG. 261 by photolithography and etching to form the lower electrode 220AB, the back gate 222AB and the contact pad 224AB. The etching for forming the lower electrode 220AB, the back gate 222AB and the contact pad 224AB is performed under the same conditions as those for a lower electrode 120AB and a contact pad 122AB.

On the lower electrode 220AB, the back gate 222AB and the contact pad 224AB formed as a result of the patterning, an insulating layer 230AB is formed. A conductive film for the upper electrode 240AB is formed thereon, and patterning is performed as shown in FIG. 261 by photolithography and etching to form the upper electrode 240AB. On the upper electrode 240AB formed as a result of the patterning, the insulating layer 250AB is formed. The etching for forming the upper electrode 240AB is performed under the same conditions as those for an upper electrode 140AB.

FIG. 263 and FIG. 264 are respectively a plan view and a cross-sectional view showing a step of forming the openings 235AB and 237AB and also openings 236AB, 238AB and 239AB in the lower electrode 220AB, the upper electrode 240AB, the insulating layers 230AB and 250AB, the underlying insulating layer 110AB and the like in the manufacturing method of the semiconductor device 10AB in embodiment 25 according to the present invention. Referring to FIG. 264, the substrate shown in FIG. 262 is subjected to photolithography and etching to form the openings 235AB and 239AB in the insulating layers and 230AB and 250AB and the lower electrode 220AB such that a recessed portion is formed in the underlying insulating layer 110AB, to form the opening 236AB in the upper electrode 240AB, the insulating layers 230AB and 250AB and the contact pad 224AB such that a recessed portion is formed in the underlying insulating layer 110AB, and to form the opening 237AB in the upper electrode 240AB and the insulating layers 230AB and 250AB such that a recessed portion is formed in the underlying insulating layer 110AB. The openings 235AB, 236AB, 237AB, 238AB and 239AB have patterns shown in FIG. 263. The etching for forming the openings 235AB, 236AB, 237AB, 238AB and 239AB is performed under the same conditions as those for openings 135AB, 137AB and 139AB.

FIG. 265 and FIG. 266 are respectively a plan view and a cross-sectional view showing a step of forming an oxide semiconductor layer 260AB in the manufacturing method of the semiconductor device 10AB in embodiment 25 according to the present invention. Referring to FIG. 266, a film for the oxide semiconductor layer 260AB is formed on the entirety of the substrate shown in FIG. 264, and patterning is performed as shown in FIG. 265 by photolithography and etching to form the oxide semiconductor layer 260AB. The oxide semiconductor layer 260AB is formed in the openings 236AB and 239AB, and a part of the film for the oxide semiconductor layer 260AB that is located in the openings 235AB, 237AB and 238AB is etched away. The formation of the oxide semiconductor layer 260AB by etching may be performed by substantially the same method as in embodiment 1.

FIG. 267 and FIG. 268 are respectively a plan view and a cross-sectional view showing a step of forming openings exposing the lower electrode 220AB, the upper electrode 240AB and the like in the manufacturing method of the semiconductor device 10AB in embodiment 25 according to the present invention. Referring to FIG. 268, the gate insulating layer 270AB is formed on the entirety of the substrate shown in FIG. 266, and is patterned as shown in FIG. 267 by photolithography and etching to form the openings in regions corresponding to the openings 235AB, 237AB and 238AB. The resultant opening 235AB exposes a side wall of the lower electrode 220AB, and the resultant opening 237AB exposes a side wall of the upper electrode 240AB. The etching for forming the openings 235AB, 237AB and 238AB in the gate insulating layer 270AB is performed under the same conditions as those for forming the openings 135AB and 137AB in a gate insulating layer 170AB.

A conductive layer for a gate electrode 280AB, a source line 290AB and a drain line 292AB is formed on the entirety of the substrate shown in FIG. 268, and patterning is performed as shown in FIG. 259 and FIG. 260 by photolithography and etching to form the gate electrode 280AB, the source line 290AB and the drain line 292AB. The second transistor 30AB of the semiconductor device 10AB in embodiment 25 according to the present invention is manufactured by the above-described manufacturing method.

As described above, with the manufacturing method of the semiconductor device 10AB in embodiment 25 according to the present invention, the first transistor 20AB having a channel length of a nanometer order and the second transistor 30AB having a channel length of a micrometer order are formed by the same manufacturing method.

Embodiment 26

With reference to FIG. 269 through FIG. 280, an overview of a semiconductor 10AC in embodiment 26 according to the present invention will be described. The semiconductor device 10AC is similar to the semiconductor device 10Y shown in FIG. 223 and FIG. 224, but an opening 139AC has a shape different from that of the opening 139Y of the semiconductor device 10Y. In the following explanation, the features of the semiconductor device 10AC that are the same as those of the semiconductor device 10Y will not be described, and the above-described difference will be described. In the following description, components that are the same as, or have the same functions as, those of the semiconductor device 10Y will be represented by the same reference signs (numerals) with alphabets, and detailed descriptions thereof will be omitted.

FIG. 269 and FIG. 270 are respectively a plan view and a cross-sectional view showing an overview of the semiconductor device 10AC in embodiment 26 according to the present invention. FIG. 270 is taken along line AC-AC' in FIG. 269. As shown in FIG. 269 and FIG. 270, in the semiconductor device 10AC, a side wall of the opening 139AC formed in a lower electrode 120AC, insulating layers 130AC and 150AC and an upper electrode 140AC is stepped as seen in a cross-sectional view. Specifically, in the opening 139AC, the opening in the insulating layer 130AC has a diameter longer than the diameter of the opening in the lower electrode 120AC. In other words, a part of a top surface of the lower electrode 120AC is exposed from the insulating layer 130AC in a region in the vicinity of the opening 139AC. In still other words, a side wall 132AC of the insulating layer 130AC is located on the top surface of the lower electrode 120AC, and extends upward from the top surface of the lower electrode 120AC. In the opening 139AC, the opening in the insulating layer 150AC has a diameter longer than the diameter of the opening in the upper electrode 140AC. In other words, a part of a top surface of the upper electrode 140AC is exposed from the insulating layer 150AC in a region in the vicinity of the opening 139AC. In still other words, a side wall 152AC of the insulating layer 150AC is located on the top surface of the upper electrode 140AC, and extends upward from the top surface of the upper electrode 140AC. The opening 139AC having such a shape is formed by a manufacturing method of the semiconductor device 10AC described below. Specifically, the step of forming the opening in the lower electrode 120AC, the step of forming the opening in the upper electrode 140AC, and the step of forming the opening in the insulating layers 130AC and 150AC are performed at different timings. As a result, the opening 139AC having the shape shown in FIG. 270 is formed.

As described above, the semiconductor device 10AC in embodiment 26 according to the present invention increases the on-current thereof, and suppresses the in-plane variance in the channel length thereof. In addition, the area size of the region where an oxide semiconductor layer 160AC contacts the lower electrode 120AC, and the area size of the region where the oxide semiconductor layer 160AC contacts the upper electrode 140AC, are limited. Therefore, the properties of a large area of the oxide semiconductor layer 160AC is suppressed from being changed in the region where the oxide semiconductor layer 160AC contacts the lower electrode 120AC and the region where the oxide semiconductor layer 160AC contacts the upper electrode 140AC. A region where a line forming the same layer with the upper electrode 140AC and a line forming the same layer with a gate electrode 180AC cross each other has merely a small parasitic capacitance.

[Manufacturing Method of the Semiconductor Device 10AC]

With reference to plan views and cross-sectional views provided in FIG. 271 through FIG. 280, a manufacturing method of the semiconductor device 10AC in embodiment 26 according to the present invention will be described.

FIG. 271 and FIG. 272 are respectively a plan view and a cross-sectional view showing a step of forming the lower electrode 120AC in the manufacturing method of the semiconductor device 10AC in embodiment 26 according to the present invention. Referring to FIG. 272, an underlying insulating layer 110AC and a conductive film for the lower electrode 120AC are formed on a substrate 100AC, and patterning is performed as shown in FIG. 271 by photolithography and etching to form the lower electrode 120AC having the opening enclosed by an electrode side wall 322A. On the lower electrode 120AC formed as a result of the patterning, the insulating layer 130AC is formed.

FIG. 273 and FIG. 274 are respectively a plan view and a cross-sectional view showing a step of forming the upper electrode 140AC in the manufacturing method of the semiconductor device 10AC in embodiment 26 according to the present invention. Referring to FIG. 274, a conductive film for the upper electrode 140AC is formed on the entirety of the substrate shown in FIG. 272, and patterning is performed as shown in FIG. 273 by photolithography and etching to form the upper electrode 140AC having the opening enclosed by an electrode side wall 142AC. The position of the upper electrode 140AC with respect to the lower electrode 120AC is adjusted such that the electrode side wall 142AC encloses the electrode side wall 322AC. On the upper electrode 140AC formed as a result of the patterning, the insulating layer 150AC is formed.

FIG. 275 and FIG. 276 are respectively a plan view and a cross-sectional view showing a step of forming the opening 139AC in the insulating layers 130AC and 150AC and the underlying insulating layer 110AC in the manufacturing method of the semiconductor device 10AC in embodiment 26 according to the present invention. Referring to FIG. 276, the substrate shown in FIG. 274 is subjected to photolithography and etching to form the opening in the insulating layer 150AC by use of a resist as a mask, to form an opening in the insulating layer 130AC by use of the upper electrode 140AC as a mask, and to form a recessed portion in the underlying insulating layer 110AC by use of the lower electrode 120AC as a mask. As a result, the opening 139AC shown in FIG. 275 is formed. Specifically, the etching on the insulating layer 150AC is performed by use of, as a mask, a resist having an opening in positional correspondence with a region enclosed by the insulating layer side wall 152AC. As a result of the etching, a portion of the insulating layer 130AC that is enclosed by the electrode side wall 142AC, and a portion of the underlying insulating layer 110AC that is enclosed by the electrode side wall 322AC, are etched away. Thus, the opening 139AC is formed.

The etching in this step is merely performed on the insulating layers. Therefore, the insulating layers 130AC and 150AC and the underlying insulating layer 110AC are etched at the same time under the same etching conditions. The etching in this step may be performed under the condition that the etching rate ratio of the insulating layers 130AC and 150AC and the underlying insulating layer 110AC with respect to the upper electrode 140AC and the lower electrode 120AC is high. In this step, it is sufficient that the upper electrode 140AC and the lower electrode 120AC are exposed. Therefore, plasma during the etching may be monitored, and the end point of the etching may be set based on a signal caused by the upper electrode 140AC and the lower electrode 120AC and detected in the plasma.

FIG. 277 and FIG. 278 are respectively a plan view and a cross-sectional view showing a step of forming the oxide semiconductor layer 160AC in the manufacturing method of the semiconductor device 10AC in embodiment 26 according to the present invention. Referring to FIG. 278, a film for the oxide semiconductor layer 160AC is formed on the entirety of the substrate shown in FIG. 276, and patterning is performed as shown in FIG. 277 by photolithography and etching to form the oxide semiconductor layer 160AC. The oxide semiconductor layer 160AC is formed in the opening 139AC. The formation of the oxide semiconductor layer 160AC by etching may be performed by substantially the same method as in embodiment 1.

FIG. 279 and FIG. 280 are respectively a plan view and a cross-sectional view showing a step of forming openings 135AC and 157AC respectively reaching the lower electrode 120AC and the upper electrode 140AC in the manufacturing method of the semiconductor device 10AC in embodiment 26 according to the present invention. Referring to FIG. 280, a gate insulating layer 170AC is formed on the entirety of the substrate shown in FIG. 278, and patterning is performed as shown in FIG. 279 by photolithography and etching to form the openings 135AC and 157AC.

A conductive layer for the gate electrode 180AC, a source line 190AC and a drain line 192AC is formed on the entirety of the substrate shown in FIG. 280, and patterning is performed as shown in FIG. 269 and FIG. 270 by photolithography and etching to form the gate electrode 180AC, the source line 190AC and the drain line 192AC. The semiconductor device 10AC in embodiment 26 according to the present invention is manufactured by the above-described manufacturing method.

As described above, with the manufacturing method of the semiconductor device 10AC in embodiment 26 according to the present invention, the conductive layers and the insulating layers are etched in separate steps. Therefore, the load on the etching device is alleviated.

Embodiment 27

With reference to FIG. 281 through FIG. 288, an overview of a semiconductor 10AD in embodiment 27 according to the present invention will be described. The semiconductor device 10AD is similar to the semiconductor device 10AC shown in FIG. 269 and FIG. 170, but openings 135AD and 157AD have shapes different from those of the corresponding openings of the semiconductor device 10AC. In the following explanation, the features of the semiconductor device 10AD that are the same as those of the semiconductor device 10AC will not be described, and the above-described differences will be described. In the following description, components that are the same as, or have the same functions as, those of the semiconductor device 10AC will be represented by the same reference signs (numerals) with alphabets, and detailed descriptions thereof will be omitted.

[Structure of the Semiconductor Device 10AD]

FIG. 281 and FIG. 282 are respectively a plan view and a cross-sectional view showing an overview of the semiconductor device 10AD in embodiment 27 according to the present invention. FIG. 282 is taken along line AD-AD' in FIG. 281. As shown in FIG. 281 and FIG. 282, in the semiconductor device 10AD, a side wall of the opening 135AD formed in insulating layers 130AD and 150AD and a gate insulating layer 170AD, and a side wall of the opening 157AD formed in the insulating layer 150AD and the gate insulating layer 170AD, are stepped as seen in a cross-sectional view. Specifically, in each of the openings 135AD and 157AD, the opening in the gate insulating layer 170AD has a diameter longer than the diameter of the opening in the insulating layer 150AD. In other words, side walls 175AD and 177AD of the gate insulating layer 170AD respectively exposed to the openings 135AD and 157AD are located on a top surface of the insulating layer 150AD, and extend upward from the top surface of the insulating layer 150AD. The openings 135AD and 157AD having such a shape are formed by a manufacturing method of the semiconductor device 10AD described below. Specifically, the step of forming the openings in the insulating layer 150AD and the step of forming the openings in the gate insulating layer 170AD are performed at different timings. As a result, the openings 135AD and the 157AD having the shapes shown in FIG. 282 are formed.

As described above, the semiconductor device 10AD in embodiment 27 according to the present invention increases the on-current thereof, and suppresses the in-plane variance in the channel length thereof. The semiconductor device 10AD also suppresses the properties of an oxide semiconductor layer 160AD from being changed. In addition, a region where a line forming the same layer with the upper electrode 140AD and a line forming the same layer with a gate electrode 180AD cross each other has merely a small parasitic capacitance.

[Manufacturing Method of the Semiconductor Device 10AD]

With reference to plan views and cross-sectional views provided in FIG. 283 through FIG. 288, a manufacturing method of the semiconductor device 10AD in embodiment 27 according to the present invention will be described.

FIG. 283 and FIG. 284 are respectively a plan view and a cross-sectional view showing a step of forming the openings 135AD and 157AD and also an opening 139AD in the insulating layers 130AD and 150AD and an underlying insulating layer 110AD in the manufacturing method of the semiconductor device 10AD in embodiment 27 according to the present invention. The lower electrode 120AD having an electrode side wall 322AD and the upper electrode 140AD having an electrode side wall 142AD are formed by substantially the same method as shown in FIG. 271 through FIG. 274 regarding embodiment 26. Referring to FIG. 284, the resultant substrate is subjected to photolithography and etching to form the openings 135AD, 139AD and 157AD having patterns shown in FIG. 283.

FIG. 285 and FIG. 286 are respectively a plan view and a cross-sectional view showing a step of forming the oxide semiconductor layer 160AD in the manufacturing method of the semiconductor device 10AD in embodiment 27 according to the present invention. Referring to FIG. 286, a film for the oxide semiconductor layer 160AD is formed on the entirety of the substrate shown in FIG. 284, and patterning is performed as shown in FIG. 285 by photolithography and etching to form the oxide semiconductor layer 160AD. The oxide semiconductor layer 160AD is formed in the opening 139AD, and a part of the film for the oxide semiconductor layer 160AD that is located in the openings 135AD and 157AD is etched away. The formation of the oxide semiconductor layer 160AD by etching may be performed by substantially the same method as in embodiment 1.

FIG. 287 and FIG. 288 are respectively a plan view and a cross-sectional view showing a step of forming openings exposing the lower electrode 120AD and the upper electrode 140AD in the manufacturing method of the semiconductor device 10AD in embodiment 27 according to the present invention. Referring to FIG. 288, the gate insulating layer 170AD is formed on the entirety of the substrate shown in FIG. 286, and is patterned as shown in FIG. 287 by photolithography and etching to form openings in regions corresponding to the openings 135AD and 157AD. The resultant opening 135AD exposes the lower electrode 120AD, and the resultant opening 157AD exposes the upper electrode 140AD.

A conductive layer for the gate electrode 180AD, a source line 190AD and a drain line 192AD is formed on the entirety of the substrate shown in FIG. 288, and patterning is performed as shown in FIG. 281 and FIG. 282 by photolithography and etching to form the gate electrode 180AD, the source line 190AD and the drain line 192AD. The semiconductor device 10AD in embodiment 27 according to the present invention is manufactured by the above-described manufacturing method.

As described above, with the manufacturing method of the semiconductor device 10AD in embodiment 27 according to the present invention, the conductive layers and the insulating layers are etched in separate steps. Therefore, the load on the etching device is alleviated.

Embodiment 28

With reference to FIG. 289 through FIG. 300, an overview of a semiconductor 10AE in embodiment 28 according to the present invention will be described. The semiconductor device 10AE includes a first transistor 20AE having a short channel length and a second transistor 30AE having a long channel length. The first transistor 20AE having a short channel length has substantially the same structure as that of the semiconductor device 10C in embodiment 26 shown in FIG. 269 and FIG. 270. In the following explanation, the features of the first transistor 20AE will not be described, and the second transistor 30AE having a long channel length will be described.

The second transistor 30AE is similar to the second transistor 30AA shown in FIG. 247 and FIG. 248, but is different from the second transistor 30AA on the following points. Openings 239AE and 256AE have shapes different from those of the corresponding openings of the second transistor 30AA. The second transistor 30AE does not include a contact pad corresponding to the contact pad 224A in the second transistor 30AA. In the following explanation, the features of the semiconductor device 10AE that are the same as those of the semiconductor device 10AA will not be described, and the above-described differences will be described. In the following description, components that are the same as, or have the same functions as, those of the semiconductor device 10AA will be represented by the same reference signs (numerals) with alphabets, and detailed descriptions thereof will be omitted.

[Structure of the Second Transistor 30AE]

FIG. 289 and FIG. 290 are respectively a plan view and a cross-sectional view showing an overview of the semiconductor device 10AE in embodiment 28 according to the present invention. FIG. 290 is taken along line AE-AE' in FIG. 289. As shown in FIG. 289 and FIG. 290, in the second transistor 30AE, a side wall of the opening 239AE is stepped as seen in a cross-sectional view, like a side wall of an opening 139AE in the first transistor 20AE. The opening 256AE does not pass through an upper electrode 240AE and is provided to expose the upper electrode 240AE from an insulating layer 250AE. An oxide semiconductor layer 260AE is connected with the upper electrode 240AE via the opening 256AE. The second transistor 30AE does not include a contact pad corresponding to the contact pad 224AA in the second transistor 30AA shown in FIG. 248.

[Manufacturing Method of the Second Transistor 30AE]

With reference to plan views and cross-sectional views provided in FIG. 291 through FIG. 300, a manufacturing method of the second transistor 30AE of the semiconductor device 10AE in embodiment 28 according to the present invention will be described. The manufacturing method of the first transistor 20AE is substantially the same as that of the semiconductor device 10AC in embodiment 26, and will not be described here.

FIG. 291 and FIG. 292 are respectively a plan view and a cross-sectional view showing a step of forming a lower electrode 220AE and a back gate 222AE in the manufacturing method of the semiconductor device 10AE in embodiment 28 according to the present invention. Referring to FIG. 292, an underlying insulating layer 110AE is formed on a substrate 100AE. A conductive film for the lower electrode 220AE and the back gate 222AE is formed thereon, and patterning is performed as shown in FIG. 291 by photolithography and etching to form the lower electrode 220AE having an opening 229AE and the back gate 222AE. On the lower electrode 220AE and the back gate 222AE formed as a result of the patterning, an insulating layer 230AE is formed. The etching for forming the lower electrode 220AE and the back gate 222AE is performed under the same conditions as those for a lower electrode 120AE.

FIG. 293 and FIG. 294 are respectively a plan view and a cross-sectional view showing a step of forming the upper electrode 240AE in the manufacturing method of the semiconductor device 10AE in embodiment 28 according to the present invention. Referring to FIG. 294, a conductive film for the upper electrode 240AE is formed on the entirety of the substrate shown in FIG. 292, and patterning is performed as shown in FIG. 293 by photolithography and etching to form the upper electrode 240AE. On the upper electrode 220AE formed as a result of the patterning, the insulating layer 250AE is formed.

FIG. 295 and FIG. 296 are respectively a plan view and a cross-sectional view showing a step of forming the openings 239AE and 256AE in the insulating layers 230AE and 250AE and the underlying insulating layer 110AE in the manufacturing method of the semiconductor device 10AE in embodiment 28 according to the present invention. Referring to FIG. 296, the substrate shown in FIG. 294 is subjected to photolithography and etching to form the opening 239AE in the insulating layers 230AE and 250AE such that a recessed portion is formed in the underlying insulating layer 110AE, and to form the opening 256AE in the insulating layer 250AE to expose the upper electrode 240AE. The openings 239AE and 256AE have patterns shown in FIG. 295. In FIG. 295 and FIG. 296, an assembly of the opening provided in the insulating layers 230AE and 250AE and the opening provided in the lower electrode 220AE is represented as the opening 239AE. The etching for forming the opening 239AE is performed under the same conditions as those for the opening 139AE.

FIG. 297 and FIG. 298 are respectively a plan view and a cross-sectional view showing a step of forming the oxide semiconductor layer 260AE in the manufacturing method of the semiconductor device 10AE in embodiment 28 according to the present invention. Referring to FIG. 298, a film for the oxide semiconductor layer 260AE is formed on the entirety of the substrate shown in FIG. 296, and patterning is performed as shown in FIG. 297 by photolithography and etching to form the oxide semiconductor layer 260AE. The formation of the oxide semiconductor layer 260AE by etching may be performed by substantially the same method as in embodiment 1.

FIG. 299 and FIG. 300 are respectively a plan view and a cross-sectional view showing a step of forming openings 235AE, 257AE and 238AE reaching the lower electrode 220AE, the upper electrode 240AE and the like in the manufacturing method of the semiconductor device 10AE in embodiment 28 according to the present invention. Referring to FIG. 300, a gate insulating layer 270AE is formed on the entirety of the substrate shown in FIG. 298, and patterning is performed as shown in FIG. 299 by photolithography and etching to form the openings 235AE, 238AE and 257AE. The etching for forming the openings 235AE, 238AE and 257AE is performed under the same conditions as those for openings 135AE and 157AE.

A conductive layer for a gate electrode 280AE, a source line 290AE and a drain line 292AE is formed on the entirety of the substrate shown in FIG. 300, and patterning is performed as shown in FIG. 289 and FIG. 290 by photolithography and etching to form the gate electrode 280AE, the source line 290AE and the drain line 292AE. The second transistor 30AE of the semiconductor device 10AE in embodiment 28 according to the present invention is manufactured by the above-described manufacturing method.

As described above, with the manufacturing method of the semiconductor device 10AE in embodiment 28 according to the present invention, the first transistor 20AE having a channel length of a nanometer order and the second transistor 30AE having a channel length of a micrometer order are formed by the same manufacturing method. In addition, the conductive layers and the insulating layers are etched in separate steps. Therefore, the load on the etching device is alleviated.

Embodiment 29

With reference to FIG. 301 through FIG. 308, an overview of a semiconductor 10AF in embodiment 29 according to the present invention will be described. The semiconductor device 10AF includes a first transistor 20AF having a short channel length and a second transistor 30AF having a long channel length. The first transistor 20AF having a short channel length has substantially the same structure as that of the semiconductor device 10AD in embodiment 27 shown in FIG. 281 and FIG. 282. In the following explanation, the features of the first transistor 20AF will not be described, and the second transistor 30AF having a long channel length will be described. In the following description, components that are the same as, or have the same functions as, those of the semiconductor device 10AD will be represented by the same reference signs (numerals) with alphabets, and detailed descriptions thereof will be omitted.

The second transistor 30AF is similar to the second transistor 30AE shown in FIG. 289 and FIG. 290, but openings 235AF and 257AF have shapes different from those of the corresponding openings of the second transistor 30AE. In the following explanation, the features of the second transistor 30AF that are the same as those of the second transistor 30AE will not be described, and the above-described differences will be described.

[Structure of the Second Transistor 30AF]

FIG. 301 and FIG. 302 are respectively a plan view and a cross-sectional view showing an overview of the semiconductor device 10AF in embodiment 29 according to the present invention. FIG. 302 is taken along line AF-AF' in FIG. 301. As shown in FIG. 301 and FIG. 302, in the second transistor 30AF, a side wall of the opening 235AF formed in insulating layers 230AF and 250AF and a gate insulating layer 270AF, and a side wall of the opening 257AF formed in the insulating layer 250AF and the gate insulating layer 270AF, are stepped as seen in a cross-sectional view. Specifically, in each of the openings 235AF and 257AF, the opening in the gate insulating layer 270AF has a diameter longer than the diameter of the opening in the insulating layer 250AF. In other words, side walls 275AF and 277AF of the gate insulating layer 270AF respectively exposed to the openings 235AF and 257AF are located on a top surface of the insulating layer 250AF, and extend upward from the top surface of the insulating layer 250AF. The openings 235AF and 257AF having such a shape are formed by a manufacturing method of the second transistor 30AF described below. Specifically, the step of forming the openings in the insulating layer 250AF and the step of forming the openings in the gate insulating layer 270AF are performed at different timings. As a result, the openings 235AF and the 257AF having the shapes shown in FIG. 302 are formed.

[Manufacturing Method of the Second Transistor 30AF]

With reference to plan views and cross-sectional views provided in FIG. 303 through FIG. 308, a manufacturing method of the second transistor 30AF of the semiconductor device 10AF in embodiment 29 according to the present invention will be described.

FIG. 303 and FIG. 304 are respectively a plan view and a cross-sectional view showing a step of forming the openings 235AF and 257AF and openings 239AF, 256AF and 238AF in the insulating layers 230AF and 250AF and an underlying insulating layer 110AF in the manufacturing method of the semiconductor device 10AF in embodiment 29 according to the present invention. A lower electrode 220AF, a back gate 222AF, and an upper electrode 240AF are formed by substantially the same method as shown in FIG. 291 through FIG. 294 regarding embodiment 28. Referring to FIG. 304, the resultant substrate is subjected to photolithography and etching to form the openings 235AF, 238AF, 239AF, 256AF and 257AF having patterns shown in FIG. 303.

FIG. 305 and FIG. 306 are respectively a plan view and a cross-sectional view showing a step of forming an oxide semiconductor layer 260AF in the manufacturing method of the semiconductor device 10AF in embodiment 29 according to the present invention. Referring to FIG. 306, a film for the oxide semiconductor layer 260AF is formed on the entirety of the substrate shown in FIG. 304, and patterning is performed as shown in FIG. 305 by photolithography and etching to form the oxide semiconductor layer 260AF. The oxide semiconductor layer 260AF is formed in the openings 239AF and 256AF, and a part of the film for the oxide semiconductor layer 260AF that is located in the openings 235AF, 238AF and 256AF is etched away. The formation of the oxide semiconductor layer 260AF by etching may be performed by substantially the same method as in embodiment 1.

FIG. 307 and FIG. 308 are respectively a plan view and a cross-sectional view showing a step of forming openings exposing the lower electrode 220AF, the upper electrode 240AF and the like in the manufacturing method of the semiconductor device 10AF in embodiment 29 according to the present invention. Referring to FIG. 308, the gate insulating layer 270AF is formed on the entirety of the substrate shown in FIG. 306, and is patterned as shown in FIG. 307 by photolithography and etching to form the openings in regions corresponding to the openings 235AF, 238AF and 257AF. The resultant opening 235AF exposes the lower electrode 220AF, and the resultant opening 257AF exposes the upper electrode 240AF. The etching for forming the openings 235AF, 257AF and 238AF in the gate insulating layer 270AF is performed under the same conditions as those for forming openings 135AF and 157AF in a gate insulating layer 170AF.

A conductive layer for a gate electrode 280AF, a source line 290AF and a drain line 292AF is formed on the entirety of the substrate shown in FIG. 308, and patterning is performed as shown in FIG. 301 and FIG. 302 by photolithography and etching to form the gate electrode 280AF, the source line 290AF and the drain line 292AF. The second transistor 30AF of the semiconductor device 10AF in embodiment 29 according to the present invention is manufactured by the above-described manufacturing method.

As described above, with the manufacturing method of the semiconductor device 10AF in embodiment 29 according to the present invention, the first transistor 20AF having a channel length of a nanometer order and the second transistor 30AF having a channel length of a micrometer order are formed by the same manufacturing method. In addition, the conductive layers and the insulating layers are etched in separate steps. Therefore, the load on the etching device is alleviated.

Embodiment 30

With reference to FIG. 309 through FIG. 317, an overview of a display device 40 in embodiment 30 according to the present invention will be described. The display device 40 includes main pixels located in a matrix, and each of the main pixels includes a plurality of sub pixels. As a selective transistor of each sub pixel included in the display device 40, any of the semiconductor devices 10 through 10AF described in embodiments 1 through 29 is usable. In this example, the semiconductor device 10E in embodiment 6 shown in FIG. 50 is used as a selective transistor. In embodiment 30, the display device 40 is a liquid crystal display device controlling liquid crystal molecules in a transverse electric field system.

[Layout of the Display Device 40]

FIG. 309 is a plan view showing an overview of the display device 40 in embodiment 30 according to the present invention. As shown in FIG. 309, the display device 40 includes a first sub pixel 410, a second sub pixel 420 and a third sub pixel 430. In the first sub pixel 410, a first pixel electrode 560 is connected with a pad 520, and is connected with a first data line 440 via a first selective transistor 470. In the second sub pixel 420, a second pixel electrode 562 is connected with a pad 522, and is connected with a second data line 450 via a second selective transistor 472. In the third sub pixel 430, a third pixel electrode 564 is connected with a pad 524, and is connected with a third data line 452 via a third selective transistor 474. Gate electrodes of the first selective transistor 470, the second selective transistor 472 and the third selective transistor 474 are all connected with a gate line 460.

The first sub pixel 410, the second sub pixel 420 and the third sub pixel 430 are provided with pixels of different colors. For example, the first sub pixel 410 may correspond to a green pixel, the second sub pixel 420 may correspond to a red pixel, and the third sub pixel 430 may correspond to a blue pixel. There may be four or more sub pixels. As described below, the first data line 440 and the third data line 452 are provided in different layers. Therefore, referring to FIG. 309, the third data line 452, which corresponds to one main pixel, and a first data line 446, which corresponds to a main pixel adjacent thereto, may be located to overlap each other as seen in a plan view.

The above-described structure may be expressed as follows. The display device 40 includes a first sub pixel 410 including the first data line 440 transmitting pixel data on a first color, the first selective transistor 470 including a source electrode and a drain electrode, one of which is connected with the first data line 440, and a first pixel electrode 560 connected with the other of the source electrode and the drain electrode of the first selective transistor 470; a second sub pixel 420 including the second data line 450 transmitting pixel data on a second color, the second selective transistor 472 including a source electrode and a drain electrode, one of which is connected with the second data line 450, and a second pixel electrode 562 connected with the other of the source electrode and the drain electrode of the second selective transistor 472; and a third sub pixel 430 including the third data line 452 transmitting pixel data on a third color, the third selective transistor 474 including a source electrode and a drain electrode, one of which is connected with the third data line 452, and a third pixel electrode 564 connected with the other of the source electrode and the drain electrode of the third selective transistor 474. The first data line 440 is located in a layer different from a layer in which the second data line 450 and the third data line 452 are located.

[Structure of the First Selective Transistor 470]

FIG. 310 is a cross-sectional view taken along line AG-AG' in FIG. 309. A comparison between the structure of the first selective transistor 470 shown in FIG. 310 and the structure of the semiconductor device 10E shown in FIG. 50 will be described below. The first data line 440 for the first selective transistor 470 corresponds to the lower electrode 120E of the semiconductor device 10E. A line 454 for the first selective transistor 470 corresponds to the upper electrode 140E of the semiconductor device 10E. A gate line 460 for the first selective transistor 470 corresponds to the gate electrode 180E of the semiconductor device 10E. The pad 520 of the first selective transistor 470 corresponds to the drain electrode 192E of the semiconductor device 10E. Namely, the source electrode and the drain electrode of the first selective transistor 470 are in different layers from each other.

As shown in FIG. 310, the first selective transistor 470 includes, in addition to the components of the semiconductor device 10E, a first interlayer film 530, a common electrode 540, a second interlayer film 550, and the first pixel electrode 560. The first interlayer film 530 covers the gate line 460. The first interlayer film 530 has an opening reaching the pad 520. The common electrode 540 is located on the first interlayer film 530 commonly to a plurality of pixels. The second interlayer film 550 covers the common electrode 540. The second interlayer film 550 has an opening reaching the pad 520. The first pixel electrode 560 is provided on the second interlayer film 550, and is connected with the pad 520 via the opening formed in the second interlayer film 550.

[Structure of the Third Selective Transistor 474]

FIG. 311 is a cross-sectional view taken along line AG"-AG'" in FIG. 309. A comparison between the structure of the third selective transistor 474 shown in FIG. 311 and the structure of the semiconductor device 10E shown in FIG. 50 will be described below. A line 444 for the third selective transistor 474 corresponds to the lower electrode 120E of the semiconductor device 10E. The third data line 452 for the third selective transistor 474 corresponds to the upper electrode 140E of the semiconductor device 10E. The gate line 460 for the third selective transistor 474 corresponds to the gate electrode 180E of the semiconductor device 10E. The pad 524 of the third selective transistor 474 corresponds to the drain electrode 192E of the semiconductor device 10E. Namely, the source electrode and the drain electrode of the third selective transistor 474 are in different layers from each other.

The third selective transistor 474 is similar to the first selective transistor 470, but is different from the first selective transistor 470 on the following point. In the first selective transistor 470, the lower electrode is used as the data line, whereas in the third selective transistor 474, the upper electrode is used as the data line. Namely, the first data line 440 connected with the first selective transistor 470 and the third data line 452 connected with the third selective transistor 474 are located in different layers from each other. Although not described herein, the structure of the second selective transistor 472 is substantially the same as that of the third selective transistor 474.

Now, with reference to FIG. 50 and FIG. 309 through FIG. 311, an insulating layer that insulates the third data line 452 in one main pixel and the first data line 446 in a main pixel adjacent thereto from each other corresponds to the insulating layer 130E having the insulating layer side wall 132E in FIG. 50. The third data line 452 and the first data line 446 overlap each other in a plan view as shown in FIG. 309.

In the display device 40, liquid crystal molecules are controlled by a transverse electric field formed between the first pixel electrode 50, the second pixel electrode 562 and the third pixel electrode 564, which are comb-like, and the common electrode 540.

[Manufacturing Method of the Display Device 40]

With reference to plan views provided in FIG. 312 through FIG. 317, a manufacturing method of the display device 40 in embodiment 30 according to the present invention will be described. The manufacturing method of the selective transistors in the display device 40 is substantially the same as that of the semiconductor device 10E in embodiment 6, and thus descriptions with reference to cross-sectional views will be omitted.

FIG. 312 is a plan view showing a step of forming the first data lines 440 and 446 and lines 442 and 444 in the manufacturing method of the display device 40 in embodiment 30 according to the present invention. Referring to FIG. 312, the first data line 440, the lines 442 and 444, and the first data line 446 in the main pixel adjacent to the main pixel including the first data line 440 and the lines 442 and 444 are formed of a layer corresponding to the lower electrode 120E of the semiconductor device 10E.

FIG. 313 is a plan view showing a step of forming the second data line 450, the third data line 452 and the line 454 in the manufacturing method of the display device 40 in embodiment 30 according to the present invention. Referring to FIG. 313, the second data line 450, the third data line 452 and the line 454 are formed of a layer corresponding to the upper electrode 140E of the semiconductor device 10E.

FIG. 314 is a plan view showing a step of forming openings 490, 492 and 494 exposing the data lines and lines in the manufacturing method of the display device 40 in embodiment 30 according to the present invention. Referring to FIG. 314, the openings 490, 492 and 494 corresponding to the opening 139E of the semiconductor device 10E are formed in regions where the data lines and lines overlap each other. The opening 490 exposes a top surface of the first data line 440 and a side wall of the line 454. The opening 492 exposes a top surface of the line 442 and a side wall of the second data line 450. The opening 494 exposes a top surface of the line 444 and a side wall of the third data line 452.

FIG. 315 is a plan view showing a step of forming oxide semiconductor layers 500, 502 and 504 in the openings in the manufacturing method of the display device 40 in embodiment 30 according to the present invention. Referring to FIG. 315, the oxide semiconductor layers 500, 502 and 504 are formed in regions corresponding to the openings 490, 492 and 494. The oxide semiconductor layer 500 is in contact with the top surface of the first data line 440 and the side wall of the line 454. The oxide semiconductor layer 502 is in contact with the top surface of the line 442 and the side wall of the second data line 450. The oxide semiconductor layer 504 is in contact with the top surface of the line 444 and the side wall of the third data line 452.

FIG. 316 is a plan view showing a step of forming openings 510, 512 and 514 exposing the lines in the manufacturing method of the display device 40 in embodiment 30 according to the present invention. Referring to FIG. 316, the openings 510, 512 and 514 respectively exposing the lines 454, 442 and 444 are formed.

FIG. 317 is a plan view showing a step of forming pads 520, 522 and 524 in the manufacturing method of the display device 40 in embodiment 30 according to the present invention. Referring to FIG. 317, the gate line 460 is formed in a region overlapping the opening 490, 492 and 494 in a plan view, and the pads 520, 522 and 524 are formed in regions overlapping the openings 510, 512 and 514.

Then, the first interlayer film 530 having opening corresponding to the pads 520, 522 and 524 is formed, and the common electrode 540, the second interlayer film 550, the first pixel electrode 560, the second pixel electrode 562, and the third pixel electrode 564 are formed. Thus, the display device 40 shown in FIG. 309 through FIG. 311 is manufactured.

As described above, with the display device 40 in embodiment 30 according to the present invention, a selective transistor is located in a region where the data line and the gate line cross each other. Since the source electrode and the drain electrode of each selective transistor are located in different layers from each other, lines in the different layers are connected with each other via the selective transistor. This improves the degree of freedom of line layout, and decreases the ratio of the area size of the lines and the selective transistors. As a result, the numerical aperture of the pixels is increased. The third data line 452, and the first data line 446 of the main pixel adjacent to the main pixel including the third data line 452, overlap each other as seen in a plan view. This allows the number of data lines located in one main pixel unit to be decreased. Thus, the numerical aperture of the pixels is further increased.

In this embodiment, the display device 40 is a liquid crystal display device of a transverse electric field system. The present invention is applicable to any other appropriate display device. For example, the present invention is applicable to an EL display device. In the case where the present invention is applied to an EL display device, for example, the first interlayer film 530 and the common electrode 540 shown in FIG. 310 may be omitted and a light emitting layer and a cathode electrode may be provided on a pixel electrode in a light emitting region.

The present invention is not limited to any of the above-described embodiments, and may be modified without departing from the gist of the present invention.

What is claimed is:

1. A semiconductor device, comprising:
a first electrode;
a first insulating layer above the first electrode;
a second electrode above the first insulating layer;
a second insulating layer above the second electrode;
a first opening in the first insulating layer, the second electrode and the second insulating layer, the first opening reaching the first electrode;
a first oxide semiconductor layer in the first opening, the first oxide semiconductor layer being connected with the first electrode and the second electrode;
a first gate electrode above the first oxide semiconductor layer, the first electrode, and the second electrode, the first gate electrode facing the first oxide semiconductor layer; and
a first gate insulating layer between the first oxide semiconductor layer and the first gate electrode,
wherein the first oxide semiconductor layer is located on a side wall of the first insulating layer and in contact with a side wall of the second electrode in the first opening.

2. The semiconductor device according to claim 1, wherein the first oxide semiconductor layer is located on a top surface of the second insulating layer.

3. The semiconductor device according to claim 2, wherein:
the first electrode is one of a source electrode and a drain electrode of a transistor including a channel formed of the first oxide semiconductor layer; and
the second electrode is the other of the source electrode and the drain electrode.

4. The semiconductor device according to claim 3, further comprising:
a first line connected with the first electrode via a second opening in the first insulating layer and the second insulating layer; and
a second line connected with the second electrode via a third opening in the second insulating layer.

5. The semiconductor device according to claim 4, wherein the first line, the second line, and the first gate electrode are formed of the same layer as each other.

6. The semiconductor device according to claim 5, wherein a top surface of the second electrode is covered with the second insulating layer.

7. The semiconductor device according to claim 5, wherein a part of a top surface of the second electrode is exposed from the second insulating layer.

8. The semiconductor device according to claim 1, further comprising:
a third electrode forming the same layer with the first electrode;
a fourth electrode isolated from the third electrode as seen in a plan view, the fourth electrode forming the same layer with the second electrode;
a second oxide semiconductor layer between the third electrode and the fourth electrode, the second oxide semiconductor forming the same layer with the first oxide semiconductor layer;
a second gate electrode facing the second oxide semiconductor layer; and
a second gate insulating layer between the second oxide semiconductor layer and the second gate electrode.

9. The semiconductor device according to claim 8, wherein a portion of the second oxide semiconductor layer that is between the third electrode and the fourth electrode has a length greater than a length of a portion of the first oxide semiconductor layer that is between the first electrode and the second electrode.

10. The semiconductor device according to claim 9, further comprising:
a third gate electrode on the opposite side to the second gate electrode with respect to the second oxide semiconductor layer at least in a part of a region where the second oxide semiconductor layer and the second gate electrode face each other, the third gate electrode forming the same layer with the first electrode; and
a third gate insulating layer between the second oxide semiconductor layer and the third gate electrode.

11. A semiconductor device, comprising:
a first electrode;
a first insulating layer above the first electrode, the first insulating layer having a first side wall;
a second electrode above the first insulating layer, the second electrode having a second side wall;
a second insulating layer above the second electrode;
a first oxide semiconductor layer on the first side wall, the second side wall, and a top surface of the second insulating layer, the first oxide semiconductor layer being connected with the first electrode and the second electrode;
a first gate electrode above the first oxide semiconductor layer, the first electrode, and the second electrode, the first gate electrode facing the first oxide semiconductor layer; and
a first gate insulating layer between the first oxide semiconductor layer and the first gate electrode,
wherein the first oxide semiconductor layer is located on the first side wall and in contact with the second side wall.

12. The semiconductor device according to claim 11, wherein:
the first electrode is one of a source electrode and a drain electrode of a transistor including a channel formed of the first oxide semiconductor layer; and
the second electrode is the other of the source electrode and the drain electrode.

13. The semiconductor device according to claim 12, further comprising:
a first line connected with the first electrode via a first opening in the first insulating layer and the second insulating layer; and
a second line connected with the second electrode via a second opening in the second insulating layer.

14. The semiconductor device according to claim 13, wherein the first line, the second line, and the first gate electrode are formed of the same layer as each other.

15. The semiconductor device according to claim 14, wherein a top surface of the second electrode is covered with the second insulating layer.

16. The semiconductor device according to claim 14, wherein a part of a top surface of the second electrode is exposed from the second insulating layer.

17. The semiconductor device according to claim 11, further comprising:
a third electrode forming the same layer with the first electrode;
a fourth electrode isolated from the third electrode as seen in a plan view, the fourth electrode forming the same layer with the second electrode;

a second oxide semiconductor layer between the third electrode and the fourth electrode, the second oxide semiconductor being connected with the first oxide semiconductor layer;

a second gate electrode facing the second oxide semiconductor layer; and a second gate insulating layer between the second oxide semiconductor layer and the second gate electrode.

18. The semiconductor device according to claim 17, wherein a portion of the second oxide semiconductor layer that is between the third electrode and the fourth electrode has a length greater than a length of a portion of the first oxide semiconductor layer that is between the first electrode and the second electrode.

19. The semiconductor device according to claim 18, further comprising:

a third gate electrode on the opposite side to the second gate electrode with respect to the second oxide semiconductor layer at least in a part of a region where the second oxide semiconductor layer and the second gate electrode face each other, the third gate electrode forming the same layer with the first electrode; and a third gate insulating layer between the second oxide semiconductor layer and the third gate electrode.

* * * * *